US009646747B2

(12) United States Patent
Tamagawa et al.

(10) Patent No.: US 9,646,747 B2
(45) Date of Patent: May 9, 2017

(54) CHIP COMPONENT

(71) Applicant: ROHM CO., LTD., Kyoto (JP)

(72) Inventors: Hiroshi Tamagawa, Kyoto (JP); Hiroki Yamamoto, Kyoto (JP); Katsuya Matsuura, Kyoto (JP); Yasuhiro Kondo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 58 days.

(21) Appl. No.: 14/373,900

(22) PCT Filed: Dec. 26, 2012

(86) PCT No.: PCT/JP2012/083570

§ 371 (c)(1),
(2) Date: Jul. 22, 2014

(87) PCT Pub. No.: WO2013/111497

PCT Pub. Date: Aug. 1, 2013

(65) Prior Publication Data

US 2015/0034981 A1 Feb. 5, 2015

(30) Foreign Application Priority Data

Jan. 27, 2012 (JP) ................................ 2012-015573
Jan. 27, 2012 (JP) ................................ 2012-015574
(Continued)

(51) Int. Cl.
*H01C 10/50* (2006.01)
*H01G 5/38* (2006.01)
(Continued)

(52) U.S. Cl.
CPC ............... *H01C 10/50* (2013.01); *H01C 1/14* (2013.01); *H01C 10/16* (2013.01); *H01C 17/23* (2013.01);
(Continued)

(58) Field of Classification Search
CPC .......... H01C 10/50; H01C 10/16; H01C 1/14; H01G 5/38; H01G 5/40; H01G 5/011;
(Continued)

(56) References Cited

U.S. PATENT DOCUMENTS 3,381,081 A * 4/1968 Schalliol ................. H01L 24/81
174/260
5,206,623 A * 4/1993 Rochette ................ H01C 17/24
338/195
(Continued)

FOREIGN PATENT DOCUMENTS

JP S63-6804 A 1/1988
JP H04(1992)-15825 U 2/1992
(Continued)

*Primary Examiner* — Peniel M Gumedzoe
(74) *Attorney, Agent, or Firm* — Rabin & Berdo, P.C.

(57) ABSTRACT

A chip component includes a substrate, an element circuit network including a plurality of element parts formed on the substrate, an external connection electrode provided on a surface of the substrate to provide external connection for the element circuit network, a plurality of fuses formed on the substrate and disconnectably connecting each of the plurality of element parts to the external connection electrode, a solder layer formed on an external connection terminal of the external connection electrode and a resin film which covers the surface of the substrate and other surface which intersects the surface of the substrate.

6 Claims, 192 Drawing Sheets

(30) Foreign Application Priority Data

| | | |
|---|---|---|
| Feb. 24, 2012 | (JP) | 2012-039181 |
| Feb. 24, 2012 | (JP) | 2012-039182 |
| Feb. 28, 2012 | (JP) | 2012-042301 |
| Mar. 16, 2012 | (JP) | 2012-060556 |
| Mar. 30, 2012 | (JP) | 2012-081628 |
| Apr. 4, 2012 | (JP) | 2012-085668 |
| Dec. 13, 2012 | (JP) | 2012-272742 |

(51) Int. Cl.

| | |
|---|---|
| ***H01G 5/40*** | (2006.01) |
| ***H01F 29/00*** | (2006.01) |
| ***H01F 27/40*** | (2006.01) |
| ***H01L 25/10*** | (2006.01) |
| ***H01G 5/011*** | (2006.01) |
| ***H01C 1/14*** | (2006.01) |
| ***H01L 27/15*** | (2006.01) |
| ***H01L 33/62*** | (2010.01) |
| ***H01L 25/13*** | (2006.01) |
| ***H01C 10/16*** | (2006.01) |
| ***H01F 27/28*** | (2006.01) |
| ***H01L 27/08*** | (2006.01) |
| ***H01C 17/23*** | (2006.01) |
| ***H05K 3/34*** | (2006.01) |
| ***H01L 23/00*** | (2006.01) |
| *H01C 17/00* | (2006.01) |
| *H01F 17/00* | (2006.01) |

(52) U.S. Cl.

CPC ......... *H01F 27/2804* (2013.01); *H01F 27/40* (2013.01); *H01F 29/00* (2013.01); *H01G 5/011* (2013.01); *H01G 5/38* (2013.01); *H01G 5/40* (2013.01); *H01L 24/32* (2013.01); *H01L 25/105* (2013.01); *H01L 25/13* (2013.01); *H01L 27/0802* (2013.01); *H01L 27/15* (2013.01); *H01L 33/62* (2013.01); *H05K 3/3442* (2013.01); *H05K 3/3478* (2013.01); *H01C 17/006* (2013.01); *H01F 17/0006* (2013.01); *H01L 2221/68304* (2013.01); *H01L 2224/16225* (2013.01); *H01L 2924/12041* (2013.01); *H01L 2924/12042* (2013.01); *H01L 2924/15788* (2013.01); *H01L 2924/181* (2013.01); *H01L 2924/351* (2013.01); *H05K 2201/10212* (2013.01); *H05K 2203/0415* (2013.01); *Y02P 70/613* (2015.11)

(58) Field of Classification Search

CPC ...... H01F 29/00; H01F 27/40; H01F 27/2804; H01L 27/15; H01L 33/62; H01L 25/13; H01L 25/105

See application file for complete search history.

(56) References Cited

U.S. PATENT DOCUMENTS

| | | | | | | |
|---|---|---|---|---|---|---|
| 5,684,330 | A * | 11/1997 | Lee | H01L 23/13 257/692 |
| 5,844,468 | A | 12/1998 | Doi et al. | |
| 6,882,266 | B2 * | 4/2005 | Christian | H01C 1/144 257/E23.069 |
| 7,192,808 | B2 * | 3/2007 | Saitoh | H01L 24/48 257/E21.506 |
| 2002/0118094 | A1 * | 8/2002 | Kambara | H01C 1/142 338/309 |
| 2004/0108937 | A1 * | 6/2004 | Ernsberger | H01C 1/028 338/309 |
| 2005/0098803 | A1 * | 5/2005 | Komatsu | H01L 23/5228 257/232 |
| 2005/0285904 | A1 * | 12/2005 | Toge | B41J 2/14072 347/58 |
| 2006/0097340 | A1 | 5/2006 | Tsukda et al. | |
| 2007/0284578 | A1 * | 12/2007 | Yoon | G02F 1/1362 257/48 |
| 2009/0108986 | A1 | 4/2009 | Urano et al. | |

FOREIGN PATENT DOCUMENTS

| | | | |
|---|---|---|---|
| JP | H09-306710 | A | 11/1997 |
| JP | H10-135016 | A | 5/1998 |
| JP | 2000-294402 | A | 10/2000 |
| JP | 2001-076912 | A | 3/2001 |
| JP | 2001-284166 | A | 10/2001 |
| JP | 2003-007510 | A | 1/2003 |
| JP | 2007-088162 | A | 4/2007 |
| JP | 2009-182144 | A | 8/2009 |
| JP | 2010-114284 | A | 5/2010 |

* cited by examiner (A)

(B)

(A)

(B)

(A)

(B)

(A)

(B)

d151

(a)

(b)

(a)

(b)

(c)

(A)

(B)

(A)

(B)

(C)

CHIP COMPONENT

FIELD OF THE ART

The present invention relates to a chip component, such as a chip resistor or chip capacitor, etc., as a discrete component.

BACKGROUND ART

For example, a chip resistor conventionally has an arrangement that includes an insulating substrate, made of ceramic, etc., a resistive film formed by screen printing a material paste on a top surface of the substrate, and electrodes connected to the resistive film. To set the resistance value of the chip resistor to a target value, a laser trimming process of irradiating a laser beam to engrave a trimming groove in the resistive film is performed (see Patent Document 1).

Also, Patent Document 2 discloses, as another example of a chip component, a laser trimmable capacitor in which a dielectric layer is formed via an internal electrode on a top surface of a base substrate and a laser trimmable upper electrode is formed on the dielectric layer so as to face the internal electrode. A portion of the upper electrode is removed by a laser to make the electrostatic capacitance between the electrodes take on a desired value.

PRIOR ART DOCUMENTS

Patent Documents

Patent Document 1: Japanese Patent Application Publication No. 2001-76912

Patent Document 2: Japanese Patent Application Publication No. 2001-284166

SUMMARY OF THE INVENTION

Problem to be Solved by the Invention

The conventional chip resistor cannot accommodate a wide range of resistance values because the resistance value is adjusted to the target value by laser trimming. Further, chip resistors are being downsized progressively each year, and in developing a high resistance product, it was difficult to realize a high resistance due to restrictions of installation area of the resistive film. Further, without improvement of geometric precision, chip resistors readily invite such problems as transfer error during substrate mounting, etc., and therefore improvement of geometric precision and improvement of micromachining precision are important issues in terms of manufacture of chip resistors.

Also, with the chip capacitor with the above structure, when capacitors of a plurality of types of capacitance values are required, a plurality of types of capacitors corresponding to the plurality of types of capacitance values need to be designed individually. A long period of time is thus required for design and much labor is required therefor. Moreover, when a specification of an equipment in which a capacitor is installed is changed and a capacitor of a new capacitance value becomes necessary, this cannot be accommodated rapidly.

The present invention has been made under the above background and a main object thereof is to provide a chip component that is excellent in mountability, can accommodate a plurality of types of required values with a common basic design, and has improved geometric precision and micromachining precision.

Means for Solving the Problem

A first aspect of the invention provides a chip component including a substrate, an element circuit network including a plurality of element parts formed on the substrate, an external connection electrode provided on the substrate to provide external connection for the element circuit network, a plurality of fuses formed on the substrate and disconnectably connecting each of the plurality of element parts to the external connection electrode, and a solder layer formed on an external connection terminal of the external connection electrode.

A second aspect of the invention provides the chip component according to the first aspect, where the element circuit network includes a resistor network including a plurality of resistor bodies formed on the substrate and the chip component is a chip resistor. A third aspect of the invention provides the chip component according to the second aspect, where the resistor bodies include a resistor body film formed on the substrate and a wiring film laminated on the resistor body film.

A fourth aspect of the invention provides the chip component according to the third aspect, where the wiring film and the fuses are conductor films formed at the same layer and the conductor films are also provided on the substrate at which the external connection electrode is provided.

A fifth aspect of the invention provides the chip component according to the first aspect, where the element circuit network includes a capacitor circuit network including a plurality of capacitor parts formed on the substrate and the chip component is a chip capacitor.

A sixth aspect of the invention provides the chip component according to the fifth aspect, where the capacitor parts include a capacitance film formed on the substrate and a lower electrode and an upper electrode facing each other across the capacitance film, the lower electrode and the upper electrode include a plurality of separated electrode film portions, and the plurality of electrode film portions are connected respectively to the plurality of fuses. A seventh aspect of the invention provides the chip component according to the sixth aspect, where a portion of the lower electrode or the upper electrode is also provided as a conductor film in a substrate region in which the external electrode is provided.

An eighth aspect of the invention provides the chip component according to the first aspect, where the element circuit network includes an inductor (coil) formed on the substrate and wiring related thereto and the chip component is a chip inductor. A ninth aspect of the invention provides the chip component according to the first aspect, where the element circuit network includes a diode network including a plurality of diodes having junction structures formed on the substrate and the chip component is a chip diode.

A tenth aspect of the invention provides the chip component according to the ninth aspect, where the plurality of diodes are an LED circuit network including an LED and the chip component is a chip LED. An eleventh aspect of the invention provides the chip component according to any one of the fourth to tenth aspects, where the external connection electrode is arranged from a conductor material laminated on a conductor film forming a portion of the element circuit network.

A twelfth aspect of the invention provides the chip component according to the eleventh aspect, where the conductor material includes a conductor material film with a multilayer structure. A thirteenth aspect of the invention provides the chip component according to any one of the fourth to twelfth aspects, where the external connection electrode includes a nickel layer, a palladium layer, a gold layer, and a solder layer.

A fourteenth aspect of the invention provides the chip component according to any one of the fourth to twelfth aspects, where the external connection electrode includes a copper layer and a solder layer.

Effects of the Invention

With the invention according to the first aspect, the external connection electrode provided in the chip component includes the solder layer formed on its external connection terminal, and the chip component can thus be arranged as one that can be mounted easily without requiring solder printing in the chip component mounting process.

The chip component can also be arranged as one with which the amount of solder used for mounting is lessened and high density mounting can be performed without occurrence of solder extrusion, etc.

By the invention according to the second or third aspect, a chip resistor that can be mounted easily and enables high density mounting can be provided. By the invention according to the fourth aspect, when the chip component is a chip resistor, the external connection electrode can be connected reliably to the resistor network and the external connection electrode can be incorporated easily into the substrate. By the invention according to the fifth or sixth aspect, a chip capacitor can be provided as a chip component that can be mounted easily.

By the invention according to the seventh aspect, the external connection electrode can be provided easily in the chip capacitor and the external connection electrode can be incorporated electrically and reliably. By the invention according to the eighth aspect, the external connection electrode can be provided easily in the chip inductor and the external connection electrode can be incorporated electrically and reliably. By the invention according to the ninth aspect, the external connection electrode can be provided easily in the chip diode and the external connection electrode can be incorporated electrically and reliably.

By the invention according to the tenth aspect, the external connection electrode can be provided easily in the chip LED and the external connection electrode can be incorporated electrically and reliably. By the invention according to the eleventh aspect, a structure with which the external connection electrode is incorporated satisfactorily in the chip component can be provided. By the invention according to the twelfth aspect, the chip component can be arranged as one that is excellent conductive performance and easy to mount.

By the invention according to the thirteenth aspect, the chip component can be arranged as one that can be mounted easily without requiring solder printing in the chip component mounting process. As with the invention according to the thirteenth aspect, the chip component can be arranged as one that can be mounted easily without requiring solder printing in the chip component mounting process by the invention according to the fourteenth aspect.

BRIEF DESCRIPTION OF THE DRAWINGS

FIG. 102 is a sectional view taken along section line CII-CII in FIG. 101.

FIG. 103 is a sectional view taken along section line CIII-CIII in FIG. 101.

FIG. 104 is a plan view of a chip diode with a cathode electrode, an anode electrode, and the arrangement formed thereon being removed to show the structure of an element forming surface of a substrate.

FIG. 105 is a perspective view of an outer appearance of a smartphone that is an example of an electronic equipment in which chip components according to the fourth reference example are used.

FIG. 106 is an illustrative plan view of the arrangement of an electronic circuit assembly housed in a housing of the smartphone.

FIG. 107(*a*) is a schematic perspective view for describing the arrangement of a chip resistor according to a preferred embodiment of a fifth reference example, and FIG. 107 (*b*) is a schematic sectional view of a state where the chip resistor is mounted on a mounting substrate.

FIG. 108 is a plan view of the chip resistor showing the positional relationship of a first connection electrode, a second connection electrode, and an element and showing the arrangement in a plan view of the element.

FIG. 109A is a partially enlarged plan view of the element shown in FIG. 108.

FIG. 109B is a vertical sectional view in the length direction taken along B-B of FIG. 109A for describing the arrangement of resistor bodies in the element.

FIG. 109C is a vertical sectional view in the width direction taken along C-C of FIG. 109A for describing the arrangement of the resistor bodies in the element.

FIG. 110 shows diagrams showing the electrical features of resistor body film lines and wiring films in the form of circuit symbols and an electric circuit diagram.

FIG. 111(*a*) is a partially enlarged plan view of a region including fuses drawn by enlarging a portion of the plan view of the chip resistor shown in FIG. 108, and FIG. 111(*b*) is a structural sectional view taken along B-B in FIG. 111 (*a*).

Figure 112:
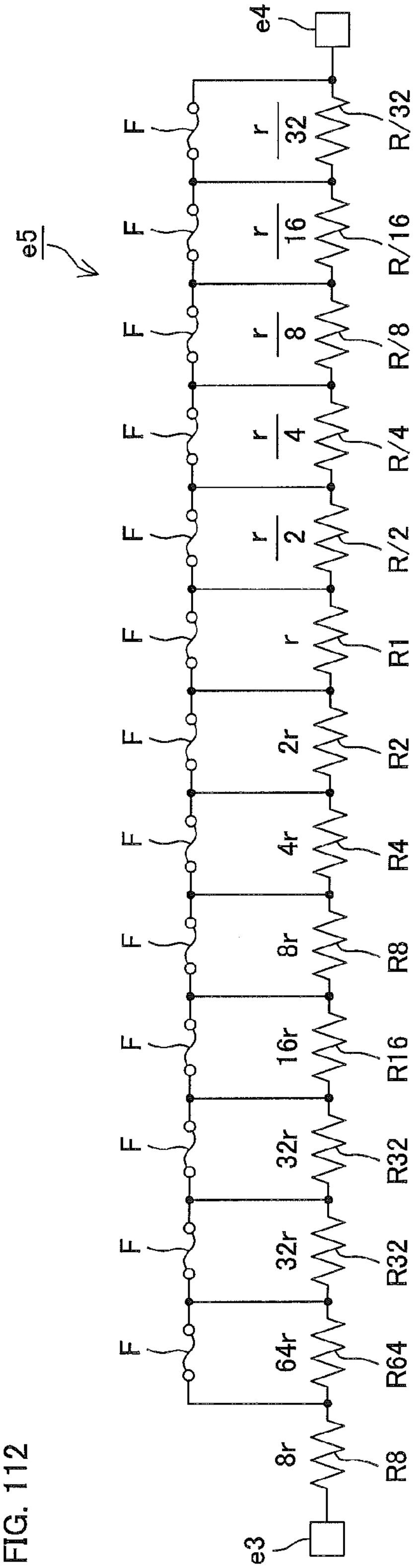

FIG. 112 is an electric circuit diagram of the element according to the preferred embodiment of the fifth reference example.

Figure 113:
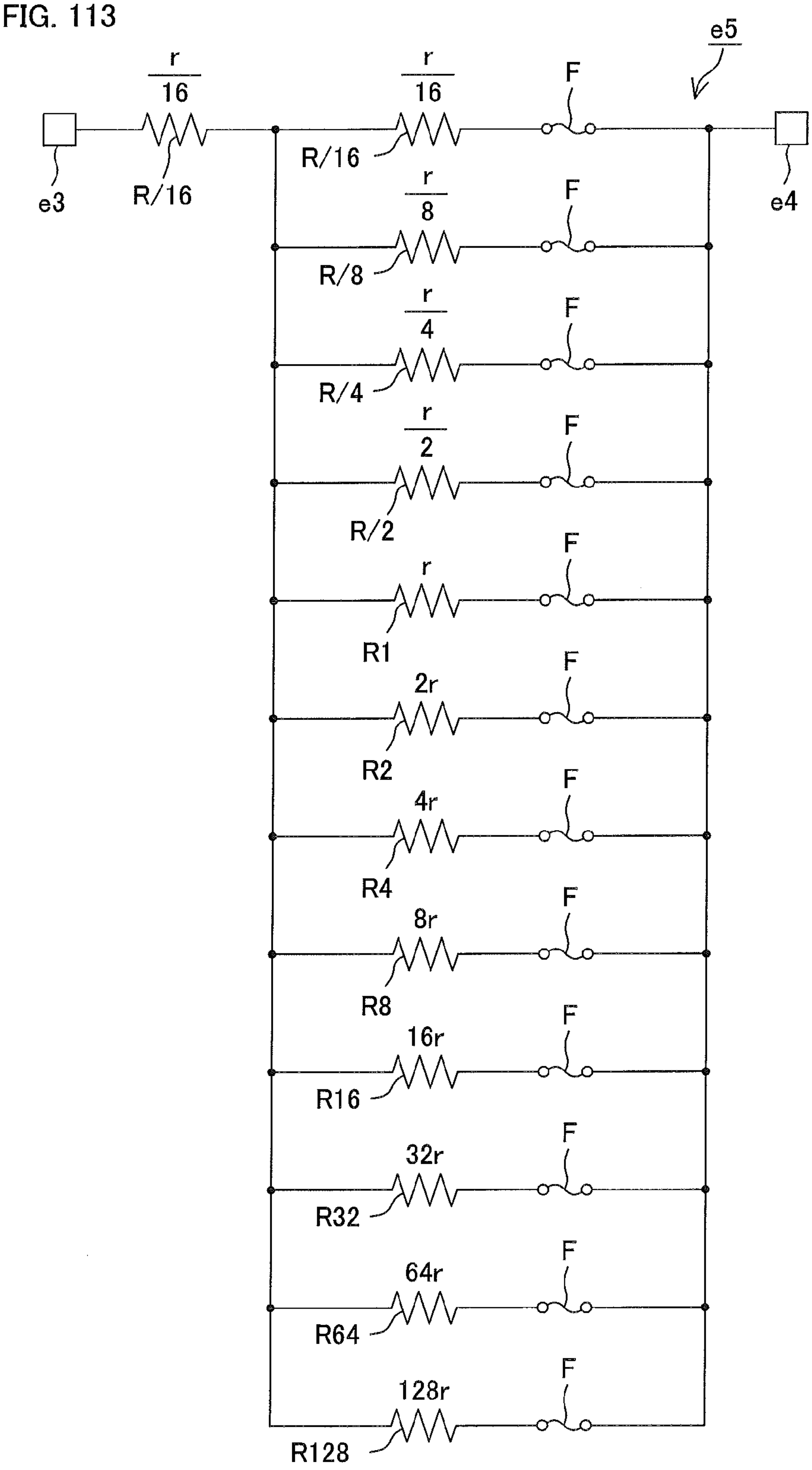

FIG. 113 is an electric circuit diagram of an element according to another preferred embodiment of the fifth reference example.

Figure 114:
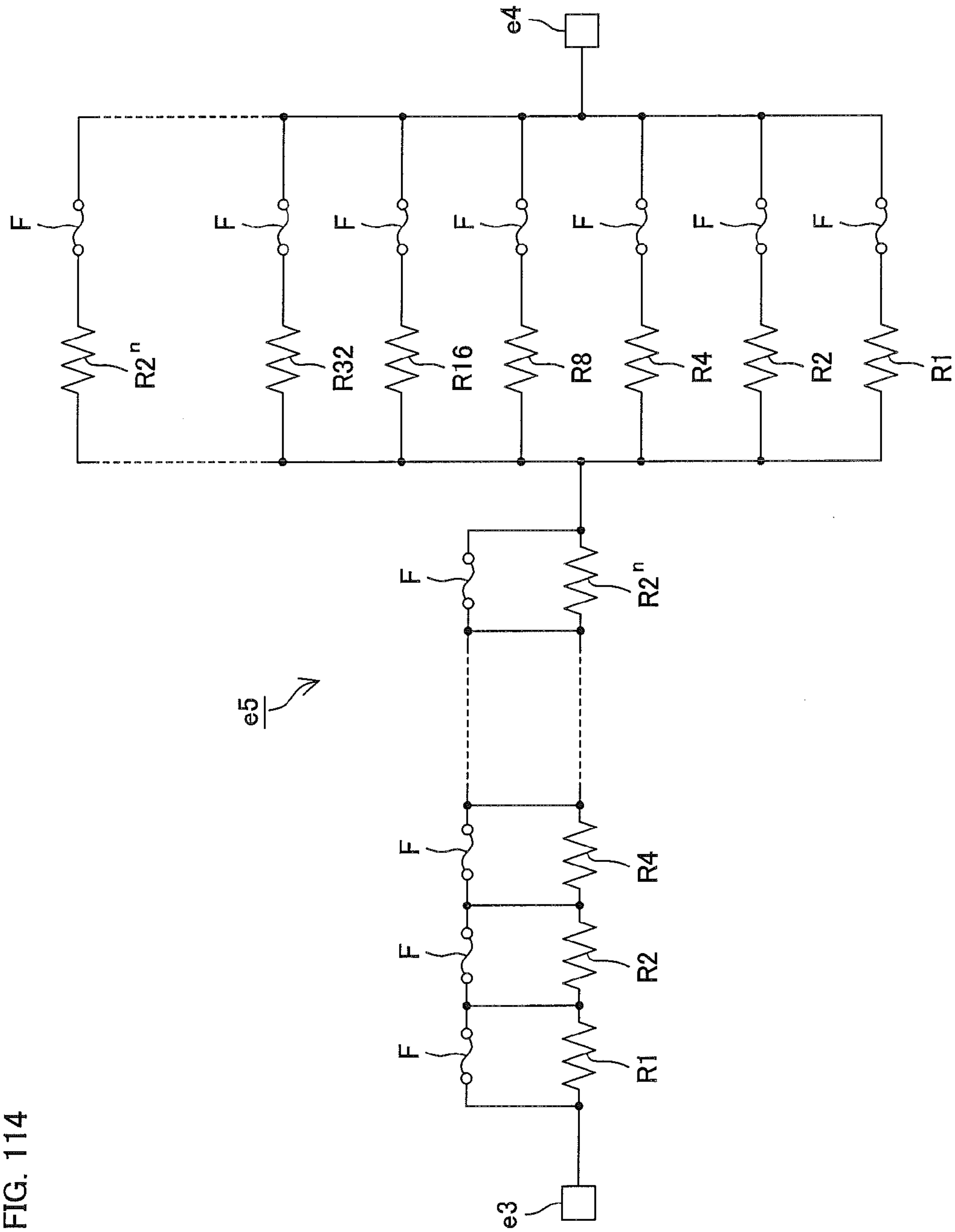

FIG. 114 is an electric circuit diagram of an element according to yet another preferred embodiment of the fifth reference example.

Figure 115:
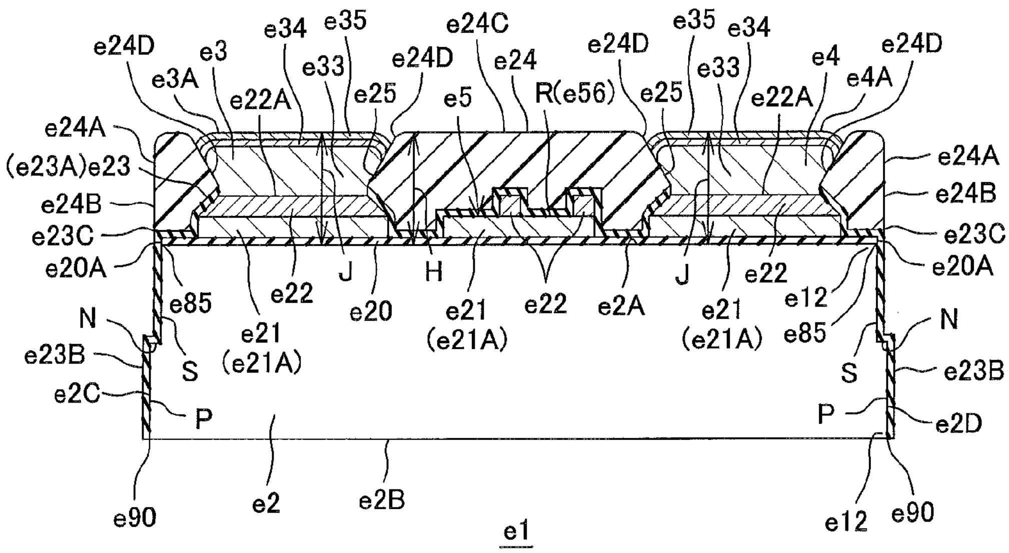

FIG. 115 is a schematic sectional view of the chip resistor.

Figure 116A:
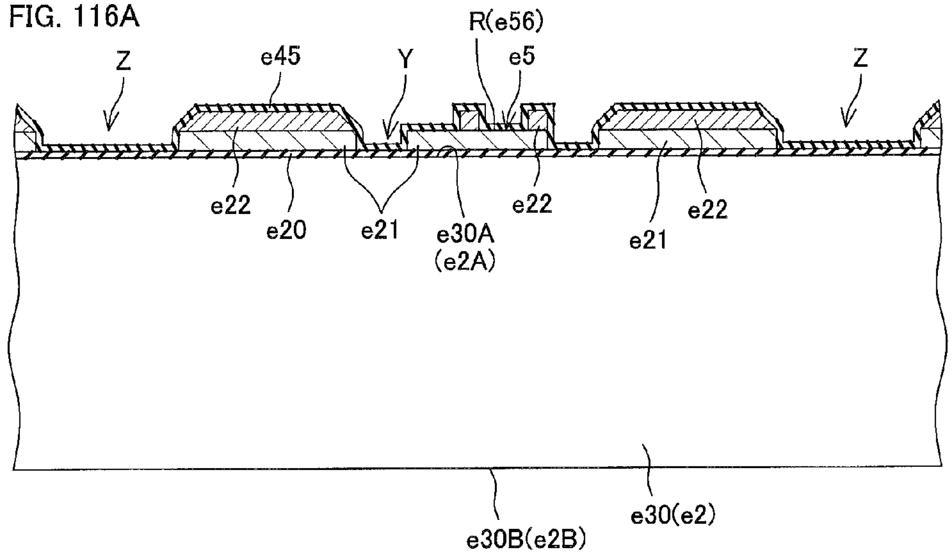

FIG. 116A is an illustrative sectional view of a method for manufacturing the chip resistor shown in FIG. 115.

Figure 116B:
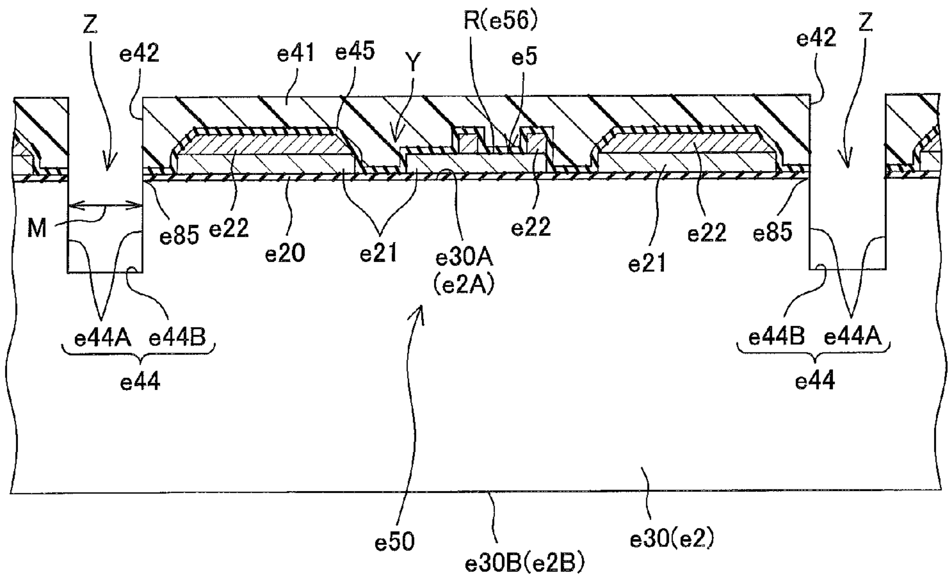

FIG. 116B is an illustrative sectional view of a step subsequent to that of FIG. 116A.

Figure 116C:
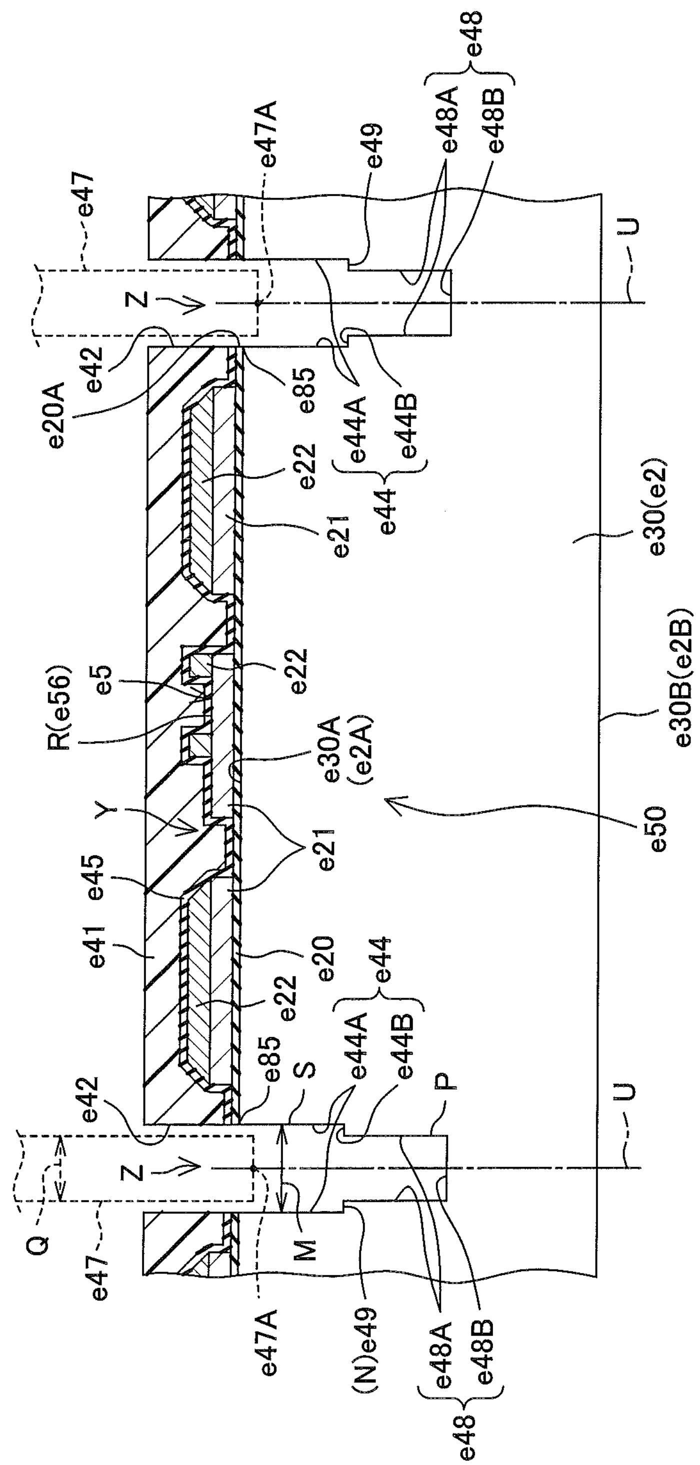

FIG. 116C is an illustrative sectional view of a step subsequent to that of FIG. 116B.

Figure 116D:
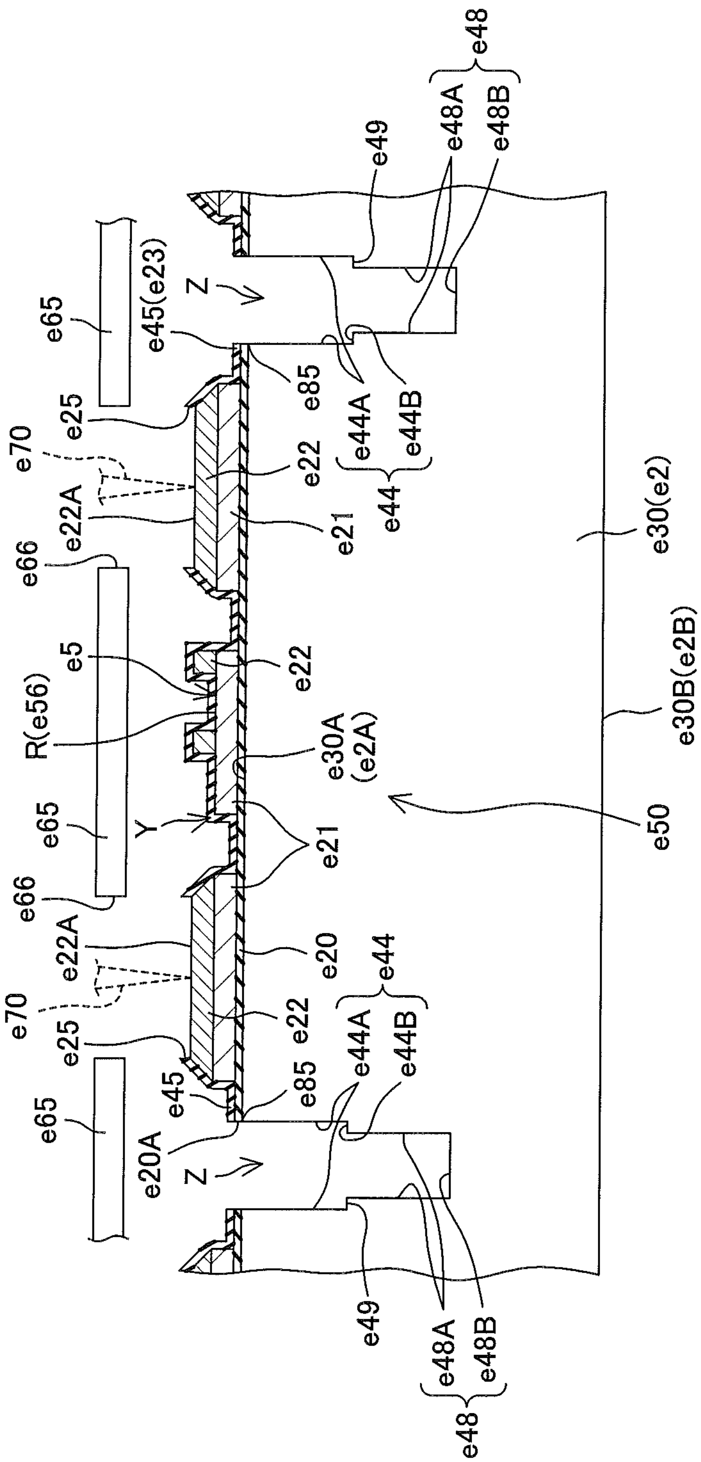

FIG. 116D is an illustrative sectional view of a step subsequent to that of FIG. 116C.

Figure 116E:
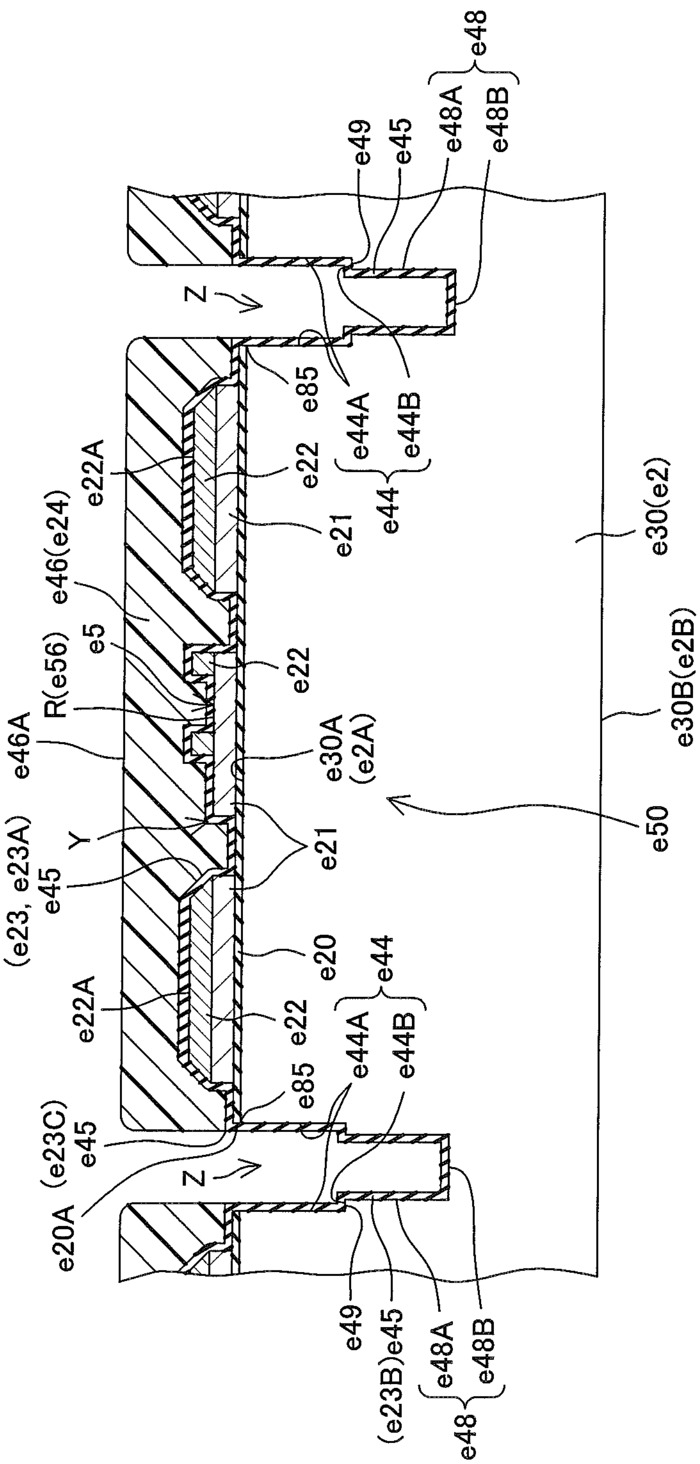

FIG. 116E is an illustrative sectional view of a step subsequent to that of FIG. 116D.

Figure 116F:
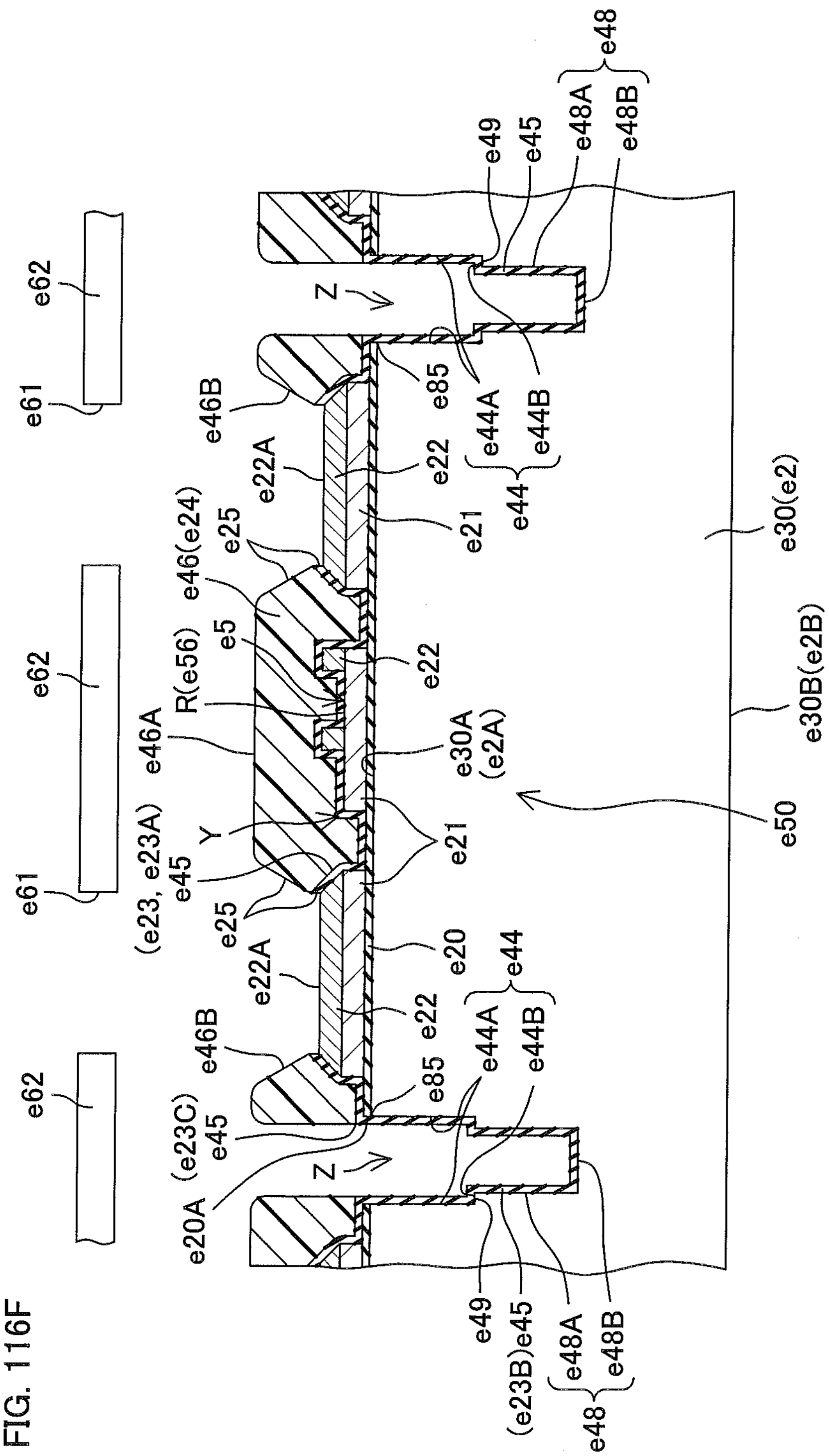

FIG. 116F is an illustrative sectional view of a step subsequent to that of FIG. 116E.

Figure 116G:
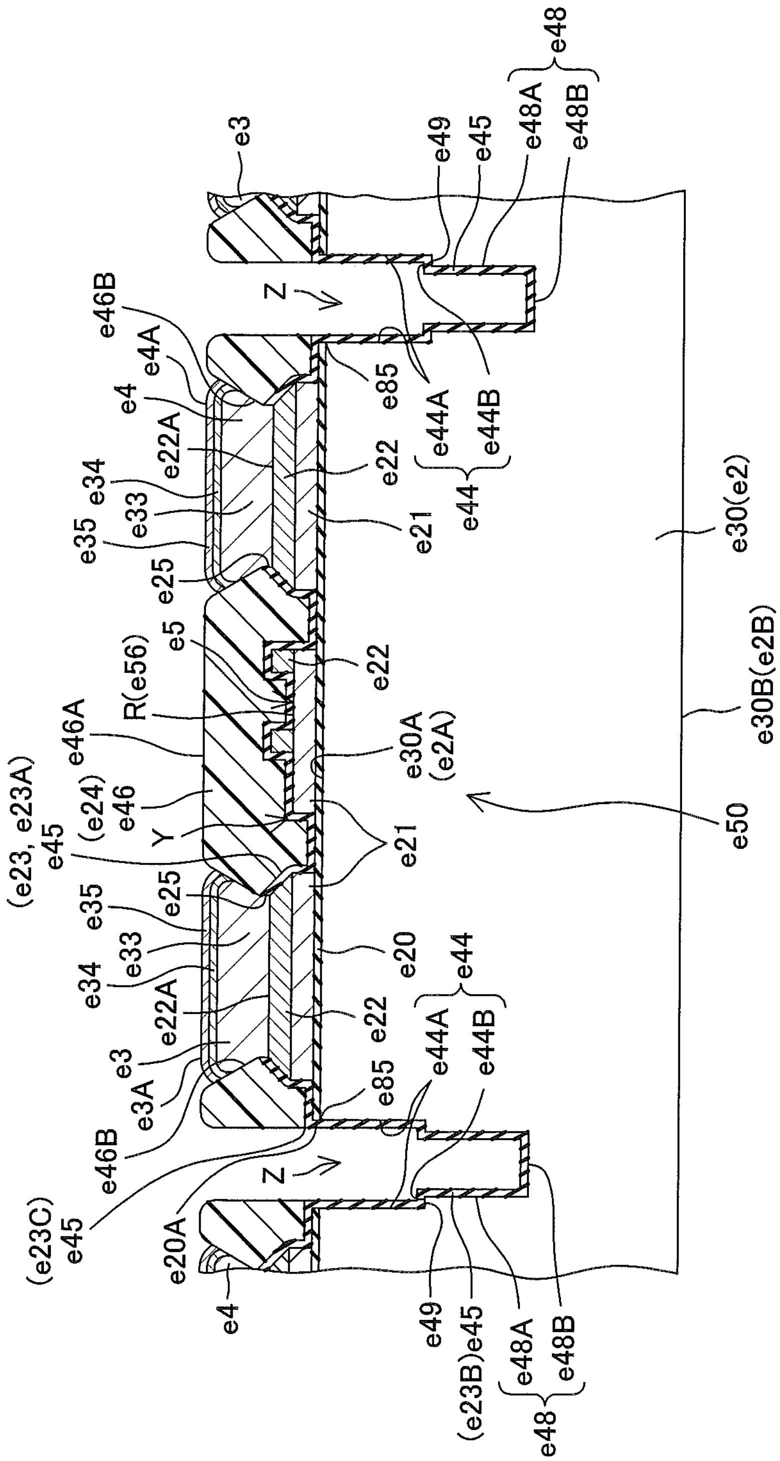

FIG. 116G is an illustrative sectional view of a step subsequent to that of FIG. 116F.

Figure 116H:
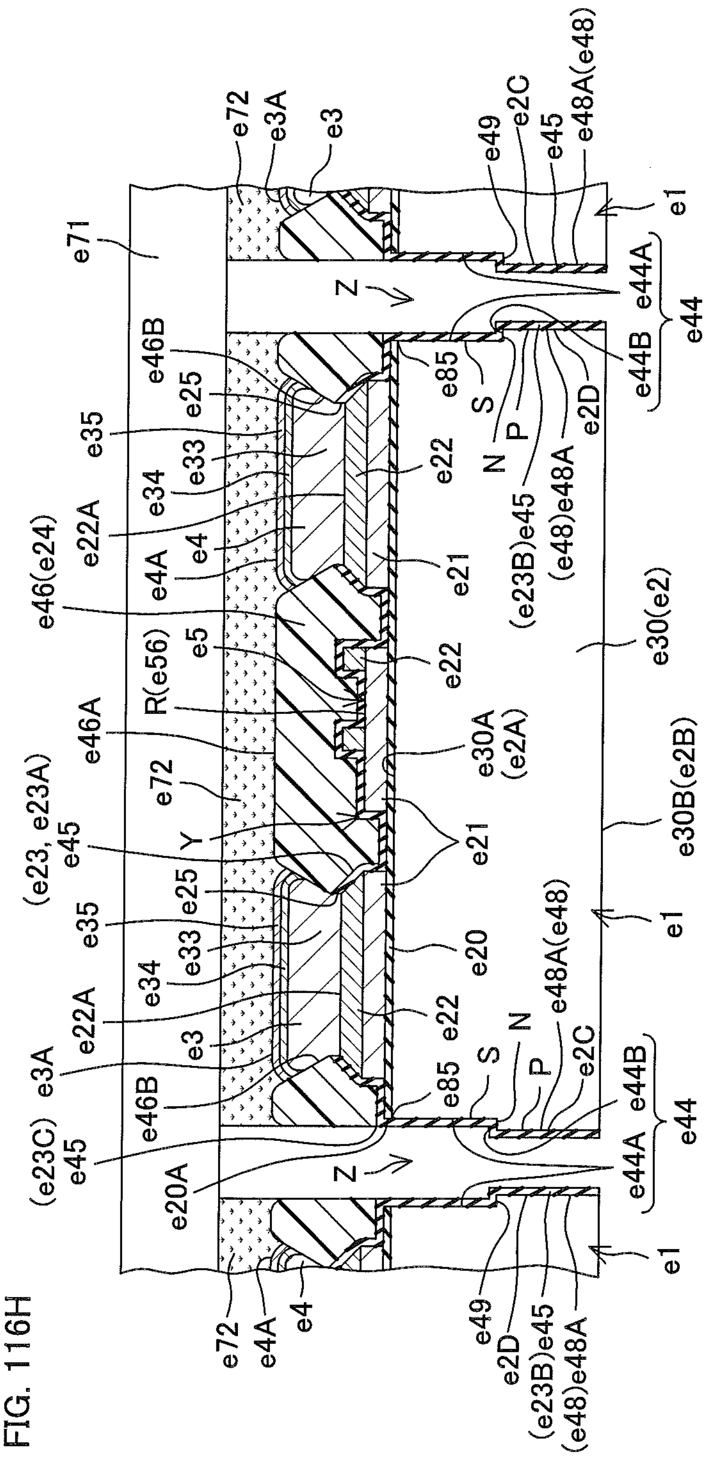

FIG. 116H is an illustrative sectional view of a step subsequent to that of FIG. 116G.

Figure 117:
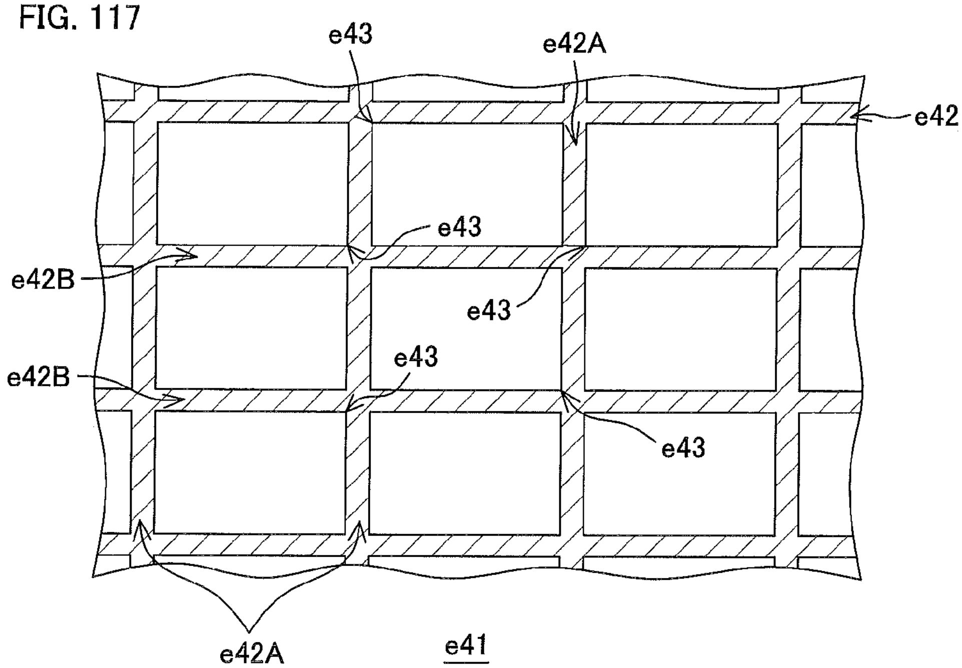

FIG. 117 is a schematic plan view of a portion of a resist pattern used for forming a first groove in the step of FIG. 116B.

Figure 118:
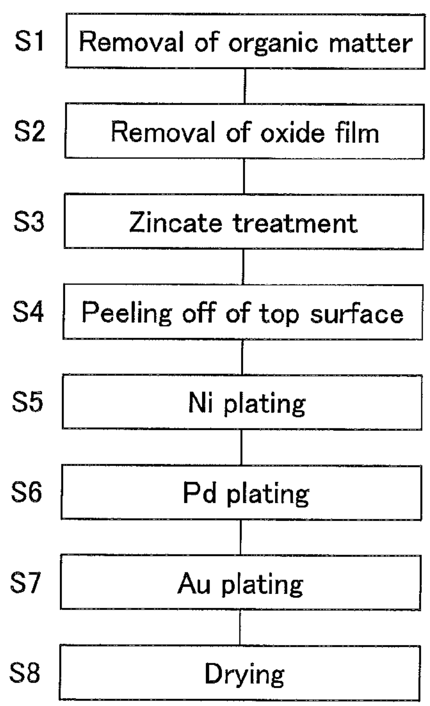

FIG. 118 is a diagram for describing a process for manufacturing a first connection electrode and a second connection electrode.

Figure 119:
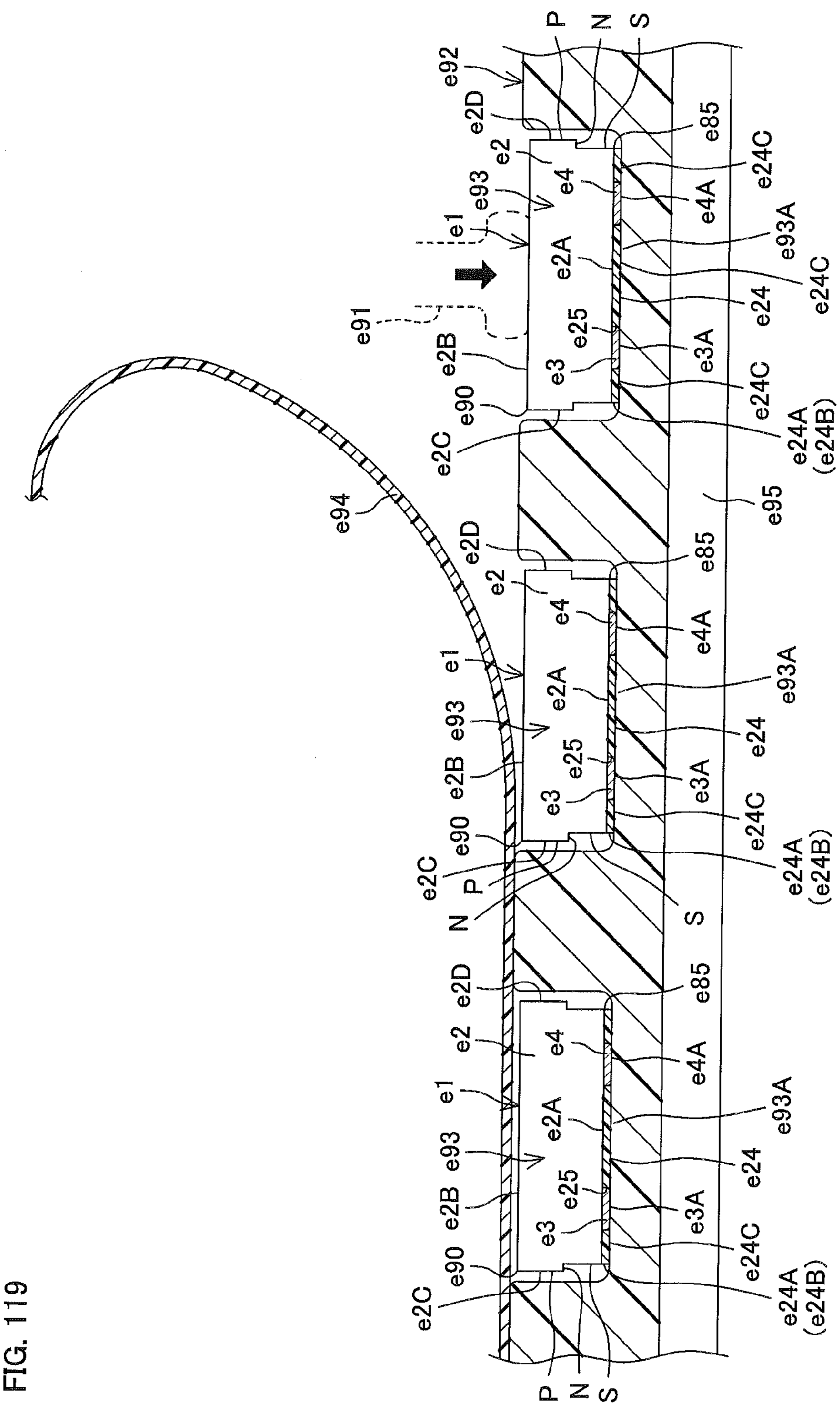

FIG. 119 is a schematic view for describing how finished chip resistors are housed in an embossed carrier tape.

Figure 120:
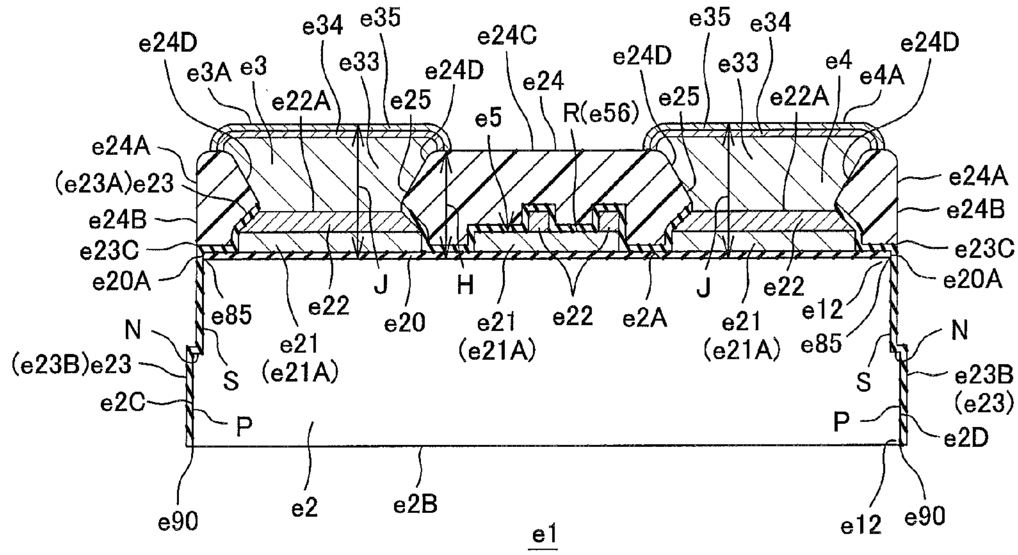

FIG. 120 is a schematic sectional view of a chip resistor according to a first modification example of the fifth reference example.

Figure 121:
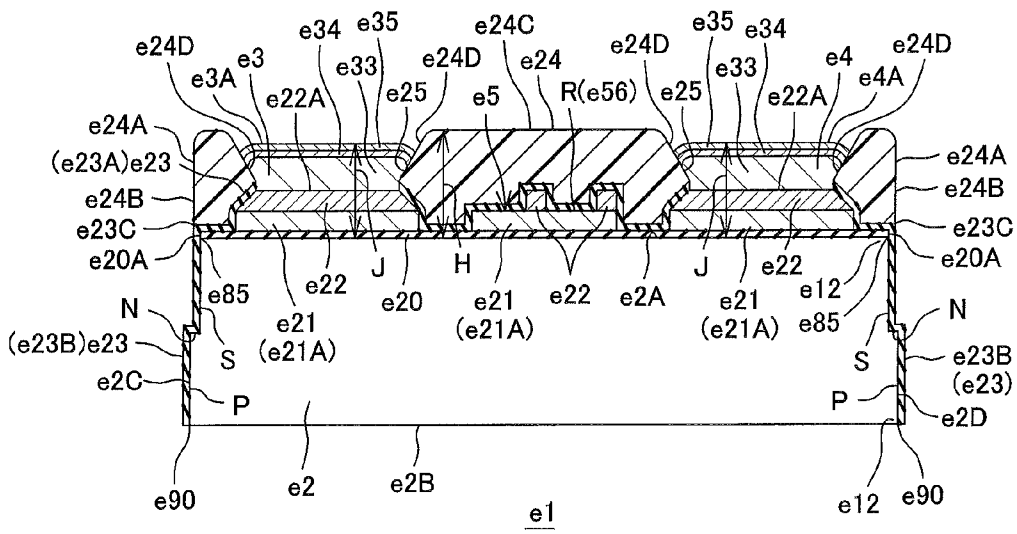

FIG. 121 is a schematic sectional view of a chip resistor according to a second modification example of the fifth reference example.

Figure 122:
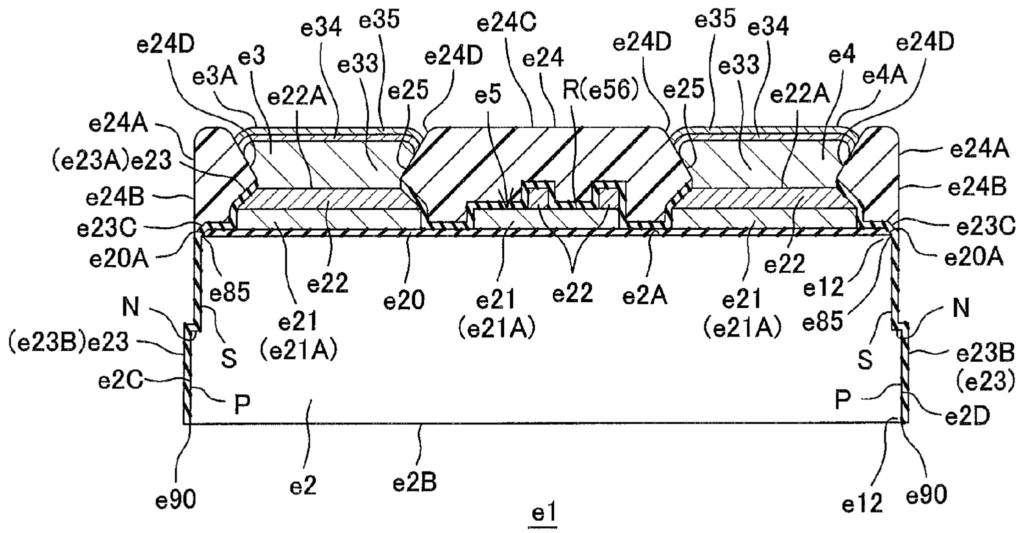

FIG. 122 is a schematic sectional view of a chip resistor according to a third modification example of the fifth reference example.

Figure 123:
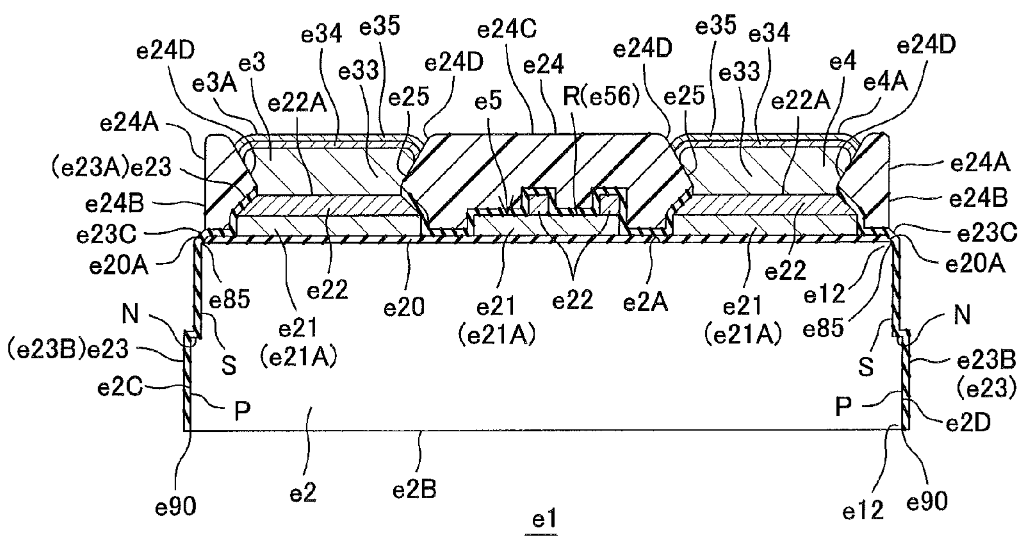

FIG. 123 is a schematic sectional view of a chip resistor according to a fourth modification example of the fifth reference example.

Figure 124:
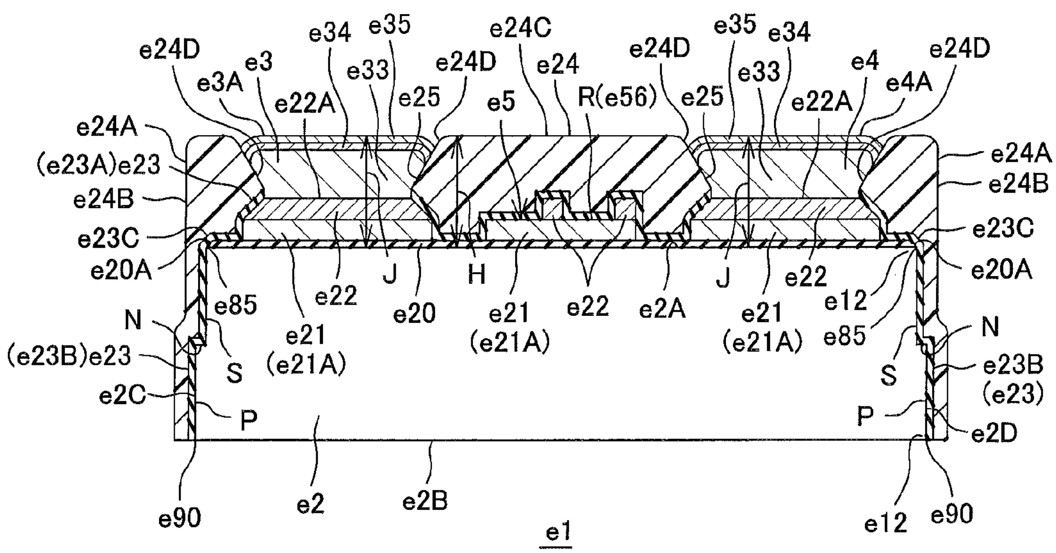

FIG. 124 is a schematic sectional view of a chip resistor according to a fifth modification example of the fifth reference example.

Figure 125:
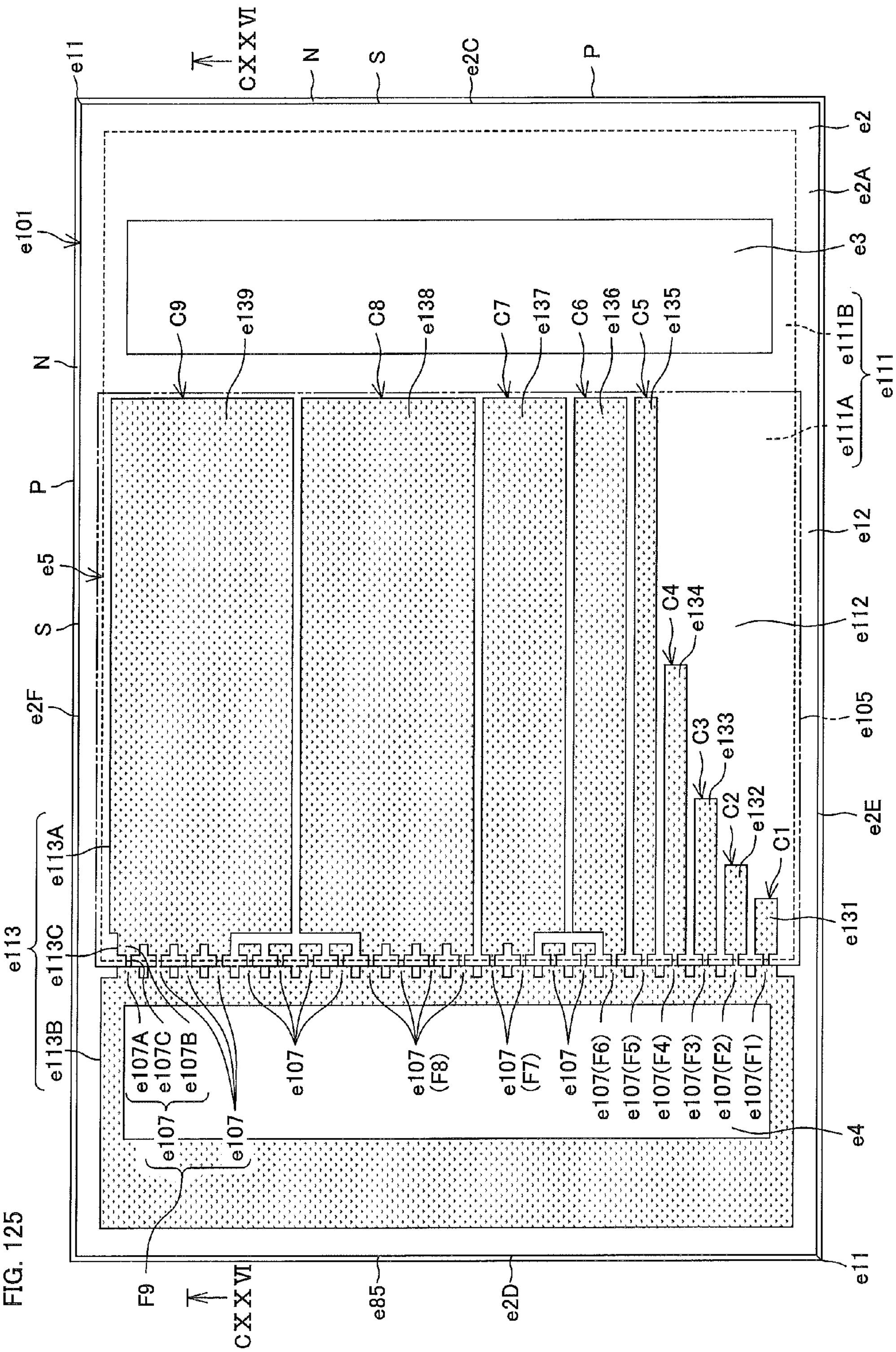

FIG. 125 is a plan view of a chip capacitor according to another preferred embodiment of the fifth reference example.

Figure 126:
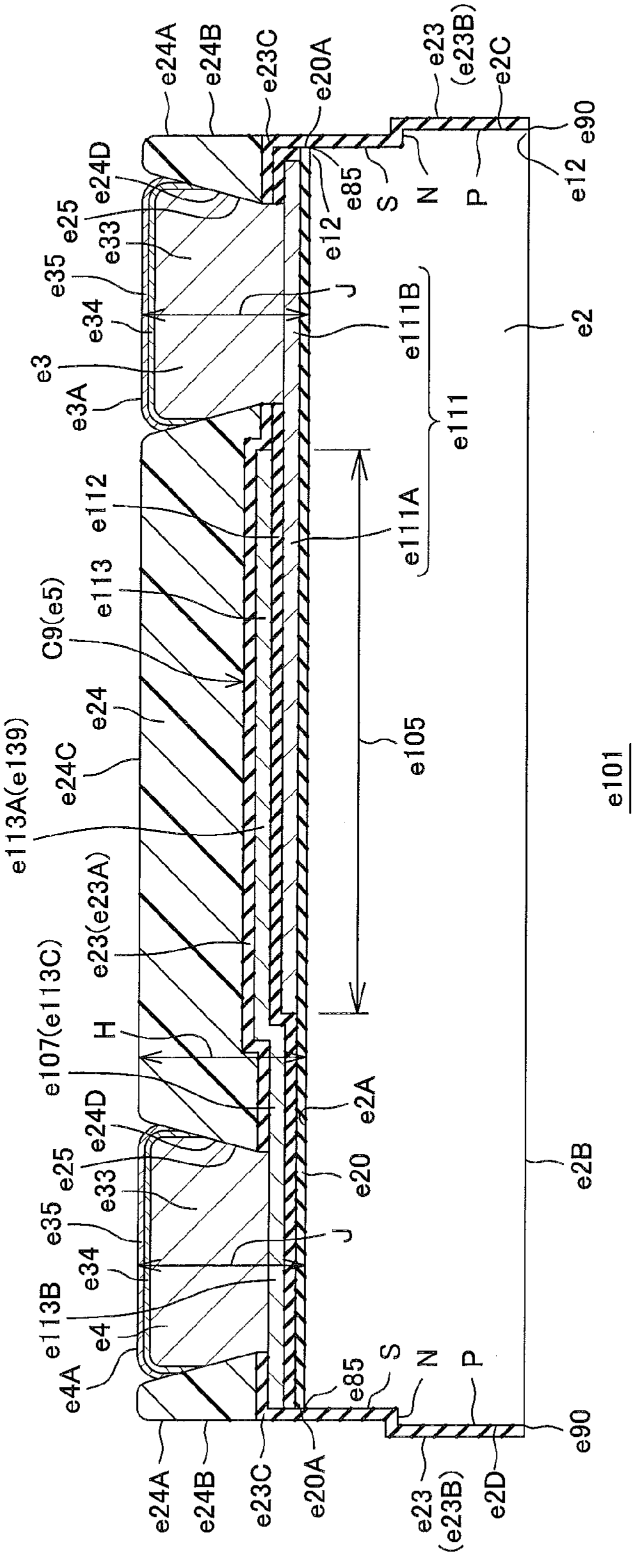

FIG. 126 is a sectional view taken along section line CXXVI-CXXVI in FIG. 125.

Figure 127:
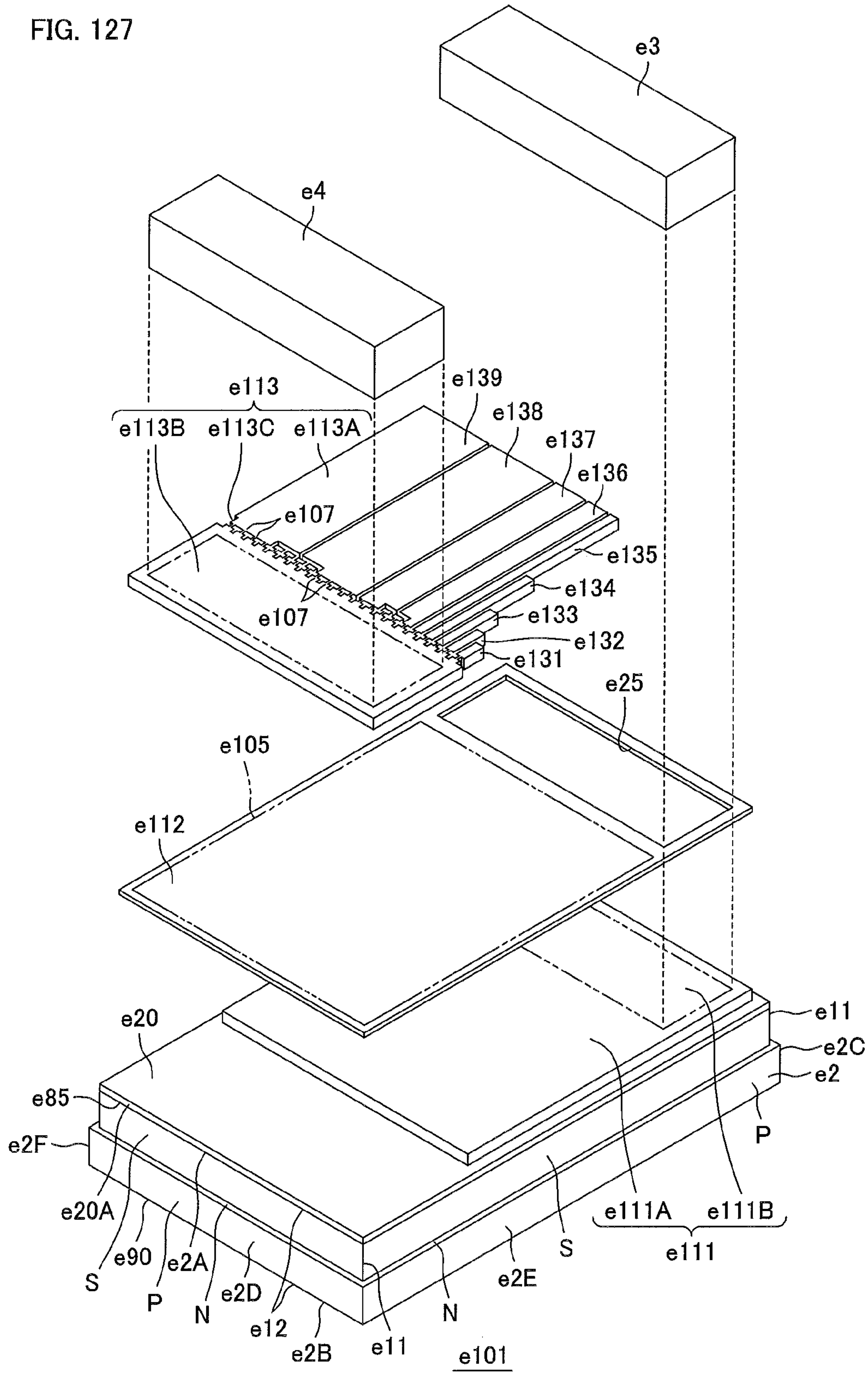

FIG. 127 is an exploded perspective view showing the arrangement of a portion of the chip capacitor in a separated state.

Figure 128:
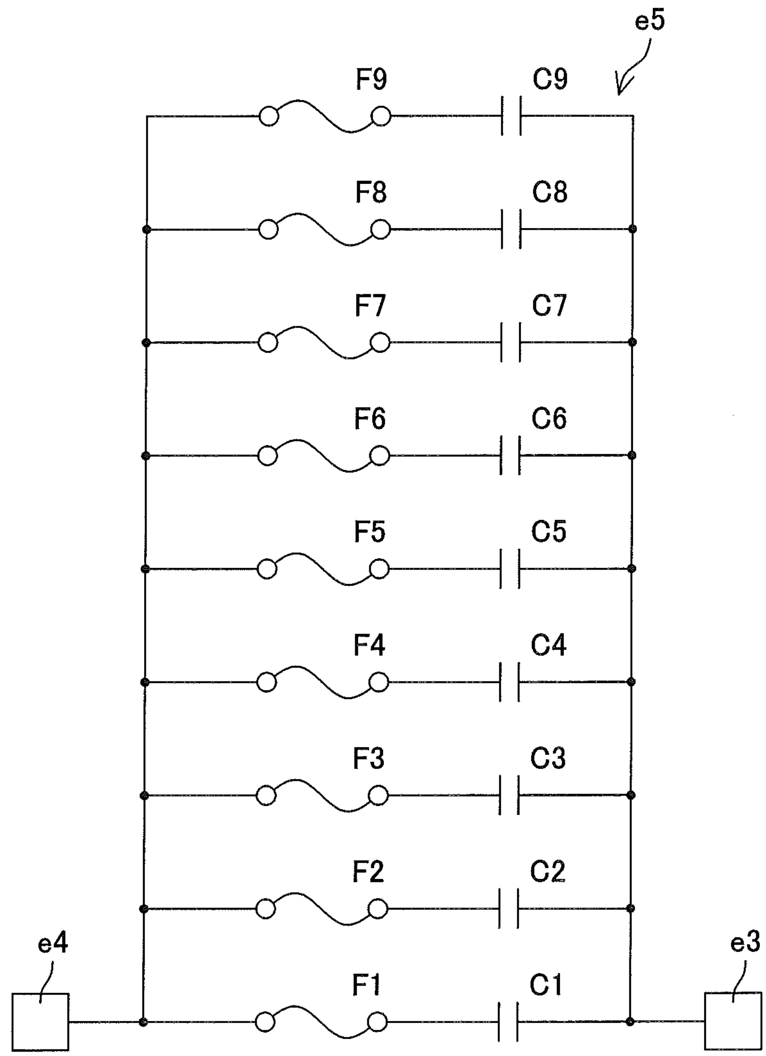

FIG. 128 is a circuit diagram of the electrical arrangement of the interior of the chip capacitor.

Figure 129:
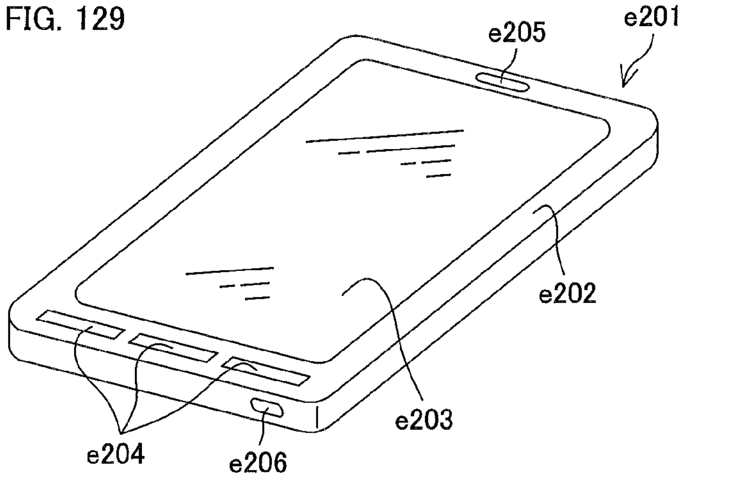

FIG. 129 is a perspective view of an outer appearance of a smartphone that is an example of an electronic equipment in which chip components according to the fifth reference example are used.

Figure 130:
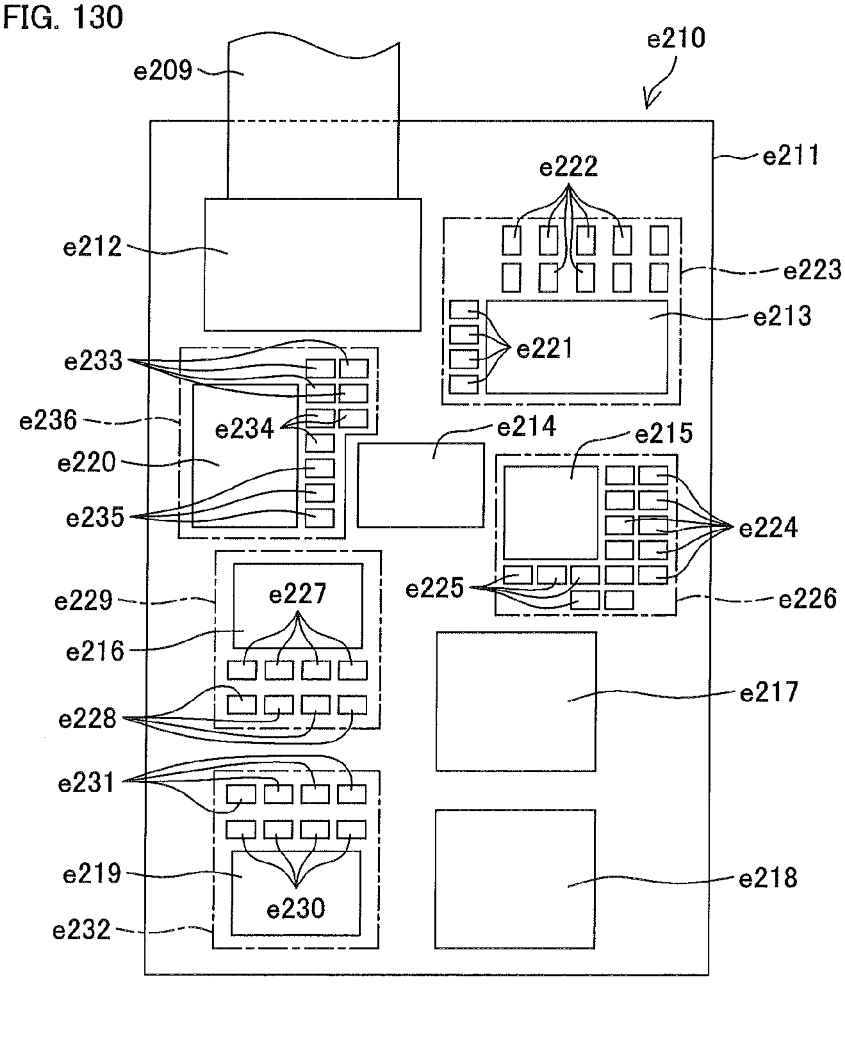

FIG. 130 is an illustrative plan view of the arrangement of an electronic circuit assembly housed in a housing of the smartphone.

Figure 131:
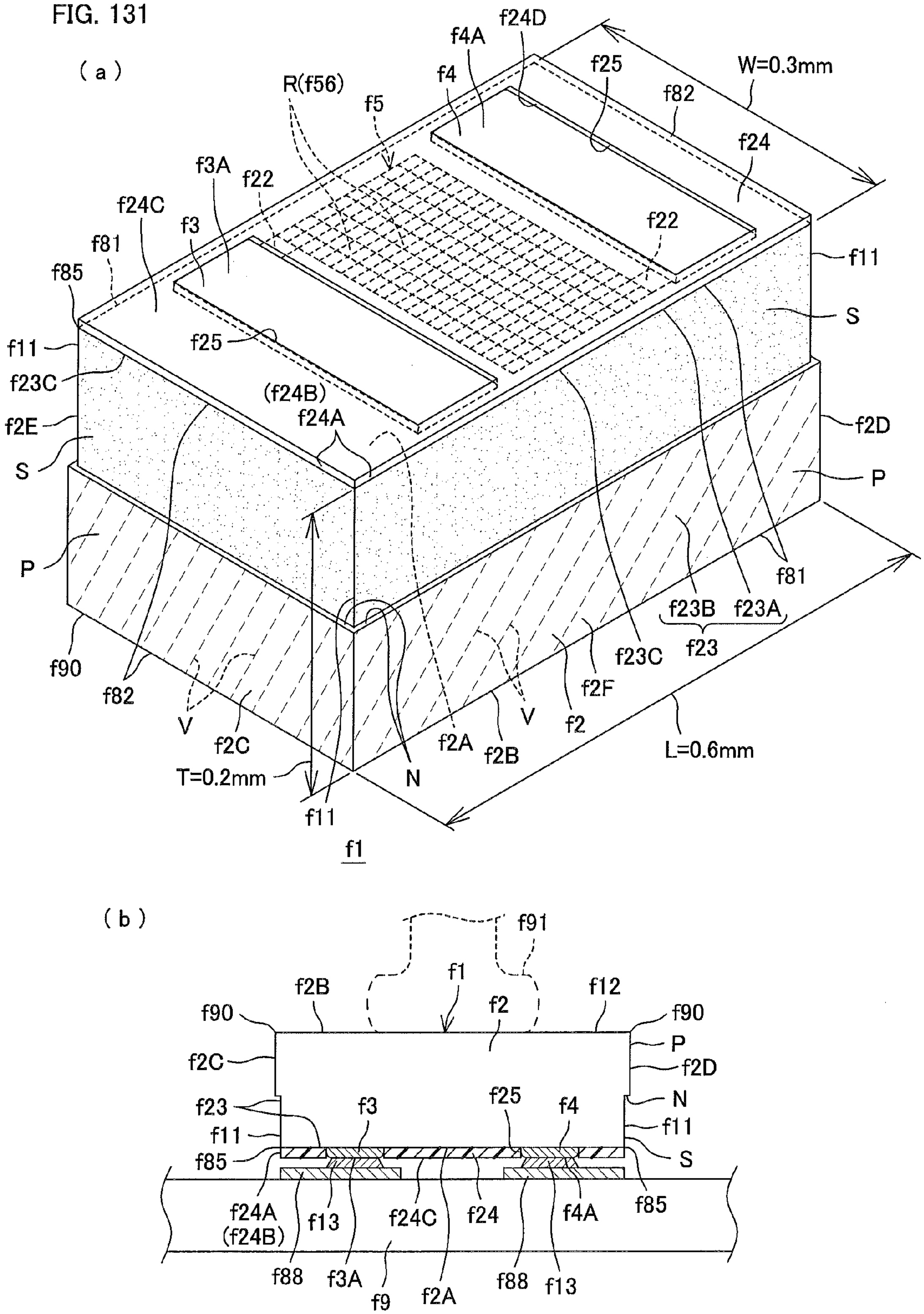

FIG. 131(*a*) is a schematic perspective view for describing the arrangement of a chip resistor according to a preferred embodiment of a sixth reference example, and FIG. 131 (*b*) is a schematic sectional view of a state where the chip resistor is mounted on a mounting substrate.

Figure 132:
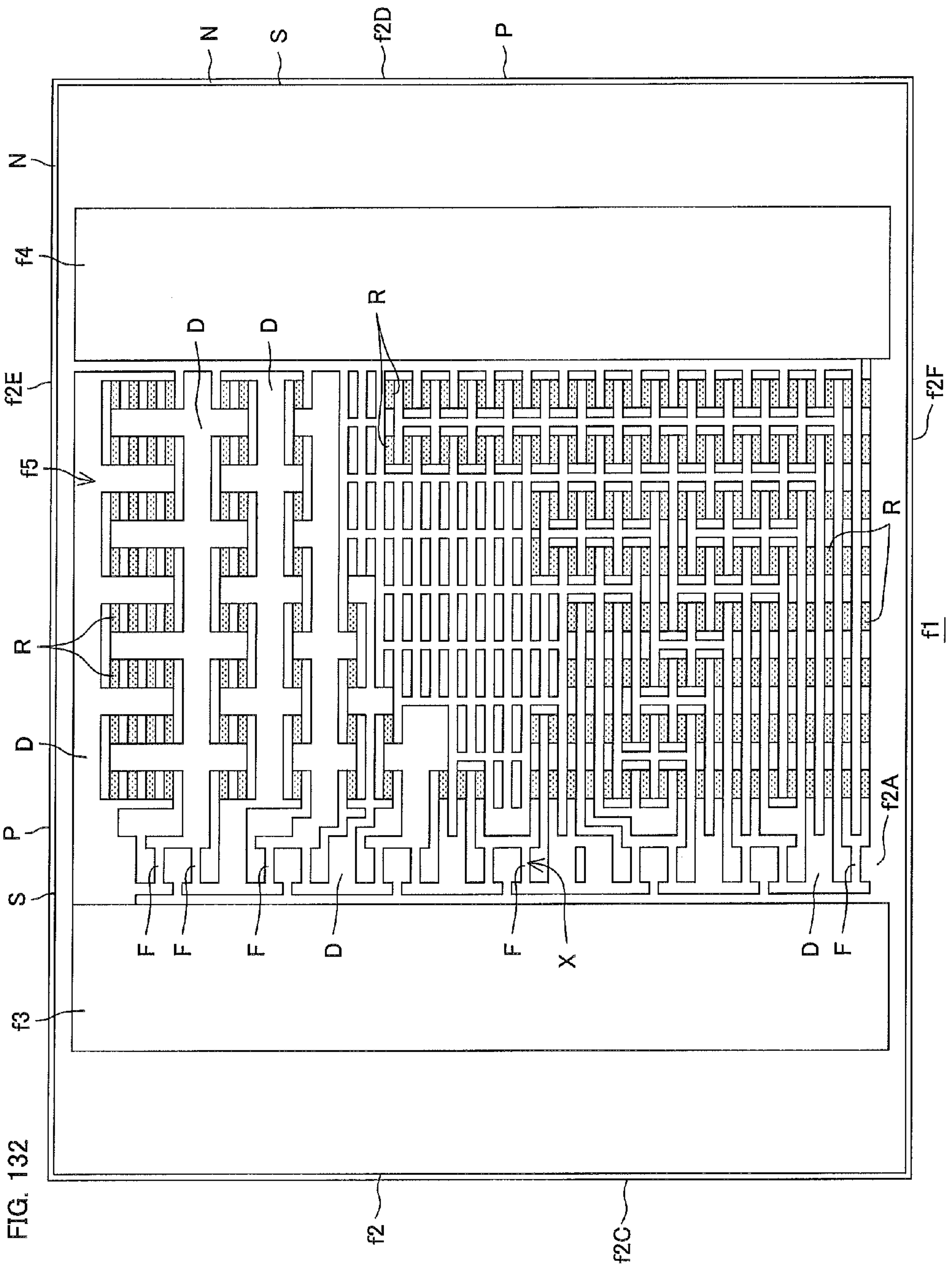

FIG. 132 is a plan view of the chip resistor showing the positional relationship of a first connection electrode, a second connection electrode, and an element and showing the arrangement in a plan view of the element.

Figure 133A:
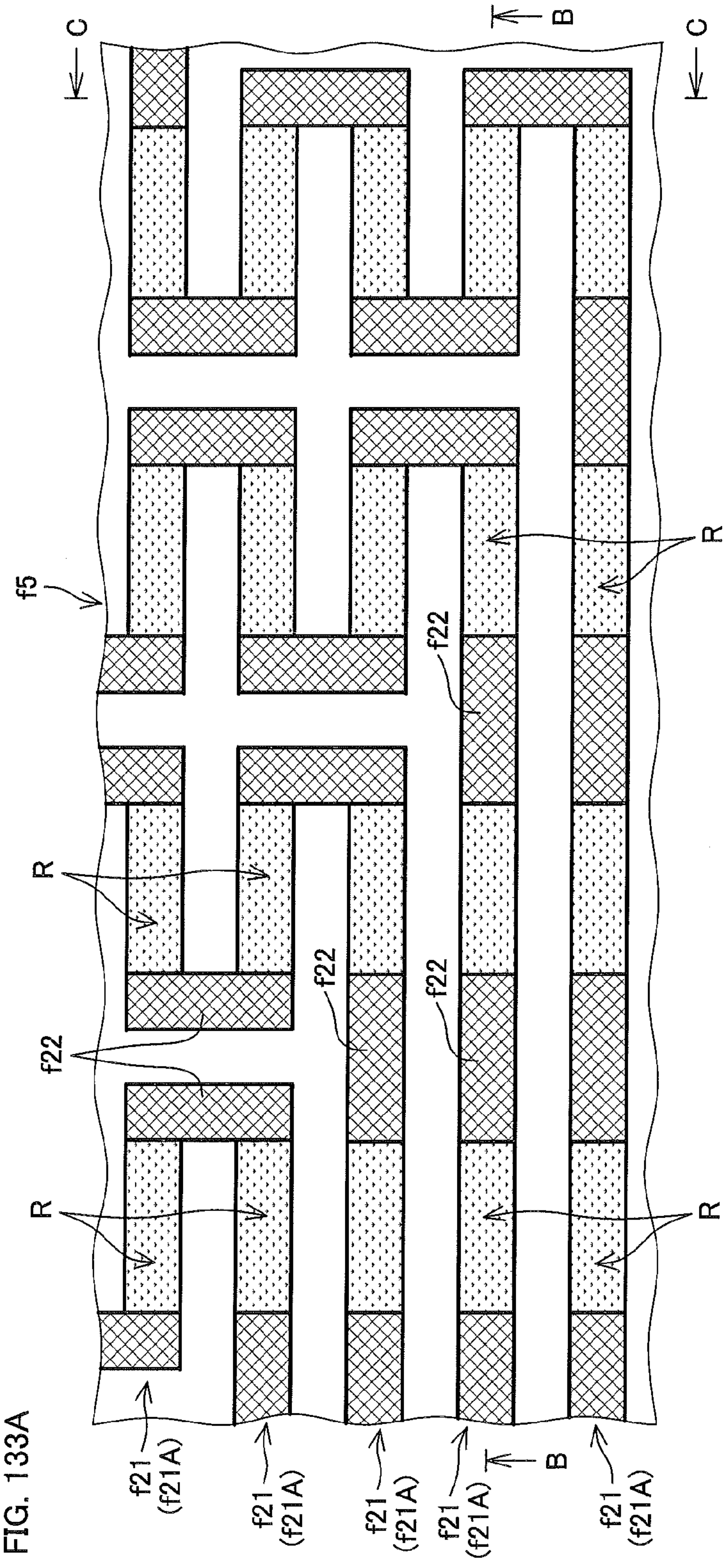

FIG. 133A is a partially enlarged plan view of the element shown in FIG. 132.

Figure 133B:
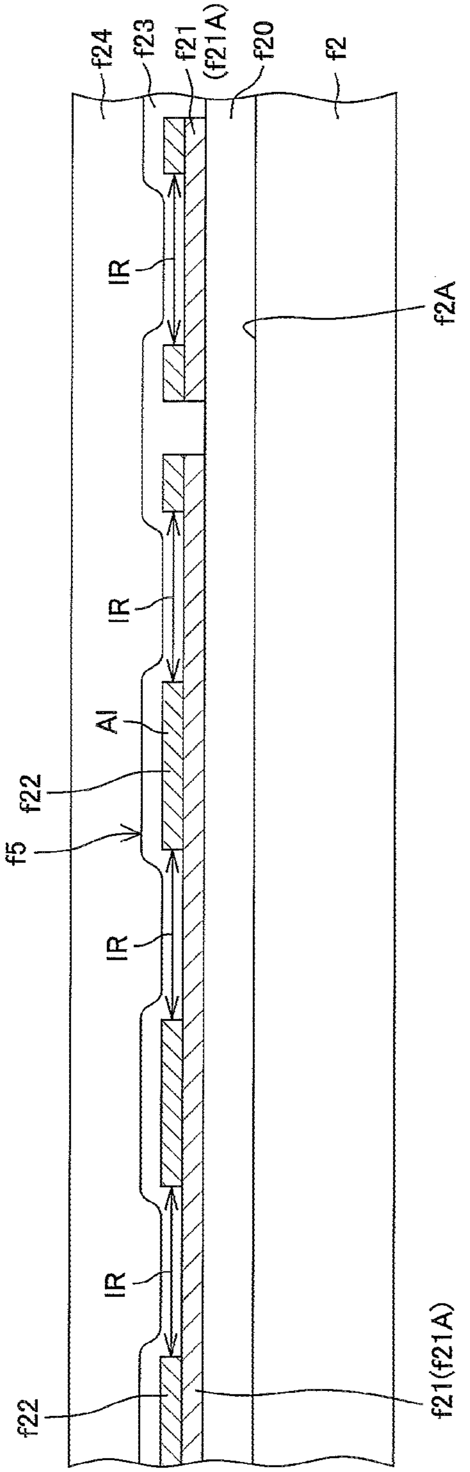

FIG. 133B is a vertical sectional view in the length direction taken along B-B of FIG. 133A for describing the arrangement of resistor bodies in the element.

Figure 133C:
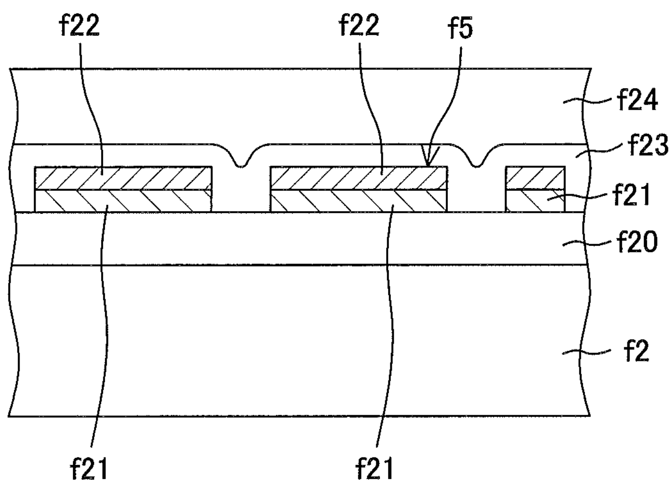

FIG. 133C is a vertical sectional view in the width direction taken along C-C of FIG. 133A for describing the arrangement of the resistor bodies in the element.

Figure 134:
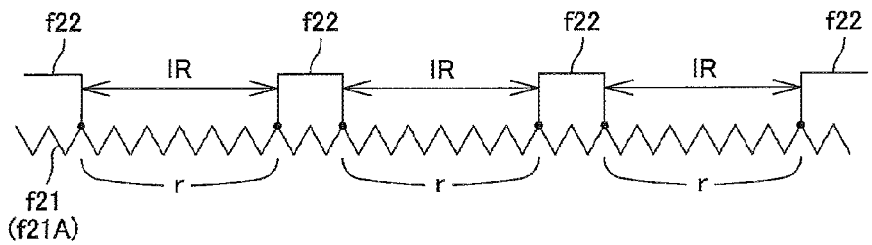
Figure 134:
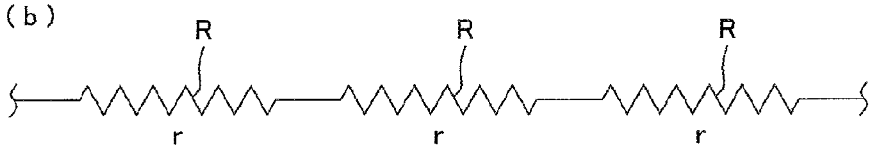
Figure 134:
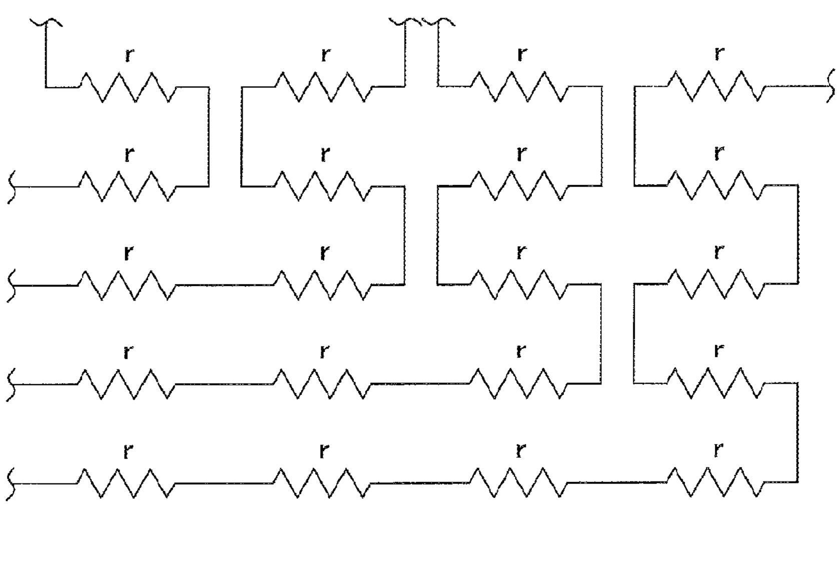

FIG. 134 shows diagrams showing the electrical features of resistor body film lines and conductor films in the form of circuit symbols and an electric circuit diagram.

Figure 135:
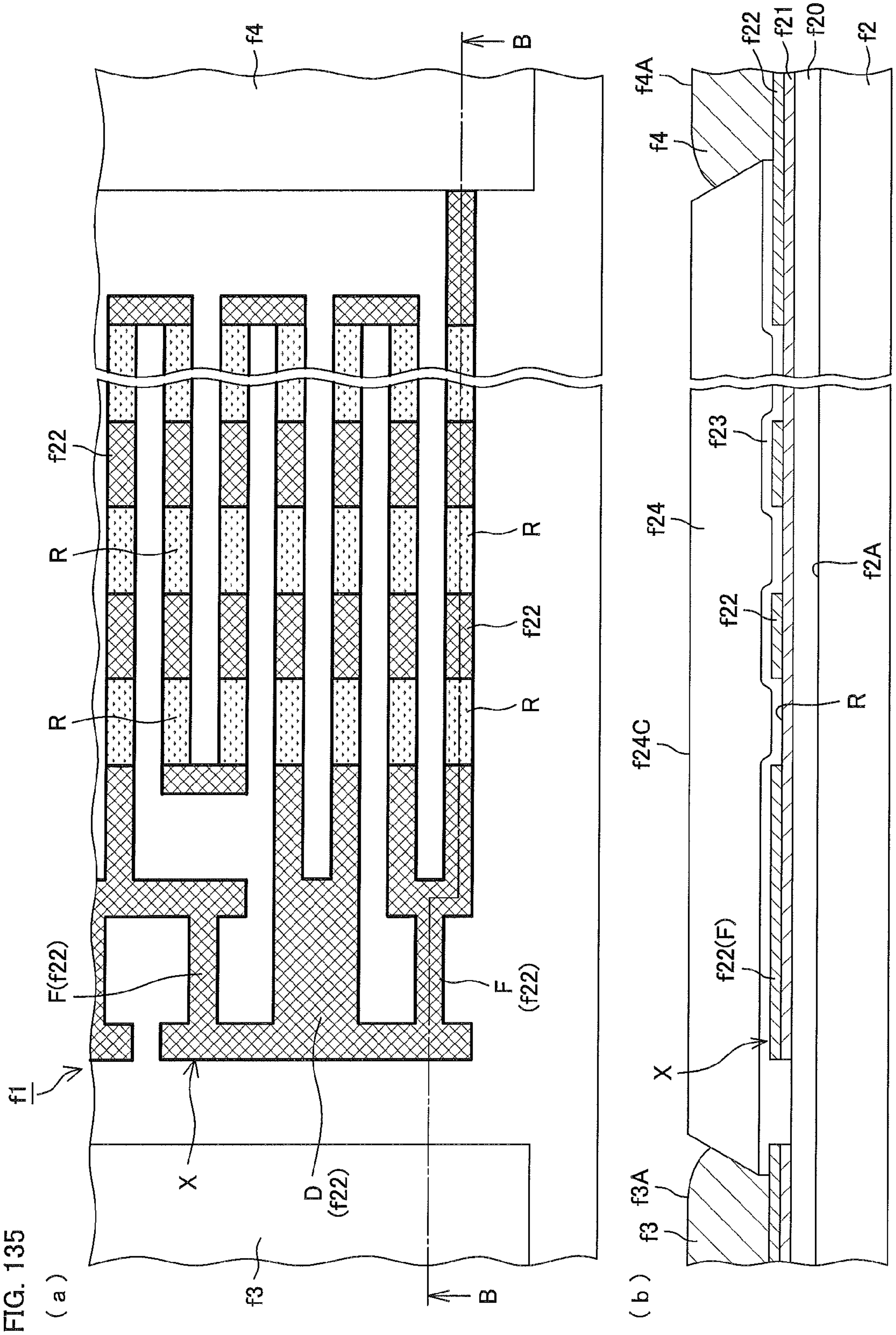

FIG. 135 (*a*) is a partially enlarged plan view of a region including fuses drawn by enlarging a portion of the plan view of the chip resistor shown in FIG. 132, and FIG. 135 (*b*) is a structural sectional view taken along B-B in FIG. 135 (*a*).

Figure 136:
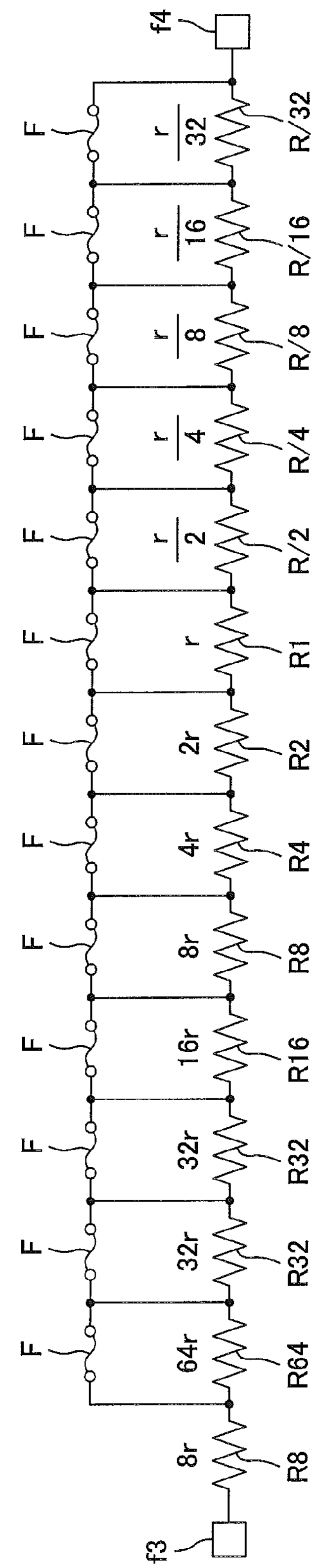

FIG. 136 is an electric circuit diagram of the element according to the preferred embodiment of the sixth reference example.

Figure 137:
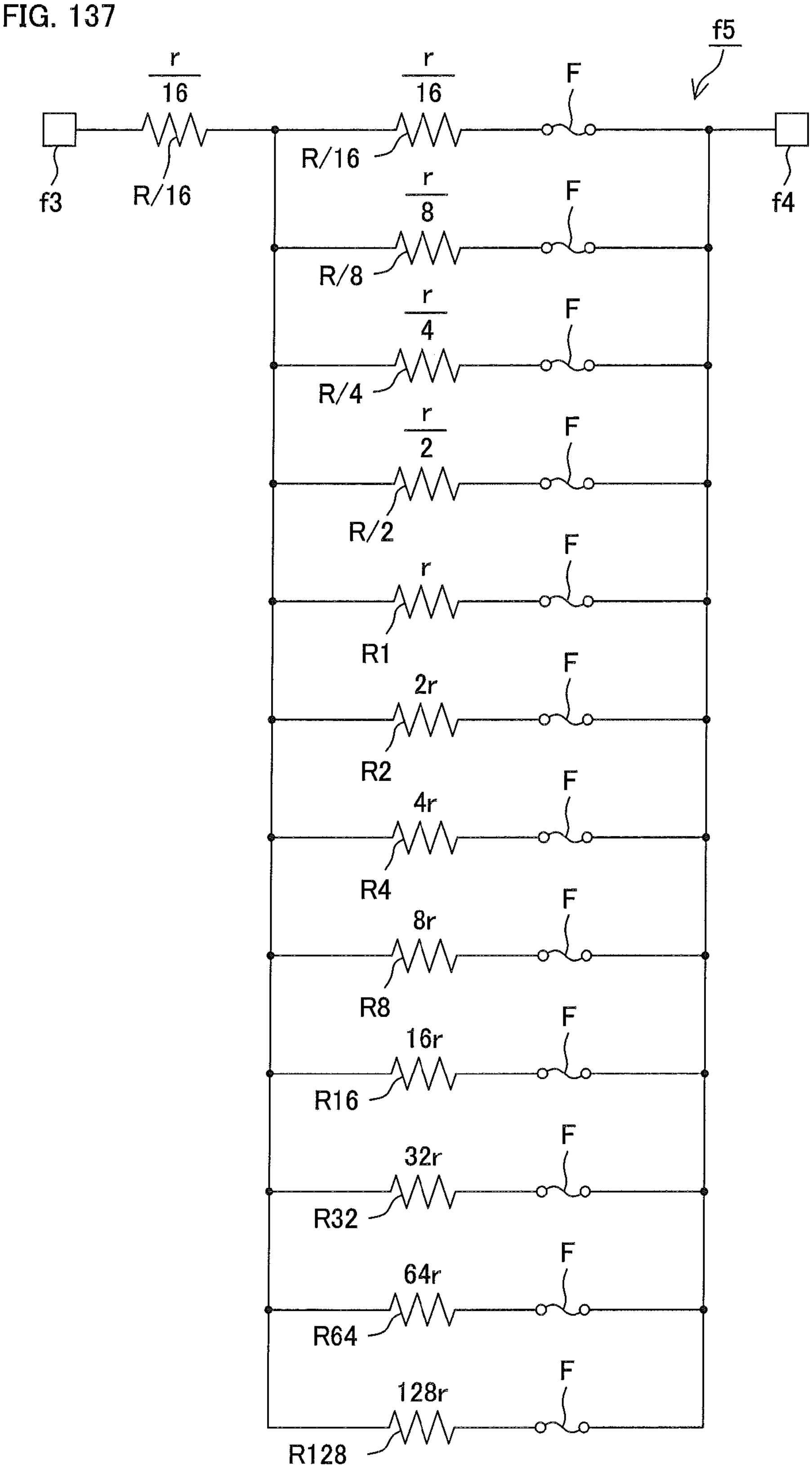

FIG. 137 is an electric circuit diagram of an element according to another preferred embodiment of the sixth reference example.

Figure 138:
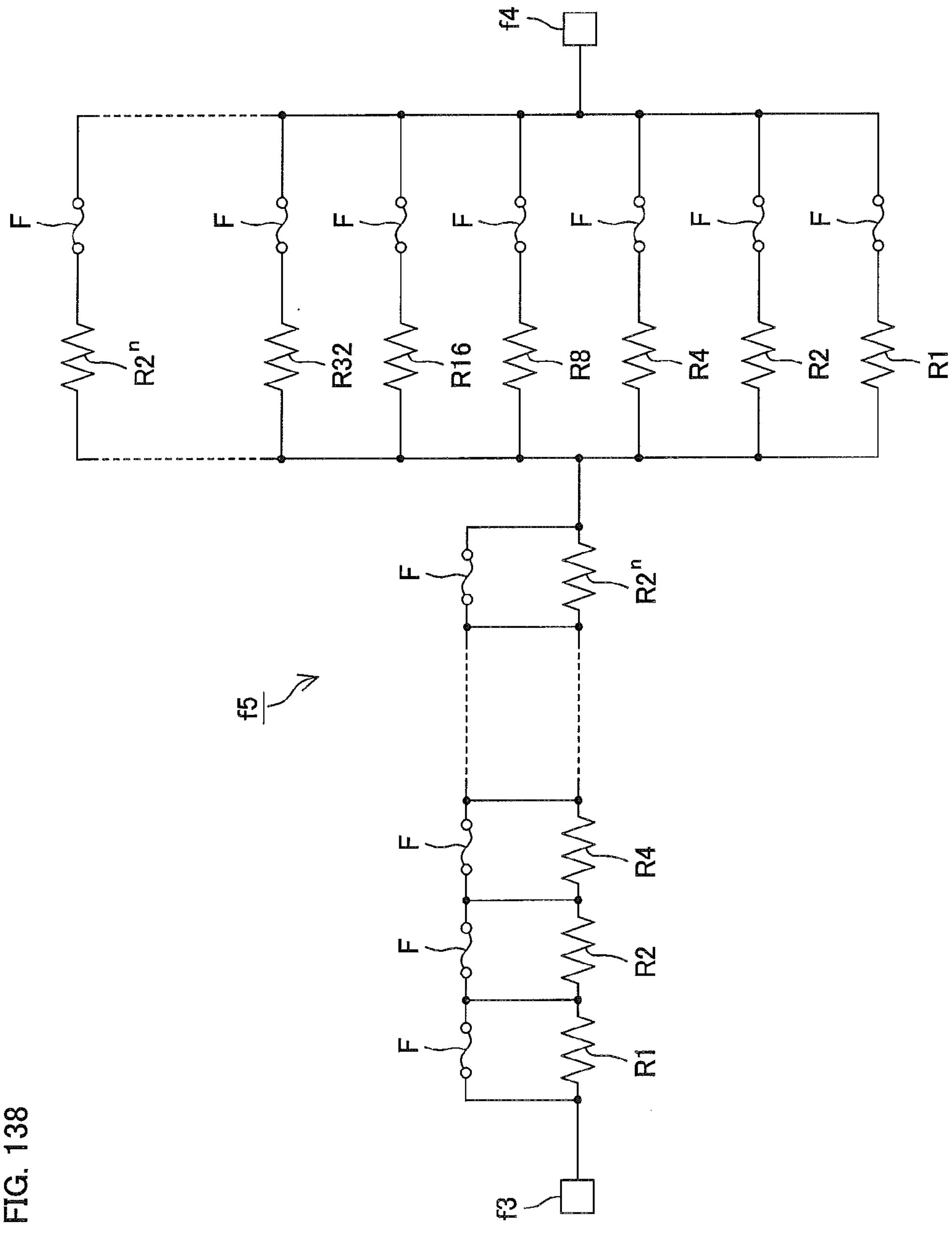

FIG. 138 is an electric circuit diagram of an element according to yet another preferred embodiment of the sixth reference example.

Figure 139:
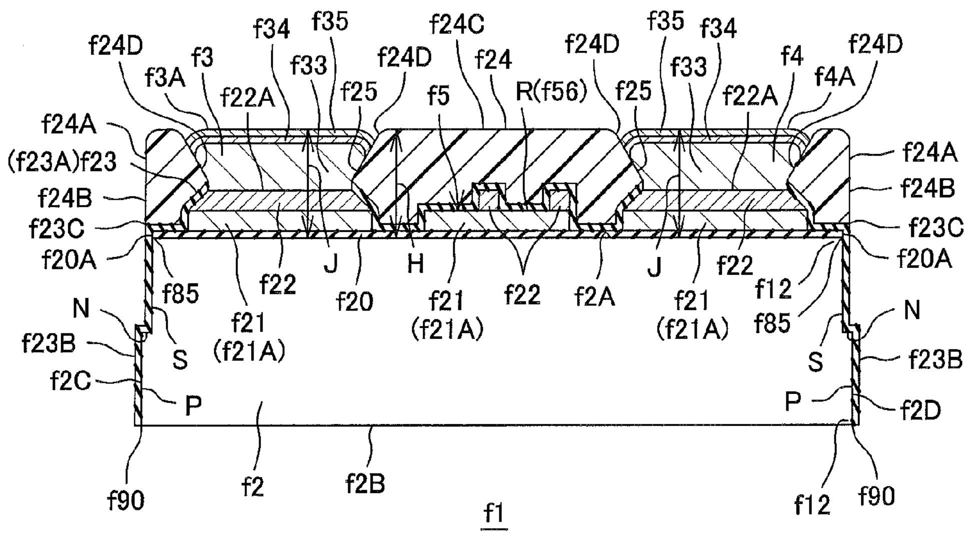

FIG. 139 is a schematic sectional view of the chip resistor.

Figure 140A:
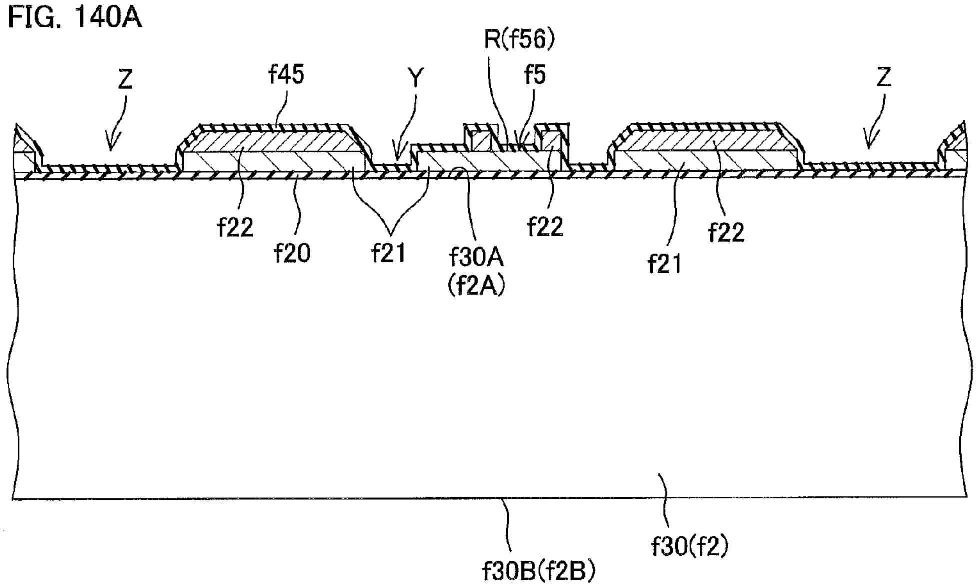

FIG. 140A is an illustrative sectional view of a method for manufacturing the chip resistor shown in FIG. 139.

Figure 140B:
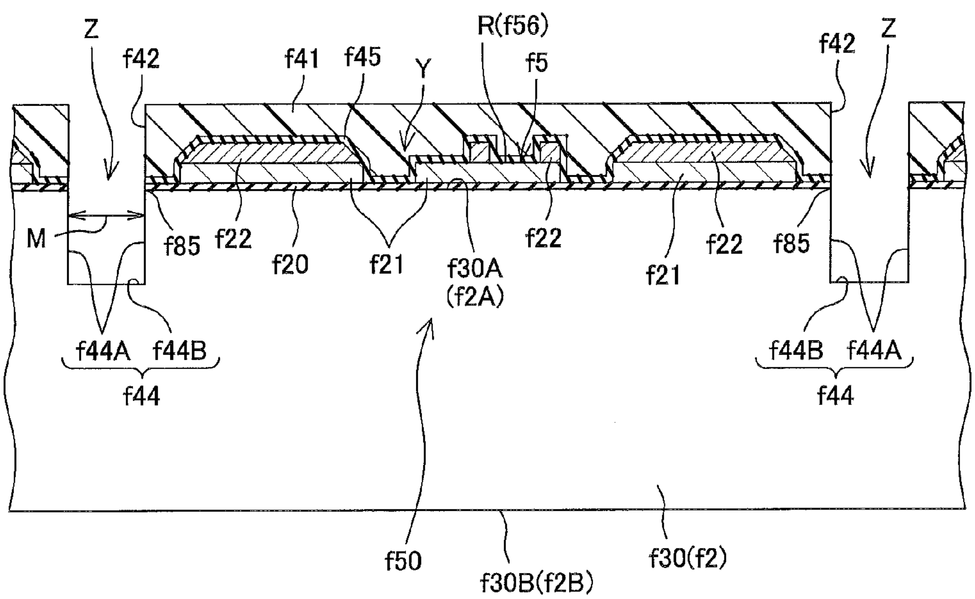

FIG. 140B is an illustrative sectional view of a step subsequent to that of FIG. 140A.

Figure 140C:
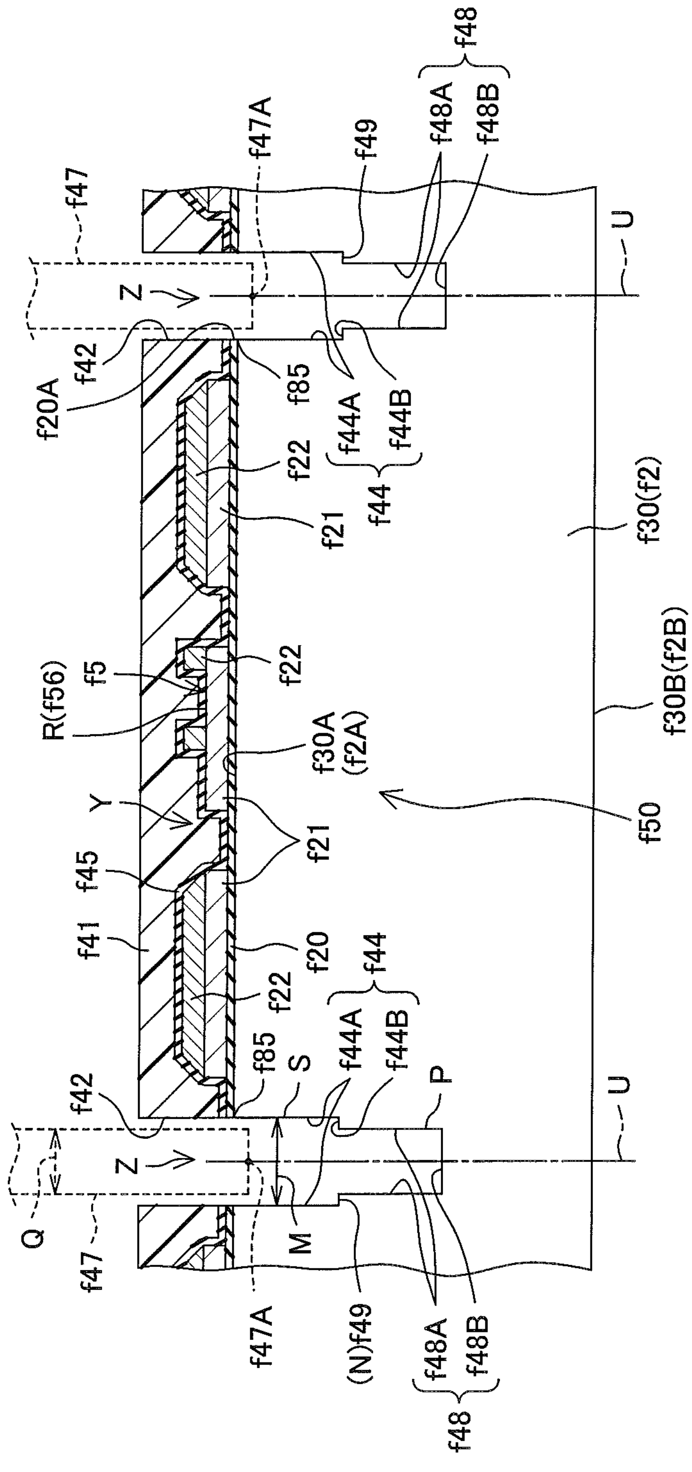

FIG. 140C is an illustrative sectional view of a step subsequent to that of FIG. 140B.

Figure 140D:
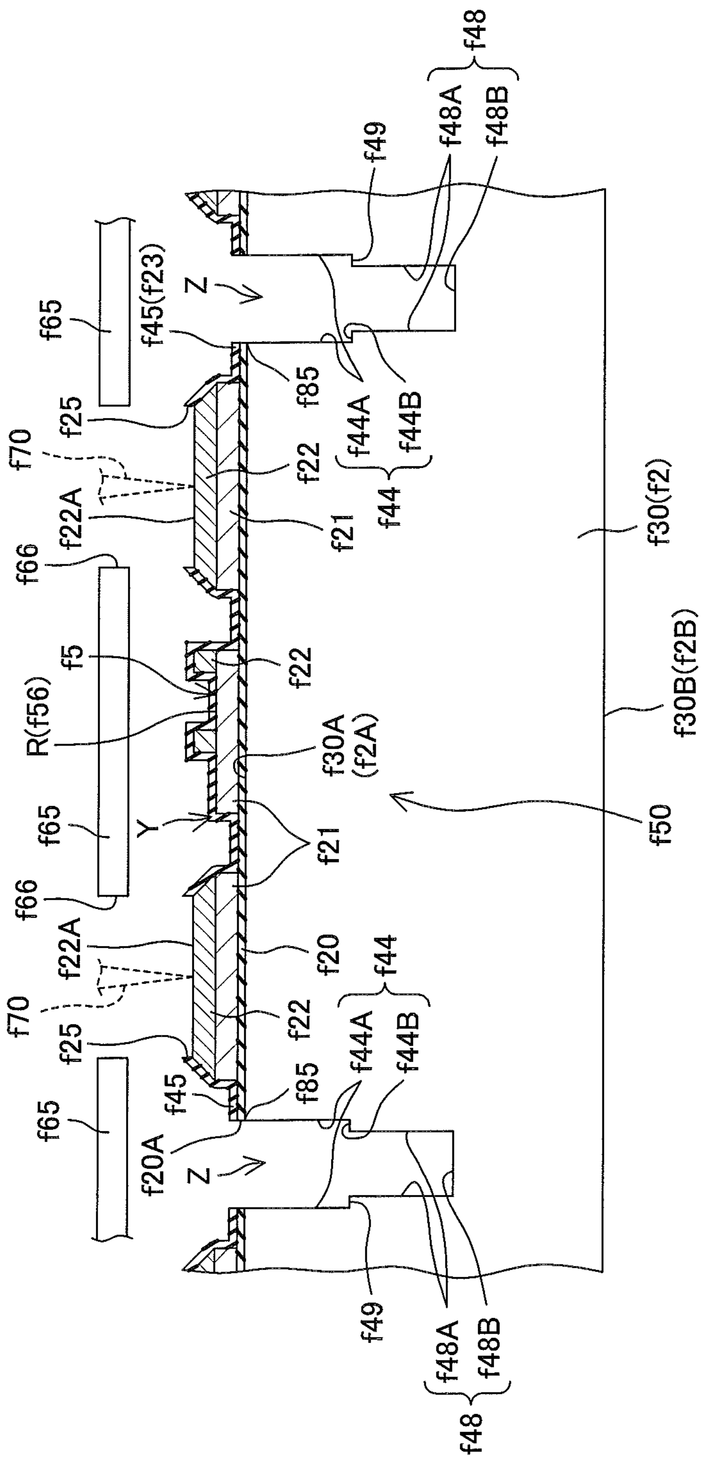

FIG. 140D is an illustrative sectional view of a step subsequent to that of FIG. 140C.

Figure 140E:
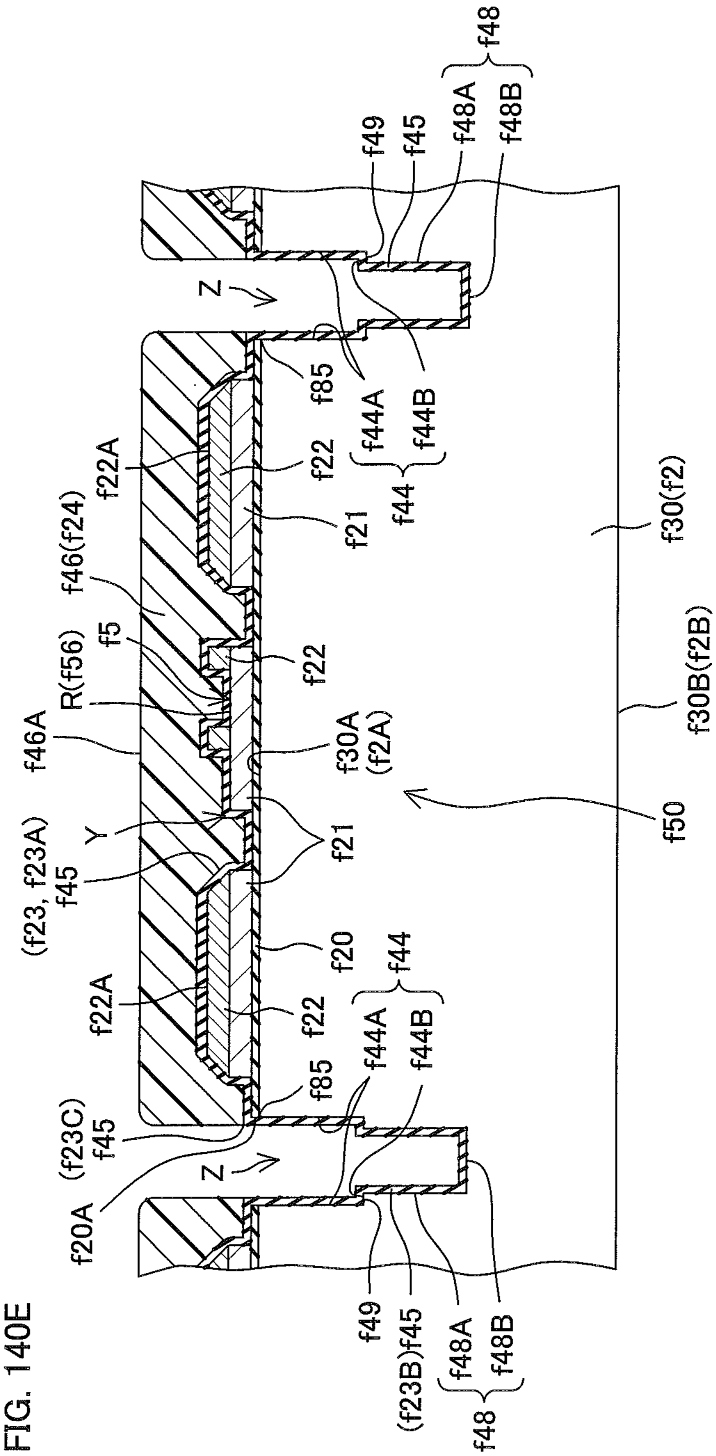

FIG. 140E is an illustrative sectional view of a step subsequent to that of FIG. 140D.

Figure 140F:
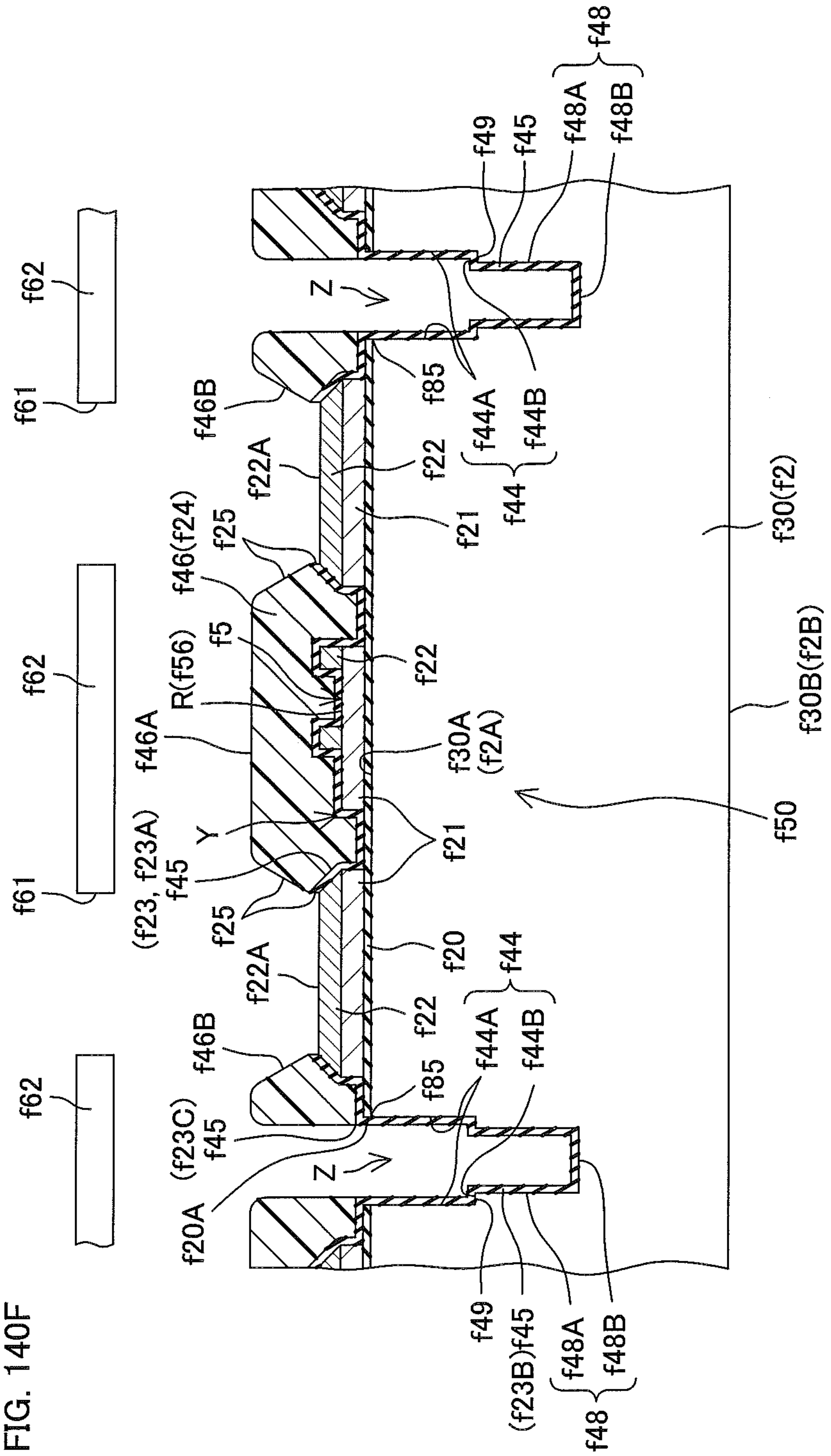

FIG. 140F is an illustrative sectional view of a step subsequent to that of FIG. 140E.

Figure 140G:
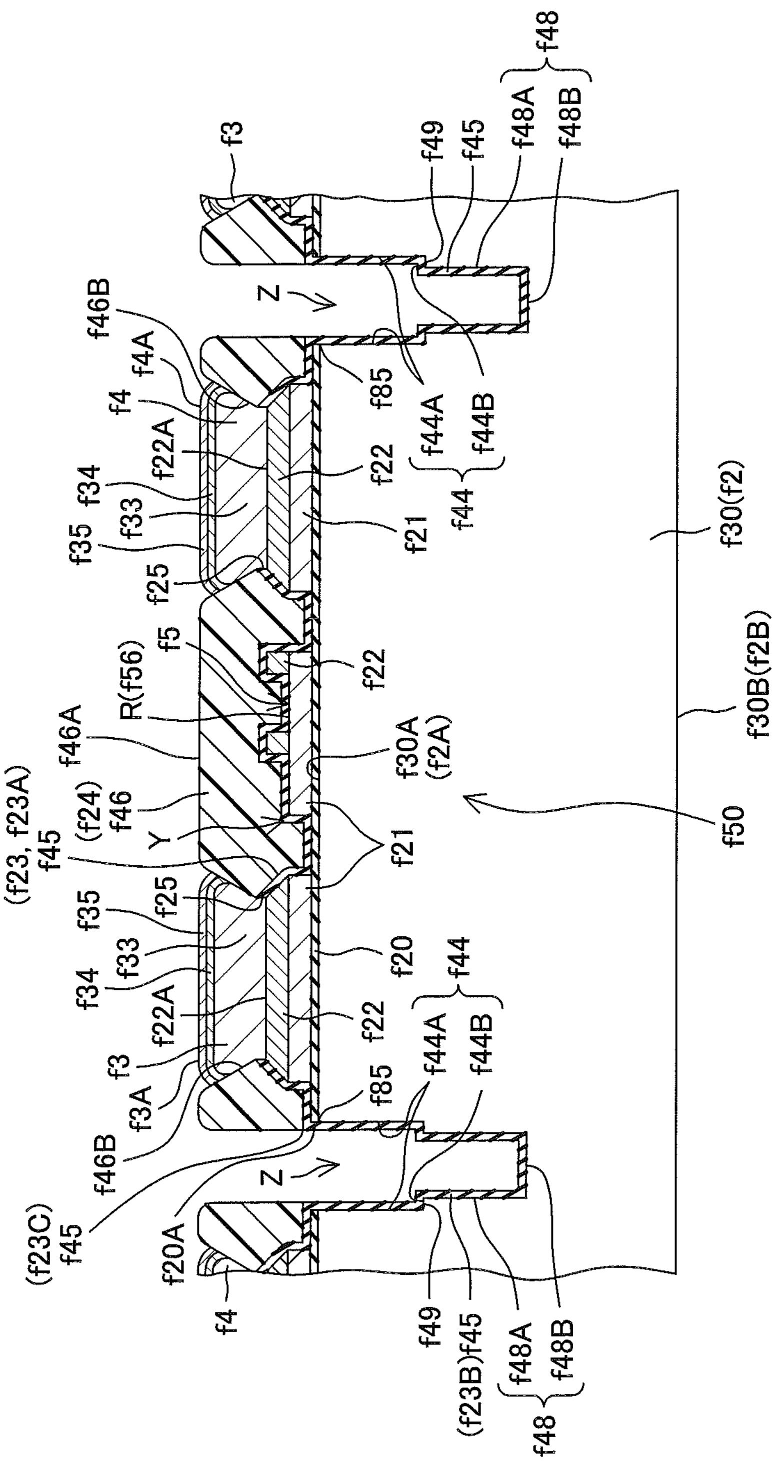

FIG. 140G is an illustrative sectional view of a step subsequent to that of FIG. 140F.

Figure 140H:
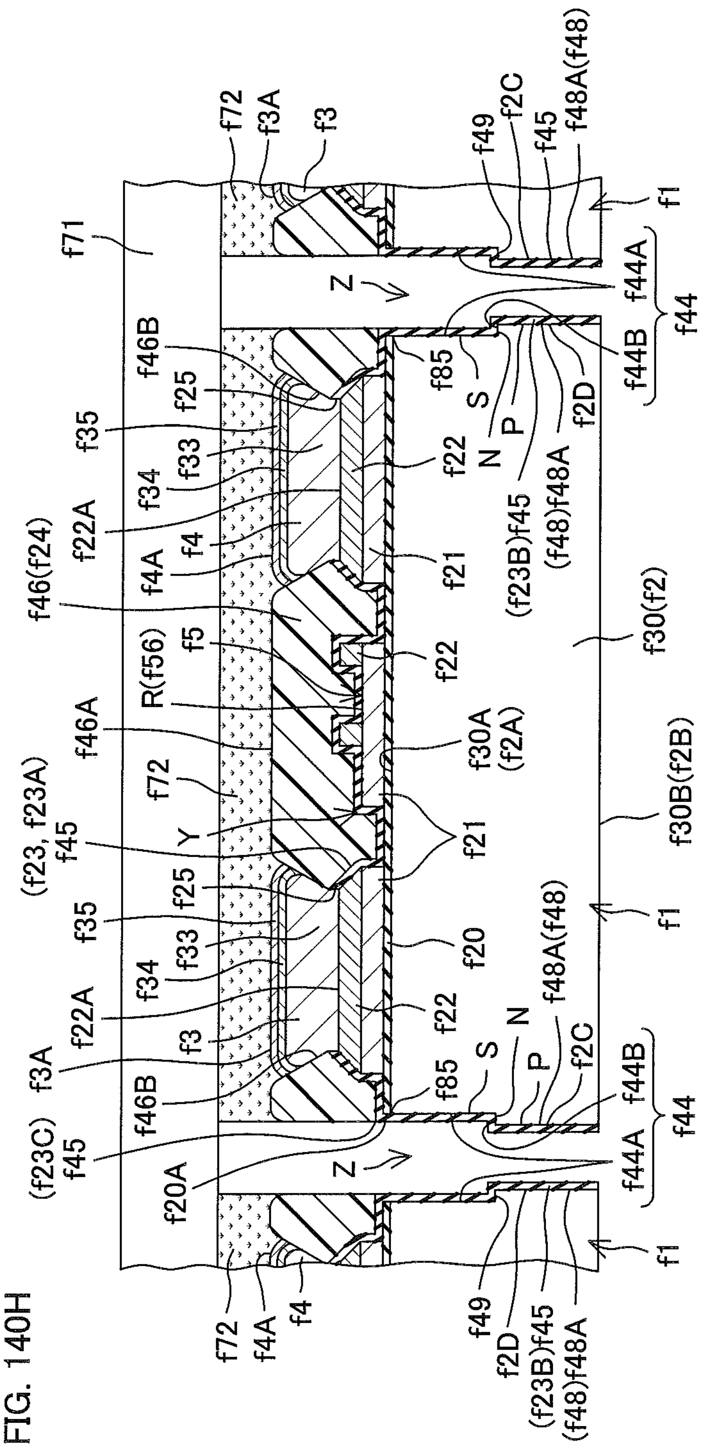

FIG. 140H is an illustrative sectional view of a step subsequent to that of FIG. 140G.

Figure 141:
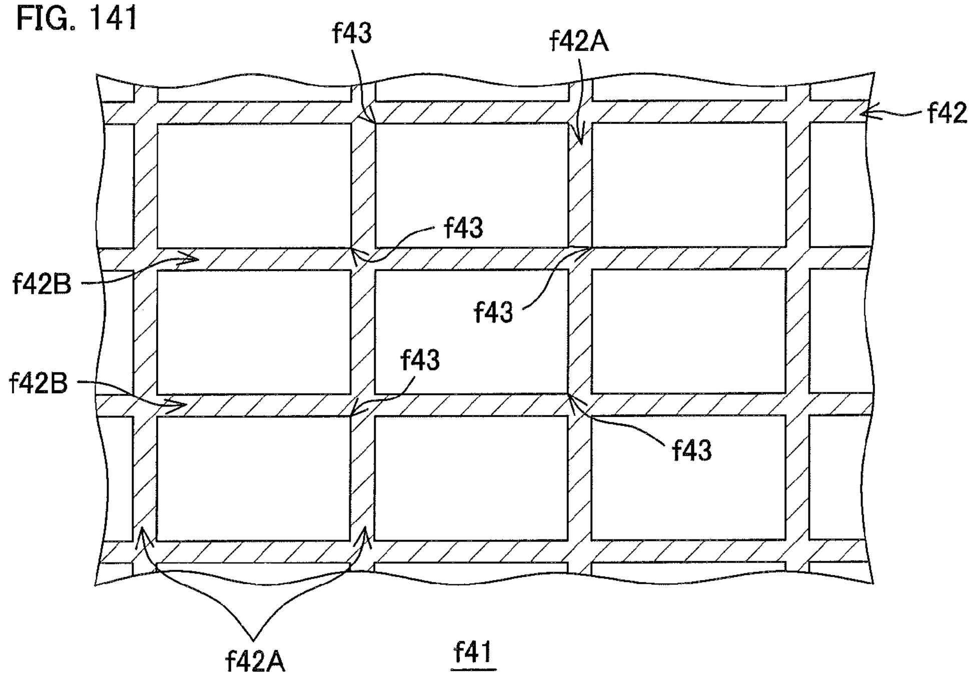

FIG. 141 is a schematic plan view of a portion of a resist pattern used for forming a first groove in the step of FIG. 140B.

Figure 142:
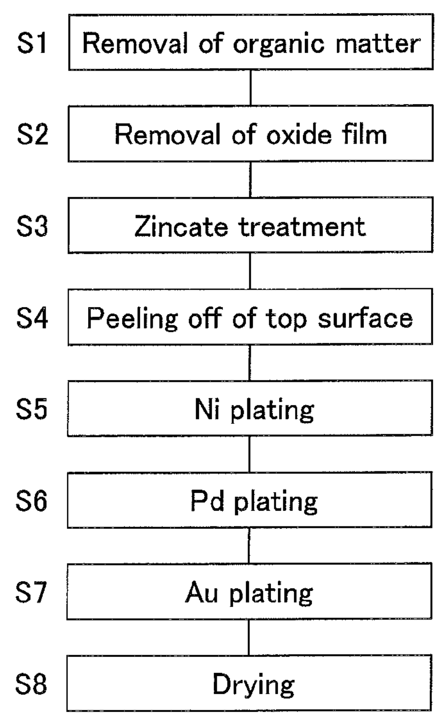

FIG. 142 is a diagram for describing a process for manufacturing a first connection electrode and a second connection electrode.

Figure 143:
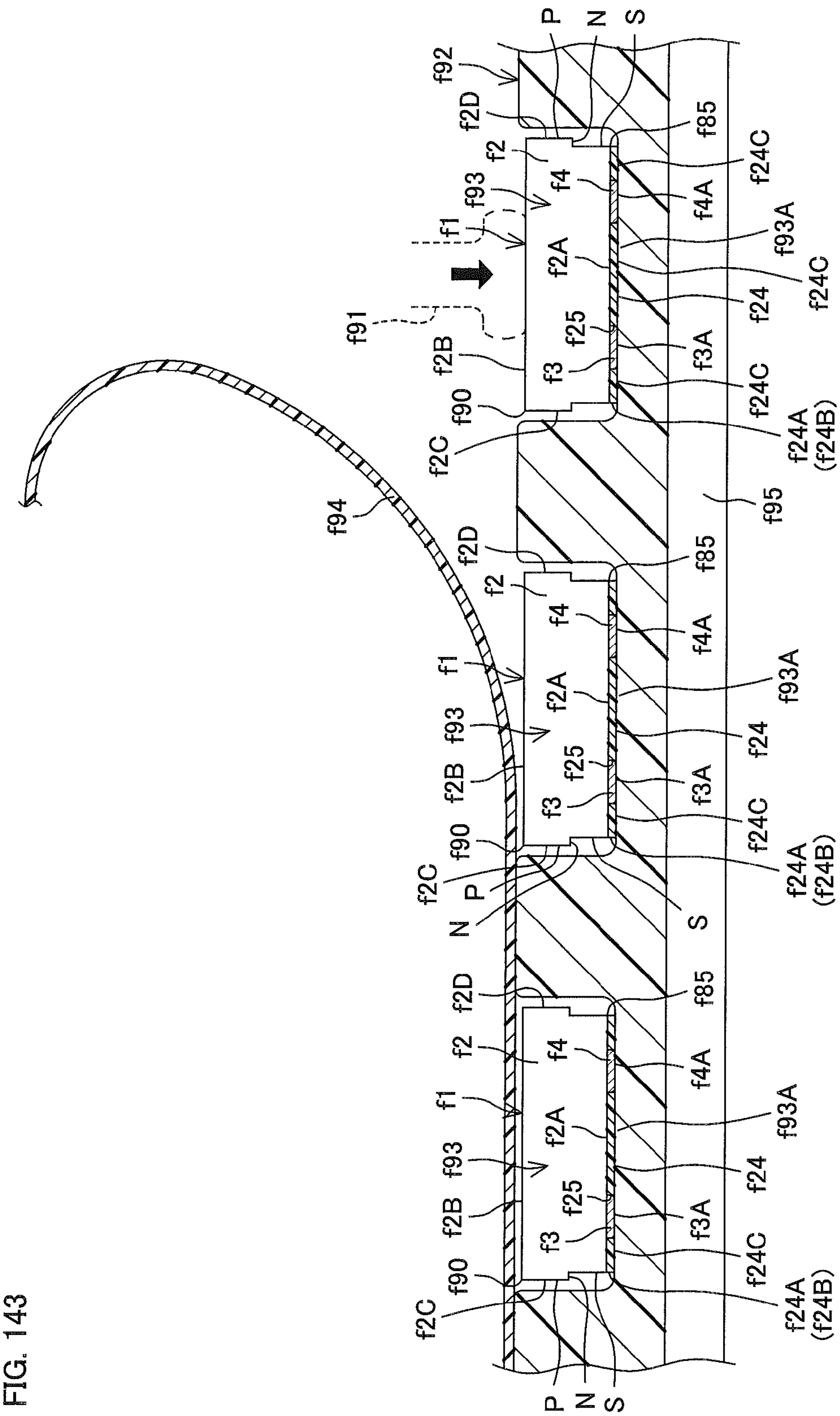

FIG. 143 is a schematic view for describing how finished chip resistors are housed in an embossed carrier tape.

Figure 144:
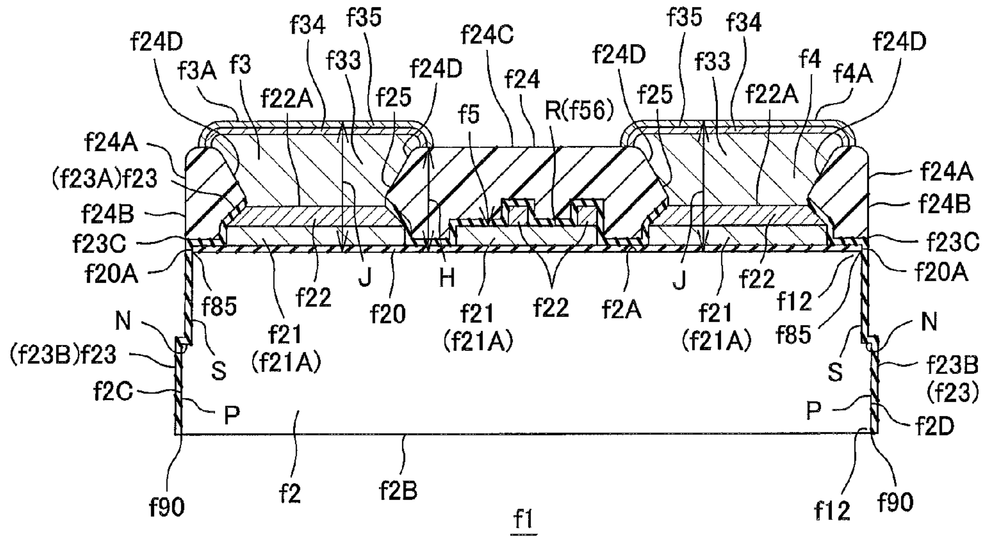

FIG. 144 is a schematic sectional view of a chip resistor according to a first modification example of the sixth reference example.

Figure 145:
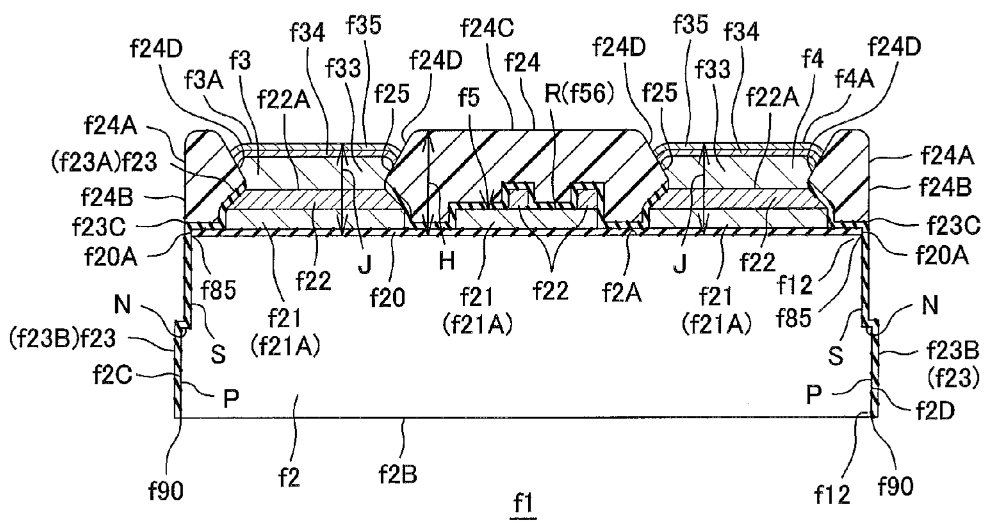

FIG. 145 is a schematic sectional view of a chip resistor according to a second modification example of the sixth reference example.

Figure 146:
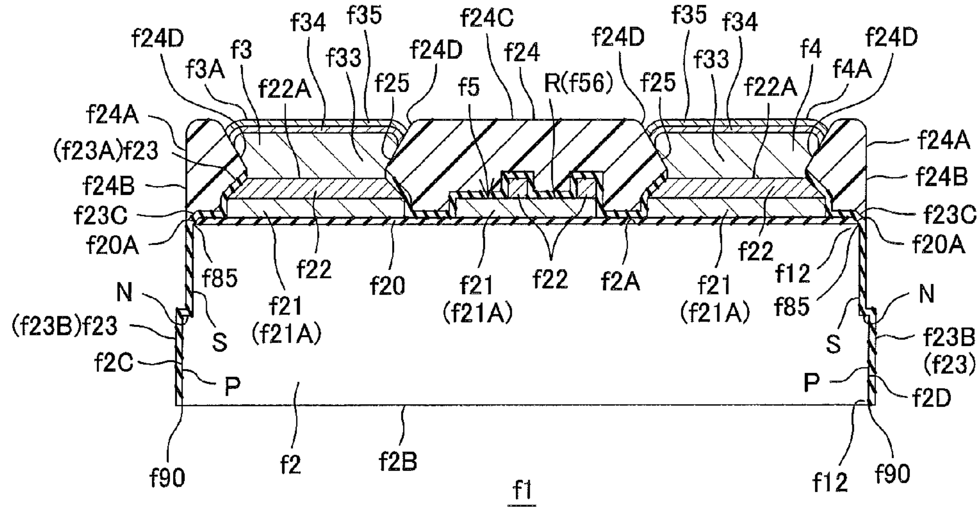

FIG. 146 is a schematic sectional view of a chip resistor according to a third modification example of the sixth reference example.

Figure 147:
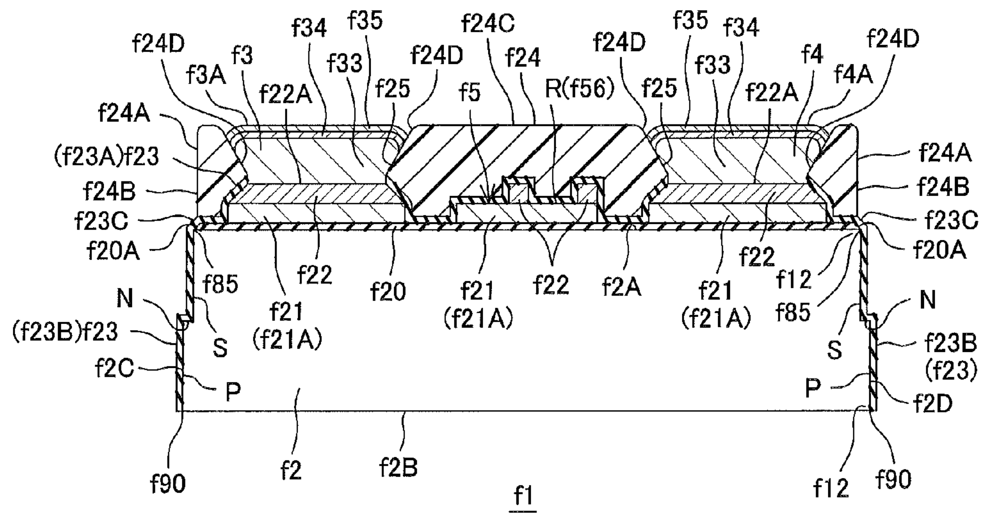

FIG. 147 is a schematic sectional view of a chip resistor according to a fourth modification example of the sixth reference example.

Figure 148:
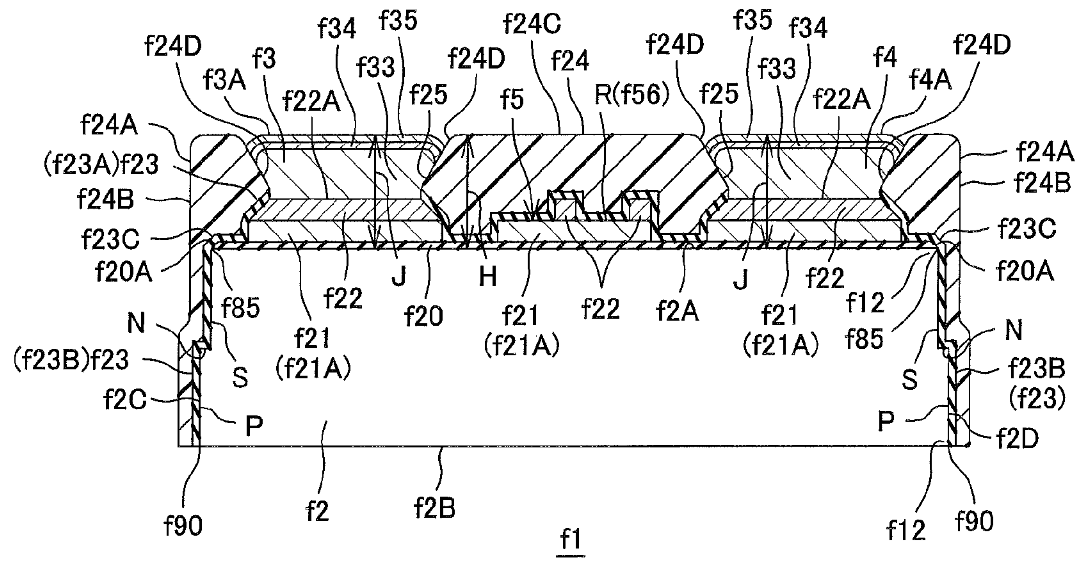

FIG. 148 is a schematic sectional view of a chip resistor according to a fifth modification example of the sixth reference example.

Figure 149:
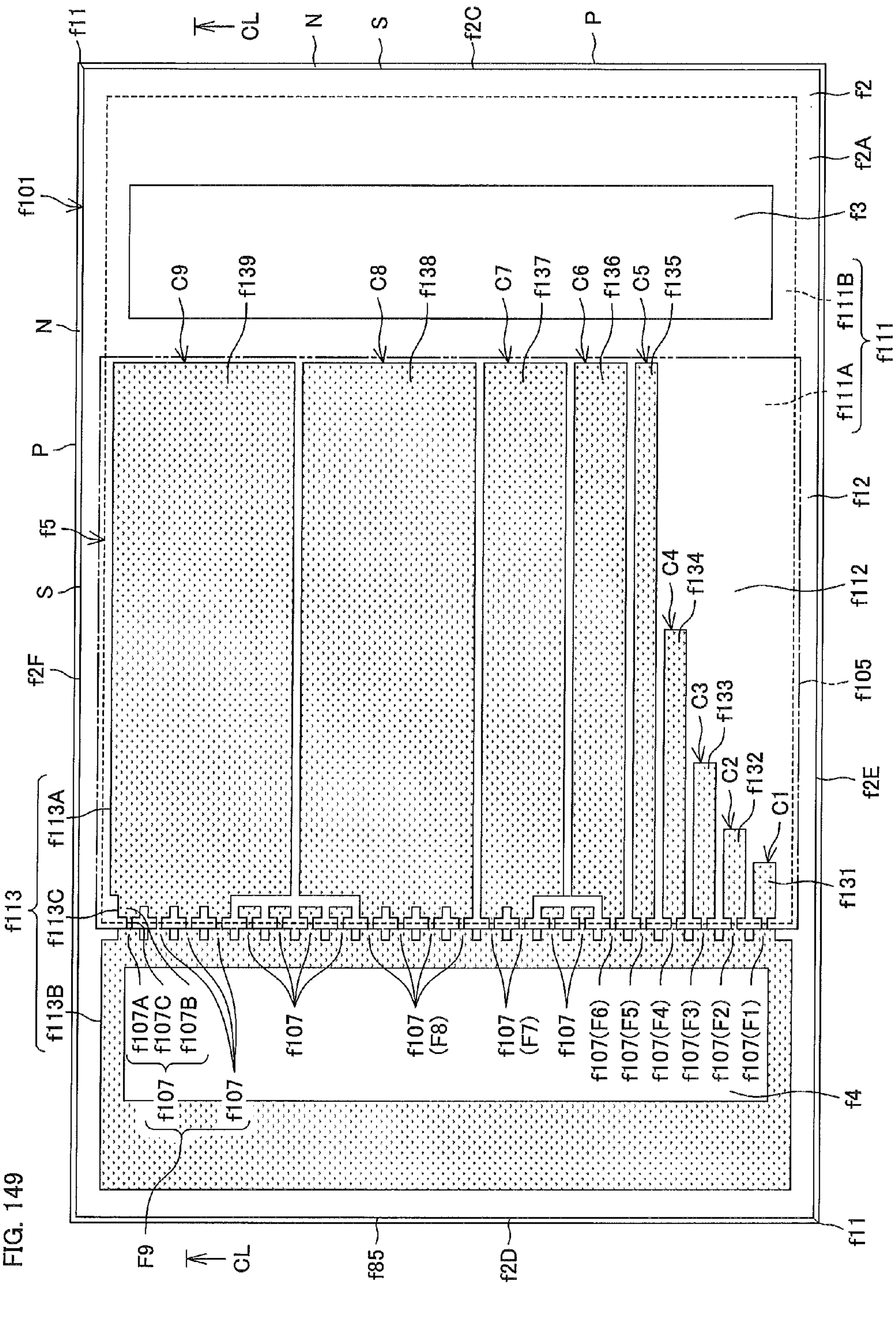

FIG. 149 is a plan view of a chip capacitor according to another preferred embodiment of the sixth reference example.

Figure 150:
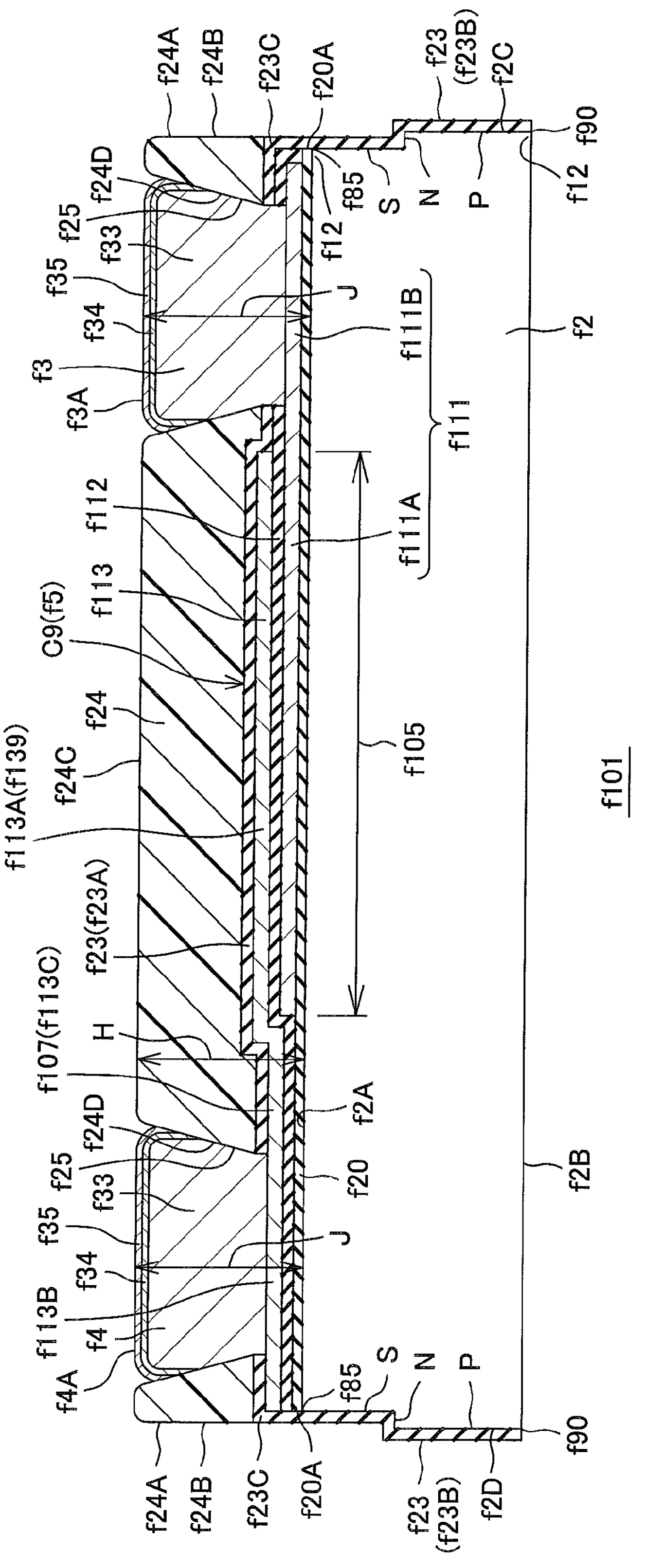

FIG. 150 is a sectional view taken along section line CL-CL in FIG. 149.

Figure 151:
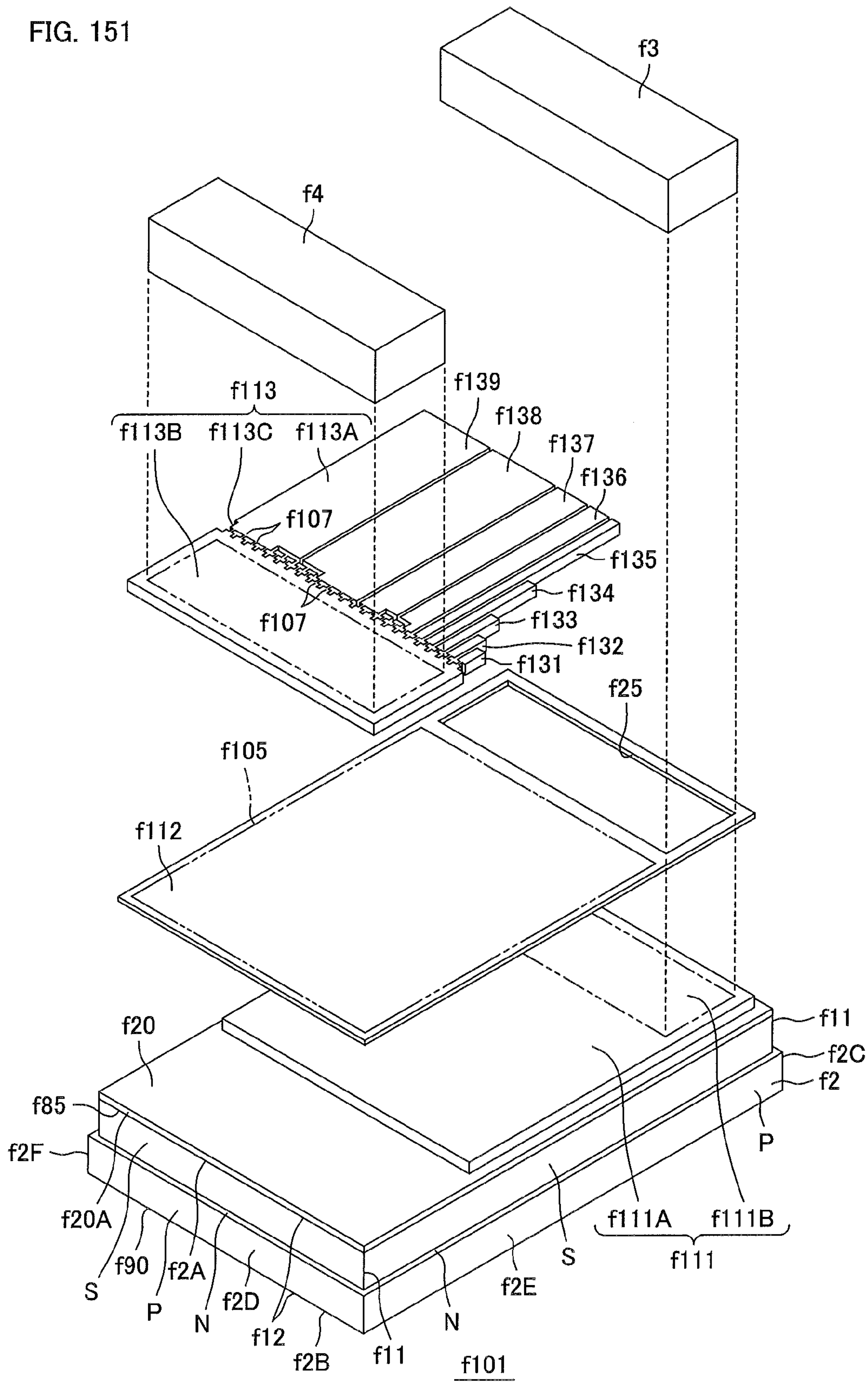

FIG. 151 is an exploded perspective view showing the arrangement of a portion of the chip capacitor in a separated state.

Figure 152:
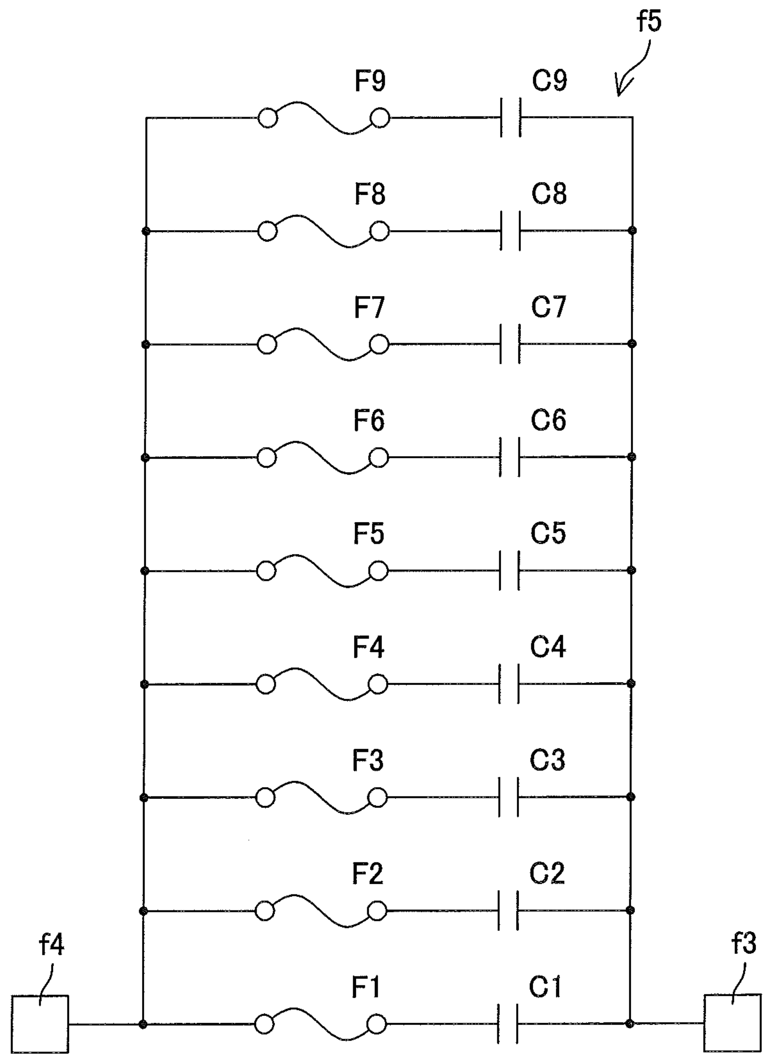

FIG. 152 is a circuit diagram of the electrical arrangement of the interior of the chip capacitor.

Figure 153:
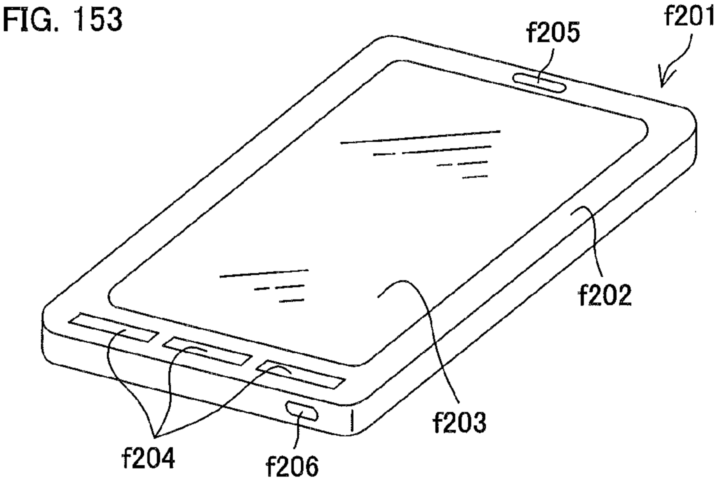

FIG. 153 is a perspective view of an outer appearance of a smartphone that is an example of an electronic equipment in which chip components according to the sixth reference example are used.

Figure 154:
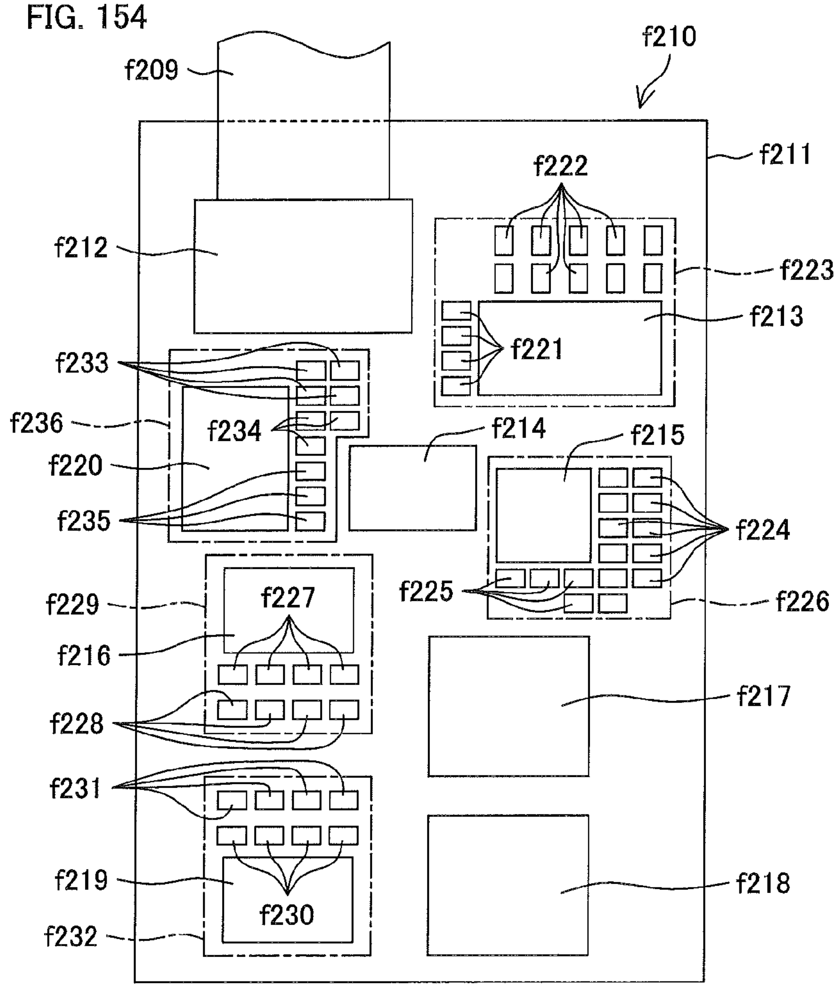

FIG. 154 is an illustrative plan view of the arrangement of an electronic circuit assembly housed in a housing of the smartphone.

Figure 155:
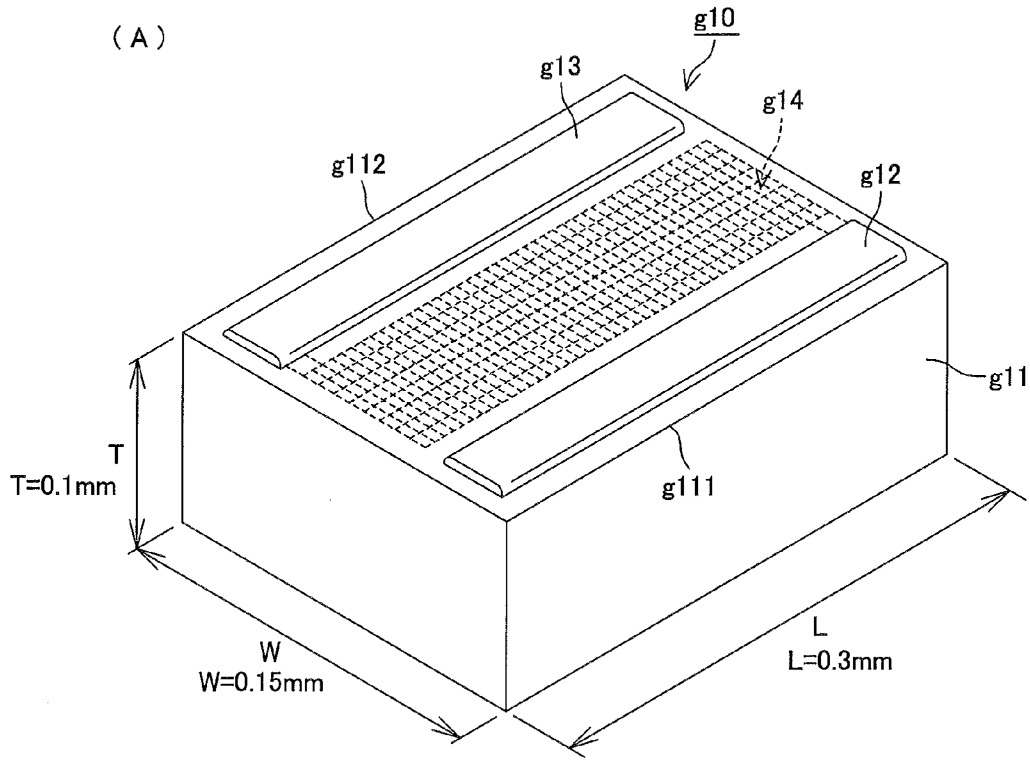
Figure 155:
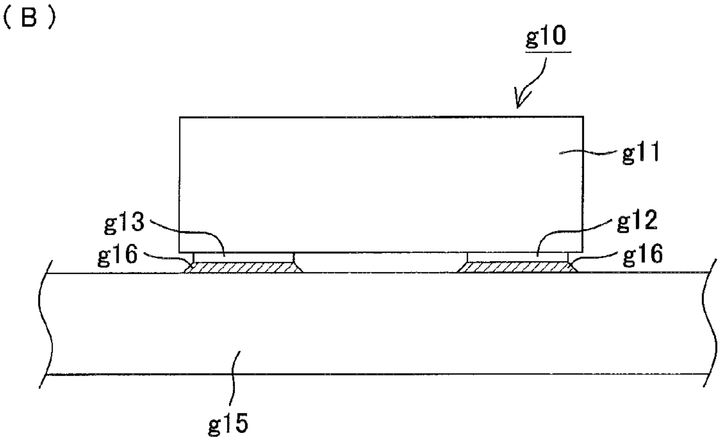

FIG. 155(A) is a schematic perspective view of the external arrangement of a chip resistor g10 according to a preferred embodiment of a seventh reference example, and FIG. 155(B) is a side view of a state where the chip resistor g10 is mounted on a substrate.

Figure 156:
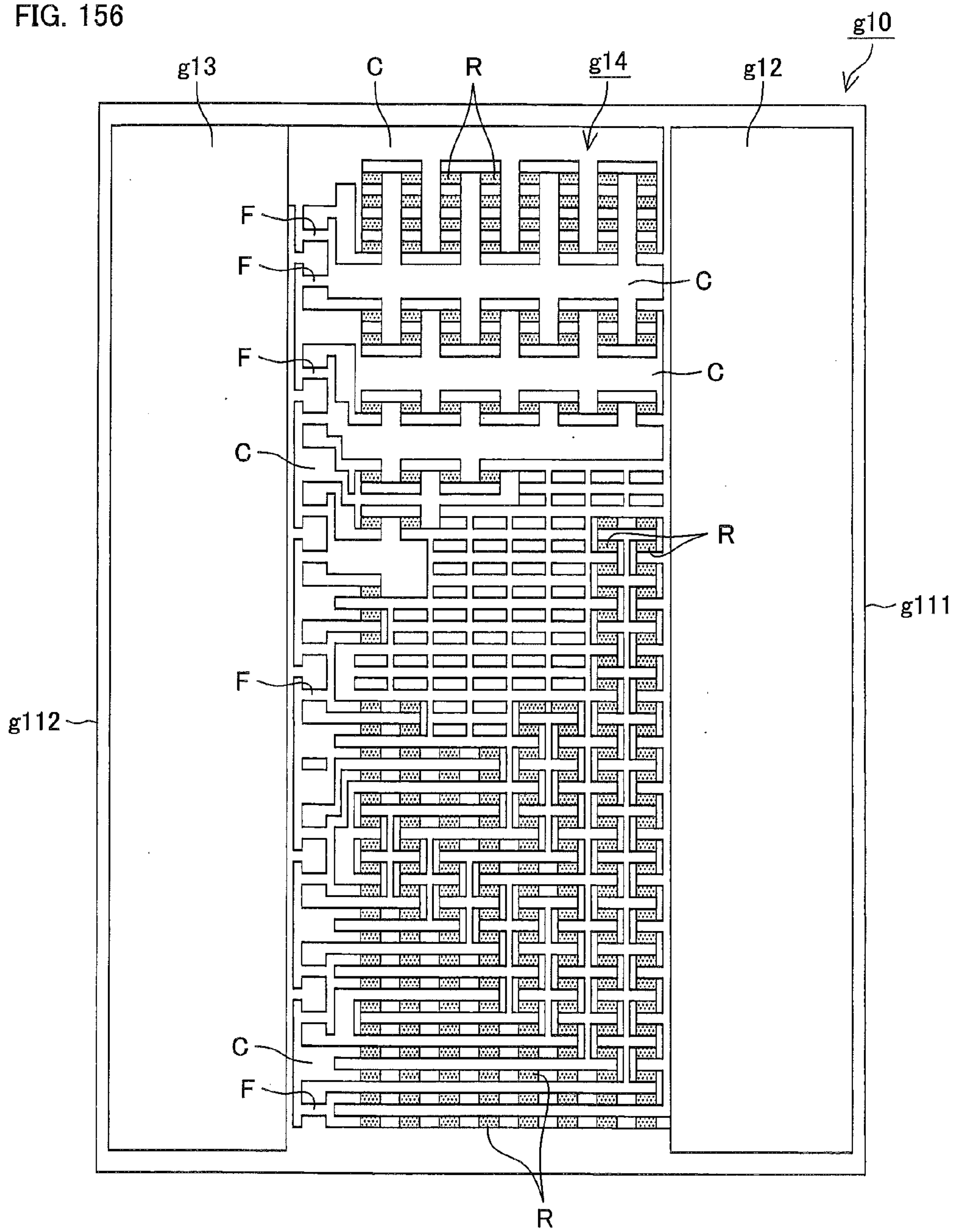

FIG. 156 is a plan view of the chip resistor g10 showing the positional relationship of a first connection electrode g12, a second connection electrode g13, and a resistor network g14 and showing the arrangement in a plan view of the resistor network g14.

Figure 157A:
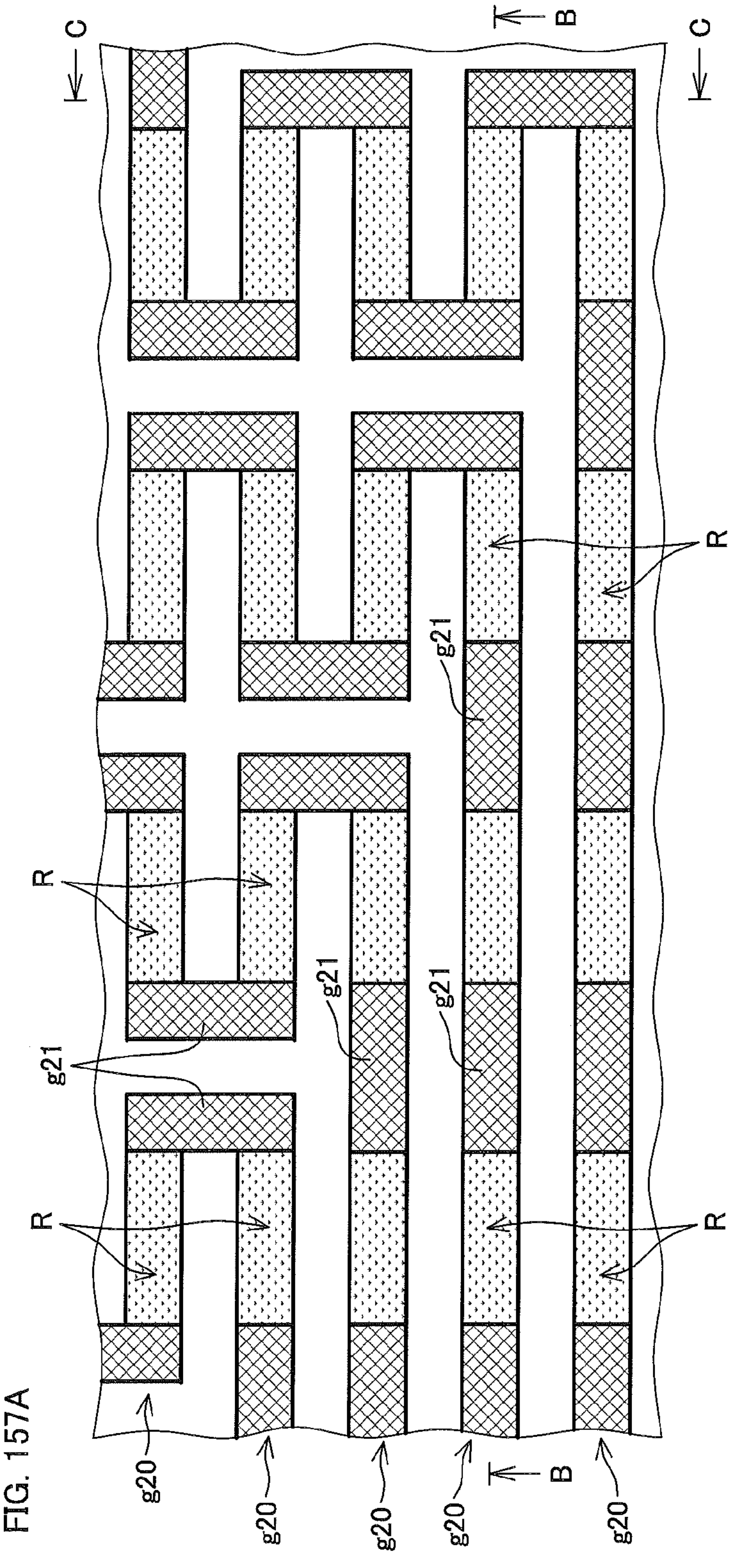

FIG. 157A is a partially enlarged plan view of the resistor network g14 shown in FIG. 156.

Figure 157B:
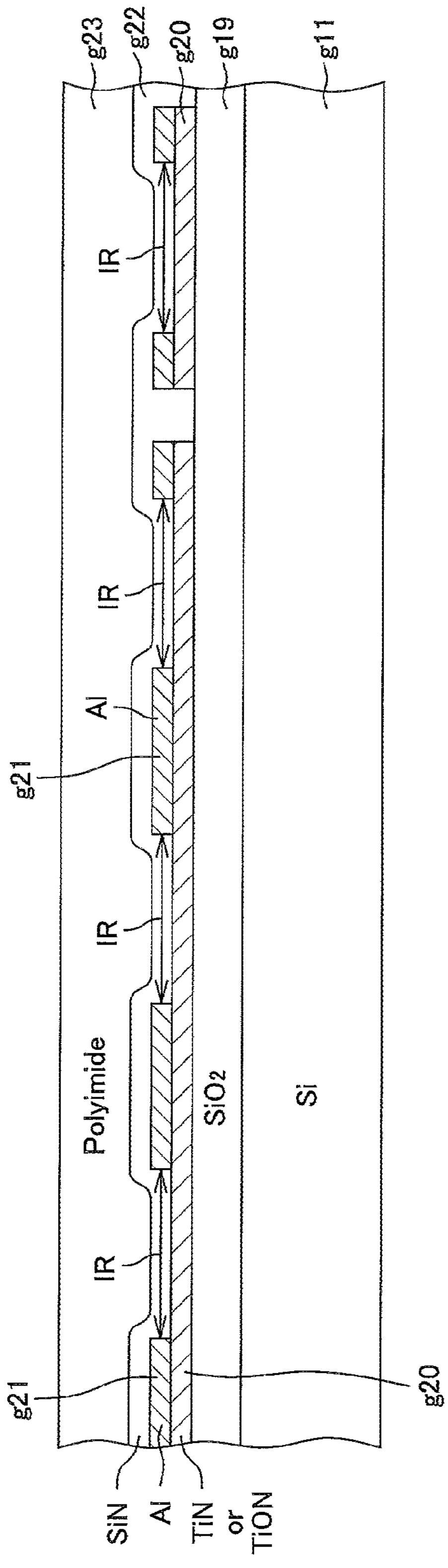

FIG. 157B is a vertical sectional view in the length direction for describing the arrangement of resistor bodies R in the resistor network g14.

Figure 157C:
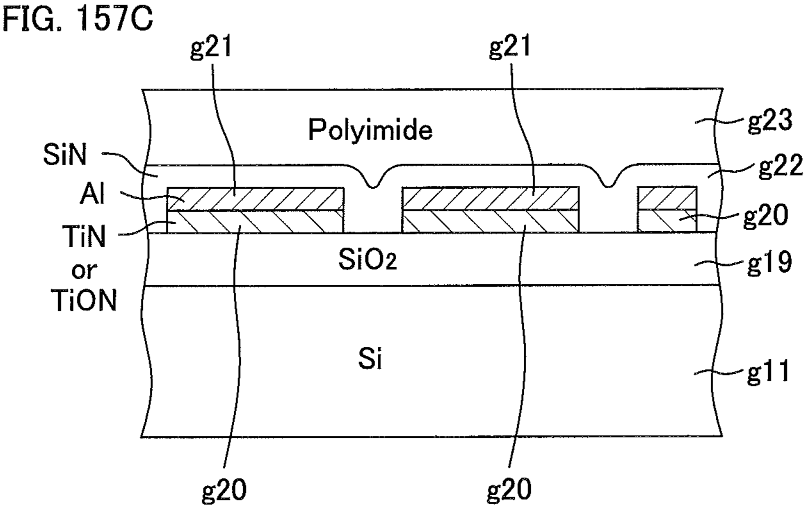

FIG. 157C is a vertical sectional view in the width direction for describing the arrangement of the resistor bodies R in the resistor network g14.

Figure 158:
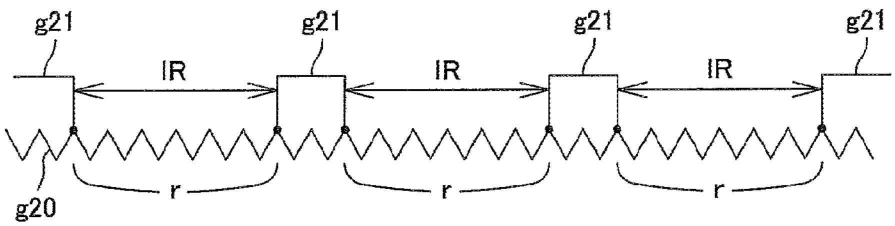
Figure 158:
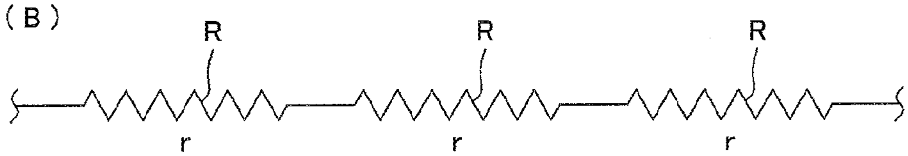
Figure 158:
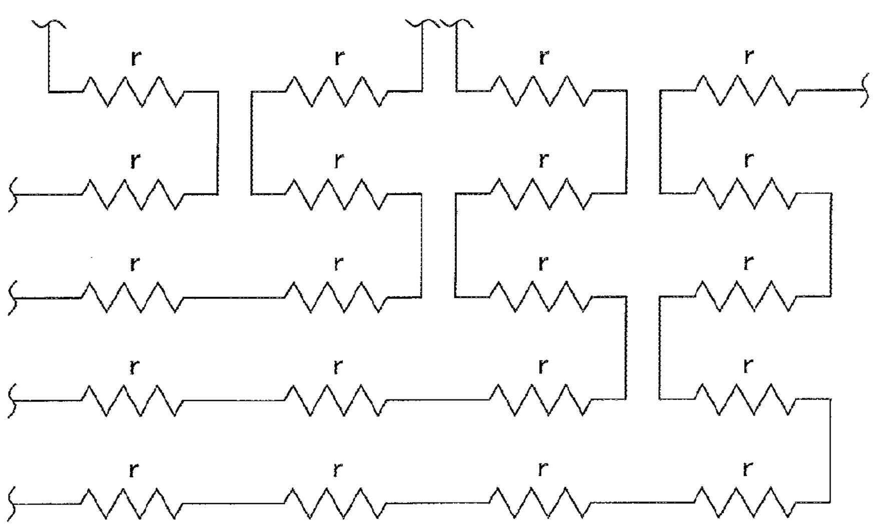

FIG. 158 shows diagrams showing the electrical features of resistive body film lines g20 and conductor film g21 in the form of circuit symbols and an electric circuit diagram.

Figure 159:
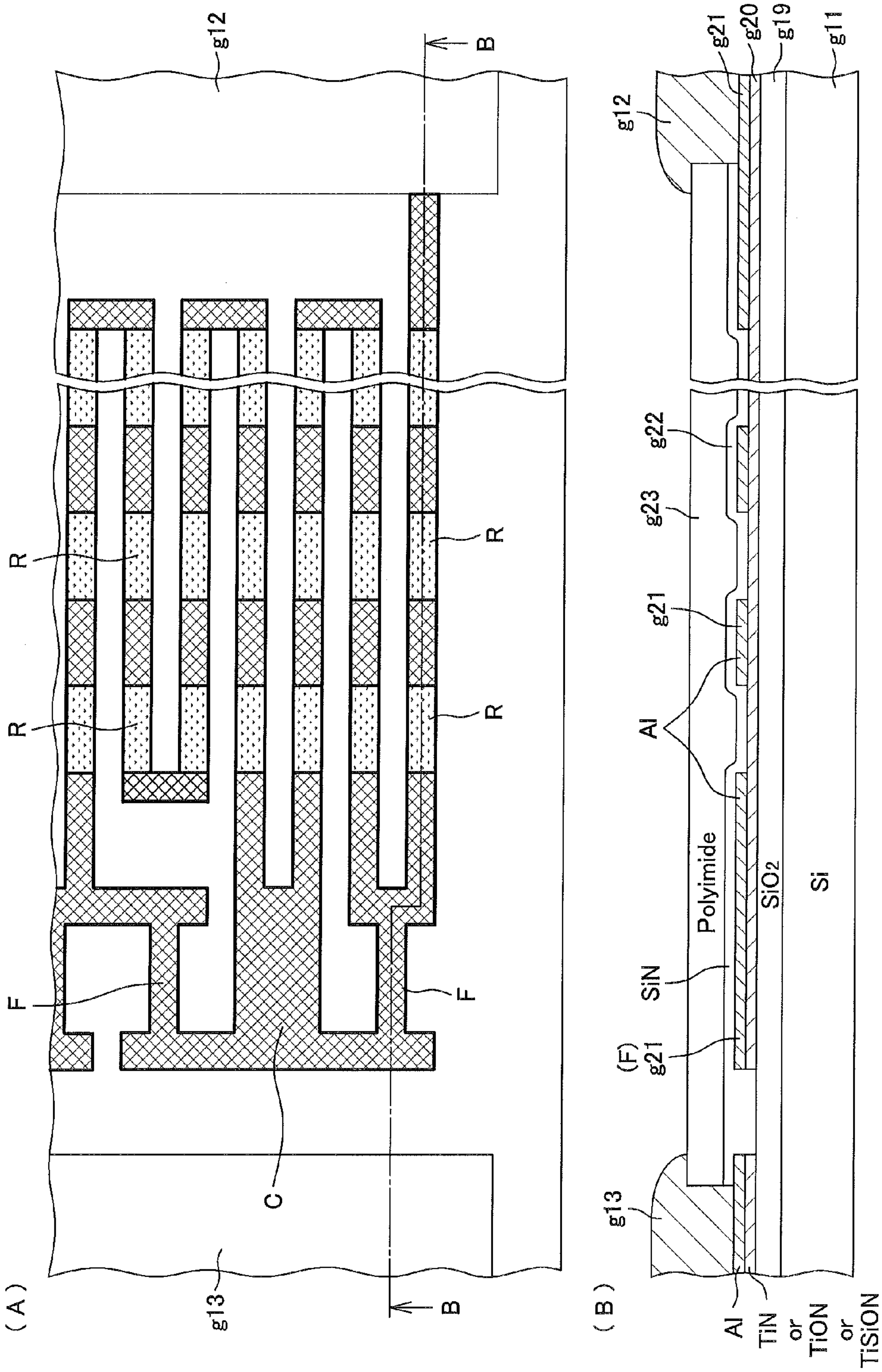

FIG. 159(A) is a partially enlarged plan view of a region including fuses F drawn by enlarging a portion of the plan view of the chip resistor shown in FIG. 156, and FIG. 159(B) is a structural sectional view taken along B-B in FIG. 159(A).

Figure 160:
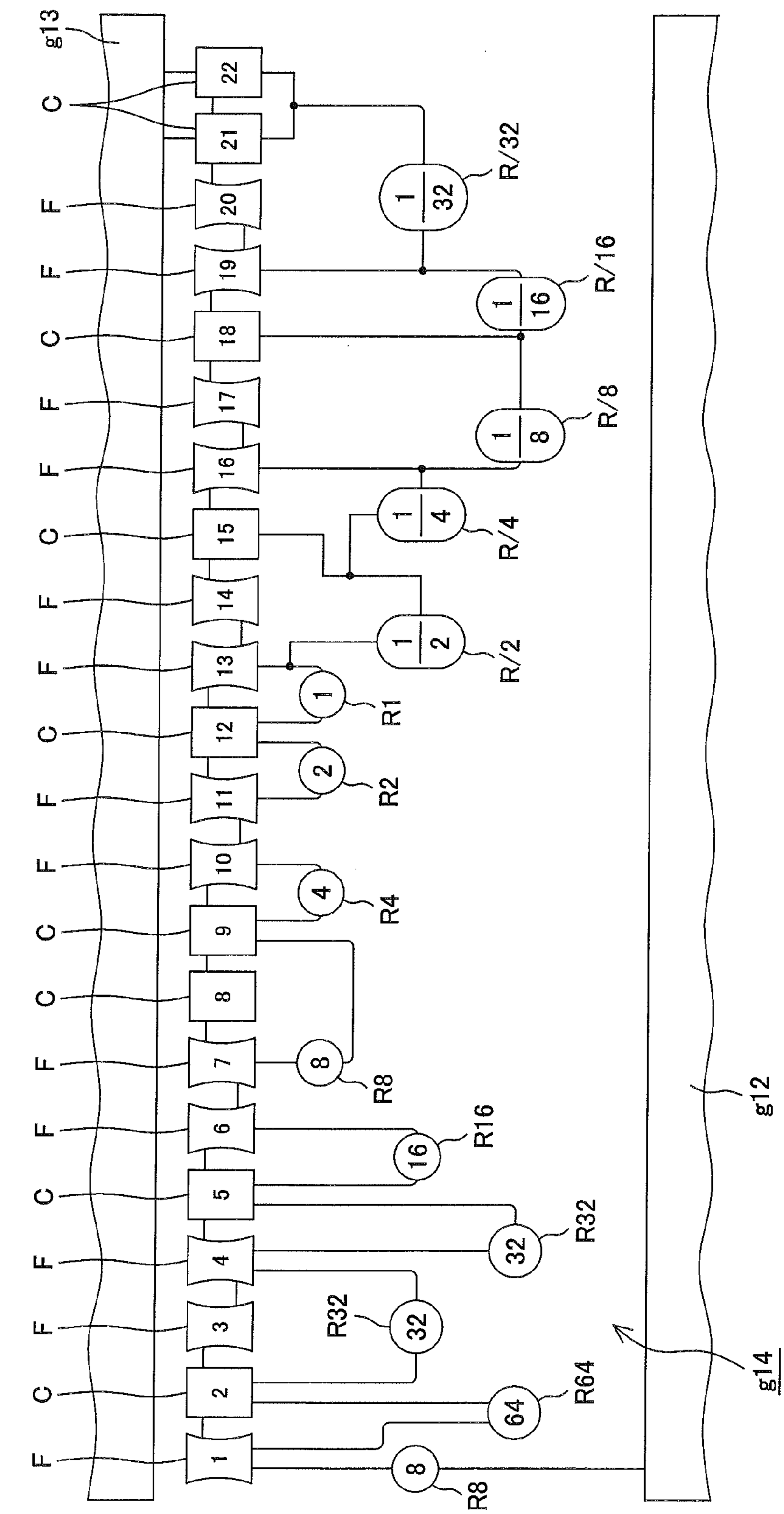

FIG. 160 is an illustrative diagram of the array relationships of connection conductor films C and fuse films F connecting a plurality of types of resistance units in the resistor network g14 shown in FIG. 156 and the connection relationships of the plurality of types of resistance units connected to the connection conductor films C and fuse films F.

Figure 161:
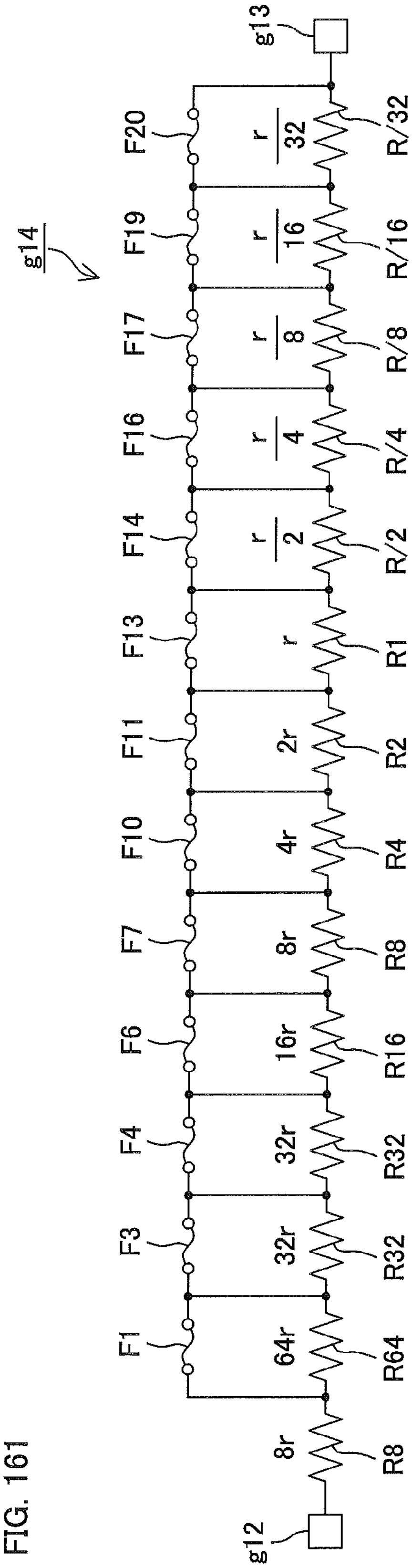

FIG. 161 is an electric circuit diagram of the resistor network g14.

Figure 162:
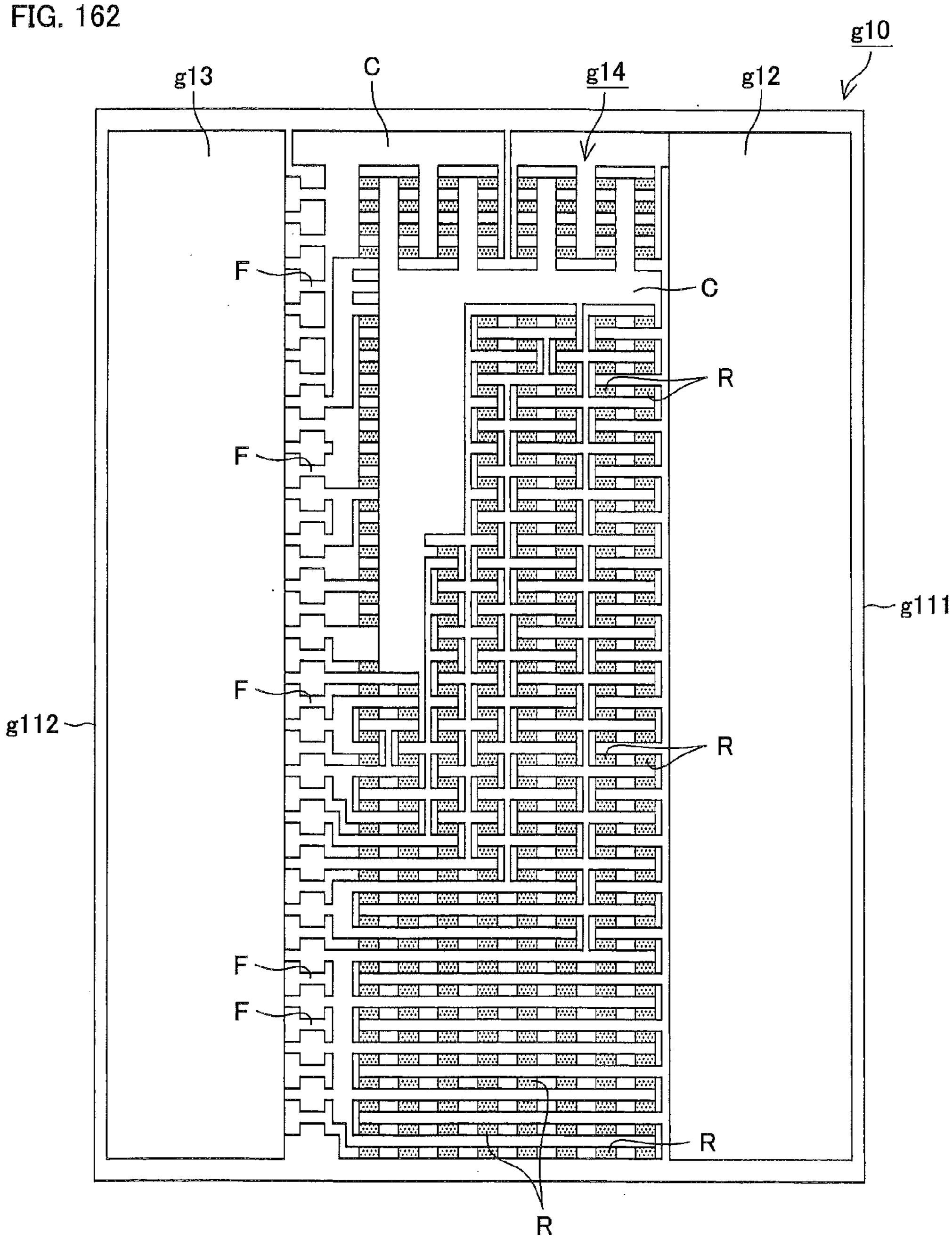

FIG. 162 is a plan view of a chip resistor g30 showing the positional relationship of a first connection electrode g12, a second connection electrode g13, and a resistor network g14 and showing the arrangement in a plan view of the resistor network g14.

Figure 163:
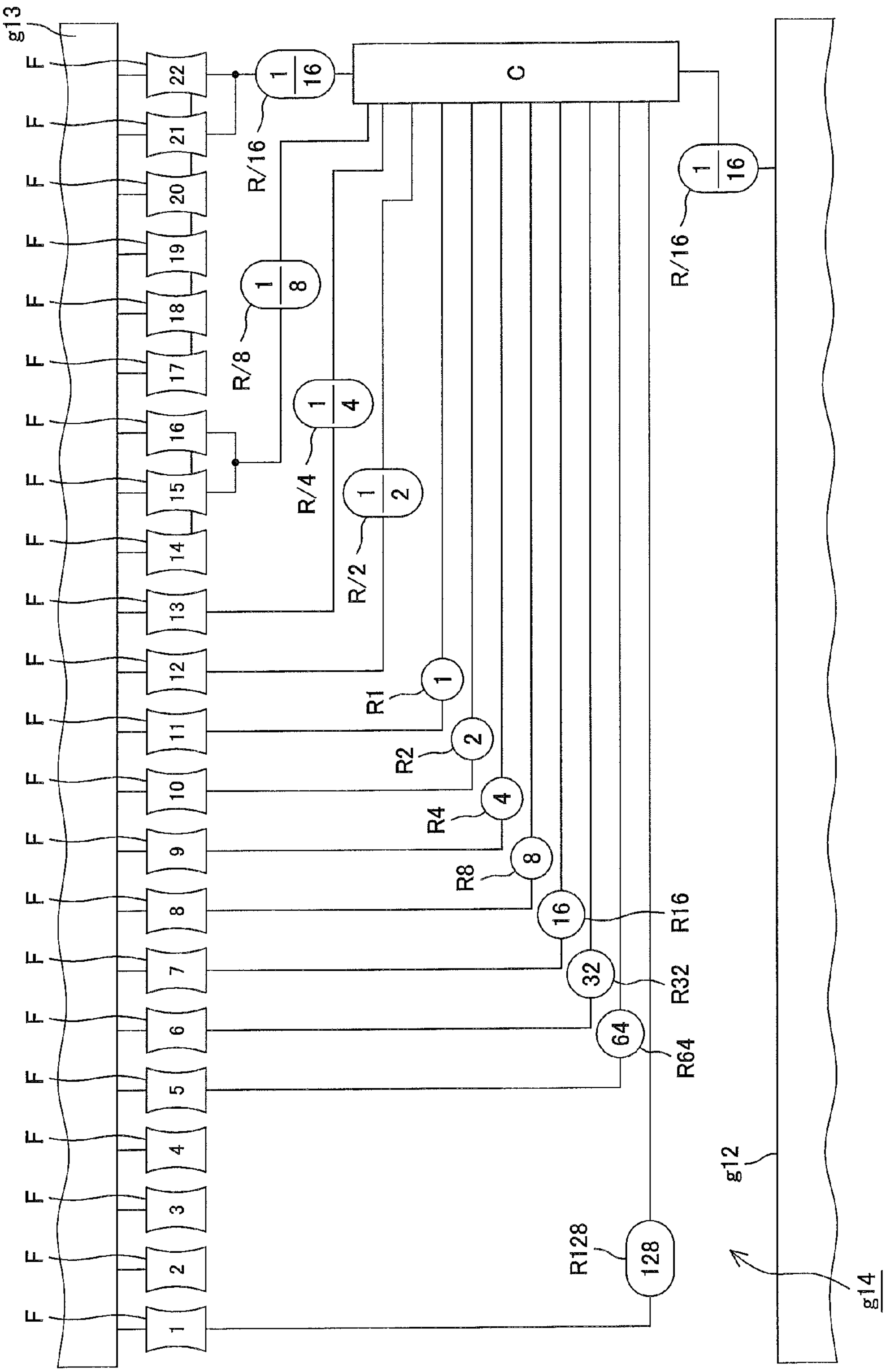

FIG. 163 is an illustrative diagram of the positional relationship of connection conductor films C and fuses F connecting a plurality of types of resistance units in the resistor network g14 shown in FIG. 162 and the connection relationships of the plurality of types of resistance units connected to the connection conductor films C and fuses F.

Figure 164:
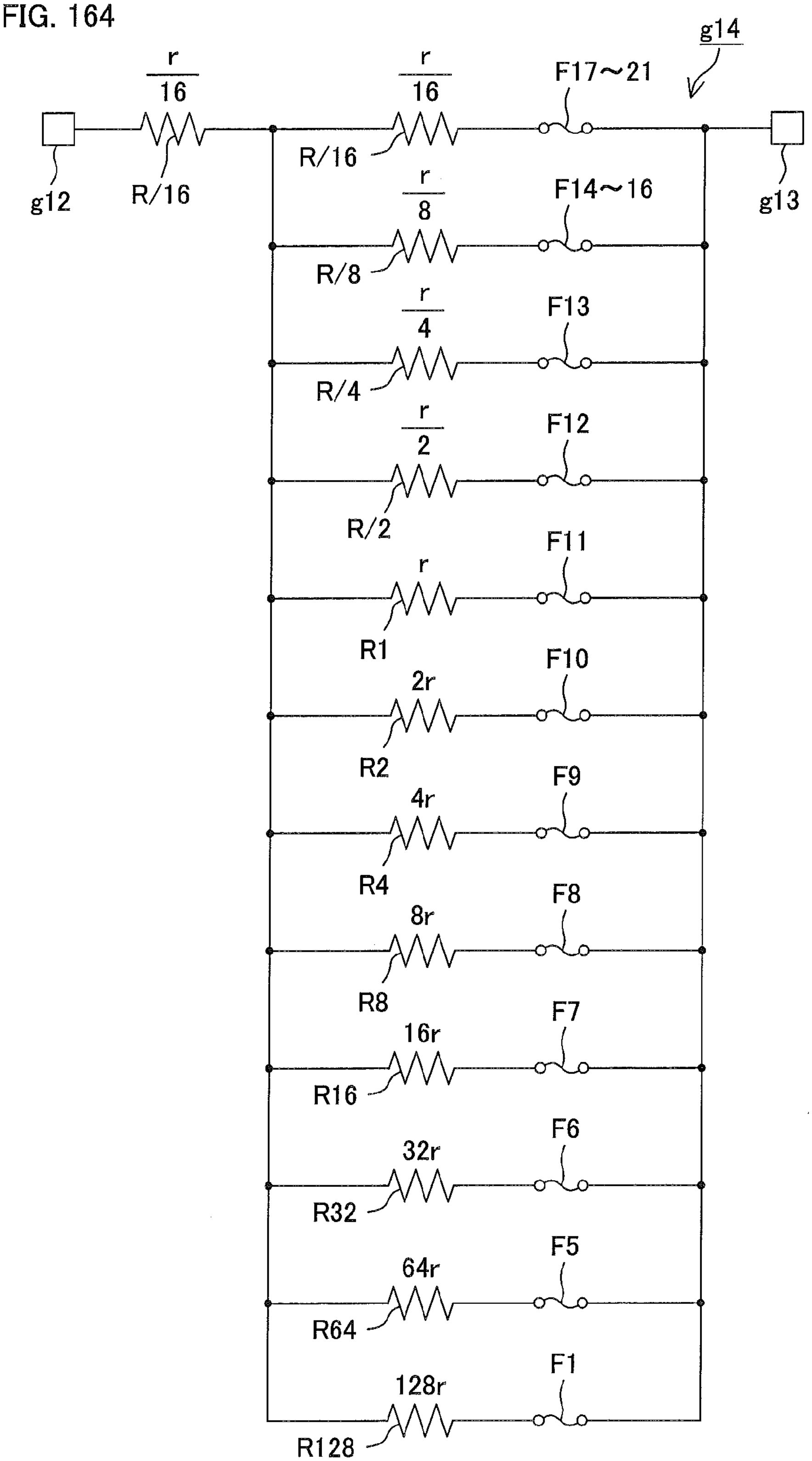

FIG. 164 is an electric circuit diagram of the resistor network g14.

Figure 165:
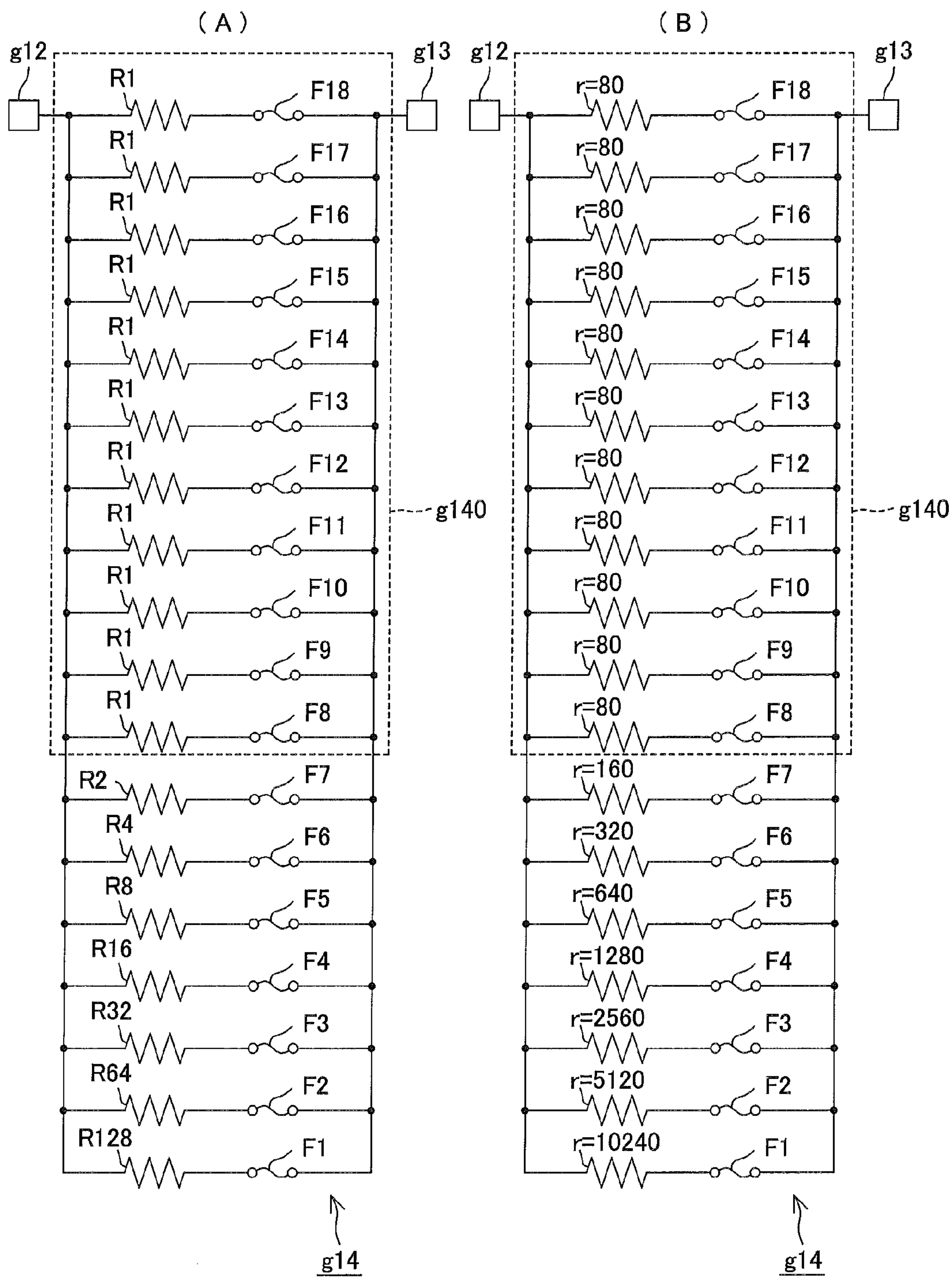

FIGS. 165(A) and 165(B) are electric circuit diagrams of modification examples of the electric circuit shown in FIG. 164.

Figure 166:
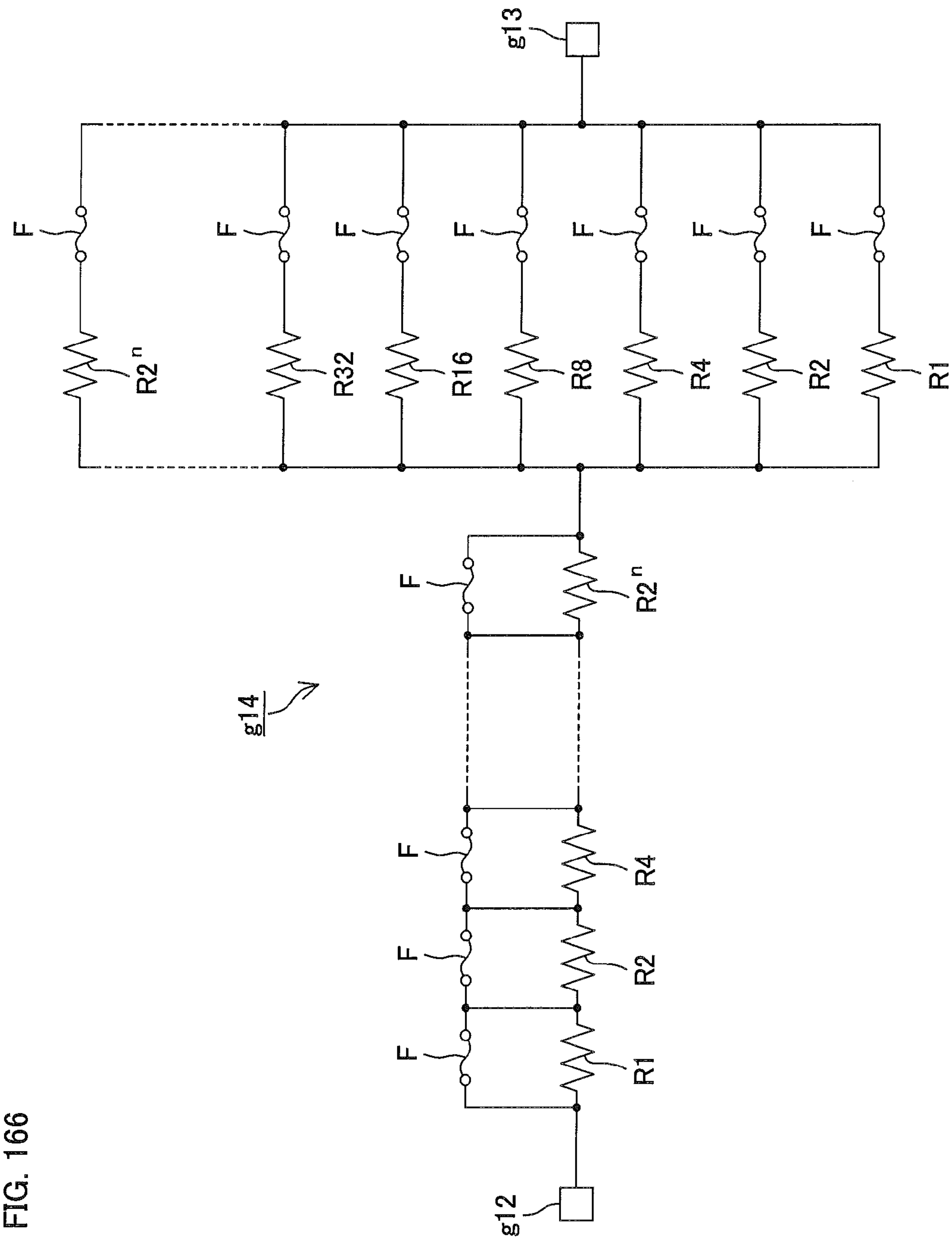

FIG. 166 is an electric circuit diagram of a resistor network g14 according to yet another preferred embodiment of the seventh reference example.

Figure 167:
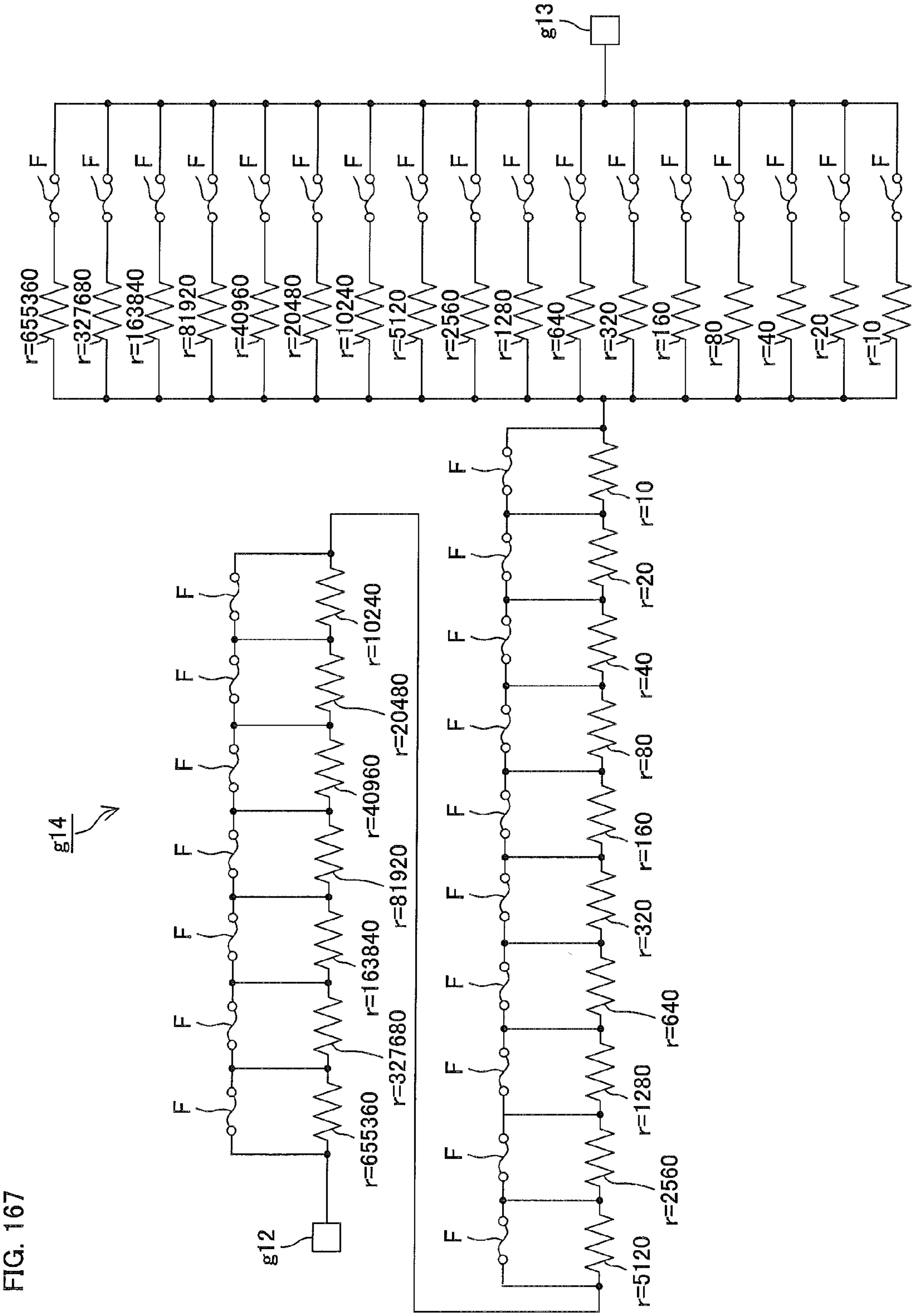

FIG. 167 is an electric circuit diagram of an arrangement example of a resistor network in a chip resistor in which specific resistance values are indicated.

Figure 168:
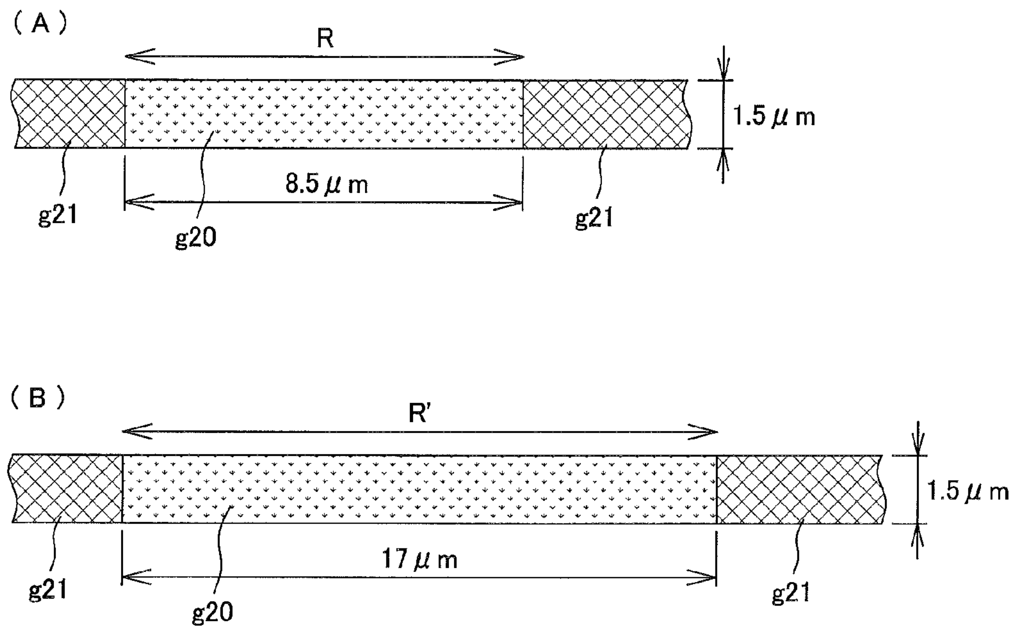

FIG. 168 shows illustrative plan views for describing the structure of principal portions of a chip resistor g90 according to yet another preferred embodiment of the seventh reference example.

Figure 169:
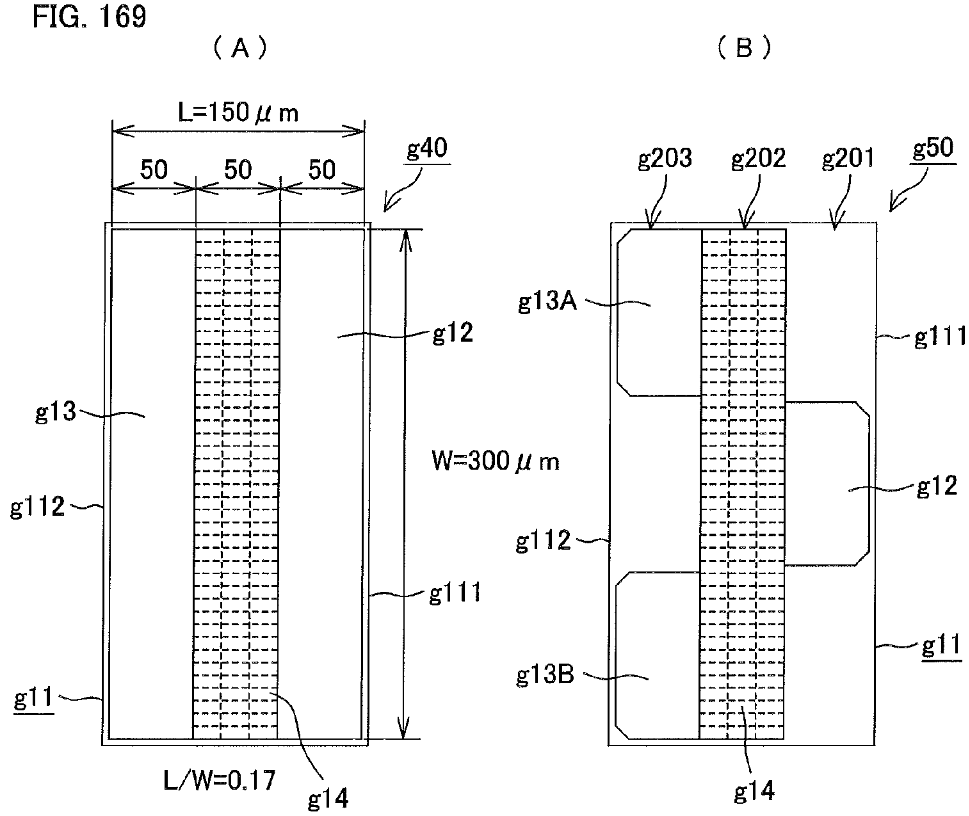

FIG. 169 shows plan views of layout arrangements (layouts) of electrodes of chip resistors according to other preferred embodiments of the seventh reference example.

Figure 170:
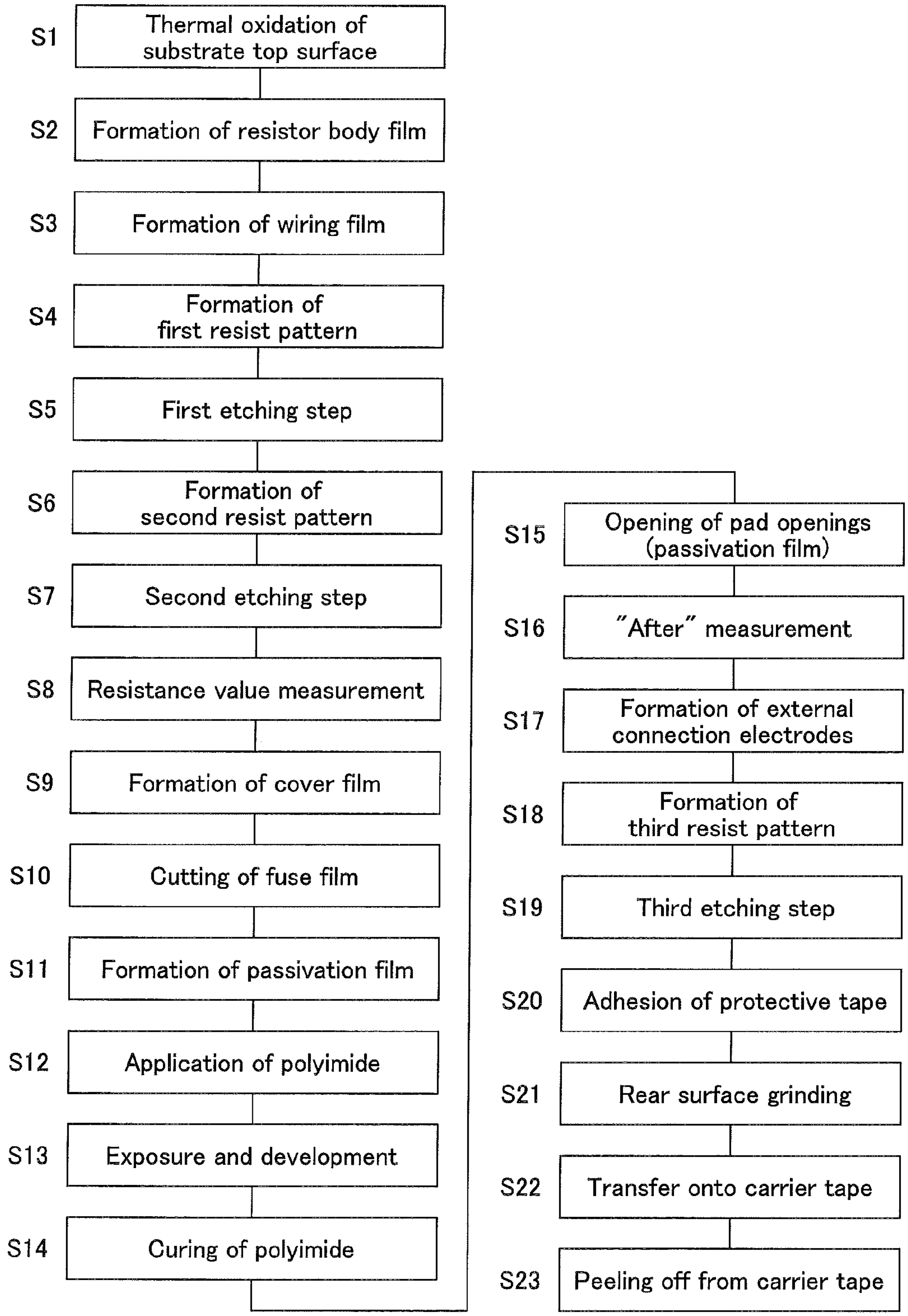

FIG. 170 is a flow diagram of an example of a process for manufacturing the chip resistor g10.

Figure 171:
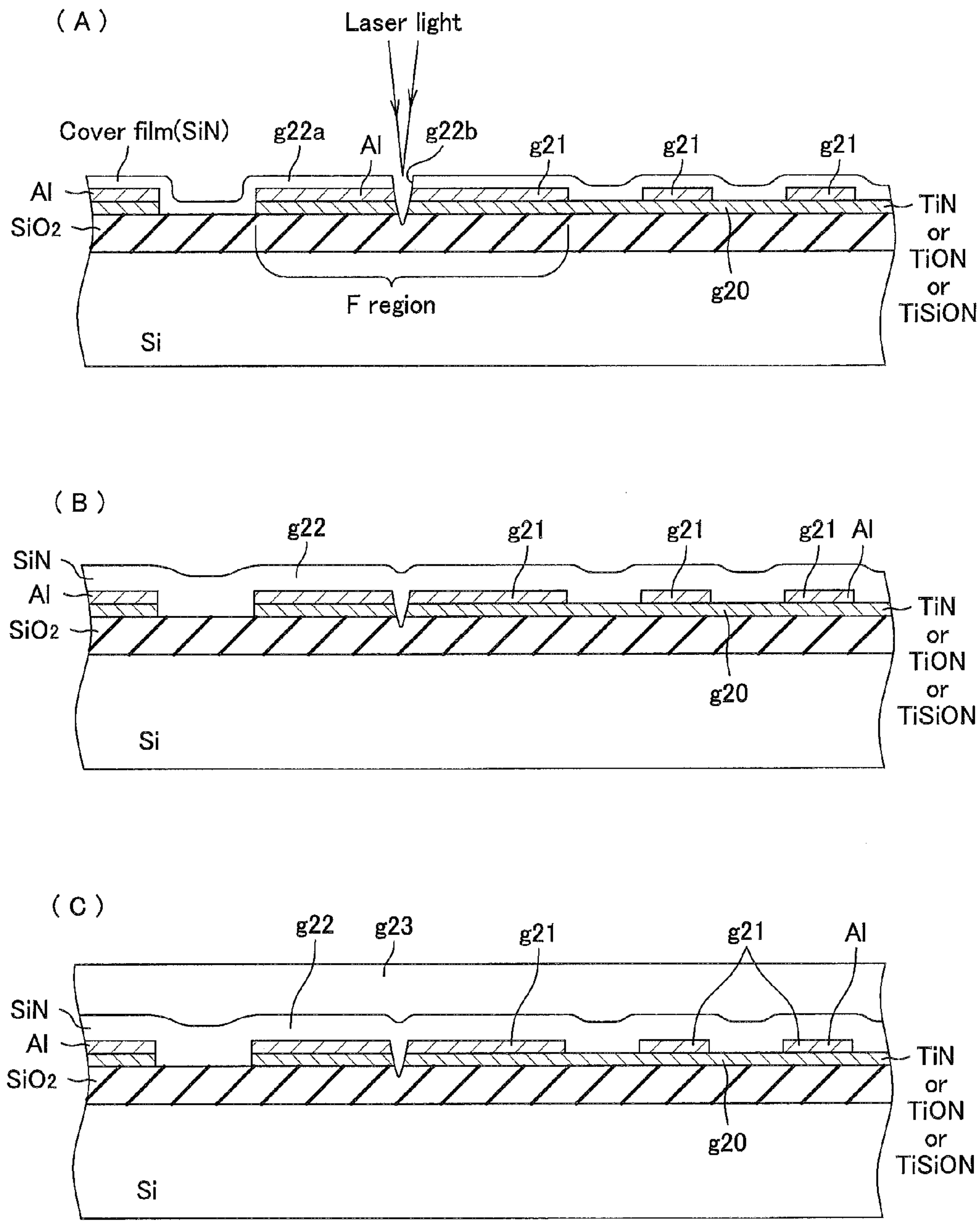

FIG. 171 shows illustrative sectional views of a fuse film F fusing step and a passivation film g22 and a resin film g23 that are formed subsequently.

Figure 172:
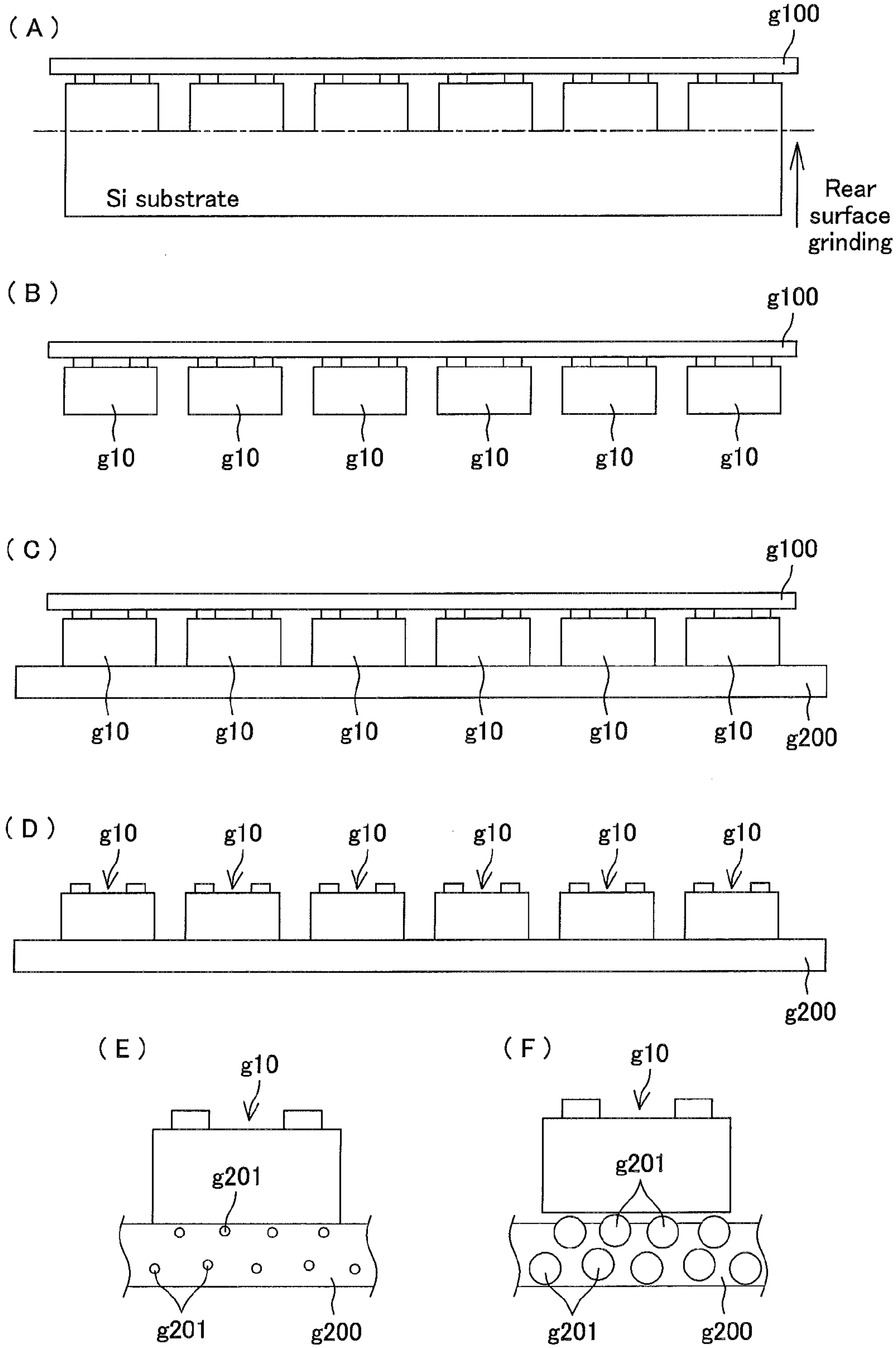

FIG. 172 shows illustrative views of processing steps of separating individual chip resistors from a substrate.

Figure 173:
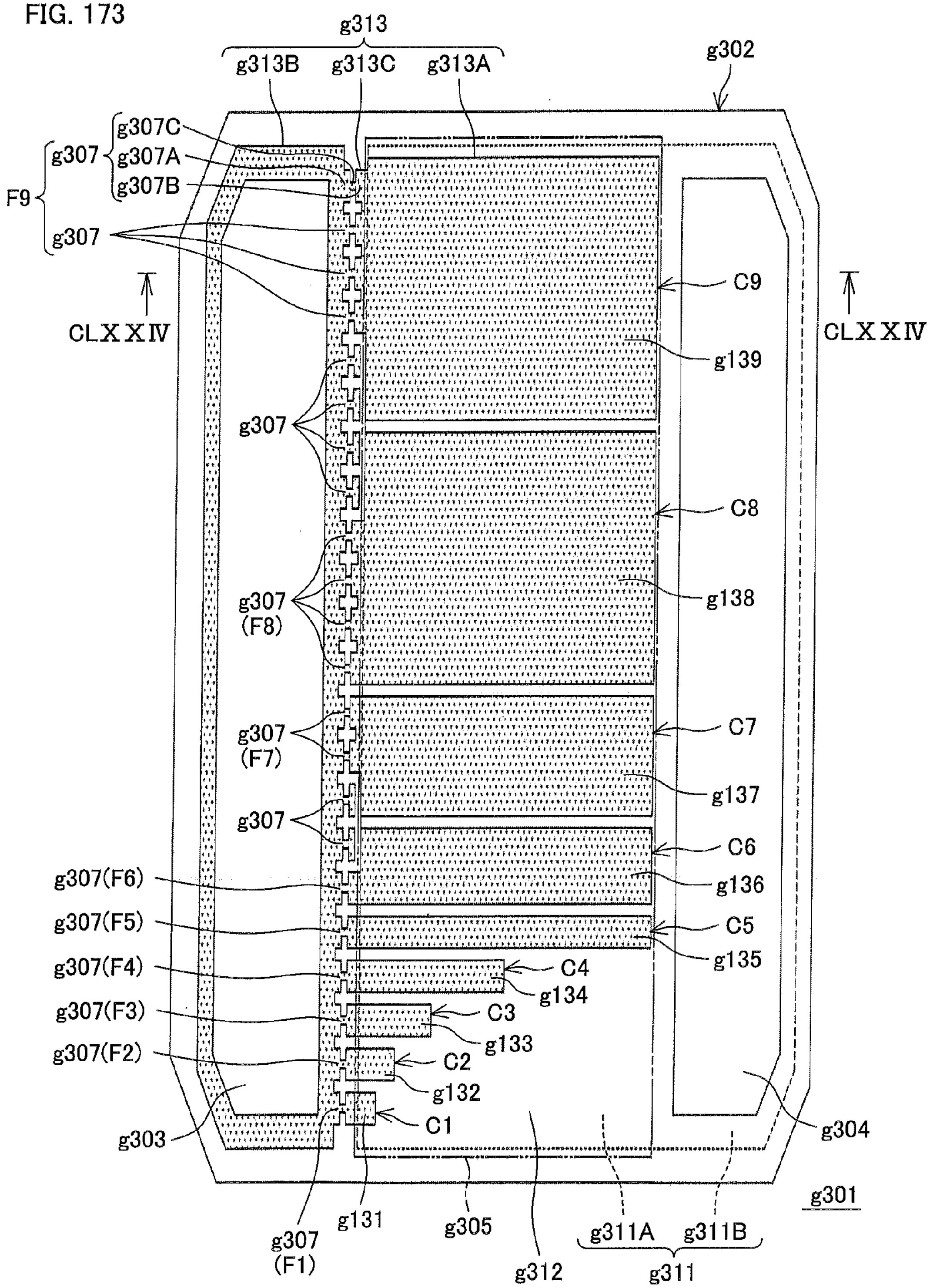

FIG. 173 is a plan view of a chip capacitor g301 according to another preferred embodiment of the seventh reference example.

Figure 174:
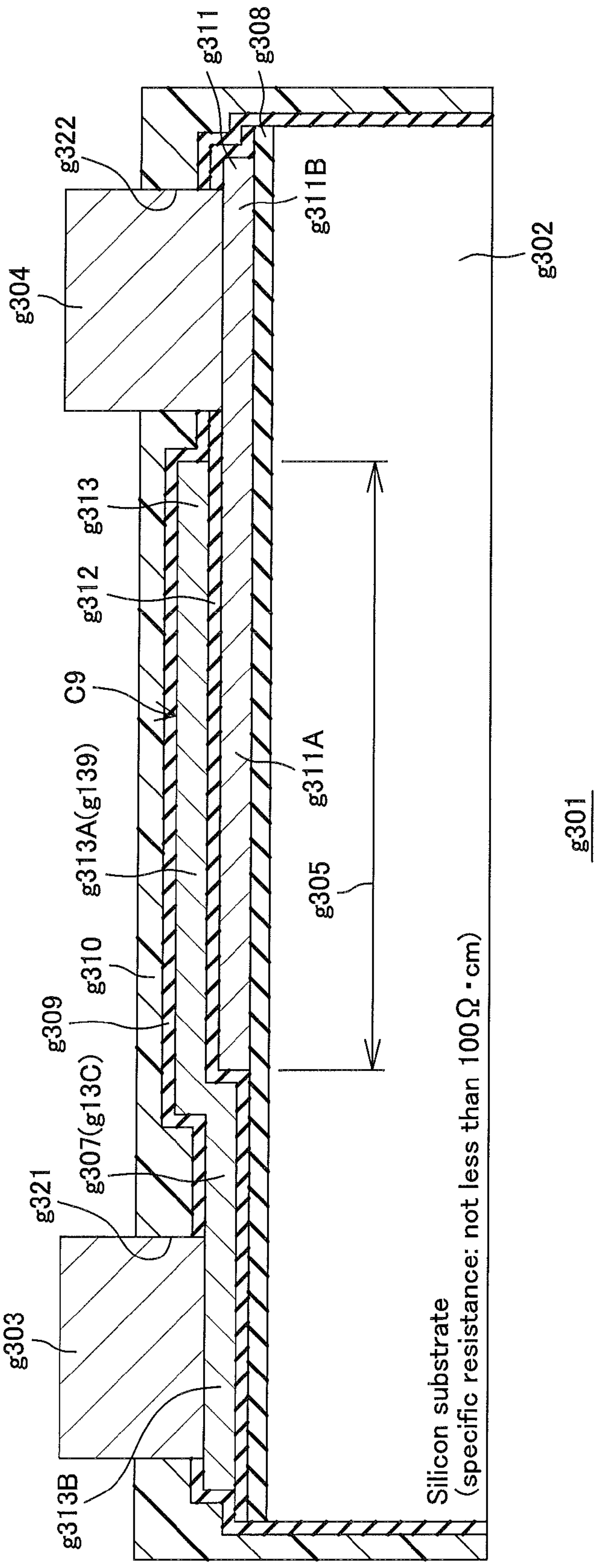

FIG. 174 is a sectional view of the chip capacitor g301 taken along section line CLXXIV-CLXXIV in FIG. 173.

Figure 175:
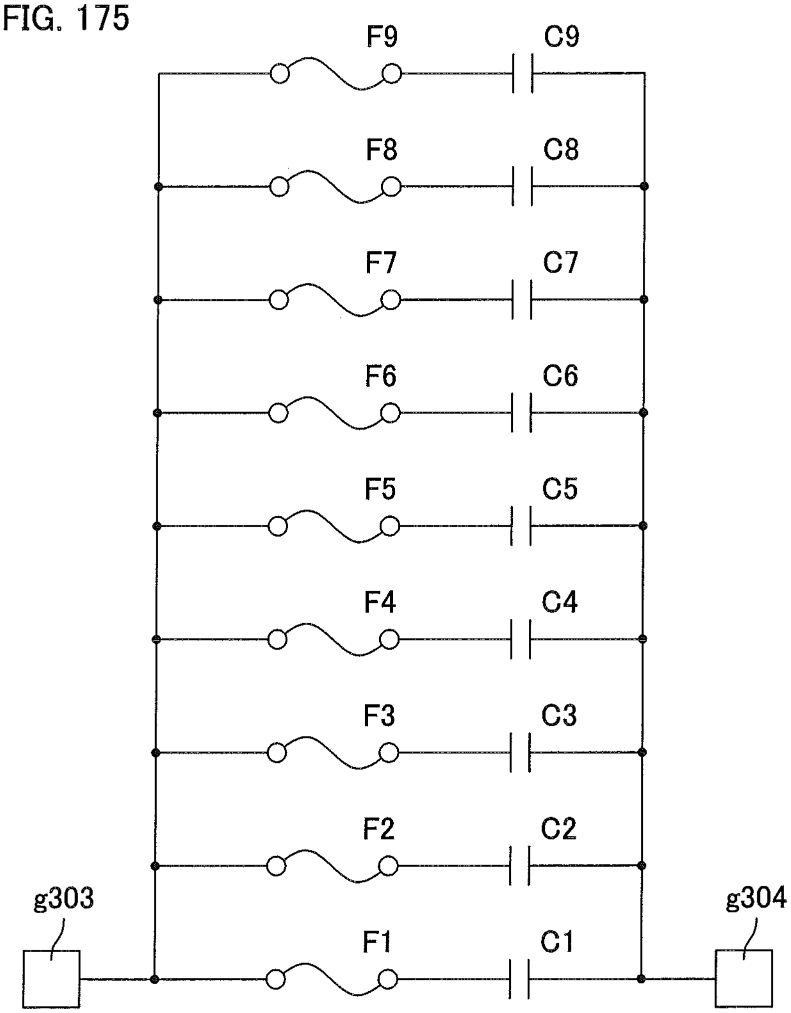

FIG. 175 is a circuit diagram of the electrical arrangement of the interior of the chip capacitor g301.

Figure 176:
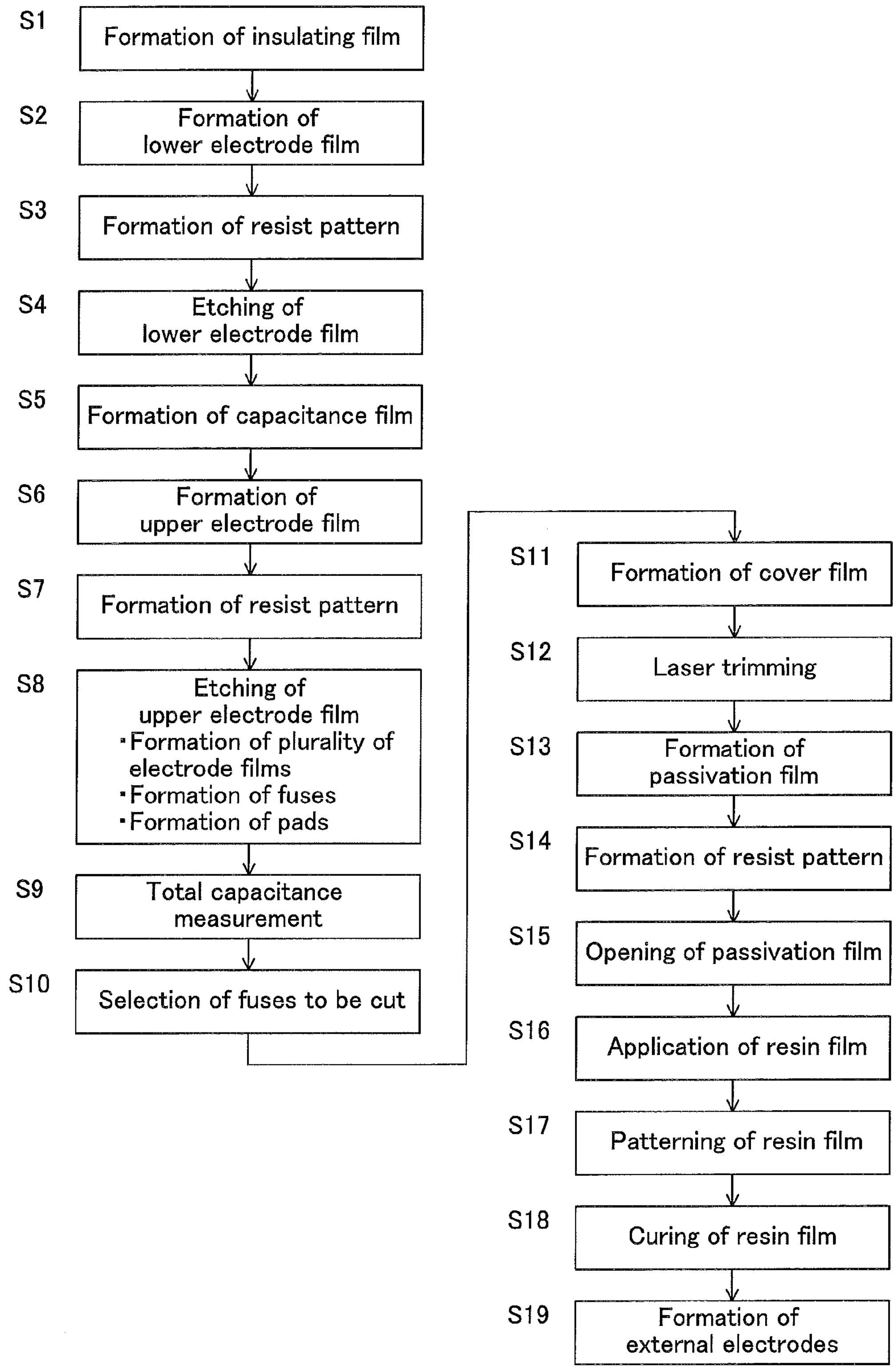

FIG. 176 is a flow diagram for describing an example of a process for manufacturing the chip capacitor g301.

Figure 177A:
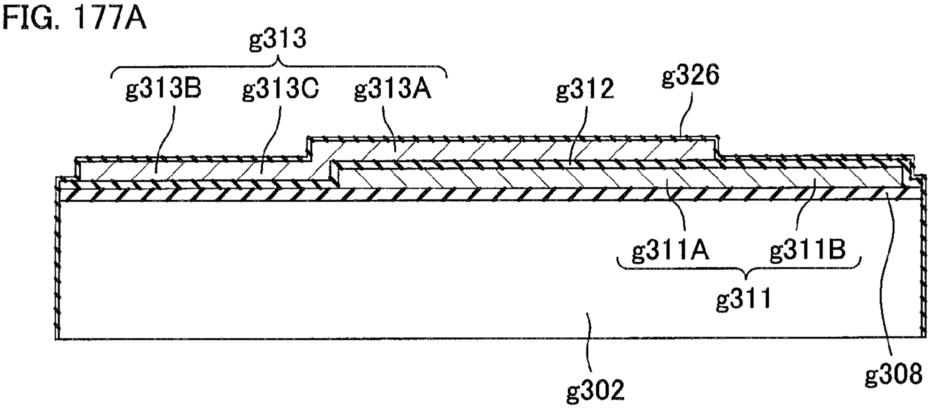

FIG. 177A is a diagram of a step in the process for manufacturing the chip capacitor g301.

Figure 177B:
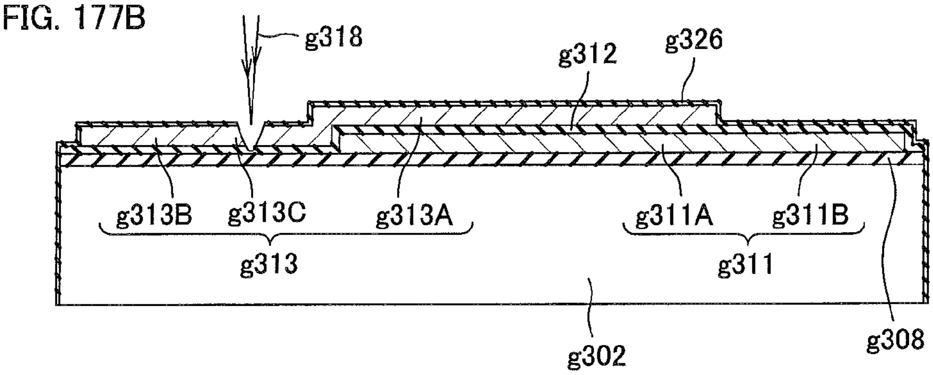

FIG. 177B is a diagram of a step in the process for manufacturing the chip capacitor g301.

Figure 177C:
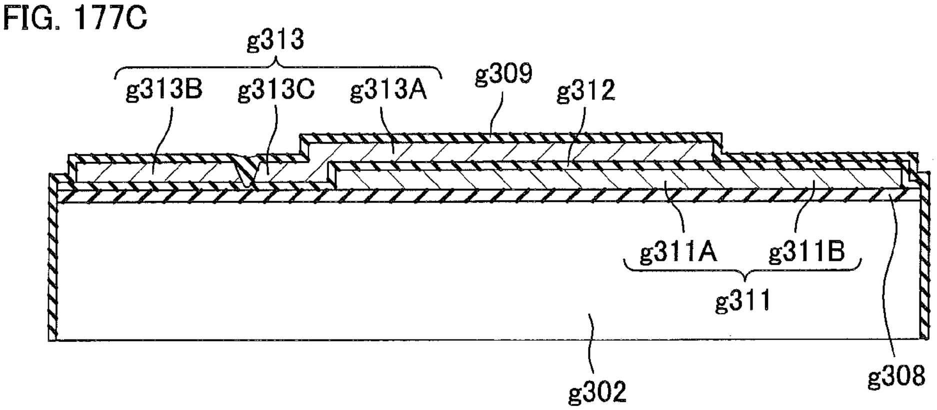

FIG. 177C is a diagram of a step in the process for manufacturing the chip capacitor g301.

Figure 178:
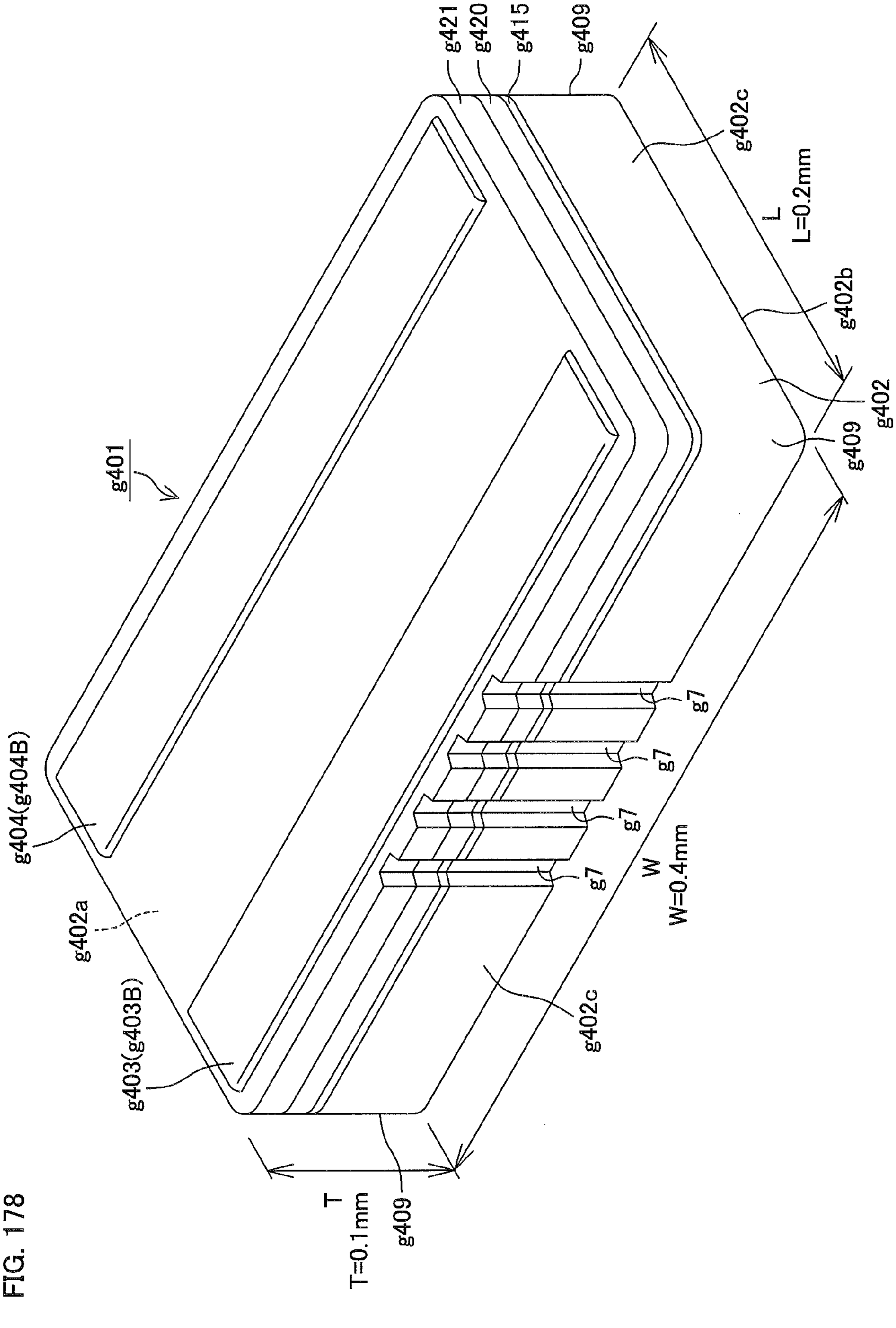

FIG. 178 is a perspective view of a chip diode g401 according to another preferred embodiment of the seventh reference example.

Figure 179:
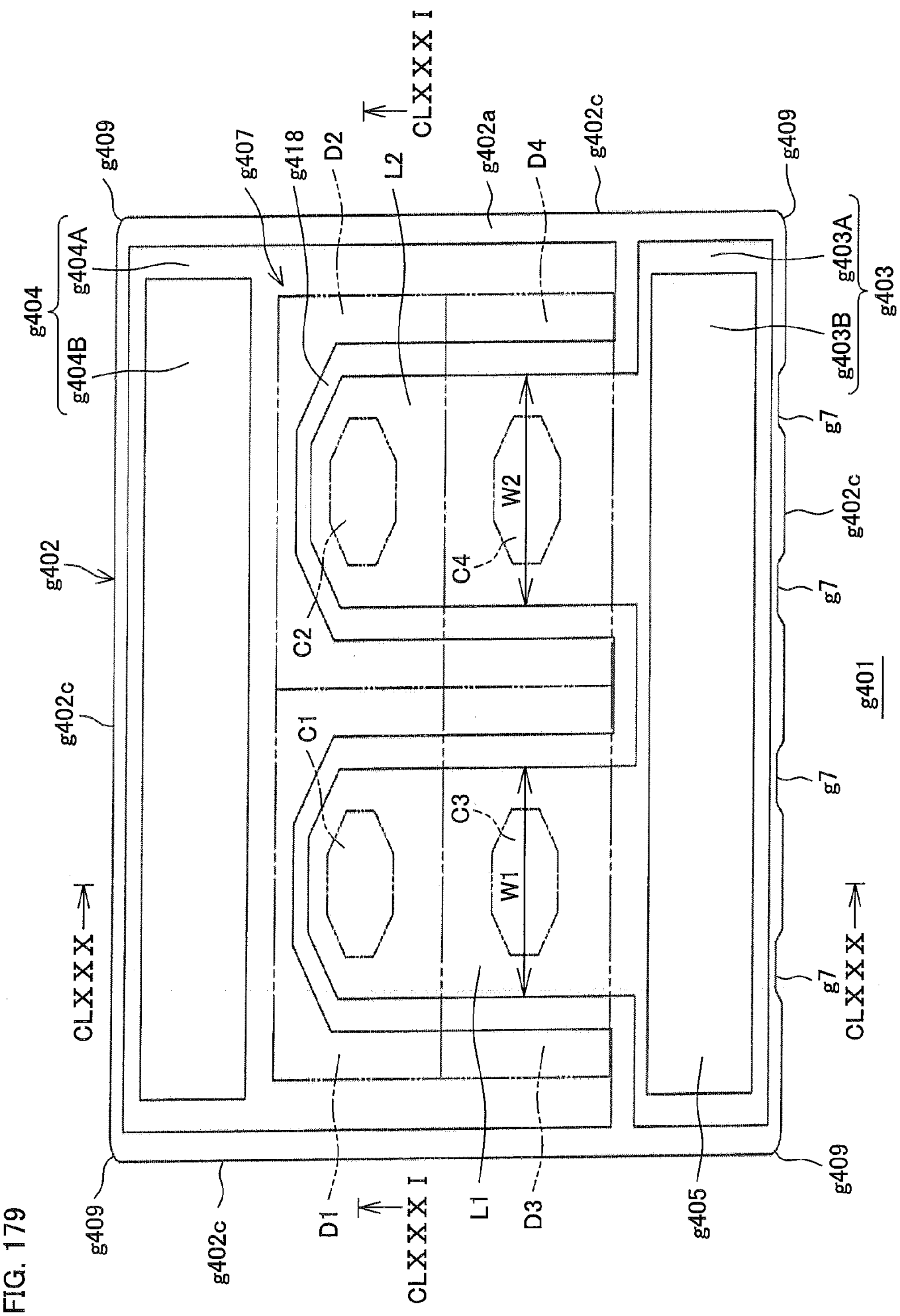

FIG. 179 is a plan view of the chip diode g401 according to the other preferred embodiment of the seventh reference example.

Figure 180:
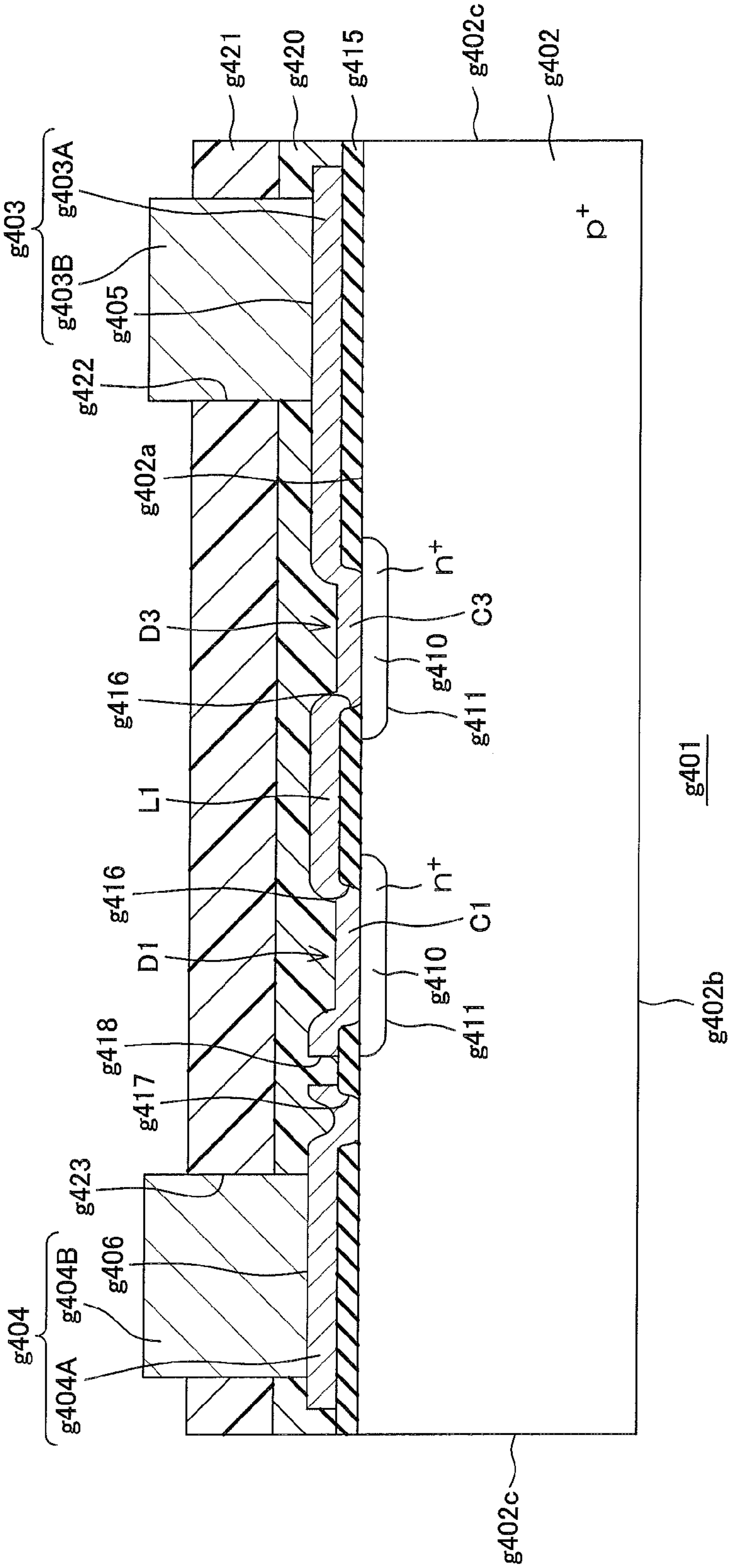

FIG. 180 is a sectional view taken along section line CLXXX-CLXXX in FIG. 179.

Figure 181:
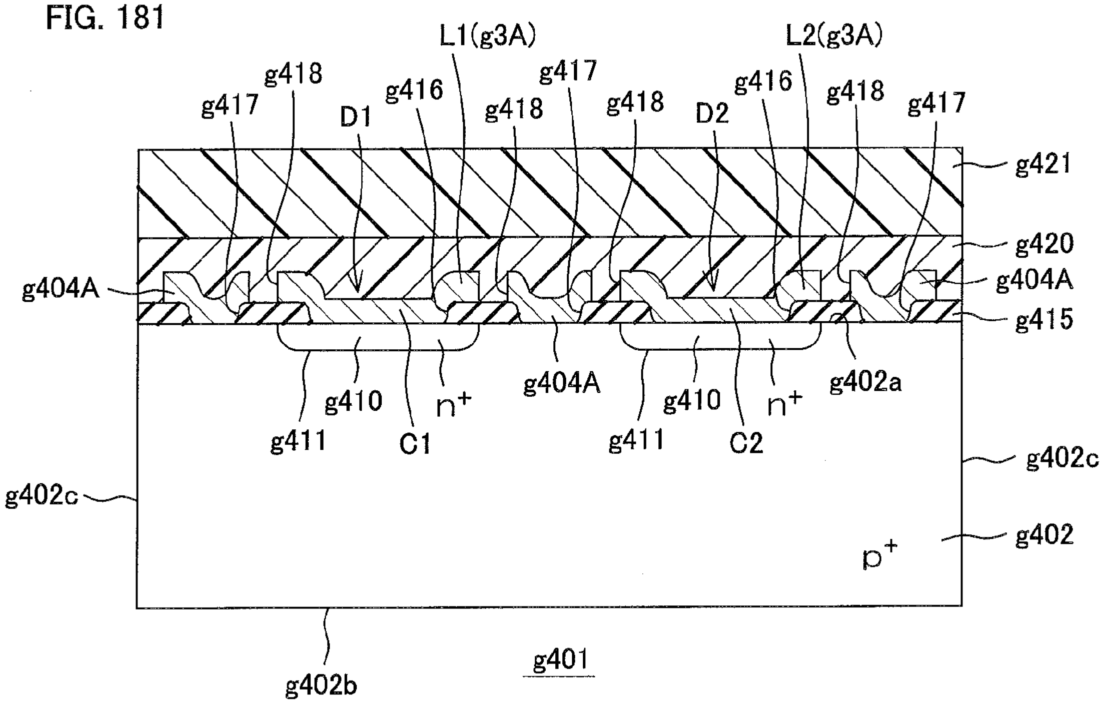

FIG. 181 is a sectional view taken along section line CLXXXI-CLXXXI in FIG. 179.

Figure 182:
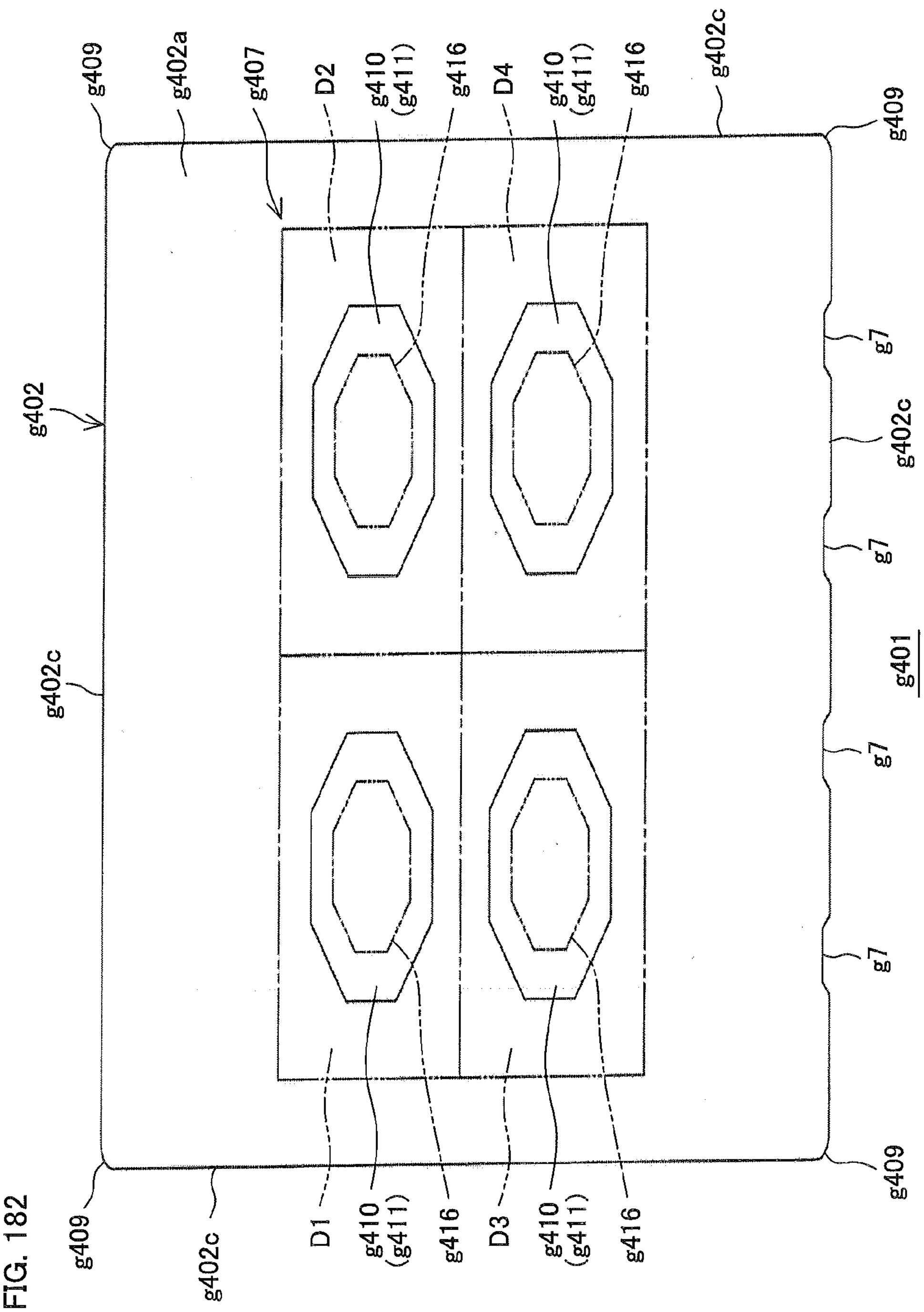

FIG. 182 is a plan view of a chip diode with a cathode electrode g403, an anode electrode g404, and the arrangement formed thereon being removed to show the structure of a top surface (element forming surface g402*a*) of a semiconductor substrate g402.

Figure 183:
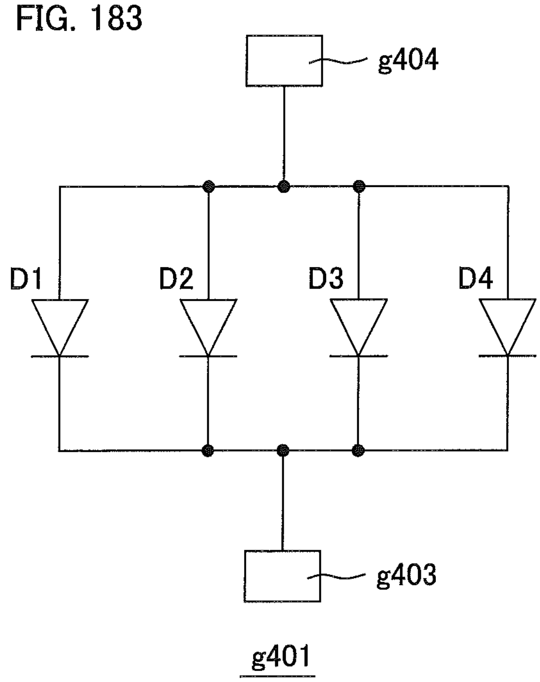

FIG. 183 is an electric circuit diagram showing the electrical structure of the interior of the chip diode g401.

Figure 184:
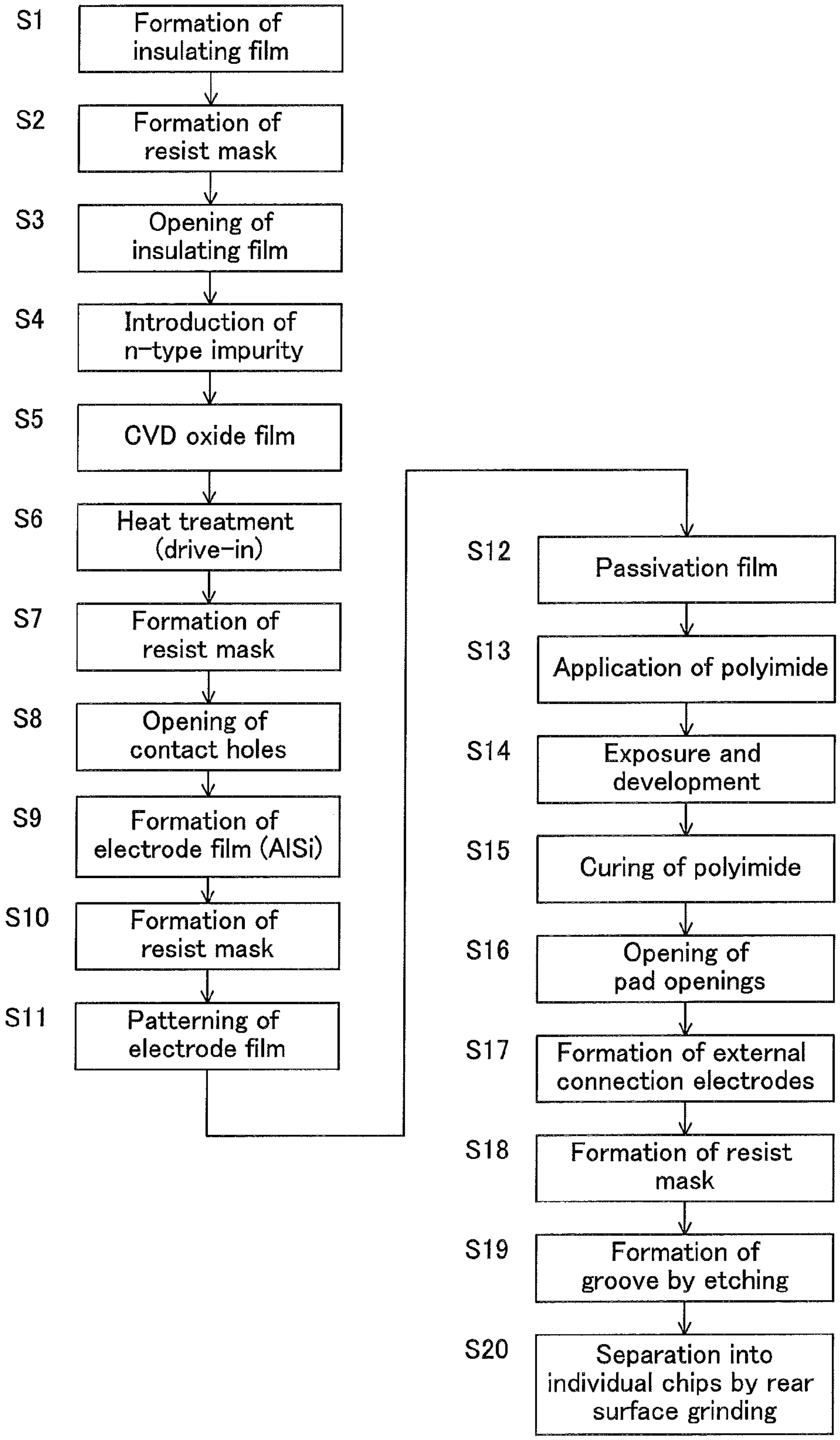

FIG. 184 is a process diagram for describing an example of a manufacturing process of the chip diode g401.

Figure 185A:
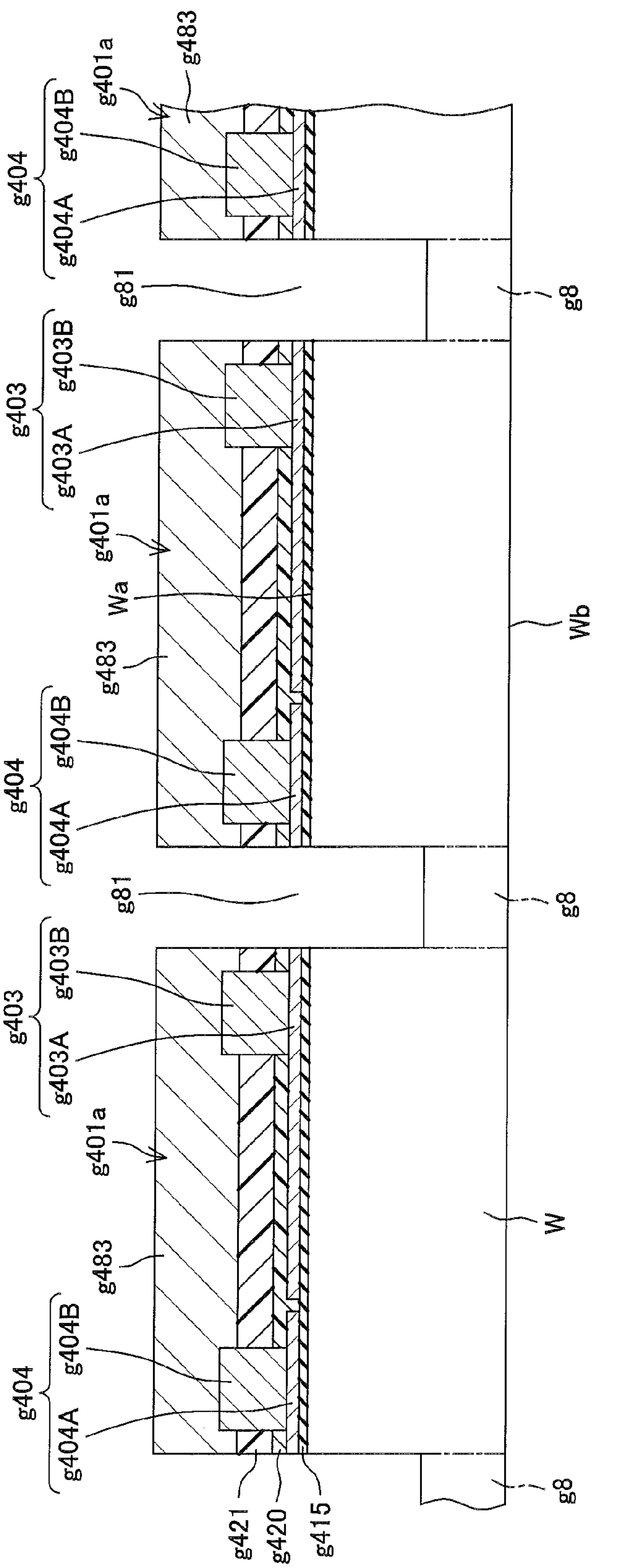

FIG. 185A is a sectional view of the arrangement in the middle of the manufacturing process of FIG. 184 and shows a section corresponding to FIG. 180.

Figure 185B:
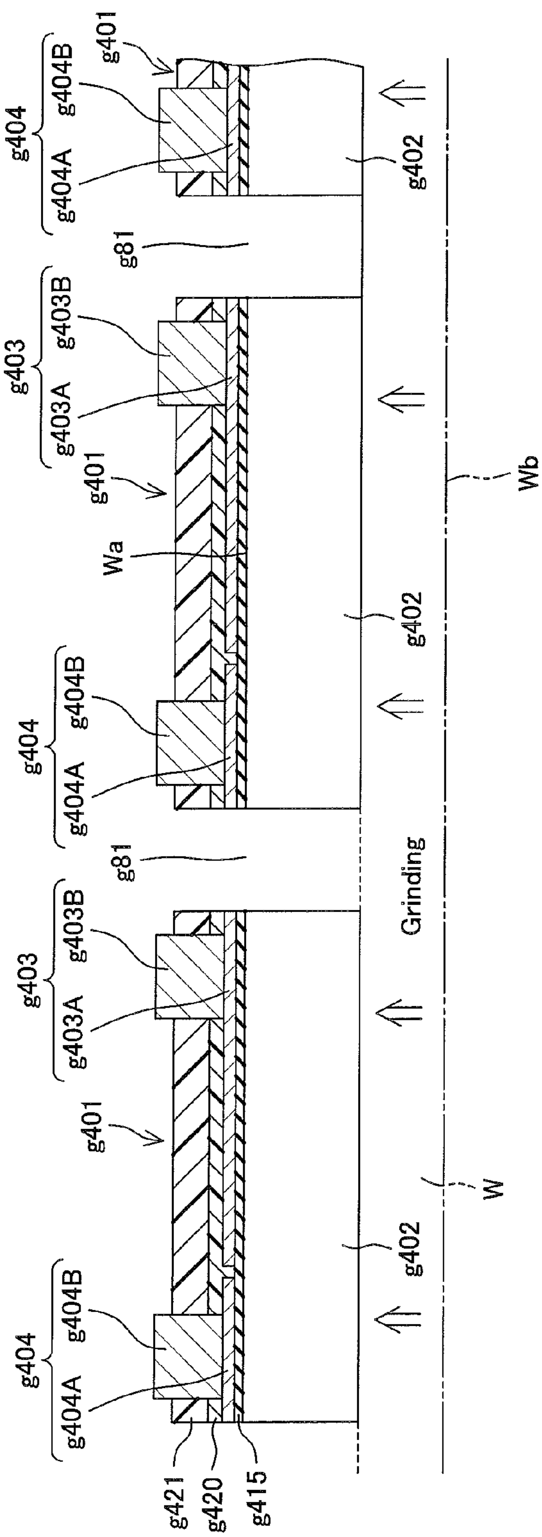

FIG. 185B is a sectional view of the arrangement in the middle of the manufacturing process of FIG. 184 and shows a section corresponding to FIG. 180.

Figure 186:
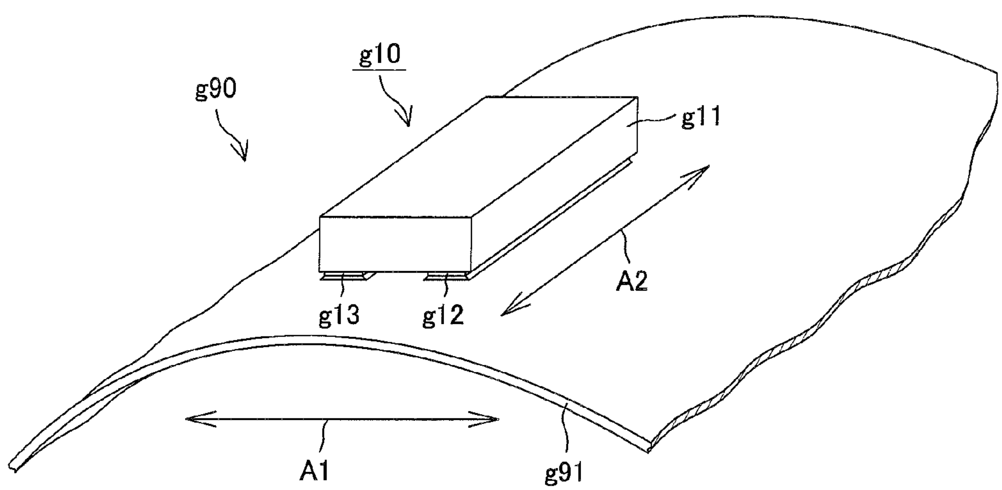

FIG. 186 is an illustrative perspective view of an arrangement example of a circuit assembly according to a preferred embodiment of the seventh reference example.

Figure 187:
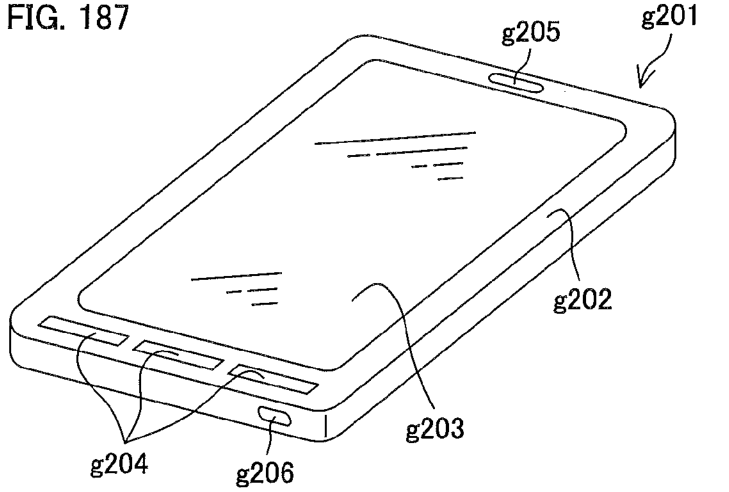

FIG. 187 is a perspective view of an outer appearance of a smartphone that is an example of an electronic equipment in which chip resistors according to the seventh reference example are used.

Figure 188:
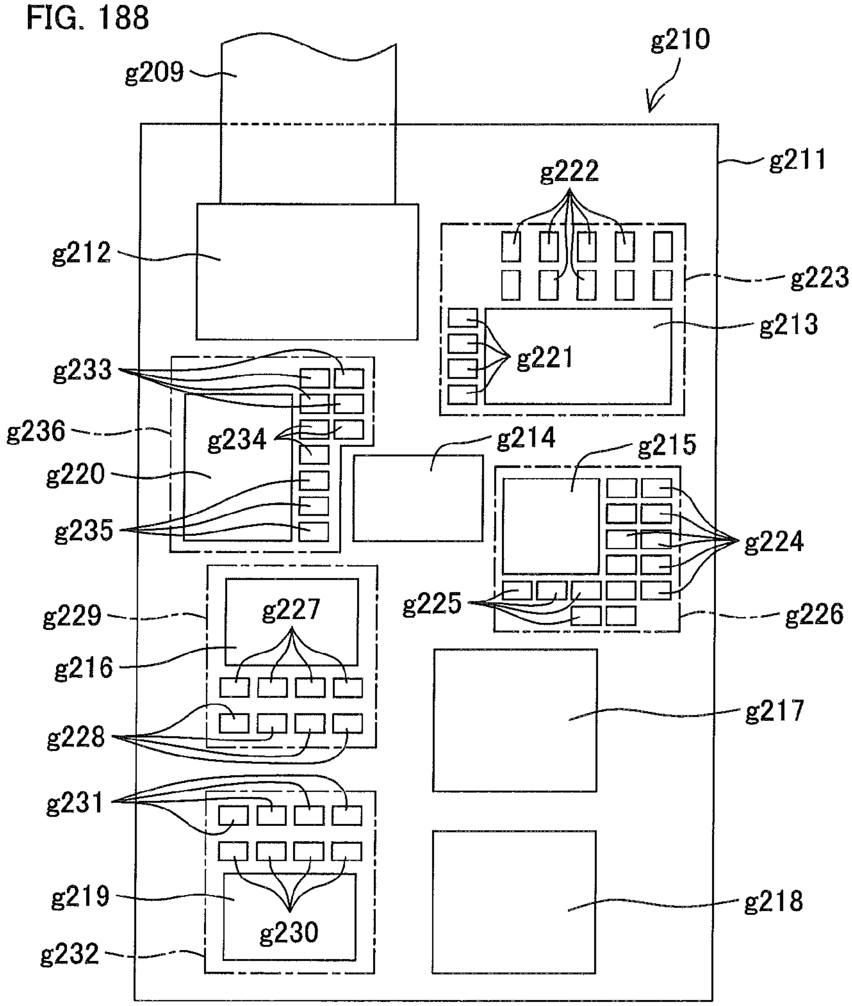

FIG. 188 is an illustrative plan view of the arrangement of an electronic circuit assembly g210 housed in a housing g201.

MODES FOR CARRYING OUT THE INVENTION

Preferred embodiments of the present invention shall now be described in detail with reference to the attached drawings.

Figure 1:
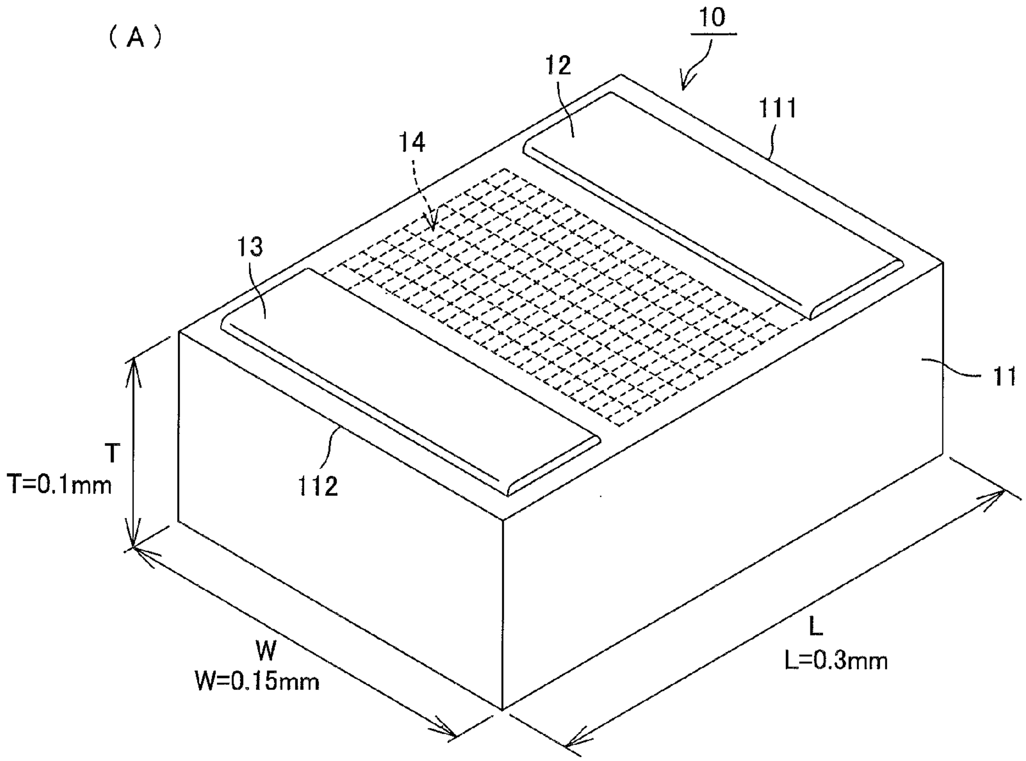
FIG. 1A is an illustrative perspective view of the external arrangement of a chip resistor 10 according to a preferred embodiment of the present invention and FIG. 1B is side view of a state where the chip resistor 10 is mounted on a substrate.
Figure 1:
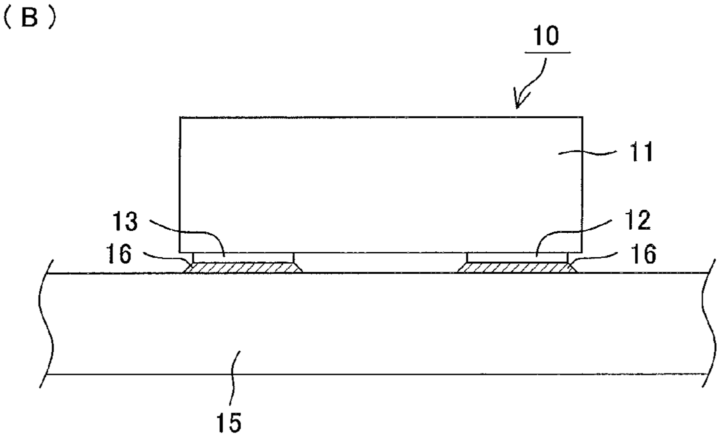

FIG. 1(A) is an illustrative perspective view of the external arrangement of a chip resistor 10 according to a preferred embodiment of the present invention and FIG. 1(B) is a side view of a state where the chip resistor 10 is mounted on a substrate. With reference to FIG. 1(A), the chip resistor 10 according to the preferred embodiment of the present invention includes a first connection electrode 12, a second connection electrode 13, and a resistor network 14 that are formed on a substrate 11. The substrate 11 has a rectangular parallelepiped shape with a substantially rectangular shape in a plan view and is a minute chip with, for example, the length in the long side direction being L=0.3 mm, the width in the short side direction being W=0.15 mm, and the thickness being T=0.1 mm, approximately. The substrate 11 may have a corner-rounded shape with the corners being chamfered in a plan view. The substrate may be formed, for example, of silicon, glass, ceramic, etc. With the preferred embodiment described below, a case where the substrate 11 is a silicon substrate shall be described as an example.

Figure 21:
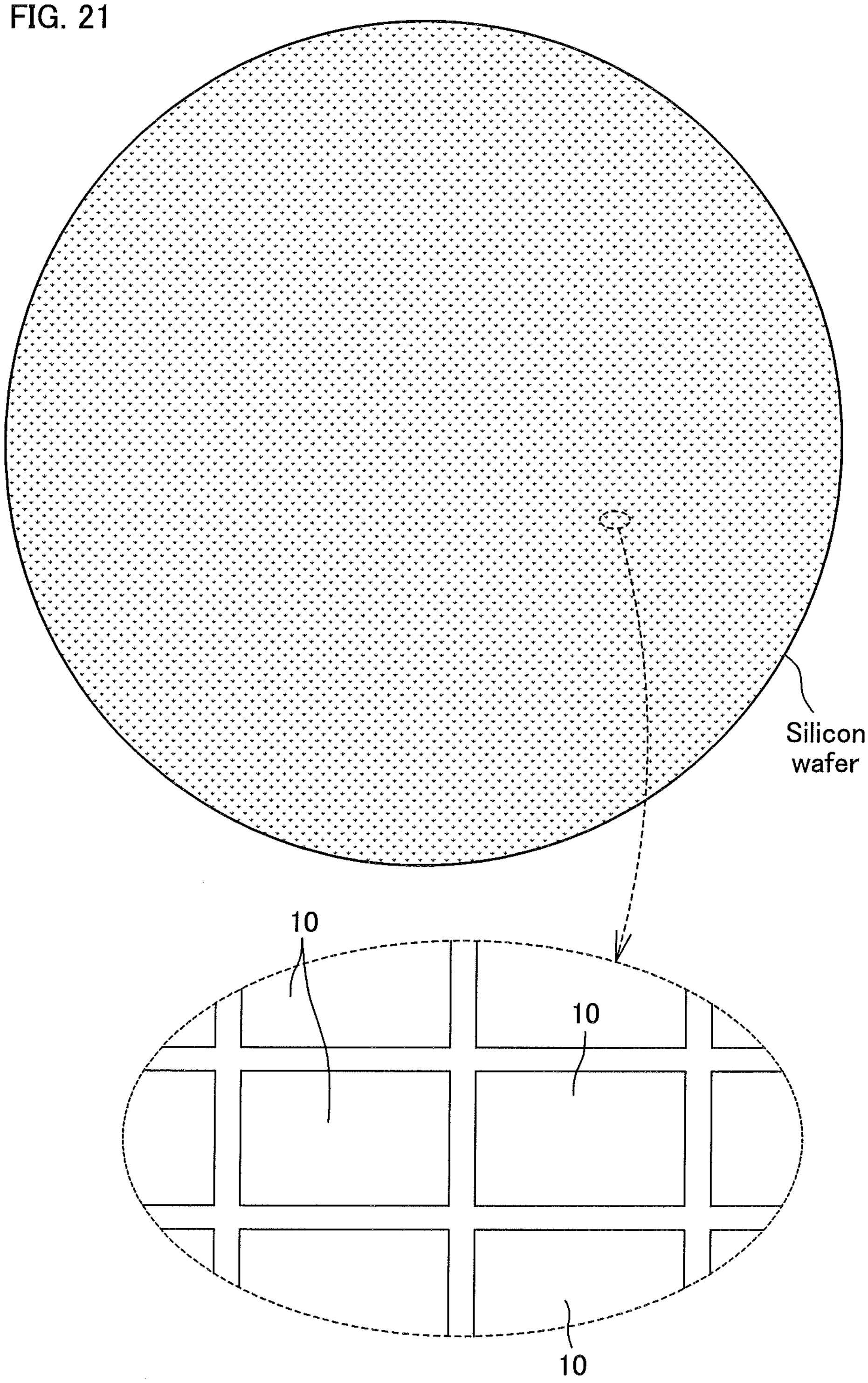
FIG. 21 is an illustrative diagram for describing the cutting out of a chip resistor from a semiconductor wafer (silicon wafer).

The chip resistor 10 is obtained by forming multiple chip resistors 10 in a lattice on a semiconductor wafer (silicon wafer) as shown in FIG. 21 and cutting the semiconductor wafer (silicon wafer) to achieve separation into individual chip resistors 10. On the silicon substrate 11, the first connection electrode 12 is a rectangular electrode that is disposed along one short side 111 of the silicon substrate 11 and is long in the short side 111 direction. The second connection electrode 13 is a rectangular electrode that is disposed on the silicon substrate 11 along the other short side 112 and is long in the short side 112 direction. The resistor network 14 is provided in a central region (circuit forming surface or element forming surface) on the silicon substrate 11 sandwiched by the first connection electrode 12 and the second connection electrode 13. One end side of the resistor network 14 is electrically connected to the first connection electrode 12 and the other end side of the resistor network 14 is electrically connected to the second connection electrode 13. The first connection electrode 12, the second connection electrode 13, and the resistor network 14 may be provided on the silicon substrate 11 by using, for example, a semiconductor manufacturing process. In other words, the discrete chip resistor 10 can be manufactured using apparatus and equipment for manufacturing a semiconductor device. In particular, the resistor network 14 with a fine and accurate layout pattern can be formed by using a photolithography process to be described below.

The first connection electrode 12 and the second connection electrode 13 respectively function as external connection electrodes. In a state where the chip resistor 10 is mounted on a circuit substrate 15, the first connection electrode 12 and the second connection electrode 13 are respectively connected electrically and mechanically by solders to circuits (not shown) of the circuit substrate 15 as shown in FIG. 1(B). In the present preferred embodiment, each of the first connection electrode 12 and the second connection electrode 13 functioning as external connection electrodes is formed of gold (Au) or copper (Cu) and has a solder layer provided in advance on a top surface thereof that is a connection terminal. Therefore there is no need for solder printing in the mounting and the chip resistor is arranged to be mounted easily.

Figure 2:
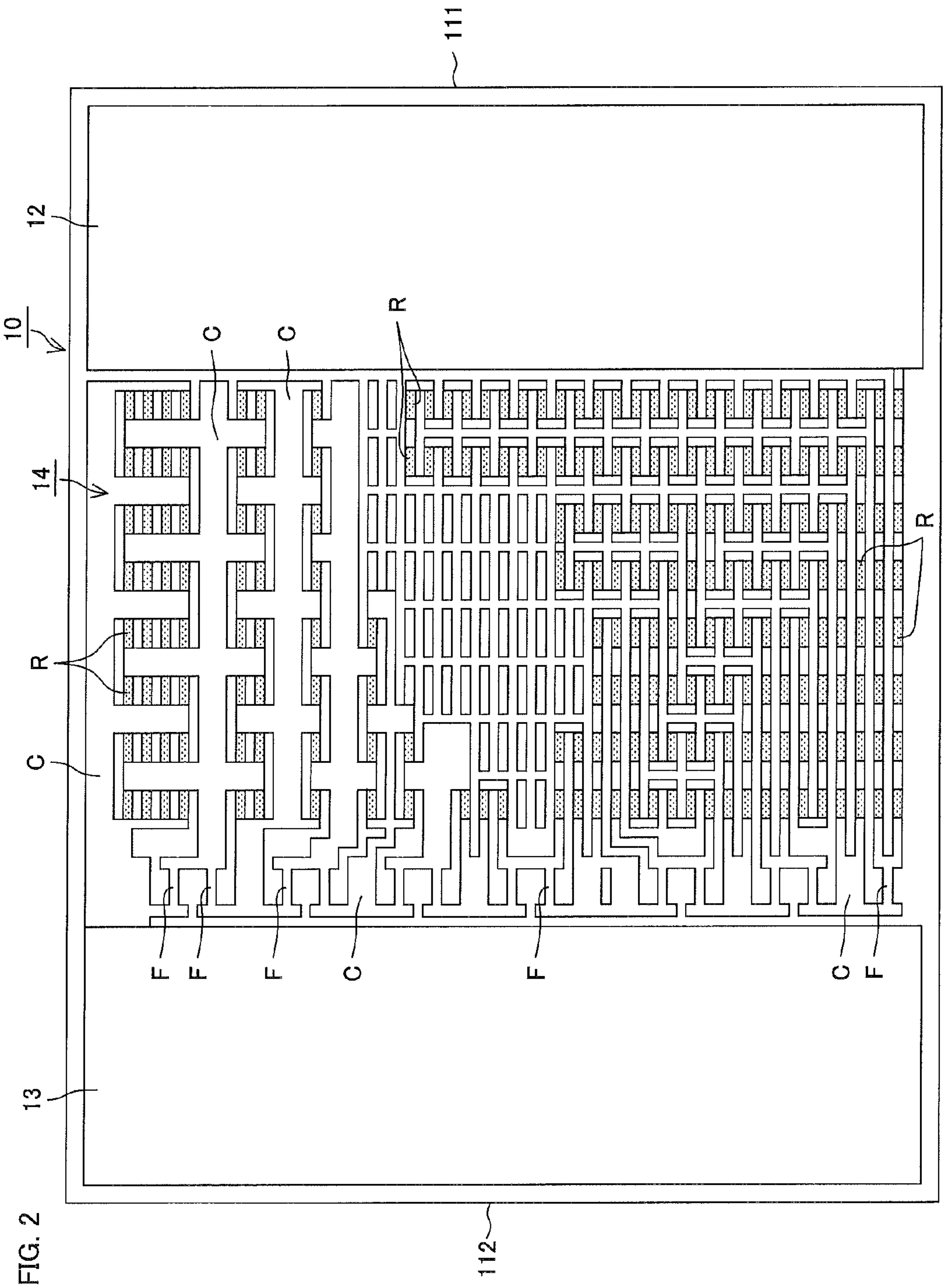
FIG. 2 is a plan view of the chip resistor 10 showing the positional relationship of a first connection electrode 12, a second connection electrode 13, and a resistor network 14 and showing the arrangement in a plan view of the resistor network 14.

FIG. 2 is a plan view of the chip resistor 10 showing the positional relationship of the first connection electrode 12, the second connection electrode 13, and the resistor network 14 and shows the arrangement in a plan view (layout pattern) of the resistor network 14. With reference to FIG. 2, the chip resistor 10 includes the first connection electrode 12, disposed with the long side parallel to the one short side 111 of an upper surface of the silicon substrate and having a substantially rectangular shape in a plan view, the second connection electrode 13, disposed with the long side parallel to the other short side 112 of the silicon substrate upper surface and having a substantially rectangular shape in a plan view, and the resistor network 14 provided in the region of rectangular shape in a plan view between the first connection electrode 12 and the second connection electrode 13.

The resistor network 14 has multiple unit resistor bodies R having an equal resistance value and arrayed in a matrix on the silicon substrate 11 (the example of FIG. 2 has an arrangement including a total of 352 unit resistor bodies R with 8 unit resistor bodies R arrayed along the row direction (length direction of the silicon substrate) and 44 unit resistor bodies R arrayed along the column direction (width direction of the silicon substrate)). A predetermined number from 1 to 64 of the multiple unit resistor bodies R are electrically connected (by wiring films formed of a conductor) to form each of a plurality of types of resistor circuits in accordance with each number of unit resistor bodies R connected. The plurality of types of resistor circuits thus formed are connected in predetermined modes by conductor films C (wiring films formed of a conductor).

Further, a plurality of fuse films F (wiring films formed of a conductor) are provided that are capable of being fused to electrically incorporate resistor circuits into the resistor network 14 or electrically separate resistor circuits from the resistor network 14. The plurality of fuse films F are arrayed along the inner side of the second connection electrode 13 so that the positioning region thereof is rectilinear. More specifically, the plurality of fuse films F and the connection conductor films C are aligned adjacently and disposed so that the alignment directions thereof are rectilinear.

Figure 3A:
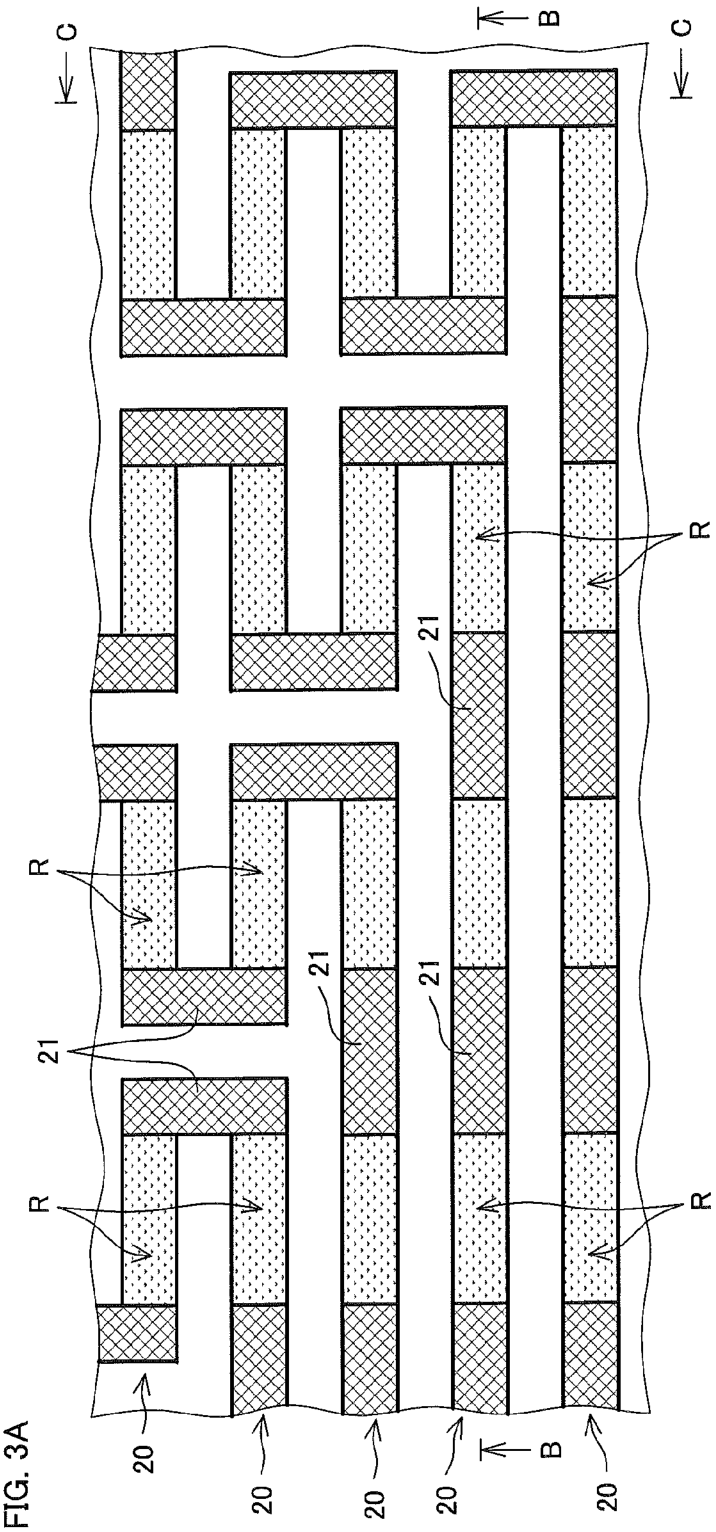
FIG. 3A is an enlarged plan view of a portion of the resistor network 14 shown in FIG. 2.
Figure 3B:
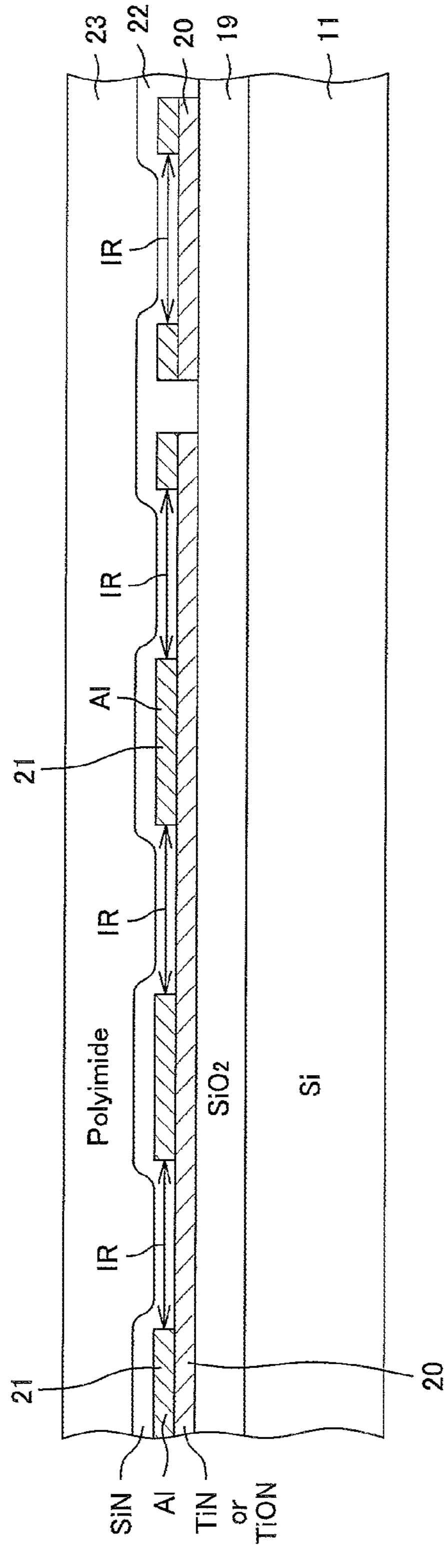
FIG. 3B is a vertical sectional view in the length direction for describing the arrangement of resistor bodies R in the resistor network 14.
Figure 3C:
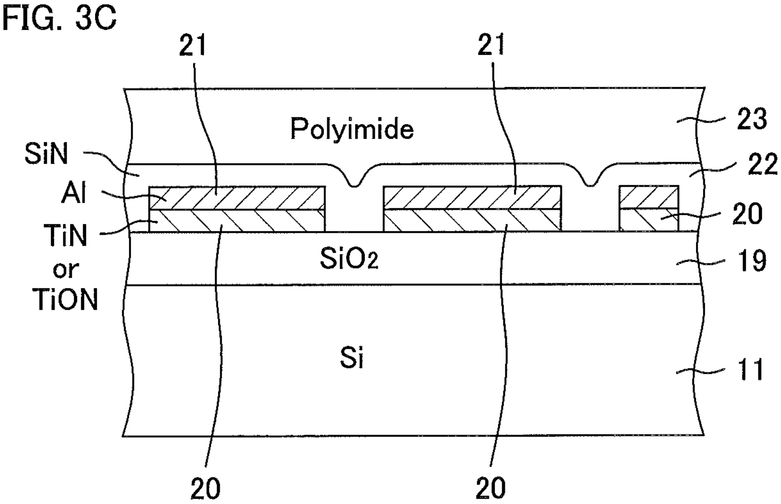
FIG. 3C is a vertical sectional view in the width direction for describing the arrangement of the resistor bodies R in the resistor network 14.

FIG. 3A is an enlarged plan view of a portion of the resistor network 14 shown in FIG. 2, and FIG. 3B and FIG. 3C are a vertical sectional view in the length direction and a vertical sectional view in the width direction, respectively, for describing the structure of the unit resistor bodies R in the resistor network 14. The arrangement of the unit resistor bodies R shall now be described with reference to FIG. 3A, FIG. 3B, and FIG. 3C. An insulating layer ($SiO_2$) 19 is formed on the upper surface of the silicon substrate 11 as the substrate, and a resistor body film 20 is disposed on the insulating film 19. The resistor body film 20 is formed of TiN, TION, or TiSiON. The resistor body film 20 is arranged as a plurality of resistor body films (hereinafter referred to as "resistor body film lines") extending parallel as straight lines between the first connection electrode 12 and the second connection electrode 13, and there are cases where a resistor body film line 20 is cut at predetermined positions in the line direction. An aluminum film is laminated as conductor film pieces 21 on the resistor body film lines 20. The respective conductor film pieces 21 are laminated on the resistor body film lines 20 at fixed intervals IR in the line direction.

Figure 4:
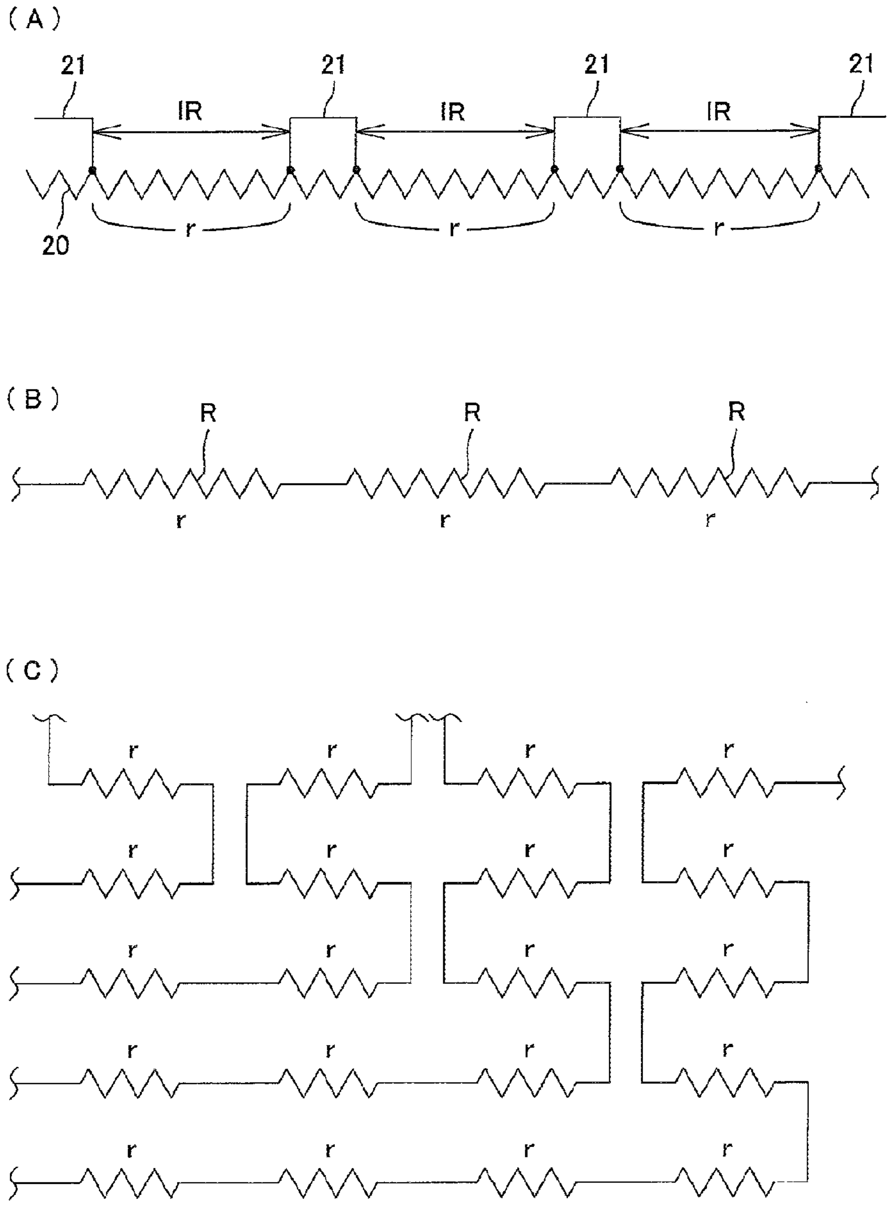
FIG. 4 shows diagrams showing the electrical features of resistive body film lines 20 and conductor films 21 in the form of circuit symbols and an electric circuit diagram.

The electrical features of the resistor body film lines 20 and the conductor film pieces 21 of the present arrangement are indicated by circuit symbols in FIG. 4. That is, as shown in FIG. 4(A), each resistor body film line 20 portion in a region of the predetermined interval IR forms a unit resistor body R with a fixed resistance value r. In each region in which a conductor film piece 21 is laminated, the resistor body film line 20 is short-circuited by the conductor film piece 21. A resistor circuit, made up of serial connections of unit resistor bodies R of resistance r, is thus formed as shown in FIG. 4(B).

Also, adjacent resistor body film lines 20 are connected to each other by the resistor body film lines 20 and the conductor film pieces 21 so that the resistor network shown in FIG. 3A forms the resistor circuit shown in FIG. 4(C). In the illustrative sectional views of FIG. 3B and FIG. 3C, the reference symbol 11 indicates the silicon substrate, 19 indicates the silicon dioxide SiO2 layer as an insulating layer, 20 indicates the resistor body film made of TiN, TiON, or TiSiON formed on the insulating layer 19, 21 indicates the wiring film made of aluminum (Al), 22 indicates an SiN film as a protective film, and 23 indicates a polyimide layer as a protective film.

A process for manufacturing the resistor network 14 with the above arrangement shall be described in detail later. In the present preferred embodiment, the unit resistor bodies R, included in the resistor network 14 formed on the silicon substrate 11, include the resistor body film lines 20 and the conductor film pieces 21 that are laminated on the resistor body film lines 20 at fixed intervals in the line direction, and a single unit resistor body R is arranged from the resistor body film line 20 at the fixed interval IR portion on which the conductor film piece 21 is not laminated. The resistor body film lines 20 making up the unit resistor bodies R are all equal in shape and size. Therefore based on the characteristic that resistor body films of the same shape and same size that are formed on a substrate are substantially the same in value, the multiple unit resistor bodies R arrayed in a matrix on the silicon substrate 11 have an equal resistance value.

Figure 5:
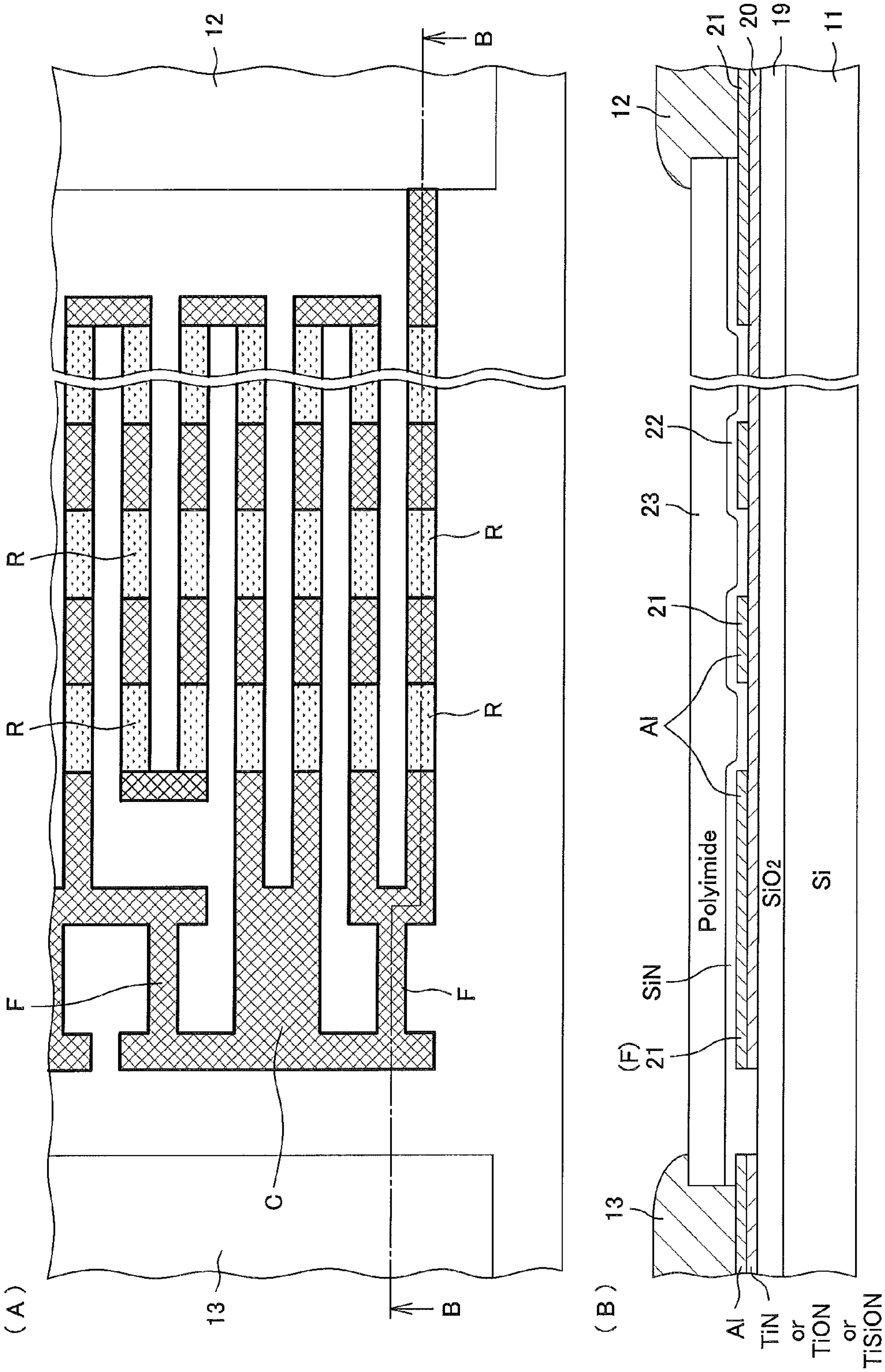
FIG. 5(A) is a partially enlarged plan view of a region including fuse films F drawn by enlarging a portion of the plan view of the chip resistor shown in FIG. 2.
FIG. 5(B) is a structural sectional view taken along B-B in FIG. 5(A).

The conductor film pieces 21 laminated on the resistor body film lines 20 form the unit resistor bodies R and also serve the role of connection wiring films that connect a plurality of unit resistor bodies R to arrange a resistor circuit. FIG. 5(A) is a partially enlarged plan view of a region including the fuse films F drawn by enlarging a portion of the plan view of the chip resistor 10 shown in FIG. 2, and FIG. 5(B) is a structural sectional view taken along B-B in FIG. 5(A).

As shown in FIGS. 5(A) and 5(B), the fuse films F are also formed by the wiring films 21, which are laminated on the resistor body film 20. That is, the fuse films F are formed of aluminum (Al), which is the same metal material as that of the conductor film pieces 21, at the same layer as the conductor film pieces 21, which are laminated on the resistor body film lines 20 that form the resistor bodies R. As mentioned above, the conductor film pieces 21 are also used as the connection conductor films C that electrically connect a plurality of unit resistor bodies R to form a resistor circuit.

That is, at the same layer laminated on the resistor body film 20, the wiring films forming the unit resistor bodies R, the connection wiring films forming the resistor circuits, the connection wiring films making up the resistor network 14, the fuse films, and the wiring films connecting the resistor network 14 to the first connection electrode 12 and the second connection electrode 13 are formed by the same manufacturing process (for example, a sputtering and photolithography process) using the same metal material (for example, aluminum). The manufacturing process of the chip resistor 10 is thereby simplified and also, various types of wiring films can be formed at the same time using a mask in common. Further, the property of alignment with respect to the resistor body film 20 is also improved.

Figure 6:
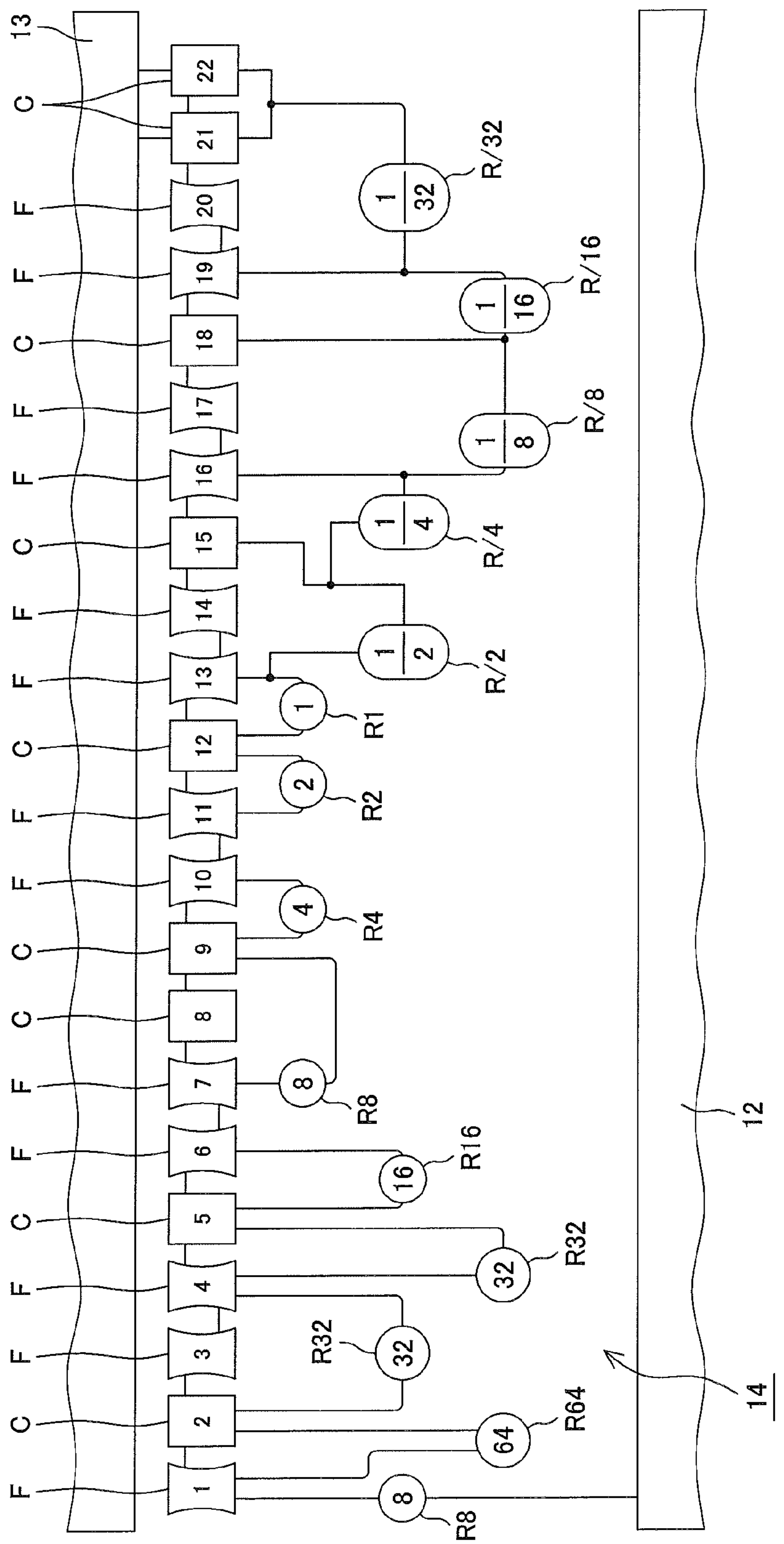
FIG. 6 is an illustrative diagram of the array relationships of connection conductor films C and fuse films F connecting a plurality of types of resistance units in the resistor network 14 shown in FIG. 2 and the connection relationships of the plurality of types of resistance units connected to the connection conductor films C and fuse films F.

FIG. 6 is an illustrative diagram of the array relationships of the connection conductor films C and the fuse films F connecting a plurality of types of resistor circuits in the resistor network 14 shown in FIG. 2 and the connection relationships of the plurality of types of resistor circuits connected to the connection conductor films C and fuse films F. With reference to FIG. 6, one end of a reference resistor circuit R8, included in the resistor network 14, is connected to the first connection electrode 12. The reference resistor circuit R8 is formed by a serial connection of 8 unit resistor bodies R and the other end thereof is connected to a fuse film F1.

One end and the other end of a resistor circuit R64, formed by a serial connection of 64 unit resistor bodies R, are connected to the fuse film F1 and a connection conductor film C2. One end and the other end of a resistor circuit R32, formed by a serial connection of 32 unit resistor bodies R, are connected to the connection conductor film C2 and a fuse film F4. One end and the other end of a resistor circuit body R32, formed by a serial connection of 32 unit resistor bodies R, are connected to the fuse film F4 and a connection conductor film C5.

One end and the other end of a resistor circuit R16, formed by a serial connection of 16 unit resistor bodies R, are connected to the connection conductor film C5 and a fuse film F6. One end and the other end of a resistor circuit R8, formed by a serial connection of 8 unit resistor bodies R, are connected to a fuse film F7 and a connection conductor film C9. One end and the other end of a resistor circuit R4, formed by a serial connection of 4 unit resistor bodies R, are connected to the connection conductor film C9 and a fuse film F10.

One end and the other end of a resistor circuit R2, formed by a serial connection of 2 unit resistor bodies R, are connected to a fuse film F11 and a connection conductor film C12. One end and the other end of a resistor circuit body R1, formed of a single unit resistor body R, are connected to the connection conductor film C12 and a fuse film F13. One end and the other end of a resistor circuit R/2, formed by a parallel connection of 2 unit resistor bodies R, are connected to the fuse film F13 and a connection conductor film C15.

One end and the other end of a resistor circuit R/4, formed by a parallel connection of 4 unit resistor bodies R, are connected to the connection conductor film C15 and a fuse film F16. One end and the other end of a resistor circuit R/8, formed by a parallel connection of 8 unit resistor bodies R, are connected to the fuse film F16 and a connection conductor film C18. One end and the other end of a resistor circuit R/16, formed by a parallel connection of 16 unit resistor bodies R, are connected to the connection conductor film C18 and a fuse film F19.

A resistor circuit R/32, formed by a parallel connection of 32 unit resistor bodies R, is connected to the fuse film F19 and a connection conductor film C22. With the plurality of fuse films F and connection conductor films C, the fuse film F1, the connection conductor film C2, the fuse film F3, the fuse film F4, the connection conductor film C5, the fuse film F6, the fuse film F7, the connection conductor film C8, the connection conductor film C9, the fuse film F10, the fuse film F11, the connection conductor film C12, the fuse film F13, a fuse film F14, the connection conductor film C15, the fuse film F16, the fuse film F17, the connection conductor film C18, the fuse film F19, the fuse film F20, the connection conductor film C21, and the connection conductor film C22 are disposed rectilinearly and connected in series. With this arrangement, when a fuse film F is fused, the electrical connection with the connection conductor film C connected adjacently to the fuse film F is interrupted.

Figure 7:
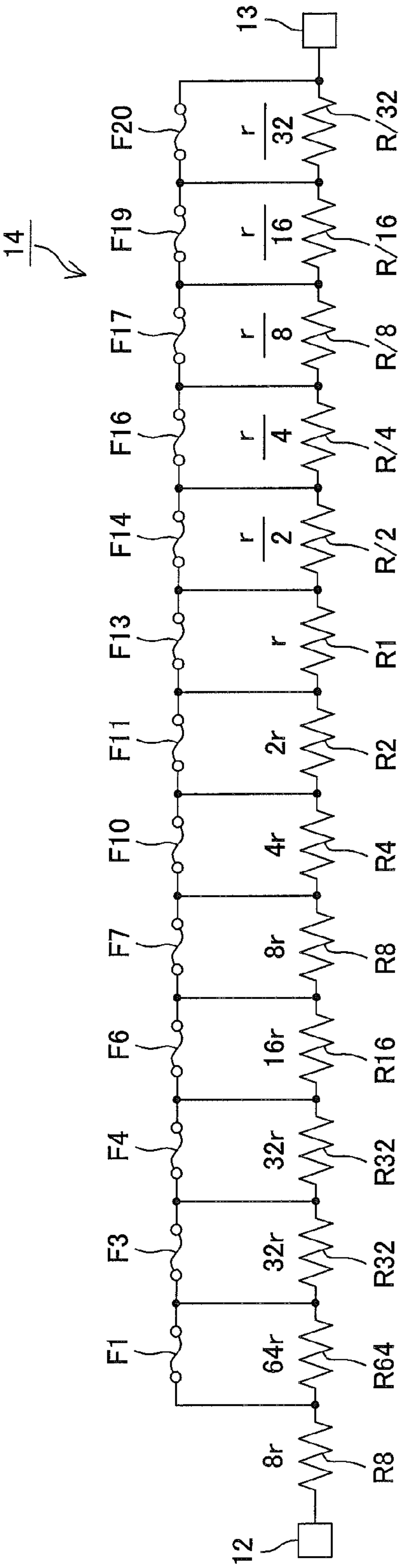
FIG. 7 is an electric circuit diagram of the resistor network 14.

This arrangement is illustrated in the form of an electric circuit diagram in FIG. 7. That is, in a state where none of the fuse films F is fused, the resistor network 14 forms a resistor circuit of the reference resistor circuit R8 (resistance value: 8r), formed by the serial connection of the 8 unit resistor bodies R provided between the first connection electrode 12 and the second connection electrode 13. For example, if the resistance value r of a single unit resistor body R is r=80Ω, the chip resistor 10 is arranged with the first connection electrode 12 and the second connection electrode 13 being connected by a resistor circuit of 8r=640Ω.

With each of the plurality of types of resistor circuits besides the reference resistor circuit R8, a fuse film F is connected in parallel, and these plurality of types of resistor circuits are put in short-circuited states by the respective fuse films F. That is, although 13 resistor circuits R64 to R/32 of 12 types are connected in series to the reference resistor circuit R8, each resistor circuit is short-circuited by the fuse film F that is connected in parallel and thus electrically, the respective resistor circuits are not incorporated in the resistance network 14.

With the chip resistor 10 according to the present preferred embodiment, a fuse film F is selectively fused, for example, by laser light in accordance with the required resistance value. The resistor circuit with which the fuse film F connected in parallel is fused is thereby incorporated into the resistor network 14. The resistor network 14 can thus be made a resistor network with the overall resistance value being the resistance value resulting from serially connecting and incorporating the resistor circuits corresponding to the fused fuse films F.

In other words, with the chip resistor 10 according to the present preferred embodiment, by selectively fusing the fuse films corresponding to a plurality of types of resistor circuits, the plurality of types of resistor circuits (for example, the serial connection of the resistor circuits R64, R32, and R1 in the case of fusing F1, F4, and F13) can be incorporated into the resistor network. The respective resistance values of the plurality of types of resistor circuits are predetermined, and the chip resistor 10 can thus be made to have the required resistance value by adjusting the resistance value of the resistance network 14 in a so to speak digital manner.

Also, the plurality of types of resistor circuits include the plurality of types of serial resistor circuits, with which the unit resistor bodies R having an equal resistance value are connected in series with the number of unit resistor bodies R being increased in geometric progression as 1, 2, 4, 8, 16, 32, and 64, and the plurality of types of parallel resistor circuits, with which the unit resistor bodies R having an equal resistance value are connected in parallel with the number of unit resistor bodies R being increased in geometric progression as 2, 4, 8, 16, and 32. These are connected in series in states of being short-circuited by the fuse films F. Therefore by selectively fusing the fuse films F, the resistance value of the resistor network 14 as a whole can be set to an arbitrary resistance value within a wide range from a small resistance value to a large resistance value.

Figure 8:
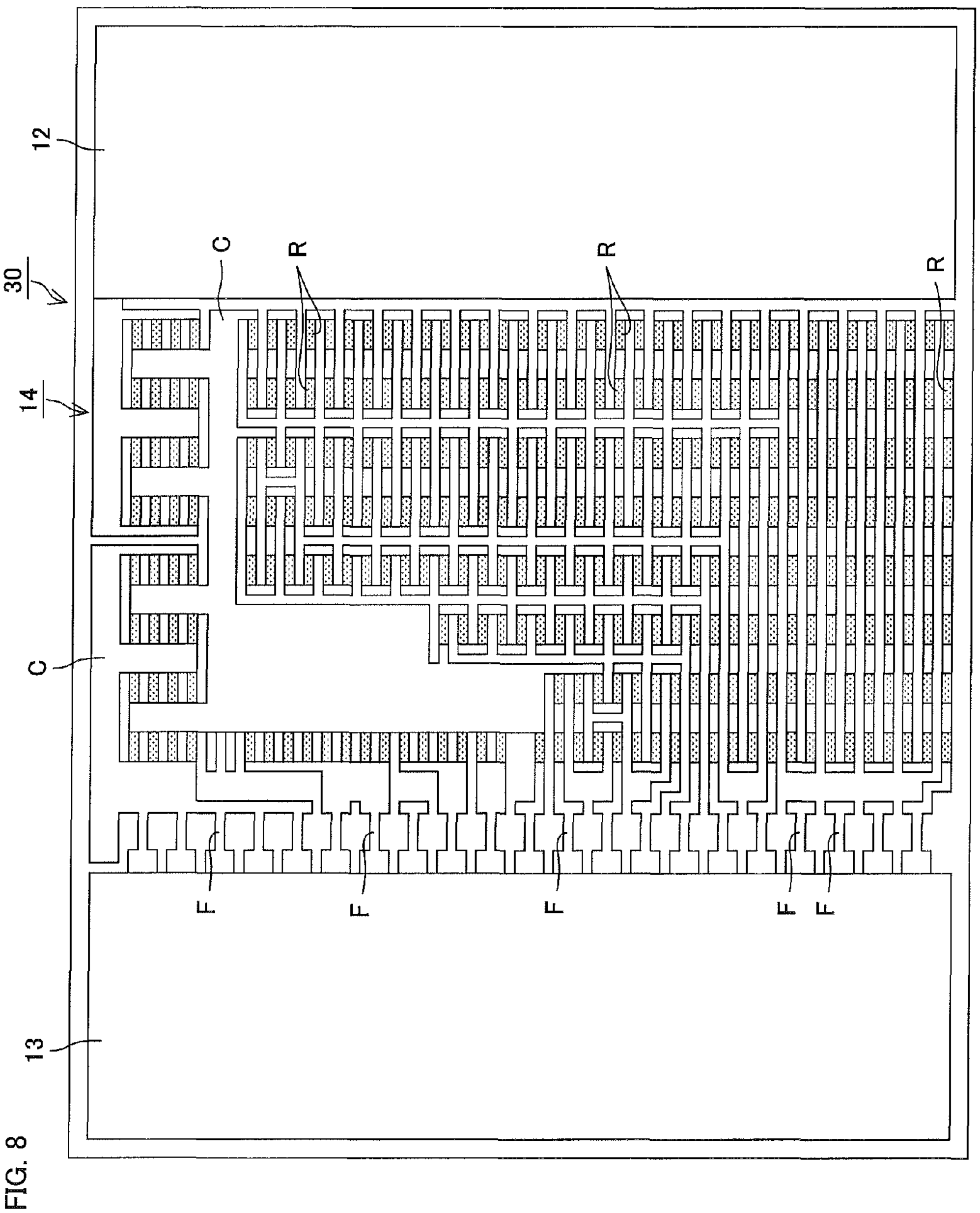
FIG. 8 is a plan view of a chip resistor 30 showing the positional relationship of the first connection electrode 12, the second connection electrode 13, and the resistor network 14 and showing the arrangement in a plan view of the resistor network 14.

FIG. 8 is a plan view of a chip resistor 30 according to another preferred embodiment of the present invention and shows the positional relationship of the first connection electrode 12, the second connection electrode 13, and the resistor network 14 and shows the arrangement in a plan view of the resistor network 14. The chip resistor 30 differs from the chip resistor 10 described above in the mode of connection of the unit resistor bodies R in the resistor network 14.

That is, the resistor network 14 of the chip resistor 30 has multiple unit resistor bodies R having an equal resistance value and arrayed in a matrix on the silicon substrate (the arrangement of FIG. 8 is an arrangement including a total of 352 unit resistor bodies R with 8 unit resistor bodies R arrayed along the row direction (length direction of the silicon substrate) and 44 unit resistor bodies R arrayed along the column direction (width direction of the silicon substrate)). A predetermined number from 1 to 128 of the multiple unit resistor bodies R are electrically connected to form a plurality of types of resistor circuits. The plurality of types of resistor circuits thus formed are connected in parallel modes by conductor films and the fuse films F as network connection means. The plurality of fuse films F are arrayed along the inner side of the second connection electrode 13 so that the positioning region thereof is rectilinear, and when a fuse film F is fused, the resistor circuit connected to the fuse film is electrically separated from the resistor network 14.

Figure 9:
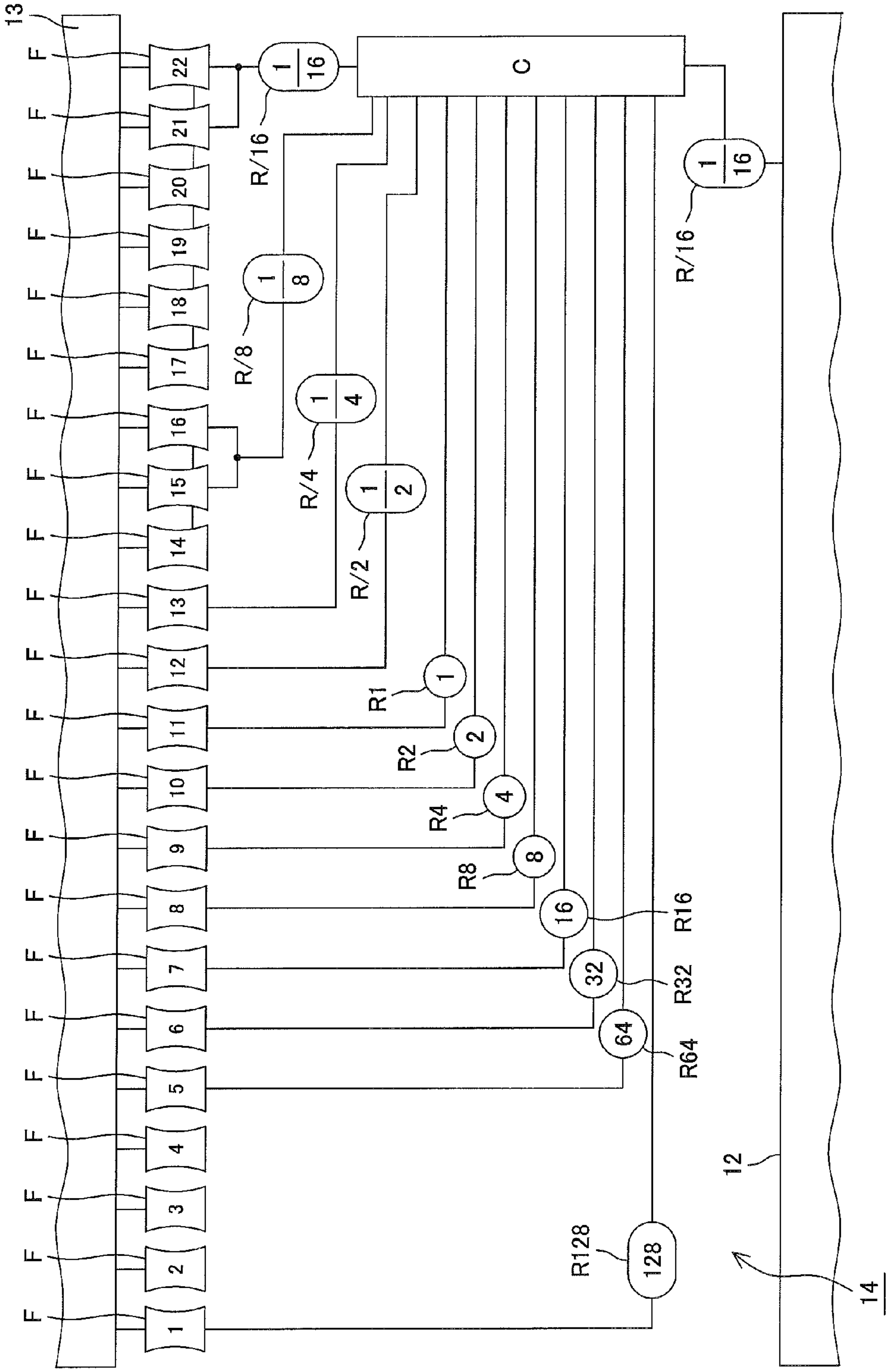
FIG. 9 is an illustrative diagram of the positional relationship of connection conductor films C and fuse films F connecting a plurality of types of resistance units in the resistor network 14 shown in FIG. 8 and the connection relationships of the plurality of types of resistance units connected to the connection conductor films C and fuse films F.

The structure of the multiple unit resistor bodies R forming the resistor network 14, and the structures of the connection conductor films and fuse films F are the same as the structures of the corresponding portions in the chip resistor 10 and description of these shall thus be omitted here. FIG. 9 is an illustrative diagram of the connection modes of the plurality of types of resistor circuits in the resistor network shown in FIG. 8, the array relationship of the fuse films F connecting the resistor circuits, and the connection relationships of the plurality of types of resistor circuits connected to the fuse films F.

Referring to FIG. 9, one end of a reference resistor circuit R/16, included in the resistor network 14, is connected to the first connection electrode 12. The reference resistor circuit R/16 is formed by a parallel connection of 16 unit resistor bodies R and the other end thereof is connected to the connection conductor film C, to which the remaining resistor circuits are connected. One end and the other end of a resistor circuit R128, formed by a serial connection of 128 unit resistor bodies R, are connected to the fuse film F1 and the connection conductor film C.

One end and the other end of a resistor circuit R64, formed by the serial connection of 64 unit resistor bodies R, are connected to the fuse film F5 and the connection conductor film C. One end and the other end of a resistor circuit R32, formed by the serial connection of 32 unit resistor bodies R, are connected to the fuse film F6 and the connection conductor film C. One end and the other end of a resistor circuit R16, formed by the serial connection of 16 unit resistor bodies R, are connected to the fuse film F7 and the connection conductor film C.

One end and the other end of a resistor circuit R8, formed by the serial connection of 8 unit resistor bodies R, are connected to the fuse film F8 and the connection conductor film C. One end and the other end of a resistor circuit R4, formed by the serial connection of 4 unit resistor bodies R, are connected to the fuse film F9 and the connection conductor film C. One end and the other end of a resistor circuit R2, formed by the serial connection of 2 unit resistor bodies R, are connected to the fuse film F10 and the connection conductor film C.

One end and the other end of a resistor circuit R1, formed of the single unit resistor body R, are connected to the fuse film F11 and the connection conductor film C. One end and the other end of a resistor circuit R/2, formed by the parallel connection of 2 unit resistor bodies R, are connected to the fuse film F12 and the connection conductor film C. One end and the other end of a resistor circuit R/4, formed by the parallel connection of 4 unit resistor bodies R, are connected to the fuse film F13 and the connection conductor film C.

The fuse films F14, F15, and F16 are electrically connected, and one end and the other end of a resistor circuit R/8, formed by the parallel connection of 8 unit resistor bodies R, are connected to the fuse films F14, F15, and F16 and the connection conductor film C. The fuse films F17, F18, F19, F20, and F21 are electrically connected, and one end and the other end of a resistor circuit R/16, formed by the parallel connection of 16 unit resistor bodies R, are connected to the fuse films F17 to F21 and the connection conductor film C.

The 21 fuse films F of fuse films F1 to F21 are provided and all of these are connected to the second connection electrode 13. With this arrangement, when a fuse film F, to which one end of a resistor circuit is connected, is fused, the resistor circuit having one end connected to the fuse film F is electrically disconnected from the resistor network 14.

Figure 10:
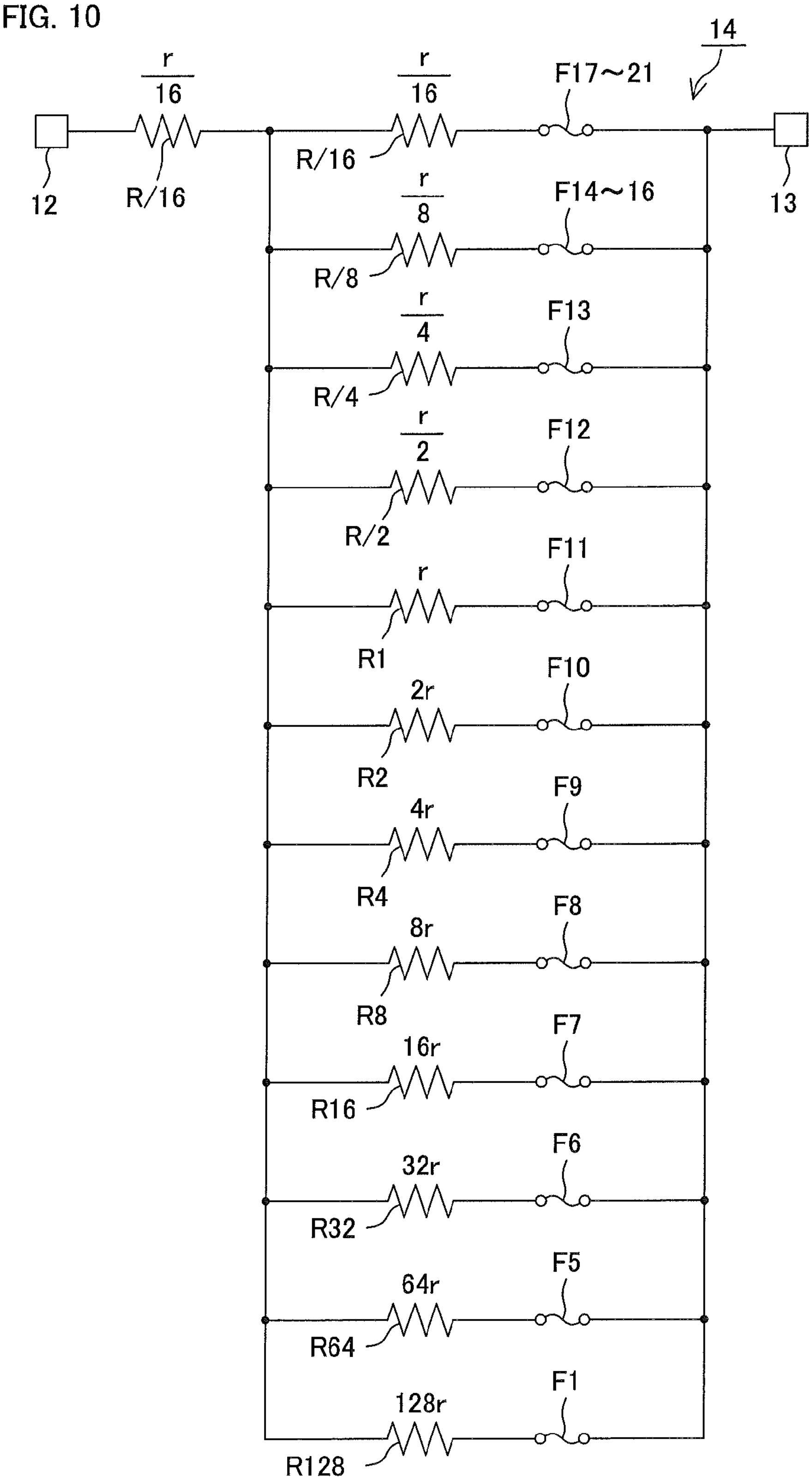
FIG. 10 is an electric circuit diagram of the resistor network 14.

The arrangement of FIG. 9, that is, the arrangement of the resistor network 14 included in the chip resistor 30, is illustrated in the form of an electric circuit diagram in FIG. 10. In a state where none of the fuse films F is fused, the resistor network 14 forms, between the first connection electrode 12 and the second connection electrode 13, a serial connection circuit of the reference resistor circuit R/16 and the parallel connection circuit of the 12 types of resistor circuits R/16, R/8, R/4, R/2, R1, R2, R4, R8, R16, R32, R64, and R128.

A fuse film F is serially connected to each of the 12 types of resistor circuits besides the reference resistor circuit R/16. Therefore with the chip resistor 30 having the resistor network 14, by selectively fusing a fuse film F, for example, by laser light in accordance with the required resistance value, the resistor circuit corresponding to the fused fuse film F (the resistor circuit connected in series to the fuse film F) is electrically separated from the resistor network 14 and the resistance value of the chip resistor 10 can thereby be adjusted.

In other words, with the chip resistor 30 according to the present preferred embodiment, by selectively fusing the fuse films provided in correspondence to a plurality of types of resistor circuits, the plurality of types of resistor circuits can be electrically separated from the resistor network. The respective resistance values of the plurality of types of resistor circuits are predetermined, and the chip resistor 30 can thus be made to have the required resistance value by adjusting the resistance value of the resistance network 14 in a so to speak digital manner.

Also, the plurality of types of resistor circuits include the plurality of types of serial resistor circuits, with which the unit resistor bodies R having an equal resistance value are connected in series with the number of unit resistor bodies R being increased in geometric progression as 1, 2, 4, 8, 16, 32, 64, and 128, and the plurality of types of parallel resistor circuits, with which the unit resistor bodies R having an equal resistance value are connected in parallel with the number of unit resistor bodies R being increased in geometric progression as 2, 4, 8, and 16. Therefore by selectively fusing the fuse films F, the resistance value of the resistor network 14 as a whole can be set to an arbitrary resistance value finely and digitally.

Figure 11:
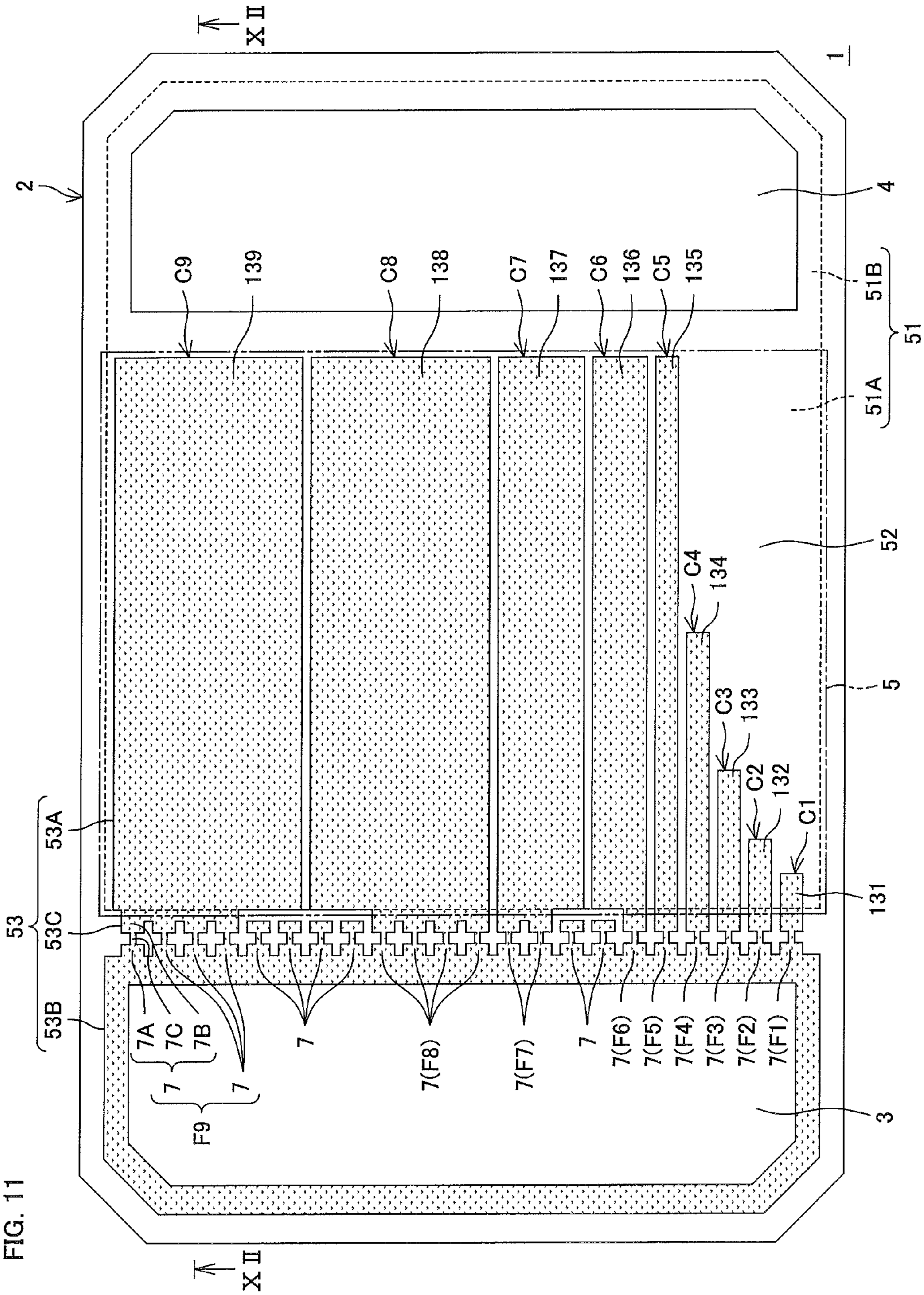
FIG. 11 is a plan view of a chip capacitor according to a preferred embodiment of the present invention.
Figure 12:
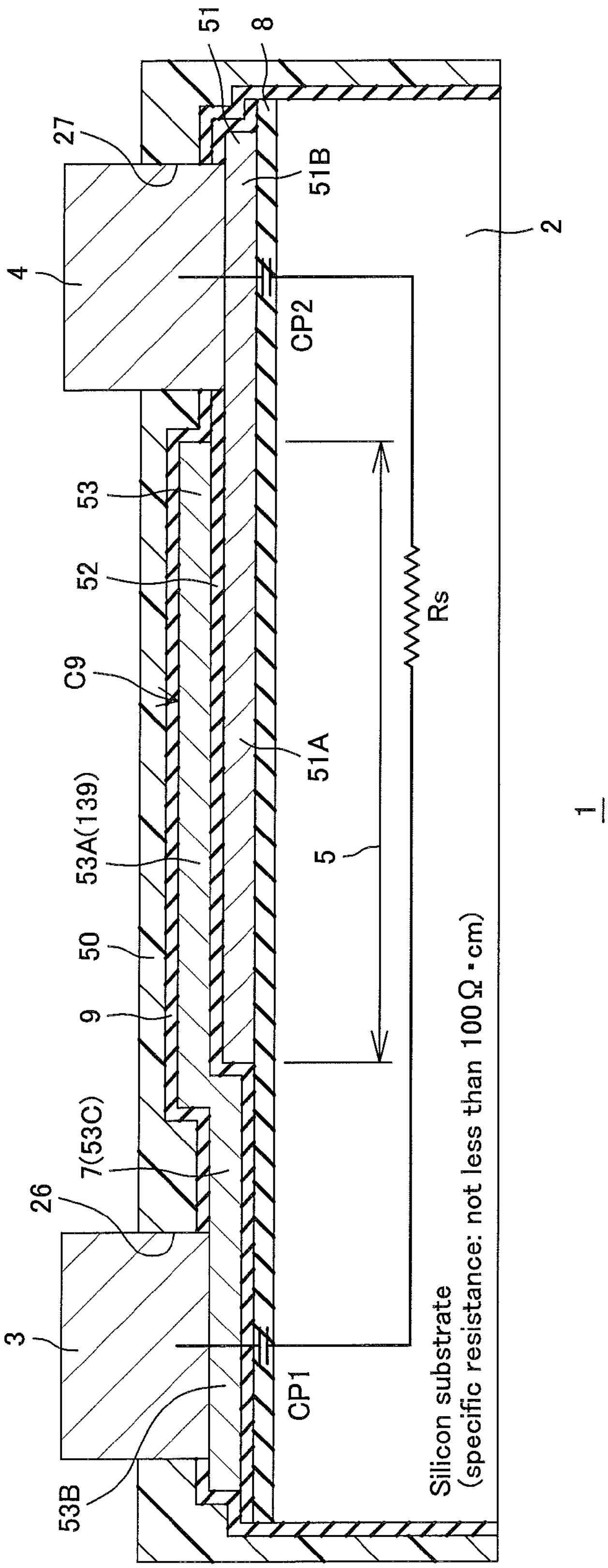
FIG. 12 is a sectional view taken along section line XII-XII in FIG. 11.
Figure 13:
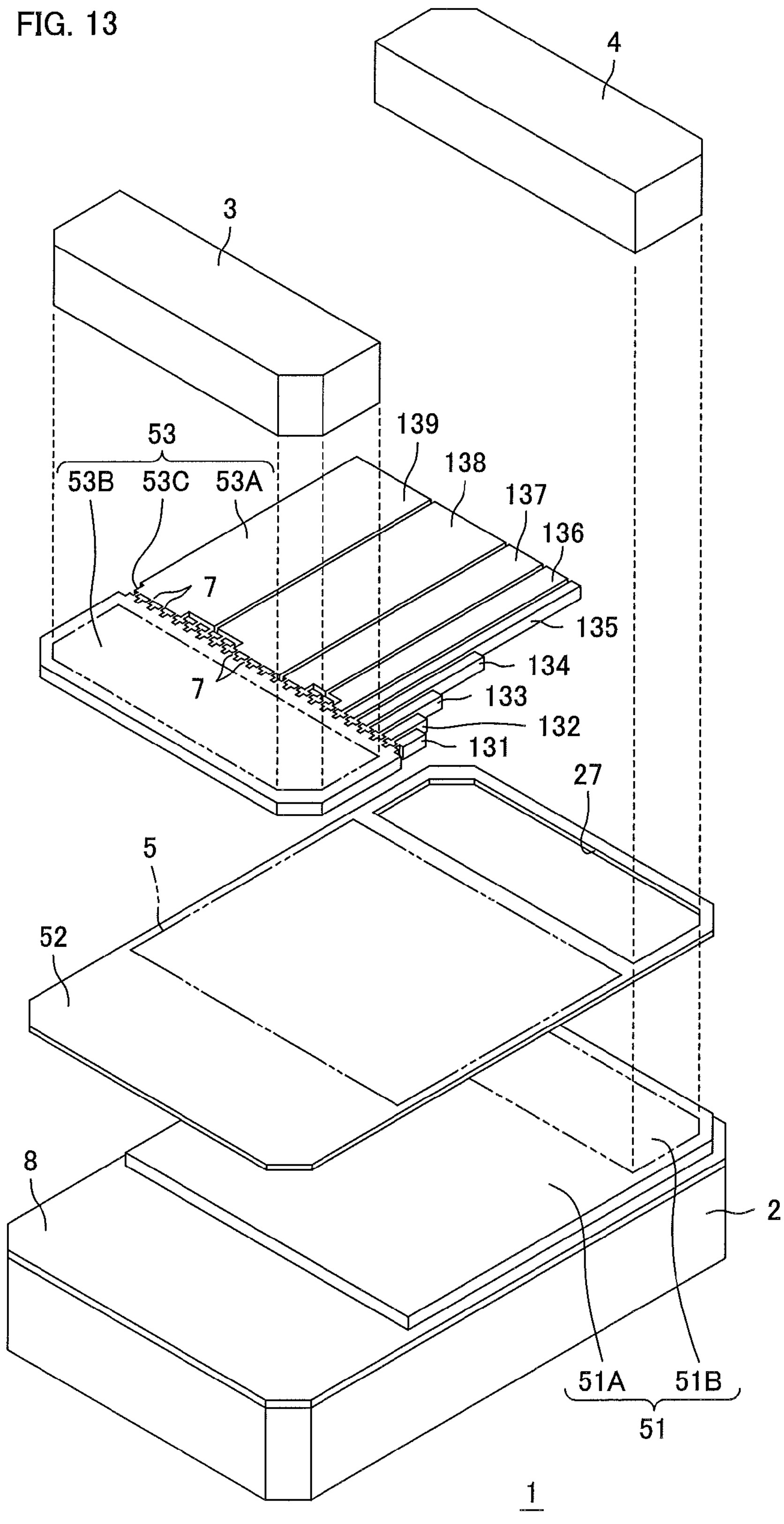
FIG. 13 is an exploded perspective view showing the arrangement of a portion of the chip capacitor in a separated state.

FIG. 11 is a plan view of a chip capacitor according to another preferred embodiment of the present invention, and FIG. 12 is a sectional view thereof showing a section taken along section line XII-XII in FIG. 11. Further, FIG. 13 is an exploded perspective view showing the arrangement of a portion of the chip capacitor in a separated state. The chip capacitor 1 includes a substrate 2, a first external electrode 3 disposed on the substrate 2, and a second external electrode 4 disposed similarly on the substrate 2. In the present preferred embodiment, the substrate 2 has, in a plan view, a rectangular shape with the four corners chamfered. The rectangular shape has dimensions of, for example, approximately 0.3 mm×0.15 mm. The first external electrode 3 and the second external electrode 4 are respectively disposed at portions at respective ends in the long direction of the substrate 2. In the present preferred embodiment, each of the first external electrode 3 and the second external electrode 4 has a substantially rectangular planar shape extending in the short direction of the substrate 2 and has chamfered portions at two locations respectively corresponding to the corners of the substrate 2. On the substrate 2, a plurality of capacitor parts C1 to C9 are disposed within a capacitor arrangement region 5 between the first external electrode 3 and the second external electrode 4. The plurality of capacitor parts C1 to C9 are electrically connected respectively to the first external electrode 3 via a plurality of fuse units 7.

As shown in FIG. 12 and FIG. 13, an insulating film 8 is formed on a top surface of the substrate 2, and a lower electrode film 51 is formed on a top surface of the insulating film 8. The lower electrode film 51 is formed to spread across substantially the entirety of the capacitor arrangement region 5 and extend to a region directly below the second external electrode 4. More specifically, the lower electrode film 51 has a capacitor electrode region 51A functioning as a lower electrode in common to the capacitor parts C1 to C9 and a pad region 51B leading out to an external electrode. The capacitor electrode region 51A is positioned in the capacitor arrangement region 5 and the pad region 51B is positioned directly below the second external electrode 4.

In the capacitor arrangement region 5, a capacitance film (dielectric film) 52 is formed so as to cover the lower electrode film 51 (capacitor electrode region 51A). The capacitance film 52 is continuous across the entirety of the capacitor electrode region 51A and, in the present preferred embodiment, further extends to a region directly below the first external electrode 3 and covers the insulating film 8 outside the capacitor arrangement region 5. An upper electrode film 53 is formed on the capacitance film 52. In FIG. 11, the upper electrode film 53 is indicated with fine dots added for the sake of clarity. The upper electrode film 53 includes a capacitor electrode region 53A positioned in the capacitor arrangement regions, a pad region 53B positioned directly below the first external electrode 3, and a fuse region 53C disposed between the pad region 53B and the capacitor electrode region 53A.

In the capacitor electrode region 53A, the upper electrode film 53 is divided into a plurality of electrode film portions 131 to 139. In the present preferred embodiment, the respective electrode film portions 131 to 139 are all formed to rectangular shapes and extend in the form of bands from the fuse region 53C toward the second external electrode 4. The plurality of electrode film portions 131 to 139 face the lower electrode film 51 across the capacitance film 52 over a plurality of types of facing areas. More specifically, the facing areas of the electrode film portions 131 to 139 with respect to the lower electrode film 51 may be set to be 1:2:4:8:16:32:64:128:128. That is, the plurality of electrode film portions 131 to 139 include the plurality of electrode film portions differing in facing area and more specifically include the plurality of electrode film portions 131 to 138 (or 131 to 137 and 139) having facing areas that are set to form a geometric progression with a common ratio of 2. The plurality of capacitor parts C1 to C9, respectively arranged by the respective electrode film portions 131 to 139 and the facing lower electrode film 51 across the capacitance film 12, thus include the plurality of capacitor parts having mutually different capacitance values. If the ratio of the facing areas of the electrode film portions 131 to 139 is as mentioned above, the ratio of the capacitance values of the capacitor parts C1 to C9 is equal to the ratio of the facing areas and is 1:2:4:8:16:32:64:128:128. The plurality of capacitor parts C1 to C9 thus include the plurality of capacitor parts C1 to C8 (or C1 to C7 and C9) with capacitance values set to form the geometric progression with the common ratio of 2.

In the present preferred embodiment, the electrode film portions 131 to 135 are formed to bands that are equal in width and have lengths with the ratio thereof being set to 1:2:4:8:16. Also, the electrode film portions 135, 136, 137, 138, and 139 are formed to bands that are equal in length and have widths with the ratio thereof being set to 1:2:4:8:8. The electrode film portions 135 to 139 are formed to extend across a range from an end edge at the first external electrode 3 side to an end edge at the second external electrode 4 side of the capacitor arrangement regions, and the electrode film portions 131 to 134 are formed to be shorter than this range.

The pad region 53B is formed to be substantially similar in shape to the first external electrode 3 and has a substantially rectangular planar shape having two chamfered portions corresponding to corner portions of the substrate 2. The fuse region 53C is disposed along one long side (the long side at the inner side with respect to the peripheral edge of the substrate 2) of the pad region 53B. The fuse region 53C includes the plurality of fuse units 7 that are aligned along the one long side of the pad region 53B. The fuse units 7 are formed of the same material as and integral to the pad region 53B of the upper electrode film 53. The plurality of electrode film portions 131 to 139 are each formed integral to one or a plurality of the fuse units 7, are connected to the pad region 53B via the fuse units 7, and are electrically connected to the first external electrode 3 via the pad region 53B. Each of the electrode film portions 131 to 136 of comparatively small area is connected to the pad region 53B via a single fuse unit 7, and each of the electrode film portions 137 to 139 of comparatively large area is connected to the pad region 53B via a plurality of fuse units 7. It is not necessary for all of the fuse units 7 to be used and, in the present preferred embodiment, a portion of the fuse units 7 is unused.

The fuse units 7 include first wide portions 7A arranged to be connected to the pad region 53B, second wide portions 7B arranged to be connected to the electrode film portions 131 to 139, and narrow portions 7C connecting the first and second wide portions 7A and 7B. The narrow portions 7C are arranged to be capable of being cut (fused) by laser light. Unnecessary electrode film portions among the electrode film portions 131 to 139 can thus be electrically disconnected from the first and second external electrodes 3 and 4 by cutting the fuse units 7.

Although omitted from illustration in FIG. 11 and FIG. 13, a top surface of the chip capacitor 1 that includes the top surface of the upper electrode film 53 is covered by a passivation film 9 as shown in FIG. 12. The passivation film 9 is constituted, for example, of a nitride film and is formed not only to cover an upper surface of the chip capacitor 1 but also to extend to side surfaces of the substrate 2 and cover the side surfaces. Further, a resin film 50, made of a polyimide resin, etc., is formed on the passivation film 9. The resin film 50 is formed to cover the upper surface of the chip capacitor 1 and extend to the side surfaces of the substrate 2 to cover the passivation film 9 on the side surfaces.

The passivation film 9 and the resin film 50 are protective films that protect the top surface of the chip capacitor 1. In these films, pad openings 26 and 27 are respectively formed in regions corresponding to the first external electrode 3 and the second external electrode 4. The pad openings 26 and 27 penetrate through the passivation film 9 and the resin film 50 so as to respectively expose a region of a portion of the pad region 53B of the upper electrode film 53 and a region of a portion of the pad region 51B of the lower electrode film 51. Further, with the present preferred embodiment, a pad opening 27 corresponding to the second external electrode 4 also penetrates through the capacitance film 52.

The first external electrode 3 and the second external electrode 4 are respectively embedded in the pad openings 26 and 27. The first external electrode 3 is thereby bonded to the pad region 53B of the upper electrode film 53 and the second external electrode 4 is bonded to the pad region 51B of the lower electrode film 51. The first and second external electrodes 3 and 4 are formed to project from a top surface of the resin film 50. The chip capacitor 1 can thereby be flip-chip bonded to a mounting substrate.

Figure 14:
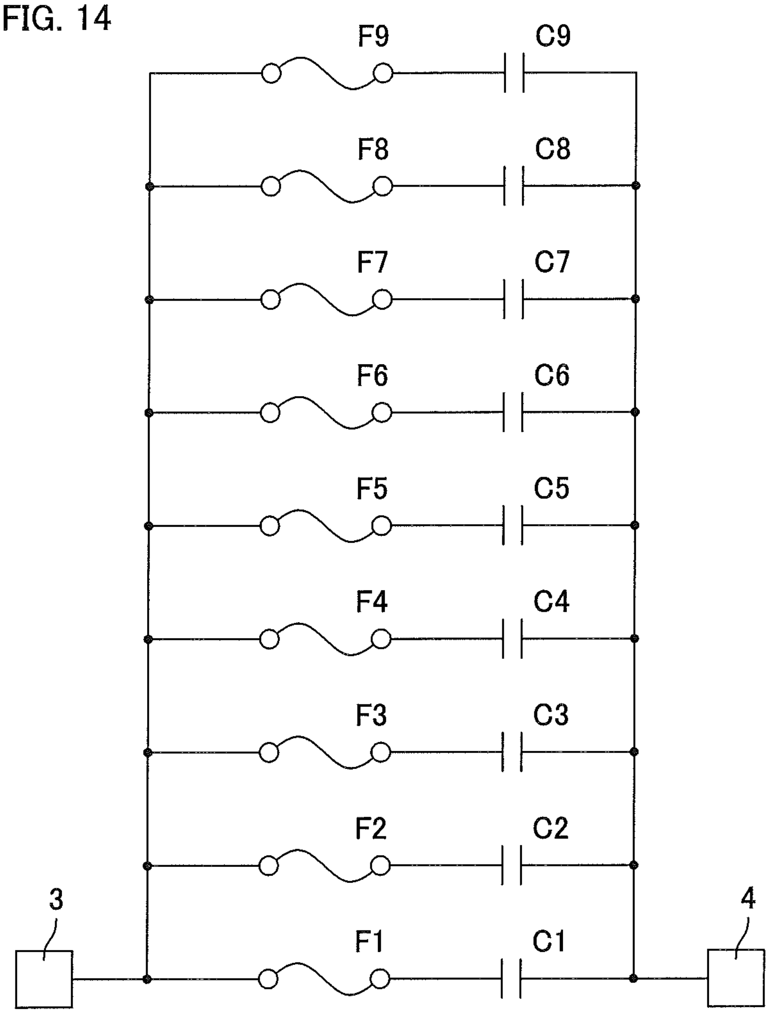
FIG. 14 is a circuit diagram of the electrical arrangement of the interior of the chip capacitor.

FIG. 14 is a circuit diagram of the electrical arrangement of the interior of the chip capacitor 1. The plurality of capacitor parts C1 to C9 are connected in parallel between the first external electrode 3 and the second external electrode 4. Fuses F1 to F9, each arranged from one or a plurality of the fuse units 7, are interposed in series between the respective capacitor parts C1 to C9 and the first external electrode 3. When all of the fuses F1 to F9 are connected, the capacitance value of the chip capacitor 1 is equal to the total of the capacitance values of the capacitor parts C1 to C9. When one or two or more fuses selected from among the plurality of fuses F1 to F9 is or are cut, each capacitor part corresponding to the cut fuse is disconnected and the capacitance value of the chip capacitor 1 decreases by just the capacitance value of the disconnected capacitor part or parts.

Therefore by measuring the capacitance value across the pad regions 51B and 53B (the total capacitance value of the capacitor parts C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor parts C1 to C8 are set to form a geometric progression with a common ratio of 2, fine adjustment to the targeted capacitance value at a precision corresponding to the capacitance value of the capacitor part C1, which is the smallest capacitance value (value of the first term in the geometric progression), is made possible.

For example, the capacitance values of the capacitor parts C1 to C9 may be set as follows. C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor 1 can be finely adjusted at a minimum adjustment precision of 0.03125 pF. Also, the fuses to be cut among the fuses F1 to F9 can be selected appropriately to provide the chip capacitor 1 with an arbitrary capacitance value between 0.1 pF and 10 pF.

As described above, with the present preferred embodiment, the plurality of capacitor parts C1 to C9 that can be disconnected by the fuses F1 to F9 are provided between the first external electrode 3 and the second external electrode 4. The capacitor parts C1 to C9 include a plurality of capacitor parts that differ in capacitance value and more specifically include a plurality of capacitor parts with capacitance values set to form a geometric progression. The chip capacitor 1, which can accommodate a plurality of types of capacitance values without change of design and can be accurately adjusted to the desired capacitance value by selection and fusion by laser light of one or a plurality of fuses among the fuses F1 to F9, can thus be provided.

Details of respective portions of the chip capacitor 1 shall now be described. The substrate 2 may have, for example, a rectangular shape of 0.3 mm×0.15 mm, 0.4 mm×0.2 mm, or 0.2 mm×0.1 mm, etc. (preferably a size of not more than 0.4 mm×0.2 mm) in a plan view. The capacitor arrangement region 5 is generally a square region with each side having a length corresponding to the length of the short side of the substrate 2. The thickness of the substrate 2 may be approximately 150 μm. The substrate 2 may, for example, be a substrate that has been thinned by grinding or polishing from a rear surface side (surface on which the capacitor parts C1 to C9 are not formed). As the material of the substrate 2, a semiconductor substrate as represented by a silicon substrate may be used or a glass substrate may be used or a resin film may be used.

The insulating film 8 may be a silicon oxide film or other oxide film. The film thickness thereof may be approximately 500 Å to 2000 Å. The lower electrode film 51 is preferably a conductive film, a metal film in particular, and may, for example, be an aluminum film. The lower electrode film 51 that is constituted of an aluminum film may be formed by a sputtering method. Similarly, the upper electrode film 53 is preferably constituted of a conductive film, a metal film in particular, and may, for example, be an aluminum film. The upper electrode film 53 that is constituted of an aluminum film may be formed by the sputtering method. The patterning for dividing the capacitor electrode region 53A of the upper electrode film 53 into the electrode film portions 131 to 139 and shaping the fuse region 53C into the plurality of fuse units 7 may be performed by photolithography and etching processes.

The capacitance film 52 may be constituted, for example, of a silicon nitride film, and the film thickness thereof may be 500 Å to 2000 Å (for example, 1000 Å). The capacitance film 52 may be a silicon nitride film formed by plasma CVD (chemical vapor deposition). The passivation film 9 may be constituted, for example, of a silicon nitride film and may be formed, for example, by the plasma CVD method. The film thickness thereof may be approximately 8000 Å. As mentioned above, the resin film 50 may be constituted of a polyimide film or other resin film.

Figure 15:
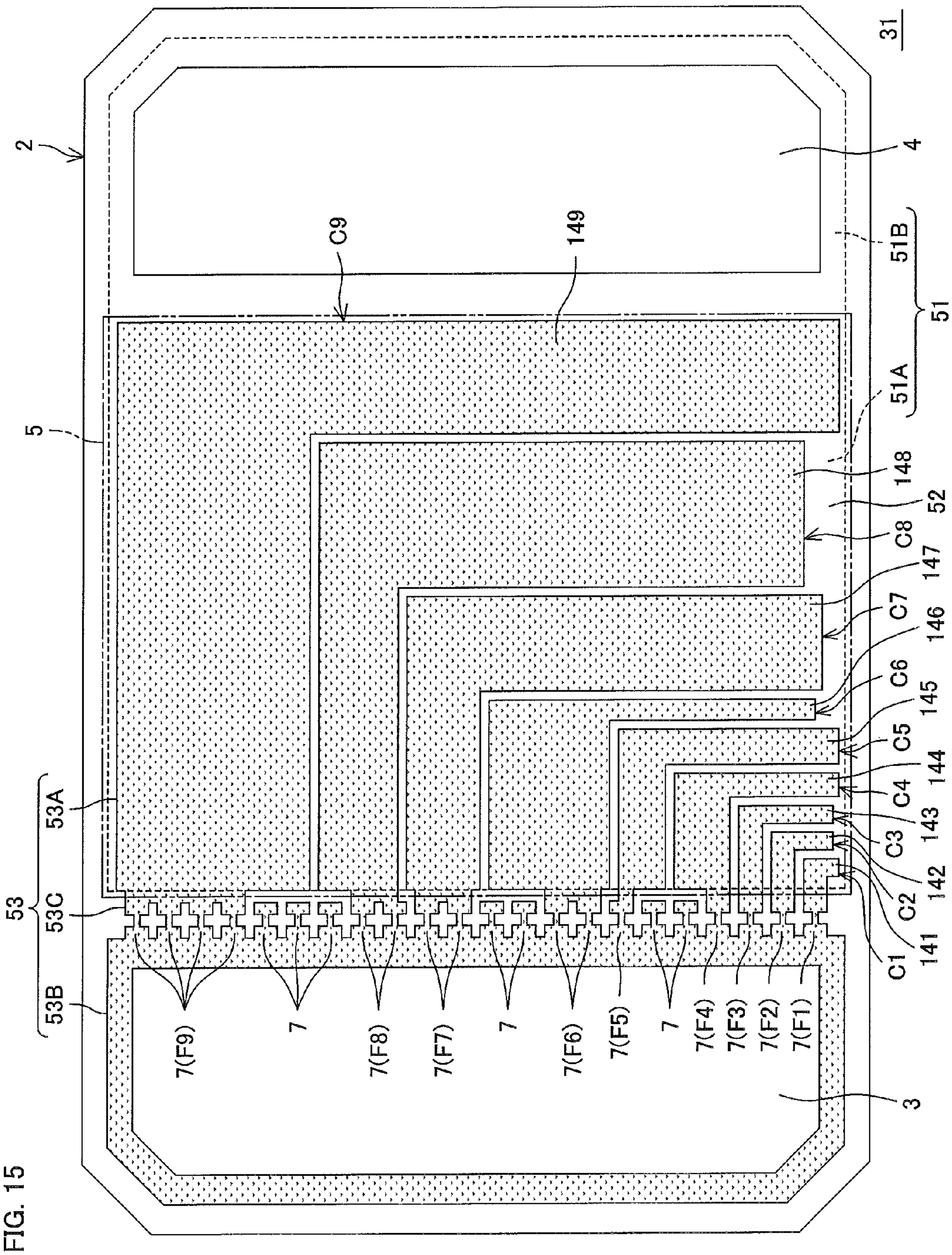
FIG. 15 is a plan view for describing an arrangement of a chip capacitor according to another preferred embodiment of the present invention.

FIG. 15 is a plan view for describing the arrangement of a chip capacitor 31 according to yet another preferred embodiment of the present invention. In FIG. 15, portions corresponding to respective portions shown in FIG. 11 are indicated using the same reference symbols as in FIG. 11. In the chip capacitor 1 of the preferred embodiment described above, the capacitor electrode region 53A of the upper electrode film 53 is divided into the electrode film portions 131 to 139 each having a band shape. In this case, regions that cannot be used as capacitor parts are formed within the capacitor arrangement region 5 as shown in FIG. 11 and effective use cannot be made of the restricted region on the small substrate 2.

Therefore with the preferred embodiment shown in FIG. 15, the capacitor electrode region 53A is divided into L-shaped electrode film portions 141 to 149. For example, the electrode film portion 149 in the arrangement of FIG. 15 can thereby be made to face the lower electrode film 51 over an area that is 1.5 times that of the electrode film portion 139 in the arrangement of FIG. 11. Therefore, if the capacitor part C9 corresponding to the electrode film portion 139 in the first preferred embodiment of FIG. 11 has a capacitance of 4 pF, the capacitor part C9 can be made to have a capacitance of 6 pF by use of the electrode film portion 149 of the present preferred embodiment. The capacitance value of the chip capacitor 31 can thereby be set over a wider range by making effective use of the interior of the capacitor arrangement region 5.

Figure 16:
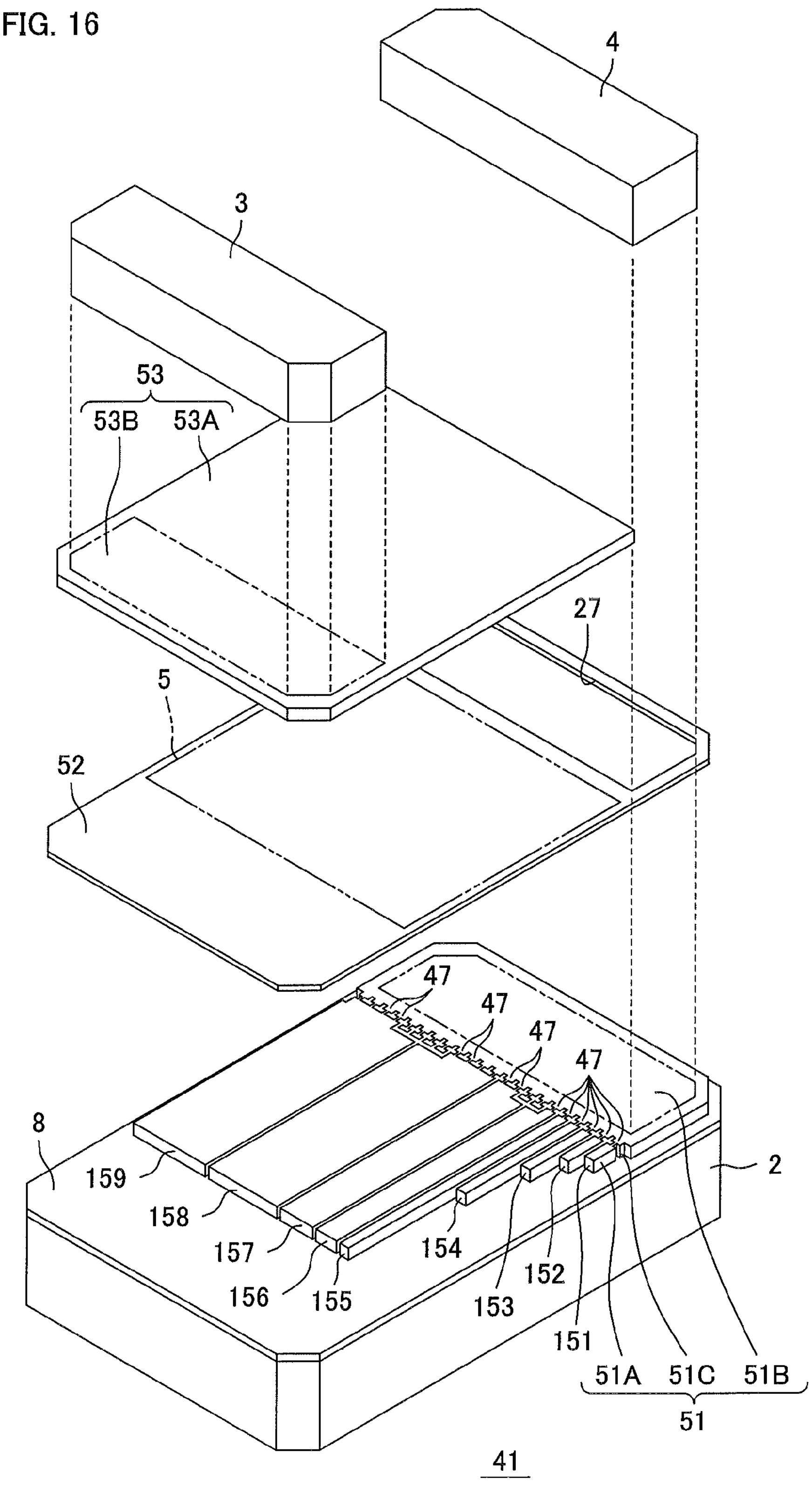
FIG. 16 is an exploded perspective view for describing an arrangement of a chip capacitor according to yet another preferred embodiment of the present invention.

In order to avoid receiving influences of parasitic capacitances, the substrate 2 is formed of a semiconductor having a specific resistance of not less than 100 Ω·cm in the present preferred embodiment as well. FIG. 16 is an exploded perspective view for describing the arrangement of a chip capacitor 41 according to yet another preferred embodiment of the present invention, and the respective portions of the chip capacitor 41 are shown in the same manner as in FIG. 13 used for describing the preferred embodiment above.

With the present preferred embodiment, whereas the capacitor electrode region 53A of the upper electrode film 53 is formed to a continuous film pattern that is continuous across substantially the entirety of the capacitor arrangement region 5, the capacitor electrode region 51A of the lower electrode film 51 is divided into a plurality of electrode film portions 151 to 159. The electrode film portions 151 to 159 may be formed in the same shapes and area ratio as those of the electrode film portions 131 to 139 in the preferred embodiment shown in FIG. 11 or may be formed in the same shapes and area ratio as those of the electrode film portions 141 to 149 in the preferred embodiment shown in FIG. 15. A plurality of capacitor parts are thus arranged by the electrode film portions 151 to 159, the capacitance film 52, and the upper electrode film 53. At least a portion of the plurality of capacitor parts constitutes a set of capacitor parts that differ in capacitance value (for example, with the respective capacitance values being set to form a geometric progression).

The lower electrode film 51 further has a fuse region 51C between the capacitor electrode region 51A and the pad region 51B. In the fuse region 51C, a plurality of fuse units 47, similar to the fuse units 7 of the preferred embodiment described above, are aligned in a single column along the pad region 51B. Each of the electrode film portions 151 to 159 is connected to the pad region 51B via one or a plurality of the fuse units 47.

The electrode film portions 151 to 159 face the upper electrode film 53 over mutually different facing areas in such an arrangement as well and any of these can be disconnected individually by cutting the fuse unit 47. The same effects as those of the preferred embodiment described above are thus obtained. In particular, by forming at least a portion of the plurality of electrode film portions 151 to 159 so as to face the upper electrode film 53 over facing areas set to form a geometric progression with a common ratio of 2, a chip capacitor that is adjusted to the required capacitance value with high precision can be provided in the same manner as in the preferred embodiment described above.

Figure 17:
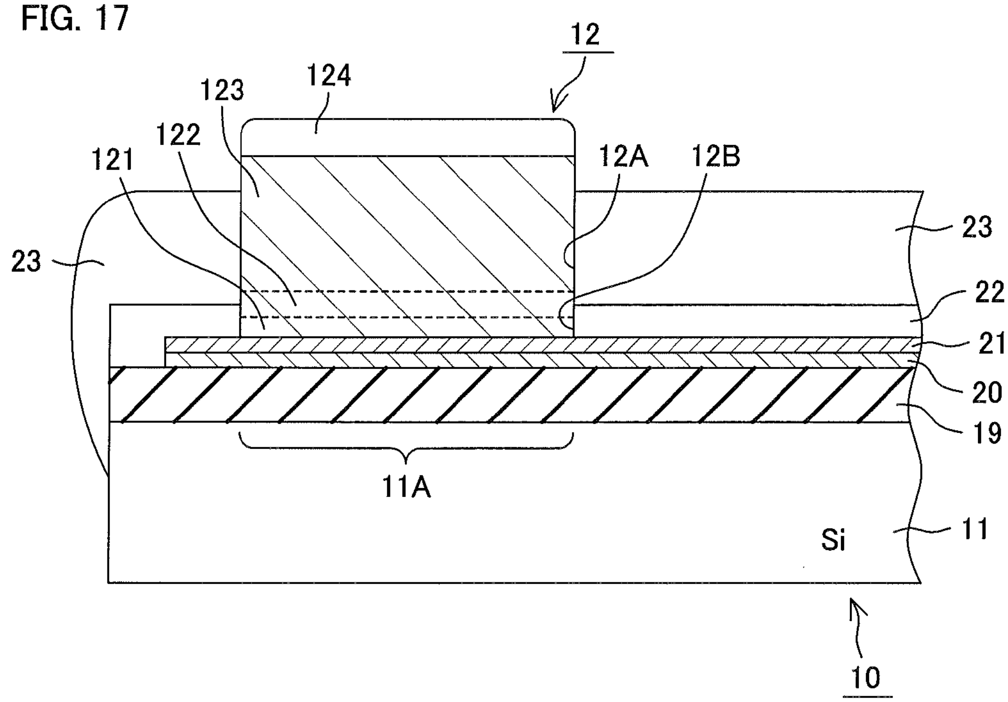
FIG. 17 is an illustrative sectional view of an example of the arrangement of an external connection electrode that is a feature of the present invention.

In order to avoid receiving influences of parasitic capacitances, the substrate 2 is formed of a semiconductor having a specific resistance of not less than 100 Ω·cm in the present preferred embodiment as well. FIG. 17 is an illustrative sectional view of an example of the arrangement of an external connection electrode that is a feature of the present invention and shows, by way of an illustrative partial vertical sectional view, the arrangement of the external connection electrode applied, for example, to the chip resistor 10 described with reference to FIGS. 1 to 5.

Referring to FIG. 17, the insulating layer ($SiO_2$) 19 is formed on the silicon substrate 11 and the resistor body film 20 is disposed on the insulating film 19. The resistor body film 20 is formed of TiN, TiON, or TiSiON. The wiring film 21, formed of an aluminum-based metal such as aluminum, is laminated on a pad region 11A on the resistor body film 20. The upper surface of the substrate 11, on which the resistor body film 20 and the wiring film 21 are formed, is covered by the passivation film 22 formed, for example, of silicon nitride (SiN) and an upper portion thereof is further covered by the resin film 23 as the protective layer formed, for example, of polyimide. The resin film 23 covers not only the upper surface of the passivation film 22 but also covers the upper surface and side surface of the substrate 11 so as to extend around to the sides of the substrate 11.

As an example of the external connection electrode, the first connection electrode 12 is formed as follows. First, patterning of the resin film 23 by photolithography is performed by performing exposure followed by a developing step on a region of the resin film 23 corresponding to an opening for the first connection electrode 12. A pad opening 12A of the resin film 23 for the first connection electrode 12 is thereby formed. Thereafter, heat treatment (polyimide curing) for hardening the resin film 23 is performed and the polyimide film (resin film) 23 is stabilized by the heat treatment. Thereafter, the passivation film 22 is etched using the polyimide film 23 as a mask having the penetrating hole 12A at the position at which the first connection electrode 12 is to be formed. A pad opening 12B exposing the wiring film 21 in the pad region 11A of the first connection electrode 12 is thereby formed. The etching of the passivation film 22 may be performed by reactive ion etching (RIE).

Thereafter, the first connection electrode 12 is grown as the external connection electrode in the pad openings 12B and 12A by, for example, an electroless plating method. In the forming of the external connection electrode 12 inside the pad openings 12B and 12A, a multilayer laminated structure film is preferably arranged by first forming a nickel layer 121 on the wiring film 21 exposed in the pad region 11A, then forming a palladium layer 122 on the nickel layer 121, and then forming a gold layer further above. The nickel layer 121 contributes to improvement of adhesion with the wiring film 21 formed of the aluminum-based metal, and the palladium layer 122 functions as a diffusion preventing layer that suppresses mutual diffusion between the gold layer 123 laminated thereabove and the wiring film 21 formed of the aluminum-based metal film. The first connection electrode 12 can thus be arranged as a satisfactory connection electrode by arranging it as a three-layer structure of Ni, Pd, or Au or other multilayer structure.

A feature of the external connection electrode according to the present invention is that a solder layer 124 is further provided on the upper surface of the gold layer 123 (external connection terminal of the external connection electrode). The solder layer 124 may be laminated, for example, by dipping (immersing) an element top surface portion in a solder bath. For the solder layer 124 to be laminated only on a top surface of the gold layer 123, for example, an upper surface of the gold layer 123 may be made substantially flush with an upper surface of the resin layer 23 (polyimide layer). Or, the upper surface of the gold layer 123 may be made in a state of being slightly more depressed than the upper surface of the resin layer (polyimide layer 23). Or, the gold layer 123 may be made in a state (shown in FIG. 17) of projecting slightly from the upper surface of the resin layer 23 (polyimide layer).

In any case, the provision of the solder layer 124 on the connection terminal surface of the external connection electrode (first connection electrode) 12 provides the advantage of making solder printing for mounting unnecessary in the process of mounting the chip resistor 10, thereby enabling the chip resistor 10 to be mounted easily. Also, in comparison to a case where solder printing is applied during mounting, the usage amount of solder is low and saving of solder can be achieved. Further, the solder fillet (spreading of the solder layer) deposited by solder printing can be lessened to enable a minute chip resistor 10 to be mounted satisfactorily.

Figure 18:
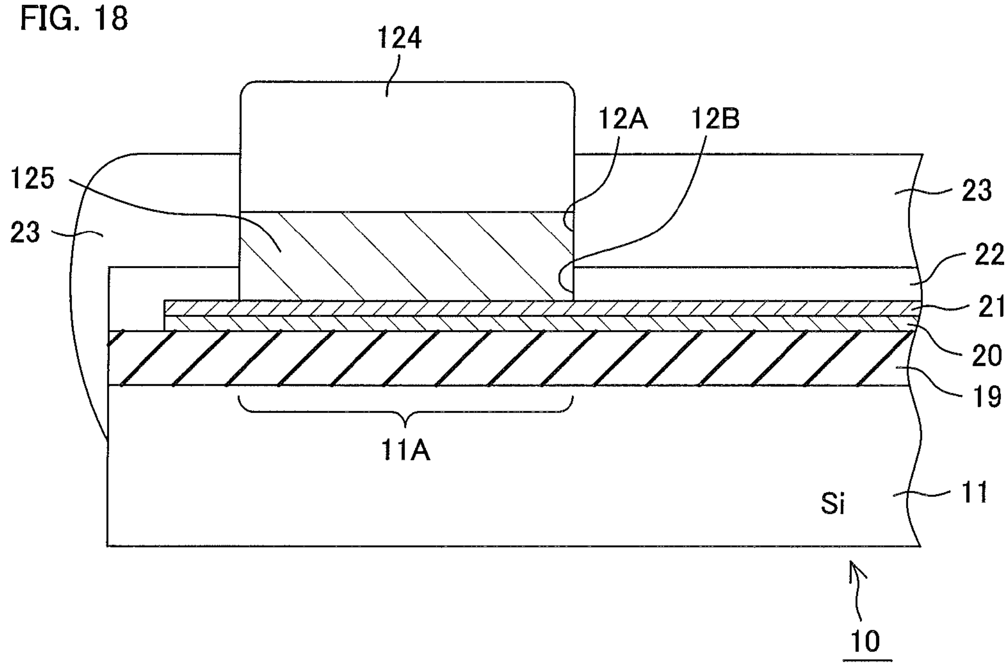
FIG. 18 is an illustrative partial sectional view of another external connection electrode structure applied to the chip resistor 10.

FIG. 18 is an illustrative partial sectional view of another external connection electrode structure applied to the chip resistor 10. In FIG. 18, portions that are the same as or corresponding to those in FIG. 17 are provided with the same symbols. A feature of the external connection electrode shown in FIG. 18 is that an electrode layer 125, made of copper (Cu) as the material, is formed on the wiring film 21 exposed inside the pad openings 12B and 12A. The copper layer 125 is formed, for example, by electroless plating inside the pad openings 12B and 12A. The solder layer 124 is laminated on the copper layer 125.

In the present preferred embodiment, the copper layer 125 is provided up to an intermediate portion of the pad openings 12B and 12A and does not fill the interiors of the pad openings 12B and 12A completely. The solder layer 124 is laminated on the upper surface of the copper layer 125 and the solder layer 124 bulges in a state of projecting slightly from the upper surface of the resin layer (polyimide layer) 23. An external connection electrode structure that satisfactorily connects the circuit of the chip resistor 10 to an external circuit can be obtained by such an arrangement as well. Moreover, solder printing can be omitted in the mounting process and the chip resistor can thus be made to have a structure that can be mounted easily.

Figure 19:
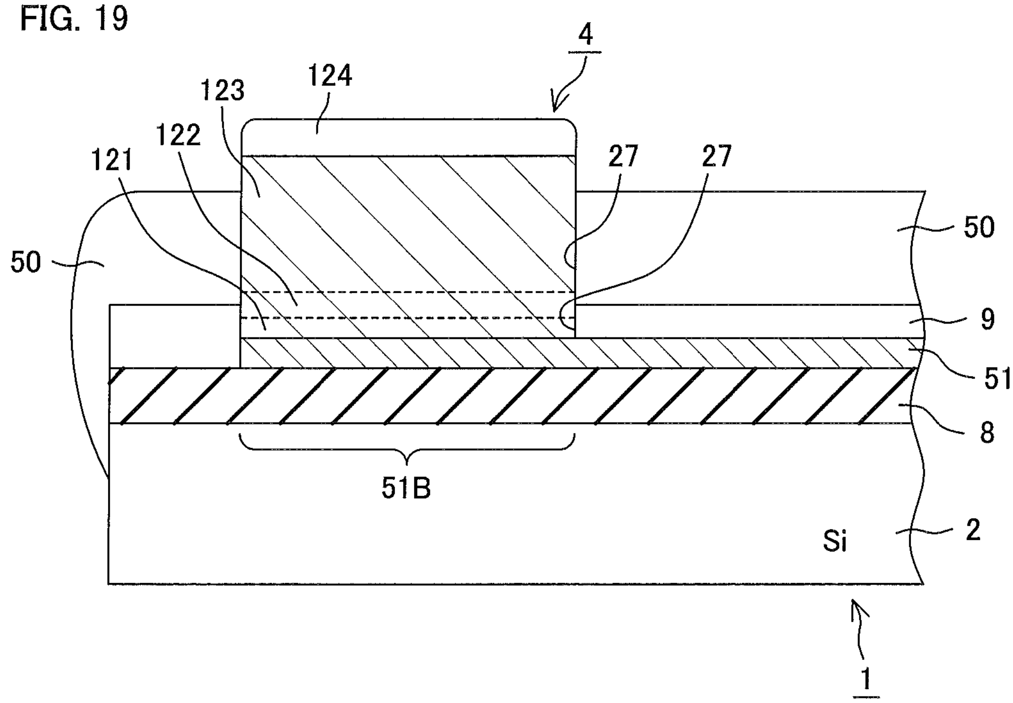
FIG. 19 is an illustrative partial sectional view for describing the arrangement in a case where the external connection electrode according to the preferred embodiment of the present invention is applied to a chip capacitor 1.

FIG. 19 is an illustrative partial sectional view for describing the arrangement in a case where the external connection electrode according to the preferred embodiment of the present invention is applied to the chip capacitor 1. In FIG. 19, the insulating film 8 is formed on the substrate 2 and, for example, the lower electrode film 51 is formed further thereon. The upper surface of the substrate 2 is covered by the passivation film 9 and this is further covered by the resin film 50.

With the present arrangement, the second external electrode 4 as the external connection electrode is formed as follows. A resist pattern having a penetrating hole at a position at which the second external electrode 4 is to be formed is formed on the passivation film 9. The passivation film 9 is etched using the resist pattern as a mask. The pad opening 27 that exposes the lower electrode film 51 in a pad region 51B is thereby formed. The etching of the passivation film 9 may be performed by reactive ion etching.

The resin film 50 is then coated on the entire surface. A photosensitive polyimide is used as the resin film 50. Patterning of the resin film 50 by photolithography may be performed by performing an exposure step followed by a developing step on a region of the resin film 50 corresponding to the pad opening 27. The pad opening 27 penetrating through the resin film 50 and the passivation film 9 is thereby formed. Thereafter, heat treatment (curing) for hardening the resin film 50 is performed. The second external electrode 4 is then grown inside the pad opening 27, for example, by the electroless plating method.

As with the external connection electrode in the chip resistor 10 described using FIG. 17, the second external electrode 4 is preferably a multilayer laminated structure film, for example, having the nickel layer 121 in contact with the lower electrode film 51, the palladium layer 122 laminated on the nickel layer 121, and the gold layer 123 laminated on the palladium layer 122. The second external electrode 4 further has the solder layer 124 provided on (the connection terminal surface of) the gold layer 123. The solder layer 124 may be laminated, for example, by dipping (immersing) the element top surface portion in a solder bath.

Therefore even with the chip capacitor 1, by laminating the solder layer 124 on the connection terminal surface of the second connection electrode 4 that is the external connection electrode, solder printing is made unnecessary in the process of mounting the chip capacitor 1, which can thereby be arranged as a chip capacitor that can be mounted easily. Also, in comparison to a case where solder printing is applied during mounting, the usage amount of solder is low and saving of solder can be achieved. Further, the solder fillet (spreading of the solder layer) deposited by solder printing can be lessened to enable a minute chip capacitor 1 to be mounted satisfactorily.

Although the second external electrode 4 of the chip capacitor 1 was taken up in the above description, the first external electrode 3 is also the same in structure and prepared at the same time as the second external electrode 4.

Figure 20:
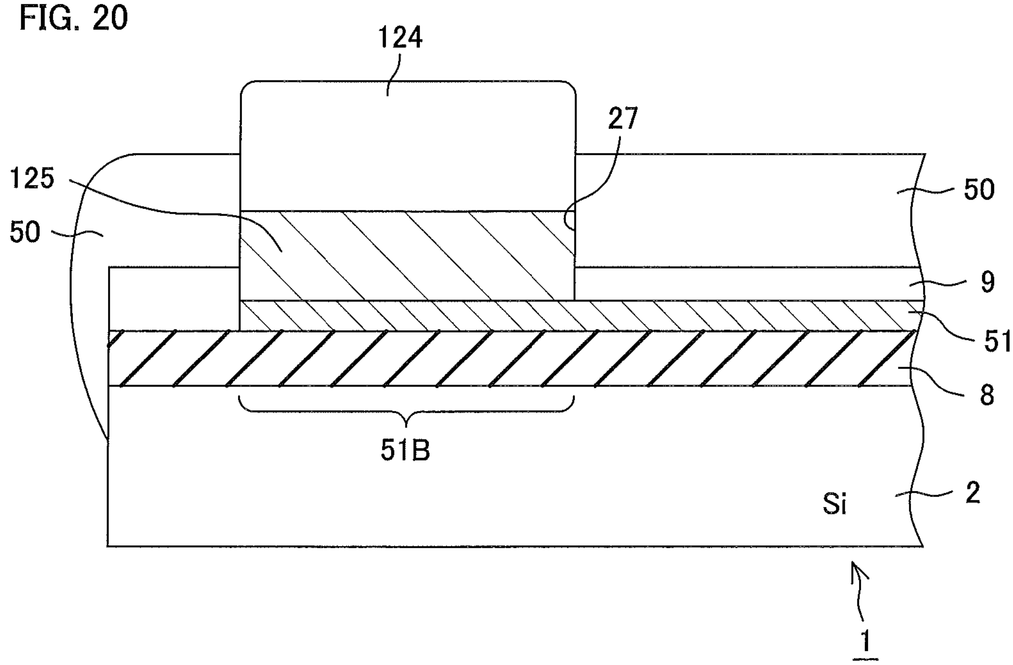
FIG. 20 is a partial vertical sectional view of another arrangement example of the external connection electrode applied to the chip capacitor 1.

FIG. 20 is a partial vertical sectional view of another arrangement example of the external connection electrode applied to the chip capacitor 1. In FIG. 20, the portions that are the same as those in FIG. 19 are provided with the same numbers. The feature of the external connection electrode (second external electrode 4) shown in FIG. 20 is the same as that of the structure described using FIG. 18. That is, the copper layer 125, made of copper (Cu), is formed, for example, by electroless plating on the lower electrode film 51 exposed in the pad opening 27. The copper layer 125 is formed so as to fill up to an intermediate portion of the pad opening 27. The solder layer 124 is laminated further on the upper surface.

As with the preferred embodiment shown in FIG. 18, the external connection electrode structure that enables easy mounting is provided by the present arrangement as well. Although chip resistors and chip capacitors were described above as preferred embodiments of the present invention, the present invention may also be applied to chip components besides chip resistors and chip capacitors.

As another example of a chip component, a chip inductor may be cited. A chip inductor is a component having, for example, a multilayer wiring structure on a substrate, having inductors (coils) and wiring related thereto inside the multilayer wiring structure, and being arranged so that an arbitrary inductor in the multilayer wiring structure can be incorporated into a circuit or disconnected from the circuit by a fuse. The chip inductor can be arranged as a chip inductor (chip component) that is easy to mount and easy to handle by adopting the structure of the external connection electrode according to the present invention.

As yet another example of a chip component, a chip diode may be cited. A chip diode is a component having, for example, a multilayer wiring structure on a substrate, having a plurality of diodes and wiring related thereto inside the multilayer wiring structure, and being arranged so that an arbitrary diode in the multilayer wiring structure can be incorporated into a circuit or disconnected from the circuit by a fuse. Rectification characteristics of the chip diode can be changed and adjusted by selection of the diode to be incorporated into the circuit. Voltage drop characteristics (resistance value) of the chip diode can also be set. Further, in the case of a chip LED, with which the diode is an LED (light emitting diode), the chip LED can be arranged to enable selection of the emitted color by selection of the LED to be incorporated into the circuit. The structure of the external connection electrode according to the present invention can also be adopted in such a chip diode or chip LED to arrange a chip component, such as a chip diode or chip LED that is easy to mount and easy to handle.

Besides the above, various design changes may be applied within the scope of the matters described in the claims.

Invention According to a First Reference Example

(1) Features of the Invention According to the First Reference Example

For example, the features of the invention according to the first reference example are the following A1 to A20.

(A1) A chip component including a chip component main body, an electrode pad formed on a top surface of the chip component main body, a protective film covering the top surface of the chip component main body and having a contact hole exposing the electrode pad at a bottom surface, and an external connection electrode electrically connected to the electrode pad via the contact hole and having a protruding portion, which, in a plan view of looking from a direction perpendicular to a top surface of the electrode pad, extends to a top surface of the protective film and protrudes further outward than the region of contact with the electrode pad over the full periphery of an edge portion of the contact hole.

With this arrangement, the chip component can be improved in reliability by devising the structure of the external connection electrode in the chip component. In particular, the external connection electrode is formed to overlap with the protective film top surface, thereby improving the moisture resistance of the chip component and increasing the surface area of the external connection electrode exposed from the top surface of the chip component so that the chip component is improved in mounting strength. Further, the external connection electrode is also improved in strength against external pressure. Consequently, a satisfactory structure is provided for the chip component especially when it is a flip chip with a pair of electrodes provided at one side.

(A2) The chip component according to A1, where the protective film has an inclining surface that spreads outward from the region of contact at the edge portion of the contact hole and the protruding portion of the electrode contacts the inclining surface.

With this arrangement, the inclining surface of the protective film and the protruding portion of the external connection electrode are in contact so that the external connection electrode can be supported firmly along the protective film.

(A3) The chip component according to A1 or A2, where the protective film includes a passivation film and a resin film laminated on the passivation film, the contact hole is formed to penetrate through the passivation film and the resin film, and the resin film is formed with a step along a boundary surface of the passivation film and the resin film that protrudes further inward than an inner edge of the passivation film facing the contact hole.

With this arrangement, the contact hole of the protective film in which the external connection electrode is provided includes the step portion at its inner peripheral surface so that the external connection electrode provided in the contact hole is fixed firmly inside the contact hole, thereby enabling improvement of moisture resistance and increase of strength against external pressure.

(A4) The chip component according to any one of A1 to A3, where the electrode has an apical surface with a convexly curved surface shape.

With this arrangement, a top surface of the external connection electrode has the protruding portion and the apical surface with convexly curved surface shape, and therefore the external connection electrode is increased in surface area to enable the chip component to be improved in mounting strength.

(A5) The chip component according to any one of A1 to A4, further including a plurality of element parts formed on the chip component main body and a plurality of fuses provided on the chip component main body and disconnectably connecting each of the plurality of element parts to the external connection electrode.

By this arrangement, the chip component can be arranged to accommodate various values with the same basic design and yet provide the effects described in A1 to A4.

(A6) The chip component according to A5, where the element parts are resistor bodies, each having a resistor body film formed on the chip component main body and a wiring film laminated in contact with the resistor body film.

By this arrangement, a chip resistor can be provided as the chip component.

(A7) The chip component according to A5, where the element parts are capacitor parts, each having a capacitance film formed on the chip component main body and an electrode film in contact with the capacitance film. By this arrangement, a chip capacitor can be provided as the chip component.

(A8) The chip component according to A5, where the element parts include an inductor (coil) and wiring related thereto formed on the chip component main body.

By this arrangement, a chip inductor can be provided as the chip component.

(A9) The chip component according to A5, where the element parts include a plurality of diodes, each having a junction structure formed on the chip component main body. By this arrangement, a chip diode can be provided as the chip component.

(A10) The chip component according to A9, where the plurality of diodes include an LED.

By this arrangement, a chip LED can be provided as the chip component.

(A11) A method for manufacturing a chip component including a step of forming an electrode pad on a top surface of a chip component main body, a step of forming a protective film covering the top surface of the chip component main body, a step of forming, in the protective film, a contact hole exposing the electrode pad at a bottom surface, and a step of forming an electrode electrically connected to the electrode pad via the contact hole and having a protruding portion extending to a top surface of the protective film and protruding further outward than the region of contact with the electrode pad over the full periphery of an edge portion of the contact hole.

By this arrangement, the chip component having the arrangement and effects described in A1 can be manufactured.

(A12) The method for manufacturing a chip component according to A11, further including a step of heat treating the protective film to form an inclining surface, which spreads outward from the region of contact, at the edge portion of the contact hole and where the electrode is formed so that the protruding portion contacts the inclining surface.

By this arrangement, the chip component having the arrangement and effects described in A2 can be manufactured.

(A13) The method for manufacturing a chip component according to A11 or A12, where the step of forming the protective film includes a step of forming a passivation film and a step of laminating a resin film on the passivation film, the step of forming the contact hole is a step of forming the contact hole so that it penetrates through the passivation film and the resin film, and an inner edge of the passivation film that faces the contact hole is side-etched below the resin film so as to recede outward further than an inner edge of the resin film that faces the contact hole to form a step along a boundary surface of the passivation film and the resin film.

By this arrangement, the chip component having the arrangement and effects described in A3 can be manufactured.

(A14) The method for manufacturing a chip component according to any one of A11 to A13 where the electrode is formed to have an apical surface with a convexly curved surface shape. By this arrangement, the chip component having the arrangement and effects described in A4 can be manufactured.

(A15) The method for manufacturing a chip component according to any one of A11 to A14, further including a step of forming a plurality of element parts on the chip component main body and a step of forming, on the chip component main body, a plurality of fuses disconnectably connecting each of the plurality of element parts to the external connection electrode.

By this arrangement, the chip component having the arrangement and effects described in A6 can be manufactured.

(A16) The method for manufacturing a chip component according to A15, where the step of forming the element parts includes a step of forming a resistor body film on the chip component main body and a step of forming a wiring film laminated in contact with the resistor body film, and each of the element parts is a resistor body that includes the resistor body film and wiring film.

By this arrangement, a chip resistor can be manufactured as the chip component having the arrangement and effects described in A6.

(A17) The method for manufacturing a chip component according to A15, where the step of forming the element parts includes a step of forming a capacitance film on the chip component main body and a step of forming an electrode film in contact with the capacitance film, and each of the element parts is a capacitor part.

By this arrangement, a chip capacitor can be manufactured as the chip component having the arrangement and effects described in A7.

(A18) The method for manufacturing a chip component according to A15, where the step of forming the element parts includes a step of forming an inductor and wiring related thereto on the chip component main body, and each of the element parts is a coil component. By this arrangement, a chip inductor can be manufactured as the chip component having the arrangement and effects described in A8.

(A19) The method for manufacturing a chip component according to A15, where the step of forming the element parts includes a step of forming a junction structure on the chip component main body, and each of the element parts is a diode part.

By this arrangement, a chip diode can be manufactured as the chip component having the arrangement and effects described in A9.

(A20) The method for manufacturing a chip component according to A15, where the step of forming the element parts includes a step of forming a junction structure on the chip component main body, and each of the element parts is an LED component.

By this arrangement, a chip LED can be manufactured as the chip component having the arrangement and effects described in A10.

(2) Preferred Embodiments of the Invention Related to the First Reference Example Preferred embodiments of the first reference example shall now be described in detail with reference to the attached drawings. The symbols indicated in FIG. 22 to FIG. 40 are effective only for these drawings and, even if used in other preferred embodiments, do not indicate the same components as the symbols in the other preferred embodiments.

FIG. 22(A) is an illustrative perspective view of the external arrangement of a chip resistor a10 according to a preferred embodiment of the first reference example and FIG. 22(B) is a side view of a state where the chip resistor a10 is mounted on a substrate. With reference to FIG. 22(A), the chip resistor a10 according to the preferred embodiment of the first reference example includes a first connection electrode alt, a second connection electrode a13, and a resistor network a14 that are formed on a substrate a11. The substrate a11 has a rectangular parallelepiped shape with a substantially rectangular shape in a plan view and is a minute chip with, for example, the length in the long side direction being L=0.3 mm, the width in the short side direction being W=0.15 mm, and the thickness being T=0.1 mm, approximately. The substrate a11 may have a corner-rounded shape with the corners being chamfered in a plan view. The substrate may be formed, for example, of silicon, glass, ceramic, etc. With the preferred embodiment described below, a case where the substrate a11 is a silicon substrate shall be described as an example.

Figure 40:
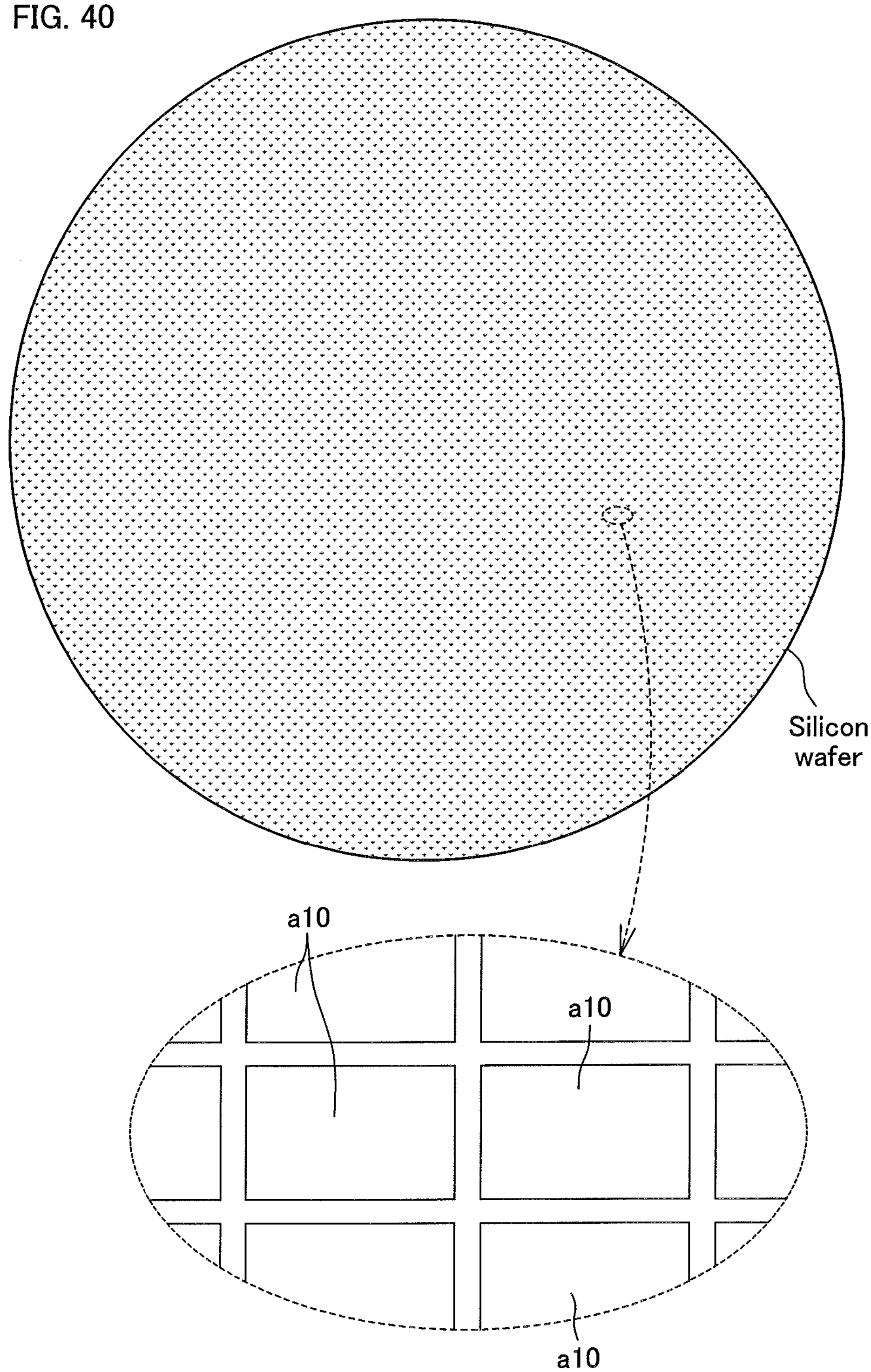
FIG. 40 is an illustrative diagram for describing the cutting out of a chip resistor from a semiconductor wafer (silicon wafer).

The chip resistor a10 is obtained by forming multiple chip resistors a10 in a lattice on a semiconductor wafer (silicon wafer) as shown in FIG. 40 and cutting the semiconductor wafer (silicon wafer) to achieve separation into individual chip resistors a10. On the silicon substrate a11, the first connection electrode a12 is a rectangular electrode that is disposed along one short side a111 of the silicon substrate a11 and is long in the short side a111 direction. The second connection electrode a13 is a rectangular electrode that is disposed on the silicon substrate a11 along the other short side a112 and is long in the short side a112 direction. The resistor network a14 is provided in a central region (circuit forming surface or element forming surface) on the silicon substrate a11 sandwiched by the first connection electrode a12 and the second connection electrode a13. One end side of the resistor network a14 is electrically connected to the first connection electrode a12 and the other end side of the resistor network a14 is electrically connected to the second connection electrode a13. The first connection electrode a12, the second connection electrode a13, and the resistor network a14 may be provided on the silicon substrate a11 by using, for example, a semiconductor manufacturing process. In other words, the discrete chip resistor a10 can be manufactured using apparatus and equipment for manufacturing a semiconductor device. In particular, the resistor network a14 with a fine and accurate layout pattern can be formed by using a photolithography process to be described below.

The first connection electrode a12 and the second connection electrode a13 respectively function as external connection electrodes. In a state where the chip resistor a10 is mounted on a circuit substrate a15, the first connection electrode a12 and the second connection electrode a13 are respectively connected electrically and mechanically by solders to circuits (not shown) of the circuit substrate 15 as shown in FIG. 22(B). In the present preferred embodiment, each of the first connection electrode a12 and the second connection electrode a13 functioning as external connection electrodes is formed of gold (Au) or copper (Cu).

Figure 23:
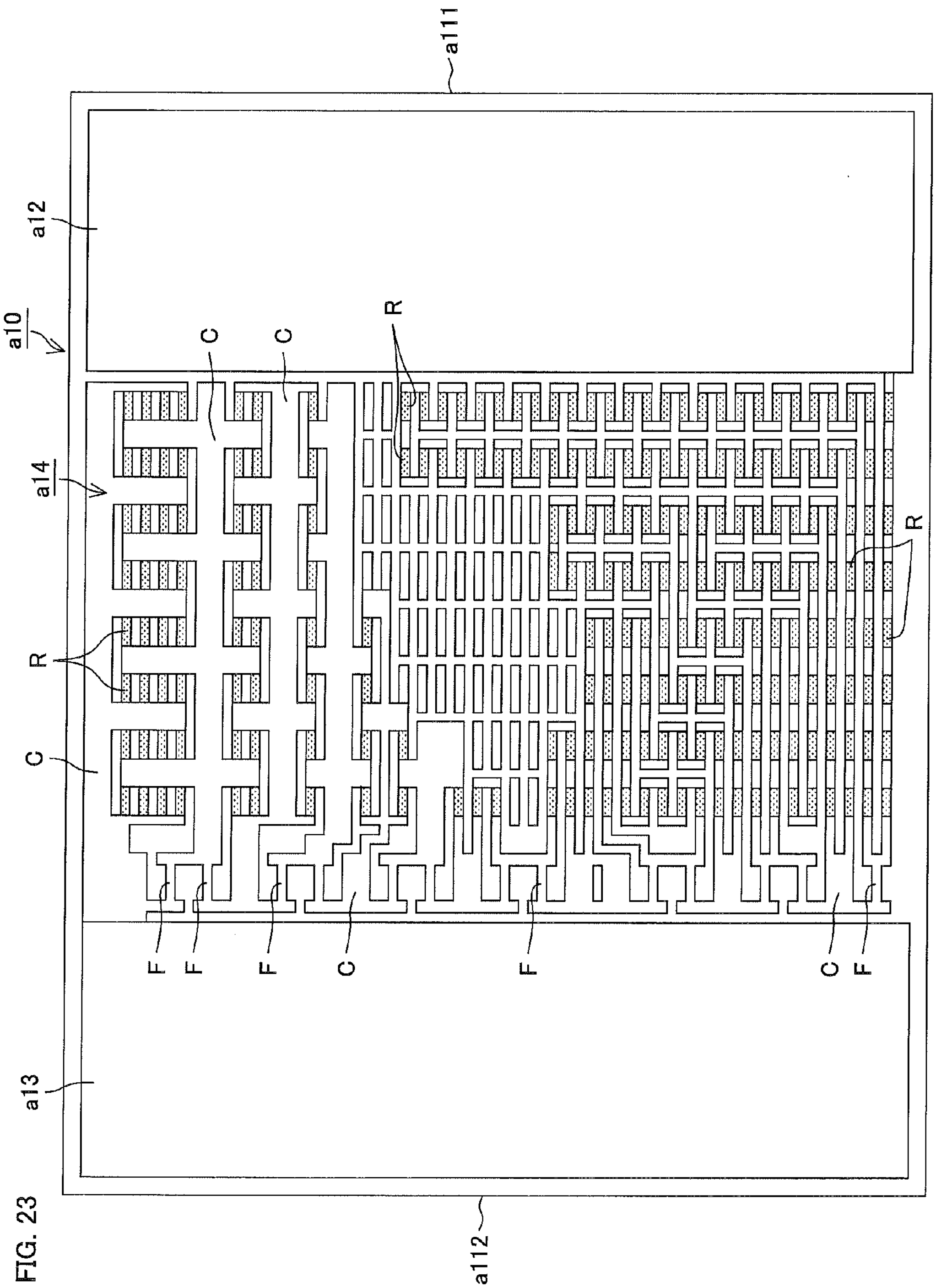
FIG. 23 is a plan view of the chip resistor a10 showing the positional relationship of a first connection electrode a12, a second connection electrode a13, and a resistor network a14 and showing the arrangement in a plan view of the resistor network a14.

FIG. 23 is a plan view of the chip resistor a10 showing the positional relationship of the first connection electrode a12, the second connection electrode a13, and the resistor network a14 and shows the arrangement in a plan view (layout pattern) of the resistor network a14. With reference to FIG. 23, the chip resistor a10 includes the first connection electrode a12, disposed with the long side parallel to the one short side a111 of the silicon substrate upper surface and having a substantially rectangular shape in a plan view, the second connection electrode a13, disposed with the long side parallel to the other short side a112 of the silicon substrate upper surface and having a substantially rectangular shape in a plan view, and the resistor network a14 provided in the region of rectangular shape in a plan view between the first connection electrode a12 and the second connection electrode a13.

The resistor network a14 has multiple unit resistor bodies R having an equal resistance value and arrayed in a matrix on the silicon substrate a11 (the example of FIG. 23 has an arrangement including a total of 352 unit resistor bodies R with 8 unit resistor bodies R arrayed along the row direction (length direction of the silicon substrate) and 44 unit resistor bodies R arrayed along the column direction (width direction of the silicon substrate)). A predetermined number from 1 to 64 of the multiple unit resistor bodies R are electrically connected (by wiring films formed of a conductor) to form each of a plurality of types of resistor circuits in accordance with each number of unit resistor bodies R connected. The plurality of types of resistor circuits thus formed are connected in predetermined modes by conductor films C (wiring films formed of a conductor).

Further, a plurality of fuse films F (wiring films formed of a conductor) are provided that are capable of being fused to electrically incorporate resistor circuits into the resistor network a14 or electrically separate resistor circuits from the resistor network a14. The plurality of fuse films F are arrayed along the inner side of the second connection electrode a13 so that the positioning region thereof is rectilinear. More specifically, the plurality of fuse films F and the connection conductor films C are aligned adjacently and disposed so that the alignment directions thereof are rectilinear.

Figure 24A:
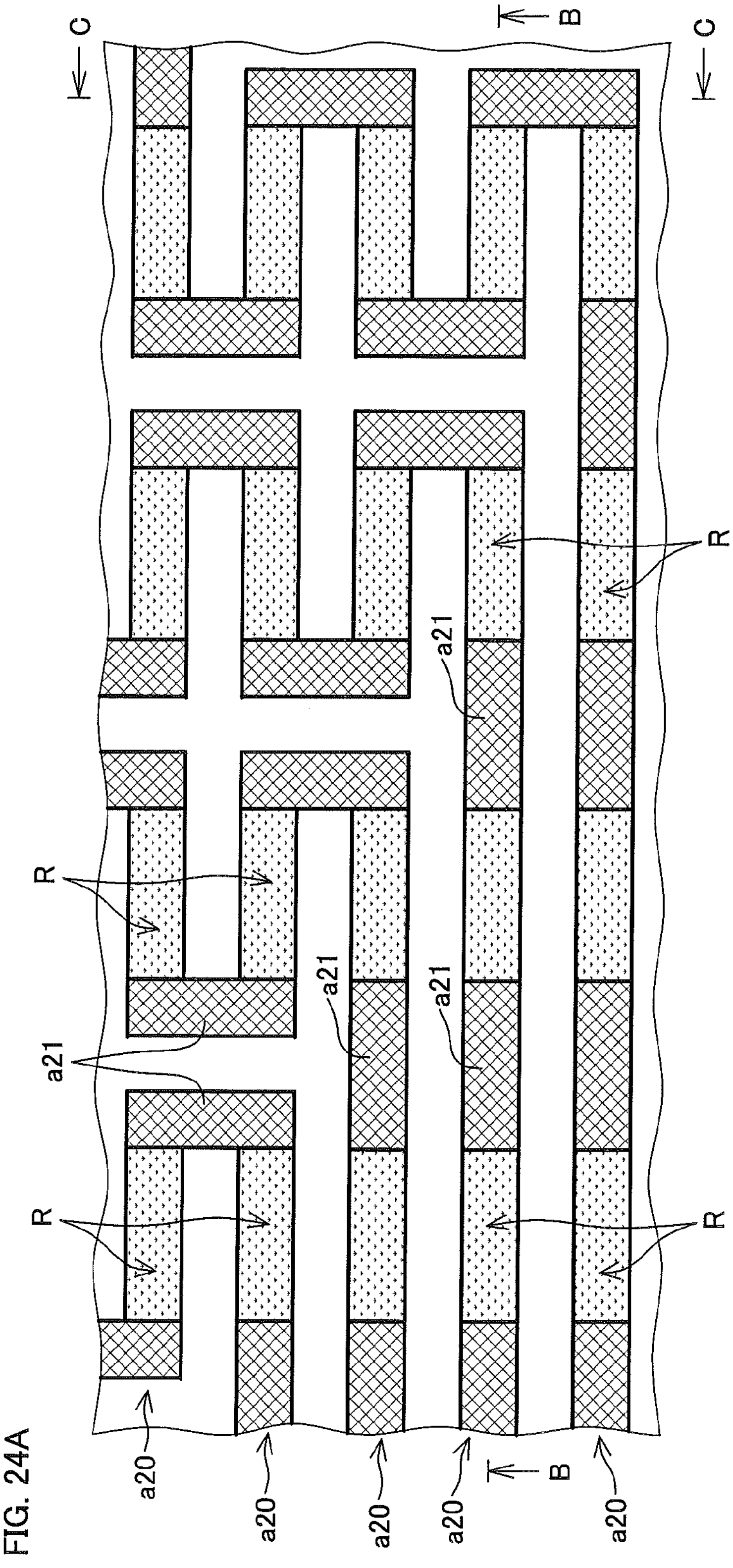
FIG. 24A is a partially enlarged plan view of the resistor network a14 shown in FIG. 23.
Figure 24B:
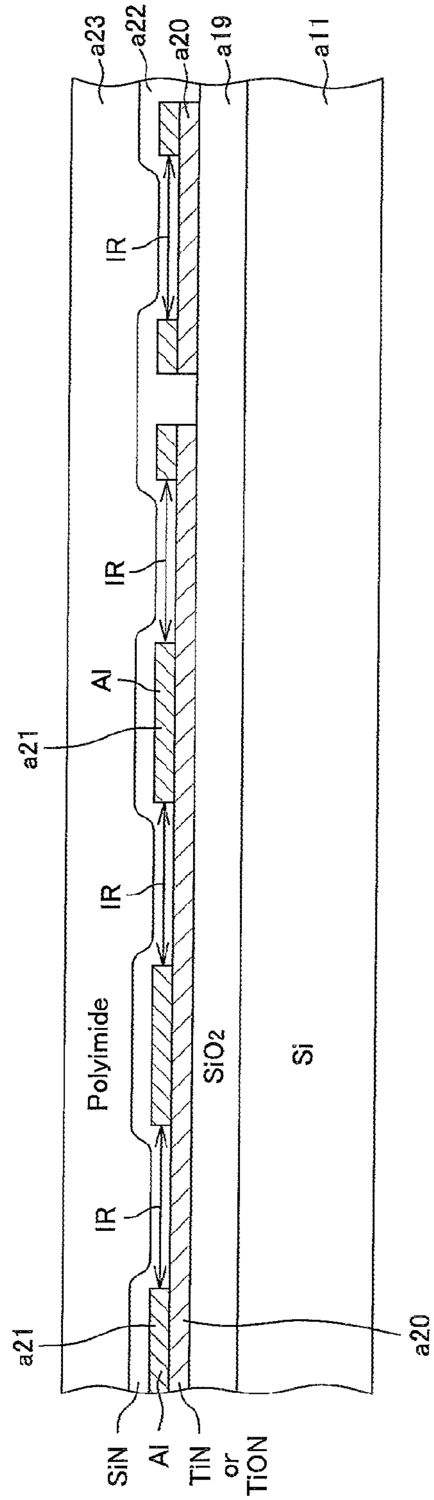
FIG. 24B is a vertical sectional view in the length direction for describing the arrangement of resistor bodies R in the resistor network a14.
Figure 24C:
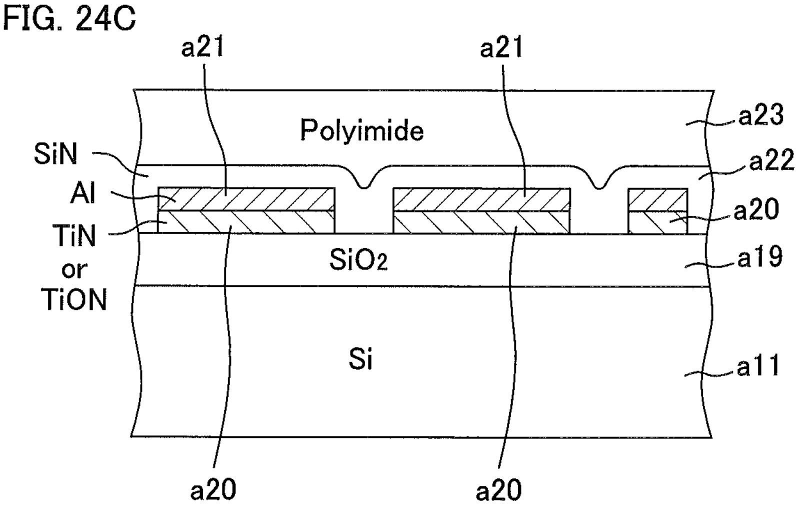
FIG. 24C is a vertical sectional view in the width direction for describing the arrangement of the resistor bodies R in the resistor network a14.

FIG. 24A is an enlarged plan view of a portion of the resistor network a14 shown in FIG. 23, and FIG. 24B and FIG. 24C are a vertical sectional view in the length direction and a vertical sectional view in the width direction, respectively, for describing the structure of the unit resistor bodies R in the resistor network a14. The arrangement of the unit resistor bodies R shall now be described with reference to FIG. 24A, FIG. 24B, and FIG. 24C.

An insulating layer ($SiO_2$) a19 is formed on an upper surface of the silicon substrate a11 as the substrate, and a resistor body film a20 is disposed on the insulating film a19. The resistor body film a20 is formed of TiN, TiON, or TiSiON. The resistor body film a20 is arranged as a plurality of resistor body films (hereinafter referred to as "resistor body film lines") extending parallel as straight lines between the first connection electrode a12 and the second connection electrode a13, and there are cases where a resistor body film line a20 is cut at predetermined positions in the line direction. An aluminum film is laminated as conductor film pieces a21 on the resistor body film lines a20. The respective conductor film pieces a21 are laminated on the resistor body film lines a20 at fixed intervals R in the line direction.

Figure 25:
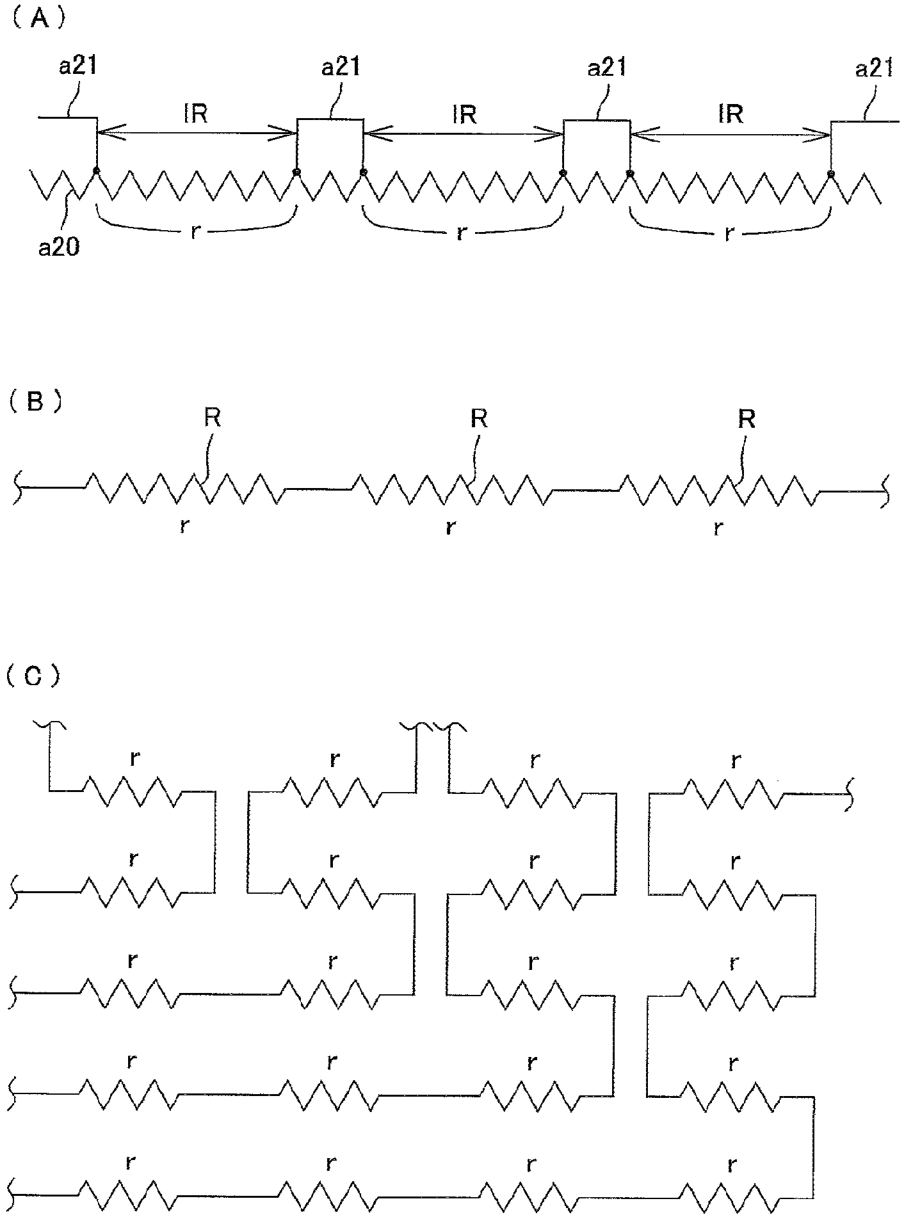
FIG. 25 shows diagrams showing the electrical features of resistive body film lines a20 and conductor films a21 in the form of circuit symbols and an electric circuit diagram.
Figure 26:
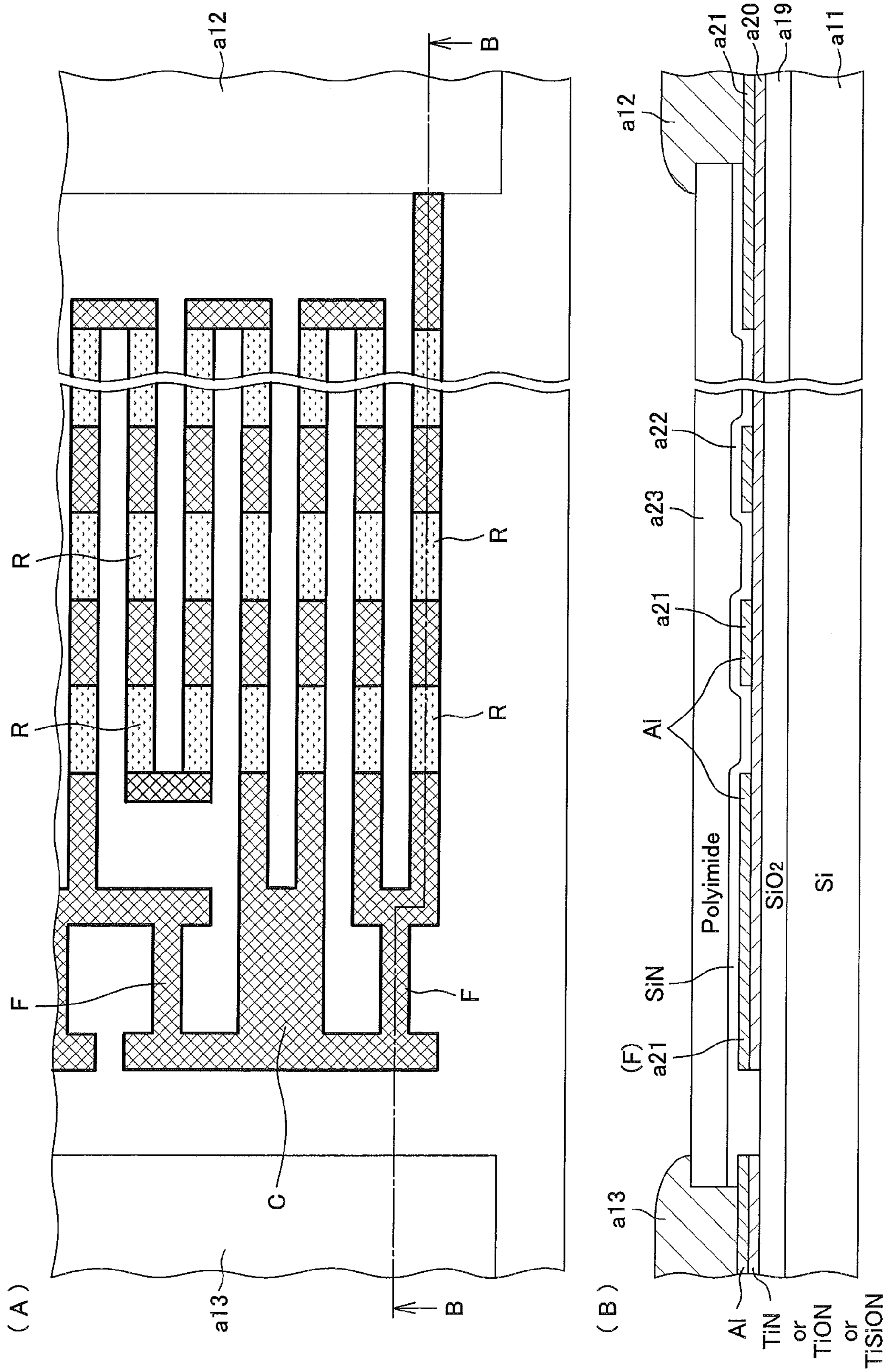
FIG. 26(A) is a partially enlarged plan view of a region including fuse films F drawn by enlarging a portion of the plan view of the chip resistor shown in FIG. 23.
FIG. 26(B) is a structural sectional view taken along B-B in FIG. 26(A).

The electrical features of the resistor body film lines a20 and the conductor film pieces a21 of the present arrangement are indicated by circuit symbols in FIG. 25. That is, as shown in FIG. 25(A), each resistor body film line a20 portion in a region of the predetermined interval IR forms a unit resistor body R with a fixed resistance value r. In each region in which a conductor film piece a21 is laminated, the resistor body film line a20 is short-circuited by the conductor film piece a21. A resistor circuit, made up of serial connections of unit resistor bodies R of resistance r, is thus formed as shown in FIG. 25(B).

Also, adjacent resistor body film lines a20 are connected to each other by the resistor body film lines a20 and the conductor film pieces a21 so that the resistor network shown in FIG. 24A forms the resistor circuit shown in FIG. 25(C). In the illustrative sectional views of FIG. 24B and FIG. 24C, the reference symbol a11 indicates the silicon substrate, a19 indicates the silicon dioxide $SiO_2$ layer as an insulating layer, a20 indicates the resistor body film made of TiN, TiON, or TiSiON formed on the insulating layer a19, a21 indicates the wiring film made of aluminum (Al), a22 indicates an SiN film as a protective film, and a23 indicates a polyimide layer as a protective film.

A process for manufacturing the resistor network a14 with the above arrangement shall be described in detail later. In the present preferred embodiment, the unit resistor bodies R, included in the resistor network a14 formed on the silicon substrate a11, include the resistor body film lines a20 and the conductor film pieces a21 that are laminated on the resistor body film lines a20 at fixed intervals in the line direction, and a single unit resistor body R is arranged from the resistor body film line a20 at the fixed interval IR portion on which the conductor film piece a21 is not laminated. The resistor body film lines a20 making up the unit resistor bodies R are all equal in shape and size. Therefore based on the characteristic that resistor body films of the same shape and same size that are formed on a substrate are substantially the same in value, the multiple unit resistor bodies R arrayed in a matrix on the silicon substrate a11 have an equal resistance value.

The conductor film pieces a21 laminated on the resistor body film lines a20 form the unit resistor bodies R and also serve the role of connection wiring films that connect a plurality of unit resistor bodies R to arrange a resistor circuit. FIG. 26(A) is a partially enlarged plan view of a region including the fuse films F drawn by enlarging a portion of the plan view of the chip resistor a10 shown in FIG. 23, and FIG. 26(B) is a structural sectional view taken along B-B in FIG. 26(A).

As shown in FIGS. 26(A) and 26(B), the fuse films F are also formed by the wiring film a21 laminated on the resistor body film a20. That is, the fuse films F are formed of aluminum (Al), which is the same metal material as that of the conductor film pieces a21, at the same layer as the conductor film pieces a21, which are laminated on the resistor body film lines a20 that form the resistor bodies R. As mentioned above, the conductor film pieces a21 are also used as the connection conductor films C that electrically connect a plurality of unit resistor bodies R to form a resistor circuit.

That is, at the same layer laminated on the resistor body film a20, the wiring films forming the unit resistor bodies R, the connection wiring films forming the resistor circuits, the connection wiring films making up the resistor network a14, the fuse films, and the wiring films connecting the resistor network a14 to the first connection electrode a12 and the second connection electrode a13 are formed by the same manufacturing process (for example, a sputtering and photolithography process) using the same metal material (for example, aluminum). The manufacturing process of the chip resistor a10 is thereby simplified and also, various types of wiring films can be formed at the same time using a mask in common. Further, the property of alignment with respect to the resistor body film a20 is also improved.

Figure 27:
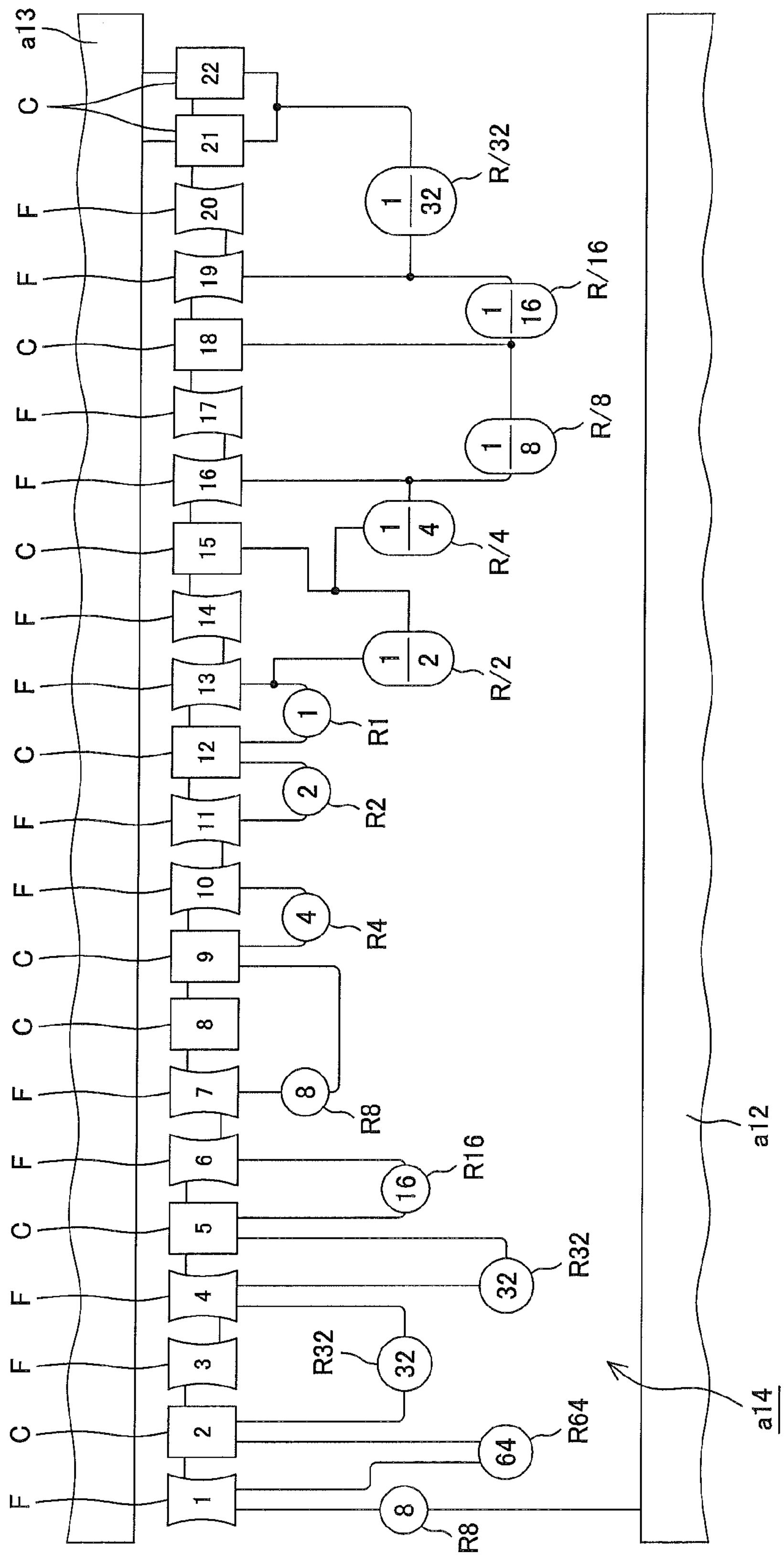
FIG. 27 is an illustrative diagram of the array relationships of connection conductor films C and fuse films F connecting a plurality of types of resistance units in the resistor network a14 shown in FIG. 23 and the connection relationships of the plurality of types of resistance units connected to the connection conductor films C and fuse films F.

FIG. 27 is an illustrative diagram of the array relationships of the connection conductor films C and the fuse films F connecting a plurality of types of resistor circuits in the resistor network a14 shown in FIG. 23 and the connection relationships of the plurality of types of resistor circuits connected to the connection conductor films C and fuse films F. With reference to FIG. 27, one end of a reference resistor circuit R8, included in the resistor network a14, is connected to the first connection electrode a12. The reference resistor circuit R8 is formed by a serial connection of 8 unit resistor bodies R and the other end thereof is connected to a fuse film F1.

One end and the other end of a resistor circuit R64, formed by a serial connection of 64 unit resistor bodies R, are connected to the fuse film F1 and a connection conductor film C2. One end and the other end of a resistor circuit R32, formed by a serial connection of 32 unit resistor bodies R, are connected to the connection conductor film C2 and a fuse film F4. One end and the other end of a resistor circuit body R32, formed by a serial connection of 32 unit resistor bodies R, are connected to the fuse film F4 and a connection conductor film C5.

One end and the other end of a resistor circuit R16, formed by a serial connection of 16 unit resistor bodies R, are connected to the connection conductor film C5 and a fuse film F6. One end and the other end of a resistor circuit R8, formed by a serial connection of 8 unit resistor bodies R, are connected to a fuse film F7 and a connection conductor film C9. One end and the other end of a resistor circuit R4, formed by a serial connection of 4 unit resistor bodies R, are connected to the connection conductor film C9 and a fuse film F10.

One end and the other end of a resistor circuit R2, formed by a serial connection of 2 unit resistor bodies R, are connected to a fuse film F11 and a connection conductor film C12. One end and the other end of a resistor circuit body R1, formed of a single unit resistor body R, are connected to the connection conductor film C12 and a fuse film F13. One end and the other end of a resistor circuit R/2, formed by a parallel connection of 2 unit resistor bodies R, are connected to the fuse film F13 and a connection conductor film C15.

One end and the other end of a resistor circuit R/4, formed by a parallel connection of 4 unit resistor bodies R, are connected to the connection conductor film C15 and a fuse film F16. One end and the other end of a resistor circuit R/8, formed by a parallel connection of 8 unit resistor bodies R, are connected to the fuse film F16 and a connection conductor film C18. One end and the other end of a resistor circuit R/16, formed by a parallel connection of 16 unit resistor bodies R, are connected to the connection conductor film C18 and a fuse film F19.

A resistor circuit R/32, formed by a parallel connection of 32 unit resistor bodies R, is connected to the fuse film F19 and a connection conductor film C22. With the plurality of fuse films F and connection conductor films C, the fuse film F1, the connection conductor film C2, the fuse film F3, the fuse film F4, the connection conductor film C5, the fuse film F6, the fuse film F7, the connection conductor film C8, the connection conductor film C9, the fuse film F10, the fuse film F11, the connection conductor film C12, the fuse film F13, a fuse film F14, the connection conductor film C15, the fuse film F16, the fuse film F17, the connection conductor film C18, the fuse film F19, the fuse film F20, the connection conductor film C21, and the connection conductor film C22 are disposed rectilinearly and connected in series. With this arrangement, when a fuse film F is fused, the electrical connection with the connection conductor film C connected adjacently to the fuse film F is interrupted.

Figure 28:
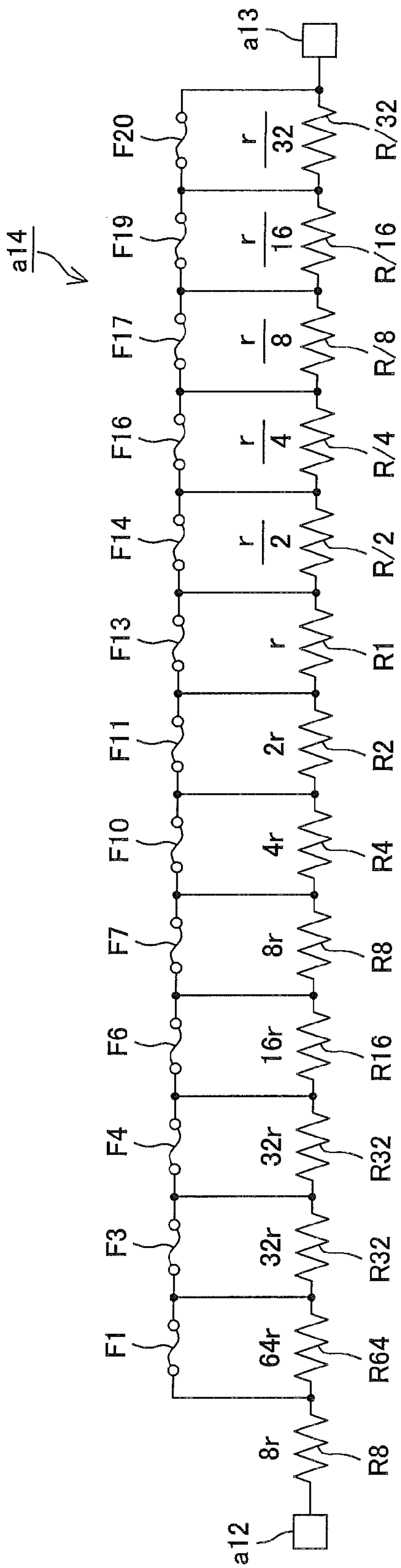
FIG. 28 is an electric circuit diagram of the resistor network a14.

This arrangement is illustrated in the form of an electric circuit diagram in FIG. 28. That is, in a state where none of the fuse films F is fused, the resistor network a14 forms a resistor circuit of the reference resistor circuit R8 (resistance value: 8r), formed by the serial connection of the 8 unit resistor bodies R provided between the first connection electrode a12 and the second connection electrode a13. For example, if the resistance value r of a single unit resistor body R is r=80Ω, the chip resistor a10 is arranged with the first connection electrode a12 and the second connection electrode a13 being connected by a resistor circuit of 8r=640Ω.

With each of the plurality of types of resistor circuits besides the reference resistor circuit R8, a fuse film F is connected in parallel, and these plurality of types of resistor circuits are put in short-circuited states by the respective fuse films F. That is, although 13 resistor circuits R64 to R/32 of 12 types are connected in series to the reference resistor circuit R8, each resistor circuit is short-circuited by the fuse film F that is connected in parallel and thus electrically, the respective resistor circuits are not incorporated in the resistance network a14.

With the chip resistor a10 according to the present preferred embodiment, a fuse film F is selectively fused, for example, by laser light in accordance with the required resistance value. The resistor circuit with which the fuse film F connected in parallel is fused is thereby incorporated into the resistor network a14. The resistor network a14 can thus be made a resistor network with the overall resistance value being the resistance value resulting from serially connecting and incorporating the resistor circuits corresponding to the fused fuse films F.

In other words, with the chip resistor a10 according to the present preferred embodiment, by selectively fusing the fuse films corresponding to a plurality of types of resistor circuits, the plurality of types of resistor circuits (for example, the serial connection of the resistor circuits R64, R32, and R1 in the case of fusing F1, F4, and F13) can be incorporated into the resistor network. The respective resistances of the plurality of types of resistor circuits are predetermined, and the chip resistor a10 can thus be made to have the required resistance value by adjusting the resistance value of the resistance network a14 in a so to speak digital manner.

Also, the plurality of types of resistor circuits include the plurality of types of serial resistor circuits, with which the unit resistor bodies R having an equal resistance value are connected in series with the number of unit resistor bodies R being increased in geometric progression as 1, 2, 4, 8, 16, 32, and 64, and the plurality of types of parallel resistor circuits, with which the unit resistor bodies R having an equal resistance value are connected in parallel with the number of unit resistor bodies R being increased in geometric progression as 2, 4, 8, 16, and 32. These are connected in series in states of being short-circuited by the fuse films F. Therefore by selectively fusing the fuse films F, the resistance value of the resistor network a14 as a whole can be set to an arbitrary resistance value within a wide range from a small resistance value to a large resistance value.

Figure 29:
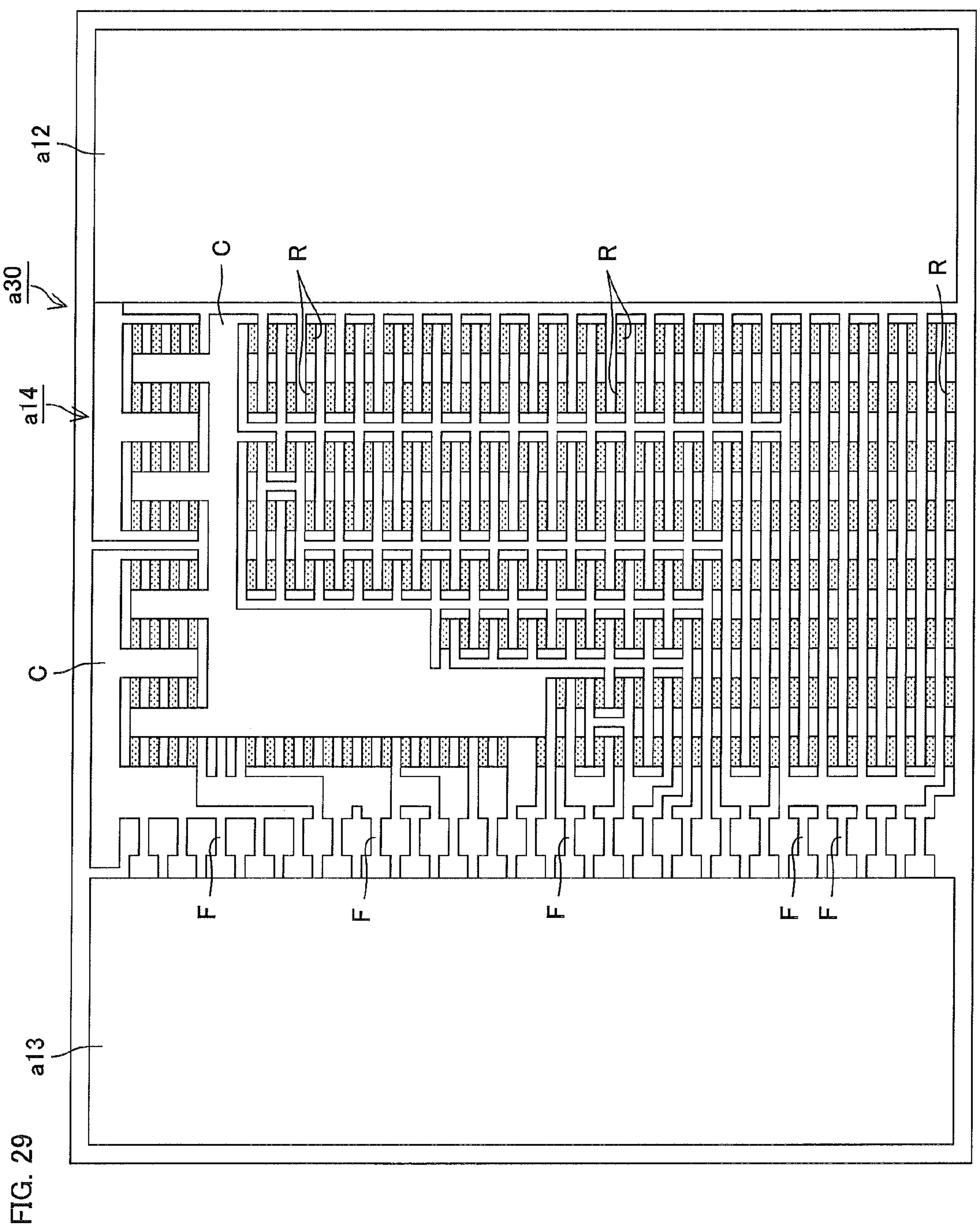
FIG. 29 is a plan view of a chip resistor a30 showing the positional relationship of a first connection electrode a12, a second connection electrode a13, and a resistor network a14 and showing the arrangement in a plan view of the resistor network a14.

FIG. 29 is a plan view of a chip resistor a30 according to another preferred embodiment of the first reference example and shows the positional relationship of the first connection electrode a12, the second connection electrode a13, and the resistor network a14 and shows the arrangement in a plan view of the resistor network a14. The chip resistor a30 differs from the chip resistor a10 described above in the mode of connection of the unit resistor bodies R in the resistor network a14.

That is, the resistor network a14 of the chip resistor a30 has multiple unit resistor bodies R having an equal resistance value and arrayed in a matrix on the silicon substrate (the arrangement of FIG. 29 is an arrangement including a total of 352 unit resistor bodies R with 8 unit resistor bodies R arrayed along the row direction (length direction of the silicon substrate) and 44 unit resistor bodies R arrayed along the column direction (width direction of the silicon substrate)). A predetermined number from 1 to 128 of the multiple unit resistor bodies R are electrically connected to form a plurality of types of resistor circuits. The plurality of types of resistor circuits thus formed are connected in parallel modes by conductor films and the fuse films F as network connection means. The plurality of fuse films F are arrayed along the inner side of the second connection electrode a13 so that the positioning region thereof is rectilinear, and when a fuse film F is fused, the resistor circuit connected to the fuse film is electrically separated from the resistor network a14.

The structure of the multiple unit resistor bodies R forming the resistor network a14, and the structures of the connection conductor films and fuse films F are the same as the structures of the corresponding portions in the chip resistor a10 and description of these shall thus be omitted here.

Figure 30:
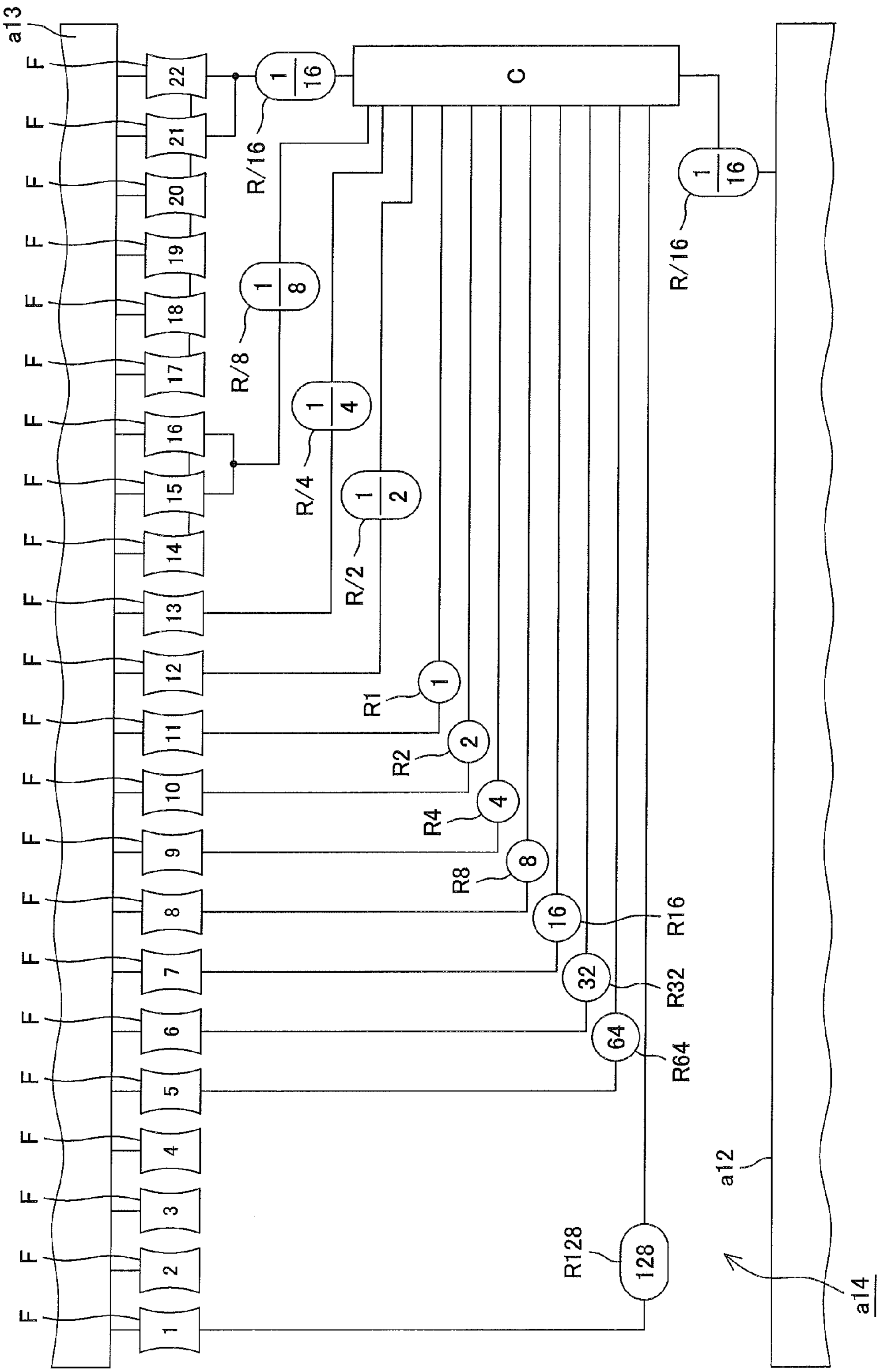
FIG. 30 is an illustrative diagram of the positional relationship of connection conductor films C and fuse films F connecting a plurality of types of resistance units in the resistor network a14 shown in FIG. 29 and the connection relationships of the plurality of types of resistance units connected to the connection conductor films C and fuse films F.

FIG. 30 is an illustrative diagram of the connection modes of the plurality of types of resistor circuits in the resistor network shown in FIG. 29, the array relationship of the fuse films F connecting the resistor circuits, and the connection relationships of the plurality of types of resistor circuits connected to the fuse films F.

Referring to FIG. 30, one end of a reference resistor circuit R/16, included in the resistor network a14, is connected to the first connection electrode a12. The reference resistor circuit R/16 is formed by a parallel connection of 16 unit resistor bodies R and the other end thereof is connected to the connection conductor film C, to which the remaining resistor circuits are connected. One end and the other end of a resistor circuit R128, formed by a serial connection of 128 unit resistor bodies R, are connected to the fuse film F1 and the connection conductor film C.

One end and the other end of a resistor circuit R64, formed by the serial connection of 64 unit resistor bodies R, are connected to the fuse film F5 and the connection conductor film C. One end and the other end of a resistor circuit R32, formed by the serial connection of 32 unit resistor bodies R, are connected to the fuse film F6 and the connection conductor film C. One end and the other end of a resistor circuit R16, formed by the serial connection of 16 unit resistor bodies R, are connected to the fuse film F7 and the connection conductor film C.

One end and the other end of a resistor circuit R8, formed by the serial connection of 8 unit resistor bodies R, are connected to the fuse film F8 and the connection conductor film C. One end and the other end of a resistor circuit R4, formed by the serial connection of 4 unit resistor bodies R, are connected to the fuse film F9 and the connection conductor film C. One end and the other end of a resistor circuit R2, formed by the serial connection of 2 unit resistor bodies R, are connected to the fuse film F10 and the connection conductor film C.

One end and the other end of a resistor circuit R1, formed of the single unit resistor body R, are connected to the fuse film F11 and the connection conductor film C. One end and the other end of a resistor circuit R/2, formed by the parallel connection of 2 unit resistor bodies R, are connected to the fuse film F12 and the connection conductor film C. One end and the other end of a resistor circuit R/4, formed by the parallel connection of 4 unit resistor bodies R, are connected to the fuse film F13 and the connection conductor film C.

The fuse films F14, F15, and F16 are electrically connected, and one end and the other end of a resistor circuit R/8, formed by the parallel connection of 8 unit resistor bodies R, are connected to the fuse films F14, F15, and F16 and the connection conductor film C. The fuse films F17, F18, F19, F20, and F21 are electrically connected, and one end and the other end of a resistor circuit R/16, formed by the parallel connection of 16 unit resistor bodies R, are connected to the fuse films F17 to F21 and the connection conductor film C.

The 21 fuse films F of fuse films F1 to F21 are provided and all of these are connected to the second connection electrode a13. With this arrangement, when a fuse film F, to which one end of a resistor circuit is connected, is fused, the resistor circuit having one end connected to the fuse film F is electrically disconnected from the resistor network a14.

Figure 31:
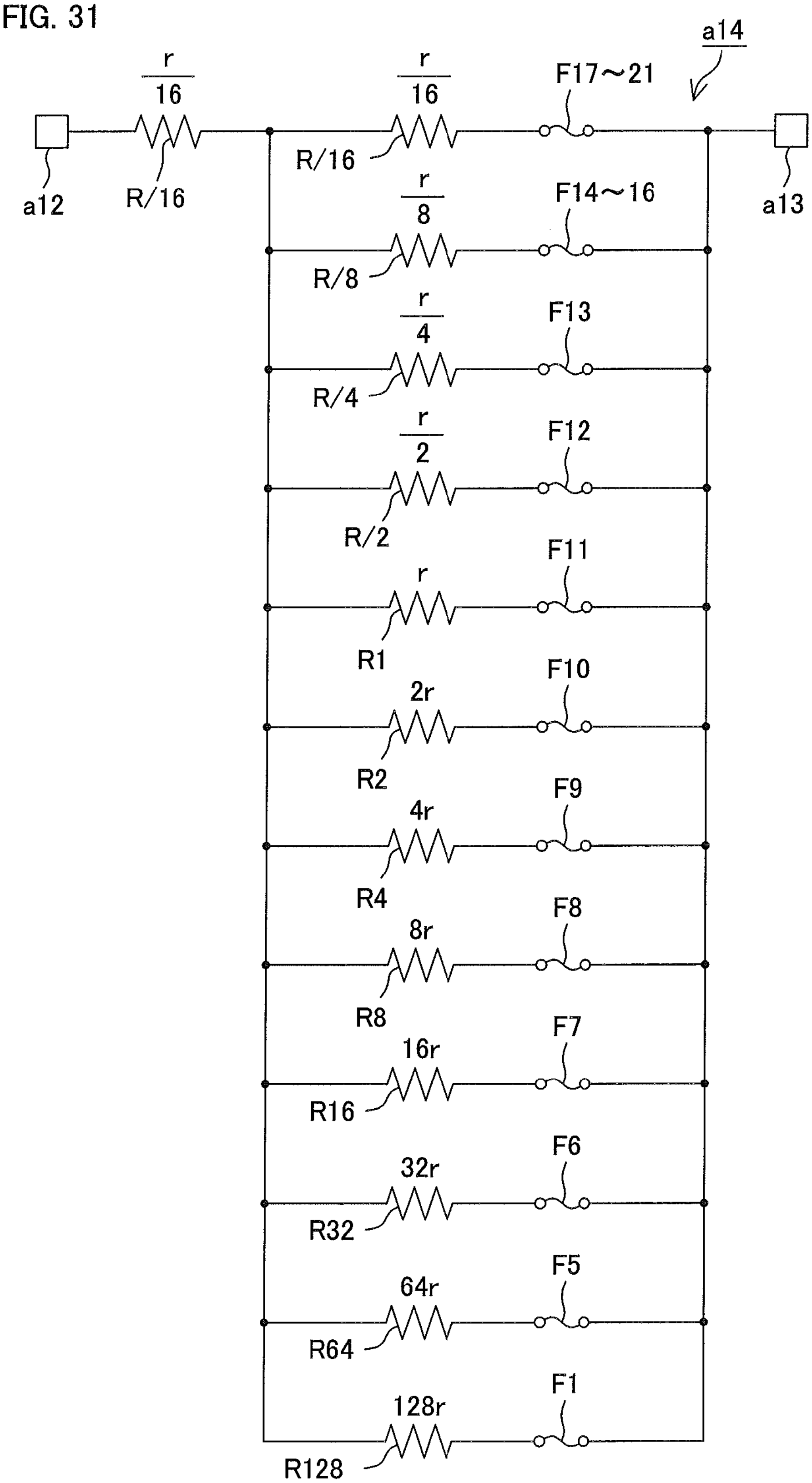
FIG. 31 is an electric circuit diagram of the resistor network a14.

The arrangement of FIG. 30, that is, the arrangement of the resistor network a14 included in the chip resistor a30, is illustrated in the form of an electric circuit diagram in FIG. 31. In a state where none of the fuse films F is fused, the resistor network a14 forms, between the first connection electrode a12 and the second connection electrode a13, a serial connection circuit of the reference resistor circuit R/16 and the parallel connection circuit of the 12 types of resistor circuits R/16, R/8, R/4, R/2, R1, R2, R4, R8, R16, R32, R64, and R128.

A fuse film F is serially connected to each of the 12 types of resistor circuits besides the reference resistor circuit R/16. Therefore with the chip resistor a30 having the resistor network a14, by selectively fusing a fuse film F, for example, by laser light in accordance with the required resistance value, the resistor circuit corresponding to the fused fuse film F (the resistor circuit connected in series to the fuse film F) is electrically separated from the resistor network a14 and the resistance value of the chip resistor a10 can thereby be adjusted.

In other words, with the chip resistor a30 according to the present preferred embodiment, by selectively fusing the fuse films provided in correspondence to a plurality of types of resistor circuits, the plurality of types of resistor circuits can be electrically separated from the resistor network. The respective resistance values of the plurality of types of resistor circuits are predetermined, and the chip resistor a30 can thus be made to have the required resistance value by adjusting the resistance value of the resistance network a14 in a so to speak digital manner.

Also, the plurality of types of resistor circuits include the plurality of types of serial resistor circuits, with which the unit resistor bodies R having an equal resistance value are connected in series with the number of unit resistor bodies R being increased in geometric progression as 1, 2, 4, 8, 16, 32, 64, and 128, and the plurality of types of parallel resistor circuits, with which the unit resistor bodies R having an equal resistance value are connected in parallel with the number of unit resistor bodies R being increased in geometric progression as 2, 4, 8, and 16. Therefore by selectively fusing the fuse films F, the resistance value of the resistor network a14 as a whole can be set to an arbitrary resistance value finely and digitally.

Figure 32:
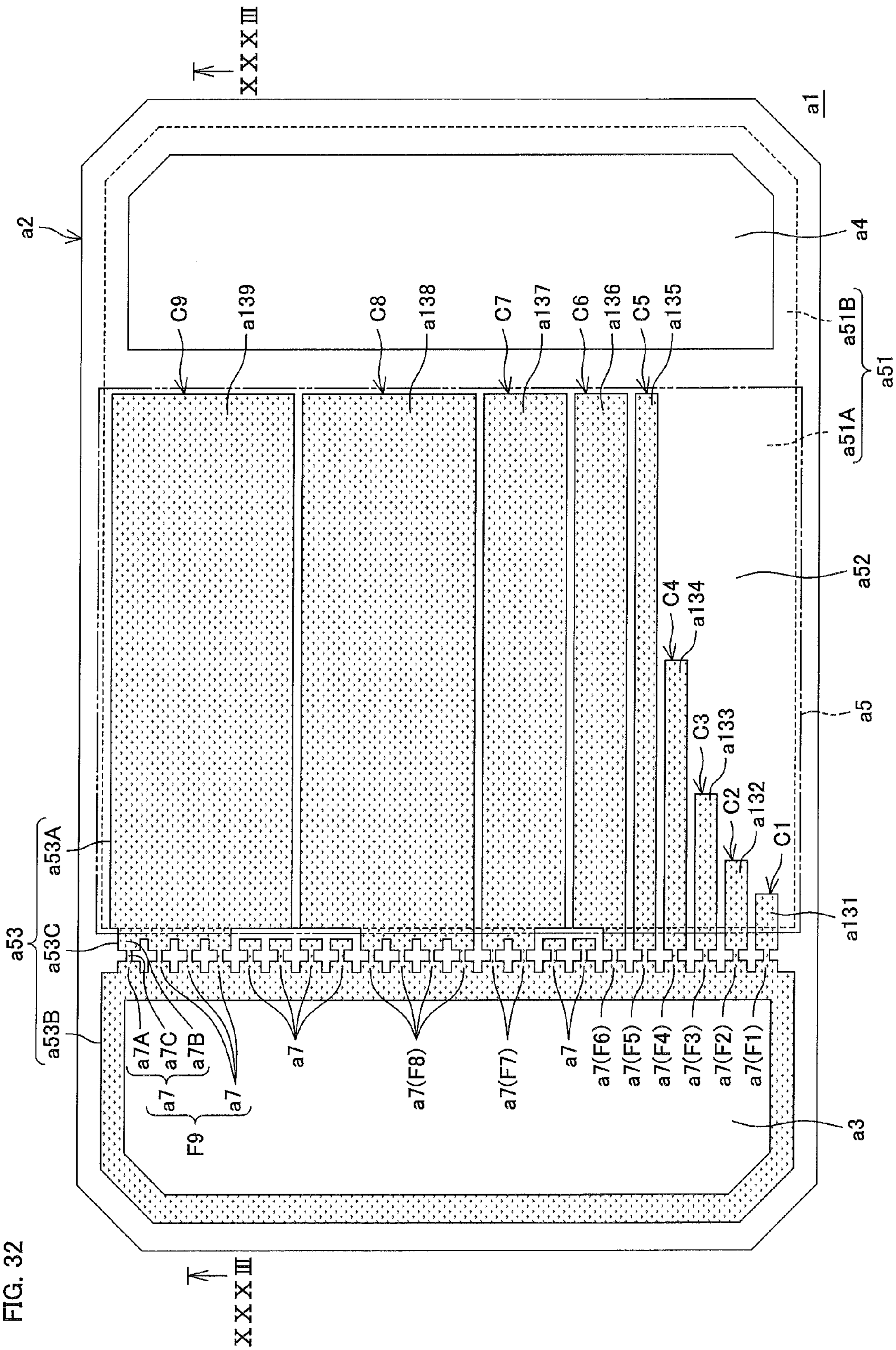
FIG. 32 is a plan view of a chip capacitor according to a preferred embodiment of a first reference example.
Figure 33:
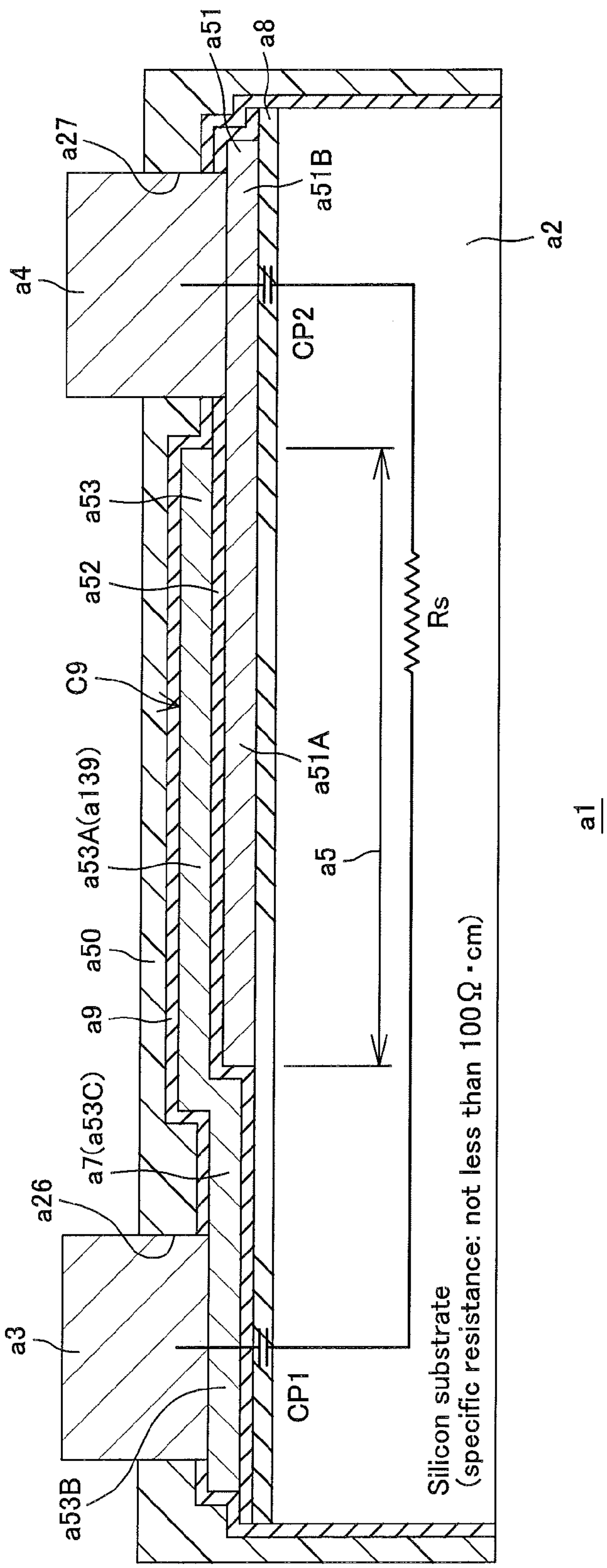
FIG. 33 is a sectional view taken along section line XXXIII-XXXIII in FIG. 32.
Figure 34:
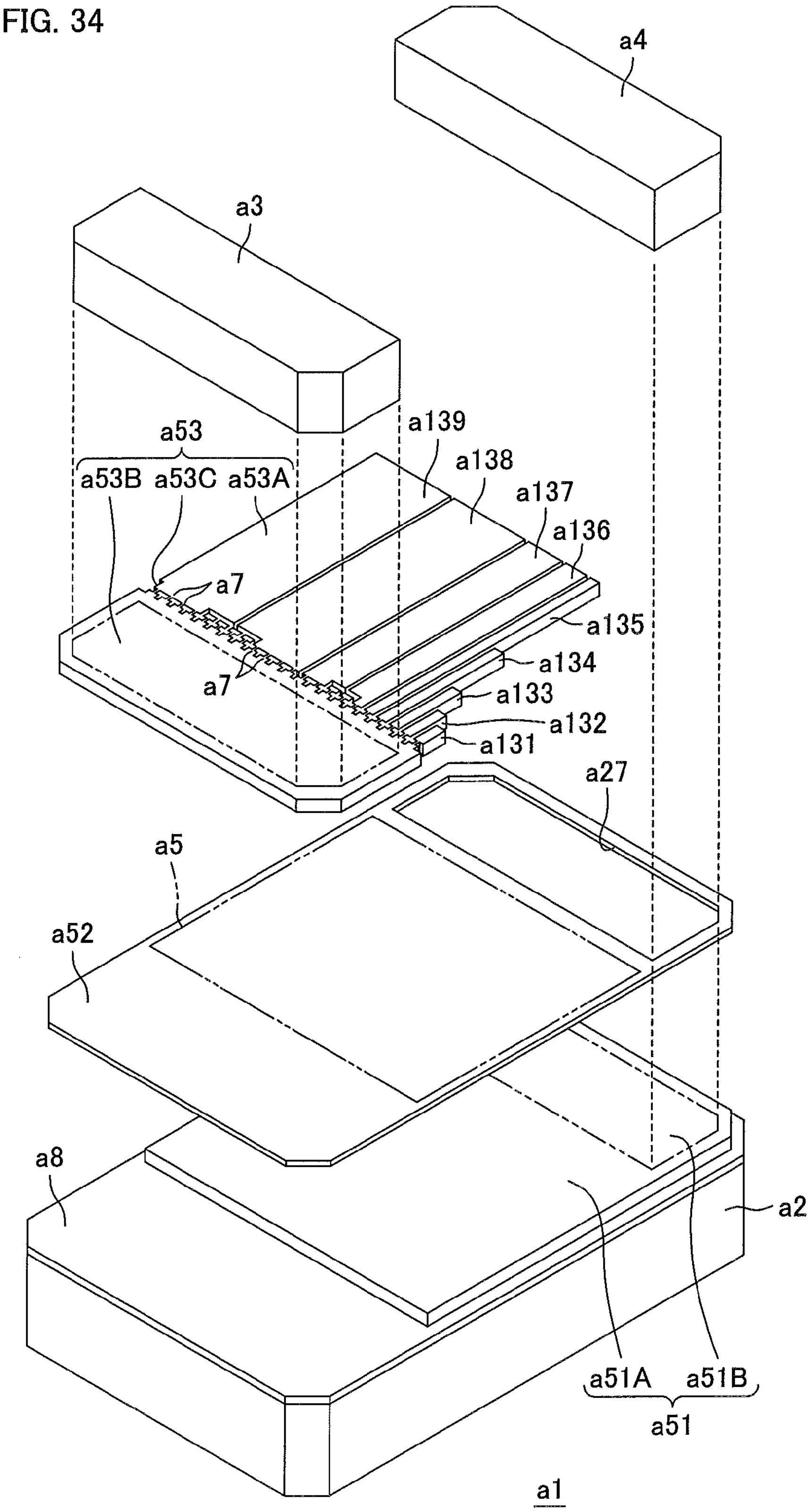
FIG. 34 is an exploded perspective view showing the arrangement of a portion of the chip capacitor in a separated state.

FIG. 32 is a plan view of a chip capacitor according to another preferred embodiment of the first reference example, and FIG. 33 is a sectional view thereof showing a section taken along section line XXXIII-XXXIII in FIG. 32. Further, FIG. 34 is an exploded perspective view showing the arrangement of a portion of the chip capacitor in a separated state. The chip capacitor a1 includes a substrate a2, a first external electrode a3 disposed on the substrate a2, and a second external electrode a4 disposed similarly on the substrate a2. In the present preferred embodiment, the substrate a2 has, in a plan view, a rectangular shape with the four corners chamfered. The rectangular shape has dimensions of, for example, approximately 0.3 mm×0.15 mm. The first external electrode a3 and the second external electrode a4 are respectively disposed at portions at respective ends in the long direction of the substrate a2. In the present preferred embodiment, each of the first external electrode a3 and the second external electrode a4 has a substantially rectangular planar shape extending in the short direction of the substrate a2 and has chamfered portions at two locations respectively corresponding to the corners of the substrate a2. On the substrate a2, a plurality of capacitor parts C1 to C9 are disposed within a capacitor arrangement region a5 between the first external electrode a3 and the second external electrode a4. The plurality of capacitor parts C1 to C9 are electrically connected respectively to the first external electrode a3 via a plurality of fuse units a7.

As shown in FIG. 33 and FIG. 34, an insulating film a8 is formed on a top surface of the substrate a2, and a lower electrode film a51 is formed on a top surface of the insulating film a8. The lower electrode film a51 is formed to spread across substantially the entirety of the capacitor arrangement region a5 and extend to a region directly below the second external electrode a4. More specifically, the lower electrode film a51 has a capacitor electrode region a51A functioning as a lower electrode in common to the capacitor parts C1 to C9 and a pad region a51B leading out to an external electrode. The capacitor electrode region a51A is positioned in the capacitor arrangement region a5 and the pad region a51B is positioned directly below the second external electrode a4.

Figure 22:
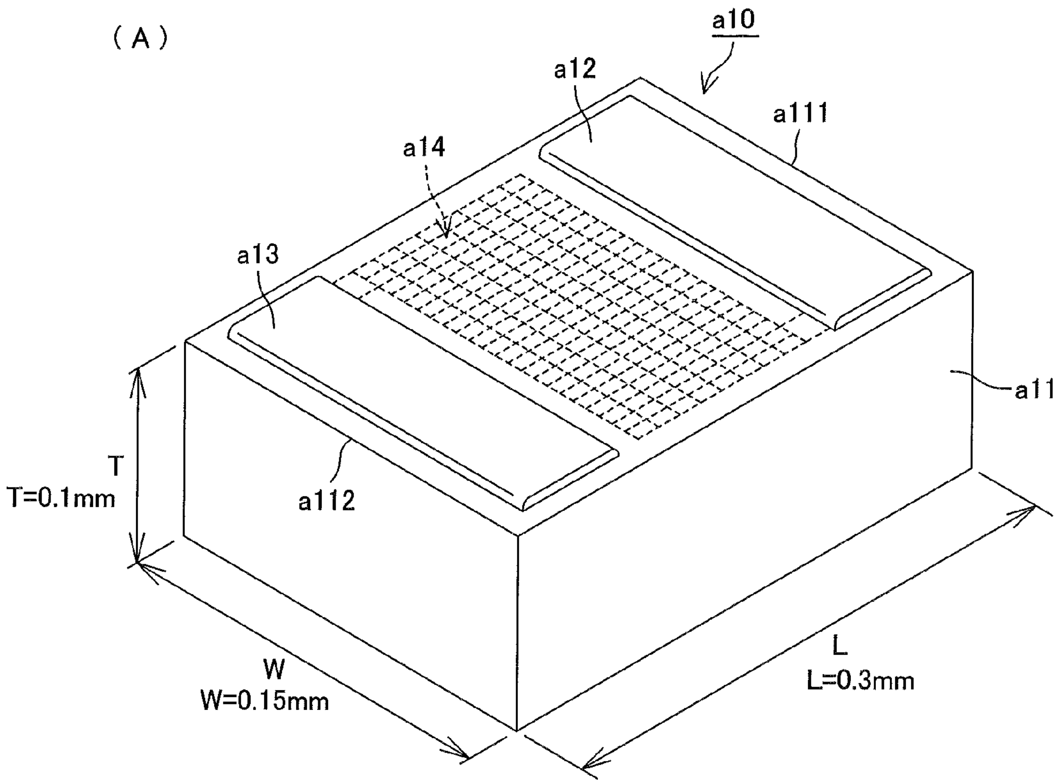
FIG. 22(A) is an illustrative perspective view of the external arrangement of a chip resistor a10 according to a preferred embodiment of a first reference example and FIG. 22(B) is a side view of a state where the chip resistor a10 is mounted on a substrate.
Figure 22:
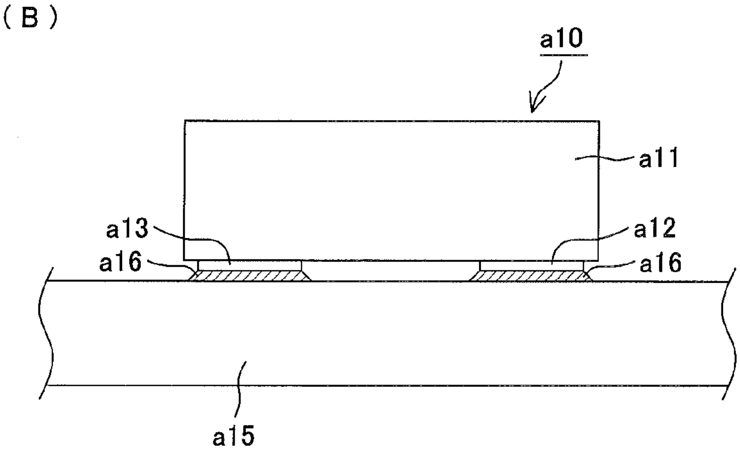

In the capacitor arrangement region a5, a capacitance film (dielectric film) a52 is formed so as to cover the lower electrode film a51 (capacitor electrode region a51A). The capacitance film a52 is continuous across the entirety of the capacitor electrode region a51A and, in the present preferred embodiment, further extends to a region directly below the first external electrode a3 and covers the insulating film a8 outside the capacitor arrangement region a5. An upper electrode film a53 is formed on the capacitance film a52. In FIG. 22, the upper electrode film a53 is indicated with fine dots added for the sake of clarity. The upper electrode film a53 includes a capacitor electrode region a53A positioned in the capacitor arrangement region a5, a pad region a53B positioned directly below the first external electrode a3, and a fuse region a53C disposed between the pad region a53B and the capacitor electrode region a53A.

In the capacitor electrode region a53A, the upper electrode film a53 is divided into a plurality of electrode film portions a131 to a139. In the present preferred embodiment, the respective electrode film portions a131 to a139 are all formed to rectangular shapes and extend in the form of bands from the fuse region a53C toward the second external electrode a4. The plurality of electrode film portions a131 to a139 face the lower electrode film a51 across the capacitance film a52 over a plurality of types of facing areas. More specifically, the facing areas of the electrode film portions a131 to a139 with respect to the lower electrode film a51 may be set to be 1:2:4:8:16:32:64:128:128. That is, the plurality of electrode film portions a131 to a139 include the plurality of electrode film portions differing in facing area and more specifically include the plurality of electrode film portions a131 to a138 (or a131 to a137 and a139) having facing areas that are set to form a geometric progression with a common ratio of 2. The plurality of capacitor parts C1 to C9, respectively arranged by the respective electrode film portions a131 to a139 and the facing lower electrode film a51 across the capacitance film a52, thus include the plurality of capacitor parts having mutually different capacitance values. If the ratio of the facing areas of the electrode film portions a131 to a139 is as mentioned above, the ratio of the capacitance values of the capacitor parts C1 to C9 is equal to the ratio of the facing areas and is 1:2:4:8:16:32:64:128:128. The plurality of capacitor parts C1 to C9 thus include the plurality of capacitor parts C1 to C8 (or C1 to C7 and C9) with capacitance values set to form the geometric progression with the common ratio of 2.

In the present preferred embodiment, the electrode film portions a131 to a135 are formed to bands that are equal in width and have lengths with the ratio thereof being set to 1:2:4:8:16. Also, the electrode film portions a135, a136, a137, a138, and a139 are formed to bands that are equal in length and have widths with the ratio thereof being set to 1:2:4:8:8. The electrode film portions a135 to a139 are formed to extend across a range from an end edge at the first external electrode a3 side to an end edge at the second external electrode a4 side of the capacitor arrangement region a5, and the electrode film portions a131 to a134 are formed to be shorter than this range.

The pad region a53B is formed to be substantially similar in shape to the first external electrode a3 and has a substantially rectangular planar shape having two chamfered portions corresponding to corner portions of the substrate a2. The fuse region a53C is disposed along one long side (the long side at the inner side with respect to the peripheral edge of the substrate a2) of the pad region a53B. The fuse region a53C includes the plurality of fuse units a7 that are aligned along the one long side of the pad region a53B. The fuse units a7 are formed of the same material as and integral to the pad region a53B of the upper electrode film a53. The plurality of electrode film portions a131 to a139 are each formed integral to one or a plurality of the fuse units a7, are connected to the pad region a53B via the fuse units a7, and are electrically connected to the first external electrode a3 via the pad region a53B. Each of the electrode film portions a131 to a136 of comparatively small area is connected to the pad region a53B via a single fuse unit a7, and each of the electrode film portions a137 to a139 of comparatively large area is connected to the pad region a53B via a plurality of fuse units a7. It is not necessary for all of the fuse units a7 to be used and, in the present preferred embodiment, a portion of the fuse units a7 is unused.

The fuse units a7 include first wide portions a7A arranged to be connected to the pad region a53B, second wide portions a7B arranged to be connected to the electrode film portions a131 to a139, and narrow portions a7C connecting the first and second wide portions a7A and a7B. The narrow portions a7C are arranged to be capable of being cut (fused) by laser light. Unnecessary electrode film portions among the electrode film portions a131 to a139 can thus be electrically disconnected from the first and second external electrodes a3 and a4 by cutting the fuse units a7.

Although omitted from illustration in FIG. 32 and FIG. 34, a top surface of the chip capacitor a1 that includes a top surface of the upper electrode film a53 is covered by a passivation film a9 as shown in FIG. 33. The passivation film a9 is constituted, for example, of a nitride film and is formed not only to cover the upper surface of the chip capacitor a1 but also to extend to side surfaces of the substrate a2 and cover the side surfaces. Further, a resin film a50, made of a polyimide resin, etc., is formed on the passivation film a9. The resin film a50 is formed to cover the upper surface of the chip capacitor a1 and extend to the side surfaces of the substrate a2 to cover the passivation film a9 on the side surfaces.

The passivation film a9 and the resin film a50 are protective films that protect the top surface of the chip capacitor a1. In these films, pad openings a26 and a27 are respectively formed in regions corresponding to the first external electrode a3 and the second external electrode a4. The pad openings a26 and a27 penetrate through the passivation film a9 and the resin film a50 so as to respectively expose a region of a portion of the pad region a53B of the upper electrode film a53 and a region of a portion of the pad region a51B of the lower electrode film a51. Further, with the present preferred embodiment, the pad opening a27 corresponding to the second external electrode a4 also penetrates through the capacitance film a52.

The first external electrode a3 and the second external electrode a4 are respectively embedded in the pad openings a26 and a27. The first external electrode a3 is thereby bonded to the pad region a53B of the upper electrode film a53 and the second external electrode a4 is bonded to the pad region a51B of the lower electrode film a51. The first and second external electrodes a3 and a4 are formed to project from a top surface of the resin film a50. The chip capacitor a1 can thereby be flip-chip bonded to a mounting substrate.

Figure 35:
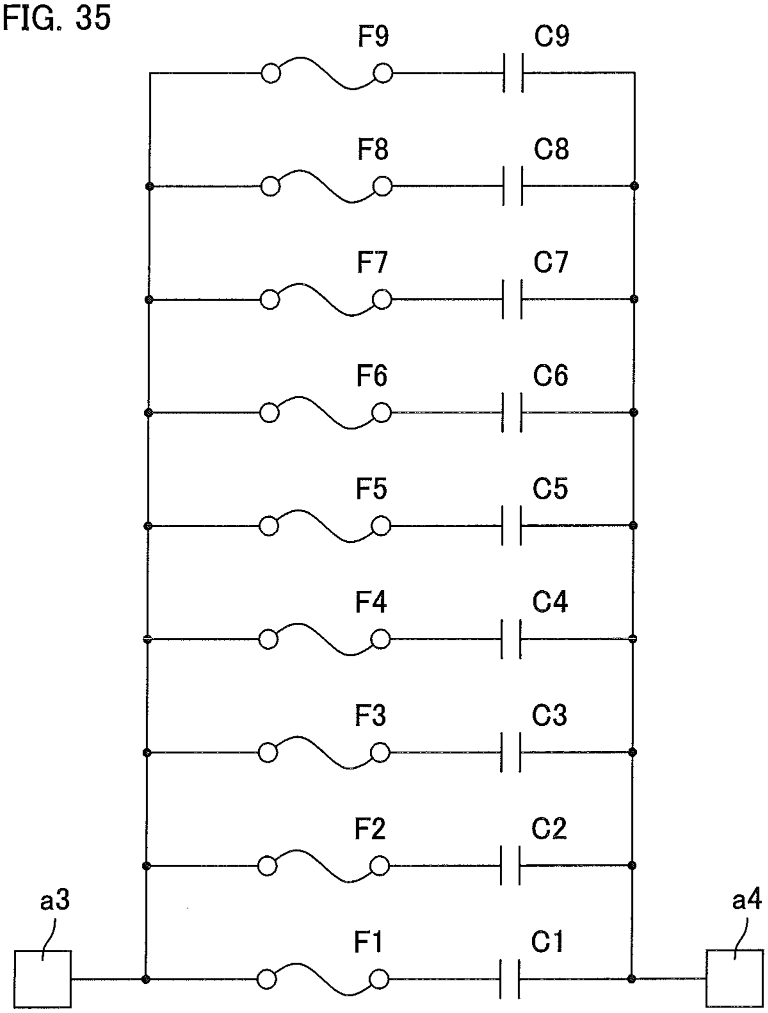
FIG. 35 is a circuit diagram of the electrical arrangement of the interior of the chip capacitor.

FIG. 35 is a circuit diagram of the electrical arrangement of the interior of the chip capacitor a1. The plurality of capacitor parts C1 to C9 are connected in parallel between the first external electrode a3 and the second external electrode a4. Fuses F1 to F9, each arranged from one or a plurality of the fuse units a7, are interposed in series between the respective capacitor parts C1 to C9 and the first external electrode a3. When all of the fuses F1 to F9 are connected, the capacitance value of the chip capacitor a1 is equal to the total of the capacitance values of the capacitor parts C1 to C9. When one or two or more fuses selected from among the plurality of fuses F1 to F9 is or are cut, each capacitor part corresponding to the cut fuse is disconnected and the capacitance value of the chip capacitor a1 decreases by just the capacitance value of the disconnected capacitor part or parts.

Therefore by measuring the capacitance value across the pad regions a51B and a53B (the total capacitance value of the capacitor parts C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor parts C1 to C8 are set to form a geometric progression with a common ratio of 2, fine adjustment to the targeted capacitance value at a precision corresponding to the capacitance value of the capacitor part C1, which is the smallest capacitance value (value of the first term in the geometric progression), is made possible.

For example, the capacitance values of the capacitor parts C1 to C9 may be set as follows. C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor a1 can be finely adjusted at a minimum adjustment precision of 0.03125 pF. Also, the fuses to be cut among the fuses F1 to F9 can be selected appropriately to provide the chip capacitor a1 with an arbitrary capacitance value between 0.1 pF and 10 pF.

As described above, with the present preferred embodiment, the plurality of capacitor parts C1 to C9 that can be disconnected by the fuses F1 to F9 are provided between the first external electrode a3 and the second external electrode a4. The capacitor parts C1 to C9 include a plurality of capacitor parts that differ in capacitance value and more specifically include a plurality of capacitor parts with capacitance values set to form a geometric progression. The chip capacitor a1, which can accommodate a plurality of types of capacitance values without change of design and can be accurately adjusted to the desired capacitance value by selection and fusion by laser light of one or a plurality of fuses among the fuses F1 to F9, can thus be provided.

Details of respective portions of the chip capacitor a1 shall now be described. The substrate a2 may have, for example, a rectangular shape of 0.3 mm×0.15 mm, 0.4 mm×0.2 mm, or 0.2 mm×0.1 mm, etc. (preferably a size of not more than 0.4 mm×0.2 mm) in a plan view. The capacitor arrangement region a5 is generally a square region with each side having a length corresponding to the length of the short side of the substrate a2. The thickness of the substrate a2 may be approximately 150 μm. The substrate a2 may, for example, be a substrate that has been thinned by grinding or polishing from a rear surface side (surface on which the capacitor parts C1 to C9 are not formed). As the material of the substrate a2, a semiconductor substrate as represented by a silicon substrate may be used or a glass substrate may be used or a resin film may be used.

The insulating film a8 may be a silicon oxide film or other oxide film. The film thickness thereof may be approximately 500 Å to 2000 Å. The lower electrode film a51 is preferably a conductive film, a metal film in particular, and may, for example, be an aluminum film. The lower electrode film a51 that is constituted of an aluminum film may be formed by a sputtering method. Similarly, the upper electrode film a53 is preferably constituted of a conductive film, a metal film in particular, and may, for example, be an aluminum film. The upper electrode film a53 that is constituted of an aluminum film may be formed by the sputtering method. The patterning for dividing the capacitor electrode region a53A of the upper electrode film a53 into the electrode film portions a131 to a139 and shaping the fuse region a53C into the plurality of fuse units a7 may be performed by photolithography and etching processes.

The capacitance film a52 may be constituted, for example, of a silicon nitride film, and the film thickness thereof may be 500 Å to 2000 Å (for example, 1000 Å). The capacitance film a52 may be a silicon nitride film formed by plasma CVD (chemical vapor deposition). The passivation film a9 may be constituted, for example, of a silicon nitride film and may be formed, for example, by the plasma CVD method. The film thickness thereof may be approximately 8000 Å. As mentioned above, the resin film a50 may be constituted of a polyimide film or other resin film.

Figure 36:
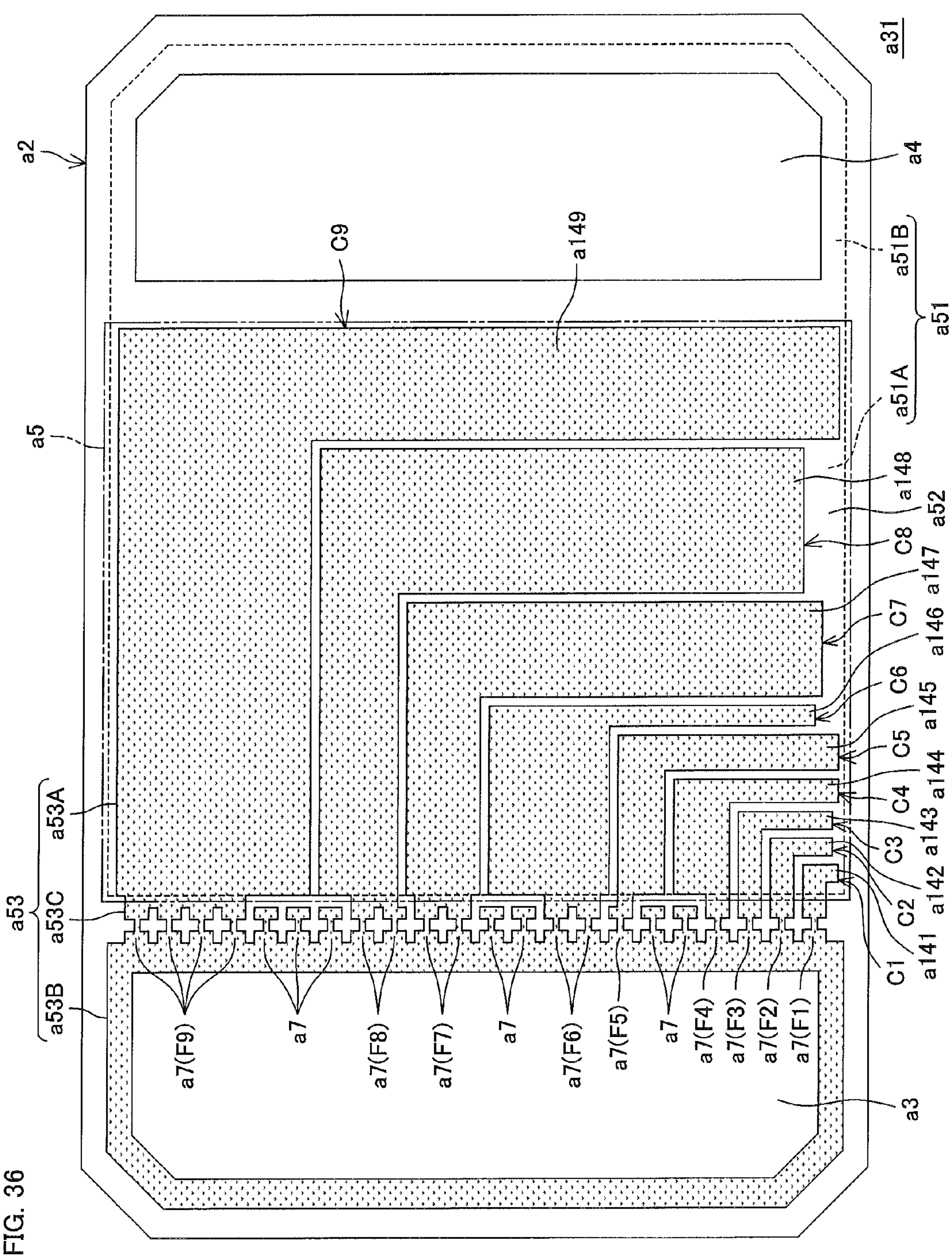
FIG. 36 is a plan view for describing the arrangement of a chip capacitor according to another preferred embodiment of the first reference example.

FIG. 36 is a plan view for describing the arrangement of a chip capacitor a31 according to yet another preferred embodiment of the first reference example. In FIG. 36, portions corresponding to respective portions shown in FIG. 32 are indicated using the same reference symbols as in FIG. 32. In the chip capacitor a1 of the preferred embodiment described above, the capacitor electrode region a53A of the upper electrode film a53 is divided into the electrode film portions a131 to a139 each having a band shape. In this case, regions that cannot be used as capacitor parts are formed within the capacitor arrangement region a5 as shown in FIG. 32 and effective use cannot be made of the restricted region on the small substrate a2.

Therefore with the preferred embodiment shown in FIG. 36, the capacitor electrode region a53A is divided into L-shaped electrode film portions a141 to a149. For example, the electrode film portion a149 in the arrangement of FIG. 36 can thereby be made to face the lower electrode film a51 over an area that is 1.5 times that of the electrode film portion a139 in the arrangement of FIG. 32. Therefore, if the capacitor part C9 corresponding to the electrode film portion a139 in the first preferred embodiment of FIG. 32 has a capacitance of 4 pF, the capacitor part C9 can be made to have a capacitance of 6 pF by use of the electrode film portion a149 of the present preferred embodiment. The capacitance value of the chip capacitor a1 can thereby be set over a wider range by making effective use of the interior of the capacitor arrangement region a5.

Figure 37:
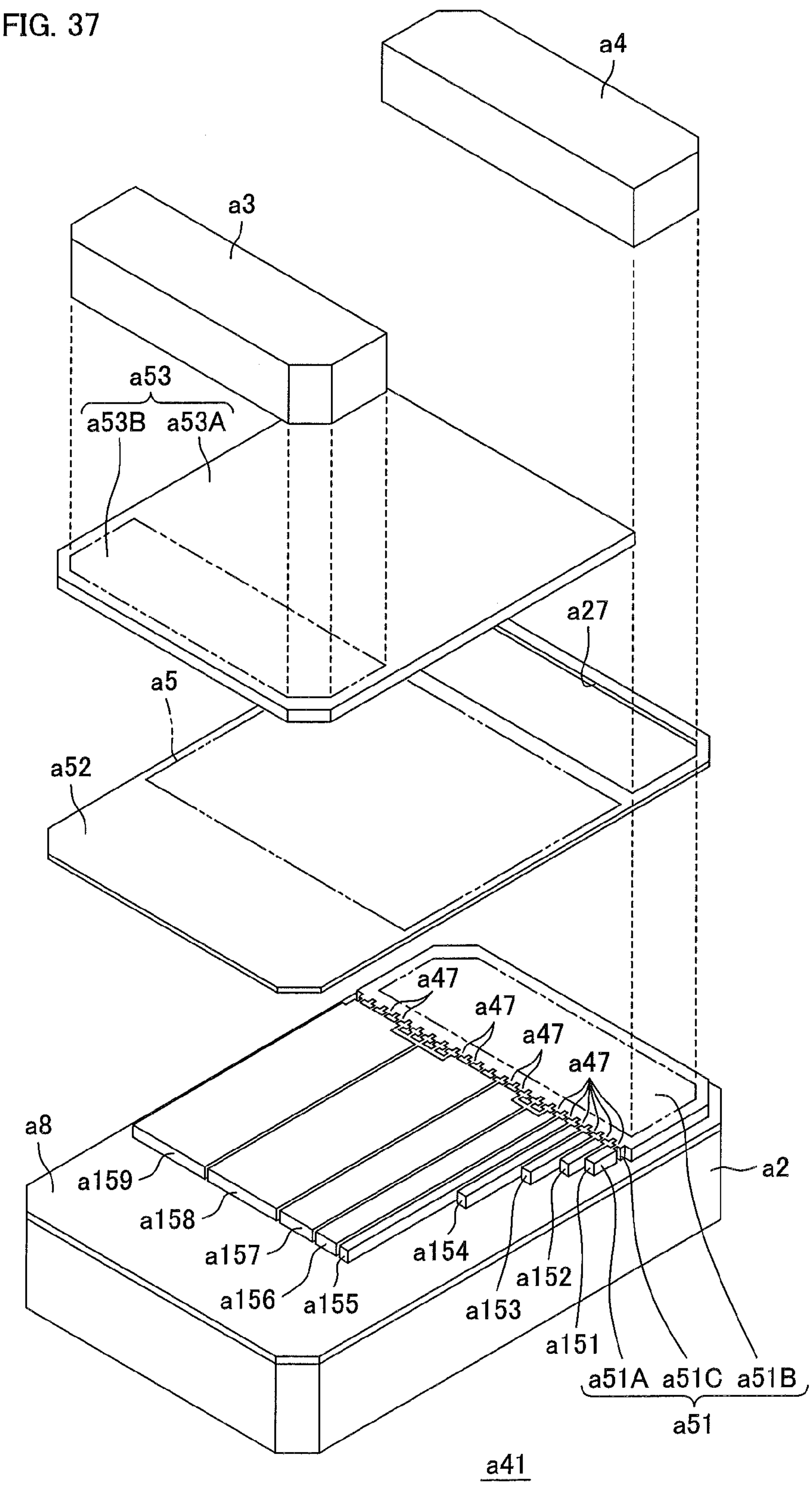
FIG. 37 is an exploded perspective view for describing the arrangement of a chip capacitor according to yet another preferred embodiment of the first reference example.

In order to avoid receiving influences of parasitic capacitances, the substrate a2 is formed of a semiconductor having a specific resistance of not less than 100 Ω·cm in the present preferred embodiment as well. FIG. 37 is an exploded perspective view for describing the arrangement of a chip capacitor a41 according to yet another preferred embodiment of the first reference example, and the respective portions of the chip capacitor a41 are shown in the same manner as in FIG. 34 used for describing the preferred embodiment above.

With the present preferred embodiment, whereas the capacitor electrode region a53A of the upper electrode film a53 is formed to a continuous film pattern that is continuous across substantially the entirety of the capacitor arrangement region a5, the capacitor electrode region a51A of the lower electrode film a51 is divided into a plurality of electrode film portions a151 to a159. The electrode film portions a151 to a159 may be formed in the same shapes and area ratio as those of the electrode film portions a131 to a139 in the preferred embodiment shown in FIG. 32 or may be formed in the same shapes and area ratio as those of the electrode film portions a141 to a149 in the preferred embodiment shown in FIG. 36. A plurality of capacitor parts are thus arranged by the electrode film portions a151 to a159, the capacitance film a52, and the upper electrode film a53. At least a portion of the plurality of capacitor parts constitutes a set of capacitor parts that differ in capacitance value (for example, with the respective capacitance values being set to form a geometric progression).

The lower electrode film a51 further has a fuse region a51C between the capacitor electrode region a51A and the pad region a51B. In the fuse region a51C, a plurality of fuse units a47, similar to the fuse units a7 of the preferred embodiment described above, are aligned in a single column along the pad region a51B. Each of the electrode film portions a151 to a159 is connected to the pad region a51B via one or a plurality of the fuse units a47.

The electrode film portions a151 to a159 face the upper electrode film a53 over mutually different facing areas in such an arrangement as well and any of these can be disconnected individually by cutting the fuse unit a47. The same effects as those of the preferred embodiment described above are thus obtained. In particular, by forming at least a portion of the plurality of electrode film portions a151 to a159 so as to face the upper electrode film a53 over facing areas set to form a geometric progression with a common ratio of 2, a chip capacitor that is adjusted to the required capacitance value with high precision can be provided in the same manner as in the preferred embodiment described above.

Figure 38:
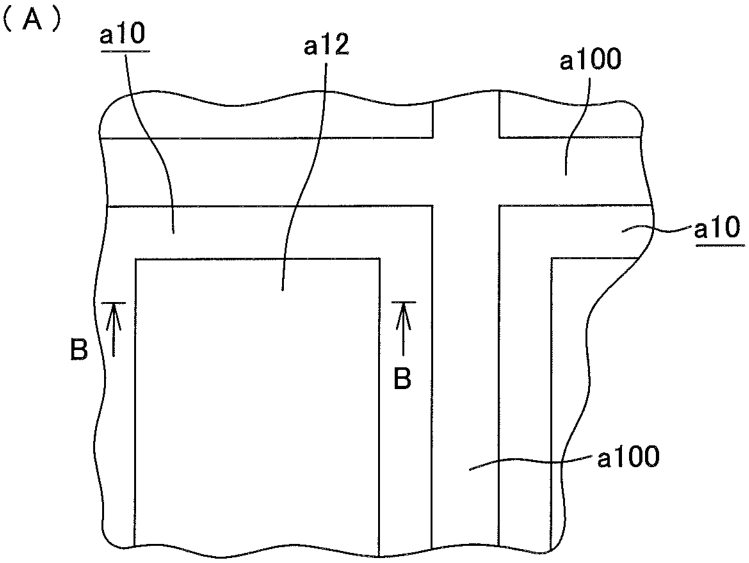
FIG. 38 shows diagrams for describing an example of the arrangement of an external connection electrode that is a feature of the first reference example, with FIG. 38(A) being a partial plan view of the chip resistor a10 showing a sectioning location B-B, and FIG. 38(B) being an illustrative partial vertical sectional view of a section taken along B-B in FIG. 38(A).
Figure 38:
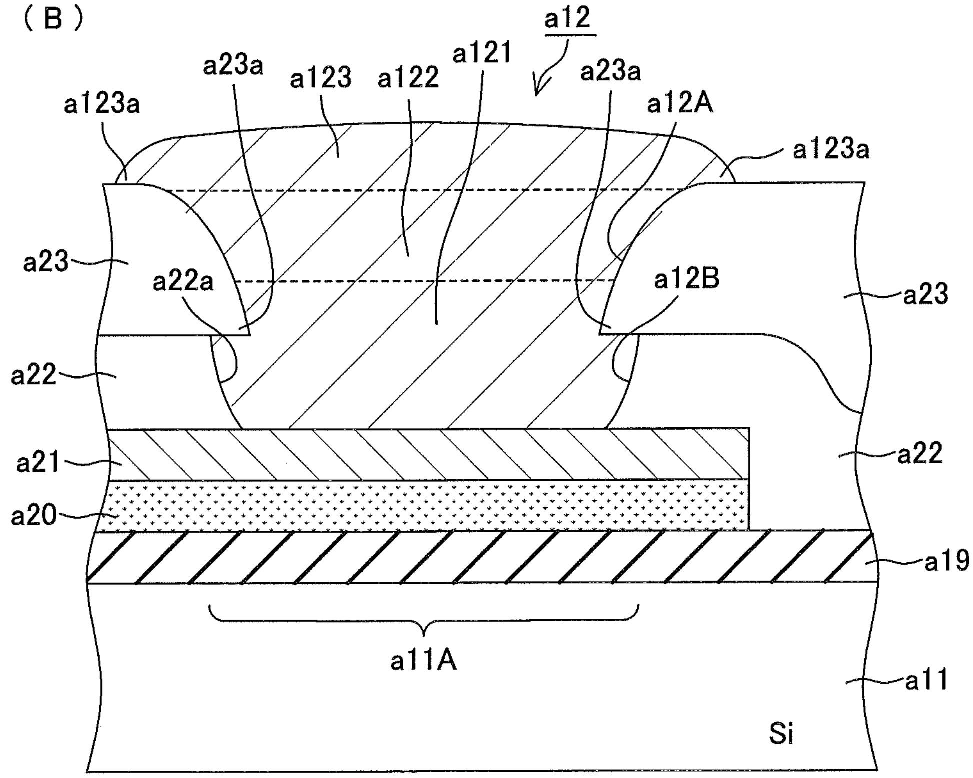

In order to avoid receiving influences of parasitic capacitances, the substrate a2 is formed of a semiconductor having a specific resistance of not less than 100 Ω·cm in the present preferred embodiment as well. FIG. 38 shows diagrams for describing an example of the arrangement of an external connection electrode that is a feature of the first reference example, with FIG. 38(A) being a partial plan view of the chip resistor a10 showing a sectioning location B-B, and FIG. 38(B) being an illustrative partial vertical sectional view of a section taken along B-B in FIG. 38(A).

For example, with the chip resistor a10 described with reference to FIGS. 22 to 25, multiple chip resistors a10 are formed in a lattice on the semiconductor wafer (silicon wafer) and are separated into the individual chip resistors a10 by cutting along scribe lines 100. The partial vertical sectional view of FIG. 38(B) shows the arrangement of the section of the first connection electrode a12 taken along B-B in the chip resistor a10.

Referring to FIG. 38(B), the insulating layer ($SiO_2$) a19 is formed on the silicon substrate a11 and the resistor body film a20 is disposed on the insulating film a19. The resistor body film a20 is formed of TiN, TiON, or TiSiON. The wiring film a21, formed of an aluminum-based metal such as aluminum (Al), is laminated on a pad region a11A on the resistor body film a20. The upper surface of the substrate a11, on which the resistor body film a20 and the wiring film a21 are formed, is covered by the passivation film a22 formed, for example, of silicon nitride (SiN) and an upper portion thereof is further covered by the resin film a23 as the protective layer formed, for example, of polyimide.

As the external connection electrode, the first connection electrode a12 is formed as follows.

First, patterning of the resin film a23 by photolithography is performed by performing exposure followed by a developing step on a region of the resin film a23 corresponding to an opening (contact hole) for the first connection electrode. A pad opening a12A is thereby formed as a contact hole in the resin film a23 for the first connection electrode a12. Thereafter, heat treatment (polyimide curing) for hardening the resin film a23 is performed and the polyimide film (resin film) a23 is stabilized by the heat treatment. Also by the heat treatment, an upper portion of the resin film a23 is shrunk so that the pad opening a12A becomes an opening that is obliquely inclined upward so as to increase in opening diameter toward the upper side.

Thereafter, the passivation film a22 is etched using the polyimide film a23 having the contact hole (pad opening) a12A at the position at which the first connection electrode a12 is to be formed, as a mask. A pad opening a12B is thereby formed as a contact hole exposing the wiring film a21 in the pad region a11A of the first connection electrode a12. The pad opening a12B constitutes a portion of the contact hole and the etching for forming the pad opening a12B may be performed by reactive ion etching (RIE). As a result of the passivation film a22 being etched to form the pad opening a12B using the polyimide film a23 as a mask, a step is formed along a boundary surface of the resin film a23 and the passivation film a22. That is, at the boundary surface with respect to the resin film a23, the passivation film a22 is etched so that its inner diameter is made wider than the inner diameter of the resin film a23. Consequently, the resin film a23 is made to have, at a lower portion of its inner peripheral surface, a step portion a23*a* that protrudes further inward than an inner peripheral surface a22*a* of the passivation film a22.

Thereafter, the first connection electrode a12 is grown as the external connection electrode in the pad openings a12B and a12A as the contact holes by, for example, an electroless plating method. In the forming of the external connection electrode a12 inside the pad openings a12B and a12A, a multilayer laminated structure film is preferably arranged by first forming a nickel layer a121 on the wiring film a21 exposed in the pad region a11A, then forming a palladium layer a122 on the nickel layer a121, and then forming a gold layer further above. The nickel layer a121 contributes to improvement of adhesion with the wiring film a21 formed of the aluminum-based metal, and the palladium layer a122 functions as a diffusion preventing layer that suppresses mutual diffusion between the gold layer a123 laminated thereabove and the wiring film a21 formed of the aluminum-based metal film. The first connection electrode a12 can thus be arranged as a satisfactory external connection electrode by arranging it as a three-layer structure of Ni, Pd, or Au or other multilayer structure.

A feature of the external connection electrode (first connection electrode a12) according to the first reference example is that the metal layer constituting the external connection electrode fills the interiors of the pad openings a12B and a12A and an outer peripheral side surface of the gold layer a123 is closely adhered along the pad opening a12A as the contact hole that increases in inner diameter toward the upper side. In a plan view of looking from a direction perpendicular to a top surface of the wiring film a21 of the pad region a11A, a protruding portion a123*a*, extends to a top surface of the protective film a23 and protrudes further outward than an upper surface exposed region of the wiring film a21 in the pad region a11A over the full periphery of an edge portion of the pad opening a12A. The protruding portion a123*a* protrudes outward over the full periphery of the edge portion of the pad opening a12A that is the contact hole.

Consequently, the gold layer a123 of the first connection electrode a12 is closely adhered to the inclining surface of the pad opening a12A and the area of adhesion of the pad opening a12A and the gold layer a123 is thus increased. Therefore the first connection electrode a12 as the external connection electrode is excellent in adhesion with the protective film a23 and moisture is unlikely to enter into the pad region a11A through a gap between the gold layer a123 and the pad opening a12A so that the chip resistor a10 is improved in moisture resistance. Also, the surface area of the first connection electrode a12 exposed from a top surface of the resin layer a23 of the chip resistor a10 is increased, thereby improving the strength of the first connection electrode a12 against external pressure. The chip resistor a10 can thereby be arranged with a structure that is satisfactory for a flip chip.

Further, an upper surface of the first connection electrode a12 (upper surface of the gold layer a123) bulges in a convexly curved shape to increase the contact area in the mounting process. Also, the step a23*a* is formed inside the pad openings a12B and a12A as the contact hole, and the bonding of the metal layer constituting the first connection electrode a12 and the pad openings a12B and a12A is improved by the step a23A.

Figure 39:
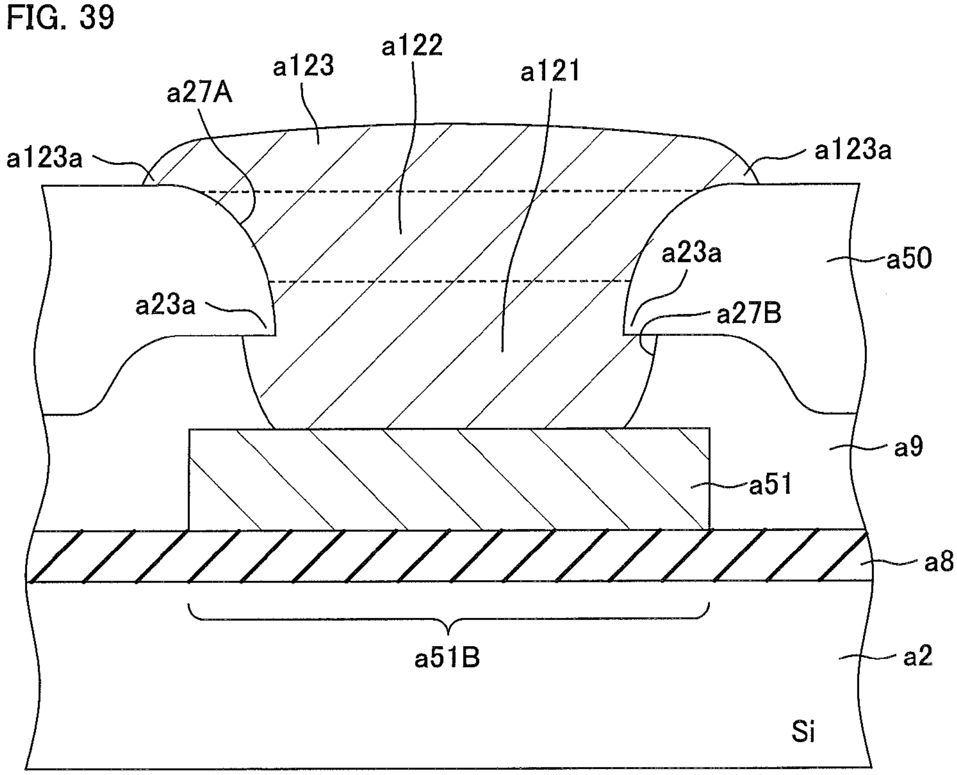
FIG. 39 is an illustrative partial sectional view for describing the arrangement in a case of applying the external connection electrode according to the preferred embodiment of the first reference example to the chip capacitor a1.

FIG. 39 is an illustrative partial sectional view for describing the arrangement in a case where the external connection electrode according to the preferred embodiment of the first reference example is applied to the chip capacitor a1. In FIG. 39, the insulating film a8 is formed on the substrate a2 and, for example, the lower electrode film a51 is formed further thereon. The upper surface of the substrate a2 is covered by the passivation film a9 and this is further covered by the resin film a50.

With the present arrangement, the second external electrode a4 as the external connection electrode is formed as follows by the same process as that for forming the opening (contact hole) in the chip resistor a10. First, patterning of the resin film a50 by photolithography is performed by performing exposure followed by a developing step on a region of the resin film a50 corresponding to an opening (contact hole) for the second external electrode a4. A pad opening a27A is thereby formed as a contact hole in the resin film a50 for the second external electrode a4. Thereafter, heat treatment (polyimide curing) for hardening the resin film a50 is performed and the polyimide film (resin film) a50 is stabilized by the heat treatment. Also by the heat treatment, an upper portion of the resin film a50 is shrunk so that the pad opening a27A becomes an opening that is obliquely inclined upward so as to increase in opening diameter toward the upper side.

Thereafter, the passivation film a9 is etched using the polyimide film a50 having the contact hole (pad opening) a27A at the position at which the second external electrode a4 is to be formed, as a mask. A pad opening a27B is thereby formed as a contact hole exposing the lower electrode film a51 in the pad region a51A of the second external electrode a4. The pad opening a27B constitutes a portion of the contact hole and the etching for forming the pad opening a27B may be performed by reactive ion etching (RIE). As a result of the passivation film a9 being etched to form the pad opening a27B using the polyimide film a50 as a mask, a step is formed along a boundary surface of the resin film a50 and the passivation film a9. That is, at the boundary surface with respect to the resin film a50, the passivation film a9 is etched so that its inner diameter is made wider than the inner diameter of the resin film a50. Consequently, the resin film a50 is made to have, at a lower portion of its inner peripheral surface, a step portion a23*a* that protrudes further inward than an inner peripheral surface a27B of the passivation film a9.

Thereafter, the second external electrode a4 is grown in the pad openings a27B and a27A as the contact holes by, for example, an electroless plating method. As with the external electrode in the chip resistor a10 described with FIG. 38(B), the second external electrode a4 is preferably a multilayer laminated structure, for example, having a nickel layer a121 in contact with the lower electrode film a51, a palladium layer a122 laminated on the nickel layer a121, and a gold layer laminated on the palladium layer a122.

The second external electrode a4 is also an external connection electrode that fills the interiors of the pad openings a27B and a27A that are formed as the contact hole that increases in inner diameter toward the upper side, is close adhered to the inclining surface of the resin layer 50, and has a protruding portion a123*a*, which, in a plan view, protrudes further outward than an exposed region of the lower electrode film a51. The second external electrode a4 also has an upper surface that is convexly curved upward. Improvement of moisture resistance, improvement of strength against external pressure, can thereby be realized with the second external electrode as the external connection electrode.

Although chip resistors and chip capacitors were described above as preferred embodiments of the first reference example, the first reference example may also be applied to chip components besides chip resistors and chip capacitors. As another example of a chip component, a chip inductor may be cited. A chip inductor is a component having, for example, a multilayer wiring structure on a substrate, having inductors (coils) and wiring related thereto inside the multilayer wiring structure, and being arranged so that an arbitrary inductor in the multilayer wiring structure can be incorporated into a circuit or disconnected from the circuit by a fuse. The chip inductor can be arranged as a chip inductor (chip component) that is excellent in moisture resistance, is capable of being improved in strength against external pressure, and is easy to handle by adopting the structure of the external connection electrode according to the first reference example.

As yet another example of a chip component, a chip diode may be cited. A chip diode is a component having, for example, a multilayer wiring structure on a substrate, having a plurality of diodes and wiring related thereto inside the multilayer wiring structure, and being arranged so that an arbitrary diode in the multilayer wiring structure can be incorporated into a circuit or disconnected from the circuit by a fuse. Rectification characteristics of the chip diode can be changed and adjusted by selection of the diode to be incorporated into the circuit. Voltage drop characteristics (resistance value) of the chip diode can also be set. Further, in the case of a chip LED, with which the diode is an LED (light emitting diode), the chip LED can be arranged to enable selection of the emitted color by selection of the LED to be incorporated into the circuit. The structure of the external connection electrode according to the first reference example can also be adopted in such a chip diode or chip LED to arrange a chip diode or chip LED that is excellent in moisture resistance, is capable of being improved in strength against external pressure, and is easy to handle.

Invention According to a Second Reference Example

(1) Features of the Invention According to the Second Reference Example

For example, the features of the invention according to the second reference example are the following B1 to B13.

(B1) A chip resistor including a substrate, a resistor body film made of an aluminum-based metal and formed on the substrate, a pair of electrodes disposed across an interval on the substrate and connected to the resistor body film at different positions, and a protective film covering the resistor body film in a state of exposing the pair of electrodes.

With this arrangement, photolithography can be applied to form the resistor body film made of the aluminum-based metal into a fine pattern. The resistor body film can thus be formed inside a plurality of fine chip resistor regions set on a base substrate and the base substrate can be cut at the boundaries of the chip resistor regions to mass-produce chip resistors of minute size. However, an aluminum-based metal is low in water resistance and therefore in the second reference example, the resistor body film is covered by the protective film. A chip resistor that is compact and high in reliability can thereby be realized to contribute to the downsizing of electronic equipment, etc.

(B2) The chip resistor according to B1, where the aluminum-based metal includes one or more types of metal selected from among Al, AlSi, AlSiCu, and AlCu.

With this arrangement, the aluminum-based metal is one or more types of metal selected from among Al, AlSi, AlSiCu, and AlCu and can thus withstand heat treatment (350° C. to 450° C.) in the process of forming the protective film to enable the realization of a chip resistor of high reliability. Also, the aluminum-based metal can be processed using an existing device and the chip resistor according to the second reference example can be prepared without using new manufacturing equipment.

(B3) The chip resistor according to B1 or B2, where the protective film includes a nitride film in contact with the resistor body film and a resin film laminated on the nitride film.

With this arrangement, the protective film is at least a two-layer structure of the nitride film and the resin film, and the chip resistor can thus be improved in water resistance, scratch resistance, and strength against stress. Besides the above arrangement, the protective film can also be made a three-layer structure of nitride film/oxide film/resin film.

(B4) The chip resistor according to B3, where the resin film includes a polyimide film.

With this arrangement, the resin film includes the polyimide film, and improvement of scratch resistance and strength against stress can thus be realized reliably.

(B5) The chip resistor according to any one of B1 to B4, where the resistance value between the pair of electrodes is not more than 50 mΩ. With this arrangement, the resistance value of the resistor body film between the pair of electrodes is not more than 50 mΩ and therefore a chip resistor that can be used as a so-called jumper resistor can be realized.

(B6) The chip resistor according to any one of B1 to B5, where the outer shape in a plan view is a rectangle with the two orthogonal sides being not more than 0.4 mm and not more than 0.2 mm, respectively.

By this arrangement, a chip resistor, in particular, a jumper resistor of minute size that is capable of withstanding currents of up to a certain degree can be provided.

(B7) The chip resistor according to any one of B1 to B6, where the film thickness of the resistor body film includes a thickness of 0.5 to 3.0 μm. By this arrangement, the resistor body film of the desired resistor value can be provided on the substrate of minute size.

(B8) The chip resistor according to any one of B1 to B7, where the resistor body film includes a single film body formed across substantially the entirety of one surface of the substrate with an outer peripheral edge portion thereof being formed on the one surface across a fixed interval from an outer peripheral edge portion of a top surface of the substrate so as to be disposed further inward than the outer peripheral edge portion of the top surface of the substrate.

By this arrangement, a side surface of the resistor body film can be covered by the protective film to improve water resistance and corrosion resistance and an etching margin for separation can be secured in the process of separation into the individual chip resistors from the base substrate.

(B9) The chip resistor according to any one of B1 to B8, where the substrate includes any of silicon, glass, and ceramic.

By this arrangement, a minute chip resistor can be provided using any of various insulating substrates.

(B10) The chip resistor according to any one of B1 to B9, further including an oxide film as an insulating film formed on the top surface of the substrate and where the resistor body film is formed on the oxide film.

With this arrangement, regardless of the type of substrate, the resistor body film is insulated from the substrate by the oxide film and the etching for patterning of the resistor body film can be stopped by the oxide film to obtain a chip resistor with the desired characteristics.

(B11) A circuit assembly including a mounting substrate and the chip resistor according to any one of B1 to B10 that is mounted on the mounting substrate.

By this arrangement, a compact circuit assembly can be arranged.

(B12) The circuit assembly according to B11 where the chip resistor is mounted as a jumper resistor on the mounting substrate. By this arrangement, a compact circuit assembly can be arranged.

(B13) An electronic equipment including a housing and the circuit assembly according to B11 or 12 housed in the housing.

By this arrangement, an electronic equipment that is compact and high in performance can be provided.

(2) Preferred Embodiments of the Invention Related to the Second Reference Example Preferred embodiments of the second reference example shall now be described in detail with reference to the attached drawings. The symbols indicated in FIG. 41 to FIG. 64 are effective only for these drawings and, even if used in other preferred embodiments, do not indicate the same components as the symbols in the other preferred embodiments.

Figure 41:
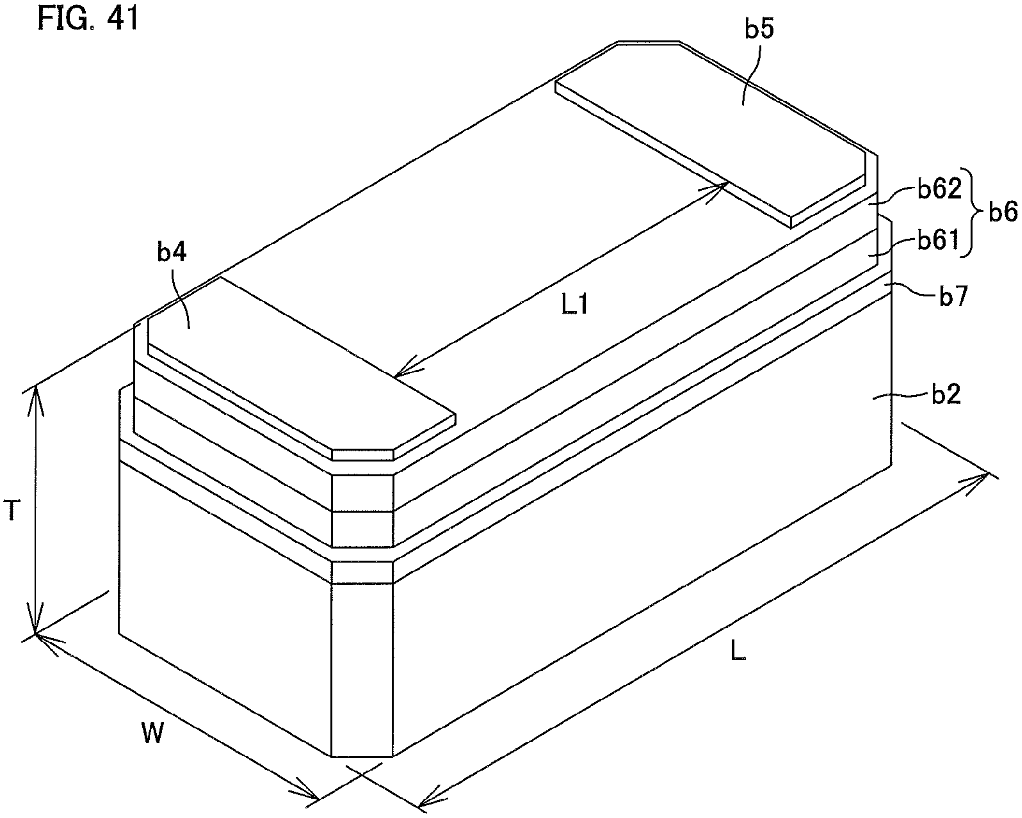
FIG. 41 is a perspective view of a chip resistor b1 according to a preferred embodiment of a second reference example.
Figure 42:
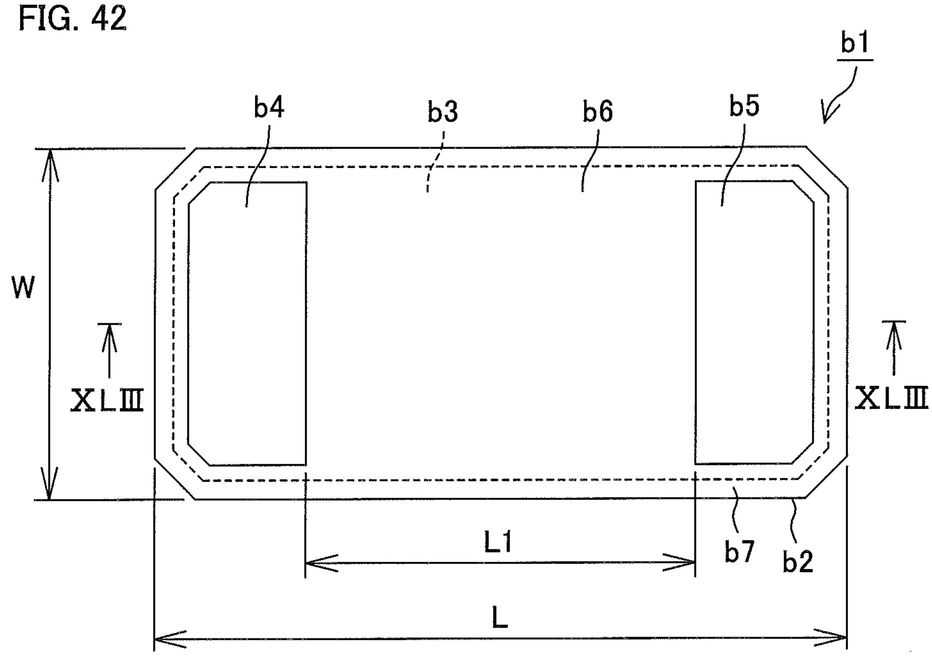
FIG. 42 is a plan view of the chip resistor b1 according to the preferred embodiment of the second reference example.
Figure 43:
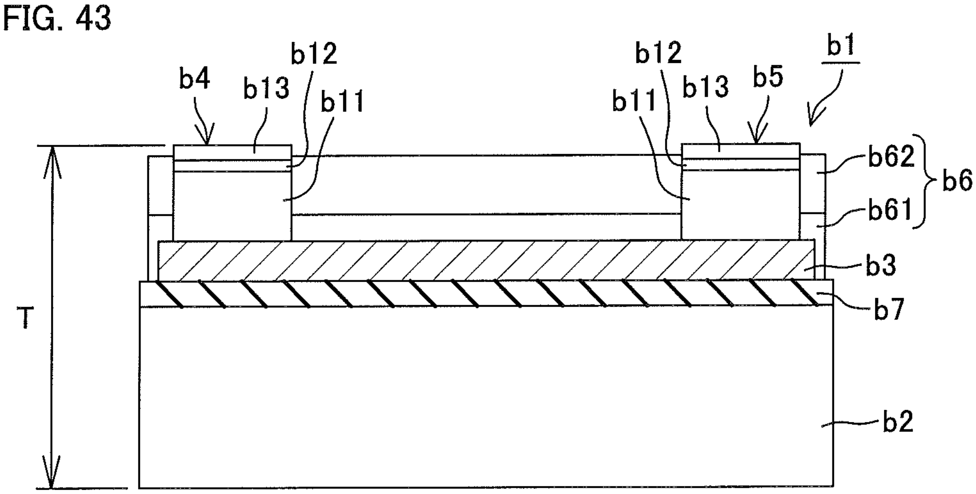
FIG. 43 is a vertical sectional view of the chip resistor b1 taken along XLIII-XLIII in FIG. 42.

FIG. 41 is a perspective view of a chip resistor b1 according to a preferred embodiment of the second reference example. FIG. 42 is a plan view of the chip resistor b1 according to the preferred embodiment of a second reference example. FIG. 43 is a vertical sectional view of the chip resistor b1 taken along XLIII-XLIII in FIG. 42. With reference to FIG. 41 to FIG. 43, the chip resistor b1 according to the preferred embodiment of the second reference example includes a substrate b2, a resistor body film b3 made of an aluminum-based metal and formed on the substrate b2, a pair of electrodes b4 and b5 disposed across an interval on the substrate b2 and electrically connected to the resistor body film, and a protective film b6 covering the resistor body film b3 in a state of exposing the pair of electrodes b4 and b5.

The substrate b2 has a rectangular parallelepiped shape with a substantially rectangular shape in a plan view and is a minute chip with, for example, the length in the long side direction being L=0.4 mm, the width in the short side direction being W=0.2 mm, and the thickness being T=0.1 to 0.15 mm, approximately. The length L and width W of the substrate b2 may be not more than the above dimensions. For example, the substrate b2 may more preferably have minute dimensions of L=0.3 mm and width W=0.15 mm, approximately.

The substrate b2 may have a corner-rounded shape with the corners being chamfered in a plan view. The substrate b2 may be formed, for example, of silicon, glass, ceramic, etc. With the preferred embodiment described below, a case where the substrate b2 is a silicon substrate shall be described as an example. The substrate b2 may be made 80 to 150 μm in thickness, and on a top surface of the substrate b2, an oxide film ($SiO_2$ film) 7 is formed as an insulating film that insulates the substrate b2 from an upper layer region. The oxide film b7 may be 0.3 to 2.5 μm in thickness.

A resistor body film b3 is laminated on the oxide film b7. The resistor body film b3 is formed of an aluminum-based metal and may be 0.5 to 3.0 μm in thickness. Also, the resistor body film b3 may have a specific resistance Rs of Rs=8 mΩ·cm to 40 mΩ·cm. The resistor body film b3 is preferably formed of one or more types of metal selected from among Al, AlSi, AlSiCu, and AlCu.

In the present preferred embodiment, the resistor body film b3 is a single film body that is formed across substantially the entirety of an upper surface of the substrate b2 via the oxide film b7. Also, an outer peripheral edge portion of the resistor body film b3 is recessed inward by a fixed dimension with respect to an outer peripheral edge portion of the substrate b2 (oxide film b7). In other words, an outline of the resistor body film b3 is made slightly smaller than the outline of the substrate b2 (oxide film b7) and the oxide film b7 is present at an outer side of the outer peripheral edge portion of the resistor body film b3 in a plan view. This is done to cover a periphery of the resistor body film b3 entirely with the protective film b6 as shall be described later.

A pair of electrodes called a first electrode b4 and a second electrode b5 are disposed above the resistor body film b3 so as to be connected to the resistor body film b3 at different positions. More specifically, the first electrode b4 is an electrode with a substantially rectangular shape in a plan view that is disposed along one short side of the substrate b2 and is long in the direction of the one short side. The second electrode b5 is an electrode with a substantially rectangular shape in a plan view that is disposed along the other short side of the substrate b2 and is long in the direction of the short side. An interval L1 between the first electrode b4 and the second electrode b5 in a plan view may be such that L1=100 to 220 μm.

Figure 62:
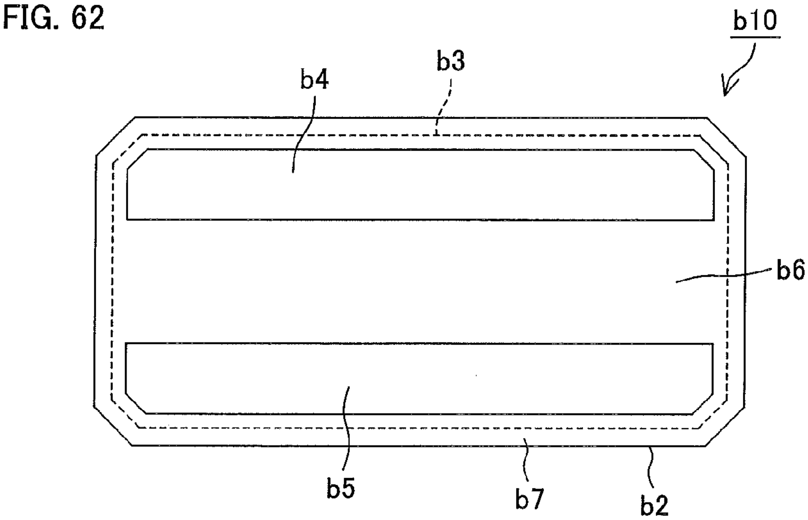
FIG. 62 is a plan view of a chip resistor of yet another preferred embodiment of the second reference example.

The electrodes b4 and b5 may be changed in arrangement position and shape as shown in FIG. 62. That is, in place of the arrangement described above, the chip resistor b10 shown in FIG. 62 has the first electrode b4 arranged as a long electrode b4 with a substantially rectangular shape in a plan view that is disposed along one long side of the substrate b2 and is long in the direction of the one long side and the second electrode b5 arranged as a long electrode b5 with a substantially rectangular shape in a plan view that is disposed along the other long side of the substrate b2 and is long in the direction of the long side. In this case, the interval between the first electrode b4 and the second electrode b5 in a plan view is shortened and the resistance value of the resistor body film b3 connecting the interval between the first electrode b4 and the second electrode b5 can thus be lowered. Also, the electrodes b4 and b5 are increased in surface contact area to provide the advantage of improvement of the mounting strength of the chip resistor.

Each of the first electrode b4 and the second electrode b5 may have a laminated structure of three types of metal, in which a nickel (Ni) layer b11, a palladium (Pd) layer b12, and a gold (Au) layer b13 are laminated successively toward the upper side from the resistor body film b3 side and in this case, for example, the Ni layer b11 may be 3 to 15 μm, the Pd layer b12 may be not more than 0.25 μm, and the Au layer b13 may be not more than 0.1 μm in thickness. By arranging the first electrode b4 and the second electrode b5 as the laminated structures described above, improvement of the strength of bonding onto a mounting substrate and improvement of corrosion resistance can be achieved when the chip resistor b1 is mounted on the substrate as a flip chip.

An upper surface and outer peripheral edges of the resistor body film b3 are covered by the protective film b6. The protective film b6 is laminated so as to cover the outer peripheral edge portion and the upper surface of the resistor body film b3 while exposing the upper surfaces of the electrodes b4 and b5 and to cover the peripheries of the electrodes b4 and b5.

In the present preferred embodiment, the protective film b6 has a two-layer structure. A protective film b6 of a lower layer that is in contact with the resistor body film b3 is formed of a nitride film b61. The nitride film b61 covers the upper surface and the outer peripheral edge portion of the resistor body film b3 entirely. The nitride film b61 may be 0.3 to 2.5 μm in thickness. A polyimide film b62 is laminated on the nitride film b61. The polyimide film b62 may be 2 to 5 μm in thickness.

Figure 60:
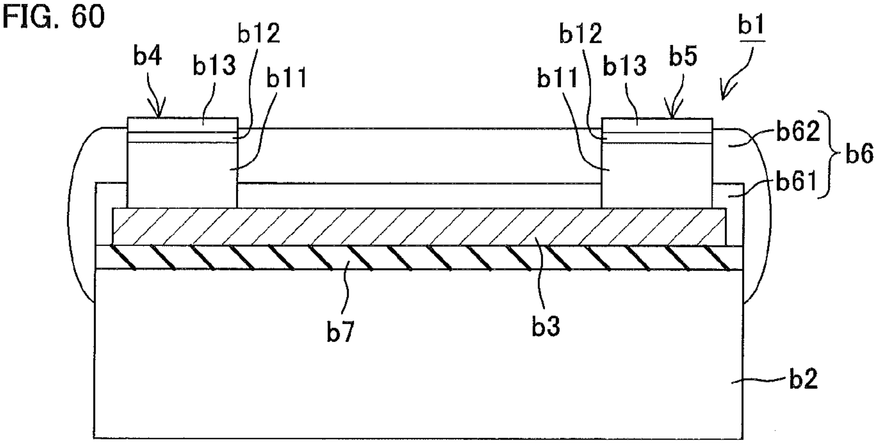
FIG. 60 is a vertical sectional view of a chip resistor of another preferred embodiment of the second reference example.

Also in the present preferred embodiment, the polyimide film b62 is laminated on the upper surface of the nitride film b61 and does not cover outer peripheral edges of the nitride film b61, that is, does not cover the outer peripheral edge portion of the resistor body film b3. However, in place of this arrangement, the polyimide film b62 may be provided so that the polyimide film b62 covers the outer peripheral edge portion of the resistor body film b3 as shown in FIG. 60. With the protective film b6 that is arranged to have the two-layer structure of the nitride film b61 and the polyimide film b62, the nitride film b61 is high in water resistance and provides the advantage that the resistor body film b3 can be protected satisfactorily from degradation due to water. Also, the polyimide film b62 is high in scratch resistance and strength against stress and therefore enables the chip resistor b1 to be made excellent in resistance against physical flawing from the upper surface side of the substrate b2.

Figure 44:
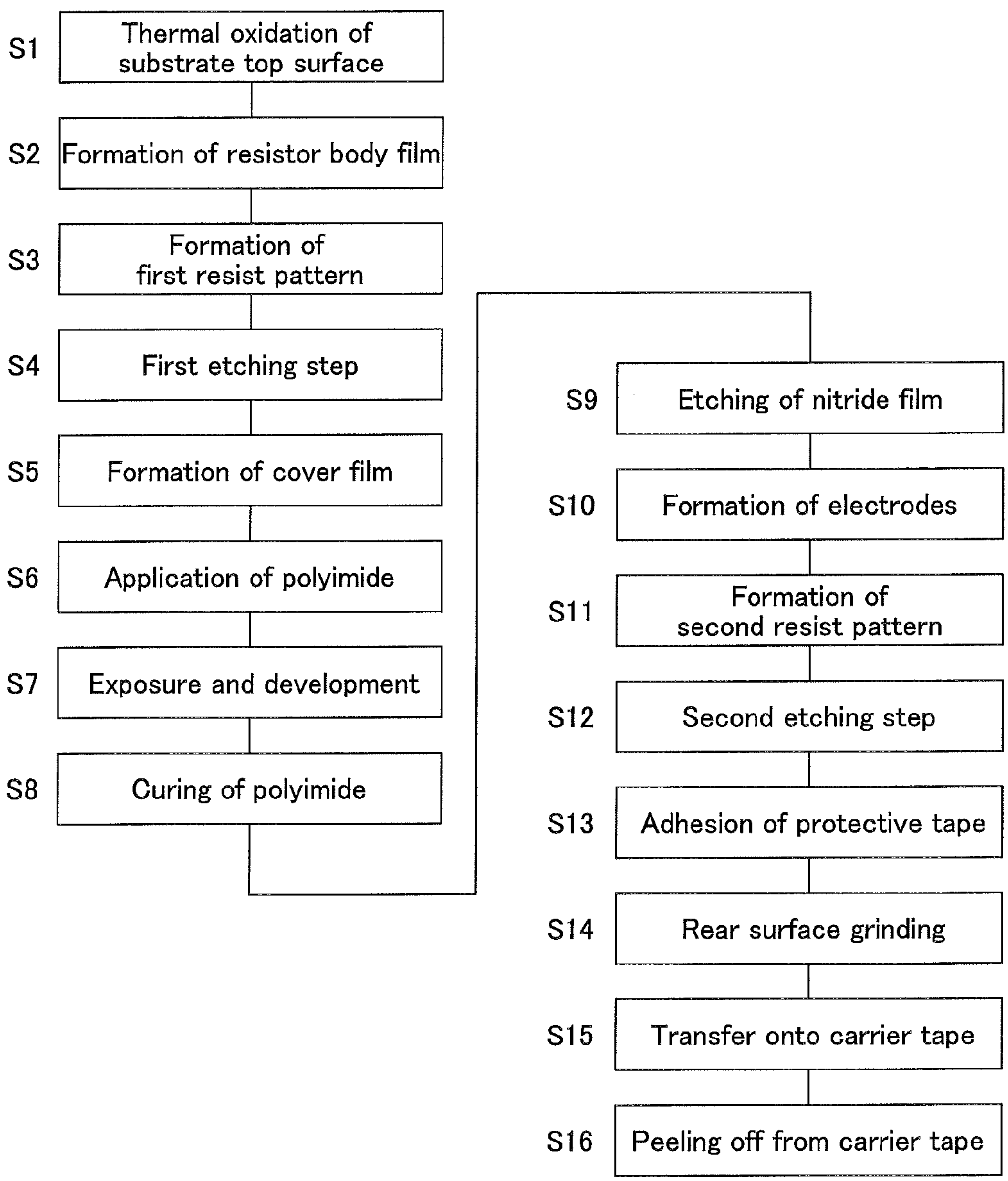
FIG. 44 is a flow diagram of an example of a process for manufacturing the chip resistor b1.

The chip resistor b1 according to the present preferred embodiment has a resistance value between the electrodes b4 and b5 of not more than 50 mΩ upon being mounted as a flip chip onto a substrate and can be used as a so-called jumper resistor. FIG. 44 is a flow diagram of an example of a process for manufacturing the chip resistor b1. Also, each of FIG. 45 to FIG. 56 is a vertical sectional view of a step of the process for manufacturing the chip resistor b1. A method for manufacturing the chip resistor b1 shall now be described in detail in accordance with the manufacturing process of the flow diagram and with reference to FIGS. 45 to 56.

Figure 45:
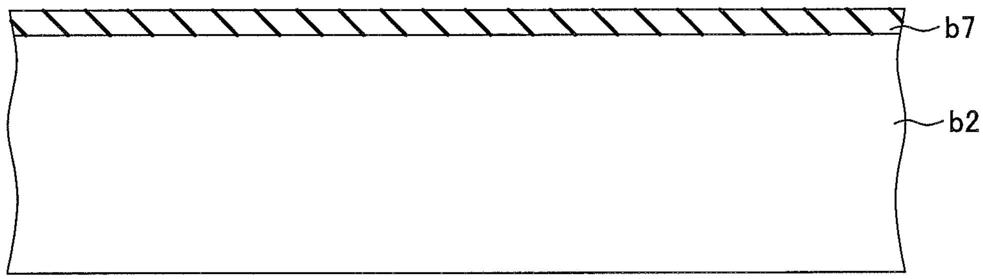
FIG. 45 is a vertical sectional view of a step of the process for manufacturing the chip resistor b1.
Figure 46:
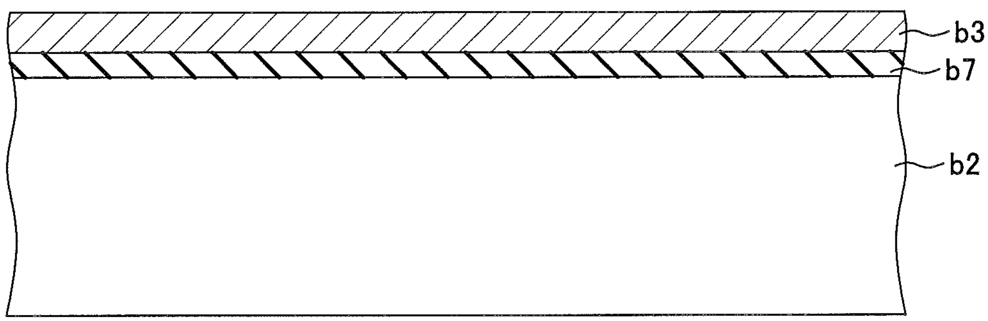
FIG. 46 is a vertical sectional view of a step of the process for manufacturing the chip resistor b1.

Step S1: First, the substrate b2 (to be more specific, the base substrate before the separation of the chip resistors b1 into individual pieces) is placed in a predetermined processing chamber and a silicon dioxide ($SiO_2$) layer is formed as the oxide film b7 on the top surface, for example, by a thermal oxidation method (FIG. 45). Step S2: Thereafter, a sputtering method, for example, is used to laminatingly form the resistor body film b3 from an aluminum-based metal, preferably one or more types of aluminum-based metal material selected from among Al, AlSi, AlSiCu, and AlCu, on an entire top surface of the oxide film b7. As mentioned above, the film thickness of the resistor body film b3 that is laminatingly formed may be approximately 0.5 to 3.0 μm (FIG. 46).

Figure 47:
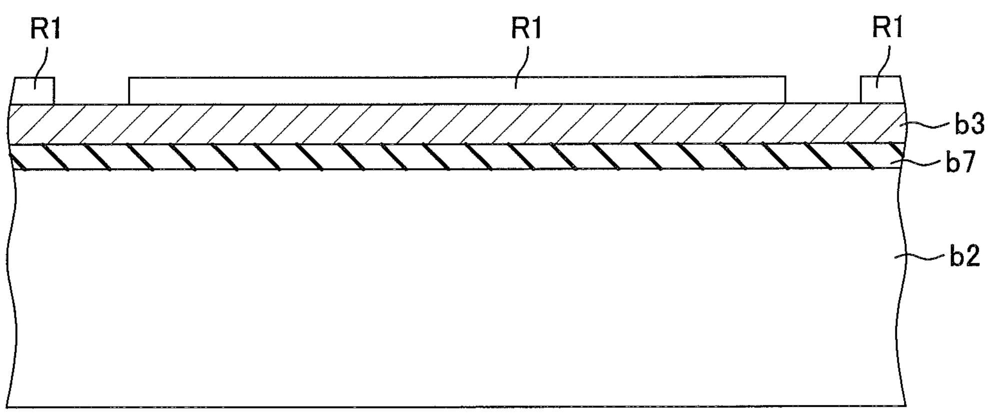
FIG. 47 is a vertical sectional view of a step of the process for manufacturing the chip resistor b1.

Step S3: Thereafter, a photolithography process is used to form a resist pattern R1 on a top surface of the resistor body film b3 (formation of the first resist pattern). The resist pattern R1 is arranged as a pattern that covers substantially the entire upper surface of the resistor body film b3 (the entirety besides the outer peripheral edge portion of the resistor body film b3) so as to remove the resistor body film b3 laminated on the outer peripheral edge portion of the oxide film b7 (FIG. 47).

Figure 48:
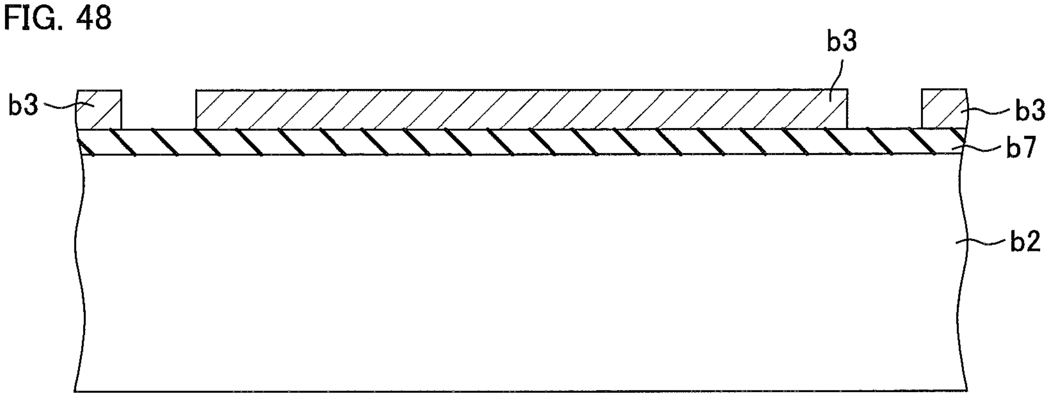
FIG. 48 is a vertical sectional view of a step of the process for manufacturing the chip resistor b1.

Step S4: A first etching step is then performed. That is, the outer peripheral edge portion of the resistor body film b3 is etched, for example, by reactive ion etching (RIE) using the first resist pattern formed in step S3 as the mask. The first resist pattern is then peeled off after etching. The etching of the outer peripheral edge portion of the resistor body film b3 may be performed by wet etching instead of RIE (FIG. 48).

Figure 49:
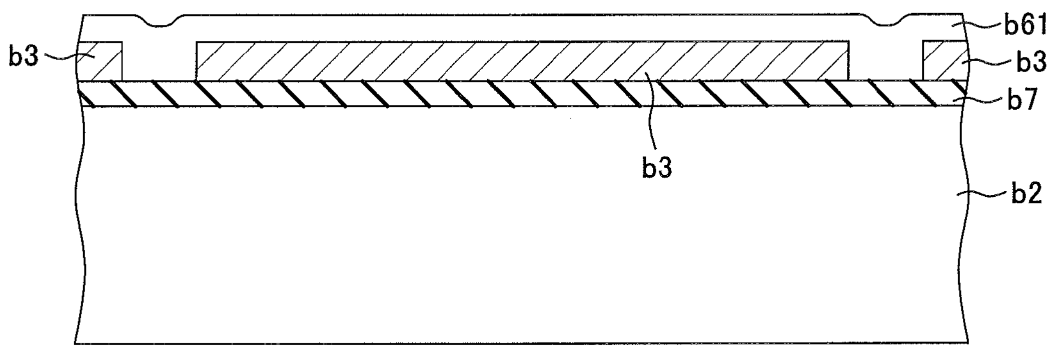
FIG. 49 is a vertical sectional view of a step of the process for manufacturing the chip resistor b1.
Figure 50:
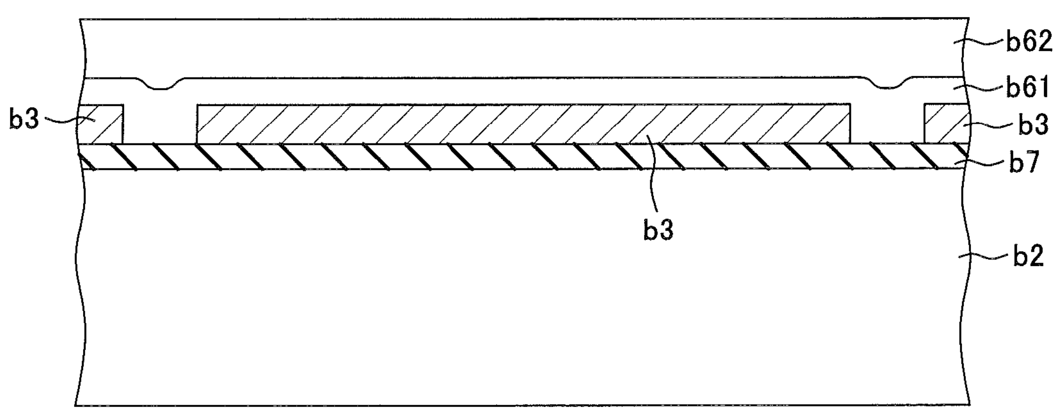
FIG. 50 is a vertical sectional view of a step of the process for manufacturing the chip resistor b1.

Step S5: Thereafter, for example, the nitride film (SiN film) b61 is formed so as to cover the entire top surface and the outer peripheral edge portion of the resistor body film b3 formed on the substrate b2. The nitride film b61 may be formed by a plasma CVD method and, for example, a nitride film with a film thickness of 0.3 to 2.5 μm may be formed (FIG. 49). Step S6: Thereafter, the resin film b62 is coated on an entire top surface of the nitride film b61. For example, a photosensitive polyimide is used as the resin film b62 (FIG. 50).

Figure 51:
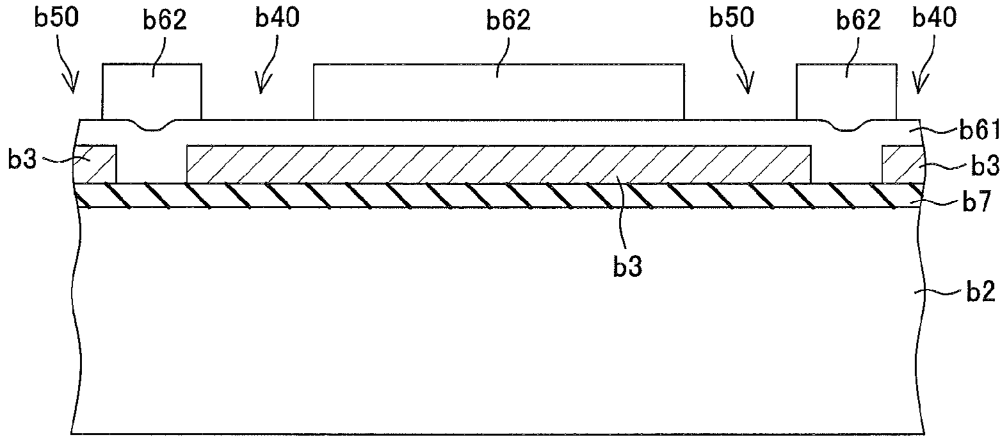
FIG. 51 is a vertical sectional view of a step of the process for manufacturing the chip resistor b1.

Before the coating of the resin film b62 in step S6, an oxide film may be formed so as to cover the top surface of the nitride film b61 and the resin film may be coated onto the oxide film. Step S7: Patterning of the resin film (polyimide film) b62 by photolithography is performed by performing exposure followed by a developing step on regions of the resin film b62 corresponding to openings for the first and second electrodes b4 and b5. Pad openings b40 and b50 for the first and second electrodes b4 and b5 are thereby formed in the resin film b62 (FIG. 51).

Figure 52:
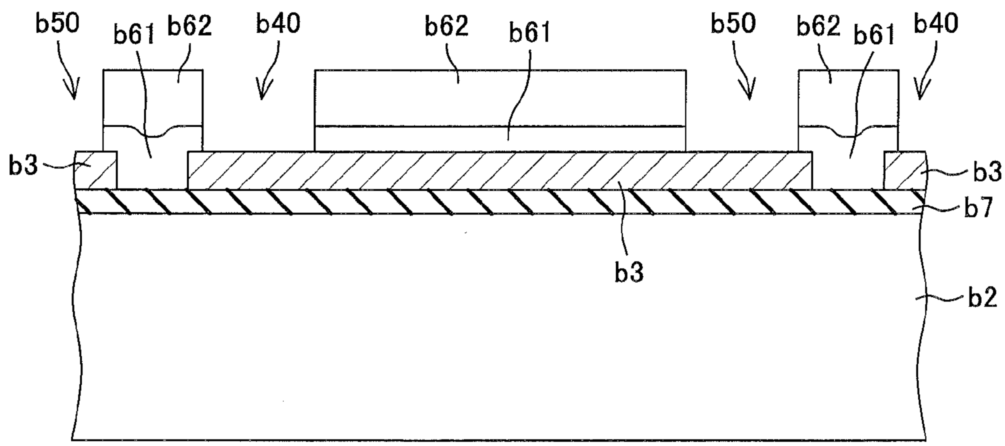
FIG. 52 is a vertical sectional view of a step of the process for manufacturing the chip resistor b1.

Step S8: Thereafter, heat treatment (polyimide curing) for hardening the resin film b62 is performed and the polyimide film b62 is stabilized by the heat treatment. The heat treatment may, for example, be performed at a temperature of approximately 170° C. to 700° C. A merit that the characteristics of the resistor body film b3 are stabilized is also provided as a result. Step S9: Thereafter, the nitride film b61 is etched using the polyimide film b62, having the penetrating holes b40 and b50 at positions at which the first electrode b4 and the second electrode b5 are to be formed, as a mask. The pad openings b40 and b50 that expose the resistor body film b3 in a region of the first electrode b4 and a region of the second electrode b5 are thereby formed. The etching of the nitride film b61 may be performed by reactive ion etching (RIE) (FIG. 52).

Figure 53:
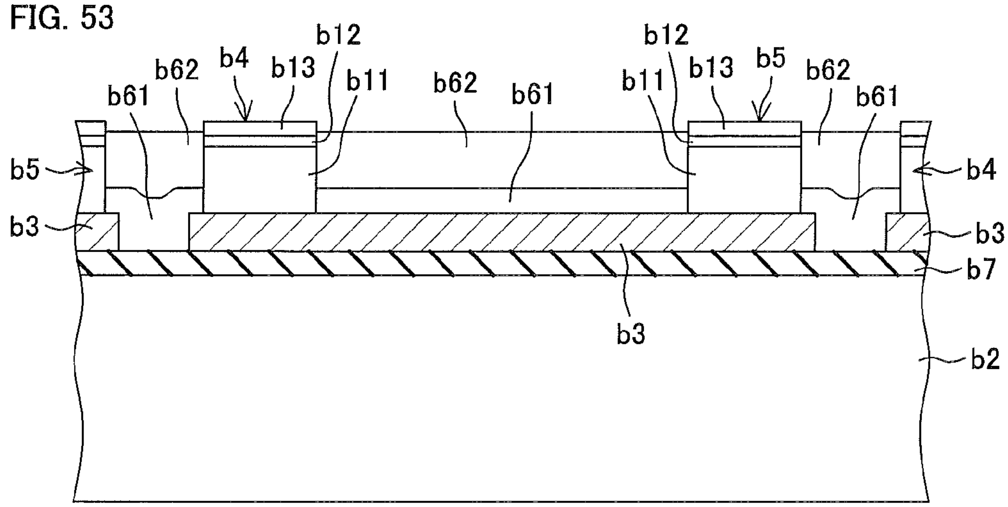
FIG. 53 is a vertical sectional view of a step of the process for manufacturing the chip resistor b1.

Step S10: The pair of electrodes that are the first electrode b4 and the second electrode b5 are grown inside the two pad openings, for example, by an electroless plating method. Each of the first electrode b4 and the second electrode b5 is preferably formed by forming a lower principal portion from nickel and thinly laminating palladium and gold as top surface layers on a topmost surface portion of the lower principal portion. This is because, by providing the electrodes b4 and b5 with this arrangement, the chip resistor b1 can be improved in strength of bonding to a substrate and improved in corrosion resistance (FIG. 53).

Step S11: Thereafter, a second resist pattern is formed by photolithography for separation of the numerous (for example, 500 thousand) respective chip resistors b1, formed in an array on the substrate top surface (top surface of the base substrate), into the individual chip resistors b1. The resist film is provided on the base substrate top surface to protect the respective chip resistors b1 and is formed so that intervals between the respective chip resistors b1 will be etched.

Figure 54:
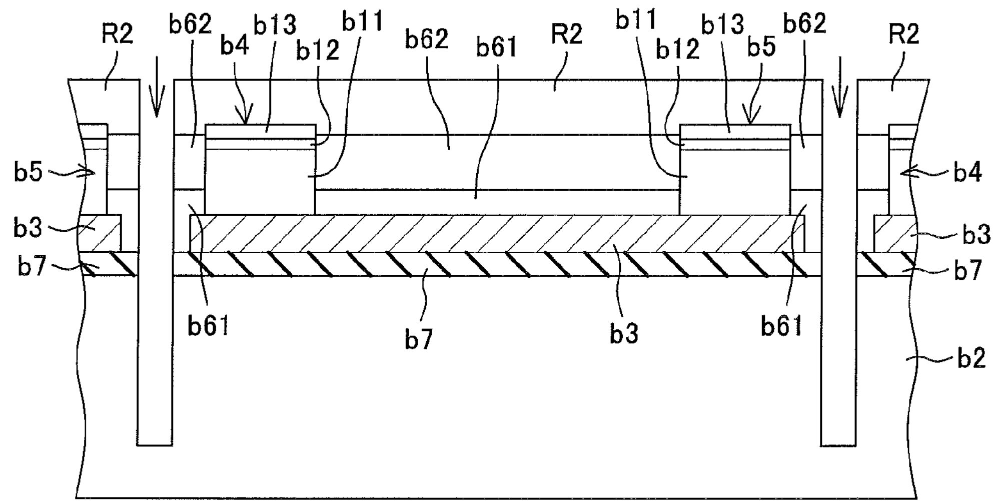
FIG. 54 is a vertical sectional view of a step of the process for manufacturing the chip resistor b1.
Figure 55:
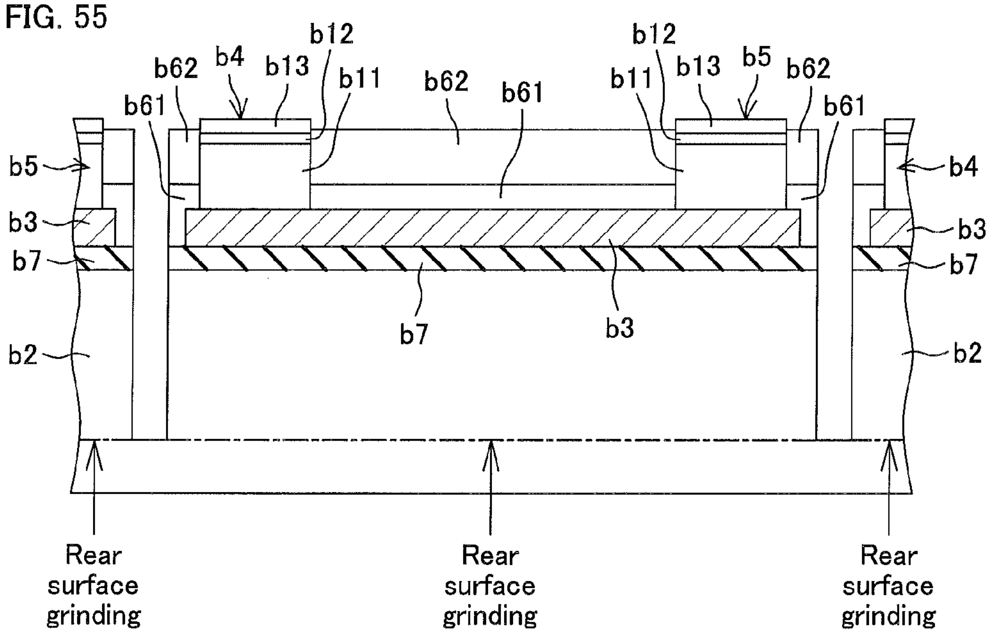
FIG. 55 is a vertical sectional view of a step of the process for manufacturing the chip resistor b1.
Figure 56:
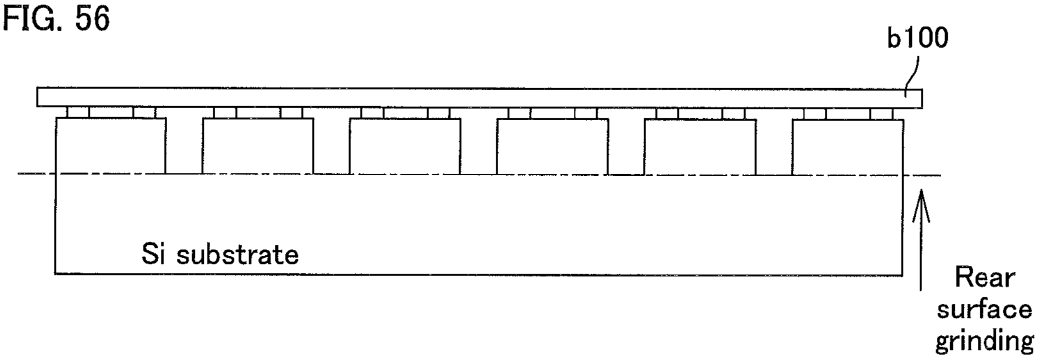
FIG. 56 is an illustrative diagram of an example of a processing step for separating individual chip resistors from a substrate.

Step S12: Plasma dicing is then executed. The plasma dicing is the etching using the second resist pattern R2 as a mask and a groove of a predetermined depth from the top surface of the base substrate b2 is formed between the respective chip resistors b1. Thereafter, the resist film is peeled off (FIGS. 54 and 55). Step S13: Then as shown in FIG. 56, a protective tape b100 is adhered onto the top surface.

Figure 57:
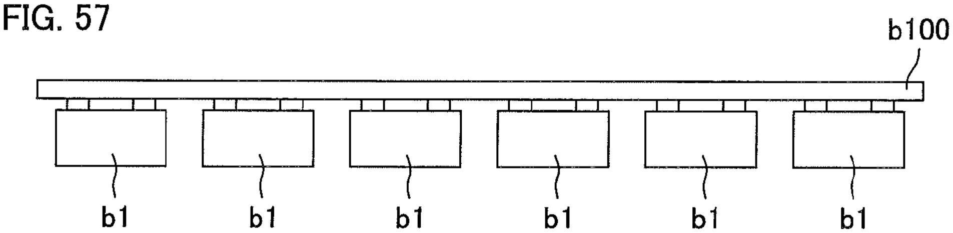
FIG. 57 is an illustrative diagram of an example of a processing step for separating individual chip resistors from a substrate.
Figure 58:
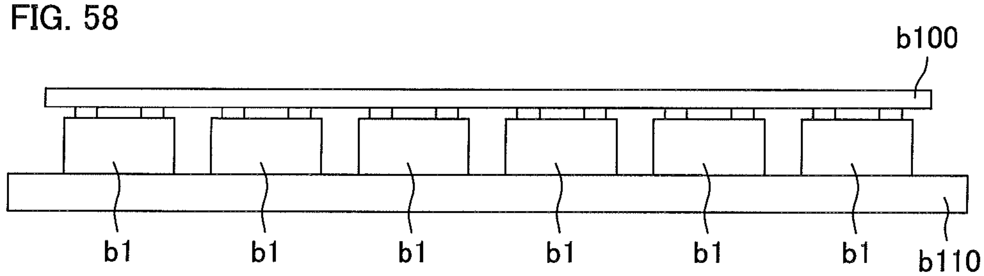
FIG. 58 is an illustrative diagram of an example of a processing step for separating individual chip resistors from a substrate.
Figure 59:
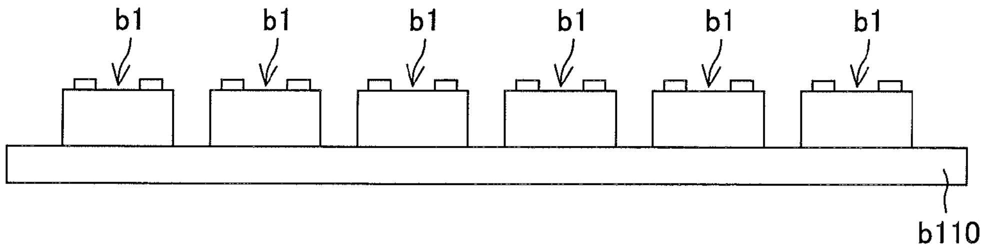
FIG. 59 is an illustrative diagram of an example of a processing step for separating individual chip resistors from a substrate.

Step S14: Thereafter, rear surface grinding of the base substrate b2 is performed to separate the chip resistors b1 into the individual chip resistors b1 (FIGS. 55, 56, and 57). Step S15: Then as shown in FIG. 58, a carrier tape (thermally foaming sheet) b110 is adhered onto the rear surface side, and the numerous chip resistors b1 that have been separated into the individual chip resistors b1 are held in a state of being arrayed on the carrier tape b110. On the other hand, the protective tape b100 adhered to the top surface is removed (FIGS. 58 and 59).

Figure 61:
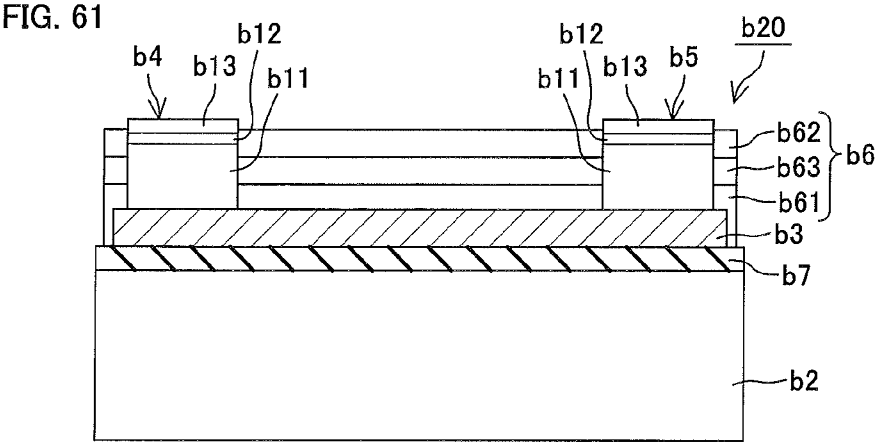
FIG. 61 is a vertical sectional view of a chip resistor of yet another preferred embodiment of the second reference example.

Step S16: When the thermally foaming sheet b110 is heated, thermally foaming particles b101 contained in the interior swell and the respective chip resistors b1 adhered to the carrier tape b110 surface are thereby peeled off from the carrier tape b110 and separated into individual chips. FIG. 61 is a vertical sectional view of a chip resistor of another preferred embodiment of the second reference example. With the chip resistor b1 shown in FIG. 61, the protective film b6 has a three-layer arrangement of the nitride film b61, an oxide film b63, and the resin film (for example, polyimide film) b62. The other arrangements are the same as the arrangements of the chip resistor b1 described above.

Figure 63:
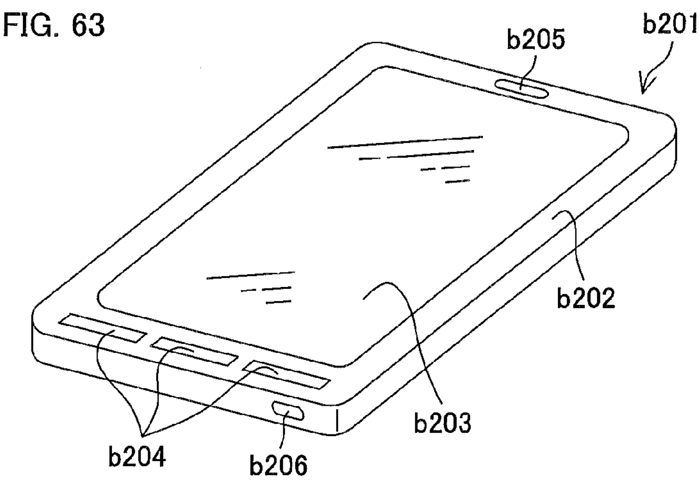
FIG. 63 is a perspective view of the outer appearance of a smartphone that is an example of an electronic equipment in which chip resistors according to the second reference example are used.

FIG. 63 is a perspective view of the outer appearance of a smartphone that is an example of an electronic equipment in which chip resistors according to the second reference example are used. The smartphone b201 is arranged by housing electronic parts in the interior of a housing b202 with a flat rectangular parallelepiped shape. The housing b202 has a pair of rectangular principal surfaces at its front side and rear side, and the pair of principal surfaces are joined by four side surfaces. A display surface of a display panel b203, constituted of a liquid crystal panel or an organic EL panel, etc., is exposed at one of the principal surfaces of the housing b202. The display surface of the display panel b203 constitutes a touch panel and provides an input interface for a user.

The display panel b203 is formed to a rectangular shape that occupies most of one of the principal surfaces of the housing b202. Operation buttons b204 are disposed along one short side of the display panel b203. In the present preferred embodiment, a plurality (three) of the operation buttons b204 are aligned along the short side of the display panel b203. The user can call and execute necessary functions by performing operations of the smartphone b210 by operating the operation buttons b204 and the touch panel.

A speaker b205 is disposed in a vicinity of the other short side of the display panel b203. The speaker b205 provides an earpiece for a telephone function and is also used as an acoustic conversion unit for reproducing music data, etc. On the other hand, close to the operation buttons b204, a microphone b206 is disposed at one of the side surfaces of the housing b202. The microphone b206 provides a mouthpiece for the telephone function and may also be used as a microphone for sound recording.

Figure 64:
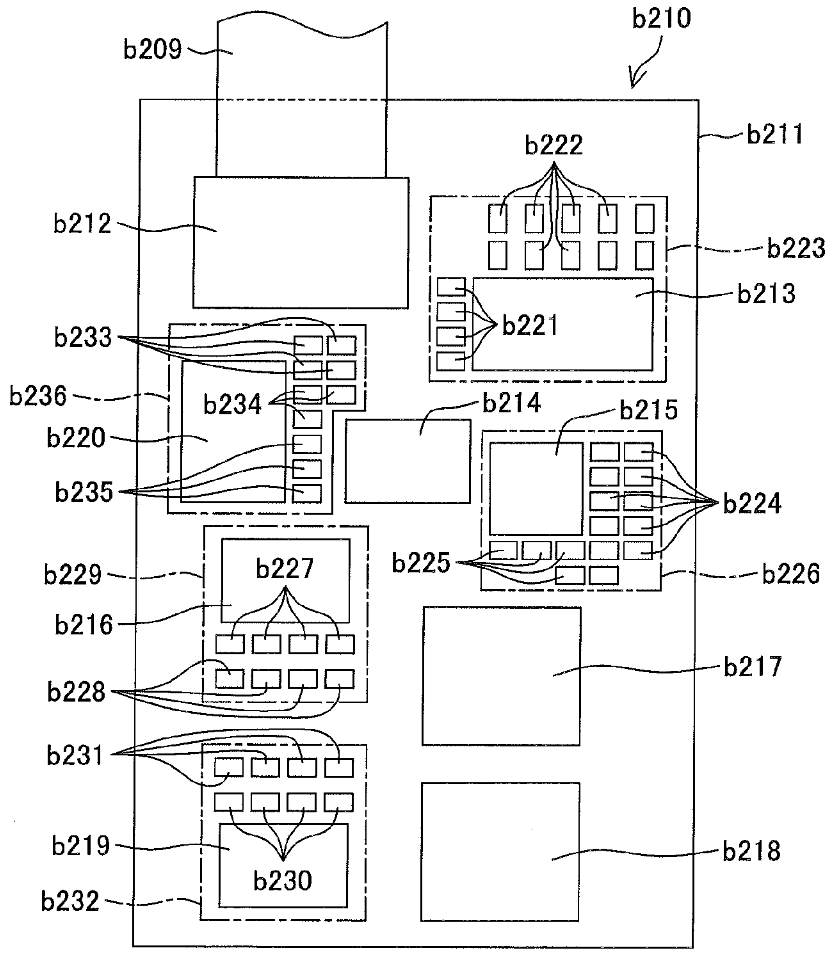
FIG. 64 is an illustrative plan view of the arrangement of an electronic circuit assembly b210 housed in a housing b202.
Figure 65:
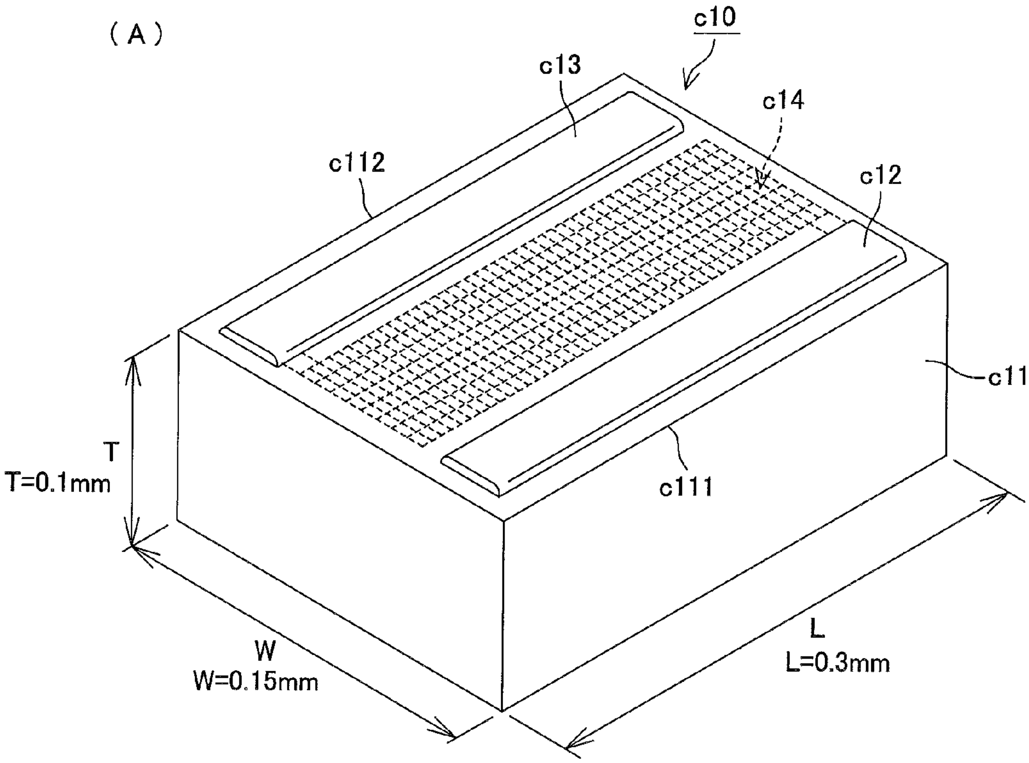
FIG. 65(A) is an illustrative perspective view of the external arrangement of a chip resistor c10 according to a preferred embodiment of a third reference example and FIG. 65(B) is side view of a state where the chip resistor c10 is mounted on a substrate.
Figure 65:
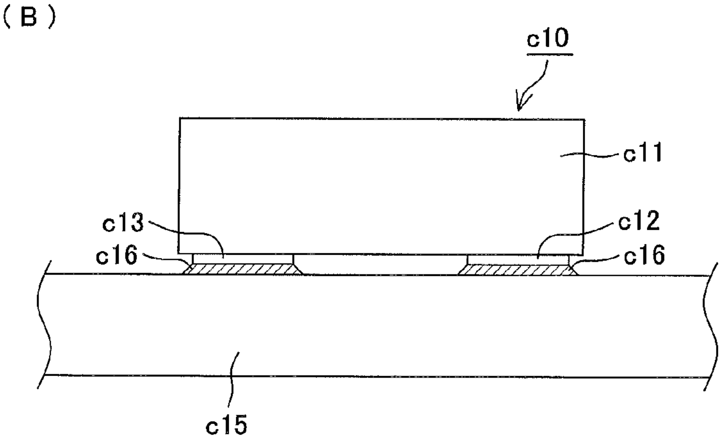

FIG. 64 is an illustrative plan view of the arrangement of an electronic circuit assembly b210 housed in the interior of the housing b202. The electronic circuit assembly b210 includes a wiring substrate b211 and circuit parts mounted on a mounting surface of the wiring substrate b211. The plurality of circuit parts include a plurality of integrated circuit elements (ICs) b212 to b220 and a plurality of chip components. The plurality of ICs include a transmission processing IC b212, a one-segment TV receiving IC b213, a GPS receiving IC b214, an FM tuner IC b215, a power supply IC b216, a flash memory b217, a microcomputer b218, a power supply IC b219, and a baseband IC b220. The plurality of chip components include chip inductors b221, b225, and b235, chip resistors b222, b224, and b233, chip capacitors b227, b230, and b234, and chip diodes b228 and b231. As the chip components, those with the arrangement according to the second reference example may be used.

The transmission processing IC b212 has incorporated therein an electronic circuit arranged to generate display control signals for the display panel b203 and receive input signals from the touch panel on a top surface of the display panel b203. For connection with the display panel b203, the transmission processing IC b212 is connected to a flexible wiring b209.

The one-segment TV receiving IC b213 incorporates an electronic circuit that constitutes a receiver for receiving one-segment broadcast (terrestrial digital television broadcast targeted for reception by portable equipment) radio waves. A plurality of the chip inductors b221 and a plurality of the chip resistors b222 are disposed in a vicinity of the one-segment TV receiving IC b213. The one-segment TV receiving IC b213, the chip inductors b221, and the chip resistors b222 constitute a one-segment broadcast receiving circuit b223. The chip inductors b221 and the chip resistors b222 respectively have accurately adjusted inductances and resistances and provide circuit constants of high precision to the one-segment broadcast receiving circuit b223.

The GPS receiving IC b214 incorporates an electronic circuit that receives radio waves from GPS satellites and outputs positional information of the smartphone b201. The FM tuner IC b215 constitutes, together with a plurality of the chip resistors b224 and a plurality of the chip inductors b225 mounted on the wiring substrate b211 in a vicinity thereof, an FM broadcast receiving circuit b226. The chip resistors b224 and the chip inductors b225 respectively have accurately adjusted resistances and inductances and provide circuit constants of high precision to the FM broadcast receiving circuit b226.

A plurality of the chip capacitors b227 and a plurality of the chip diodes b228 are mounted on the mounting surface of the wiring substrate b211 in a vicinity of the power supply IC b216. Together with the chip capacitors b227 and the chip diodes b228, the power supply IC b216 constitutes a power supply circuit b229. The flash memory b217 is a storage device for recording operating system programs, data generated in the interior of the smartphone b201, and data and programs acquired from the exterior by communication functions, etc.

The microcomputer b218 is a computing processing circuit that incorporates a CPU, a ROM, and a RAM and realizes a plurality of functions of the smartphone b201 by executing various computational processes. More specifically, computational processes for image processing and various application programs are realized by actions of the microcomputer b218. A plurality of the chip capacitors b230 and a plurality of the chip diodes b231 are mounted on the mounting surface of the wiring substrate b211 in a vicinity of the power supply IC b219. Together with the chip capacitors b230 and the chip diodes b231, the power supply IC b219 constitutes a power supply circuit b232.

A plurality of the chip resistors b233, a plurality of the chip capacitors b234, and a plurality of the chip inductors b235 are mounted on the mounting surface of the wiring substrate b211 in a vicinity of the baseband IC b220. Together with the chip resistors b233, the chip capacitors b234, and the chip inductors b235, the baseband IC b220 constitutes a baseband communication circuit b236. The baseband communication circuit b236 provides communication functions for telephone communication and data communication.

With the above arrangement, electric power that is appropriately adjusted by the power supply circuits b229 and b232 is supplied to the transmission processing IC b212, the GPS receiving IC b214, the one-segment broadcast receiving circuit b223, the FM broadcast receiving circuit b226, the baseband communication circuit b236, the flash memory b217, and the microcomputer b218. The microcomputer b218 performs computational processes in response to input signals input via the transmission processing IC b212 and makes the display control signals be output from the transmission processing IC b212 to the display panel b203 to make the display panel b203 perform various displays.

When receiving of a one-segment broadcast is commanded by operation of the touch panel or the operation buttons b204, the one-segment broadcast is received by actions of the one-segment broadcast receiving circuit b223. Computational processes for outputting the received images to the display panel b203 and making the received audio signals be acoustically converted by the speaker b205 are executed by the microcomputer b218. Also, when positional information of the smartphone b201 is required, the microcomputer b218 acquires the positional information output by the GPS receiving IC b214 and executes computational processes using the positional information.

Further, when an FM broadcast receiving command is input by operation of the touch panel or the operation buttons b204, the microcomputer b218 starts up the FM broadcast receiving circuit b226 and executes computational processes for outputting the received audio signals from the speaker b205. The flash memory b217 is used for storing data acquired by communication and storing data prepared by computations by the microcomputer b218 and inputs from the touch panel. The microcomputer b218 writes data into the flash memory b217 or reads data from the flash memory b217 as necessary.

The telephone communication or data communication functions are realized by the baseband communication circuit b236. The microcomputer b218 controls the baseband communication circuit b236 to perform processes for sending and receiving audio signals or data.

Invention According to a Third Reference Example

(1) Features of the Invention According to the Third Reference Example

For example, the features of the invention according to the third reference example are the following C1 to C15.

(C1) A chip resistor including a rectangular substrate having a pair of mutually facing long sides and a pair of mutually facing short sides, a pair of electrodes respectively disposed on the substrate and along the pair of long sides, a plurality of resistor bodies formed between the pair of electrodes and each having a resistor body film formed on the substrate and a wiring film laminated in contact with the resistor body film, and a plurality of disconnectable fuses formed between the pair of electrodes and respectively connecting the plurality of resistor bodies.

By this arrangement, the electrode area can be made large to improve the heat dissipation efficiency even when the size is small. That is, even when the size is small, an accurate resistance value can be realized and variation of the resistance value due to temperature characteristics of the resistor bodies can be suppressed because the heat dissipation efficiency is high. A chip resistor of accurate resistance value and small size can thus be realized. With a conventional structure, a chip resistor that is made compact becomes high in temperature, may thus be subject to severe temperature cycling, and may thus be poor in temperature cycling characteristics. Further, by the chip resistor becoming high in temperature, solder between the chip resistor and the mounting wiring substrate may melt and the reliability of solder bonding may thus degrade. All of these problems are resolved by the third reference example.

(C2) The chip resistor according to C1, where the pair of electrodes are respectively formed along the pair of long sides and across the entire lengths of the long sides.

With this arrangement, the pair of electrodes are formed along the long direction of the substrate and moreover each electrode extends across the entire length of the substrate so that the electrode area can be increased to further improve the heat dissipation characteristics.

(C3) The chip resistor according to C1 or C2, where the length of the long side is not more than 0.4 mm and the length of the short side is not more than 0.2 mm.

By this arrangement, large electrodes can be formed in a compact chip resistor, thereby enabling the realization of a chip resistor of accurate resistance value and small size.

(C4) The chip resistor according to any one of C1 to C3, where the resistance value between the pair of electrodes is 20 mΩ to 100Ω. By this arrangement, improvement of characteristics can be realized, especially in a chip resistor of low resistance.

(C5) The chip resistor according to any one of C1 to C4, where, on the substrate, a first connection electrode among the pair of electrodes is a rectangular electrode that is disposed along one long side of the substrate and is long in the direction of the long side, and a second connection electrode is a rectangular electrode that is disposed along the other long side of the substrate and is long in the direction of the long side.

By this arrangement, the electrode area can be increased to improve the heat dissipation efficiency.

(C6) The chip resistor according to any one of C1 to C5, where the pair of connection electrodes are formed along the pair of long sides of the substrate and a resistor network is disposed in a central region sandwiched by a first connection electrode c12 and a second connection electrode c13 on the substrate. With this arrangement, the heat dissipation is good and variation of the resistance value due to the temperature characteristics of the resistor bodies can thus be suppressed.

(C7) A chip component including a rectangular substrate having a pair of mutually facing long sides and a pair of mutually facing short sides, a pair of electrodes respectively disposed on the substrate and along the pair of long sides, a plurality of functional elements each having a wiring film formed on the substrate, and a plurality of disconnectable fuses having wiring firms integral to the wiring films of the plurality of functional elements and respectively connecting the plurality of functional elements to the electrodes.

By this arrangement, the electrode area can be made large to improve the heat dissipation efficiency even when the size is small. That is, even when the size is small, variation of performance due to temperature characteristics of the functional elements can be suppressed because the heat dissipation efficiency is high. A chip component of accurate characteristics and small size can thus be realized.

(C8) The chip component according to C7, where the functional elements include a resistor body, having a resistor body film formed on the substrate and a wiring film laminated in contact with the resistor body film, and the chip component is a chip resistor.

By this arrangement, a chip resistor providing the above actions and effects can be arranged.

(C9) The chip component according to C7, where the functional elements include a capacitor element, having a capacitance film formed on the substrate and a system wiring film connected to the capacitance film, and the chip component is a chip capacitor. By this arrangement, a chip capacitor providing the above actions and effects can be arranged.

(C10) The chip component according to C7, where the functional elements include a coil element, having a coil forming film formed on the substrate and a wiring film connected to the coil forming film, and the chip component is a chip inductor.

By this arrangement, a chip inductor providing the above actions and effects can be arranged.

(C11) The chip component according to C7, where the functional elements include a unidirectionally conductive element, having a junction structure portion formed on the substrate and a wiring film connected to the junction structure portion, and the chip component is a chip diode. By this arrangement, a chip diode providing the above actions and effects can be arranged.

(C12) The chip component according to any one of C7 to C11, further including an electrode pad arranged from a wiring film that is integral to the wiring films of the fuses and where the electrode is in contact with the electrode pad.

By this arrangement, the electrode can be installed easily and the chip component can be arranged as one having the electrode disposed accurately on a fine substrate.

(C13) The chip component according to any one of C7 to C12, where at least one of the fuses is cut and further including a protective film with an insulating property that is formed on the substrate so as to cover a cut portion of the fuse.

With this arrangement, the cut fuse is covered by the protective film with the insulating property and the chip component can thus be arranged as one that is improved in water resistance.

(C14) The chip component according to any one of C7 to C13, where the pair of electrodes are respectively formed along the pair of long sides and across the entire lengths of the long sides. By this arrangement, the functional element layout and the fuse layout can be prepared accurately with an extremely fine pattern, thereby enabling a chip component with stable characteristic values to be prepared. Also, chip components that can accommodate various types of characteristic values with the same design can be manufactured.

(C15) The chip component according to any one of C7 to C14, where the length of the long side is not more than 0.4 mm and the length of the short side is not more than 0.2 mm.

With this arrangement, the layout position of the electrodes is determined by the patterning of the electrode pad, and a chip component that is compact and yet accurate in the layout position of the electrode and easy to mount can be manufactured.

(2) Preferred Embodiments of the Invention Related to the Third Reference Example Preferred embodiments of the third reference example shall now be described in detail with reference to the attached drawings. With the following preferred embodiments, chip resistors shall be used and described specifically as an example of chip components. The symbols indicated in FIG. 65 to FIG. 84 are effective only for these drawings and, even if used in other preferred embodiments, do not indicate the same components as the symbols in the other preferred embodiments.

FIG. 65(A) is an illustrative perspective view of the external arrangement of a chip resistor c10 according to a preferred embodiment of the third reference example and FIG. 65(B) is a side view of a state where the chip resistor c10 is mounted on a substrate. With reference to FIG. 65(A), the chip resistor c10 according to the preferred embodiment of the third reference example includes a first connection electrode c12, a second connection electrode c13, and a resistor network c14 that are formed on a substrate c11. The substrate c11 has a rectangular parallelepiped shape with a substantially rectangular shape in a plan view and is a minute chip with, for example, the length in the long side direction being L=0.3 mm, the width in the short side direction being W=0.15 mm, and the thickness being T=0.1 mm, approximately. The substrate c11 may have a corner-rounded shape with the corners being chamfered in a plan view. The substrate may be formed, for example, of silicon, glass, ceramic, etc. With the preferred embodiment described below, a case where the substrate c11 is a silicon substrate shall be described as an example.

Figure 82:
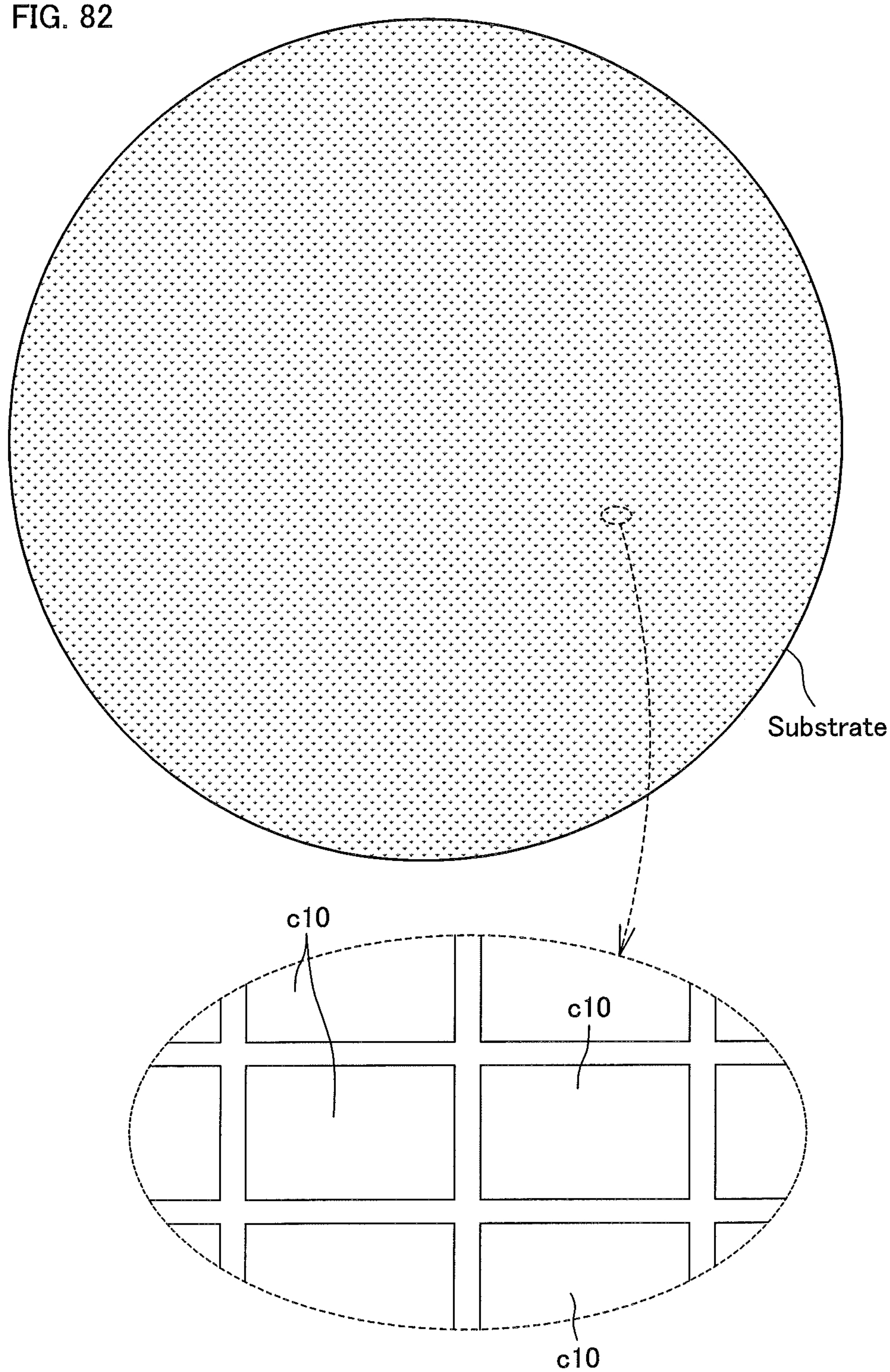
FIG. 82 is an illustrative view for describing that chip resistors are cut out from the substrate.

The chip resistor c10 is obtained by forming multiple chip resistors c10 in a lattice on a substrate as shown in FIG. 82 and cutting the substrate to achieve separation into individual chip resistors c10. On the substrate c11, the first connection electrode c12 is a rectangular electrode that is disposed along one long side c111 of the substrate c11 and is long in the long side c111 direction. The second connection electrode c13 is a rectangular electrode that is disposed on the substrate c11 along the other long side c112 and is long in the long side c112 direction. A feature of the present preferred embodiment is that the pair of connection electrodes are formed along the pair of long sides c111 and c112 of the substrate c11. The resistor network c14 is provided in a central region (circuit forming surface or element forming surface) on the substrate c11 sandwiched by the first connection electrode c12 and the second connection electrode c13. One end side of the resistor network c14 is electrically connected to the first connection electrode c12 and the other end side of the resistor network c14 is electrically connected to the second connection electrode c13. The first connection electrode c12, the second connection electrode c13, and the resistor network c14 may be provided on the substrate c11 by using, for example, a micromachining process. In particular, the resistor network c14 with a fine and accurate layout pattern can be formed by using a photolithography process to be described below.

The first connection electrode c12 and the second connection electrode c13 respectively function as external connection electrodes. In a state where the chip resistor c10 is mounted on a circuit substrate c15, the first connection electrode c12 and the second connection electrode c13 are respectively connected electrically and mechanically by solders to circuits (not shown) of the circuit substrate c15 as shown in FIG. 65(B). Preferably with each of the first connection electrode c12 and the second connection electrode c13 functioning as external connection electrodes, at least a top surface region is formed of gold (Au) or gold plating is applied to the top surface to improve solder wettability and improve reliability.

Figure 66:
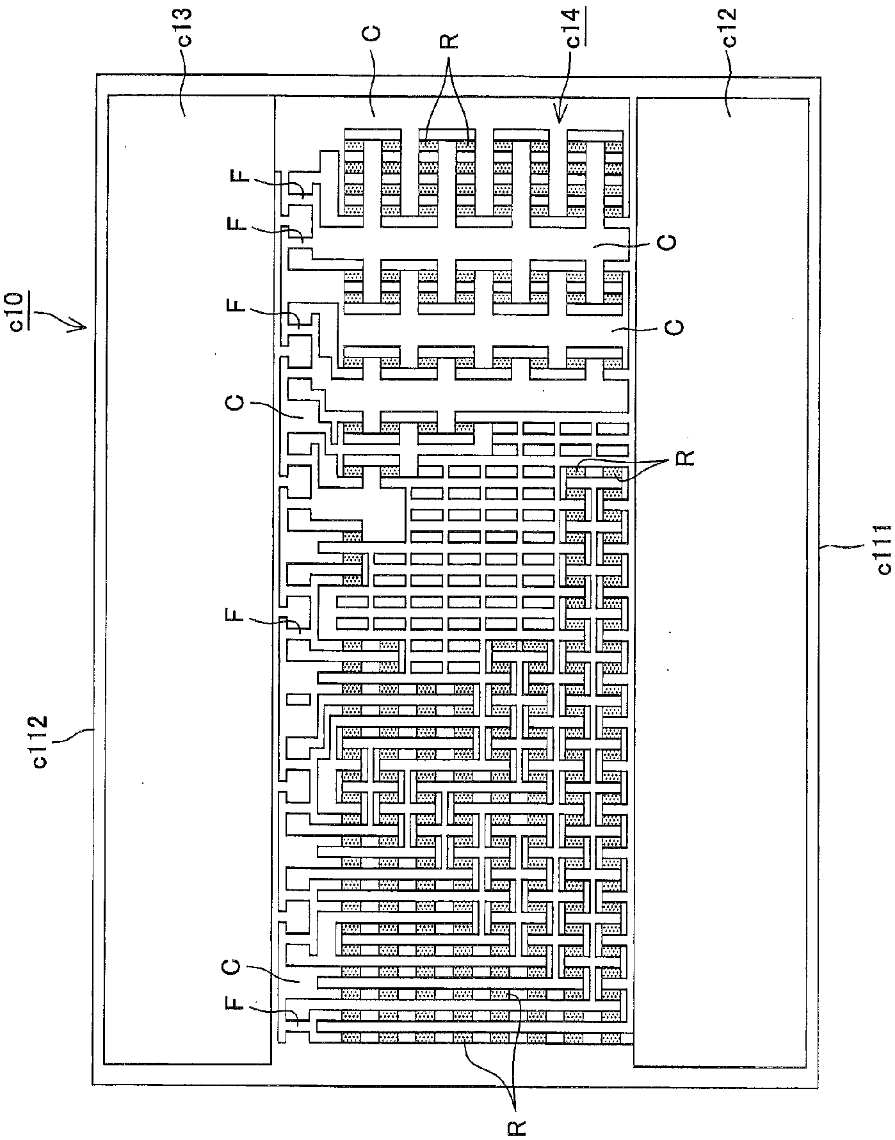
FIG. 66 is a plan view of the chip resistor c10 showing the positional relationship of a first connection electrode c12, a second connection electrode c13, and a resistor network c14 and showing the arrangement in a plan view of the resistor network c14.

FIG. 66 is a plan view of the chip resistor c10 showing the positional relationship of the first connection electrode c12, the second connection electrode c13, and the resistor network c14 and shows the arrangement in a plan view (layout pattern) of the resistor network c14. With reference to FIG. 66, the chip resistor c10 includes the first connection electrode c12, disposed with the long side parallel to the one long side c111 of the substrate c11 upper surface and having a substantially long rectangular shape in a plan view, the second connection electrode c13, disposed with the long side parallel to the other long side c112 of the substrate c11 upper surface and having a substantially long rectangular shape in a plan view, and the resistor network c14 provided in the region of rectangular shape in a plan view between the first connection electrode c12 and the second connection electrode c13.

The resistor network c14 has multiple unit resistor bodies R having an equal resistance value and arrayed in a matrix on the substrate c11 (the example of FIG. 66 has an arrangement including a total of 352 unit resistor bodies R with 8 unit resistor bodies R arrayed along the column direction (width (short) direction of the substrate c11) and 44 unit resistor bodies R arrayed along the row direction (length direction of the substrate c11)). A predetermined number from 1 to 64 of the multiple unit resistor bodies R are electrically connected by conductor films C (each conductor film C preferably being a wiring film formed of an aluminum-based metal, such as Al, AlSi, AlSiCu, or AlCu, etc.) to form each of a plurality of types of resistor circuits in accordance with each number of unit resistor bodies R connected.

Further, a plurality of fuse films F (preferably wiring films formed of aluminum-based metal films of Al, AlSi, AlSiCu, or AlCu, etc., that is the same material as that of the conductor film C and hereinafter also referred to as "fuses") are provided that are capable of being fused to electrically incorporate resistor circuits into the resistor network c14 or electrically separate resistor circuits from the resistor network c14. The plurality of fuse films F are arrayed along the inner side of the second connection electrode c13 so that the positioning region thereof is rectilinear. More specifically, the plurality of fuse films F and the connection conductor films C are aligned adjacently and disposed so that the alignment directions thereof are rectilinear.

Figure 67A:
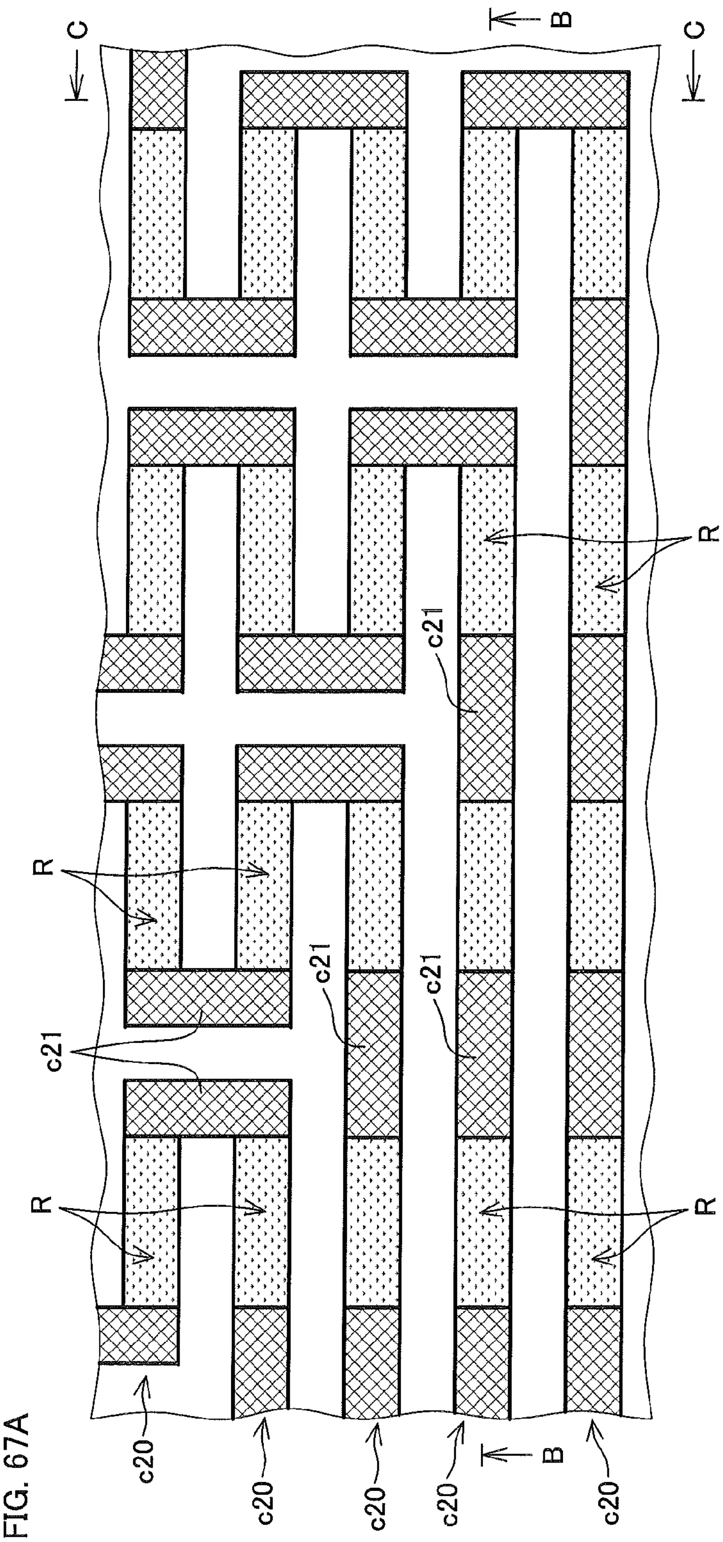
FIG. 67A is a partially enlarged plan view of the resistor network c14 shown in FIG. 66.
Figure 67B:
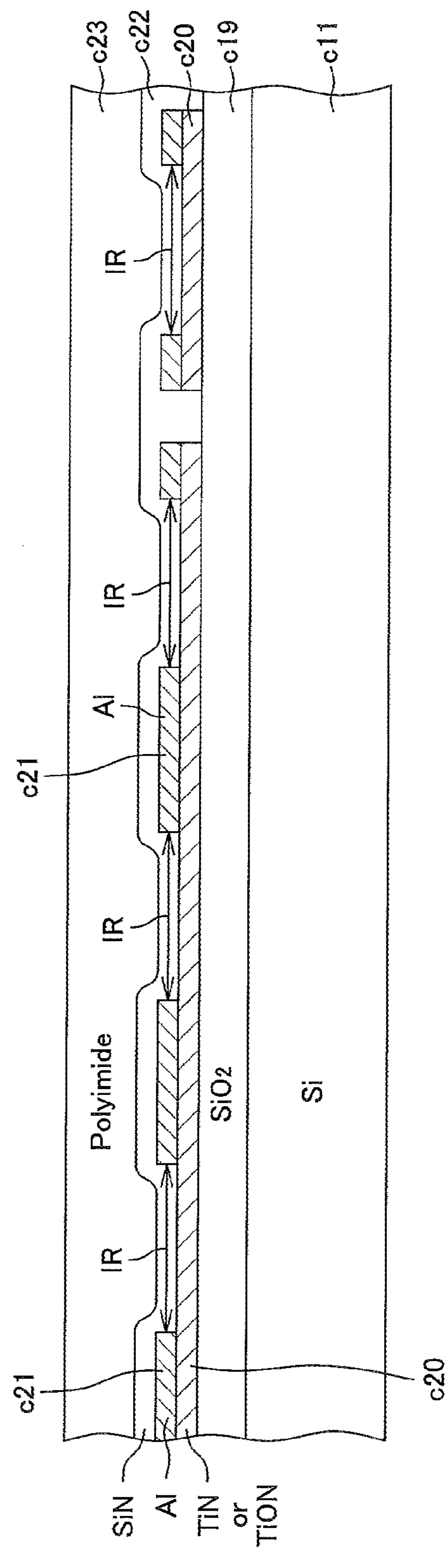
FIG. 67B is a vertical sectional view in the length direction for describing the arrangement of resistor bodies R in the resistor network c14.
Figure 67C:
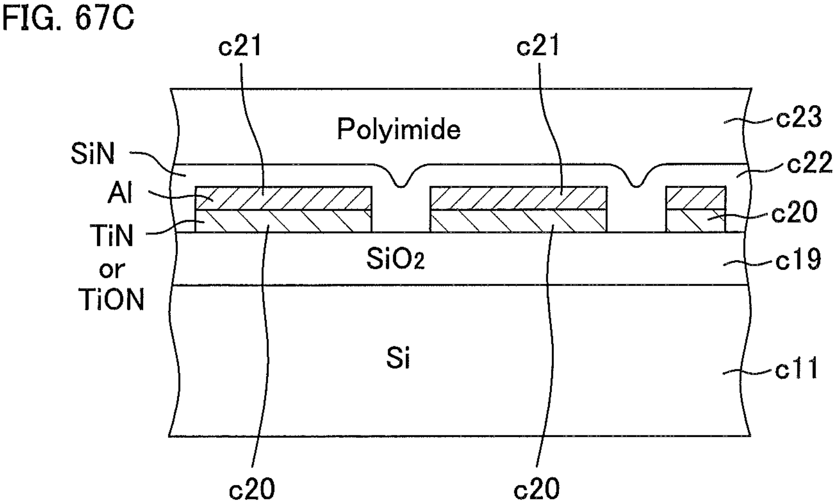
FIG. 67C is a vertical sectional view in the width direction for describing the arrangement of the resistor bodies R in the resistor network c14.

FIG. 67A is an enlarged plan view of a portion of the resistor network c14 shown in FIG. 66, and FIG. 67B and FIG. 67C are a vertical sectional view in the length direction and a vertical sectional view in the width direction, respectively, for describing the structure of the unit resistor bodies R in the resistor network c14. The arrangement of the unit resistor bodies R shall now be described with reference to FIG. 67A, FIG. 67B, and FIG. 67C.

An insulating layer ($SiO_2$) c19 is formed on an upper surface of the substrate c11, and a resistor body film c20 is disposed on the insulating film c19. The resistor body film c20 is made of a material containing one or more types of material selected from the group consisting of NiCr, NiCrAl, NiCrSi, NiCrSiAl, TaN, $TaSiO_2$, TiN, TiNO, and TiSiON. By forming the resistor body film c20 from such a material, micromachining by photolithography is made possible. Also, a chip resistor of accurate resistance value with which the resistance value does not change readily due to influences of temperature characteristics can be prepared. The resistor body film c20 is arranged as a plurality of resistor body films (hereinafter referred to as "resistor body film lines") extending parallel as straight lines between the first connection electrode c12 and the second connection electrode c13, and there are cases where a resistor body film line c20 is cut at predetermined positions in the line direction. An aluminum film is laminated as conductor film pieces c21 on the resistor body film lines c20. The respective conductor film pieces c21 are laminated on the resistor body film lines c20 at fixed intervals R in the line direction.

Figure 68:
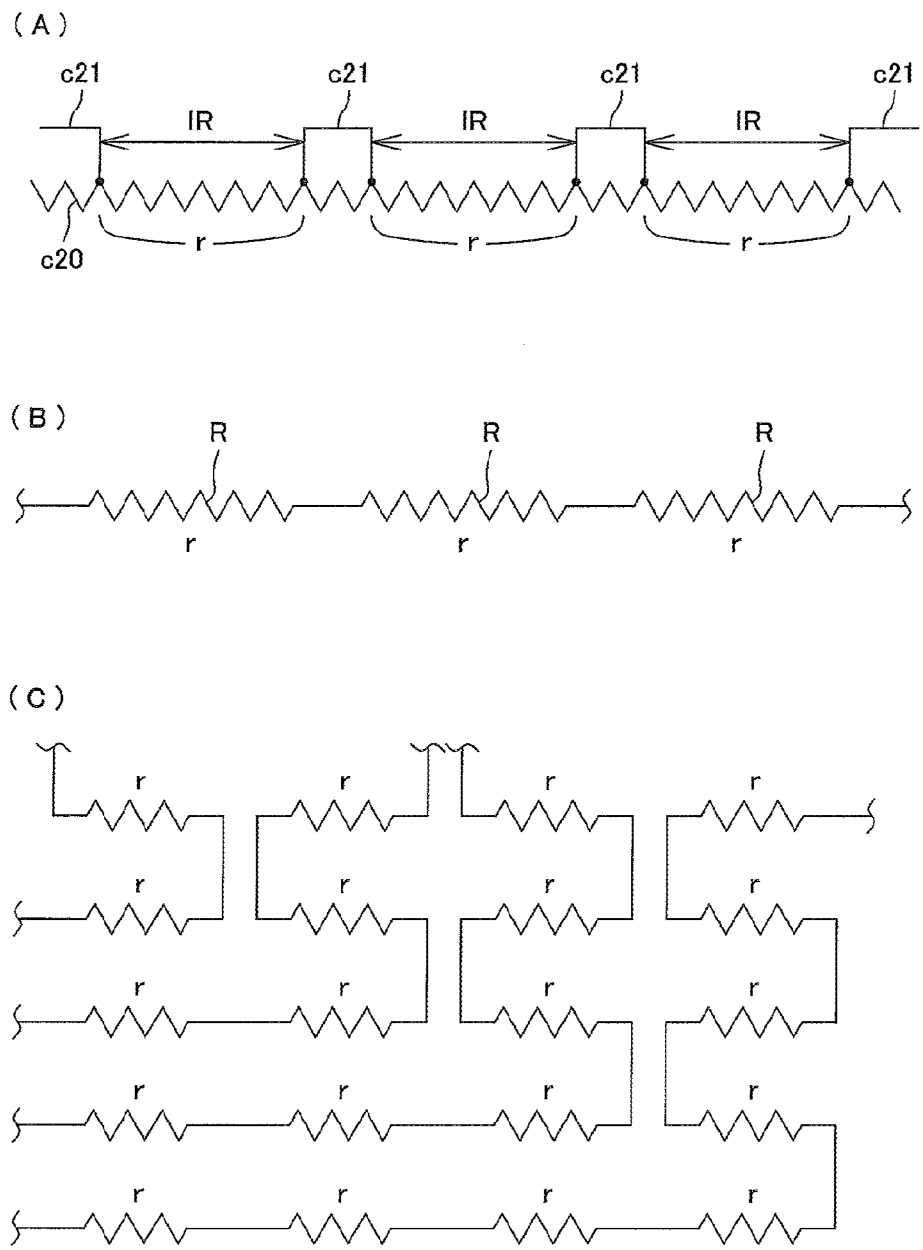
FIG. 68 shows diagrams showing the electrical features of resistive body film lines c20 and conductor film c21 in the form of circuit symbols and an electric circuit diagram.
Figure 69:
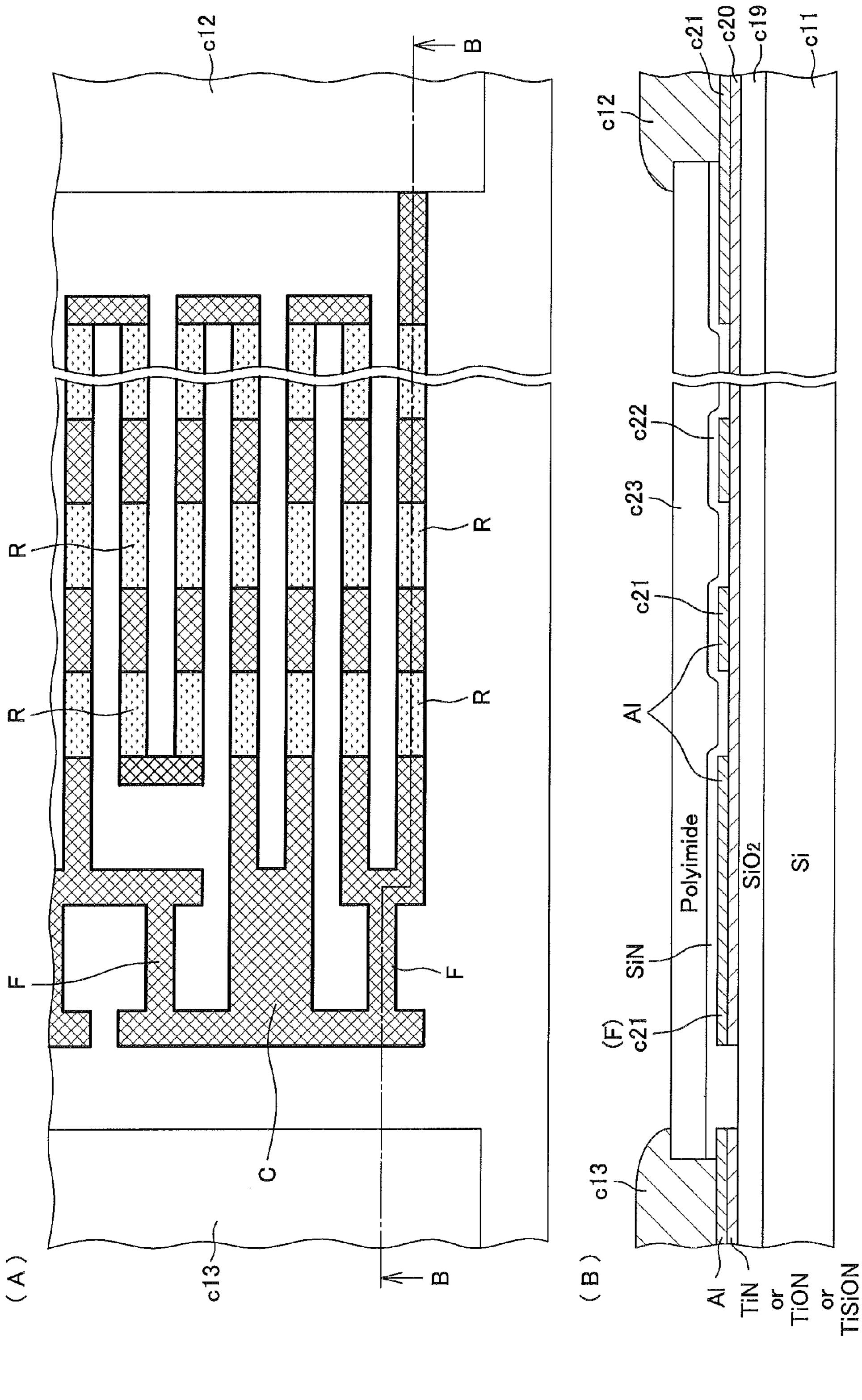
FIG. 69(A) is a partially enlarged plan view of a region including fuse films F drawn by enlarging a portion of the plan view of the chip resistor shown in FIG. 66.
FIG. 69(B) is a structural sectional view taken along B-B in FIG. 69(A).

The electrical features of the resistor body film lines c20 and the conductor film pieces c21 of the present arrangement are indicated by circuit symbols in FIG. 68. That is, as shown in FIG. 68(A), each resistor body film line c20 portion in a region of the predetermined interval IR forms a unit resistor body R with a fixed resistance value r. In each region in which a conductor film piece c21 is laminated, the resistor body film line c20 is short-circuited by the conductor film pieces c21. A resistor circuit, made up of serial connections of unit resistor bodies R of resistance r, is thus formed as shown in FIG. 68(B).

Also, adjacent resistor body film lines c20 are connected to each other by the resistor body film lines c20 and the conductor film pieces c21 so that the resistor network shown in FIG. 67A forms the resistor circuit shown in FIG. 68(C). In the illustrative sectional views of FIG. 67B and FIG. 67C, the reference symbol c11 indicates the silicon substrate, c19 indicates the silicon dioxide $SiO_2$ layer as an insulating layer, c20 indicates the resistor body film formed on the insulating layer c19, c21 indicates the wiring film made of aluminum (Al), c22 indicates an SiN film as a protective film, and c23 indicates a polyimide layer as a protective film.

As mentioned above, the material of the resistor body film c20 is constituted of the material containing one or more types of material selected from the group consisting of NiCr, NiCrAl, NiCrSi, NiCrSiAl, TaN, $TaSiO_2$, TiN, TiNO, and TiSiON. Also, the film thickness of the resistor body film c20 is preferably 300 Å to 1 μm. This is because by setting the film thickness of the resistor body film c20 in this range, a temperature coefficient of 50 ppm/° C. to 200 ppm/° C. can be realized for the resistor body film c20 and the chip resistor becomes one that is not readily influenced by temperature characteristics.

A chip resistor that is satisfactory for practical use can be obtained if the temperature coefficient of the resistor body film c20 is less than 1000 ppm/° C. Further, the resistor body film c20 is preferably a structure that includes linear components having a line width of 1 μm to 1.5 μm. This is because miniaturization of the resistor circuit and satisfactory temperature characteristics can then be realized at the same time. In place of Al, the wiring film c21 may be constituted of an aluminum-based metal film, such as AlSi, AlSiCu, or AlCu. By thus forming the wiring film c21 (including the fuse films F) from an aluminum-based metal film, the processing precision can be improved.

A process for manufacturing the resistor network c14 with the above arrangement shall be described in detail later. In the present preferred embodiment, the unit resistor bodies R, included in the resistor network c14 formed on the substrate c11, include the resistor body film lines c20 and the conductor film pieces c21 that are laminated on the resistor body film lines c20 at fixed intervals in the line direction, and a single unit resistor body R is arranged from the resistor body film line c20 at the fixed interval IR portion on which the conductor film piece c21 is not laminated. The resistor body film lines c20 making up the unit resistor bodies R are all equal in shape and size. Therefore based on the characteristic that resistor body films of the same shape and same size that are formed on a substrate are substantially the same in value, the multiple unit resistor bodies R arrayed in a matrix on the silicon substrate c11 have an equal resistance value.

The conductor film pieces c21 laminated on the resistor body film lines c20 form the unit resistor bodies R and also serve the role of connection wiring films that connect a plurality of unit resistor bodies R to arrange a resistor circuit. FIG. 69(A) is a partially enlarged plan view of a region including the fuse films F drawn by enlarging a portion of the plan view of the chip resistor c10 shown in FIG. 66, and FIG. 69(B) is a structural sectional view taken along B-B in FIG. 69(A).

As shown in FIGS. 69(A) and 69(B), the fuse films F are also formed by the wiring film c21 laminated on the resistor body film c20. That is, the fuse films F are formed of aluminum (Al), which is the same metal material as that of the conductor film pieces c21, at the same layer as the conductor film pieces c21, which are laminated on the resistor body film lines c20 that form the resistor bodies R. As mentioned above, the conductor film pieces c21 are also used as the connection conductor films C that electrically connect a plurality of unit resistor bodies R to form a resistor circuit.

That is, at the same layer laminated on the resistor body film c20, the wiring films forming the unit resistor bodies R, the connection wiring films forming the resistor circuits, the connection wiring films making up the resistor network c14, the fuse films, and the wiring films connecting the resistor network c14 to the first connection electrode c12 and the second connection electrode c13 are formed by the same manufacturing process (for example, a sputtering and photolithography process) using the same aluminum-based metal material (for example, aluminum). The manufacturing process of the chip resistor c10 is thereby simplified and also, various types of wiring films can be formed at the same time using a mask in common. Further, the property of alignment with respect to the resistor body film c20 is also improved.

Figure 70:
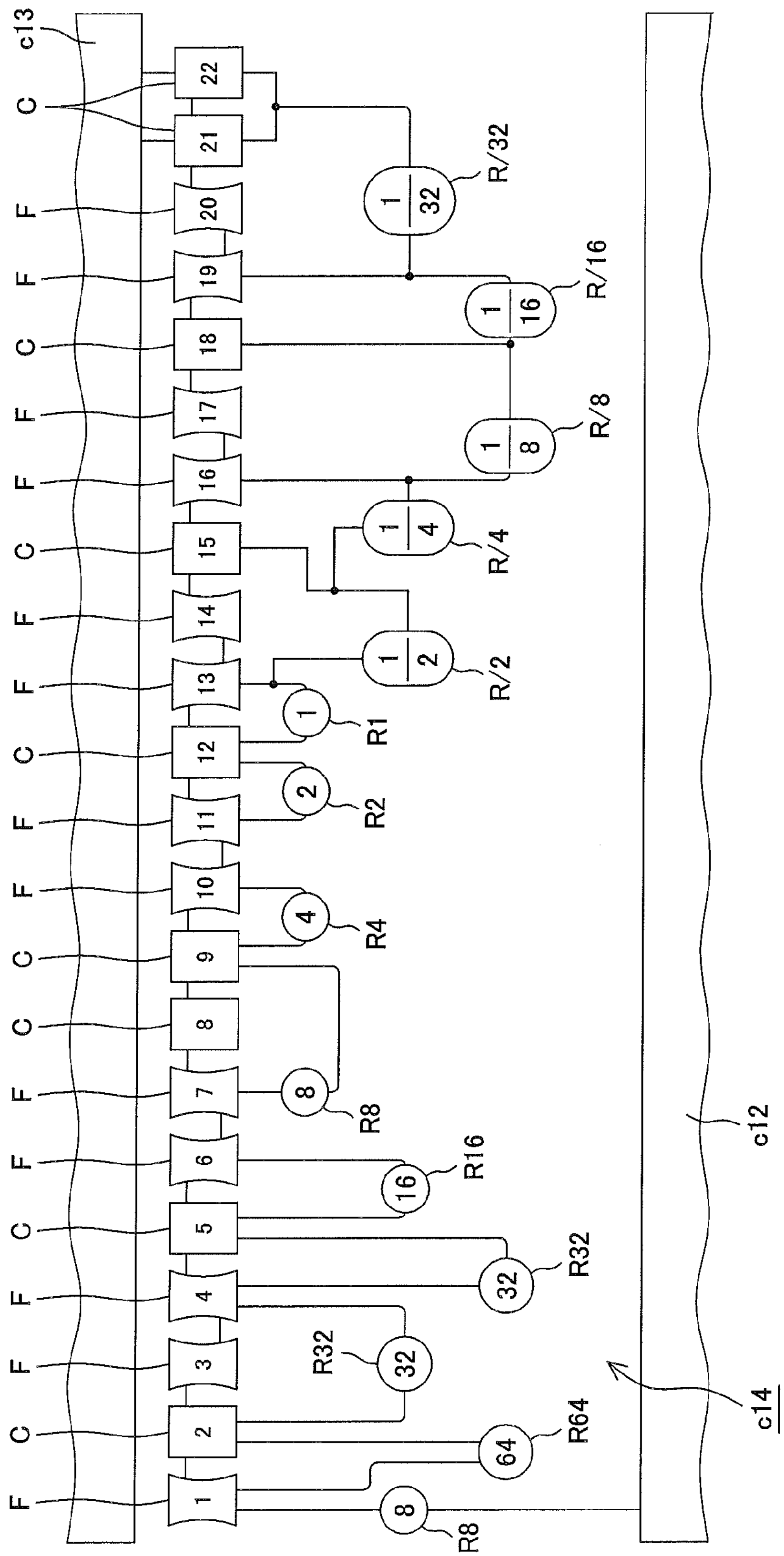
FIG. 70 is an illustrative diagram of the array relationships of connection conductor films C and fuse films F connecting a plurality of types of resistance units in the resistor network c14 shown in FIG. 66 and the connection relationships of the plurality of types of resistance units connected to the connection conductor films C and fuse films F.

FIG. 70 is an illustrative diagram of the array relationships of the connection conductor films C and the fuse films F connecting a plurality of types of resistor circuits in the resistor network c14 shown in FIG. 66 and the connection relationships of the plurality of types of resistor circuits connected to the connection conductor films C and fuse films F.

With reference to FIG. 70, one end of a reference resistor circuit R8, included in the resistor network c14, is connected to the first connection electrode c12. The reference resistor circuit R8 is formed by a serial connection of 8 unit resistor bodies R and the other end thereof is connected to a fuse film F1.

One end and the other end of a resistor circuit R64, formed by a serial connection of 64 unit resistor bodies R, are connected to the fuse film F1 and a connection conductor film C2. One end and the other end of a resistor circuit R32, formed by a serial connection of 32 unit resistor bodies R, are connected to the connection conductor film C2 and a fuse film F4. One end and the other end of a resistor circuit body R32, formed by a serial connection of 32 unit resistor bodies R, are connected to the fuse film F4 and a connection conductor film C5.

One end and the other end of a resistor circuit R16, formed by a serial connection of 16 unit resistor bodies R, are connected to the connection conductor film C5 and a fuse film F6. One end and the other end of a resistor circuit R8, formed by a serial connection of 8 unit resistor bodies R, are connected to a fuse film F7 and a connection conductor film C9. One end and the other end of a resistor circuit R4, formed by a serial connection of 4 unit resistor bodies R, are connected to the connection conductor film C9 and a fuse film F10.

One end and the other end of a resistor circuit R2, formed by a serial connection of 2 unit resistor bodies R, are connected to a fuse film F11 and a connection conductor film C12. One end and the other end of a resistor circuit body R1, formed of a single unit resistor body R, are connected to the connection conductor film C12 and a fuse film F13. One end and the other end of a resistor circuit R/2, formed by a parallel connection of 2 unit resistor bodies R, are connected to the fuse film F13 and a connection conductor film C15.

One end and the other end of a resistor circuit R/4, formed by a parallel connection of 4 unit resistor bodies R, are connected to the connection conductor film C15 and a fuse film F16. One end and the other end of a resistor circuit R/8, formed by a parallel connection of 8 unit resistor bodies R, are connected to the fuse film F16 and a connection conductor film C18. One end and the other end of a resistor circuit R/16, formed by a parallel connection of 16 unit resistor bodies R, are connected to the connection conductor film C18 and a fuse film F19.

One end and the other end of a resistor circuit R/32, formed by a parallel connection of 32 unit resistor bodies R, are connected to the fuse film F19 and a connection conductor film C22. With the plurality of fuse films F and connection conductor films C, the fuse film F1, the connection conductor film C2, the fuse film F3, the fuse film F4, the connection conductor film C5, the fuse film F6, the fuse film F7, the connection conductor film C8, the connection conductor film C9, the fuse film F10, the fuse film F11, the connection conductor film C12, the fuse film F13, a fuse film F14, the connection conductor film C15, the fuse film F16, the fuse film F17, the connection conductor film C18, the fuse film F19, the fuse film F20, the connection conductor film C21, and the connection conductor film C22 are disposed rectilinearly and connected in series. With this arrangement, when a fuse film F is fused, the electrical connection with the connection conductor film C connected adjacently to the fuse film F is interrupted.

Figure 71:
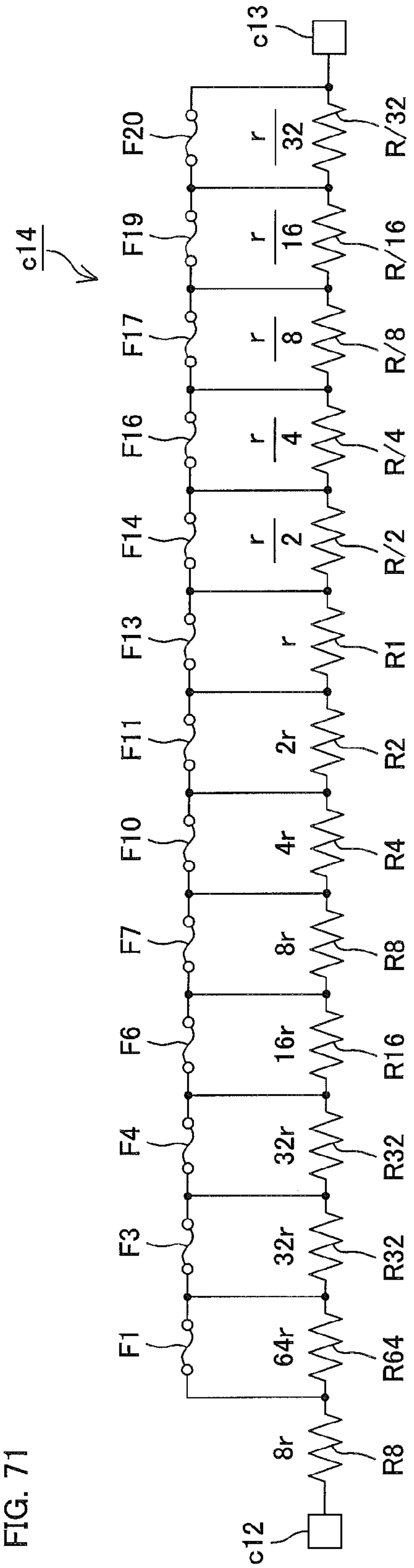
FIG. 71 is an electric circuit diagram of the resistor network c14.

This arrangement is illustrated in the form of an electric circuit diagram in FIG. 71. That is, in a state where none of the fuse films F is fused, the resistor network c14 forms a resistor circuit of the reference resistor circuit R8 (resistance value: 8r), formed by the serial connection of the 8 unit resistor bodies R provided between the first connection electrode c12 and the second connection electrode c13. For example, if the resistance value r of a single unit resistor body R is r=80Ω, the chip resistor c10 is arranged with the first connection electrode c12 and the second connection electrode c13 being connected by a resistor circuit of 8r=640Ω.

With each of the plurality of types of resistor circuits besides the reference resistor circuit R8, a fuse film F is connected in parallel, and these plurality of types of resistor circuits are put in short-circuited states by the respective fuse films F. That is, although 13 resistor circuits R64 to R/32 of 12 types are connected in series to the reference resistor circuit R8, each resistor circuit is short-circuited by the fuse film F that is connected in parallel and thus electrically, the respective resistor circuits are not incorporated in the resistance network c14.

With the chip resistor c10 according to the present preferred embodiment, a fuse film F is selectively fused, for example, by laser light in accordance with the required resistance value. The resistor circuit with which the fuse film F connected in parallel is fused is thereby incorporated into the resistor network c14. The resistor network c14 can thus be made a resistor network with the overall resistance value being the resistance value resulting from serially connecting and incorporating the resistor circuits corresponding to the fused fuse films F.

In other words, with the chip resistor c10 according to the present preferred embodiment, by selectively fusing the fuse films corresponding to a plurality of types of resistor circuits, the plurality of types of resistor circuits (for example, the serial connection of the resistor circuits R64, R32, and R1 in the case of fusing F1, F4, and F13) can be incorporated into the resistor network. The respective resistance values of the plurality of types of resistor circuits are predetermined, and the chip resistor c10 can thus be made to have the required resistance value by adjusting the resistance value of the resistance network c14 in a so to speak digital manner.

Also, the plurality of types of resistor circuits include the plurality of types of serial resistor circuits, with which the unit resistor bodies R having an equal resistance value are connected in series with the number of unit resistor bodies R being increased in geometric progression as 1, 2, 4, 8, 16, 32, and 64, and the plurality of types of parallel resistor circuits, with which the unit resistor bodies R having an equal resistance value are connected in parallel with the number of unit resistor bodies R being increased in geometric progression as 2, 4, 8, 16, and 32. These are connected in series in states of being short-circuited by the fuse films F. Therefore by selectively fusing the fuse films F, the resistance value of the resistor network c14 as a whole can be set to an arbitrary resistance value within a wide range from a small resistance value to a large resistance value.

Figure 72:
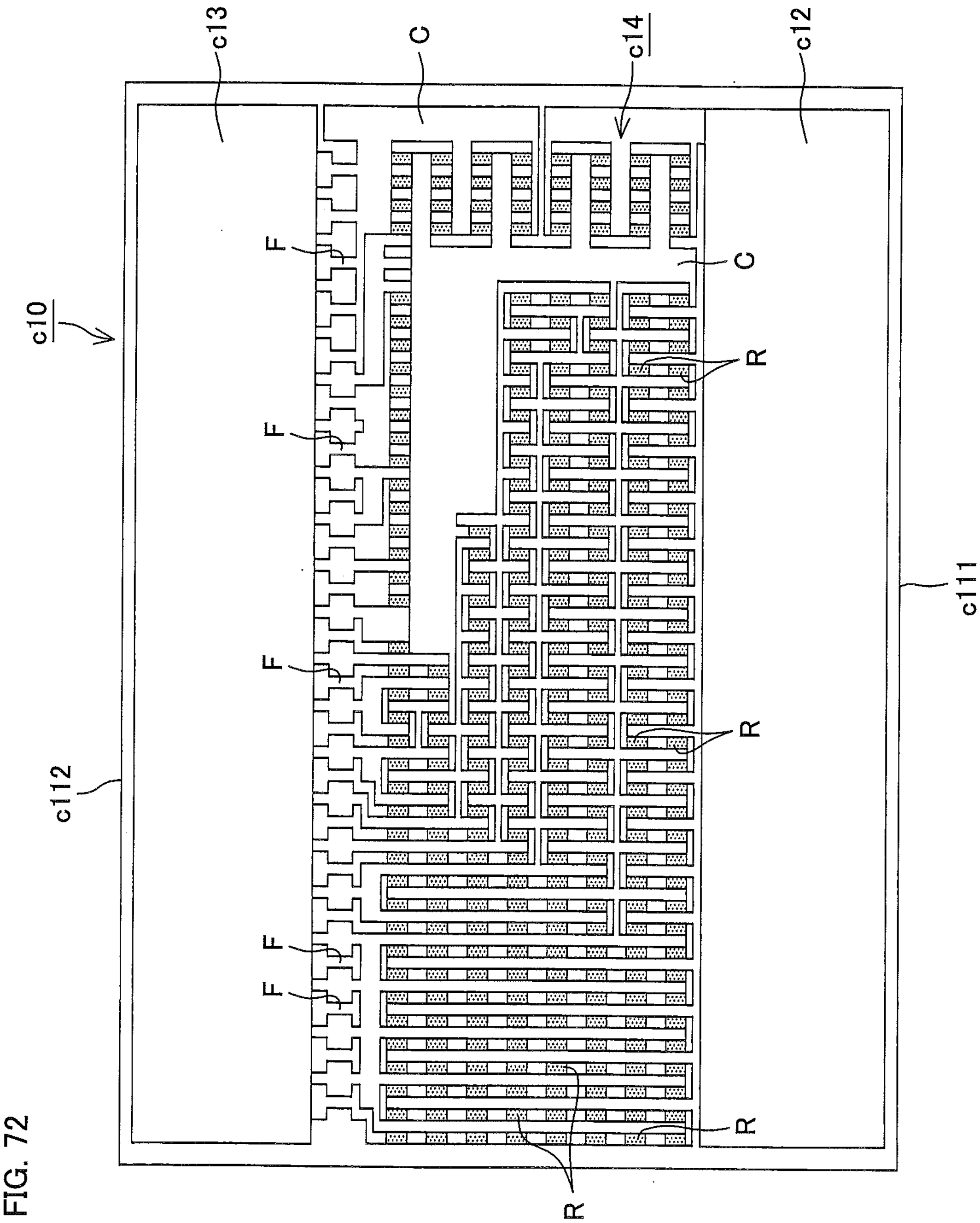
FIG. 72 is a plan view of a chip resistor c30 showing the positional relationship of a first connection electrode c12, a second connection electrode c13, and a resistor network c14 and showing the arrangement in a plan view of the resistor network c14.

FIG. 72 is a plan view of a chip resistor c30 according to another preferred embodiment of the third reference example and shows the positional relationship of the first connection electrode c12, the second connection electrode c13, and the resistor network c14 and shows the arrangement in a plan view of the resistor network c14. The first connection electrode c12 and the second connection electrode c13 are disposed along the pair of long sides of the substrate c11 in the present preferred embodiment as well.

The chip resistor c30 differs from the chip resistor c10 described above in the mode of connection of the unit resistor bodies R in the resistor network c14. That is, the resistor network c14 of the chip resistor c30 has multiple unit resistor bodies R having an equal resistance value and arrayed in a matrix on the substrate c11 (the arrangement of FIG. 72 is an arrangement including a total of 352 unit resistor bodies R with 8 unit resistor bodies R arrayed along the column direction (short (width) direction of the substrate c11) and 44 unit resistor bodies R arrayed along the row direction (length direction of the substrate c11)). A predetermined number from 1 to 128 of the multiple unit resistor bodies R are electrically connected to form a plurality of types of resistor circuits. The plurality of types of resistor circuits thus formed are connected in parallel modes by conductor films and the fuse films F as network connection means. The plurality of fuse films F are arrayed along the inner side of the second connection electrode c13 so that the positioning region thereof is rectilinear, and when a fuse film F is fused, the resistor circuit connected to the fuse film is electrically separated from the resistor network c14.

Figure 73:
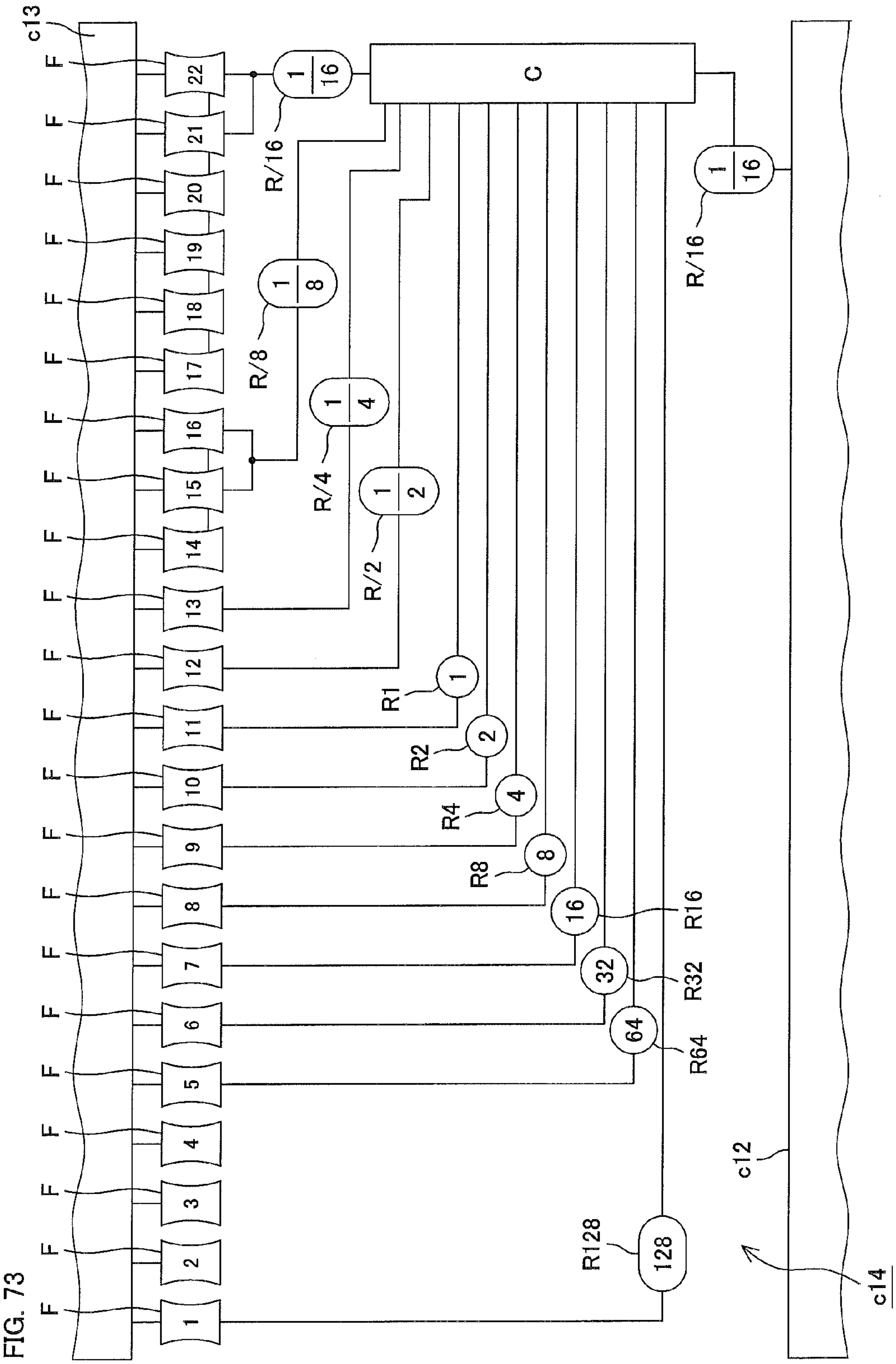
FIG. 73 is an illustrative diagram of the positional relationship of connection conductor films C and fuse films F connecting a plurality of types of resistance units in the resistor network c14 shown in FIG. 72 and the connection relationships of the plurality of types of resistance units connected to the connection conductor films C and fuse films F.

The material and structure of the multiple unit resistor bodies R forming the resistor network c14, and the material and structures of the connection conductor films and fuse films F are the same as the structures of the corresponding portions in the chip resistor c10 and description of these shall thus be omitted here. FIG. 73 is an illustrative diagram of the connection modes of the plurality of types of resistor circuits in the resistor network shown in FIG. 72, the array relationship of the fuse films F connecting the resistor circuits, and the connection relationships of the plurality of types of resistor circuits connected to the fuse films F.

Referring to FIG. 73, one end of a reference resistor circuit R/16, included in the resistor network c14, is connected to the first connection electrode c12. The reference resistor circuit R/16 is formed by a parallel connection of 16 unit resistor bodies R and the other end thereof is connected to the connection conductor film C, to which the remaining resistor circuits are connected. One end and the other end of a resistor circuit R128, formed by a serial connection of 128 unit resistor bodies R, are connected to the fuse film F1 and the connection conductor film C.

One end and the other end of a resistor circuit R64, formed by the serial connection of 64 unit resistor bodies R, are connected to the fuse film F5 and the connection conductor film C. One end and the other end of a resistor circuit R32, formed by the serial connection of 32 unit resistor bodies R, are connected to the fuse film F6 and the connection conductor film C. One end and the other end of a resistor circuit R16, formed by the serial connection of 16 unit resistor bodies R, are connected to the fuse film F7 and the connection conductor film C.

One end and the other end of a resistor circuit R8, formed by the serial connection of 8 unit resistor bodies R, are connected to the fuse film F8 and the connection conductor film C. One end and the other end of a resistor circuit R4, formed by the serial connection of 4 unit resistor bodies R, are connected to the fuse film F9 and the connection conductor film C. One end and the other end of a resistor circuit R2, formed by the serial connection of 2 unit resistor bodies R, are connected to the fuse film F10 and the connection conductor film C.

One end and the other end of a resistor circuit R1, formed of the single unit resistor body R, are connected to the fuse film F11 and the connection conductor film C. One end and the other end of a resistor circuit R/2, formed by the parallel connection of 2 unit resistor bodies R, are connected to the fuse film F12 and the connection conductor film C. One end and the other end of a resistor circuit R/4, formed by the parallel connection of 4 unit resistor bodies R, are connected to the fuse film F13 and the connection conductor film C.

The fuse films F14, F15, and F16 are electrically connected, and one end and the other end of a resistor circuit R/8, formed by the parallel connection of 8 unit resistor bodies R, are connected to the fuse films F14, F15, and F16 and the connection conductor film C. The fuse films F17, F18, F19, F20, and F21 are electrically connected, and one end and the other end of a resistor circuit R/16, formed by the parallel connection of 16 unit resistor bodies R, are connected to the fuse films F17 to F21 and the connection conductor film C.

The 21 fuse films F of fuse films F1 to F21 are provided and all of these are connected to the second connection electrode c13. With this arrangement, when a fuse film F, to which one end of a resistor circuit is connected, is fused, the resistor circuit having one end connected to the fuse film F is electrically disconnected from the resistor network c14.

Figure 74:
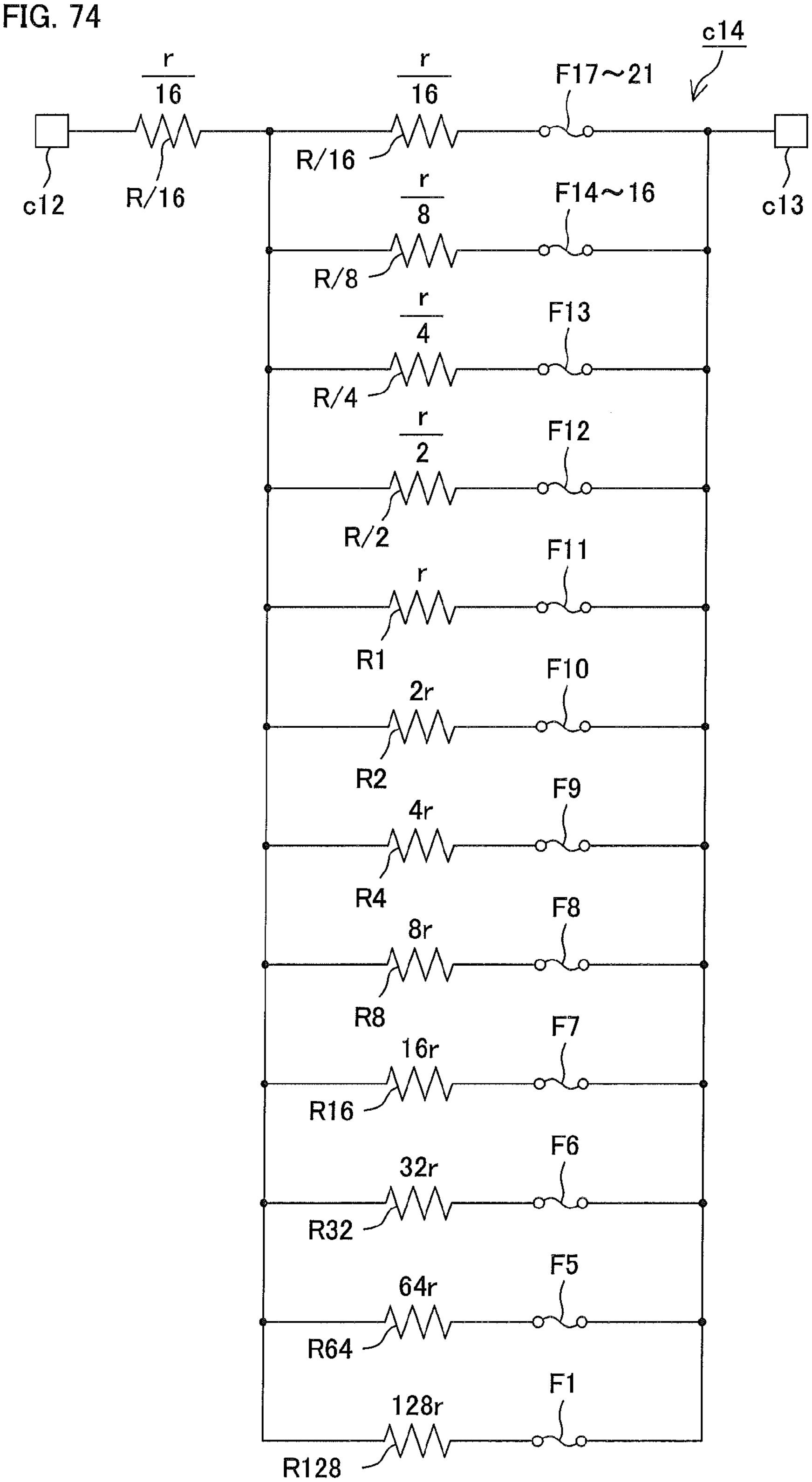
FIG. 74 is an electric circuit diagram of the resistor network c14.
Figure 75:
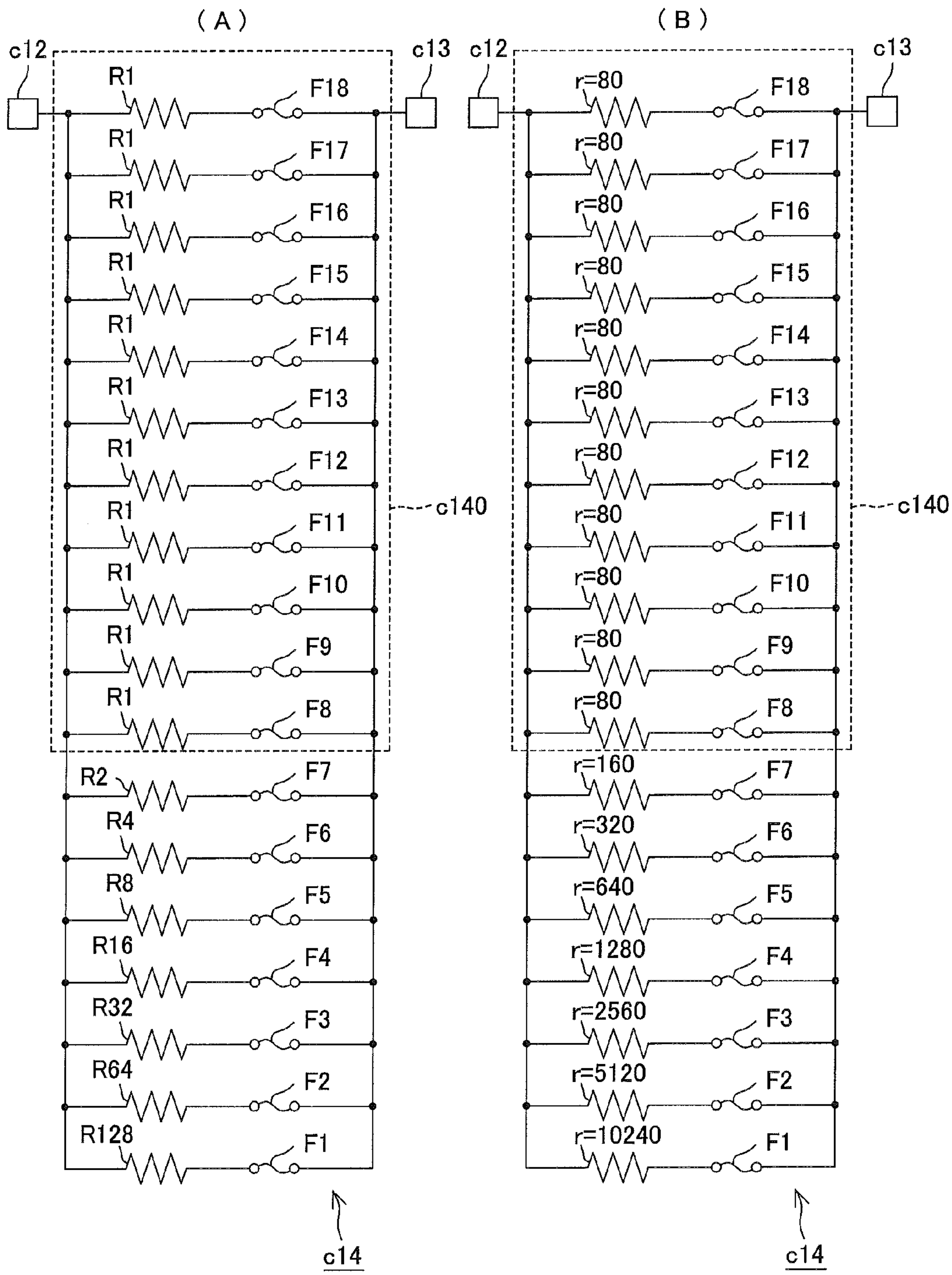
FIGS. 75(A) and 75(B) are electric circuit diagrams of modification examples of the electric circuit shown in FIG. 74.

The arrangement of FIG. 73, that is, the arrangement of the resistor network c14 included in the chip resistor c30, is illustrated in the form of an electric circuit diagram in FIG. 74. In a state where none of the fuse films F is fused, the resistor network c14 forms, between the first connection electrode c12 and the second connection electrode c13, a serial connection circuit of the reference resistor circuit R/16 and the parallel connection circuit of the 12 types of resistor circuits R/16, R/8, R/4, R/2, R1, R2, R4, R8, R16, R32, R64, and R128.

A fuse film F is serially connected to each of the 12 types of resistor circuits besides the reference resistor circuit R/16. Therefore with the chip resistor c30 having the resistor network c14, by selectively fusing a fuse film F, for example, by laser light in accordance with the required resistance value, the resistor circuit corresponding to the fused fuse film F (the resistor circuit connected in series to the fuse film F) is electrically separated from the resistor network c14 and the resistance value of the chip resistor c10 can thereby be adjusted.

In other words, with the chip resistor c30 according to the present preferred embodiment, by selectively fusing the fuse films provided in correspondence to a plurality of types of resistor circuits, the plurality of types of resistor circuits can be electrically separated from the resistor network. The respective resistance values of the plurality of types of resistor circuits are predetermined, and the chip resistor c30 can thus be made to have the required resistance value by adjusting the resistance value of the resistance network c14 in a so to speak digital manner.

Also, the plurality of types of resistor circuits include the plurality of types of serial resistor circuits, with which the unit resistor bodies R having an equal resistance value are connected in series with the number of unit resistor bodies R being increased in geometric progression as 1, 2, 4, 8, 16, 32, 64, and 128, and the plurality of types of parallel resistor circuits, with which the unit resistor bodies R having an equal resistance value are connected in parallel with the number of unit resistor bodies R being increased in geometric progression as 2, 4, 8, and 16. Therefore by selectively fusing the fuse films F, the resistance value of the resistor network c14 as a whole can be set to an arbitrary resistance value finely and digitally.

With the electric circuit shown in FIG. 74, there is a tendency for an overcurrent to flow in resistor circuits of low resistance value among the reference resistor circuit R/16 and the parallel-connected resistor circuits, and the rated current that can be allowed to flow through the resistors must be designed to be large in setting the resistors. Therefore to disperse the current, the connection structure of the resistor network of the electric circuit shown in FIG. 74 may be changed to the electric circuit arrangement shown in FIG. 75(A). That is, the reference resistor circuit R/16 is eliminated, and the parallel-connected resistor circuits are changed to a circuit that includes an arrangement c140 in which the minimum resistance value is set to r and a plurality of sets of resistance units R1 of resistance value r are connected in parallel.

Figure 76:
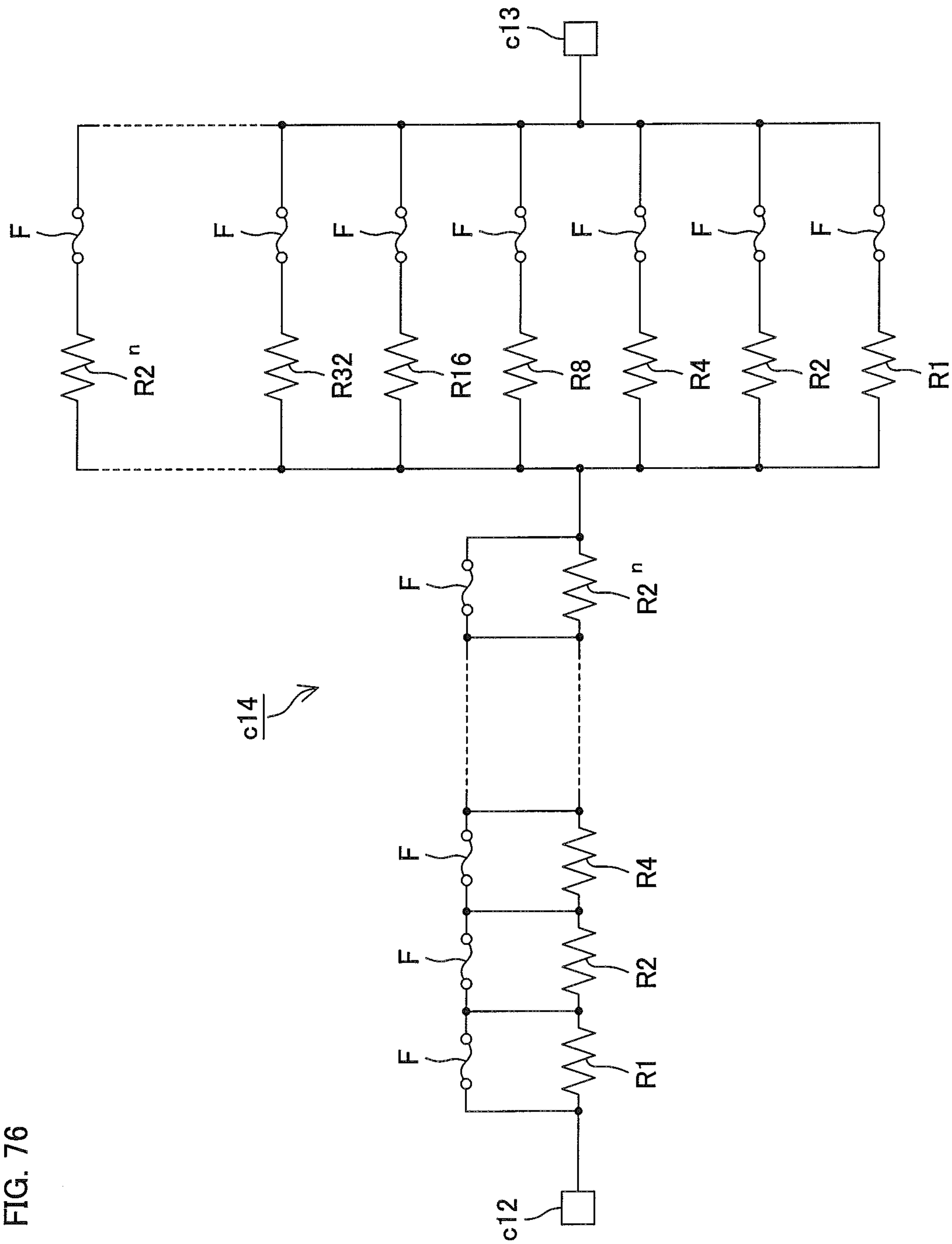
FIG. 76 is an electric circuit diagram of a resistor network c14 according to yet another preferred embodiment of the third reference example.

FIG. 75(B) is an electric circuit diagram with specific resistance values indicated therein and the circuit is arranged to include the arrangement c140 in which a plurality of sets of a serial connection of an 80Ω unit resistor body and the fuse film F are connected in parallel. The current flowing through can thereby be dispersed. FIG. 76 is an electric circuit diagram of the circuit arrangement of a resistor network c14 included in a chip resistor according to yet another preferred embodiment of the third reference example. A feature of the resistor network c14 shown in FIG. 76 is a circuit arrangement in which a serial connection of a plurality of types of resistor circuits and a parallel connection of a plurality of types of resistor circuits are connected in series.

With the plurality of types of resistor circuits connected in series, a fuse film F is connected in parallel to each resistor circuit and all of the plurality of types resistor circuits connected in series are put in short circuited states by the fuse films F as in the preferred embodiments described above. Therefore, when a fuse film F is fused, the resistor circuit short-circuited by the fuse film F is electrically incorporated in the resistor network c14. On the other hand, a fuse film F is connected in series to each of the plurality of types of resistor circuits connected in parallel. Therefore, by fusing a fuse film F, the resistor circuit connected in series to the fuse film F can be electrically disconnected from the parallel connection of the resistor circuits.

By this arrangement, for example, a low resistance of not more than 1 kΩ can be prepared at the parallel connection side and resistor circuits of not less than 1 kΩ can be prepared at the serial connection side. A wide range of resistor circuits from those of low resistance of several Ω to those of high resistance of several MΩ can thus be prepared using resistor networks c14 arranged with the same basic design. If a resistance value is to be set more precisely, the fuse film of a resistor circuit at the serial connection side that is close to the required resistance value can be cut in advance and fine adjustment of the resistance value can then be performed by fusing the fuse films of resistor circuits at the parallel connection side to thereby improve the precision of adjustment to the desired resistance value.

Figure 77:
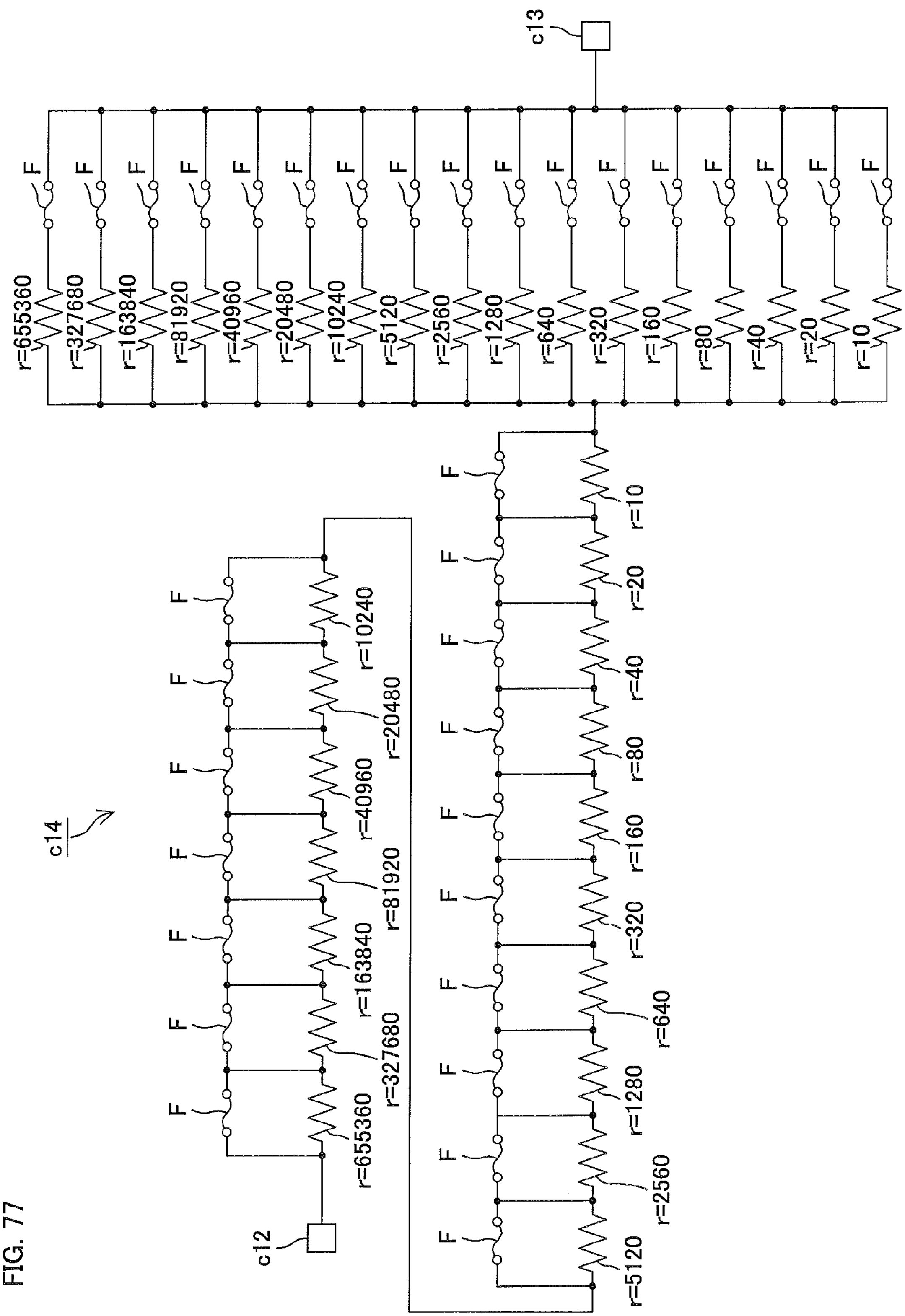
FIG. 77 is an electric circuit diagram of an arrangement example of a resistor network in a chip resistor in which specific resistance values are indicated.

FIG. 77 is an electric circuit diagram of a specific arrangement example of the resistor network c14 in a chip resistor having a resistance value in a range of 10Ω to 1 MΩ. The resistor network c14 shown in FIG. 77 also has the circuit arrangement in which a serial connection of a plurality of types of resistor circuits short-circuited by the fuse films F and a parallel connection of a plurality of types of resistor circuits serially connected to the fuse films F are connected in series.

With the resistor circuit of FIG. 77, an arbitrary resistance value from 10 to 1 kΩ can be set at a precision of within 1% at the parallel connection side. Also, an arbitrary resistance value from 1 k to 1 MΩ can be set at a precision of within 1% at the serial connection side. In a case of using a circuit at the serial connection side, the merit of being able to set the resistance value more precisely is provided by fusing the fuse film F of a resistor circuit close to the desired resistance value and adjusting to the desired resistance value in advance.

Although only cases where the same layer is used for the fuse films F as that used for the connection conductor films C has been described, the connection conductor film C portions may have another conductor film laminated further thereon to decrease the resistance value of the conductor films. Also, the resistor body film may be eliminated to use only the connection conductor films C. Even in these cases, the fuse films F are not degraded in fusing property as long as a conductor film is not laminated on the fuse films F.

Figure 78:
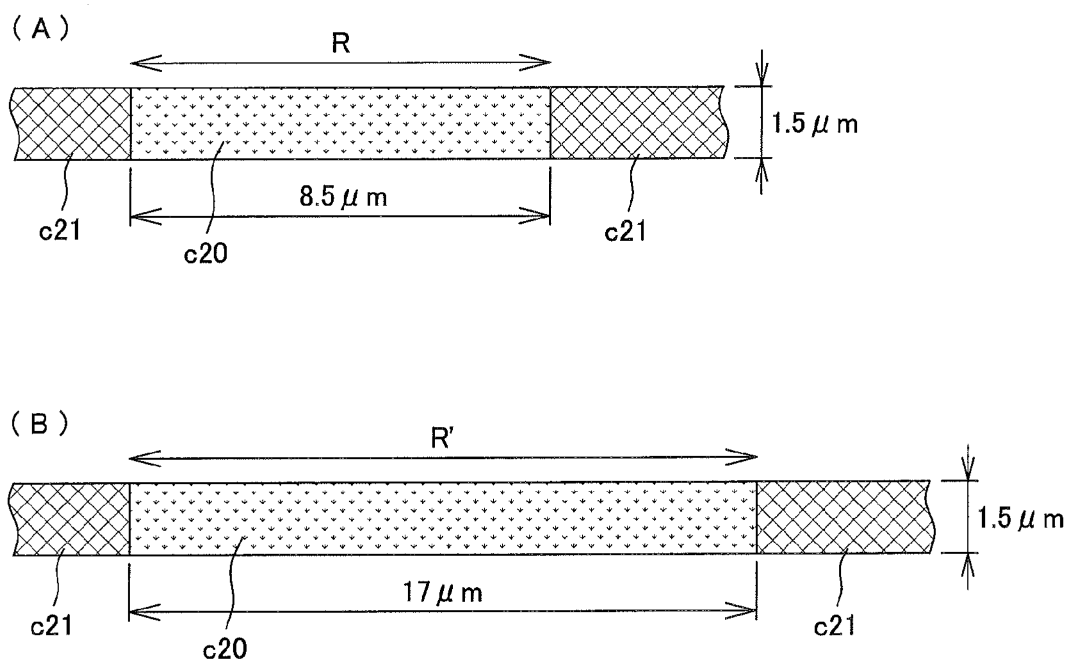
FIG. 78 shows illustrative plan views for describing the structure of principal portions of a chip resistor 90 according to yet another preferred embodiment of the third reference example.

FIG. 78 shows illustrative plan views for describing the structure of principal portions of a chip resistor 90 according to yet another preferred embodiment of the third reference example. For example, with the chip resistor c10 (see FIG. 65 and FIG. 66) and the chip resistor c30 (see FIG. 72) described above, the relationship, expressed in a plan view, of the resistor body film lines c20 and the conductor film pieces c21 constituting the resistor circuits has the arrangement shown in FIG. 78(A). That is, as shown in FIG. 78(A), the resistor body film line c20 portion in the region of the predetermined interval IR forms the unit resistor body R with the fixed resistance value r. Conductor film pieces c21 are laminated at both sides of the unit resistor body R and the resistor body film line c20 is short-circuited by the conductor film pieces c21.

Here, with the chip resistor c10 and the chip resistor c30, the length of the resistor body film line c20 portion forming the unit resistor body R is, for example, 12 μm, the width of the resistor body film line c20 is, for example, 1.5 μm, and the unit resistance (sheet resistance) 10Ω/€. The resistance value r of the unit resistor body R is thus r=80Ω. With the chip resistor c10 shown in FIG. 65 and FIG. 66, for example, there is a demand for increasing the resistance value of the resistor network c14 without expanding the arrangement region of the resistor network c14 to realize a high resistance in the chip resistor c10.

Therefore with the chip resistor 90 according to the present preferred embodiment, the layout of the resistor network c14 is changed and the unit resistor body constituting the resistor circuits included in the resistor network is made to have the shape and size shown in FIG. 78(B). With reference to FIG. 78(B), the resistor body film line c20 includes a line-shaped resistor body film line c20 that extends in a straight line with a width of 1.5 μm. In the resistor body film line c20, the resistor body film line c20 portion of a predetermined interval R' forms a unit resistor body R' with a fixed resistance value r'. The length of the unit resistor body R' is set, for example, to 17 μm. The unit resistor body R' can thereby be arranged as a unit resistor body with a resistance value r' of r'=160Ω, that is, substantially twice that of the unit resistor body R shown in FIG. 78(A).

Also, the length of the conductor film piece c21 laminated on the resistor body film line c20 can be arranged to be the same length in the arrangement shown in FIG. 78(A) and in the arrangement shown in FIG. 78(B). A high resistance is thus realized in the chip resistor 90 by changing the layout pattern of the respective unit resistor bodies R' constituting the resistor circuits included in the resistor network c14 to a layout pattern in which the unit resistor bodies R' can be connected serially.

Figure 79:
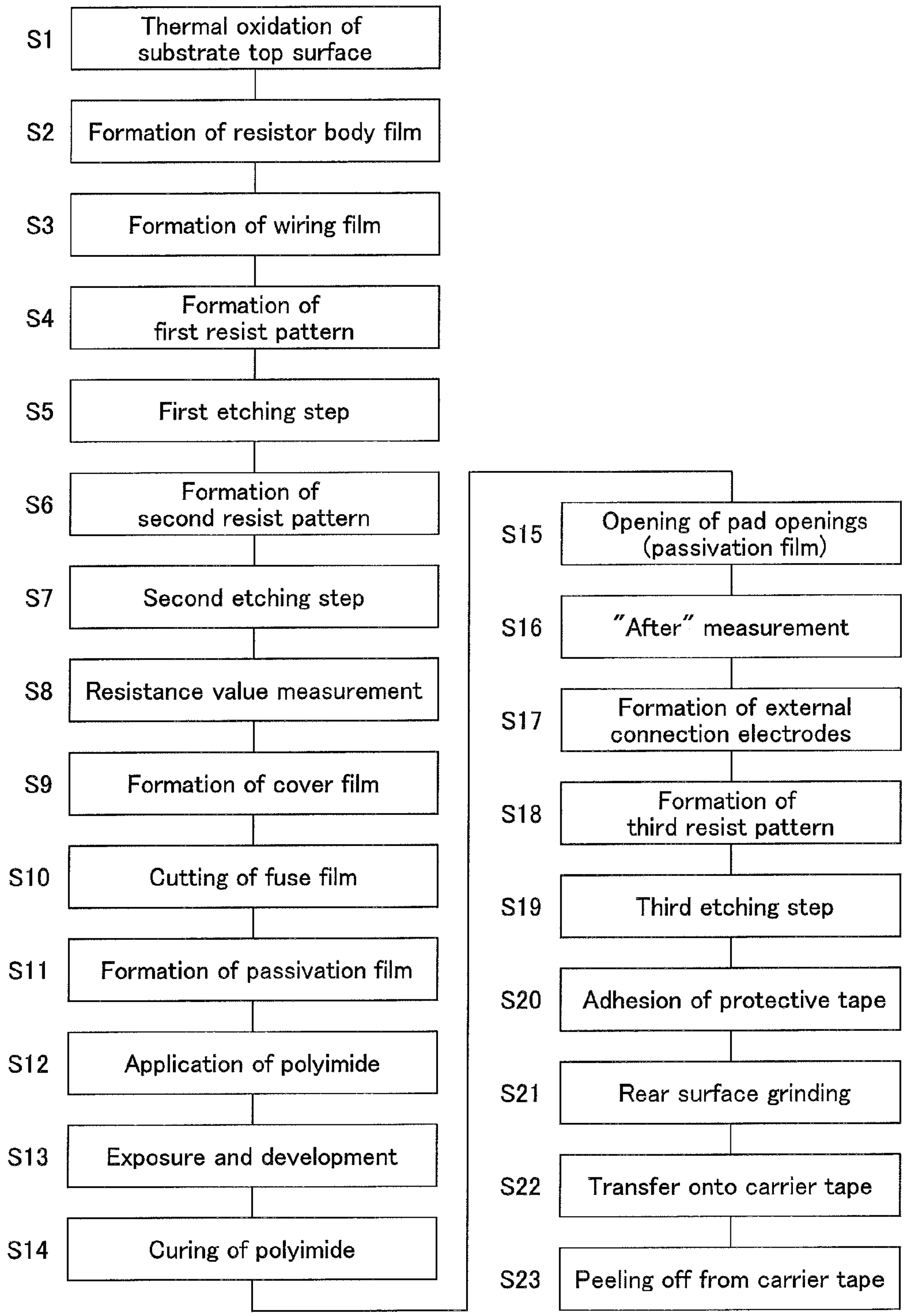
FIG. 79 is a flow diagram of an example of a process for manufacturing the chip resistor c10.
Figure 80:
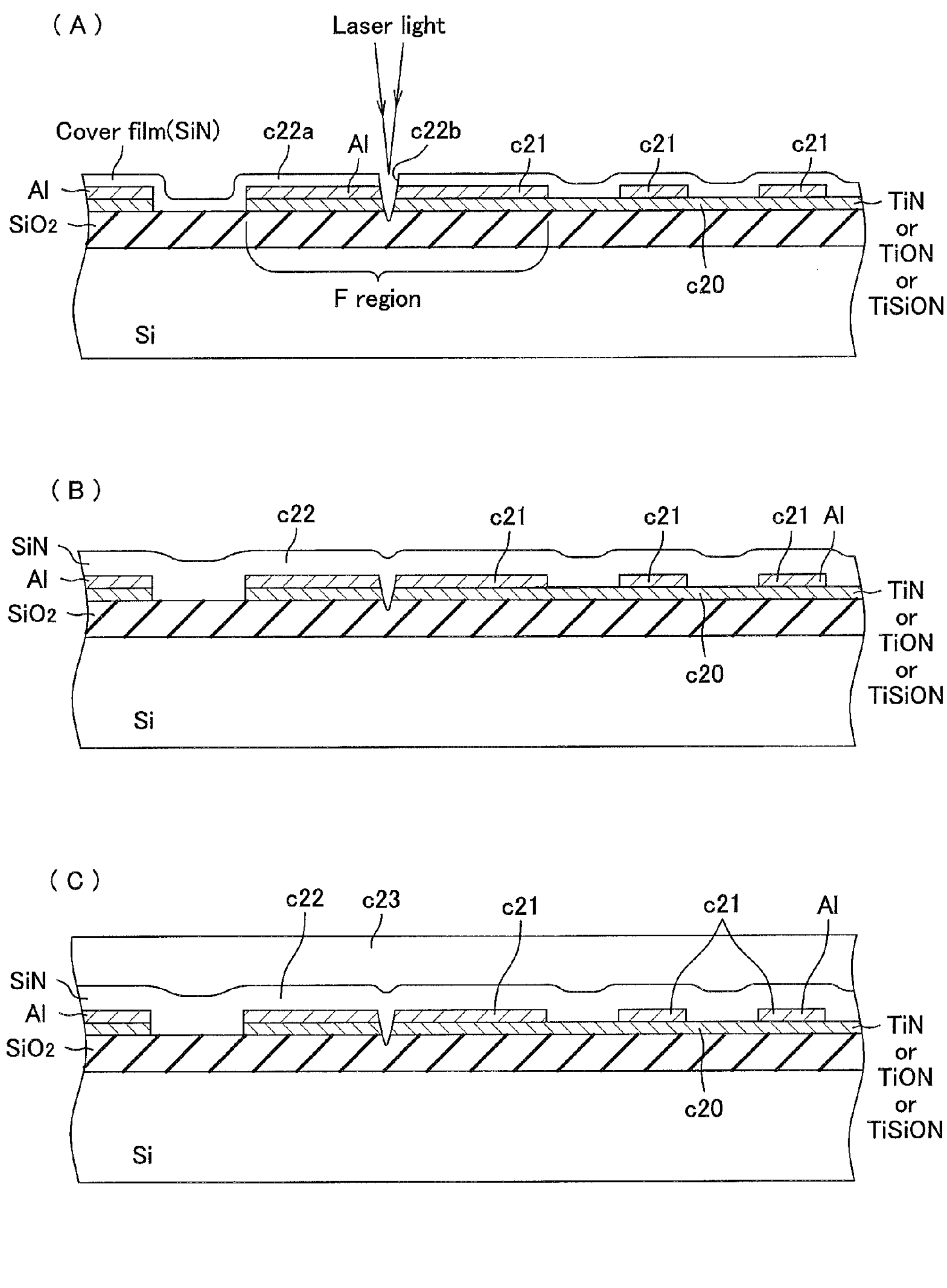
FIG. 80 shows illustrative sectional views of a fuse film F fusing step and a passivation film c22 and a resin film c23 that are formed subsequently.
Figure 81:
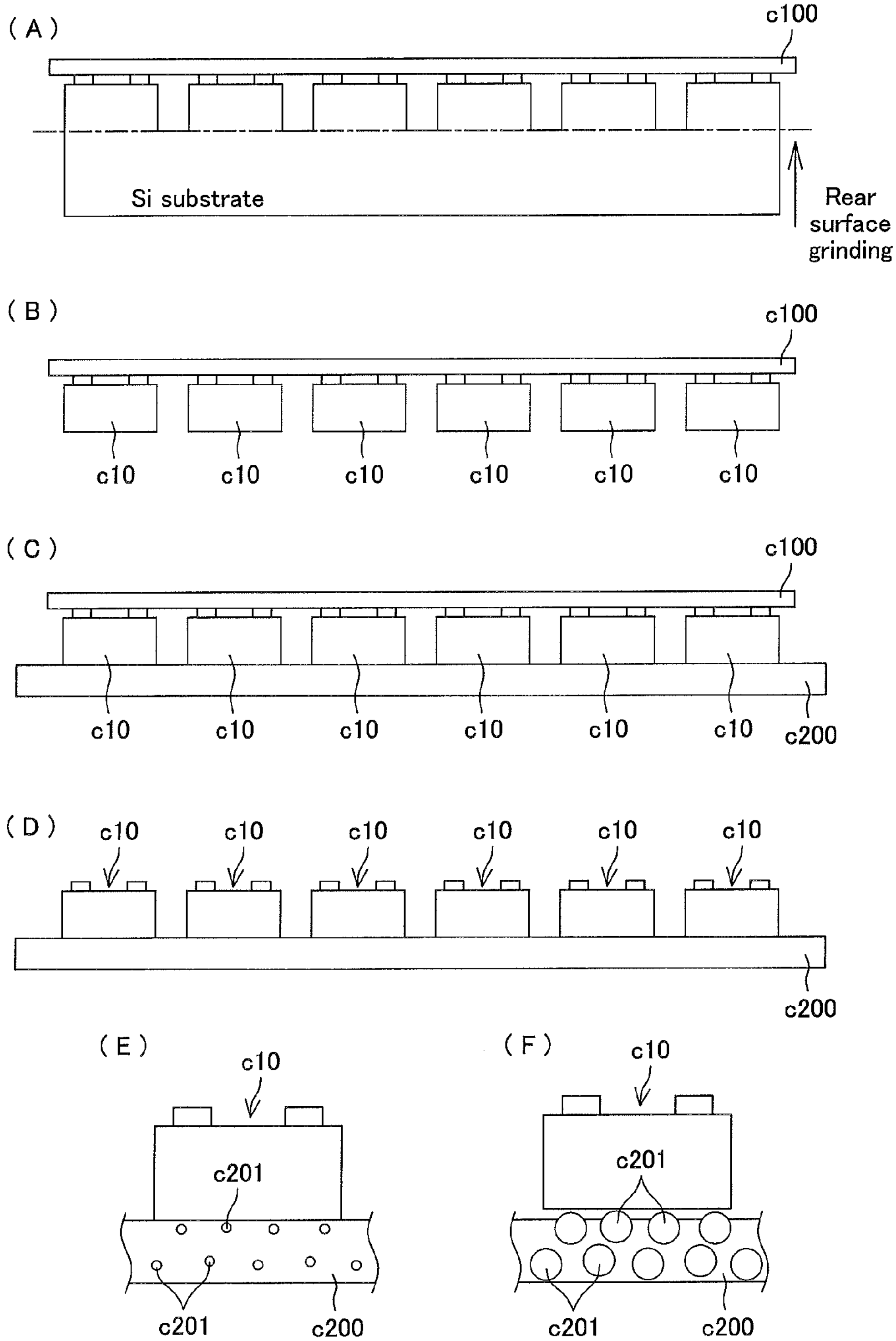
FIG. 81 shows illustrative views of processing steps of separating individual chip resistors from a substrate.

FIG. 79 is a flow diagram of an example of a process for manufacturing the chip resistor c10 described with reference to FIGS. 65 to 71. A method for manufacturing the chip resistor c10 shall now be described in detail in accordance with the manufacturing process of the flow diagram and with reference to FIGS. 65 to 71 where necessary. Step S1: First, the substrate c11 (actually, a silicon wafer before separation by cutting into the individual chip resistors c10 (see FIG. 81)) is placed in a predetermined processing chamber and a silicon dioxide ($SiO_2$) layer is formed as the insulating layer c19 on the top surface, for example, by a thermal oxidation method.

Step S2: Thereafter, the resistor body film c20, made, for example, of TiN, TiON, or TiSiON or other material containing one or more types of material selected from the group consisting of NiCr, NiCrAl, NiCrSi, NiCrSiAl, TaN, $TaSiO_2$, TiN, TiNO, and TiSiON, is formed, for example, by a sputtering method on an entire top surface of the insulating layer c19. Step S3: Thereafter, the sputtering method, for example, is used to laminatingly form the wiring film c21, for example, from aluminum (Al) on an entire top surface of the resistor body film c20. The total film thickness of the two laminated film layers of the resistor body film c20 and the wiring film c21 may, for example, be approximately 8000 Å. In place of Al, the wiring film c21 may be formed from an aluminum-based metal film, such as AlSi, AlSiCu, or AlCu. By forming the wiring film c21 from an aluminum-based metal film, such as Al, AlSi, AlSiCu, or AlCu, the processing precision can be improved.

Step S4: Thereafter, a photolithography process is used to form a resist pattern, corresponding to the arrangement in a plan view of the resistor network c14 (the layout pattern including the conductor films C and the fuse films F) on a top surface of the wiring film c21 (formation of the first resist pattern). Step S5: A first etching step is then performed. That is, the laminated two-layer film of the resistor body film c20 and the wiring film c21 is etched, for example, by reactive ion etching (RIE) using the first resist pattern formed in step S4 as the mask. The first resist pattern is then peeled off after etching.

Step S6: The photolithography process is used again to form a second resist pattern. The second resist pattern formed in step S6 is a pattern for selectively removing the wiring film c21 laminated on the resistor body film c20 to form the unit resistor bodies R (regions indicated by being provided with fine dots in FIG. 66). Step S7: Only the wiring film c21 is etched selectively, for example, by wet etching using the second resist pattern, formed in step S6 as a mask (second etching step). After the etching, the second resist pattern is peeled off. The layout pattern of the resistor network c14 shown in FIG. 66 is thereby obtained.

Step S8: The resistance value of the resistor network c14 formed on the substrate top surface (the resistance value of the network c14 as a whole) is measured at this stage. This measurement is made, for example, by putting multiprobe pins in contact with an end portion of the resistor network c14 at the side connected to the first connection electrode c12 shown in FIG. 66 and end portions of the fuse film and the resistor network c14 at the side connected to the second connection electrode c13. The quality of the manufactured resistor network c14 in the initial state can be judged by this measurement.

Step S9: Thereafter, a cover film c22*a*, made, for example, of a nitride film, is formed so as to cover the entire surface of the resistor network c14 formed on the substrate c11. In place of a nitride film (SiN film), the cover film c22*a* may be an oxide film ($SiO_2$ film). The cover film c22*a* may be formed by a plasma CVD method, and a silicon nitride film (SiN film) with a film thickness, for example, of approximately 3000 Å may be formed. The cover film c22*a* covers the patterned wiring film c21, resistor body film c20, and fuse films F.

Step S10: From this state, laser trimming is performed to selectively fuse the fuse films F to adjust the chip resistor c10 to a desired resistance value. That is, as shown in FIG. 80(A), a fuse film F, selected in accordance with the measurement result of the total resistance value measurement performed in step S8, is irradiated with laser light to fuse the fuse film F and the resistor body film c20 positioned below it. The corresponding resistor circuit that was short-circuited by the fuse film F is thereby incorporated into the resistor network c14 to enable the resistance value of the resistor network c14 to be adjusted to the desired resistance value. When a fuse film F is irradiated with the laser light, the energy of the laser light is accumulated at a vicinity of the fuse film F by an action of the cover film c22*a* and the fuse film F and the resistor body film c20 below it is thereby fused.

Step S11: Thereafter as shown in FIG. 80(B), a passivation film c22 is formed by depositing a silicon nitride film on the cover film c22*a*, for example, by the plasma CVD method. In the final form, the cover film c22*a* is made integral with the passivation film c22 to constitute a portion of the passivation film c22. The passivation film c22 that is formed after the cutting of the fuse films F and the resistor body film c20 therebelow enters into openings 22*b* in the cover film c22*a* that is destroyed at the same time as the fusing of the fuse films F and the resistor body film c20 therebelow to protect cut surfaces of the fuse films F and the resistor body film c20 therebelow. The passivation film c22 thus prevents entry of foreign matter and entry of moisture into cut locations of the fuse films F. The passivation film c22 suffices to have a thickness, for example, of approximately 1000 to 20000 Å as a whole and may be formed to have a film thickness, for example, of approximately 8000 Å. Also as mentioned above, the passivation film c22 may be a silicon oxide film.

Step S12: Thereafter, a resin film c23 is coated on the entire surface as shown in FIG. 80(C). As the resin film c23, for example, a coating film c23 of a photosensitive polyimide is used. Step S13: Patterning of the resin film c23 by photolithography may be performed by performing an exposure step and a subsequent developing step on regions of the resin film corresponding to openings of the first connection electrode c12 and the second connection electrode c13. Pad openings for the first connection electrode c12 and the second connection electrode c13 are thereby formed in the resin film c23.

Step S14: Thereafter, heat treatment (polyimide curing) for curing the resin film c23 is performed and the polyimide film c23 is stabilized by the heat treatment. The heat treatment may, for example, be performed at a temperature of approximately 170° C. to 700° C. A merit that the characteristics of the resistor bodies (the resistor body film c20 and the patterned wiring film c21) are stabilized is also provided as a result. Step S15: Thereafter, the passivation film c22 is etched using the polyimide film c23, having penetrating holes at positions at which the first connection electrode c12 and the second connection electrode c13 are to be formed, as a mask. The pad openings that expose the wiring film c21 at a region of the first connection electrode c12 and a region of the second connection electrode c13 are thereby formed. The etching of the passivation film c22 may be performed by reactive ion etching (RIE).

Step S16: Multiprobe pins are put in contact with the wiring film c21 exposed from the two pad openings to perform resistance value measurement ("after" measurement) for confirming that the resistance value of the chip resistor is the desired resistance value. By performing the "after" measurement, in other words, performing the series of processes of the first measurement (initial measurement)→fusing of the fuse films F (laser repair)→"after" measurement, the trimming processing ability with respect to the chip resistor c10 is improved significantly.

Step S17: The first connection electrode c12 and the second connection electrode c13 are grown as external connection electrodes inside the two pad openings, for example, by an electroless plating method. Step S18: Thereafter, a third resist pattern is formed by photolithography for separation of the numerous (for example, 500 thousand) respective chip resistors, formed in an array on the wafer top surface, into the individual chip resistors c10. The resist film is provided on the wafer top surface to protect the respective chip resistors c10 shown, for example, in FIG. 82 and is formed so that intervals between the respective chip resistors c10 will be etched.

Step S19: Plasma dicing is then executed. The plasma dicing is the etching using the third resist pattern as a mask and a groove is formed between the respective chip resistors c10 to a predetermined depth from the top surface of the silicon wafer that is the substrate. Thereafter, the resist film is peeled off. Step S20: Then as shown, for example, in FIG. 81(A), a protective tape c100 is adhered onto the top surface.

Step S21: Thereafter, rear surface grinding of the silicon wafer is performed to separate the chip resistors into the individual chip resistors c10 (see FIG. 81(A) and FIG. 81(B)). Step S22: Then as shown in FIG. 81(C), a carrier tape (thermally foaming sheet) c200 is adhered onto the rear surface side, and the numerous chip resistors c10 that have been separated into the individual chip resistors are held in a state of being arrayed on the carrier tape c200. On the other hand, the protective tape adhered to the top surface is removed (see FIG. 81(D)).

Step S23: When the thermally foaming sheet c200 is heated, thermally foaming particles c201 contained in the interior swell and the respective chip resistors c10 adhered to the carrier tape c200 surface are thereby peeled off from the carrier tape c200 and separated into individual chips (see FIGS. 81(E) and 81(F)). Although a description was given above using chip resistors as preferred embodiments of the third reference example, the third reference example may also be applied to chip components besides chip resistors.

As another example of a chip component, a chip capacitor may be cited. A chip capacitor includes a substrate, a first external electrode disposed on the substrate, and a second external electrode similarly disposed on the substrate. A capacitor arrangement region is provided between the first external electrode and the second external electrode, and a plurality of capacitor parts are disposed as functional elements. The plurality of capacitor parts are respectively connected electrically to the first external electrode via a plurality of fuses.

The aforementioned issue can also be resolved in the chip capacitor by applying the third reference example to dispose the first external electrode and the second external electrode along the long direction of the substrate at respective sides in the short direction of the substrate top surface. As yet another example of a chip component, a chip inductor may be cited. A chip inductor is a component having, for example, a multilayer wiring structure on a substrate, having inductors (coils) and wiring related thereto inside the multilayer wiring structure, and being arranged so that an arbitrary inductor in the multilayer wiring structure can be incorporated into a circuit or disconnected from the circuit by a fuse. The aforementioned issue can also be resolved in the chip inductor by the structure of the external connection electrodes according to the third reference example, that is, by disposing the external connection electrodes along the long direction of the substrate at respective sides in the short direction of the substrate top surface.

As yet another example of a chip component, a chip diode may be cited. A chip diode is a component having, for example, a multilayer wiring structure on a substrate, having a plurality of diodes and wiring related thereto inside the multilayer wiring structure, and being arranged so that an arbitrary diode in the multilayer wiring structure can be incorporated into a circuit or disconnected from the circuit by a fuse. Rectification characteristics of the chip diode can be changed and adjusted by selection of the diode to be incorporated into the circuit. Voltage drop characteristics (resistance value) of the chip diode can also be set. Further, in the case of a chip LED, with which the diode is an LED (light emitting diode), the chip LED can be arranged to enable selection of the emitted color by selection of the LED to be incorporated into the circuit. The aforementioned issue can also be resolved in the chip diode or chip LED by the structure of the external connection electrodes according to the third reference example, that is, by disposing the external connection electrodes along the long direction of the substrate at respective sides in the short direction of the substrate top surface. The chip diode or chip LED can thereby be arranged as a chip component of high performance that is easy to handle.

Figure 83:
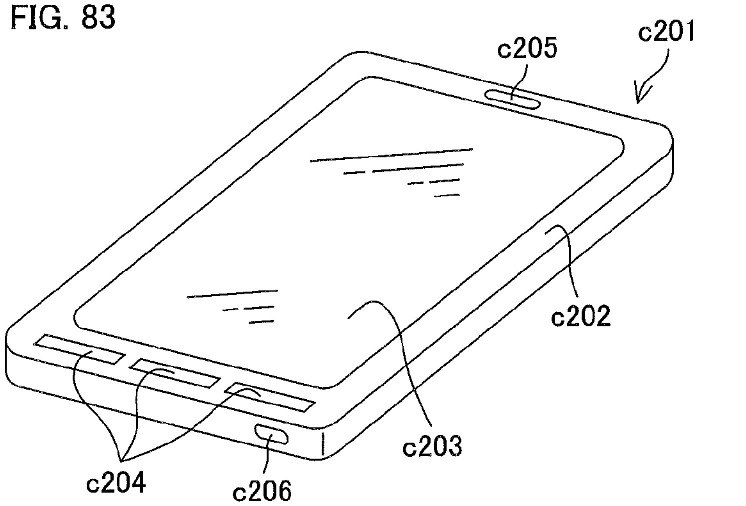
FIG. 83 is a perspective view of the outer appearance of a smartphone that is an example of an electronic equipment in which chip resistors according to the third reference example are used.

FIG. 83 is a perspective view of the outer appearance of a smartphone that is an example of an electronic equipment in which chip components according to the third reference example are used. The smartphone c201 is arranged by housing electronic parts in the interior of a housing c202 with a flat rectangular parallelepiped shape. The housing c202 has a pair of rectangular principal surfaces at its front side and rear side, and the pair of principal surfaces are joined by four side surfaces. A display surface of a display panel c203, constituted of a liquid crystal panel or an organic EL panel, etc., is exposed at one of the principal surfaces of the housing c202. The display surface of the display panel c203 constitutes a touch panel and provides an input interface for a user.

The display panel c203 is formed to a rectangular shape that occupies most of one of the principal surfaces of the housing c202. Operation buttons c204 are disposed along one short side of the display panel c203. In the present preferred embodiment, a plurality (three) of the operation buttons c204 are aligned along the short side of the display panel c203. The user can call and execute necessary functions by performing operations of the smartphone c210 by operating the operation buttons c204 and the touch panel.

A speaker c205 is disposed in a vicinity of the other short side of the display panel c203. The speaker c205 provides an earpiece for a telephone function and is also used as an acoustic conversion unit for reproducing music data, etc. On the other hand, close to the operation buttons c204, a microphone c206 is disposed at one of the side surfaces of the housing c202. The microphone c206 provides a mouthpiece for the telephone function and may also be used as a microphone for sound recording.

Figure 84:
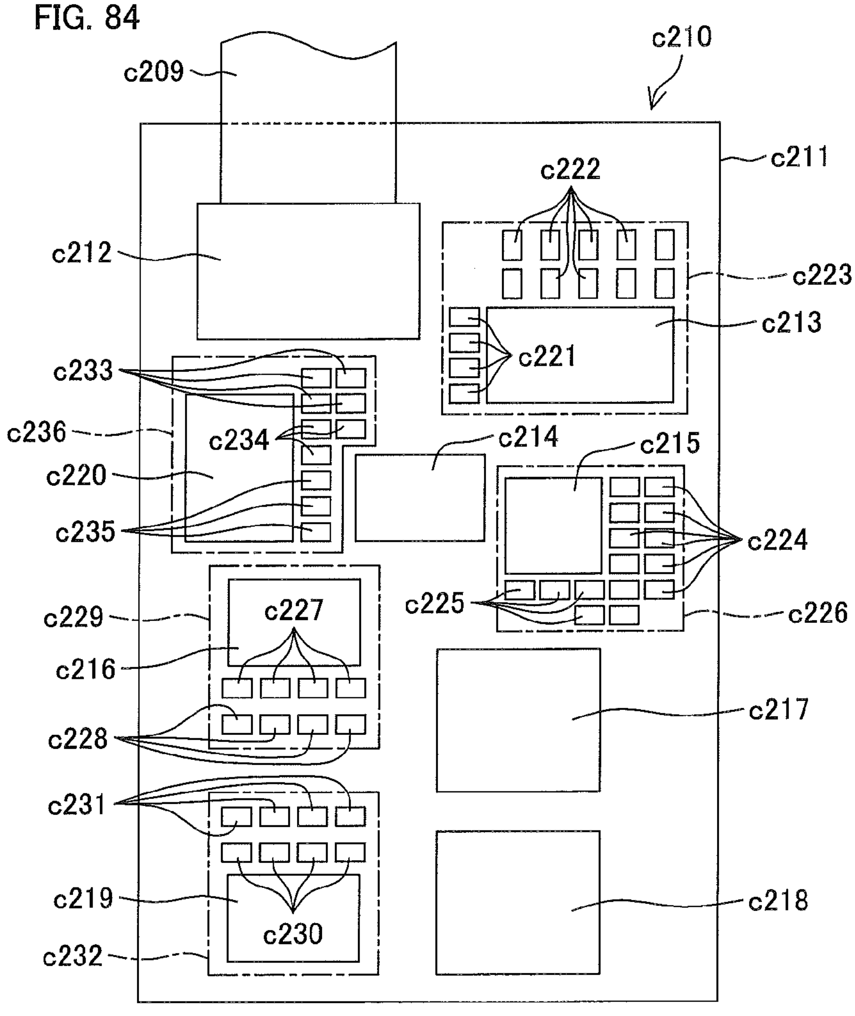
FIG. 84 is an illustrative plan view of the arrangement of an electronic circuit assembly c210 housed in a housing c202.

FIG. 84 is an illustrative plan view of the arrangement of an electronic circuit assembly c210 housed in the interior of the housing c202. The electronic circuit assembly c210 includes a wiring substrate c211 and circuit parts mounted on a mounting surface of the wiring substrate c211. The plurality of circuit parts include a plurality of integrated circuit elements (ICs) c212 to c220 and a plurality of chip components. The plurality of ICs include a transmission processing IC c212, a one-segment TV receiving IC c213, a GPS receiving IC c214, an FM tuner IC c215, a power supply IC c216, a flash memory c217, a microcomputer c218, a power supply IC c219, and a baseband IC c220. The plurality of chip components include chip inductors c221, c225, and c235, chip resistors c222, c224, and c233, chip capacitors c227, c230, and c234, and chip diodes c228 and c231. As the chip components, those with the arrangement according to the third reference example may be used.

The transmission processing IC c212 has incorporated therein an electronic circuit arranged to generate display control signals for the display panel c203 and receive input signals from the touch panel on a top surface of the display panel c203. For connection with the display panel c203, the transmission processing IC c212 is connected to a flexible wiring c209.

The one-segment TV receiving IC c213 incorporates an electronic circuit that constitutes a receiver for receiving one-segment broadcast (terrestrial digital television broadcast targeted for reception by portable equipment) radio waves. A plurality of the chip inductors c221 and a plurality of the chip resistors c222 are disposed in a vicinity of the one-segment TV receiving IC c213. The one-segment TV receiving IC c213, the chip inductors c221, and the chip resistors c222 constitute a one-segment broadcast receiving circuit c223. The chip inductors c221 and the chip resistors c222 respectively have accurately adjusted inductances and resistances and provide circuit constants of high precision to the one-segment broadcast receiving circuit c223.

The GPS receiving IC c214 incorporates an electronic circuit that receives radio waves from GPS satellites and outputs positional information of the smartphone c201. The FM tuner IC c215 constitutes, together with a plurality of the chip resistors c224 and a plurality of the chip inductors c225 mounted on the wiring substrate c211 in a vicinity thereof, an FM broadcast receiving circuit c226. The chip resistors c224 and the chip inductors c225 respectively have accurately adjusted resistance values and inductances and provide circuit constants of high precision to the FM broadcast receiving circuit c226.

A plurality of the chip capacitors c227 and a plurality of the chip diodes c228 are mounted on the mounting surface of the wiring substrate c211 in a vicinity of the power supply IC c216. Together with the chip capacitors c227 and the chip diodes c228, the power supply IC c216 constitutes a power supply circuit c229. The flash memory c217 is a storage device for recording operating system programs, data generated in the interior of the smartphone c201, and data and programs acquired from the exterior by communication functions, etc.

The microcomputer c218 is a computing processing circuit that incorporates a CPU, a ROM, and a RAM and realizes a plurality of functions of the smartphone c201 by executing various computational processes. More specifically, computational processes for image processing and various application programs are realized by actions of the microcomputer c218. A plurality of the chip capacitors c230 and a plurality of the chip diodes c231 are mounted on the mounting surface of the wiring substrate c211 in a vicinity of the power supply IC c219. Together with the chip capacitors c230 and the chip diodes c231, the power supply IC c219 constitutes a power supply circuit c232.

A plurality of the chip resistors c233, a plurality of the chip capacitors c234, and a plurality of the chip inductors c235 are mounted on the mounting surface of the wiring substrate c211 in a vicinity of the baseband IC c220. Together with the chip resistors c233, the chip capacitors c234, and the chip inductors c235, the baseband IC c220 constitutes a baseband communication circuit c236. The baseband communication circuit c236 provides communication functions for telephone communication and data communication.

With the above arrangement, electric power that is appropriately adjusted by the power supply circuits c229 and c232 is supplied to the transmission processing IC c212, the GPS receiving IC c214, the one-segment broadcast receiving circuit c223, the FM broadcast receiving circuit c226, the baseband communication circuit c236, the flash memory c217, and the microcomputer c218. The microcomputer c218 performs computational processes in response to input signals input via the transmission processing IC c212 and makes the display control signals be output from the transmission processing IC c212 to the display panel c203 to make the display panel c203 perform various displays.

When receiving of a one-segment broadcast is commanded by operation of the touch panel or the operation buttons c204, the one-segment broadcast is received by actions of the one-segment broadcast receiving circuit c223. Computational processes for outputting the received images to the display panel c203 and making the received audio signals be acoustically converted by the speaker c205 are executed by the microcomputer c218. Also, when positional information of the smartphone c201 is required, the microcomputer c218 acquires the positional information output by the GPS receiving IC c214 and executes computational processes using the positional information.

Further, when an FM broadcast receiving command is input by operation of the touch panel or the operation buttons c204, the microcomputer c218 starts up the FM broadcast receiving circuit c226 and executes computational processes for outputting the received audio signals from the speaker c205. The flash memory c217 is used for storing data acquired by communication and storing data prepared by computations by the microcomputer c218 and inputs from the touch panel. The microcomputer c218 writes data into the flash memory c217 or reads data from the flash memory c217 as necessary.

The telephone communication or data communication functions are realized by the baseband communication circuit c236. The microcomputer c218 controls the baseband communication circuit c236 to perform processes for sending and receiving audio signals or data.

Invention According to a Fourth Reference Example

(1) Features of the Invention According to the Fourth Reference Example

For example, the features of the invention according to the fourth reference example are the following D1 to D18.

(D1) A chip component where two electrodes are formed across an interval on a substrate and are disposed on one surface across an interval from a peripheral edge portion of the substrate.

With this arrangement, the respective electrodes in the chip component are disposed inwardly away from the peripheral edge portion of the substrate, and therefore when the chip component is mounted on a mounting substrate, solders bonding the respective electrodes and lands of the mounting substrate are disposed inwardly from the peripheral edge portion of the substrate and are not extruded outside the peripheral edge portion or are low in extrusion amount even if extruded. Consequently, the practical mounting area of the chip component on the mounting substrate can be suppressed to be small. That is, the chip component can be mounted on the mounting substrate at a small mounting area.

(D2) The chip component according to D1, not having an electrode on a surface besides the one surface.

With this arrangement, the electrodes are provided only on the surface at one side (the one surface) of the chip component, and therefore a surface of the chip component besides the surface at one side is a flat surface without electrodes (unevenness). Therefore, for example, in moving the chip component by suctioning it by a suction nozzle of an automatic mounting machine, the suction nozzle can be made to suction the flat surface. The suction nozzle can thereby be made to suction the chip component reliably and the chip component can be conveyed reliably without dropping off from the suction nozzle in the middle.

(D3) The chip component according to D1 or D2, which is a chip resistor including a resistor body formed on the substrate and connected between the two electrodes.

By this arrangement, the chip resistor can be mounted on a mounting substrate at a small mounting area.

(D4) The chip component according to D3, further including a plurality of the resistor bodies and a plurality of fuses provided on the substrate and disconnectably connecting each of the plurality of the resistor bodies to the electrodes.

With this arrangement, the chip component (chip resistor) can be made to accommodate a plurality of types of resistance values easily and rapidly by selecting and cutting one or a plurality of the fuses. In other words, chip resistors of various resistance values can be realized with a common design by combining a plurality of resistor bodies that differ in resistance value.

(D5) The chip component according to D1 or D2, which is a chip capacitor including a capacitor element formed on the substrate and connected between the two electrodes.

By this arrangement, the chip capacitor can be mounted on a mounting substrate at a small mounting area.

(D6) The chip component according to D5, further including a plurality of the capacitor parts constituting the capacitor element and a plurality of fuses provided on the substrate and disconnectably connecting each of the plurality of the capacitor parts to the electrodes.

With this arrangement, the chip component (chip capacitor) can be made to accommodate a plurality of types of capacitance values easily and rapidly by selecting and cutting one or a plurality of the fuses. In other words, chip capacitors of various capacitance values can be realized with a common design by combining a plurality of capacitor parts that differ in capacitance value.

(D7) The chip component according to D1 or D2, which is a chip diode including a diode element formed on the substrate and connected between the two electrodes.

By this arrangement, the chip diode can be mounted on a mounting substrate at a small mounting area.

(D8) The chip component according to D7, further including a plurality of the diode parts constituting the diode element and a plurality of fuses provided on the substrate and disconnectably connecting each of the plurality of the diode parts to the electrodes.

With this arrangement, the combination pattern of the plurality of diode parts in the chip component (chip diode) can be set to any pattern by selecting and cutting one or a plurality of the fuses, thereby enabling chip diodes of various electrical characteristics to be realized with a common design.

(D9) The chip component according to D1 or D2, which is a chip inductor including an inductor element formed on the substrate and connected between the two electrodes.

By this arrangement, the chip inductor can be mounted on a mounting substrate at a small mounting area.

(D10) The chip component according to D9, further including a plurality of the inductor parts constituting the inductor element and a plurality of fuses provided on the substrate and disconnectably connecting each of the plurality of the inductor parts to the electrodes.

With this arrangement, the combination pattern of the plurality of inductor parts in the chip component (chip inductor) can be set to any pattern by selecting and cutting one or a plurality of the fuses, thereby enabling chip inductors of various electrical characteristics to be realized with a common design.

(D11) The chip component according to any one of D1 to D10, where each electrode includes a Ni layer and an Au layer, and the Au layer is exposed at the topmost surface.

With this arrangement, the surface of the Ni layer of each electrode is covered by the Au layer so that oxidation of the Ni layer can be prevented.

(D12) The chip component according to D11, where each electrode further includes a Pd layer interposed between the Ni layer and the Au layer. With this arrangement, even if a penetrating hole (pinhole) forms in the Au layer of the electrode due to thinning of the Au layer, the Pd layer interposed between the Ni layer and the Au layer closes the penetrating hole and the Ni layer can thus be prevented from being exposed to the exterior through the penetrating hole and becoming oxidized.

(D13) A circuit assembly including the chip component according to any one of D1 to D12 and a mounting substrate having two lands, solder-bonded to the two electrodes, on amounting surface facing the one surface of the chip component.

With this arrangement, the chip component can be mounted on the mounting substrate at a small mounting area in the circuit assembly.

(D14) The circuit assembly according to D13, where the solders stay within the range of the chip component when viewed from the direction of a normal to the mounting surface. With this arrangement, the solders are reliably prevented from extruding outside the peripheral edge portion of the substrate. Consequently, the practical mounting area of the chip component on the mounting substrate can be suppressed to be small reliably.

(D15) The circuit assembly according to D13 or D14, further including a first mounting substrate that is the mounting substrate and a second mounting substrate laminated on the first mounting substrate and having an opening housing the chip component.

With this arrangement, a multilayer substrate can be arranged by the first mounting substrate and the second mounting substrate of the circuit assembly and the chip component can be mounted at a small mounting area on the multilayer substrate.

(D16) The circuit assembly according to D15, further including a third mounting substrate laminated on the second mounting substrate and closing the opening of the second mounting substrate.

With this arrangement, a multilayer substrate can be arranged by the first mounting substrate, the second mounting substrate, and the third mounting substrate of the circuit assembly and the chip component can be mounted at a small mounting area on the multilayer substrate.

(D17) An electronic equipment preferably includes the chip component described above.

(D18) An electronic equipment preferably includes the circuit assembly described above.

(2) Preferred Embodiments of the Invention Related to the Fourth Reference Example Preferred embodiments of the fourth reference example shall now be described in detail with reference to the attached drawings. The symbols indicated in FIG. 85 to FIG. 106 are effective only for these drawings and, even if used in other preferred embodiments, do not indicate the same components as the symbols in the other preferred embodiments.

Figure 85A:
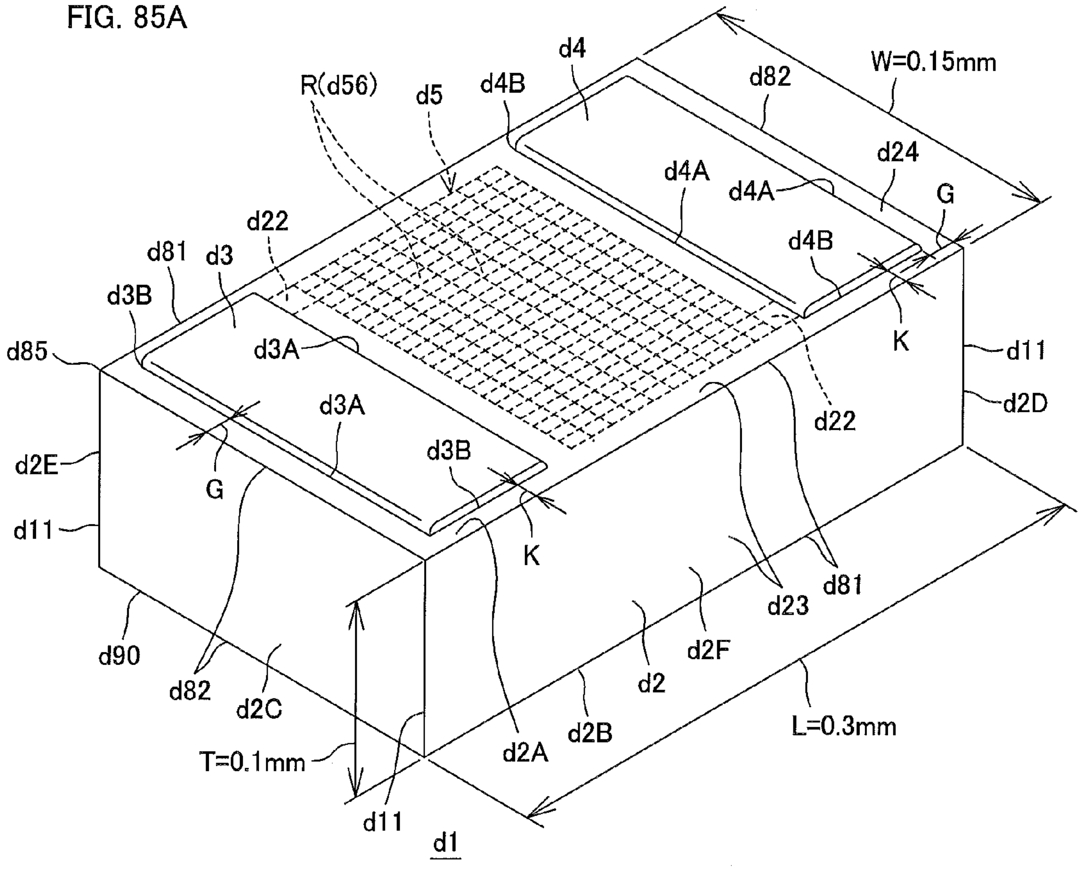
FIG. 85A is a schematic perspective view for describing the arrangement of a chip resistor according to a preferred embodiment of a fourth reference example.

FIG. 85A is a schematic perspective view for describing the arrangement of a chip resistor according to a preferred embodiment of the fourth reference example. The chip resistor d1 is a minute chip component and, as shown in FIG. 85A, has a rectangular parallelepiped shape. The planar shape of the chip resistor d1 is a rectangular shape with the two orthogonal sides (long side d81 and short side d82) being not more than 0.4 mm and not more than 0.2 mm, respectively. Preferably in regard to the dimensions of the chip resistor d1, the length L (length of the long side d81) is approximately 0.3 mm, the width W (length of the short side d82) is approximately 0.15 mm, and the thickness T is approximately 0.1 mm.

The chip resistor d1 is obtained by forming multiple chip resistors d1 in a lattice on a substrate, then forming a groove in the substrate, and thereafter performing rear surface grinding (splitting of the substrate at the groove) to perform separation into the individual chip resistors d1. The chip resistor d1 mainly includes a substrate d2 that constitutes the main body of the chip resistor d1, a first connection electrode d3 and a second connection electrode d4 that are to be external connection electrodes, and an element d5 connected to the exterior by the first connection electrode d3 and the second connection electrode d4.

The substrate d2 has a substantially rectangular parallelepiped chip shape. With the substrate d2, the surface constituting the upper surface in FIG. 85A is an element forming surface d2A. The element forming surface d2A is the surface of the substrate d2 on which the element d5 is formed and has a substantially rectangular shape. The surface at the opposite side of the element forming surface d2A in the thickness direction of the substrate d2 is a rear surface d2B. The element forming surface d2A and the rear surface d2B are substantially the same in dimensions and same in shape and are parallel to each other. A rectangular edge defined by the pair of long sides d81 and short sides d82 at the element forming surface d2A shall be referred to as a peripheral edge portion d85 and a rectangular edge defined by the pair of long sides d81 and short sides d82 at the rear surface d2B shall be referred to as a peripheral edge portion d90. When viewed from the direction of a normal orthogonal to the element forming surface d2A (rear surface d2B), the peripheral edge portion d85 and the peripheral edge portion d90 are overlapped (see FIG. 85D described below).

As surfaces besides the element forming surface d2A and the rear surface d2B, the substrate d2 has a plurality of side surfaces (a side surface d2C, a side surface d2D, a side surface d2E, and a side surface d2F). The plurality of side surfaces extend so as to intersect (specifically, so as to be orthogonal to) each of the element forming surface d2A and the rear surface d2B and join the element forming surface d2A and the rear surface d2B. The side surface d2C is constructed between the short sides d82 at one side in the long direction (the front left side in FIG. 85A) of the element forming surface d2A and the rear surface d2B, and the side surface d2D is constructed between the short sides d82 at the other side in the long direction (the inner right side in FIG. 85A) of the element forming surface d2A and the rear surface d2B. The side surfaces d2C and d2D are the respective end surfaces of the substrate d2 in the long direction. The side surface d2E is constructed between the long sides d81 at one side in the short direction (the inner left side in FIG. 85A) of the element forming surface d2A and the rear surface d2B, and the side surface d2F is constructed between the long sides d81 at the other side in the short direction (the front right side in FIG. 85A) of the element forming surface d2A and the rear surface d2B. The side surfaces d2E and d2F are the respective end surfaces of the substrate d2 in the short direction. Each of the side surface d2C and the side surface d2D intersects (specifically, is orthogonal to) each of the side surface d2E and the side surface d2F. Mutually adjacent surfaces among the element forming surface d2A to side surface d2F thus form a right angle.

With the substrate d2, the respective entireties of the element forming surface d2A and the side surfaces d2C to d2F are covered by a passivation film d23. Therefore to be exact, the respective entireties of the element forming surface d2A and the side surfaces d2C to d2F in FIG. 85A are positioned at the inner sides (rear sides) of the passivation film d23 and are not exposed to the exterior. The chip resistor d1 further has a resin film d24. The resin film d24 covers the entirety (the peripheral edge portion d85 and a region at the inner side thereof) of the passivation film d23 on the element forming surface d2A. The passivation film d23 and the resin film d24 shall be described in detail later.

The first connection electrode d3 and the second connection electrode d4 are formed on a region of the element forming surface d2A of the substrate d2 that is positioned further inward than the peripheral edge portion d85 (at positions each separated from the peripheral edge portion d85 by an interval) and are partially exposed from the resin film d24 on the element forming surface d2A. In other words, the resin film d24 covers the element forming surface d2A (to be exact, the passivation film d23 on the element forming surface d2A) so as to expose the first connection electrode d3 and the second connection electrode d4. Each of the first connection electrode d3 and the second connection electrode d4 is arranged by laminating, for example, Ni (nickel), Pd (palladium), and Au (gold) in that order on the element forming surface d2A. The first connection electrode d3 and the second connection electrode d4 are disposed across an interval with respect to each other in the long direction of the element forming surface d2A and have rectangular shapes that are long in the short direction of the element forming surface d2A. In FIG. 85A, the first connection electrode d3 is provided at a position of the element forming surface d2A close to the side surface d2C and the second connection electrode d4 is provided at a position close to the side surface d2D.

The first connection electrode d3 and the second connection electrode d4 are substantially the same in dimensions and the same in shape in a plan view of looking from the direction of the normal. The first connection electrode d3 has a pair of long sides d3A and short sides d3B that form four sides in a plan view. The long sides d3A and the short sides d3B are orthogonal in a plan view. The second connection electrode d4 has a pair of long sides d4A and short sides d4B that form four sides in a plan view. The long sides d4A and the short sides d4B are orthogonal in a plan view. The long sides d3A and the long sides d4A extend in parallel to the short sides d82 of the substrate d2, and the short sides d3B and the short side d4B extend parallel to the long sides d81 of the substrate d2. A top surface of the first connection electrode d3 is curved toward the substrate d2 side at both end portions at the long sides d3A. A top surface of the second connection electrode d4 is also curved toward the substrate d2 side at both end portions at the long sides d4A.

In a plan view, the entirety of the long side d3A, which, among the pair of long sides d3A of the first connection electrode d3, is nearest to the peripheral edge portion d85 of the element forming surface d2A of the substrate d2 (the long side d3A at the front left side in FIG. 85A) is separated toward the interior of the substrate d2 from the nearest peripheral edge portion d85 (short side d82) by just a distance G in the long direction of the substrate d2. In a plan view, the entirety of the long side d4A, which, among the pair of long sides d4A of the second connection electrode d4, is nearest to the peripheral edge portion d85 of the element forming surface d2A of the substrate d2 (the long side d4A at the inner right side in FIG. 85A) is also separated toward the interior of the substrate d2 from the nearest peripheral edge portion d85 (short side d82) by just the distance G in the long direction of the substrate d2. The distance G is, for example, 5 μm.

In a plan view, the entirety of each short side d3B of the first connection electrode d3 is separated toward the interior of the substrate d2 from the nearest peripheral edge portion d85 (long side d81) by just a distance K in the short direction of the substrate d2. In a plan view, the entirety of each short side d4B of the second connection electrode d4 is also separated toward the interior of the substrate d2 from the nearest peripheral edge portion d85 (long side d81) by just the distance Kin the short direction of the substrate d2. The distance K is, for example, 5 μm.

In the present preferred embodiment, the distance G and the distance K are both 5 μm and equal, and therefore each of the first connection electrode d3 and the second connection electrode d4 is separated toward the interior of the substrate d2 from the peripheral edge portion d85 by just an equal distance in a plan view. However, each of the distance G and the distance K may be changed to any value. The chip resistor d1 does not have an electrode at a surface besides the element forming surface d2A on which the first connection electrode d3 and the second connection electrode d4 are formed (that is, any of the rear surface d2B and side surfaces d2C to d2F).

The element d5 is a circuit element, is formed in a region of the element forming surface d2A of the substrate d2 between the first connection electrode d3 and the second connection electrode d4, and is covered from above by the passivation film d23 and the resin film d24. The element d5 of the present preferred embodiment is a resistor d56. The resistor d56 is arranged by a circuit network in which a plurality of (unit) resistor bodies R, having an equal resistance value, are arrayed in a matrix on the element forming surface d2A. The resistor bodies R are made of TiN (titanium nitride) or TiON (titanium oxide nitride) or TiSiON. The element d5 is electrically connected to wiring films d22, to be described below, and is electrically connected to the first connection electrode d3 and the second connection electrode d4 via the wiring films d22. The element d5 is thus formed on the substrate d2 and is connected between the first connection electrode d3 and the second connection electrode d4.

Figure 85B:
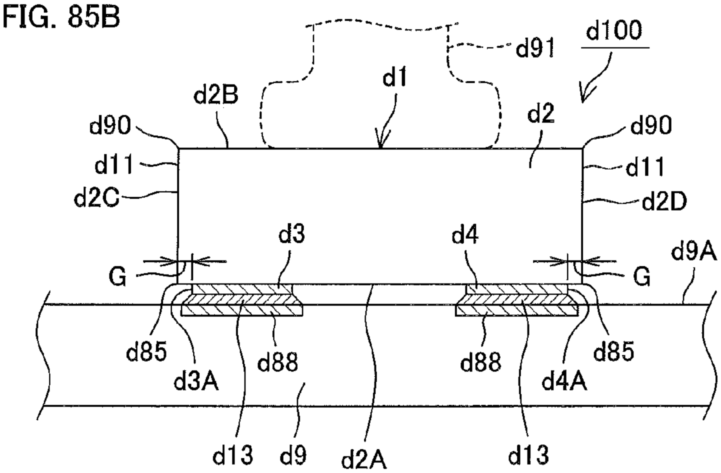
FIG. 85B is a schematic sectional view, taken along a long direction of the chip resistor, of a circuit assembly in a state where the chip resistor is mounted on a mounting substrate.
Figure 85C:
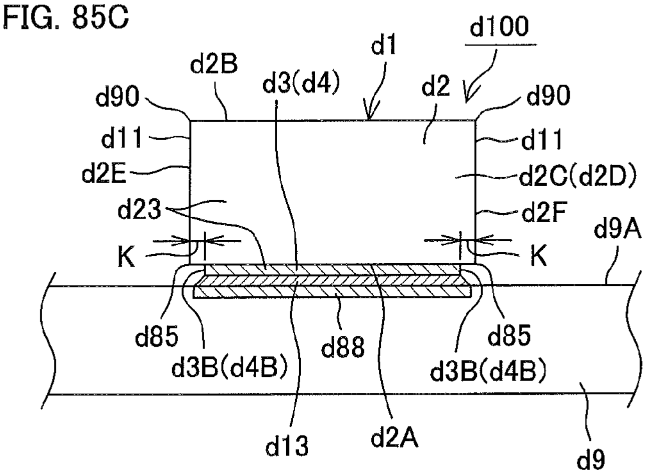
FIG. 85C is a schematic sectional view, taken along a short direction of the chip resistor, of the circuit assembly in the state where the chip resistor is mounted on the mounting substrate.

FIG. 85B is a schematic sectional view, taken along a long direction of the chip resistor, of a circuit assembly in a state where the chip resistor is mounted on a mounting substrate. FIG. 85C is a schematic sectional view, taken along a short direction of the chip resistor, of the circuit assembly in the state where the chip resistor is mounted on the mounting substrate. Only principal portions are shown in section in FIG. 85B and FIG. 85C.

The chip resistor d1 is mounted on a mounting substrate d9 as shown in FIG. 85B. The chip resistor d1 and the mounting substrate d9 in this state constitute the circuit assembly d100. An upper surface of the mounting substrate d9 in FIG. 85B is a mounting surface d9A. A pair (two) of lands d88, connected to an internal circuit (not shown) of the mounting substrate d9, are formed on the mounting surface d9A. Each land d88 is formed, for example, of Cu. On a top surface of each land d88, a solder d13 is provided so as to project from the top surface.

In mounting the chip resistor d1 on the mounting substrate d9, the rear surface d2B of the chip resistor d1 is suctioned onto a suction nozzle d91 of an automatic mounting machine (not shown) and then the suction nozzle d91 is moved to convey the chip resistor d1. In this process, a substantially central portion in the long direction of the rear surface d2B is suctioned onto the suction nozzle d91. As mentioned above, the first connection electrode d3 and the second connection electrode d4 are formed only on a surface atone side (the element forming surface d2A) of the chip resistor d1, and therefore the surfaces d2B to d2F (especially the rear surface d2B) of the chip resistor d1 besides the element forming surface d2A are flat surfaces without electrodes (unevenness). The flat rear surface d2B can thus be suctioned onto the suction nozzle d91 when moving the chip resistor d1 upon being suctioned by the suction nozzle d91. In other words, with the flat rear surface d2B, a margin of the portion enabling suction by the suction nozzle d91 can be increased. The chip resistor d1 can thereby be suctioned reliably onto the suction nozzle d91 and the chip resistor d1 can be conveyed reliably without dropping off from the suction nozzle d91 in the middle.

The suction nozzle d91 with the chip resistor d1 suctioned thereon is then moved to the mounting substrate d9. At this point, the element forming surface d2A of the chip resistor d1 and the mounting surface d9A of the mounting substrate d9 face each other. In this state, the suction nozzle d91 is moved and pressed against the mounting substrate d9 so that, with the chip resistor d1, the first connection electrode d3 is contacted with the solder d13 on one land d88 and the second connection electrode d4 is contacted with the solder d13 on the other land d88. The solders d13 are then heated so that the solders d13 melt. Thereafter, when the solders d13 are cooled and solidified, the first connection electrode d3 and the one land d88 become bonded via the solder d13 and the second connection electrode d4 and the other land d88 become bonded via the solder d13. That is, each of the two lands d88 is solder-bonded to the corresponding electrode among the first connection electrode d3 and the second connection electrode d4. Mounting (flip-chip connection) of the chip resistor d1 to the mounting substrate d9 is thereby completed and the circuit assembly d100 is completed. The first connection electrode d3 and the second connection electrode d4 that function as the external connection electrodes are preferably formed of gold (Au) or has gold plating applied on the top surfaces thereof as shall be described below to improve solder wettability and improve reliability.

Figure 85D:
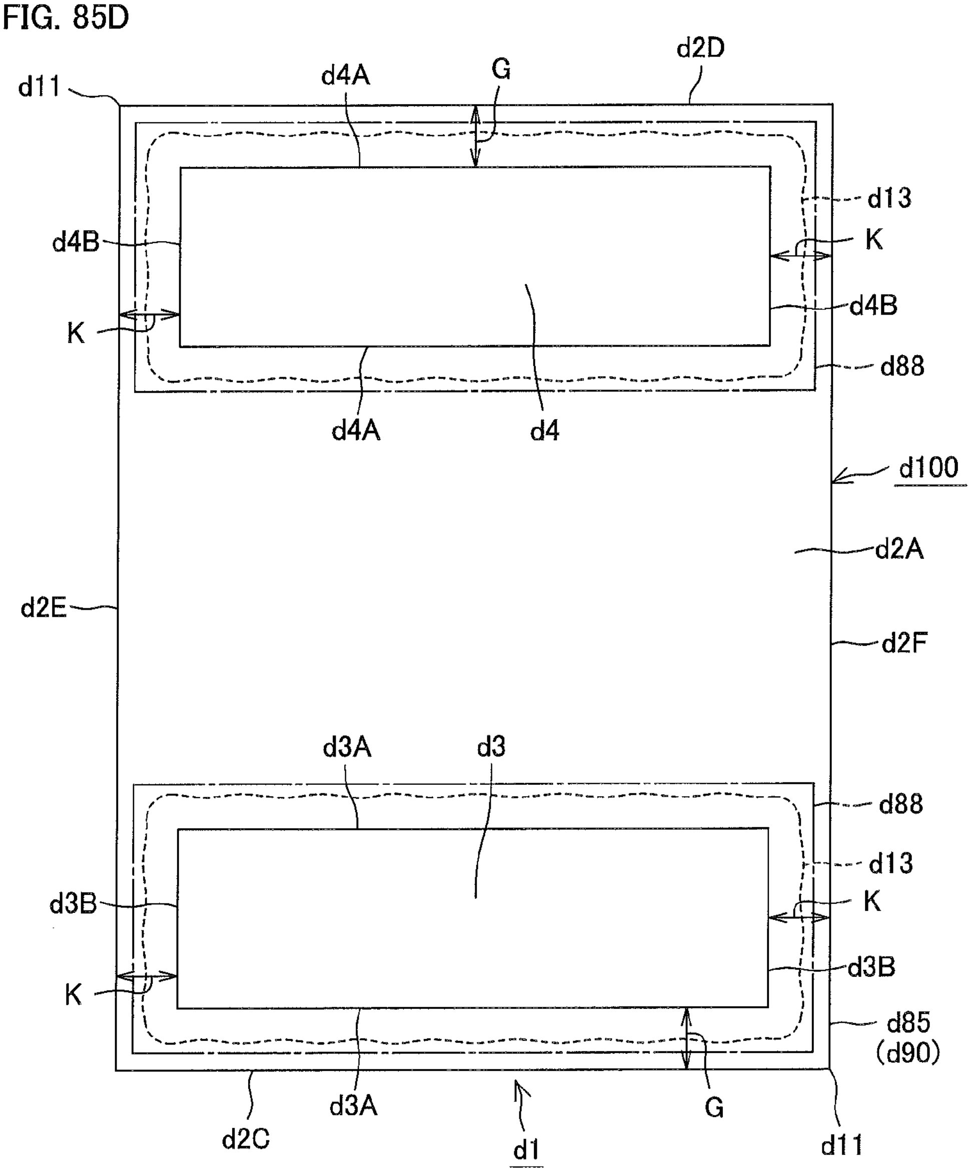
FIG. 85D is a schematic plan view, as viewed from an element forming surface side, of the chip resistor in the state of being mounted on the mounting substrate.

In the circuit assembly d100 in the completed state, the element forming surface d2A of the chip resistor d1 and the mounting surface d9A of the mounting substrate d9 extend parallel while facing each other across a gap (see also FIG. 85C). The dimension of the gap corresponds to the total of the thickness of the portion of the first connection electrode d3 or the second connection electrode d4 projecting from the element forming surface d2A and the thickness of the solders d13. FIG. 85D is a schematic plan view, as viewed from the element forming surface side, of the chip resistor in the state of being mounted on the mounting substrate. The circuit assembly d100 (to be accurate, the portion of bonding of the chip resistor d1 and the mounting substrate d9) shall now be viewed from the direction of the normal to the mounting surface d9A (and the element forming surface d2A) (the direction orthogonal to these surfaces) as shown in FIG. 85D. In this case, although the solder d13 bonding the first connection electrode d3 and the one land d88 is slightly extruded outside the outline of the first connection electrode d3 (the long sides d3A and the short sides d3B), it stays within the range of the chip resistor d1 (at the inner side of the peripheral edge portion d85 of the substrate d2). Similarly, although the solder d13 bonding the second connection electrode d4 and the other land d88 is slightly extruded outside the outline of the second connection electrode d4 (the long sides d4A and the short sides d4B), it stays within the range of the chip resistor d1 (at the inner side of the peripheral edge portion d85 of the substrate d2).

With the chip resistor d1, the first connection electrode d3 and the second connection electrode d4 are thus disposed inwardly away from the peripheral edge portion d85 of the substrate d2. Therefore the solders d13 bonding the first connection electrode d3 and the second connection electrode d4 to the lands d88 are disposed inwardly from the peripheral edge portion d85 of the substrate d2 and are not extruded outside the peripheral edge portion d85 as solder fillets or are low in extrusion amount even if extruded. Consequently, the practical mounting area of the chip resistor d1 on the mounting substrate d9 can be suppressed to be small. That is, the chip resistor d1 can be mounted on the mounting substrate d9 at a small mounting area, and with the circuit assembly d100, the chip resistor d1 can be mounted on the mounting substrate d9 at a small mounting area. Therefore when a plurality of chip resistors d1 are to be mounted adjacent to each other, the interval between mutually adjacent chip resistors d1 can be reduced to enable high density mounting of the chip resistors d1.

Figure 85E:
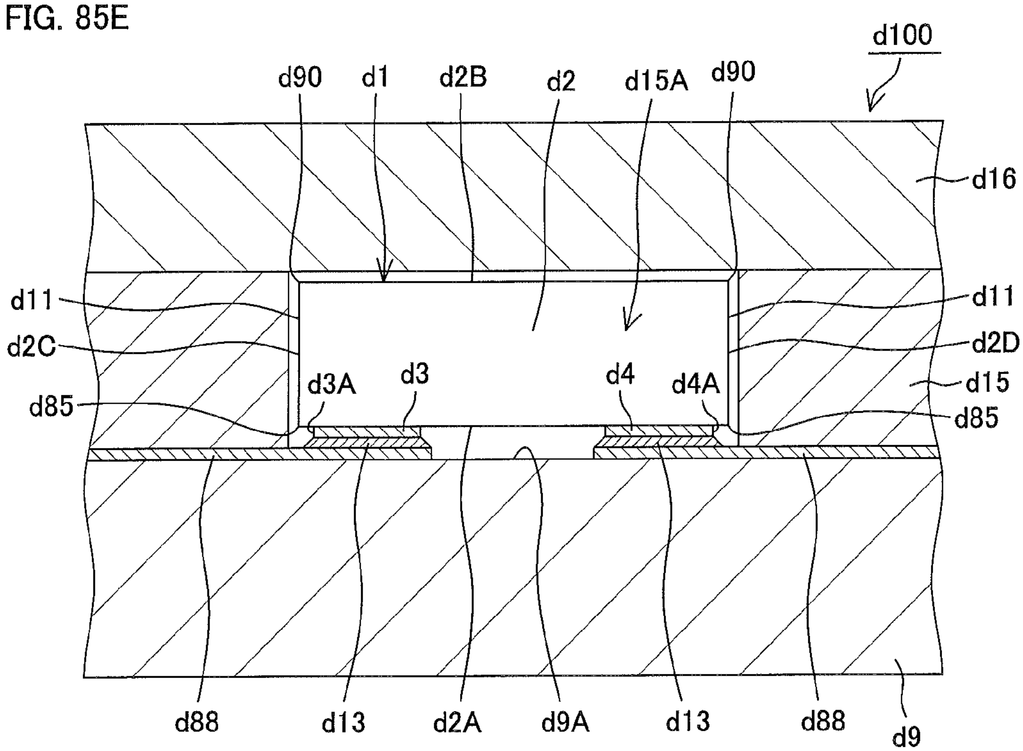
FIG. 85E is a schematic sectional view, taken along the long direction of the chip resistor, of a circuit assembly in a state where the chip resistor is mounted on a multilayer substrate.

FIG. 85E is a schematic sectional view, taken along the long direction of the chip resistor, of a circuit assembly in a state where the chip resistor is mounted on a multilayer substrate. Although the circuit assembly d100 with which the chip resistor d1 is mounted on the single mounting substrate d9 was described above (see FIG. 85B), there may also be a circuit assembly d100 where the chip resistor d1 is mounted on a so-called multilayer substrate as shown in FIG. 85E. In this case, the circuit assembly d100 includes a first mounting substrate d9, which is the mounting substrate d9 described above, and a second mounting substrate d15.

The first mounting substrate d9 and the second mounting substrate d15 constitute the multilayer substrate.

The pair of lands d88 are formed across an interval with respect to each other on the mounting surface d9A of the first mounting substrate d9. The solder d13 is provided on a top surface of an end portion of each land d88 that is nearest to the counterpart land d88. The second mounting substrate d15 is laminated on the first mounting substrate d9 via the lands d88. The second mounting substrate d15 has formed therein an opening 15A that penetrates through the second mounting substrate d15 in the thickness direction. The opening 15A has a size enabling the housing of the chip resistor d1. Both of the solders d13 of the pair of lands d88 are exposed in the opening 15A. In such a circuit assembly d100, the chip resistor d1 is mounted on the first mounting substrate d9 in a state of being completely housed in the opening 15A of the second mounting substrate d15.

Also, the circuit assembly d100 having the multilayer substrate may further include a third mounting substrate d16 besides the first mounting substrate d9 and the second mounting substrate d15. The third mounting substrate d16 is laminated on the second mounting substrate d15 and closes the opening 15A at the side opposite to the first mounting substrate d9 side. The chip resistor d1 inside the opening 15A is thereby put in a sealed state.

Figure 86:
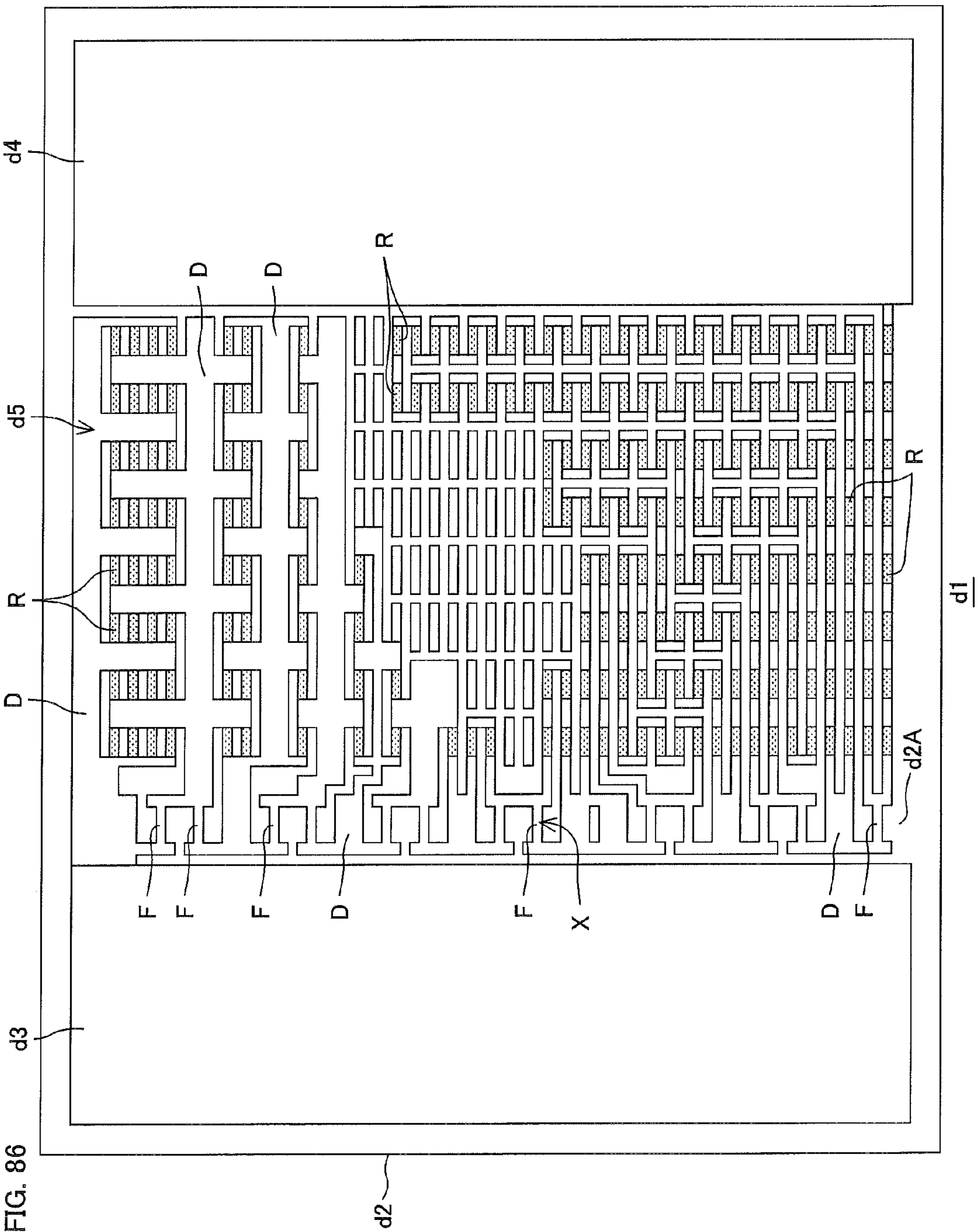
FIG. 86 is a plan view of a chip resistor showing the positional relationship of a first connection electrode, a second connection electrode, and an element and showing the arrangement in a plan view of the element.

Therefore with the circuit assembly d100, the multilayer substrate can be arranged by the first mounting substrate d9 and the second mounting substrate d15 (and the third mounting substrate d16 if necessary) and the chip resistor d1 can be mounted on the multilayer substrate at a small mounting area. Another arrangement of the chip resistor d1 shall mainly be described below. FIG. 86 is a plan view of a chip resistor showing the positional relationship of a first connection electrode, a second connection electrode, and an element and showing the arrangement (layout pattern) in a plan view of the element.

With reference to FIG. 86, the element d5 is a resistor network. Specifically, the element d5 has a total of 352 resistor bodies R arranged from 8 resistor bodies R arrayed along the row direction (length direction of the substrate d2) and 44 resistor bodies R arrayed along the column direction (width direction of the substrate d2). The resistor bodies R are the plurality of element parts that constitute the resistor network of the element d5.

The plurality of resistor bodies R are electrically connected in groups of predetermined numbers of 1 to 64 each to form a plurality of types of resistor circuits. The plurality of types of resistor circuits thus formed are connected in predetermined modes by conductor films D (wiring films formed of a conductor). Further, on the element forming surface d2A of the substrate d2, a plurality of fuses F are provided that are capable of being cut (fused) to electrically incorporate resistor circuits into the element d5 or electrically separate resistor circuits from the element d5. The plurality of fuses F and the conductor films D are arrayed along the inner side of the first connection electrode d3 so that the positioning regions thereof are rectilinear. More specifically, the plurality of fuses F and the conductor films D are disposed adjacently and the direction of alignment thereof is rectilinear. The plurality of fuses F connect each of the plurality of types of resistor circuits (each of the pluralities of resistor bodies R of the respective resistor circuits) to the first connection electrode d3 in a manner enabling cutting (enabling disconnection).

Figure 87A:
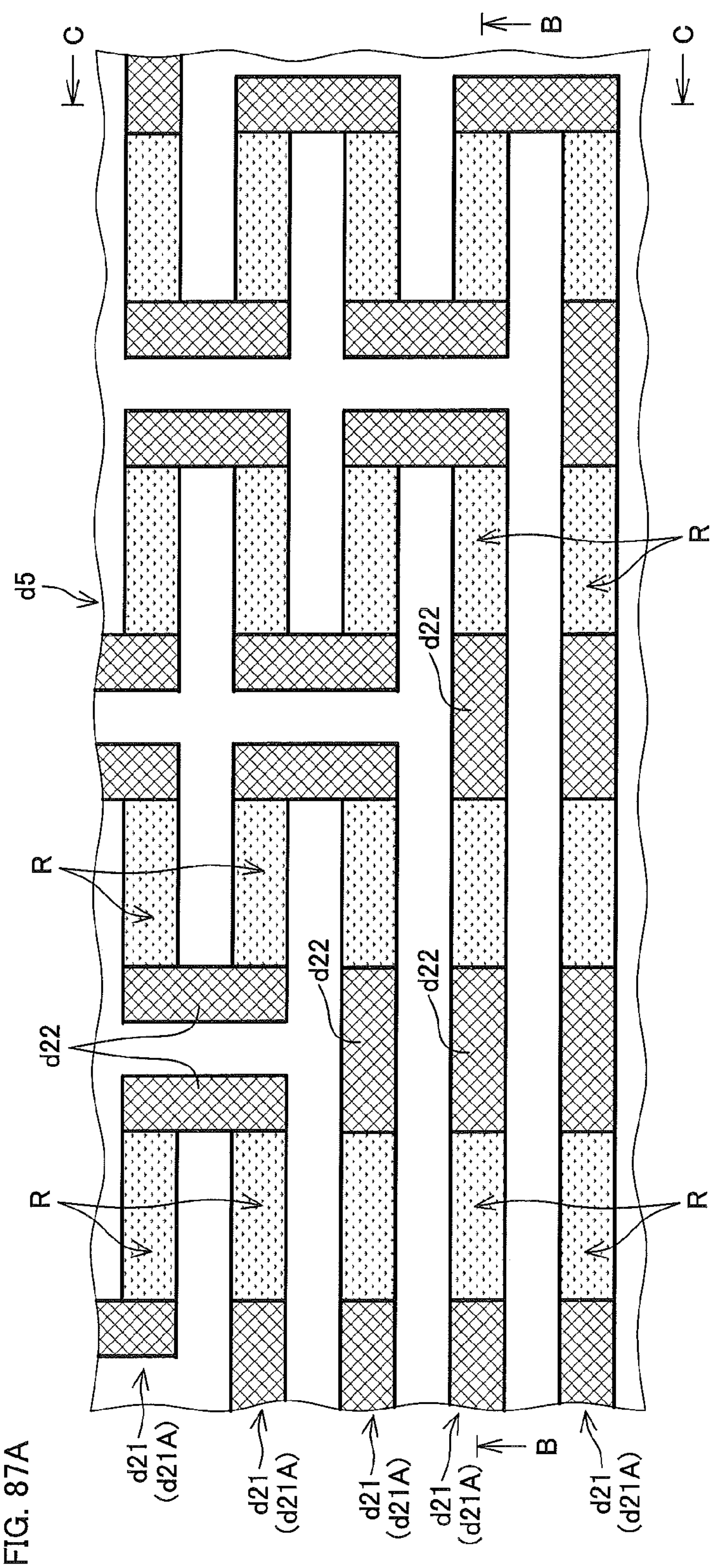
FIG. 87A is a partially enlarged plan view of the element shown in FIG. 86.
Figure 87B:
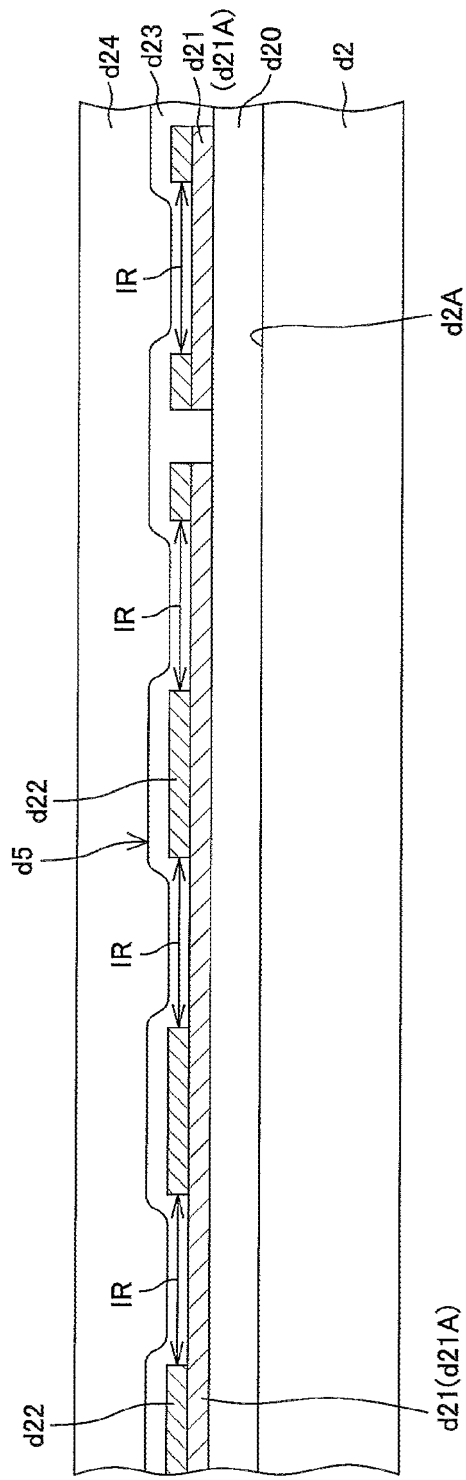
FIG. 87B is a vertical sectional view in the length direction taken along B-B of FIG. 87A for describing the arrangement of resistor bodies in the element.
Figure 87C:
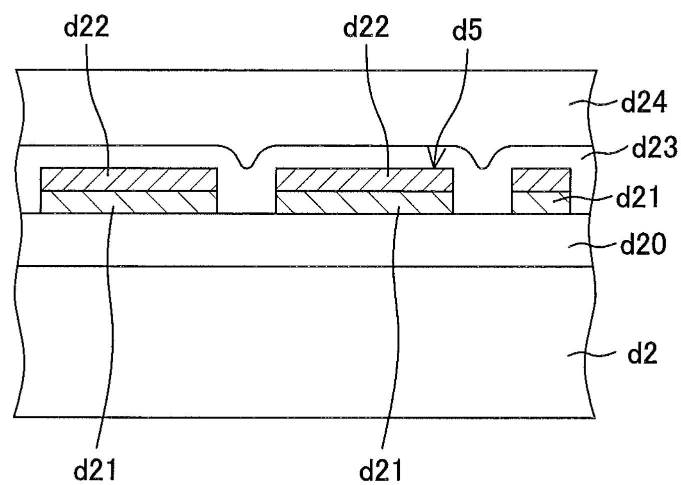
FIG. 87C is a vertical sectional view in the width direction taken along C-C of FIG. 87A for describing the arrangement of the resistor bodies in the element.

FIG. 87A is a partially enlarged plan view of the element shown in FIG. 86. FIG. 87B is a vertical sectional view in the length direction taken along B-B of FIG. 87A for describing the arrangement of resistor bodies in the element. FIG. 87C is a vertical sectional view in the width direction taken along C-C of FIG. 87A for describing the arrangement of the resistor bodies in the element. The arrangement of the resistor bodies R shall now be described with reference to FIG. 87A, FIG. 87B, and FIG. 87C.

Besides the wiring films d22, the passivation film d23, and the resin film d24, the chip resistor d1 further includes an insulating layer d20 and a resistor body film d21 (see FIG. 87B and FIG. 87C). The insulating layer d20, the resistor body film d21, the wiring films d22, the passivation film d23, and the resin film d24 are formed on the substrate d2 (element forming surface d2A). The insulating layer d20 is made of $SiO_2$ (silicon oxide). The insulating layer d20 covers the entirety of the element forming surface d2A of the substrate d2. The thickness of the insulating layer d20 is approximately 10000 Å.

The resistor body film d21 is formed on the insulating layer d20. The resistor body film d21 is formed of TiN, TiON, or TiSiON. The thickness of the resistor body film d21 is approximately 2000 Å. The resistor body film d21 is arranged as a plurality of resistor body films (hereinafter referred to as "resistor body film lines d21A") extending parallel and rectilinearly between the first connection electrode d3 and the second connection electrode d4, and there are cases where a resistor body film line d21A is cut at predetermined positions in the line direction (see FIG. 87A).

The wiring films d22 are laminated on the resistor body film lines d21A. The wiring films d22 are made of Al (aluminum) or an alloy (AlCu alloy) of aluminum and Cu (copper). The thickness of each wiring film d22 is approximately 8000 Å. The wiring films d22 are laminated on the resistor body film lines d21A at fixed intervals R in the line direction and are in contact with the resistor body film lines d21A.

Figure 88:
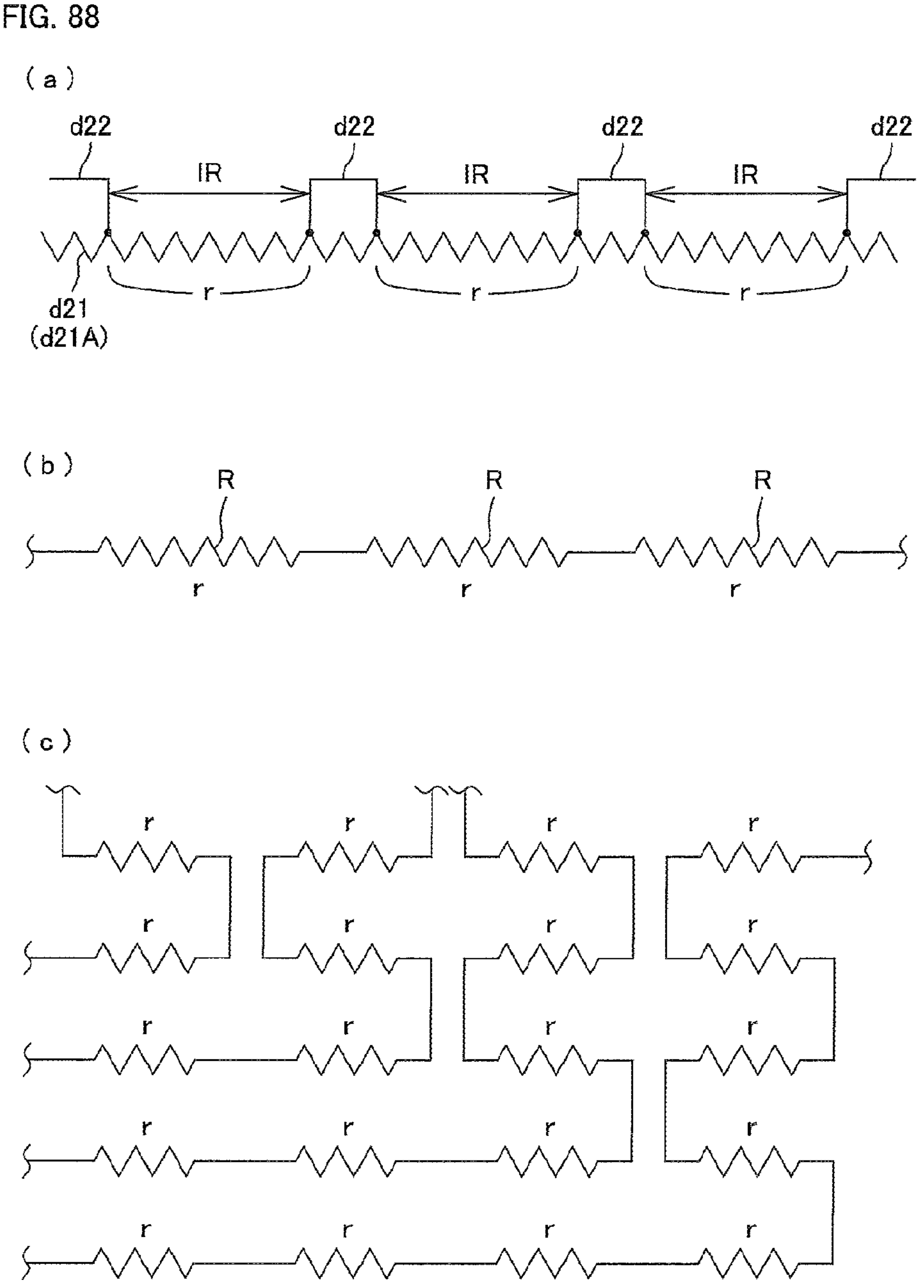
FIG. 88 shows diagrams showing the electrical features of resistor body film lines and conductor films in the form of circuit symbols and an electric circuit diagram.

The electrical features of the resistor body film lines d21A and the wiring films d22 are indicated by circuit symbols in FIG. 88. That is, as shown in FIG. 88(*a*), each of the resistor body film line 21A portions in regions of the predetermined interval IR forms a single resistor body R with a fixed resistance value r. In each region at which the wiring film d22 is laminated, the wiring film d22 electrically connects mutually adjacent resistor bodies R so that the resistor body film line d21A is short-circuited by the wiring film d22. A resistor circuit, made up of serial connections of resistor bodies R of resistance r, is thus formed as shown in FIG. 88(*b*).

Also, adjacent resistor body film lines d21A are connected to each other by the resistor body film d21 and the wiring film d22, and the resistor network of the element d5 shown in FIG. 87A thus constitutes the resistor circuits (made up of the unit resistors of the resistor bodies R) shown in FIG. 88(*c*). The resistor body film d21 and the wiring films d22 thus constitute the resistor bodies R and the resistor circuits (that is, the element 5). Each resistor body R includes a resistor body film line d21A (resistor body film d21) and a plurality of wiring films d22 laminated at the fixed interval in the line direction on the resistor body film line d21A, and the resistor body film line d21A of the fixed interval IR portion on which the wiring film d22 is not laminated constitutes a single resistor body R. The resistor body film lines d21A at the portions constituting the resistor bodies R are all equal in shape and size. The multiple resistor bodies R arrayed in a matrix on the substrate d2 thus have an equal resistance value.

Figure 89:
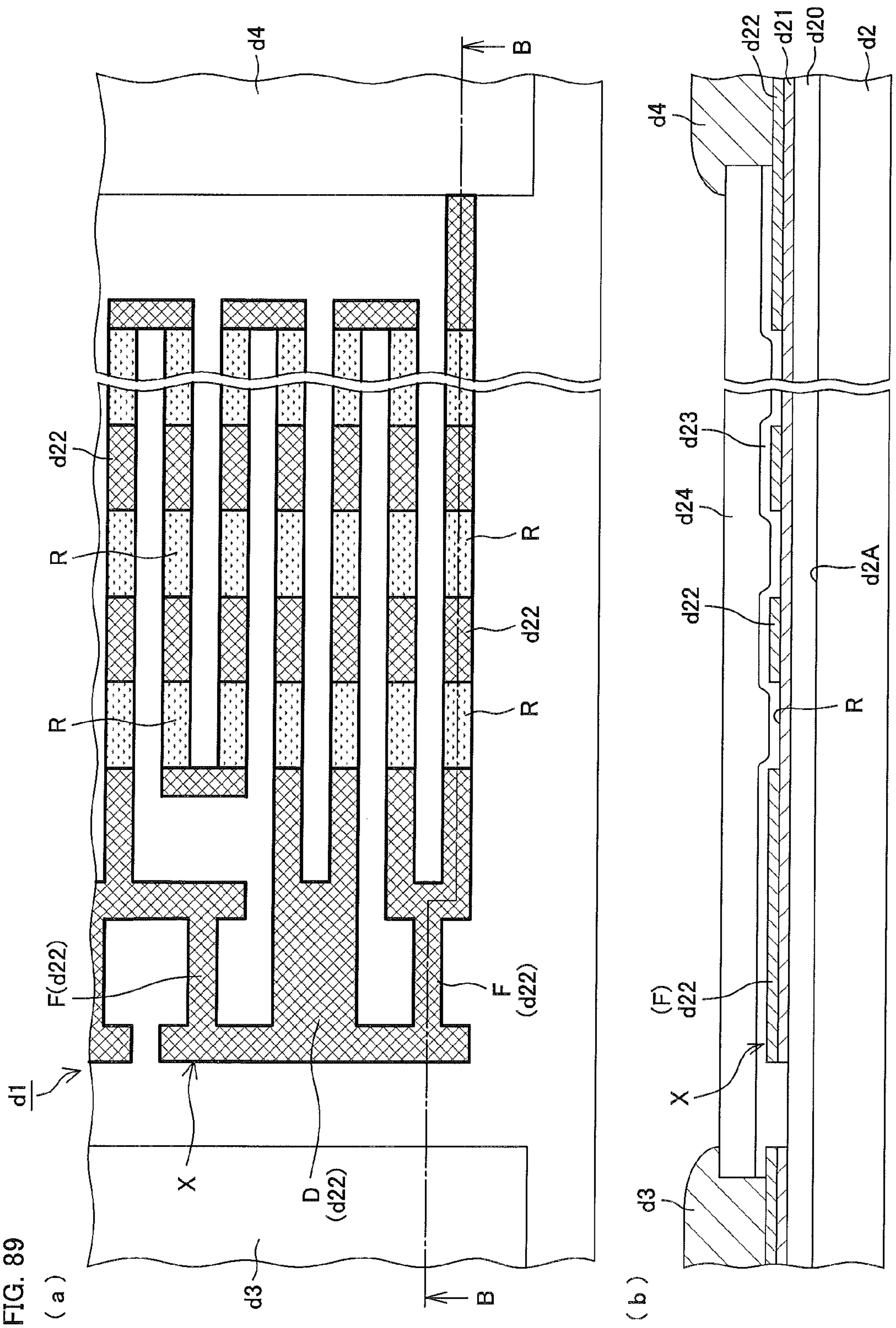
FIG. 89(*a*) is a partially enlarged plan view of a region including fuses drawn by enlarging a portion of the plan view of the chip resistor shown in FIG. 86, and FIG. 89(*b*) is a structural sectional view taken along B-B in FIG. 89(*a*).

Also, the wiring films d22 laminated on the resistor body film lines d21A form the resistor bodies R and also serve the role of conductor films D that connect a plurality of resistor bodies R to arrange a resistor circuit (see FIG. 86). FIG. 89(*a*) is a partially enlarged plan view of a region including the fuses drawn by enlarging a portion of the plan view of the chip resistor shown in FIG. 86, and FIG. 89(*b*) is a structural sectional view taken along B-B in FIG. 89(*a*).

As shown in FIGS. 89(*a*) and 89(*b*), the fuses F and the conductor films D are also formed by the wiring films d22, which are laminated on the resistor body film d21 that forms the resistor bodies R. That is, the fuses F and the conductor films D are formed of Al or AlCu alloy, which is the same metal material as that of the wiring films d22, at the same layer as the wiring films d22, which are laminated on the resistor body film lines d21A that form the resistor bodies R. As mentioned above, the wiring films d22 are also used as the conductor films D that connect a plurality of resistor bodies R to form a resistor circuit.

That is, at the same layer laminated on the resistor body film d21, the wiring films for forming the resistor bodies R, the fuses F, the conductor films D, and the wiring films for connecting the element d5 to the first connection electrode d3 and the second connection electrode d4 are formed as the wiring films d22 using the same metal material (Al or AlCu alloy). The fuses F are differed (distinguished) from the wiring films d22 because the fuses F are formed narrowly to enable easy cutting and because the fuses F are disposed so that other circuit components are not present in the surroundings thereof.

Here, a region of the wiring films d22 in which the fuses F are disposed shall be referred to as a trimming region X (see FIG. 86 and FIG. 89(*a*)). The trimming region X is a rectilinear region along the inner side of the first connection electrode d3 and not only the fuses F but also the conductor films D are disposed in the trimming region X. Also, the resistor body film d21 is formed below the wiring films 22 in the trimming region X (see FIG. 89(*b*)). The fuses F are wirings that are greater in interwiring distance (are more separated from the surroundings) than portions of the wiring films d22 besides the trimming region X.

The fuse F may refer not only to a portion of the wiring films d22 but may also refer to an assembly (fuse element) of a portion of a resistor body R (resistor body film d21) and a portion of the wiring film d22 on the resistor body film d21. Also, although only a case where the same layer is used for the fuses F as that used for the conductor films D has been described, the conductor films D may have another conductor film laminated further thereon to decrease the resistance value of the conductor films D as a whole. Even in this case, the fusing property of the fuses F is not degraded as long as a conductor film is not laminated on the fuses F.

Figure 90:
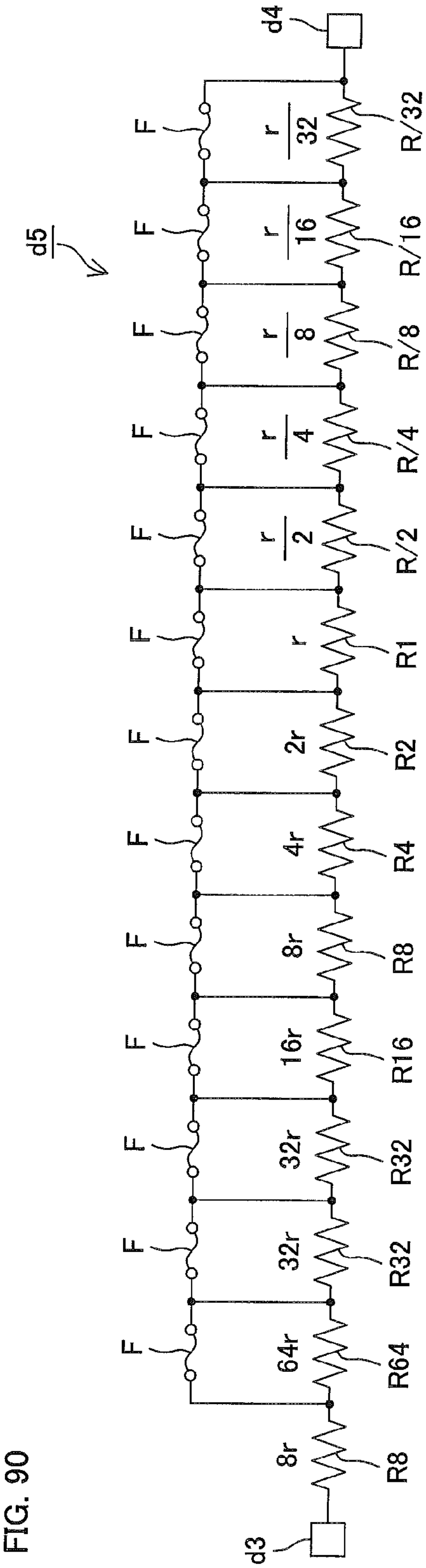
FIG. 90 is an electric circuit diagram of the element according to the preferred embodiment of the fourth reference example.

FIG. 90 is an electric circuit diagram of the element according to the preferred embodiment of the fourth reference example. Referring to FIG. 90, the element d5 is arranged by serially connecting a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16, and a resistor circuit R/32 in that order from the first connection electrode d3. Each of the reference resistor circuit R8 and resistor circuits R64 to R2 is arranged by serially connecting the same number of resistor bodies R as the number at the end of its symbol ("64" in the case of R64). The resistor circuit R1 is arranged from a single resistor body R. Each of the resistor circuits R/2 to R/32 is arranged by connecting the same number of resistor bodies R as the number at the end of its symbol ("32" in the case of R/32) in parallel. The meaning of the number at the end of the symbol of the resistor circuit is the same in FIG. 91 and FIG. 92 to be described below.

One fuse F is connected in parallel to each of the resistor circuit R64 to resistor circuit R132, besides the reference resistor circuit R8. The fuses F are mutually connected in series directly or via the conductor films D (see FIG. 89(*a*)). In a state where none of the fuses F is fused as shown in FIG. 90, the element d5 constitutes a resistor circuit of the reference resistor circuit R8 formed by the serial connection of the 8 resistor bodies R provided between the first connection electrode d3 and the second connection electrode d4. For example, if the resistance value r of a single resistor body R is r=8Ω, the chip resistor d1 is arranged with the first connection electrode d3 and the second connection electrode d4 being connected by the resistor circuit (the reference resistor circuit R8) of 8r=64Ω.

Also in the state where none of the fuses F is fused, the plurality of types of resistor circuits besides the reference resistor circuit R8 are put in short-circuited states. That is, although 13 resistor circuits R64 to R/32 of 12 types are connected in series to the reference resistor circuit R8, each resistor circuit is short-circuited by the fuse F that is connected in parallel and thus electrically, the respective resistor circuits are not incorporated in the element d5.

With the chip resistor d1 according to the present preferred embodiment, a fuse F is selectively fused, for example, by laser light in accordance with the required resistance value. The resistor circuit with which the fuse F connected in parallel is fused is thereby incorporated into the element d5. The overall resistance value of the element d5 can thus be set to the resistance value resulting from serially connecting and incorporating the resistor circuits corresponding to the fused fuses F.

In particular, the plurality of types of resistor circuits include the plurality of types of serial resistor circuits, with which the resistor bodies R having the equal resistance value are connected in series with the number of resistor bodies R being increased in geometric progression with a geometric ratio of 2 as 1, 2, 4, 8, 16, 32, . . . , and the plurality of types of parallel resistor circuits, with which the resistor bodies R having the equal resistance value are connected in parallel with the number of resistor bodies R being increased in geometric progression with a geometric ratio of 2 as 2, 4, 8, 16, . . . . Therefore by selectively fusing the fuses F (including the fuse elements), the resistance value of the element d5 (resistor d56) as a whole can be adjusted finely and digitally to an arbitrary resistance value to enable a resistance of a desired value to be formed in the chip resistor d1.

Figure 91:
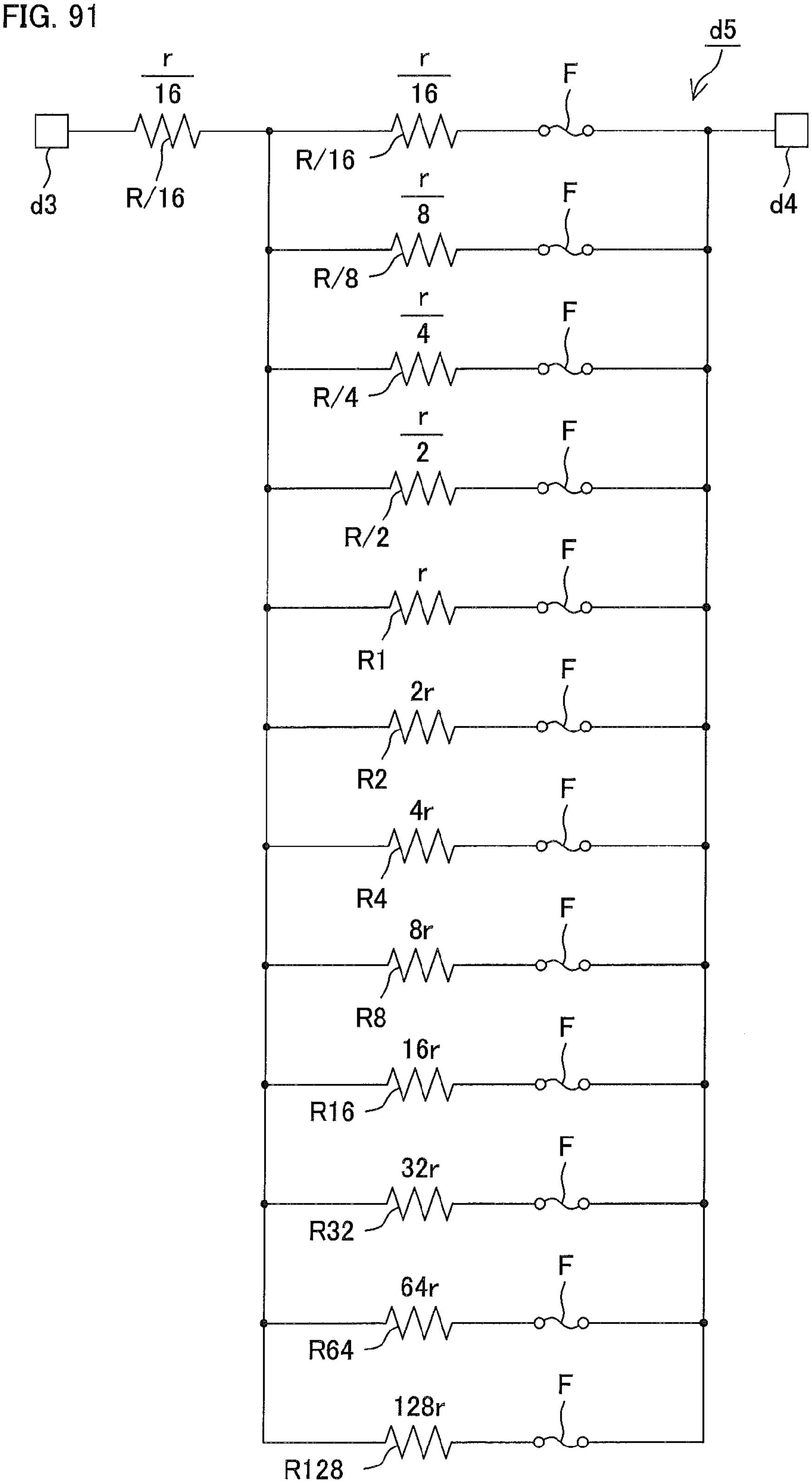
FIG. 91 is an electric circuit diagram of an element according to another preferred embodiment of the fourth reference example.

FIG. 91 is an electric circuit diagram of an element according to another preferred embodiment of the fourth reference example. Instead of arranging the element d5 by serially connecting the reference resistor circuit R8 and the resistor circuit R64 to the resistor circuit R/32 as shown in FIG. 90, the element d5 may be arranged as shown in FIG. 91. Specifically, the element d5 may be arranged, between the first connection electrode d3 and the second connection electrode d4, as a serial connection circuit of the reference resistor circuit R/16 and the parallel connection circuit of the 12 types of resistor circuits R/16, R/8, R/4, R/2, R1, R2, R4, R8, R16, R32, R64, and R128.

In this case, a fuse F is serially connected to each of the 12 types of resistor circuits besides the reference resistor circuit R/16. In a state where none of the fuses F is fused, the respective resistor circuits are electrically incorporated in the element d5. By selectively fusing a fuse F, for example, by laser light in accordance with the required resistance value, the resistor circuit corresponding to the fused fuse F (the resistor circuit connected in series to the fuse F) is electrically separated from the element d5 and the resistance value of the chip resistor d1 as a whole can thereby be adjusted.

Figure 92:
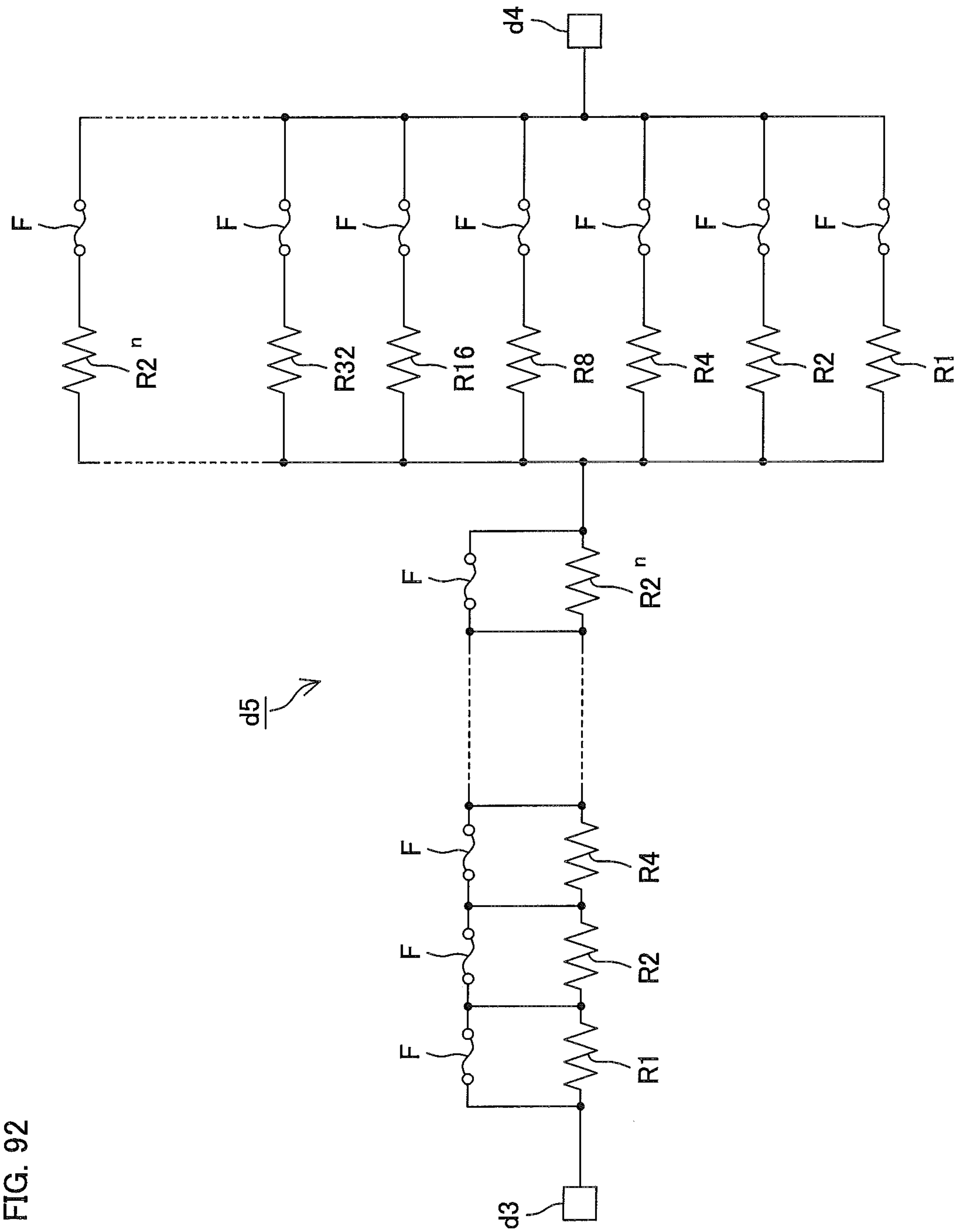
FIG. 92 is an electric circuit diagram of an element according to yet another preferred embodiment of the fourth reference example.

FIG. 92 is an electric circuit diagram of an element according to yet another preferred embodiment of the fourth reference example. A feature of the element d5 shown in FIG. 92 is that it has the circuit arrangement where a serial connection of a plurality of types of resistor circuits and a parallel connection of a plurality of types of resistor circuits are connected in series. As in a previous preferred embodiment, with the plurality of types of resistor circuits connected in series, a fuse F is connected in parallel to each resistor circuit and all of the plurality of types of resistor circuits that are connected in series are put in short-circuited states by the fuses F. Therefore, when a fuse F is fused, the resistor circuit that was short-circuited by the fused fuse F is electrically incorporated into the element d5.

On the other hand, a fuse F is connected in series to each of the plurality of types of resistor circuits that are connected in parallel. Therefore by fusing a fuse F, the resistor circuit connected in series to the fused fuse F can be electrically disconnected from the parallel connection of resistor circuits. With this arrangement, for example, by forming a low resistance of not more than 1 kΩ at the parallel connection side and forming a resistor circuit of not less than 1 kΩ at the serial connection side, resistor circuits of a wide range, from a low resistance of several Ω to a high resistance of several MΩ, can be formed using the resistor networks arranged with the same basic design. That is, with the chip resistor d1, a plurality of types of resistance values can be accommodated easily and rapidly by selecting and cutting one or a plurality of the fuses F. In other words, chip resistors d1 of various resistance values can be realized with a common design by combining a plurality of resistor bodies R that differ in resistance value.

Figure 93:
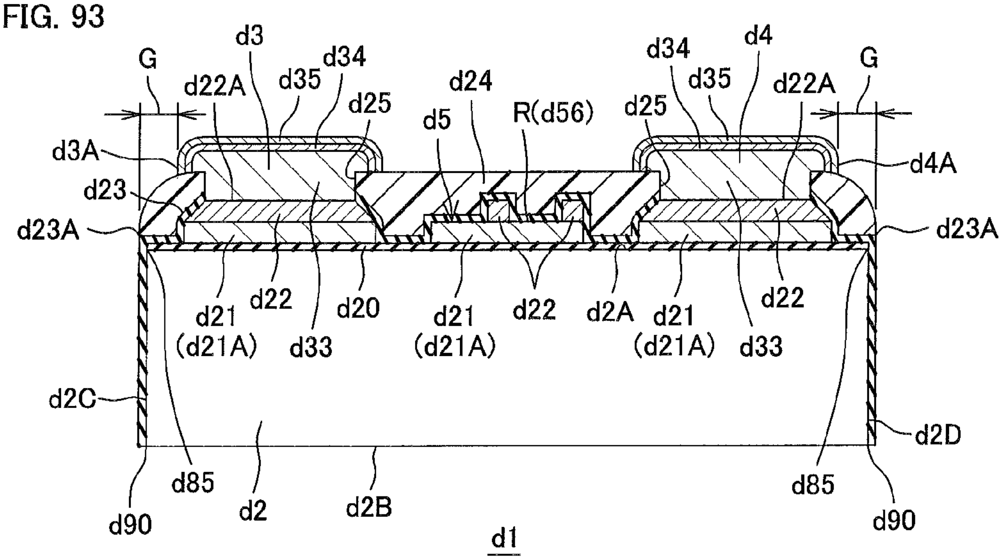
FIG. 93 is a schematic sectional view of the chip resistor.

With the chip resistor d1, the connection states of the plurality of resistor bodies R (resistor circuits) in the trimming region X can be changed as described above. FIG. 93 is a schematic sectional view of the chip resistor. The chip resistor d1 shall now be described in further detail with reference to FIG. 93. For the sake of description, the element d5 is illustrated in a simplified form and hatching is applied to respective elements besides the substrate d2 in FIG. 93.

Here, the passivation film d23 and the resin film d24 shall be described. The passivation film d23 is made, for example, from SiN (silicon nitride) and the thickness thereof is 1000 Å to 5000 Å (approximately 3000 Å here). The passivation film d23 is provided across the respective entireties of the element forming surface d2A and the side surfaces d2C to d2F. The passivation film d23 on the element forming surface d2A covers the resistor body film d21 and the respective wiring films d22 on the resistor body film d21 (that is, the element d5) from the top surface (upper side in FIG. 93) and covers the upper surfaces of the respective resistor bodies R in the element d5. The passivation film d23 thus covers the wiring films d22 in the trimming region X as well (see FIG. 89(*b*)). Also, the passivation film d23 contacts the element d5 (the wiring films d22 and the resistor body film d21) and also contacts the insulating layer d20 in regions besides the resistor body film d21. The passivation film d23 on the element forming surface d2A thus functions as a protective film that covers the entirety of the element forming surface d2A and protects the element d5 and the insulating layer d20. Also at the element forming surface d2A, the passivation film d23 prevents short-circuiting across the resistor bodies R (short-circuiting across adjacent resistor body film lines d21A) at portions besides the wiring films d22.

On the other hand, the passivation film d23 provided on each of the side surfaces d2C to d2F functions as a protective layer that protects each of the side surfaces d2C to d2F. The boundary of the respective side surfaces d2C to d2F and the element forming surface d2A is the peripheral edge portion d85, and the passivation film d23 also covers the boundary (the peripheral edge portion d85). In the passivation film d23, the portion covering the peripheral edge portion d85 (portion overlapping the peripheral edge portion d85) shall be referred to as the end portion 23A. The passivation film d23 is an extremely thin film and therefore, in the present preferred embodiment, the passivation film d23 covering each of the side surfaces d2C to d2F may be regarded as being a portion of the substrate d2. The passivation film d23 covering each of the side surfaces d2C to d2F shall thus be considered as being each of the side surfaces d2C to d2F itself.

The resin film d24, together with the passivation film d23, protects the element forming surface d2A of the chip resistor d1 and is made of a resin, such as polyimide, etc. The thickness of the resin film d24 is approximately 5 μm. The resin film d24 covers the entirety of a top surface of the passivation film d23 on the element forming surface d2A (including the resistor body film d21 and the wiring films d22 covered by the passivation film d23). A peripheral edge portion of the resin film d24 thus coincides in a plan view with the end portion 23A of the passivation film d23 (the peripheral edge portion d85 of the element forming surface d2A).

In the resin film d24, openings d25 are formed, one at each of two positions that are separated in a plan view. Each opening d25 is a penetrating hole penetrating continuously through each of the resin film d24 and the passivation film d23 in the thickness direction. The openings d25 are thus formed not only in the resin film d24 but also in the passivation film d23. Portions of wiring films d22 are exposed at the respective openings d25. The portions of the wiring films d22 exposed at the respective openings d25 are pad regions d22A for external connection.

Of the two openings d25, one opening d25 is completely filled by the first connection electrode d3 and the other opening d25 is completely filled by the second connection electrode d4. Here, each of the first connection electrode d3 and the second connection electrode d4 has an Ni layer d33, a Pd layer d34, and an Au layer d35 in that order from the element forming surface d2A side. Therefore in each of the first connection electrode d3 and the second connection electrode d4, the Pd layer d34 is interposed between the Ni layer d33 and the Au layer d35. In each of the first connection electrode d3 and the second connection electrode d4, the Ni layer d33 takes up most of each connection electrode and the Pd layer d34 and the Au layer d35 are formed significantly thinner than the Ni layer d33. The Ni layer d33 serves a role of relaying between the Al of the wiring film d22 in the pad region d22A in each opening d25 and the solder d13 when the chip resistor d1 is mounted on the mounting substrate d9 (see FIG. 85B and FIG. 85C).

As described above, with the first connection electrode d3 and the second connection electrode d4, a top surface of the Ni layer d33 is covered by the Au layer d35 and the Ni layer d33 can thus be prevented from becoming oxidized. Also with the first connection electrode d3 and the second connection electrode d4, even if a penetrating hole (pinhole)

forms in the Au layer d35 due to thinning of the Au layer d35, the Pd layer d34 interposed between the Ni layer d33 and the Au layer d35 closes the penetrating hole and the Ni layer d33 can thus be prevented from being exposed to the exterior through the penetrating hole and becoming oxidized.

With each of the first connection electrode d3 and the second connection electrode d4, the Au layer d35 is exposed at the topmost surface and faces the exterior through the opening d25 of the resin film d24. The first connection electrode d3 is electrically connected, via one opening d25, to the wiring film d22 in the pad region d22A in the opening d25. The second connection electrode d4 is electrically connected, via the other opening d25, to the wiring film d22 in the pad region d22A in the opening d25. With each of the first connection electrode d3 and the second connection electrode d4, the Ni layer d33 is connected to the pad region d22A. Each of the first connection electrode d3 and the second connection electrode d4 is thereby electrically connected to the element d5. Here, the wiring films d22 form wirings that are respectively connected to groups of resistor bodies R (resistor d56) and the first connection electrode d3 and the second connection electrode d4.

The resin film d24 and the passivation film d23, in which the openings d25 are formed, thus cover the element forming surface d2A in a state where the first connection electrode d3 and the second connection electrode d4 are exposed through the openings d25. Electrical connection between the chip resistor d1 and the mounting substrate d9 can thus be achieved via the first connection electrode d3 and the second connection electrode d4 protruding from the openings d25 at a top surface of the resin film d24 (see FIG. 85B and FIG. 85C).

Figure 94A:
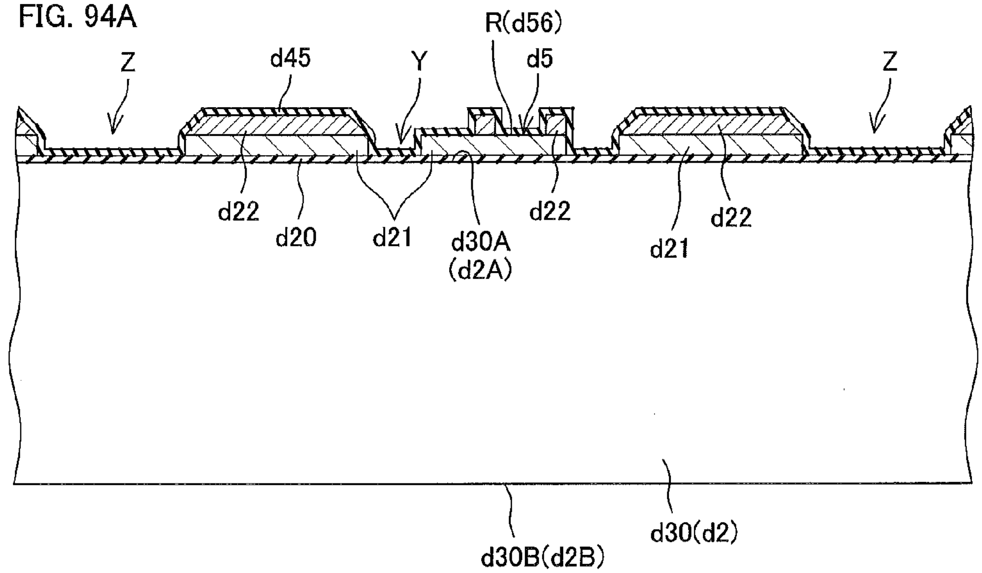
FIG. 94A is an illustrative sectional view of a method for manufacturing the chip resistor shown in FIG. 93.

FIG. 94A to FIG. 94G are illustrative sectional views of a method for manufacturing the chip resistor shown in FIG. 93. First, as shown in FIG. 94A, a substrate d30, which is to be the base of the substrate d2, is prepared. Here, a top surface d30A of the substrate d30 is the element forming surface d2A of the substrate d2 and a rear surface d30B of the substrate d30 is the rear surface d2B of the substrate d2.

The top surface d30A of the substrate d30 is then thermally oxidized to form the insulating layer d20, made of $SiO_2$, etc., on the top surface d30A, and the element d5 (the resistor bodies R and the wiring films d22 connected to the resistor bodies R) is formed on the insulating layer d20. Specifically, first, the resistor body film d21 of TiN, TiON, or TiSiON is formed by sputtering on the entire surface of the insulating layer d20 and further, the wiring film d22 of aluminum (Al) is laminated on the resistor body film d21 so as to contact the resistor body film d21. Thereafter, a photolithography process is used and, for example, RIE (reactive ion etching) or other form of dry etching is performed to selectively remove and pattern the resistor body film d21 and the wiring film d22 to obtain the arrangement where, as shown in FIG. 87A, the resistor body film lines d21A of fixed width, at which the resistor body film d21 is laminated, are arrayed at fixed intervals in the column direction in a plan view. In this process, regions in which the resistor body film lines d21A and the wiring film d22 are cut at portions are also formed and the fuses F and the conductor films D are formed in the trimming region X (see FIG. 86). The wiring film d22 laminated on the resistor body film lines d21A is then removed selectively, for example, by wet etching. The element d5 of the arrangement where the wiring films d22 are laminated at the fixed intervals R on the resistor body film lines d21A is consequently obtained. In this process, the resistance value of the entirety of the element d5 may be measured to check whether or not the resistor body film d21 and the wiring film d22 have been formed to the targeted dimensions.

With reference to FIG. 94A, the elements d5 are formed at multiple locations on the top surface d30A of the substrate d30 in accordance with the number of chip resistors d1 that are to be formed on the single substrate d30. If a single region of the substrate d30 in which an element d5 (the resistor d56) is formed is referred to as a chip component region Y, a plurality of chip component regions Y (in other words, elements d5), each having the resistor d56, are formed (set) on the top surface d30A of the substrate d30. A single chip component region Y coincides with a single finished chip resistor d1 (see FIG. 93) in a plan view. On the top surface d30A of the substrate d30, a region between adjacent chip component regions Y shall be referred to as a "boundary region Z." The boundary region Z has a band shape and extends in a lattice in a plan view. A single chip component region Y is disposed in a single lattice cell defined by the boundary region Z. The width of the boundary region Z is 1 μm to 60 μm (for example, 20 μm) and is extremely narrow, and therefore a large number of chip component regions Y can be secured on the substrate d30 to consequently enable mass production of the chip resistors d1.

Thereafter as shown in FIG. 94A, an insulating film d45 made of SiN is formed on the entirety of the top surface d30A of the substrate d30 by a CVD (chemical vapor deposition) method. The insulating film d45 contacts and covers all of the insulating layer d20 and the elements d5 (resistor body film d21 and wiring films d22) on the insulating layer d20. The insulating film 45 thus also covers the wiring films d22 in the trimming regions X (see FIG. 86). Also, the insulating film d45 is formed across the entirety of the top surface d30A of the substrate d30 and is thus formed to extend to regions besides the trimming regions X on the top surface d30A. The insulating film d45 is thus a protective film that protects the entirety of the top surface d30A (including the elements d5 on the top surface d30A).

Figure 94B:
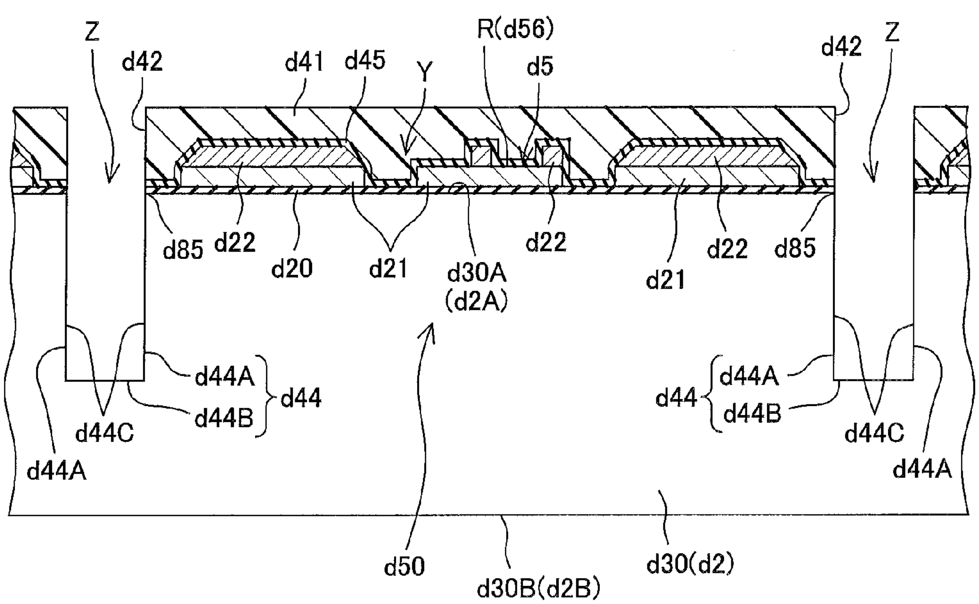
FIG. 94B is an illustrative sectional view of a step subsequent to that of FIG. 94A.
Figure 95:
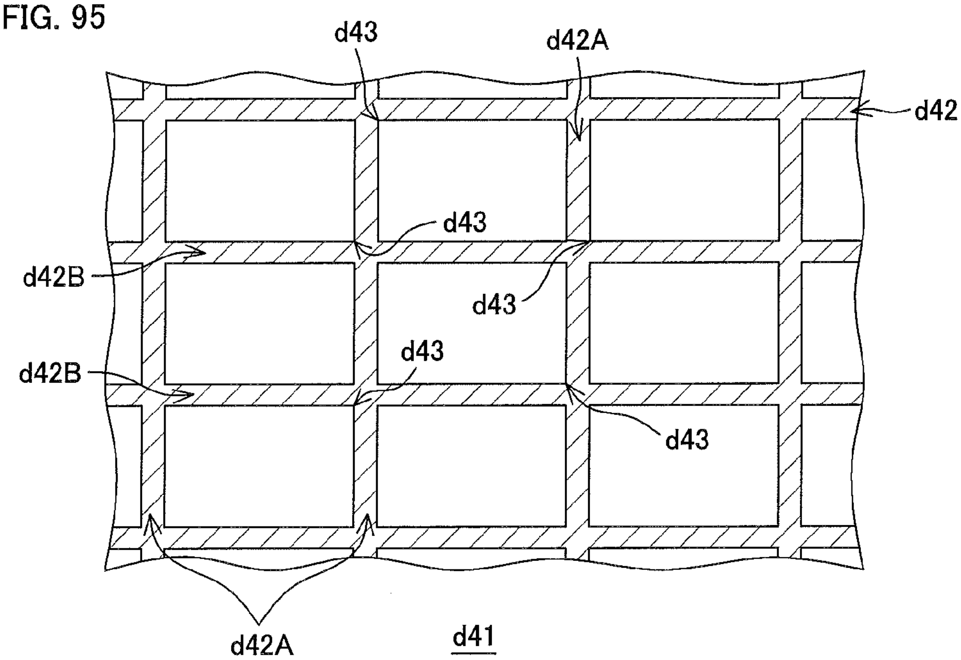
FIG. 95 is a schematic plan view of a portion of a resist pattern used for forming a groove in the step of FIG. 94B.

Thereafter as shown in FIG. 94B, a resist pattern d41 is formed across the entirety of the top surface d30A of the substrate d30 so as to cover the entire insulating film d45. An opening d42 is formed in the resist pattern d41. FIG. 95 is a schematic plan view of a portion of the resist pattern used for forming a groove in the step of FIG. 94B.

With reference to FIG. 95, the opening d42 of the resist pattern d41 coincides with (corresponds to) a region (hatched portion in FIG. 95, in other words, the boundary region Z) between outlines of mutually adjacent chip resistors 1 in a plan view in a case where multiple chip resistors d1 (in other words, the chip component regions Y) are disposed in an array (that is also a lattice). The overall shape of the opening d42 is thus a lattice having a plurality of mutually orthogonal rectilinear portions d42A and d42B.

In the resist pattern d41, the mutually orthogonal rectilinear portions d42A and d42B in the opening d42 are connected while being maintained in mutually orthogonal states (without curving). Intersection portions d43 of the rectilinear portions d42A and d42B are thus pointed and form angles of substantially 90° in a plan view. Referring to FIG. 94B, the insulating film d45, the insulating layer d20, and the substrate d30 are respectively removed selectively by plasma etching using the resist pattern d41 as a mask. The material of the substrate d30 is thereby removed in the boundary region Z between mutually adjacent elements d5 (chip component regions Y). Consequently, a groove d44, penetrating through the insulating film d45 and the insulating layer d20 and having a predetermined depth reaching a middle portion of the thickness of the substrate d30 from the top surface d30A of the substrate d30, is formed at positions (boundary region Z) coinciding with the opening d42 of the resist pattern d41 in a plan view. The groove d44 is defined by a pair of mutually facing side walls d44A and a bottom wall d44B joining the lower ends (ends at the rear surface d30B side of the substrate d30) of the pair of side walls d44A. The depth of the groove d44 on the basis of the top surface d30A of the substrate d30 is approximately 100 μm and the width of the groove d44 (interval between the mutually facing side walls d44A) is approximately 20 μm and is fixed across the entire depth direction.

The overall shape of the groove d44 in the substrate d30 is a lattice that coincides with the opening d42 (see FIG. 95) of the resist pattern d41 in a plan view. At the top surface d30A of the substrate d30, rectangular frame portions (boundary region Z) of the groove d44 surround the peripheries of the chip component regions Y in which the respective elements d5 are formed. In the substrate d30, each portion in which the element d5 is formed is a semi-finished product d50 of the chip resistor d1. At the top surface d30A of the substrate d30, one semi-finished product d50 is positioned in each chip component region Y surrounded by the groove d44, and these semi-finished products d50 are arrayed and disposed in an array. By thus forming the groove d44, the substrate d30 is separated into the substrates d2 according to the plurality of chip component regions Y.

Figure 94C:
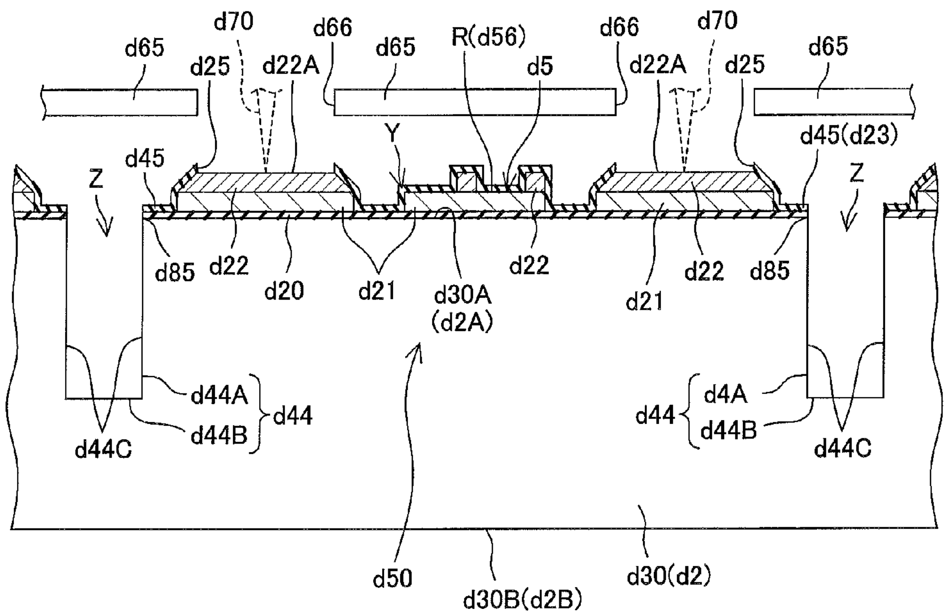
FIG. 94C is an illustrative sectional view of a step subsequent to that of FIG. 94B.

After the groove d44 has been formed as shown in FIG. 94B, the resist pattern d41 is removed, and by etching using a mask d65, the insulating film d45 is removed selectively as shown in FIG. 94C. With the mask d65, openings d66 are formed at portions of the insulating film d45 coinciding with the respective pad regions d22A (see FIG. 93) in a plan view. Portions of the insulating film d45 coinciding with the openings d66 are thereby removed by the etching and the openings d25 are formed at these portions. The insulating film d45 is thus formed so that the respective pad regions d22A are exposed in the openings d25. Two openings d25 are formed per single semi-finished product d50.

With each semi-finished product d50, after the two openings d25 have been formed in the insulating film d45, probes d70 of a resistance measuring apparatus (not shown) are put in contact with the pad regions d22A in the respective openings d25 to detect the resistance value of the element d5 as a whole. Laser light (not shown) is then irradiated onto an arbitrary fuse F (see FIG. 86) via the insulating film d45 to trim the wiring film d22 in the trimming region X by the laser light and thereby fuse the corresponding fuse F. By thus fusing (trimming) the fuses F so that the required resistance value is attained, the resistance value of the semi-finished product d50 (in other words, the chip resistor d1) as a whole can be adjusted, as described above. In this process, the insulating film d45 serves as a cover film that covers the element d5 and therefore the occurrence of a short circuit due to attachment of a fragment, etc., formed in the fusing process to the element d5 can be prevented. Also, the insulating film d45 covers the fuses F (the resistor body film d21) and therefore the energy of the laser light accumulates in the fuses F to enable the fuses F to be fused reliably.

Figure 94D:
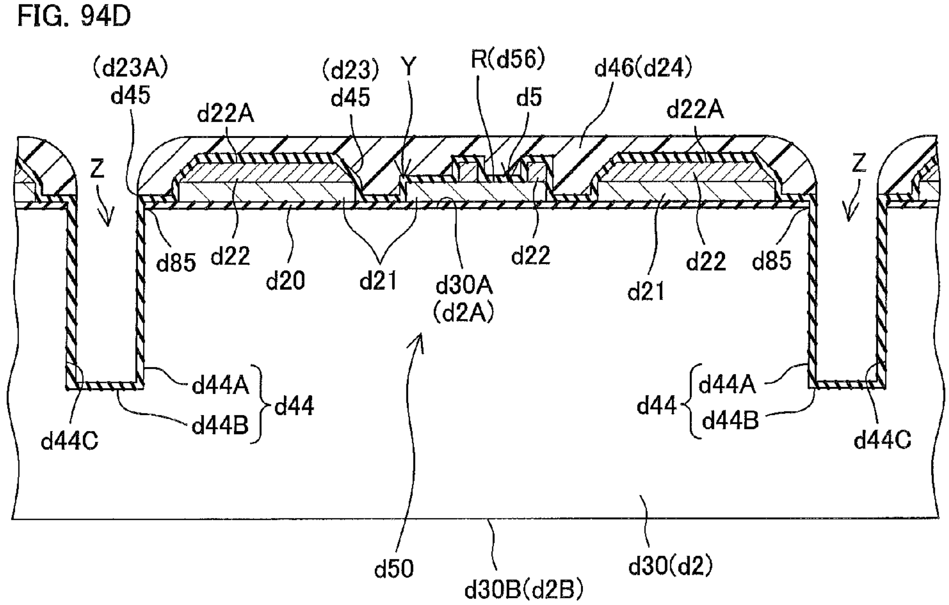
FIG. 94D is an illustrative sectional view of a step subsequent to that of FIG. 94C.

Thereafter, SiN is formed on the insulating film d45 by the CVD method to thicken the insulating film d45. In this process, the insulating film d45 is also formed on the entirety of the inner peripheral surface of the groove d44 (defining surfaces 44C of the side walls d44A and an upper surface of the bottom wall d44B) as shown in FIG. 94D. At the final stage, the insulating film d45 (in the state shown in FIG. 94D) has a thickness of 1000 Å to 5000 Å (approximately 3000 Å here). At this point, portions of the insulating film d45 enter inside the respective openings d25 to close the openings d25.

Thereafter, a liquid of a photosensitive resin constituted of polyimide is spray-coated onto the substrate d30 from above the insulating film d45 to form a resin film d46 of the photosensitive resin as shown in FIG. 94D. In this process, the liquid is coated onto the substrate d30 across a mask (not shown) having a pattern covering only the groove d44 in a plan view so that the liquid does not enter inside the groove d44. Consequently, the photosensitive resin of liquid form is formed only on the substrate d30 to become the resin film d46 on the substrate d30. A top surface of the resin film d46 on the top surface d30A is formed flatly along the top surface d30A.

The liquid does not enter inside the groove d44 and therefore the resin film d46 is not formed inside the groove d44. Also, besides spray-coating the liquid of photosensitive resin, the resin film d46 may be formed by spin-coating the liquid or adhering a sheet, made of the photosensitive resin, on the top surface d30A of the substrate d30. Thereafter, heat treatment (curing) is performed on the resin film d46. The thickness of the resin film d46 is thereby made to undergo thermal contraction and the resin film d46 hardens and stabilizes in film quality.

Figure 94E:
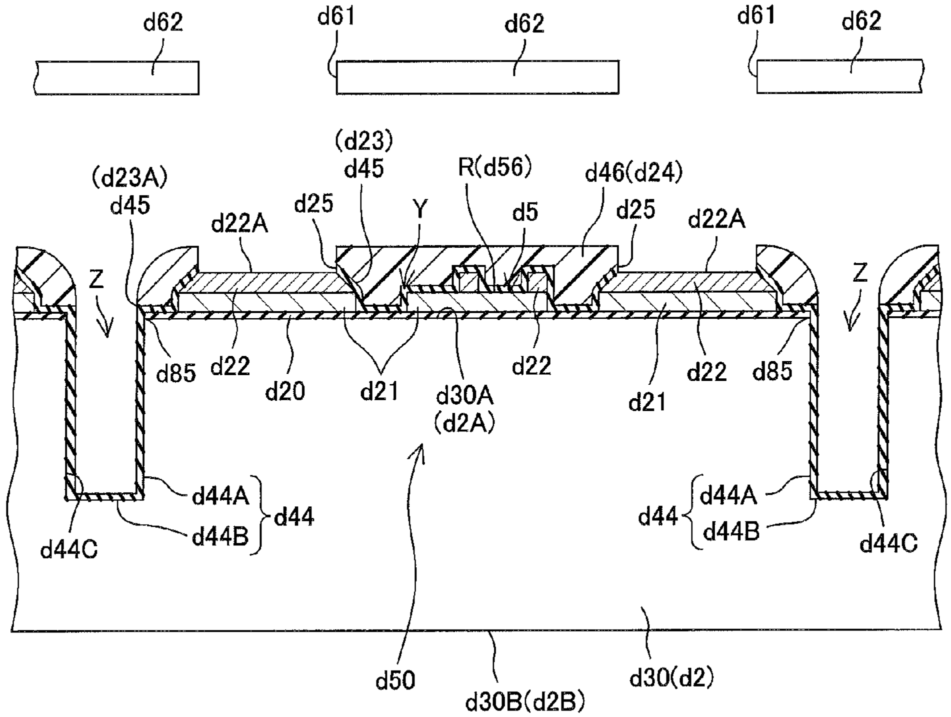
FIG. 94E is an illustrative sectional view of a step subsequent to that of FIG. 94D.

Thereafter as shown in FIG. 94E, the resin film d46 is patterned to selectively remove portions of the resin film d46 on the top surface d30A coinciding with the respective pad regions d22A (openings d25) of the wiring film d22 in a plan view. Specifically, a mask d62, having openings d61 of a pattern matching (coinciding with) the respective pad regions d22A in a plan view formed therein, is used to expose and develop the resin film d46 with the pattern. The resin film d46 is thereby made to separate at portions above the respective pad regions d22A. Thereafter, the insulating film d45 above the respective pad regions d22 is removed by RIE using an unillustrated mask to open the respective openings d25 and expose the pad regions d22A.

Figure 94F:
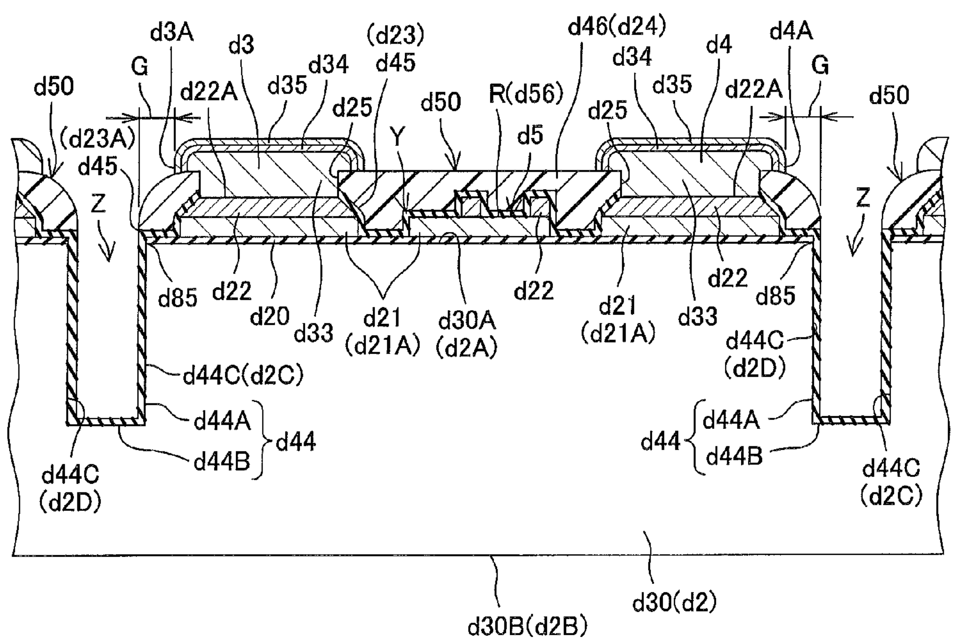
FIG. 94F is an illustrative sectional view of a step subsequent to that of FIG. 94E.
Figure 96:
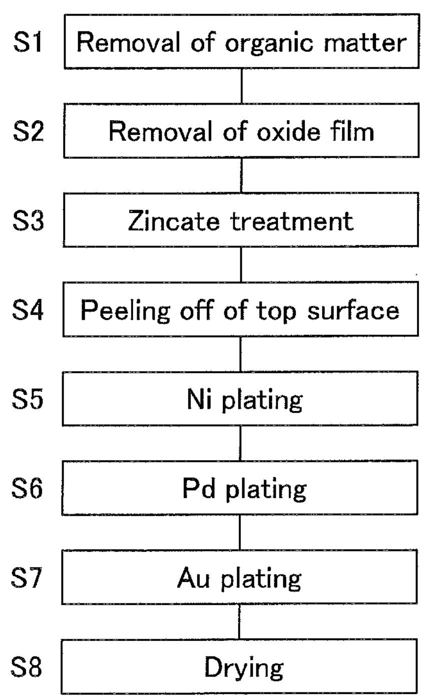
FIG. 96 is a diagram for describing a process for manufacturing a first connection electrode and a second connection electrode.

Thereafter, an Ni/Pd/Au laminated film, constituted by laminating Ni, Pd, and Au by electroless plating, is formed on the pad region d22 in each opening d25 to form the first connection electrode d3 and the second connection electrode d4 on the pad regions d22A as shown in FIG. 94F. FIG. 96 is a diagram for describing a process for manufacturing the first connection electrode and the second connection electrode.

Specifically, with reference to FIG. 96, first, a top surface of each pad region d22A is cleaned to remove (degrease) organic matter (including smuts, such as stains of carbon, etc., and oil and fat dirt) on the top surface (step S1). Thereafter, an oxide film on the top surface is removed (step S2). Thereafter, a zincate treatment is performed on the top surface to convert the Al (of the wiring film d22) at the top surface to Zn (step S3). Thereafter, the Zn on the top surface is peeled off by nitric acid, etc., so that fresh Al is exposed at the pad region d22A (step S4).

Thereafter, the pad region d22A is immersed in a plating solution to apply Ni plating on a top surface of the fresh Al in the pad region d22A. The Ni in the plating solution is thereby chemically reduced and deposited to form the Ni layer d33 on the top surface (step S5). Thereafter, the Ni layer d33 is immersed in another plating solution to apply Pd plating on a top surface of the Ni layer d33. The Pd in the plating solution is thereby chemically reduced and deposited to form the Pd layer d34 on the top surface of the Ni layer d33 (step S6).

Thereafter, the Pd layer d34 is immersed in yet another plating solution to apply Au plating on a top surface of the Pd layer d34. The Au in the plating solution is thereby chemically reduced and deposited to form the Au layer d35 on the top surface of the Pd layer d34 (step S7). The first connection electrode d3 and the second connection electrode d4 are thereby formed, and when the first connection electrode d3 and the second connection electrode d4 that have been formed are dried (step S8), the process for manufacturing the first connection electrode d3 and the second connection electrode d4 is completed. A step of washing the semi-finished product d50 with water is performed as necessary between consecutive steps. Also, the zincate treatment may be performed a plurality of times.

FIG. 94F shows a state after the first connection electrode d3 and the second connection electrode d4 have been formed in each semi-finished product d50. As described above, the first connection electrode d3 and the second connection electrode d4 are formed by electroless plating and therefore in comparison to a case where the first connection electrode d3 and the second connection electrode d4 are formed by electrolytic plating, the number of steps of the process for forming the first connection electrode d3 and the second connection electrode d4 (for example, a lithography step, a resist mask peeling step, etc., that are necessary in electrolytic plating) can be reduced to improve the productivity of the chip resistor d1. Further in the case of electroless plating, the resist mask that is deemed to be necessary in electrolytic plating is unnecessary and deviation of the positions of formation of the first connection electrode d3 and the second connection electrode d4 due to positional deviation of the resist mask thus does not occur, thereby enabling the formation position precision of the first connection electrode d3 and the second connection electrode d4 to be improved to improve the yield.

Figure 94G:
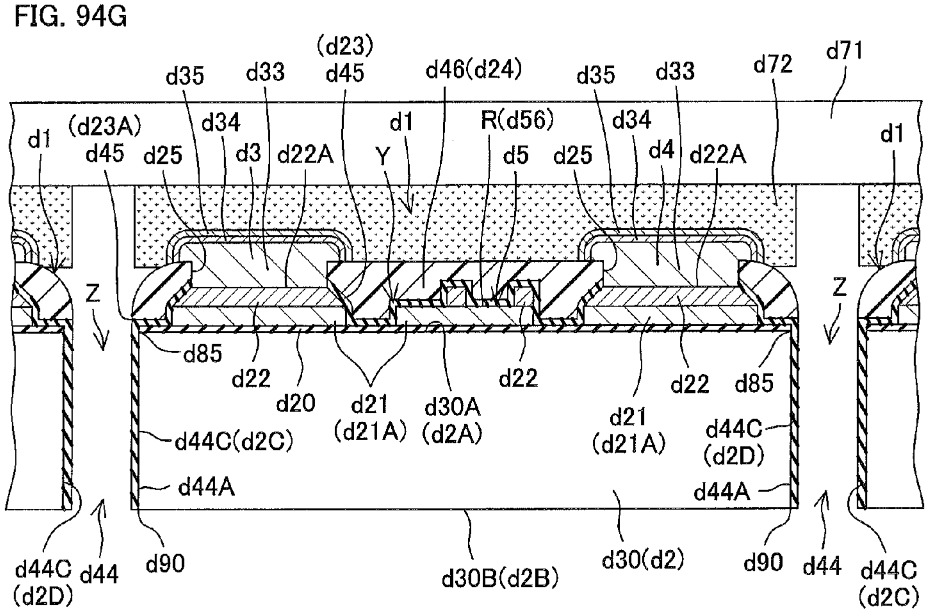
FIG. 94G is an illustrative sectional view of a step subsequent to that of FIG. 94F.

After the first connection electrode d3 and the second connection electrode d4 have thus been formed, a conduction test is performed across the first connection electrode d3 and the second connection electrode d4, and thereafter, the substrate d30 is ground from the rear surface d30B. Specifically, after the groove d44 has been formed, an adhesive surface d72 of a thin, plate-shaped supporting tape d71, made of PET (polyethylene terephthalate) and having the adhesive surface d72, is adhered onto the first connection electrode d3 and second connection electrode d4 side (that is, the top surface d30A) of each semi-finished product d50 as shown in FIG. 94G. The respective semi-finished products d50 are thereby supported by the supporting tape d71. Here, for example, a laminated tape may be used as the supporting tape d71.

In the state where the respective semi-finished products d50 are supported by the supporting tape d71, the substrate d30 is ground from the rear surface d30B side. When the substrate d30 has been thinned by grinding until the upper surface of the bottom wall d44B (see FIG. 94F) of the groove d44 is reached, there are no longer portions that join mutually adjacent semi-finished products d50 and the substrate d30 is thus divided at the groove d44 as boundaries and the semi-finished products d50 are separated individually to become the finished products of the chip resistors d1. That is, the substrate d30 is cut (divided) at the groove d44 (in other words, the boundary region Z) and the individual chip resistors d1 are thereby cut out. The chip resistors d1 may be cut out instead by etching to the bottom wall 44B of the groove d44 from the rear surface d30B side of the substrate d30.

With each finished chip resistor d1, each portion that formed a defining surface 44C of the side walls d44A of the groove d44 becomes one of the side surfaces d2C to d2F of the substrate d2 and the rear surface d30B becomes the rear surface d2B. That is, the step of forming the groove d44 by etching as described above (see FIG. 94B) is included in the step of forming the side surfaces d2C to d2F. Also, the insulating film d45 becomes the passivation film d23, and the separated resin film d46 becomes the resin film d24.

The plurality of chip component regions Y formed on the substrate d30 can thus be separated all at once into individual chip resistors d1 (chip components) (the individual chips of the plurality of chip resistors d1 can be obtained at once) by forming the groove d44 and then grinding the substrate d30 from the rear surface d30B side as described above. The productivity of the chip resistors d1 can thus be improved by reduction of the time for manufacturing the plurality of chip resistors d1.

The rear surface d2B of the substrate d2 of the finished chip resistor d1 may be mirror-finished by polishing or etching to refine the rear surface d2B. Although preferred embodiments of the fourth reference example have been described above, the fourth reference example may be implemented in yet other modes as well. For example, although with each of the preferred embodiments described above, the chip resistor d1 was disclosed as an example of a chip component according to the fourth reference example, the fourth reference example may also be applied to a chip component, such as a chip capacitor, a chip diode, or a chip inductor. A chip capacitor and a chip diode shall be described successively below.

Figure 97:
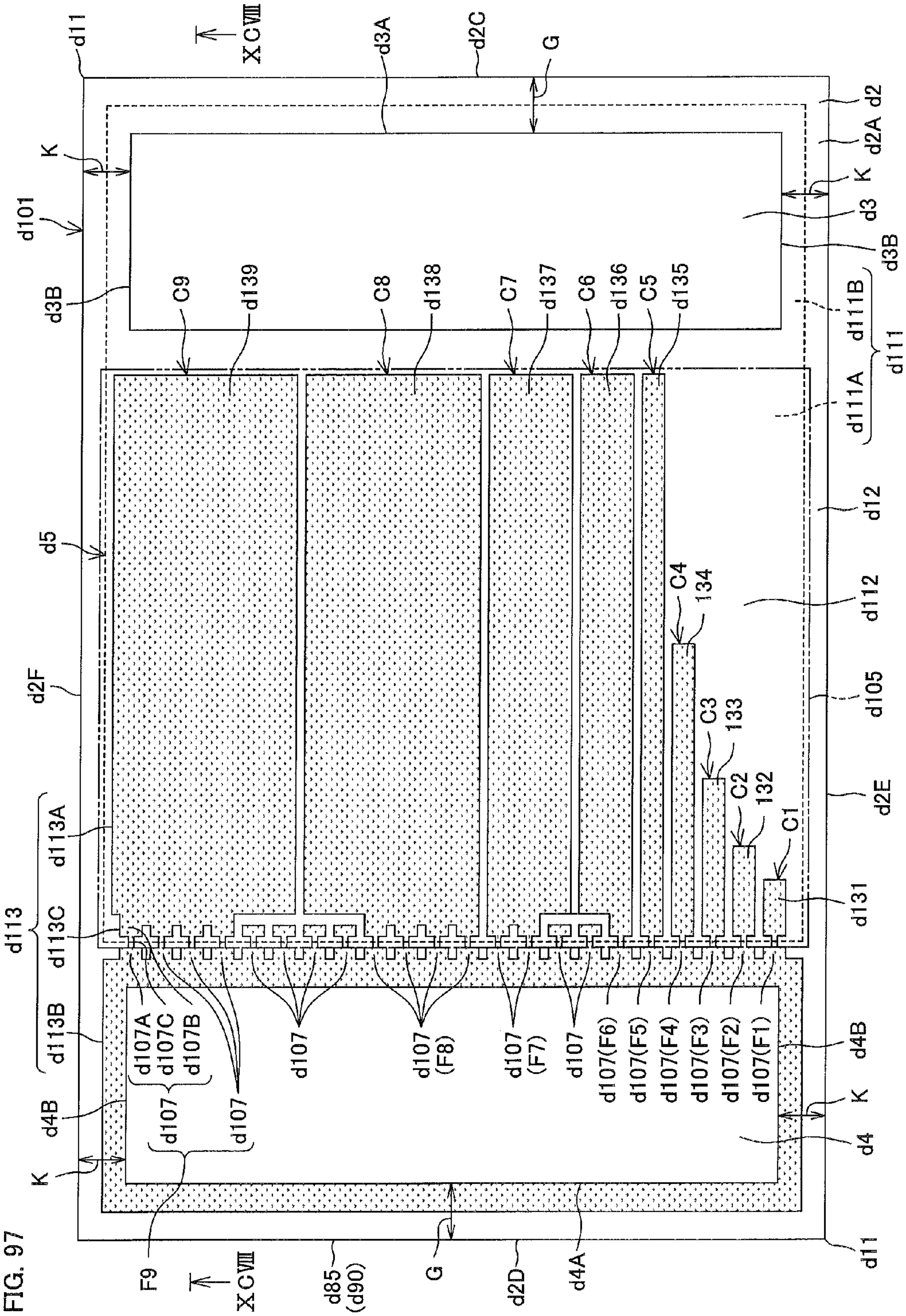
FIG. 97 is a plan view of a chip capacitor according to another preferred embodiment of the fourth reference example.
Figure 98:
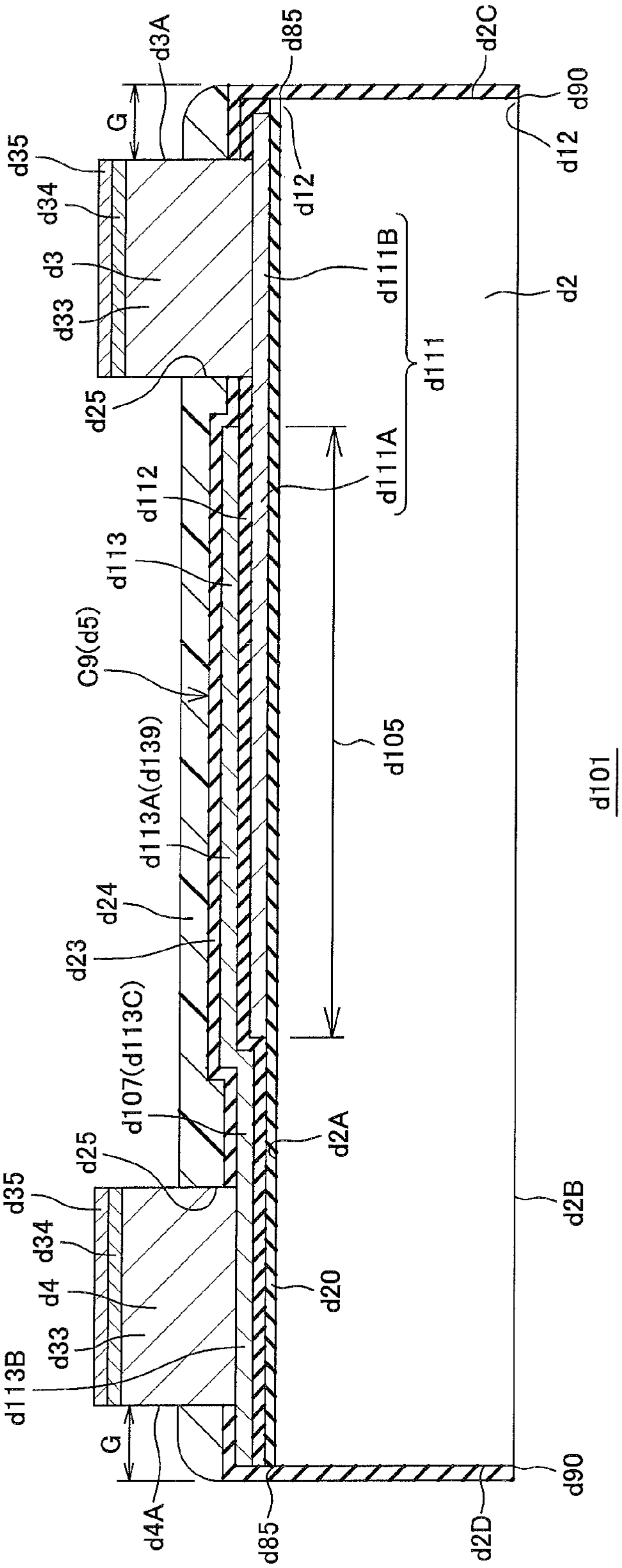
FIG. 98 is a sectional view taken along section line XCVIII-XCVIII in FIG. 97.
Figure 99:
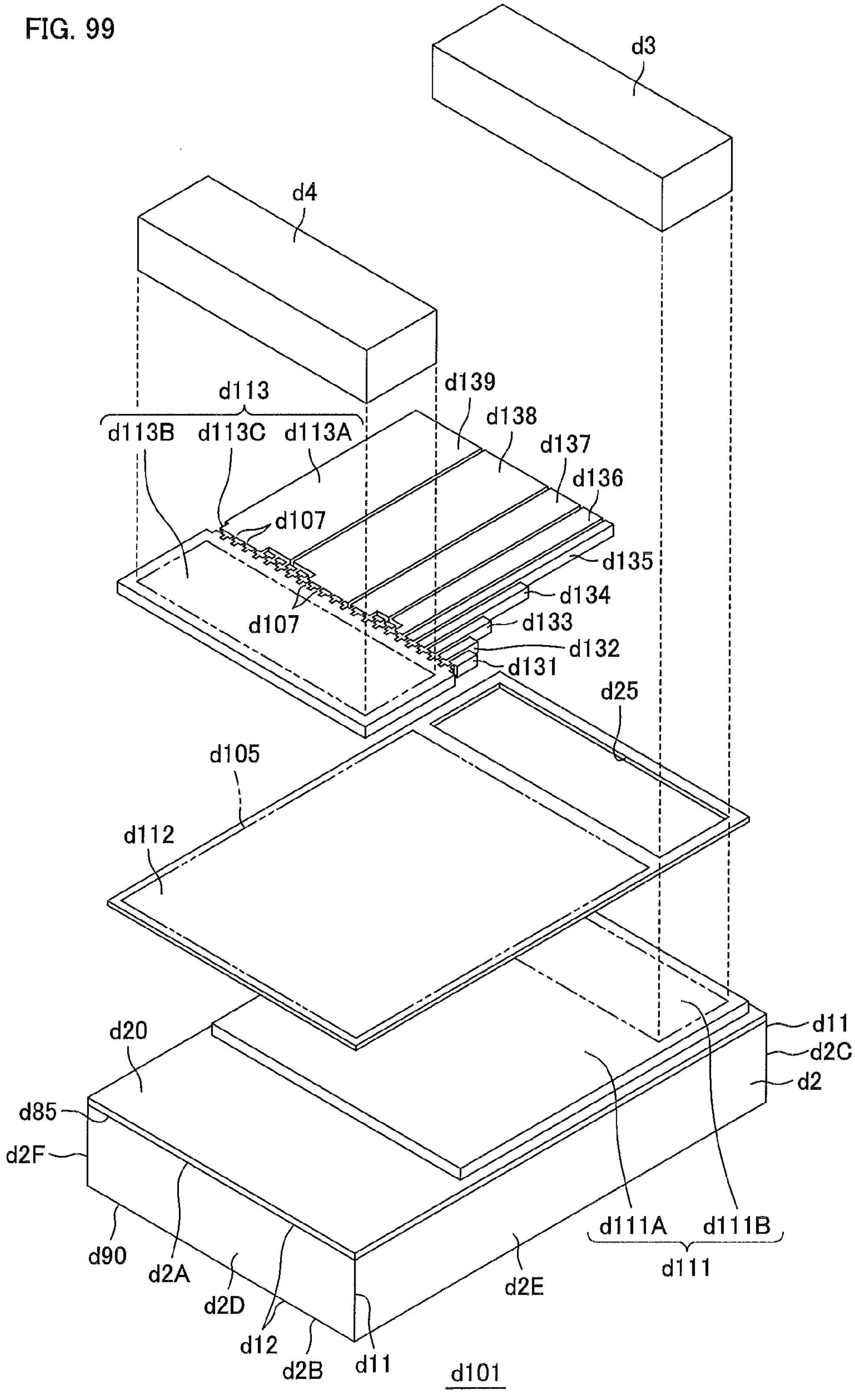
FIG. 99 is an exploded perspective view showing the arrangement of a portion of the chip capacitor in a separated state.

FIG. 97 is a plan view of a chip capacitor according to another preferred embodiment of the fourth reference example. FIG. 98 is a sectional view taken along section line XCVIII-XCVIII in FIG. 97. FIG. 99 is an exploded perspective view showing the arrangement of a portion of the chip capacitor in a separated state. With the chip capacitor d101 to be described below, portions corresponding to portions described above for the chip resistor d1 shall be provided with the same reference symbols and detailed description of such portions shall be omitted. With the chip capacitor d101, the portions provided with the same reference symbols as the portions described for the chip resistor d1 have, unless noted otherwise, the same arrangements as the portions described for the chip resistor d1 and can exhibit the same actions and effects as the portions described for the chip resistor d1 (especially the portions related to the first connection electrode d3 and the second connection electrode d4).

With reference to FIG. 97, the chip capacitor d101 has, like the chip resistor d1, the substrate d2, the first connection electrode d3 disposed on the substrate d2 (at the element forming surface d2A side of the substrate d2), and the second connection electrode d4 disposed similarly on the substrate d2. In the present preferred embodiment, the substrate d2 has, in a plan view, a rectangular shape. The first connection electrode d3 and the second connection electrode d4 are respectively disposed at portions at respective ends in the long direction of the substrate d2. In the present preferred embodiment, each of the first connection electrode d3 and the second connection electrode d4 has a substantially rectangular planar shape extending in the short direction of the substrate d2. As in the chip resistor d1, each of the first connection electrode d3 and the second connection electrode d4 in the chip capacitor d101 is disposed across an interval from the peripheral edge portion d85 of the element forming surface d2A of the substrate d2. Therefore with the circuit assembly d100, in which the chip capacitor d101 is mounted on the mounting substrate d9 (see FIG. 85B to FIG. 85E), the chip capacitor d101 can be mounted at a small mounting area on the mounting substrate d9, as in the case of the chip resistor d1. That is, the chip capacitor d101 can be mounted on the mounting substrate d9 at a small mounting area.

On the element forming surface d2A of the substrate d2, a plurality of capacitor parts C1 to C9 are disposed within a capacitor arrangement region d105 between the first connection electrode d3 and the second connection electrode d4. The plurality of capacitor parts C1 to C9 are a plurality of element parts that constitute the element d5 (a capacitor element in the present case) and are connected between the first connection electrode d3 and the second connection electrode d4. Specifically, the plurality of capacitor parts C1 to C9 are electrically connected respectively to the second connection electrode d4 via a plurality of fuse units d107 (corresponding to the fuses F described above) in a manner enabling disconnection.

As shown in FIG. 98 and FIG. 99, an insulating layer d20 is formed on the element forming surface d2A of the substrate d2, and a lower electrode film d111 is formed on a top surface of the insulating layer d20. The lower electrode film d111 is formed to spread across substantially the entirety of the capacitor arrangement region d105. The lower electrode film d111 is further formed to extend to a region directly below the first connection electrode d3. More specifically, the lower electrode film d111 has, in the capacitor arrangement region d105, a capacitor electrode region d111A functioning as a lower electrode in common to the capacitor parts C1 to C9 and has a pad region d111B arranged to lead out to an external electrode and disposed directly below the first connection electrode d3. The capacitor electrode region d111A is positioned in the capacitor arrangement region d105 and the pad region d111B is positioned directly below the first connection electrode d3 and is in contact with the first connection electrode d3.

In the capacitor arrangement region d105, a capacitance film (dielectric film) d112 is formed so as to cover and contact the lower electrode film d111 (capacitor electrode region d111A). The capacitance film d112 is formed across the entirety of the capacitor electrode region d111A (capacitor arrangement region d105). In the present preferred embodiment, the capacitance film d112 further covers the insulating layer d20 outside the capacitor arrangement region d105.

An upper electrode film d113 is formed on the capacitance film d112. In FIG. 97, the upper electrode film d113 is colored for the sake of clarity. The upper electrode film d113 includes a capacitor electrode region d113A positioned in the capacitor arrangement region d105, a pad region d113B positioned directly below the second connection electrode d4 and in contact with the second connection electrode d4, and a fuse region d113C disposed between the capacitor electrode region d113A and the pad region d113B.

In the capacitor electrode region d113A, the upper electrode film d113 is divided (separated) into a plurality of electrode film portions (upper electrode film portions) d131 to d139. In the present preferred embodiment, the respective electrode film portions d131 to d139 are all formed to rectangular shapes and extend in the form of bands from the fuse region d113C toward the first connection electrode d3. The plurality of electrode film portions d131 to d139 face the lower electrode film d111 across the capacitance film d112 over a plurality of types of facing areas (while being in contact with the capacitance film d112). More specifically, the facing areas of the electrode film portions d131 to d139 with respect to the lower electrode film d111 may be set to be 1:2:4:8:16:32:64:128:128. That is, the plurality of electrode film portions d131 to d139 include the plurality of electrode film portions differing in facing area and more specifically include the plurality of electrode film portions d131 to d138 (or d131 to d137 and d139) having facing areas that are set to form a geometric progression with a common ratio of 2. The plurality of capacitor parts C1 to C9, respectively arranged by the respective electrode film portions d131 to d139 and the facing lower electrode film d111 across the capacitance film d112, thus include the plurality of capacitor parts having mutually different capacitance values. If the ratio of the facing areas of the electrode film portions d131 to d139 is as mentioned above, the ratio of the capacitance values of the capacitor parts C1 to C9 is equal to the ratio of the facing areas and is 1:2:4:8:16:32:64:128:128. The plurality of capacitor parts C1 to C9 thus include the plurality of capacitor parts C1 to C8 (or C1 to C7 and C9) with capacitance values set to form the geometric progression with the common ratio of 2.

In the present preferred embodiment, the electrode film portions d131 to d135 are formed to bands that are equal in width and have lengths with the ratio thereof being set to 1:2:4:8:16. Also, the electrode film portions d135, d136, d137, d138, and d139 are formed to bands that are equal in length and have widths with the ratio thereof being set to 1:2:4:8:8. The electrode film portions d135 to d139 are formed to extend across a range from an end edge at the second connection electrode d4 side to an end edge at the first connection electrode d3 side of the capacitor arrangement region d105, and the electrode film portions d131 to d134 are formed to be shorter than this range.

The pad region d113B is formed to be substantially similar in shape to the second connection electrode d4 and has a substantially rectangular planar shape. As shown in FIG. 98, the upper electrode film d113 in the pad region d113B is in contact with the second connection electrode d4. The fuse region d113C is disposed along one long side (the long side at the inner side with respect to the peripheral edge of the substrate d2) of the pad region d113B. The fuse region d113C includes the plurality of fuse units d107 that are aligned along the one long side of the pad region d113B.

The fuse units d107 are formed of the same material as and to be integral to the pad region d113B of the upper electrode film d113. The plurality of electrode film portions d131 to d139 are each formed integral to one or a plurality of the fuse units d107, are connected to the pad region d113B via the fuse units d107, and are electrically connected to the second connection electrode d4 via the pad region d113B. As shown in FIG. 97, each of the electrode film portions d131 to d136 of comparatively small area is connected to the pad region d113B via a single fuse unit d107, and each of the electrode film portions d137 to d139 of comparatively large area is connected to the pad region d113B via a plurality of fuse units d107. It is not necessary for all of the fuse units d107 to be used and, in the present preferred embodiment, a portion of the fuse units d107 is unused.

The fuse units d107 include first wide portions d107A arranged to be connected to the pad region d113B, second wide portions d107B arranged to be connected to the electrode film portions d131 to d139, and narrow portions d107C connecting the first and second wide portions d107A and d107B. The narrow portions d107C are arranged to be capable of being cut (fused) by laser light. Unnecessary electrode film portions among the electrode film portions d131 to d139 can thus be electrically disconnected from the first and second connection electrodes d3 and d4 by cutting the fuse units d107.

Although omitted from illustration in FIG. 97 and FIG. 99, a top surface of the chip capacitor d101 that includes a top surface of the upper electrode film d113 is covered by the passivation film d23 as shown in FIG. 98. The passivation film d23 is constituted, for example, of a nitride film and is formed not only to cover the upper surface of the chip capacitor d101 but also to extend to the side surfaces d2C to d2F of the substrate d2 and cover the entireties of the side surfaces d2C to d2F. Further, the resin film d24 is formed on the passivation film d23. The resin film d24 covers the element forming surface d2A.

The passivation film d23 and the resin film d24 are protective films that protect the top surface of the chip capacitor d101. In these films, the pad openings d25 are respectively formed in regions corresponding to the first connection electrode d3 and the second connection electrode d4. The pad openings d25 penetrate through the passivation film d23 and the resin film d24 so as to respectively expose a region of a portion of the pad region d111B of the lower electrode film d111 and a region of a portion of the pad region d113B of the upper electrode film d113. Further, with the present preferred embodiment, the pad opening d25 corresponding to the first connection electrode d3 also penetrates through the capacitance film d112.

The first connection electrode d3 and the second connection electrode d4 are respectively embedded in the openings d25. The first connection electrode d3 is thereby bonded to the pad region d111B of the lower electrode film d111 and the second connection electrode d4 is bonded to the pad region d113B of the upper electrode film d113. The first and second external electrodes d3 and d4 are formed to project from the top surface of the resin film d24. The chip capacitor d101 can thereby be flip-chip bonded to a mounting substrate.

Figure 100:
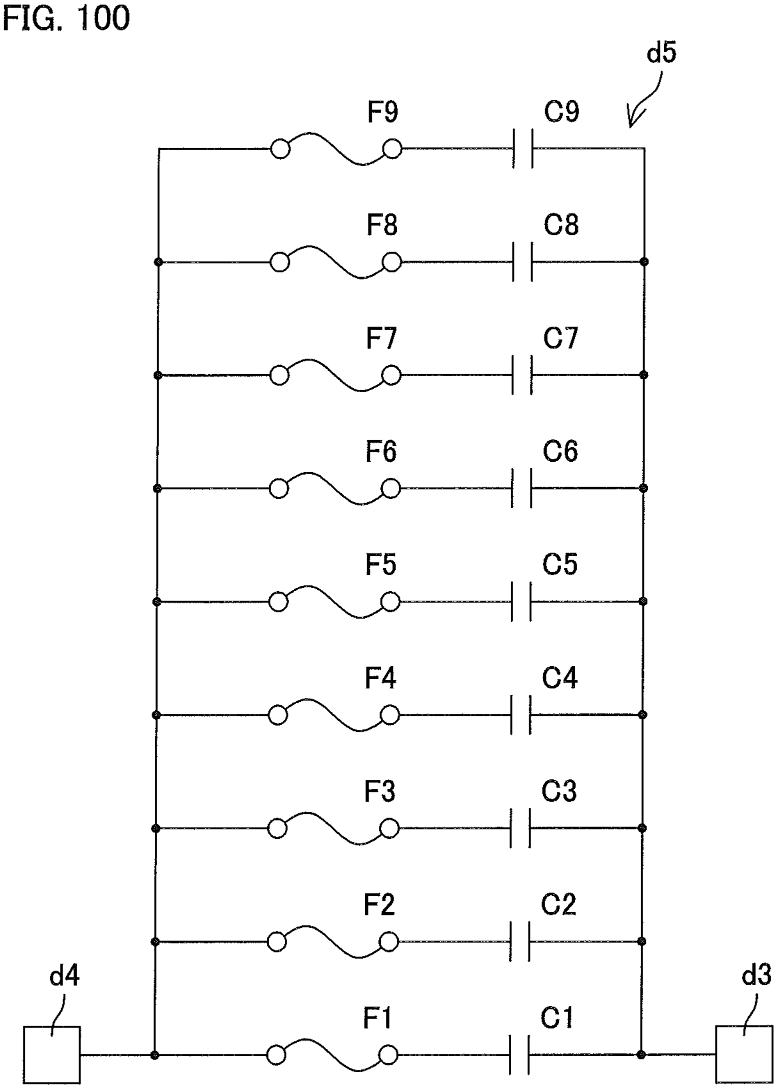
FIG. 100 is a circuit diagram of the electrical arrangement of the interior of the chip capacitor.

FIG. 100 is a circuit diagram of the electrical arrangement of the interior of the chip capacitor. The plurality of capacitor parts C1 to C9 are connected in parallel between the first connection electrode d3 and the second connection electrode d4. Fuses F1 to F9, each arranged from one or a plurality of the fuse units d107, are interposed in series between the respective capacitor parts C1 to C9 and the second connection electrode d4.

When all of the fuses F1 to F9 are connected, the capacitance value of the chip capacitor d101 is equal to the total of the capacitance values of the capacitor parts C1 to C9. When one or two or more fuses selected from among the plurality of fuses F1 to F9 is or are cut, each capacitor part corresponding to the cut fuse is disconnected and the capacitance value of the chip capacitor d101 decreases by just the capacitance value of the disconnected capacitor part or parts.

Therefore by measuring the capacitance value across the pad regions d111B and d113B (the total capacitance value of the capacitor parts C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor parts C1 to C8 are set to form a geometric progression with a common ratio of 2, fine adjustment to the targeted capacitance value at a precision corresponding to the capacitance value of the capacitor part C1, which is the smallest capacitance value (value of the first term in the geometric progression), is made possible.

For example, the capacitance values of the capacitor parts C1 to C9 may be set as follows. C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor d101 can be finely adjusted at a minimum adjustment precision of 0.03125 pF. Also, the fuses to be cut among the fuses F1 to F9 can be selected appropriately to provide the chip capacitor d101 with an arbitrary capacitance value between 10 pF and 18 pF.

As described above, with the present preferred embodiment, the plurality of capacitor parts C1 to C9 that can be disconnected by the fuses F1 to F9 are provided between the first connection electrode d3 and the second connection electrode d4. The capacitor parts C1 to C9 include a plurality of capacitor parts that differ in capacitance value and more specifically include a plurality of capacitor parts with capacitance values set to form a geometric progression. Chip capacitors d101, which can accommodate a plurality of types of capacitance values without change of design and can be accurately adjusted to the desired capacitance value by selection and fusion by laser light of one or a plurality of fuses among the fuses F1 to F9, can thus be realized with a common design.

Details of respective portions of the chip capacitor d101 shall now be described. With reference to FIG. 97, the substrate d2 may have, for example, a rectangular shape of 0.3 mm×0.15 mm, 0.4 mm×0.2 mm, etc. (preferably a size of not more than 0.4 mm×0.2 mm) in a plan view. The capacitor arrangement region d105 is generally a square region with each side having a length corresponding to the length of the short side of the substrate d2. The thickness of the substrate d2 may be approximately 150 μm. With reference to FIG. 98, the substrate d2 may, for example, be a substrate that has been thinned by grinding or polishing from the rear surface side (surface on which the capacitor parts C1 to C9 are not formed). As the material of the substrate d2, a semiconductor substrate as represented by a silicon substrate may be used or a glass substrate may be used or a resin film may be used.

The insulating layer d20 may be a silicon oxide film or other oxide film. The film thickness thereof may be approximately 500 Å to 2000 Å. The lower electrode film d111 is preferably a conductive film, a metal film in particular, and may, for example, be an aluminum film. The lower electrode film d111 that is constituted of an aluminum film may be formed by a sputtering method. Similarly, the upper electrode film d113 is preferably constituted of a conductive film, a metal film in particular, and may, for example, be an aluminum film. The upper electrode film d113 that is constituted of an aluminum film may be formed by the sputtering method. The patterning for dividing the capacitor electrode region d113A of the upper electrode film d113 into the electrode film portions d131 to d139 and shaping the fuse region d113C into the plurality of fuse units d107 may be performed by photolithography and etching processes.

The capacitance film d112 may be constituted, for example, of a silicon nitride film, and the film thickness thereof may be 500 Å to 2000 Å (for example, 1000 Å). The capacitance film d112 may be a silicon nitride film formed by plasma CVD (chemical vapor deposition). The passivation film d23 may be constituted, for example, of a silicon nitride film and may be formed, for example, by the plasma CVD method. The film thickness thereof may be approximately 8000 Å. As mentioned above, the resin film d24 may be constituted of a polyimide film or other resin film.

Each of the first and second connection electrodes d3 and d4 may, for example, be constituted of a laminated structure film in which a nickel layer in contact with the lower electrode film d111 or the upper electrode film d113, a palladium layer laminated on the nickel layer, and a gold layer laminated on the palladium layer are laminated, and may be formed, for example, by a plating method (or more specifically, an electroless plating method). The nickel layer contributes to improvement of adhesion with the lower electrode film d111 or the upper electrode film d113, and the palladium layer functions as a diffusion preventing layer that suppresses mutual diffusion of the material of the upper electrode film or the lower electrode film and the gold of the topmost layer of each of the first and second connection electrodes d3 and d4.

A process for manufacturing the chip capacitor d101 is the same as the process for manufacturing the chip resistor d1 after the element d5 has been formed. To form the element d5 (capacitor element) in the chip capacitor d101, first, the insulating layer d20, constituted of an oxide film (for example, a silicon oxide film), is formed on a top surface of the substrate d30 (substrate d2) by a thermal oxidation method and/or CVD method. Thereafter, the lower electrode film d111, constituted of an aluminum film, is formed over the entire top surface of the insulating layer d20, for example, by the sputtering method. The film thickness of the lower electrode film d111 may be approximately 8000 Å. Thereafter, a resist pattern corresponding to the final shape of the lower electrode film d111 is formed on the top surface of the lower electrode film by photolithography. The lower electrode film is etched using the resist pattern as a mask to obtain the lower electrode film d111 of the pattern shown in FIG. 97, etc. The etching of the lower electrode film d111 may be performed, for example, by reactive ion etching.

Thereafter, the capacitance film d112, constituted of a silicon nitride film, etc., is formed on the lower electrode film d111, for example, by the plasma CVD method. In the region in which the lower electrode film d111 is not formed, the capacitance film d112 is formed on the top surface of the insulating layer d20. Thereafter, the upper electrode film d113 is formed on the capacitance film d112. The upper electrode film d113 is constituted, for example, of an aluminum film and may be formed by the sputtering method. The film thickness thereof may be approximately 8000 Å. Thereafter, a resist pattern corresponding to the final shape of the upper electrode film d113 is formed on the top surface of the upper electrode film d113 by photolithography. The upper electrode film d113 is patterned to its final shape (see FIG. 97, etc.) by etching using the resist pattern as a mask. The upper electrode film d113 is thereby shaped to the pattern having the portion divided into the plurality of electrode film portions d131 to d139 in the capacitor electrode region d113A, having the plurality of fuse units d107 in the fuse region d113C, and having the pad region d113B connected to the fuse units d107. The etching for patterning the upper electrode film d113 may be performed by wet etching using an etching liquid, such as phosphoric acid, etc., or may be performed by reactive ion etching.

The element d5 (the capacitor parts C1 to C9 and the fuse units d107) in the chip capacitor d101 is formed by the above. After the element d5 has been formed, the insulating film d45 is formed by the plasma CVD method so as to cover the entire element d5 (the upper electrode film d113 and the capacitance film d112 in the region in which the upper electrode film d113 is not formed) (see FIG. 94A). Thereafter, the groove d44 is formed (see FIG. 94B) and then the openings d25 are formed (see FIG. 24C). Probes d70 are then contacted against the pad region d113B of the upper electrode film d113 and the pad region d111B of the lower electrode film d111 that are exposed through the openings d25 to measure the total capacitance value of the plurality of capacitor parts C1 to C9 (see FIG. 94C). Based on the measured total capacitance value, the capacitor parts to be disconnected, that is, the fuses to be cut are selected in accordance with the targeted capacitance value of the chip capacitor d101.

From this state, the laser trimming for fusing the fuse units d107 is performed. That is, each fuse unit d107 constituting a fuse selected in accordance with the measurement result of the total capacitance value is irradiated with laser light and the narrow portion d107C (see FIG. 97) of the fuse unit d107 is fused. The corresponding capacitor part is thereby disconnected from the pad region d113B. When the laser light is irradiated on the fuse unit d107, the energy of the laser light is accumulated at a vicinity of the fuse unit d107 by the action of the insulating film d45 that is a cover film and the fuse unit d107 is thereby fused. The capacitance value of the chip capacitor d101 can thereby be set to the targeted capacitance value reliably.

Thereafter, a silicon nitride film is deposited on the cover film (insulating film d45), for example, by the plasma CVD method to form the passivation film d23. In the final form, the cover film is made integral with the passivation film d23 to constitute a portion of the passivation film d23. The passivation film d23 that is formed after the cutting of the fuses enters into openings in the cover film, destroyed at the same time as the fusing of the fuses, to cover and protect the cut surfaces of the fuse units d107. The passivation film d23 thus prevents entry of foreign matter and entry of moisture into the cut locations of the fuse units d107. The chip capacitor d101 of high reliability can thereby be manufactured. The passivation film d23 may be formed to have a film thickness, for example, of approximately 8000 Å as a whole.

Thereafter, the resin film d46 is formed (see FIG. 94D). Thereafter, the openings d25, closed by the resin film d46 and the passivation film d23, are opened (see FIG. 94E) and the first connection electrode d3 and the second connection electrode d4 are grown, for example, by the electroless plating method inside the openings d25 (see FIG. 94F). Thereafter, as in the case of the chip resistor d1, the individual chips of the chip capacitors d101 can be cut out by grinding the substrate d30 from the rear surface d30B (see FIG. 94G).

In the patterning of the upper electrode film d113 using the photolithography process, the electrode film portions d131 to d139 of minute areas can be formed with high precision and the fuse units d107 of even finer pattern can be formed. After the patterning of the upper electrode film d113, the total capacitance value is measured and then the fuses to be cut are determined. By cutting the determined fuses, the chip capacitor d101 that is accurately adjusted to the desired capacitance value can be obtained.

Figure 101:
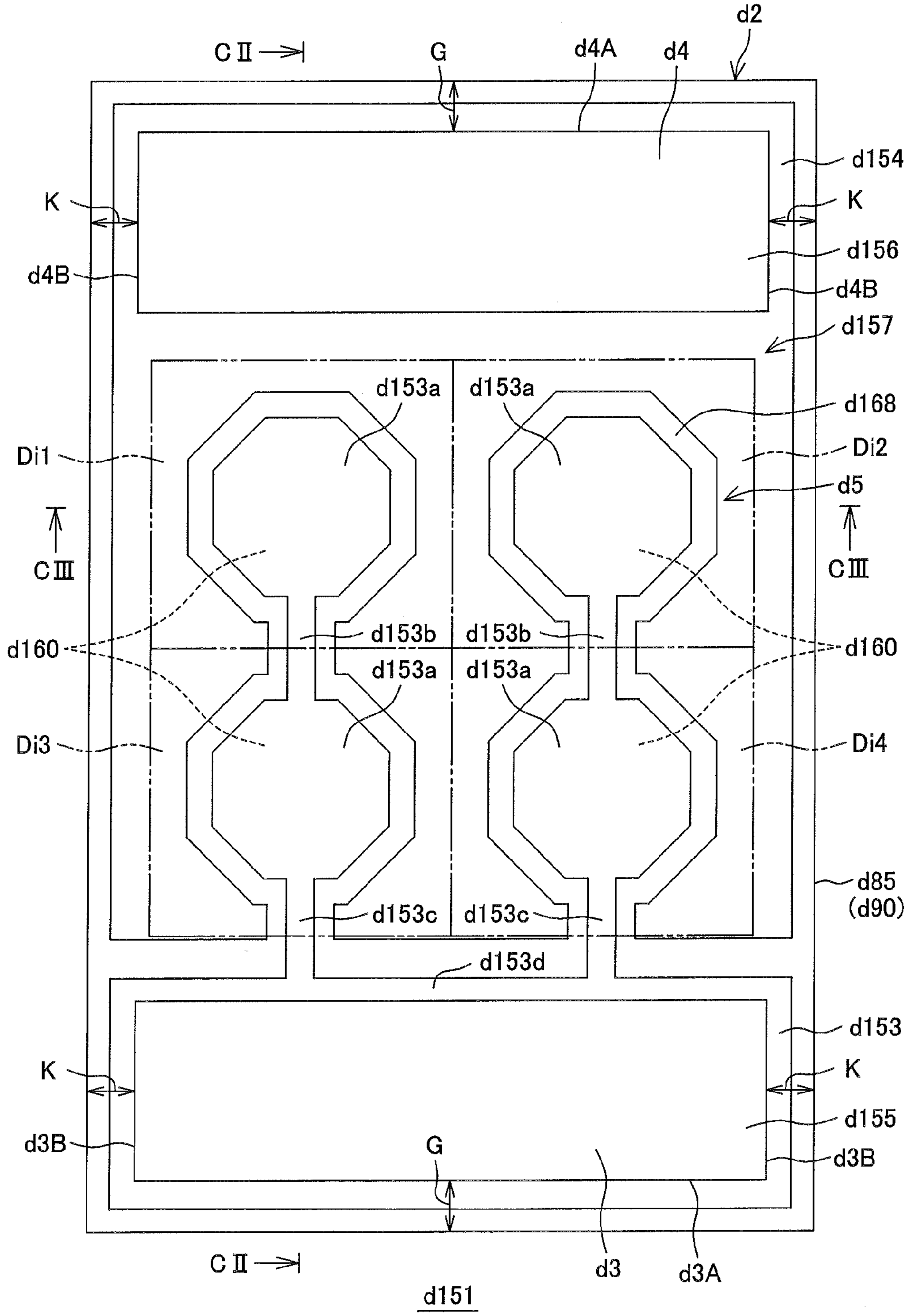
FIG. 101 is a plan view of a chip capacitor according to yet another preferred embodiment of the fourth reference example.
Figure 102:
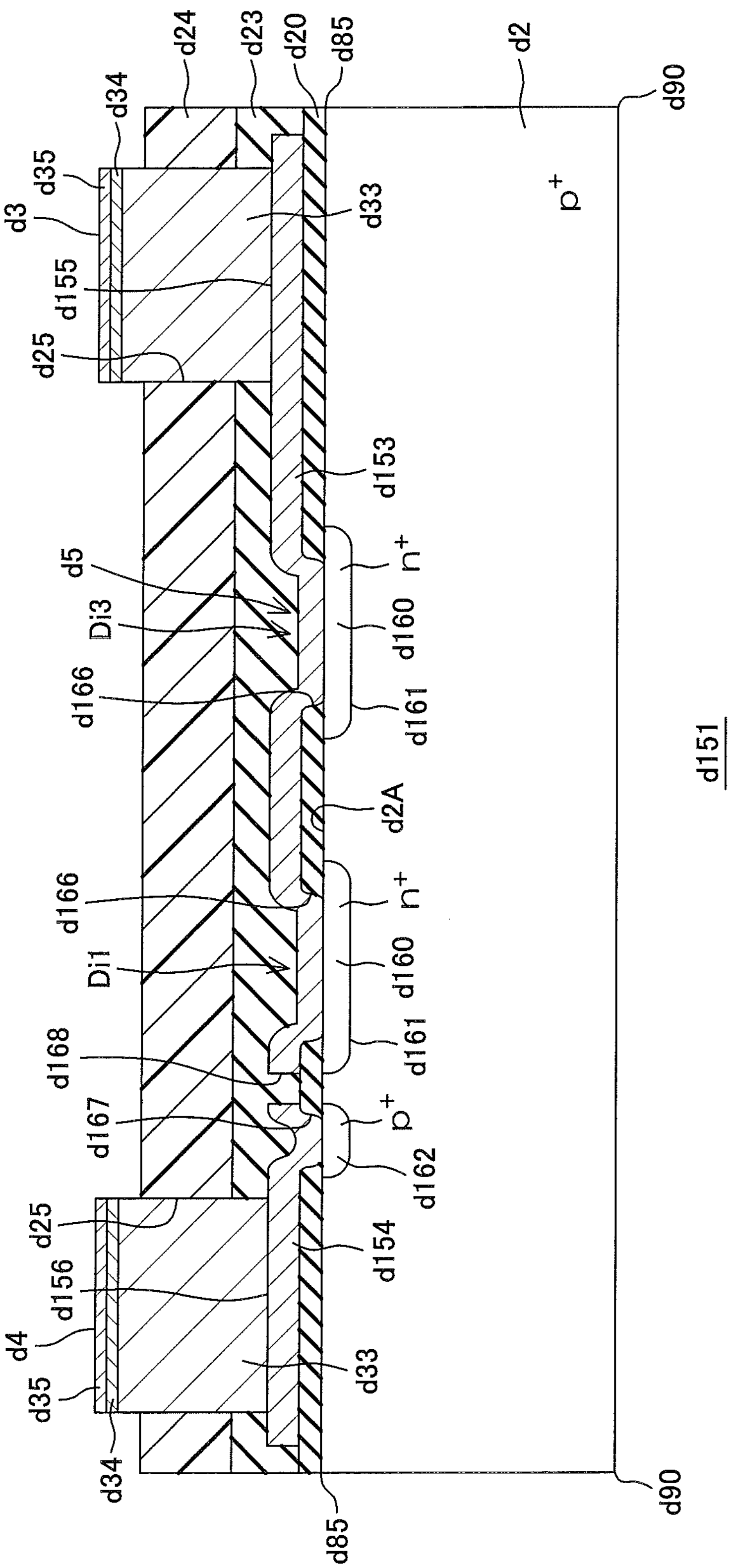
Figure 103:
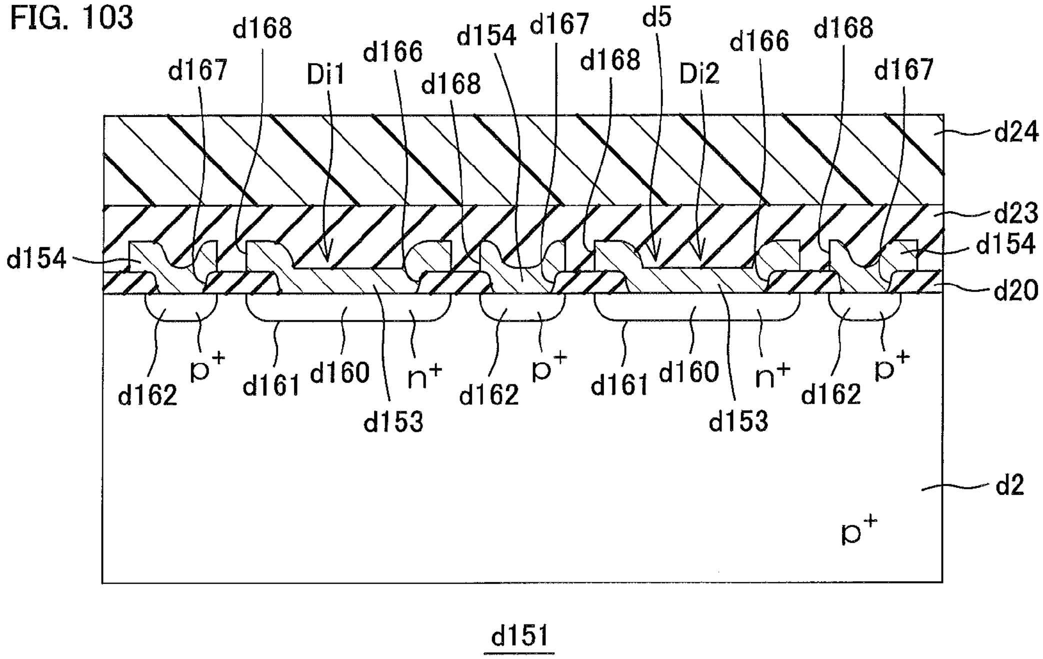

A chip diode shall now be described. FIG. 101 is a plan view of a chip capacitor according to yet another preferred embodiment of the fourth reference example. FIG. 102 is a sectional view taken along section line CII-CII in FIG. 101. FIG. 103 is a sectional view taken along section line CIII-CIII in FIG. 101. With the chip diode d151 to be described below, portions corresponding to portions described above for the chip resistor d1 or the chip capacitor d101 shall be provided with the same reference symbols and detailed description of such portions shall be omitted. With the chip diode d151, the portions provided with the same reference symbols as the portions described for the chip resistor d1 or the chip capacitor d101 have, unless noted otherwise, the same arrangements as the portions described for the chip resistor d1 or the chip capacitor d101 and exhibit the same actions and effects as the portions described for the chip resistor d1 or the chip capacitor d101 (especially the portions related to the first connection electrode d3 and the second connection electrode d4).

With reference to FIG. 101, the chip diode d151 includes, like the chip resistor d1 and the chip capacitor d101, the substrate d2. The substrate d2 is a $p^+$-type semiconductor substrate (for example, a silicon substrate). The substrate d2 is formed to a rectangular shape in a plan view. Further the chip diode d151 includes a cathode electrode d153, an anode electrode d154, and a plurality of diode cells Di1 to Di4 that are formed on the semiconductor substrate d2. The cathode electrode d153 and the anode electrode d154 connect the plurality of diode cells Di1 to Di4 in parallel. The diode cells Di1 to Di4 are a plurality of diode parts that constitute the element d5 (a diode element in the present case).

A cathode pad d155 arranged to be connected to the cathode electrode d153 and an anode pad d156 arranged to be connected to the anode electrode d154 are disposed at respective end portions of the substrate d2. A diode cell region d157 is provided between the pads d155 and d156. The first connection electrode d3 is formed on the cathode pad d155, and the second connection electrode d4 is formed on the anode pad d156. The element d5 (the group of diode cells Di1 to Di4) is connected between the first connection electrode d3 and the second connection electrode d4 via the cathode electrode d153 and the anode electrode d154.

Figure 104:
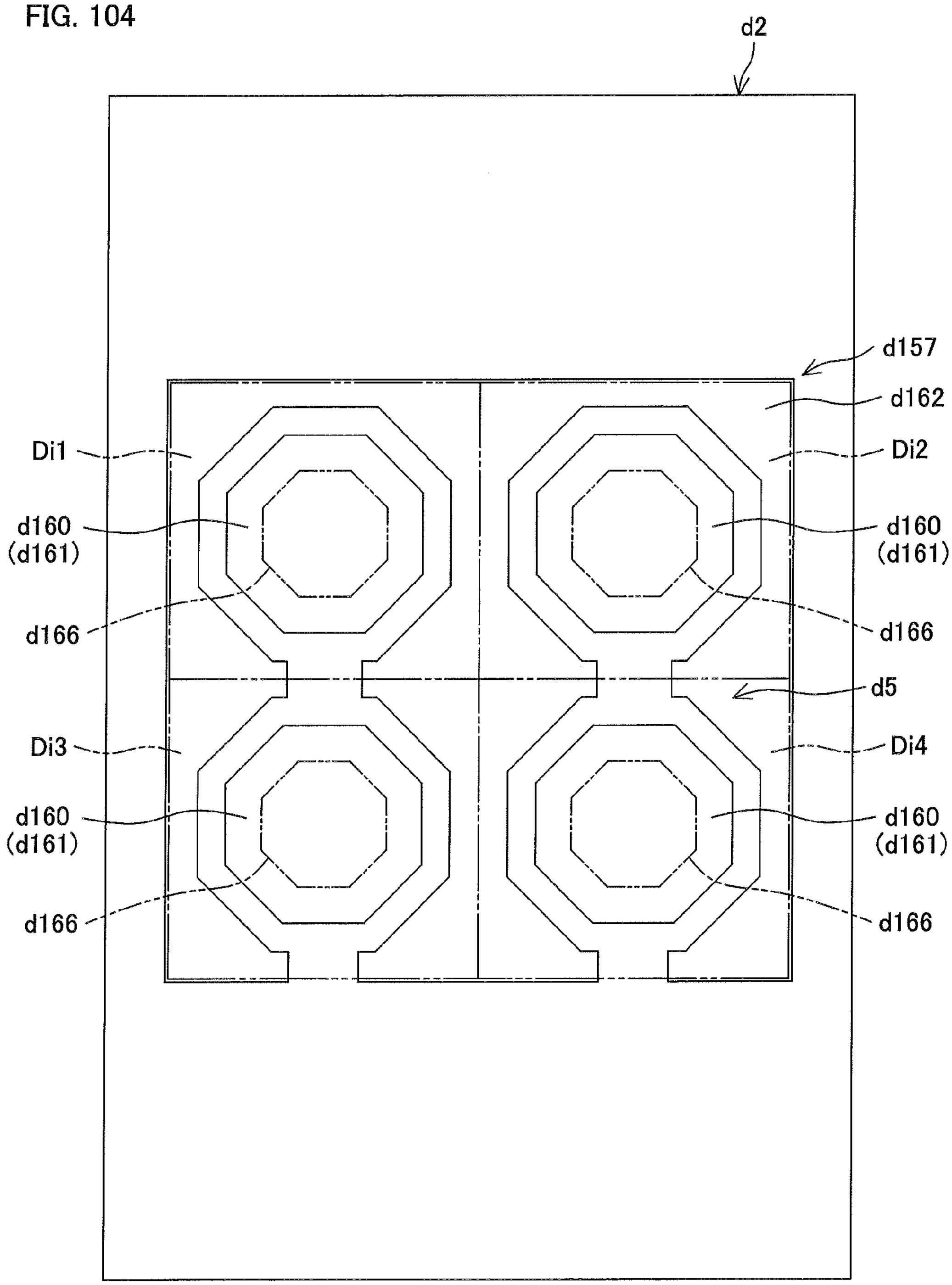

In the present preferred embodiment, the diode cell region d157 is formed to a rectangular shape. The plurality of diode cells Di1 to Di4 are disposed inside the diode cell region d157. In regard to the plurality of diode cells Di1 to Di4, four are provided in the present preferred embodiment and these are arrayed two-dimensionally at equal intervals in a matrix along the long direction and short direction of the substrate d2. FIG. 104 is a plan view showing the structure of the element forming surface of the substrate with the cathode electrode, the anode electrode, and the arrangement formed thereon being removed. With reference to FIG. 104, in each of the regions of the diode cells Di1 to Di4, an $n^+$-type region d160 is formed in a top layer region of the $p^+$-type substrate d2. The $n^+$-type regions d160 are separated according to each individual diode cell. The diode cells Di1 to Di4 are thereby made to respectively have p-n junction regions d161 that are separated according to each individual diode cell.

In the present preferred embodiment, the plurality of diode cells Di1 to Di4 are formed to be equal in size and equal in shape and are specifically formed to rectangular shapes, and the $n^+$-type region d160 with a polygonal shape is formed in the rectangular region of each diode cell. In the present preferred embodiment, each $n^+$-type region d160 is formed to a regular octagon having four sides parallel to the four sides forming the rectangular region of the corresponding diode cell among the diode cells Di1 to Di4 and another four sides respectively facing the four corner portions of the rectangular region of the corresponding diode cell among the diode cells Di1 to Di4. Further in the top layer region of the substrate d2, a $p^+$-type region d162 is formed in a state of being separated from the $n^+$-type regions d160 across a predetermined interval. In the diode cell region d157, the $p^+$-type region d162 is formed to a pattern that avoids the region in which the cathode electrode d153 is disposed (see FIG. 102).

As shown in FIG. 102 and FIG. 103, the insulating layer d20 (omitted from illustration in FIG. 101) is formed on a top surface of the substrate d2. Contact holes d166 exposing top surfaces of the respective $n^+$-type regions d160 of the diode cells Di1 to Di4 and contact holes d167 exposing the $p^+$-type region d162 are formed in the insulating layer d20. The cathode electrode d153 and the anode electrode d154 are formed on the top surface of the insulating layer d20. The cathode electrode d153 enters into the contact holes d166 from the top surface of the insulating layer d20 and is in ohmic contact with the respective $n^+$-type regions d160 of the diode cells Di1 to Di4 inside the contact holes d166. The anode electrode d154 extends to interiors of the contact holes d167 from the top surface of the insulating layer d20 and is in ohmic contact with the $p^+$-type region d162 inside the contact holes d167. In the present preferred embodiment, the cathode electrode d153 and the anode electrode d154 are constituted of electrode films made of the same material.

As each electrode film, a Ti/Al laminated film having a Ti film as a lower layer and an Al film as an upper layer or an AlCu film may be applied. Besides these, an AlSi film may also be used as the electrode film. When an AlSi film is used, the anode electrode d154 can be put in ohmic contact with the substrate d2 without having to provide the $p^+$-type region d162 on the top surface of the substrate d2. A process for forming the $p^+$-type region d162 can thus be omitted.

The cathode electrode d153 and the anode electrode d154 are separated by a slit d168. In the present preferred embodiment, the slit d168 is formed to a frame shape (that is, a regular octagonal frame shape) matching the planar shapes of the $n^+$-type regions d160 of the diode cells Di1 to Di4 so as to border the $n^+$-type regions d160. Accordingly, the cathode electrode d153 has, in the regions of the respective diode cells Di1 to Di4, cell junction portions d153*a* with planar shapes matching the shapes of the $n^+$-type regions d160 (that is, regular octagonal shapes), and the cell junction portions d153*a* are put in communication with each other by rectilinear bridging portions d153*b* and connected by other rectilinear bridging portions d153*c* to a large external connection portion d153*d* of rectangular shape that is formed directly below the cathode pad d155. On the other hand, the anode electrode d154 is formed on the top surface of the insulating layer d20 so as to surround the cathode electrode d153 across an interval corresponding to the slit d168 of substantially fixed width and is formed integrally to extend to a rectangular region directly below the anode pad d156.

With reference to FIG. 102, the cathode electrode d153 and the anode electrode d154 are covered by the passivation film d23 (omitted from illustration in FIG. 101), and a resin film d24, made of polyimide, etc., is further formed on the passivation film d23. An opening d25 exposing the cathode pad d155 and an opening d25 exposing the anode pad d156 are formed so as to penetrate through the passivation film d23 and the resin film d24. Further, the first connection electrode d3 is embedded in the opening d25 exposing the cathode pad d155, and the second connection electrode d4 is embedded in the opening d25 exposing the anode pad d156. The first connection electrode d3 and the second connection electrode d4 project from the top surface of the resin film d24. As with the chip resistor d1 and the chip capacitor d101, each of the first connection electrode d3 and the second connection electrode d4 in the chip diode d151 is disposed across an interval from the peripheral edge portion d85 of the element forming surface d2A of the substrate d2. Therefore with the circuit assembly d100, in which the chip diode d151 is mounted on the mounting substrate d9 (see FIG. 85B to FIG. 85E), the chip diode d151 can be mounted at a small mounting area on the mounting substrate d9, as in the case of the chip resistor d1 and the chip capacitor d101. That is, the chip diode d151 can be mounted on the mounting substrate d9 at a small mounting area.

In each of the diode cells Di1 to Di4, a p-n junction region d161 is formed between the p-type substrate d2 and the $n^+$-type region d160, and a p-n junction diode is thus formed respectively. The $n^+$-type regions d160 of the plurality of diode cells Di1 to Di4 are connected in common to the cathode electrode d153, and the $p^+$-type substrate d2, which is the p-type region in common to the diode cells Di1 to Di4, is connected in common via the $p^+$-type region d162 to the anode electrode d154. All of the plurality of diode cells Di1 to Di4, formed on the substrate d2, are thereby connected in parallel.

By the cathode sides of the p-n junction diodes respectively constituted by the diode cells Di1 to Di4 being connected in common by the cathode electrode d153 and the anode sides being connected in common by the anode electrode d154, all of the diodes are connected in parallel and are thereby made to function as a single diode as a whole. With the arrangement of the present preferred embodiment, the chip diode d151 has the plurality of diode cells Di1 to Di4 and each of the diode cells Di1 to Di4 has the p-n junction region d161. The p-n junction regions d161 are separated according to each of the diode cells Di1 to Di4. The chip diode d151 is thus made long in the peripheral length of the p-n junction regions d161, that is, the total peripheral length (total extension) of the $n^+$-type regions d160 in the substrate d2. The electric field can thereby be dispersed and prevented from concentrating at vicinities of the p-n junction regions d161, and the ESD (electrostatic discharge) tolerance can thus be improved. That is, even when the chip diode d151 is to be formed compactly, the total peripheral length of the p-n junction regions d161 can be made large, thereby enabling both downsizing of the chip diode d151 and securing of the ESD tolerance to be achieved at the same time.

A process for manufacturing the chip diode d151 shall now be described briefly. First, the insulating layer d20, which is a thermal oxide film, etc., is formed on the top surface of the $p^+$-type substrate d2 and a resist mask is formed on the insulating layer d20. By ion implantation or diffusion of an n-type impurity (for example, phosphorus) via the resist mask, the $n^+$-type regions d160 are formed. Further, another resist mask, having an opening matching the $p^+$-type region d162, is formed and by ion implantation or diffusion of a p-type impurity (for example, arsenic) via the resist mask, the $p^+$-type region d162 is formed. After then peeling off the resist mask and thickening the insulating layer d20 (thickening, for example, by CVD) as necessary, yet another resist mask, having opening matching the contact holes d166 and d167, is formed on the insulating layer d20. The contact holes d166 and d167 are formed in the insulating layer d20 by etching via the resist mask.

Thereafter, an electrode film that constitutes the cathode electrode d153 and the anode electrode d154 is formed on the insulating layer d20, for example, by sputtering. A resist film having an opening pattern corresponding to the slit d168 is then formed on the electrode film and the slit d168 is formed in the electrode film by etching via the resist film. The electrode film is thereby separated into the cathode electrode d153 and the anode electrode d154.

Then after peeling off the resist film, the passivation film d23, which is a nitride film, etc., is formed, for example, by the CVD method, and further, polyimide, etc., is coated on to form the resin film d24. By then applying etching using photolithography to the passivation film d23 and the resin film d24, the pair of openings d25 are formed. Thereafter, the first connection electrode d3 is formed in one of the openings d25 and the second connection electrode d4 is formed in the other opening d25. The chip diode d151 with the structure described above can thereby be obtained.

Although with the chip diode d151, an example where four diode cells Di are formed on the substrate d2 was described, two or three diode cells Di may be formed or not less than four diode cells Di may be formed on the substrate d2. Also with the chip diode d151, the plurality of fuses F may be provided on the substrate d2 (the bridging portions d153*b* and d153*c* may be used as the fuses F) so that each diode cell Di is disconnectably connected to the first connection electrode d3 and the second connection electrode d4 via a fuse F. In this case, with the chip diode d151, the pattern of combination of the plurality of diode cells Di1 to Di4 can be set to any pattern by selectively disconnecting one or a plurality of fuses F, and chip diodes d151 of various electrical characteristics can thus be realized with a common design.

Although chip components of the fourth reference example (the chip resistor d1, the chip capacitor d101, and the chip diode d151) have been described above, the fourth reference example may be implemented in yet other modes as well. For example, although with the chip resistor d1 among the preferred embodiments described above, an example where the plurality of resistor circuits include the plurality of resistor circuits having resistance values that form a geometric progression with a common ratio r ($0<r$; $r\neq1$)=2 was described, the common ratio of the geometric progression may be a numeral other than 2. Also, although with the chip capacitor d101, an example where the plurality of capacitor parts include the plurality of capacitor parts having capacitance values that form a geometric progression with a common ratio r ($0<r$; $r\neq1$)=2 was described, the common ratio of the geometric progression may be a numeral other than 2.

Also, although with the chip resistor d1 and the chip capacitor d101, the insulating layer d20 is formed on the top surface of the substrate d2, the insulating layer d20 may be omitted if the substrate d2 is an insulating substrate. Also, although with the chip capacitor d101, the arrangement where just the upper electrode film d113 is divided into the plurality of electrode film portions was described, just the lower electrode film d111 may be divided into a plurality of electrode film portions instead or both the upper electrode film d113 and the lower electrode film d111 may be divided into a plurality of electrode film portions. Further, although the preferred embodiment, an example where the fuse units are made integral with the upper electrode film or the lower electrode film was described, the fuse units may be formed from a conductor film separate from the upper electrode film and the lower electrode film. Also, although with the chip capacitor d101, the single layer capacitor structure having the upper electrode film d113 and the lower electrode film d111 is formed, another electrode film may be laminated via a capacitance film on the upper electrode film d113 so that a plurality of capacitor structures are laminated.

With the chip capacitor d101, a conductive substrate may be used as the substrate d2, the conductive substrate may be used as a lower electrode, and the capacitance film d112 may be formed in contact with the top surface of the conductive substrate. In this case, one of the external electrodes may be led out from a rear surface of the conductive substrate. Also, in a case of applying the fourth reference example to a chip inductor, the element d5 formed on the substrate d2 in the chip inductor includes an inductor element, which includes a plurality of inductor parts (element parts), and is connected between the first connection electrode d3 and the second connection electrode d4. The element d5 is disposed in a multilayer wiring of the multilayer substrate and is formed by the wiring film d22. Also, with the chip inductor, the plurality of fuses F may be provided on the substrate d2 so that each inductor part is disconnectably connected to the first connection electrode d3 and the second connection electrode d4 via a fuse F.

In this case, with the chip inductor, the pattern of combination of the plurality of inductor parts can be set to any pattern by selectively disconnecting one or a plurality of fuses F, and chip inductors of various electrical characteristics can thus be realized with a common design. Also, as with the chip resistor d1, the chip capacitor d101, and the chip diode d151, each of the first connection electrode d3 and the second connection electrode d4 in the chip inductor is disposed across an interval from the peripheral edge portion d85 of the element forming surface d2A of the substrate d2. Therefore with the circuit assembly d100, in which the chip inductor is mounted on the mounting substrate d9 (see FIG. 85B to FIG. 85E), the chip inductor can be mounted at a small mounting area on the mounting substrate d9 as well. That is, the chip inductor can be mounted on the mounting substrate d9 at a small mounting area.

Figure 105:
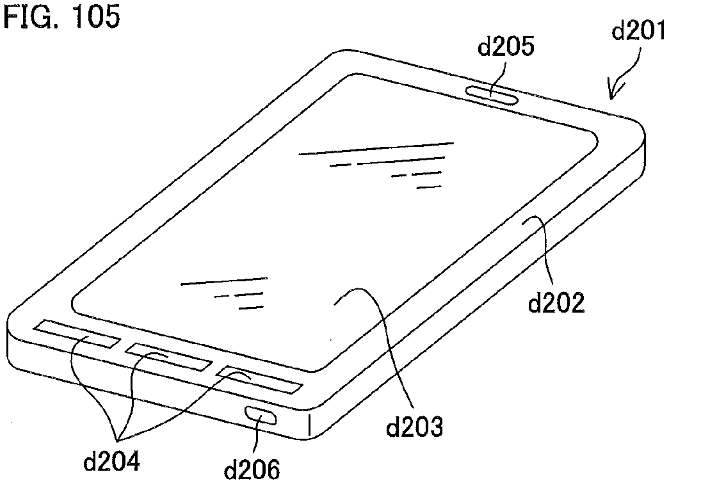

Also, in the first connection electrode d3 and the second connection electrode d4 described above, the Pd layer d34 interposed between the Ni layer d33 and the Au layer d35 may be omitted. The adhesion of the Ni layer d33 and the Au layer d35 is good and if the pinhole mentioned above does not form in the Au layer d35, the Pd layer d34 may be omitted. FIG. 105 is a perspective view of the outer appearance of a smartphone that is an example of an electronic equipment in which chip components according to the fourth reference example are used. The smartphone d201 is arranged by housing electronic parts in the interior of a housing d202 with a flat rectangular parallelepiped shape. The housing d202 has a pair of rectangular principal surfaces at its front side and rear side, and the pair of principal surfaces are joined by four side surfaces. A display surface of a display panel d203, constituted of a liquid crystal panel or an organic EL panel, etc., is exposed at one of the principal surfaces of the housing d202. The display surface of the display panel d203 constitutes a touch panel and provides an input interface for a user.

The display panel d203 is formed to a rectangular shape that occupies most of one of the principal surfaces of the housing d202. Operation buttons d204 are disposed along one short side of the display panel d203. In the present preferred embodiment, a plurality (three) of the operation buttons d204 are aligned along the short side of the display panel d203. The user can call and execute necessary functions by performing operations of the smartphone d201 by operating the operation buttons d204 and the touch panel.

A speaker d205 is disposed in a vicinity of the other short side of the display panel d203. The speaker d205 provides an earpiece for a telephone function and is also used as an acoustic conversion unit for reproducing music data, etc. On the other hand, close to the operation buttons d204, a microphone d206 is disposed at one of the side surfaces of the housing d202. The microphone d206 provides a mouthpiece for the telephone function and may also be used as a microphone for sound recording.

Figure 106:
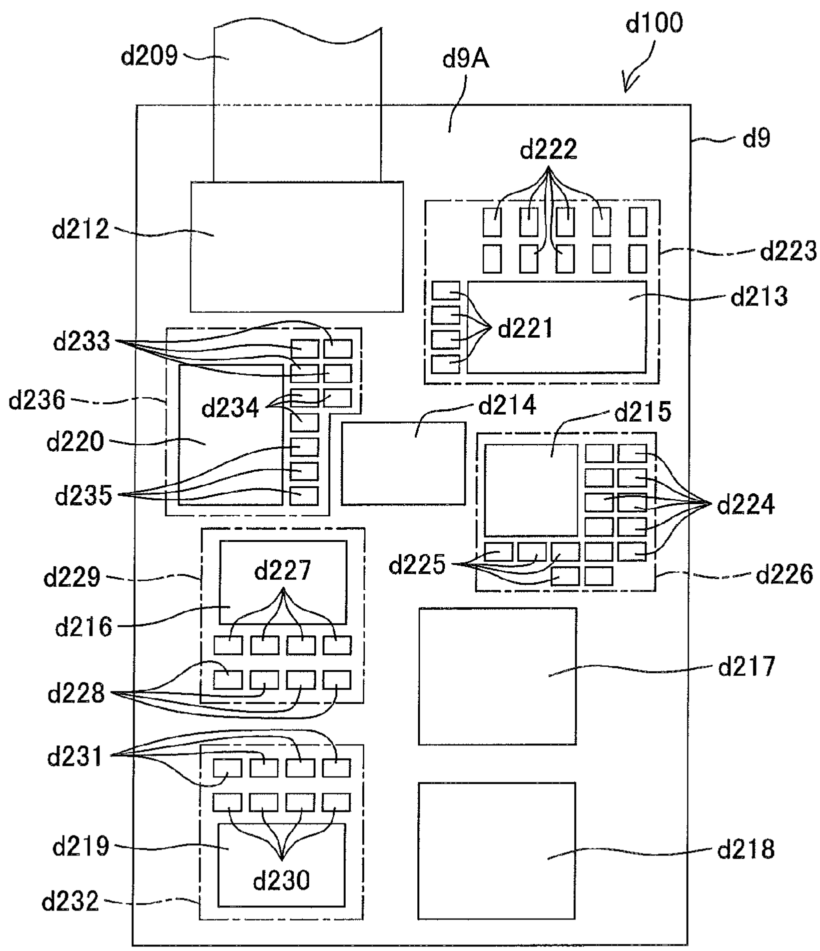

FIG. 106 is an illustrative plan view of the arrangement of the circuit assembly d100 housed in the interior of the housing d202. The circuit assembly d100 includes the mounting substrate d9 (which may be the multilayer substrate mentioned above) and circuit parts mounted on the mounting surface d9A of the mounting substrate d9. The plurality of circuit parts include a plurality of integrated circuit elements (ICs) d212 to d220 and a plurality of chip components. The plurality of ICs include a transmission processing IC d212, a one-segment TV receiving IC d213, a GPS receiving IC d214, an FM tuner IC d215, a power supply IC d216, a flash memory d217, a microcomputer d218, a power supply IC d219, and a baseband IC d220. The plurality of chip components (corresponding to the chip components of the fourth reference example) include chip inductors d221, d225, and d235, chip resistors d222, d224, and d233, chip capacitors d227, d230, and d234, and chip diodes d228 and d231.

The transmission processing IC d212 has incorporated therein an electronic circuit arranged to generate display control signals for the display panel d203 and receive input signals from the touch panel on a top surface of the display panel d203. For connection with the display panel d203, the transmission processing IC d212 is connected to a flexible wiring 209. The one-segment TV receiving IC d213 incorporates an electronic circuit that constitutes a receiver for receiving one-segment broadcast (terrestrial digital television broadcast targeted for reception by portable equipment) radio waves. A plurality of the chip inductors d221 and a plurality of the chip resistors d222 are disposed in a vicinity of the one-segment TV receiving IC d213. The one-segment TV receiving IC d213, the chip inductors d221, and the chip resistors d222 constitute a one-segment broadcast receiving circuit d223. The chip inductors d221 and the chip resistors d222 respectively have accurately adjusted inductances and resistances and provide circuit constants of high precision to the one-segment broadcast receiving circuit d223.

The GPS receiving IC d214 incorporates an electronic circuit that receives radio waves from GPS satellites and outputs positional information of the smartphone d201. The FM tuner IC d215 constitutes, together with a plurality of the chip resistors d224 and a plurality of the chip inductors d225 mounted on the mounting substrate d9 in a vicinity thereof, an FM broadcast receiving circuit d226. The chip resistors d224 and the chip inductors d225 respectively have accurately adjusted resistance values and inductances and provide circuit constants of high precision to the FM broadcast receiving circuit d226.

A plurality of the chip capacitors d227 and a plurality of the chip diodes d228 are mounted on the mounting surface of the mounting substrate d9 in a vicinity of the power supply IC d216. Together with the chip capacitors d227 and the chip diodes d228, the power supply IC d216 constitutes a power supply circuit d229. The flash memory d217 is a storage device for recording operating system programs, data generated in the interior of the smartphone d201, and data and programs acquired from the exterior by communication functions, etc.

The microcomputer d218 is a computing processing circuit that incorporates a CPU, a ROM, and a RAM and realizes a plurality of functions of the smartphone d201 by executing various computational processes. More specifically, computational processes for image processing and various application programs are realized by actions of the microcomputer d218. A plurality of the chip capacitors d230 and a plurality of the chip diodes d231 are mounted on the mounting surface of the mounting substrate d9 in a vicinity of the power supply IC d219. Together with the chip capacitors d230 and the chip diodes d231, the power supply IC d219 constitutes a power supply circuit d232.

A plurality of the chip resistors d233, a plurality of the chip capacitors d234, and aplurality of the chip inductors d235 are mounted on the mounting surface d9A of the mounting substrate d9 in a vicinity of the baseband IC d220. Together with the chip resistors d233, the chip capacitors d234, and the chip inductors d235, the baseband IC d220 constitutes a baseband communication circuit d236. The baseband communication circuit d236 provides communication functions for telephone communication and data communication.

With the above arrangement, electric power that is appropriately adjusted by the power supply circuits d229 and d232 is supplied to the transmission processing IC d212, the GPS receiving IC d214, the one-segment broadcast receiving circuit d223, the FM broadcast receiving circuit d226, the baseband communication circuit d236, the flash memory d217, and the microcomputer d218. The microcomputer d218 performs computational processes in response to input signals input via the transmission processing IC d212 and makes the display control signals be output from the transmission processing IC d212 to the display panel d203 to make the display panel d203 perform various displays.

When receiving of a one-segment broadcast is commanded by operation of the touch panel or the operation buttons d204, the one-segment broadcast is received by actions of the one-segment broadcast receiving circuit d223. Computational processes for outputting the received images to the display panel d203 and making the received audio signals be acoustically converted by the speaker d205 are executed by the microcomputer d218. Also, when positional information of the smartphone d201 is required, the microcomputer d218 acquires the positional information output by the GPS receiving IC d214 and executes computational processes using the positional information.

Further, when an FM broadcast receiving command is input by operation of the touch panel or the operation buttons d204, the microcomputer d218 starts up the FM broadcast receiving circuit d226 and executes computational processes for outputting the received audio signals from the speaker d205. The flash memory d217 is used for storing data acquired by communication and storing data prepared by computations by the microcomputer d218 and inputs from the touch panel. The microcomputer d218 writes data into the flash memory d217 or reads data from the flash memory d217 as necessary.

The telephone communication or data communication functions are realized by the baseband communication circuit d236. The microcomputer d218 controls the baseband communication circuit d236 to perform processes for sending and receiving audio signals or data.

Invention According to a Fifth Reference Example

(1) Features of the Invention According to the Fifth Reference Example

For example, the features of the invention according to the fifth reference example are the following E1 to E13.

(E1) A method for manufacturing a chip component including a step of forming an element, which includes a plurality of element parts, on a substrate, a step of forming a plurality of fuses for disconnectably connecting each of the plurality of element parts to an external connection electrode, and a step of forming the external connection electrode, which is arranged to provide external connection for the element, by electroless plating on the substrate.

With this method, the external connection electrode is formed by electroless plating and therefore in comparison to a case where the external connection electrode is formed by electrolytic plating, the number of steps of the process for forming the external connection electrode can be reduced to improve the productivity of the chip component. Further in the case of electroless plating, the resist mask that is deemed to be necessary in electrolytic plating is unnecessary and deviation of the position of formation of the external connection electrode due to positional deviation of the resist mask thus does not occur, thereby enabling the formation position precision of the external connection electrode to be improved to improve the yield. Also, with this method, the pattern of combination of the plurality of element parts in the element can be set to any pattern by selectively disconnecting one or a plurality of the fuses, and chip components with elements of various electrical characteristics can thus be realized with a common design.

(E2) The method for manufacturing a chip component according to E1, where the external connection electrode includes an Ni layer and an Au layer, and the Au layer is exposed at the topmost surface.

With this method, the external connection electrode can be formed by using electroless plating to form the Ni layer and form the Au layer on the Ni layer. With such an external connection electrode, a top surface of the Ni layer is covered by the Au layer so that oxidation of the Ni layer can be prevented.

(E3) The method for manufacturing a chip component according to E2, where the external connection electrode further includes a Pd layer interposed between the Ni layer and the Au layer.

With this method, the external connection electrode can be formed by using electroless plating to form the Ni layer, form the Pd layer on the Ni layer, and form the Au layer on the Pd layer. With such an external connection electrode, even if a penetrating hole (pinhole) forms in the Au layer due to thinning of the Au layer, the Pd layer interposed between the Ni layer and the Au layer closes the penetrating hole and the Ni layer can thus be prevented from being exposed to the exterior through the penetrating hole and becoming oxidized.

(E4) The method for manufacturing a chip component according to E1, where the element parts are resistor bodies and the chip component is a chip resistor.

With this method, the chip component (chip resistor) can be made to accommodate a plurality of types of resistance values easily and rapidly by selecting and cutting one or a plurality of the fuses. In other words, chip resistors of various resistance values can be realized with a common design by combining a plurality of resistor bodies that differ in resistance value.

(E5) The method for manufacturing a chip component according to E4, where the step of forming the resistor bodies includes a step of forming a resistor body film on a top surface of the substrate, a step of forming a wiring film in contact with the resistor body film, and a step of forming the plurality of resistor bodies by patterning the resistor body film and the wiring film.

With this method, portions of the resistor body film between mutually adjacent wiring films become the resistor bodies and therefore the plurality of resistor bodies can be formed simply by just laminating the wiring film on the resistor body film and patterning the resistor body film and the wiring film.

(E6) The method for manufacturing a chip component according to E5, where the fuses are formed in the step of patterning the resistor body film and the wiring film.

With this method, the fuses can be formed in a batch together with the plurality of resistor bodies by patterning the resistor body film and the wiring film.

(E7) The method for manufacturing a chip component according to E6, where the wiring film includes a pad on which the external connection electrode is to be formed and the external connection electrode is formed on the pad.

With this method, the external connection electrode can be formed on the pad of the wiring film by performing electroless plating on the pad.

(E8) The method for manufacturing a chip component according to E1, where the element parts are capacitor parts and the chip component is a chip capacitor.

With this method, the chip component (chip capacitor) can be made to accommodate a plurality of types of capacitance values easily and rapidly by selecting and cutting one or a plurality of the fuses. In other words, chip capacitors of various capacitance values can be realized with a common design by combining a plurality of capacitor parts that differ in capacitance value.

(E9) The method for manufacturing a chip component according to E8, where the step of forming the capacitor parts includes a step of forming a capacitance film on a top surface of the substrate, a step of forming an electrode film in contact with the capacitance film, and a step of dividing the electrode film into a plurality of electrode film portions to form a plurality of capacitor parts corresponding to the plurality of electrode film portions.

With this method, the plurality of capacitor elements corresponding to the number of electrode film portions can be formed.

(E10) The method for manufacturing a chip component according to E9, where the electrode film includes a pad on which the external connection electrode is to be formed and the external connection electrode is formed on the pad. With this method, the external connection electrode can be formed on the pad of the electrode film by performing electroless plating on the pad.

(E11) The method for manufacturing a chip component according to E7 or E10, further including a step of forming, on the substrate, a protective film that covers the element and exposes the pad, and where the external connection electrode is formed on the pad exposed from the protective film.

With this method, the external connection electrode can be formed just on the pad exposed from the protective film by performing electroless plating on the pad.

(E12) The method for manufacturing a chip component according to E1, where the element parts are inductor parts and the chip component is a chip inductor. With this method, the combination pattern of the plurality of inductor parts in the chip component (chip inductor) can be set to any pattern by selecting and cutting one or a plurality of the fuses, thereby enabling chip inductors of various electrical characteristics to be realized with a common design.

(E13) The method for manufacturing a chip component according to E1, where the element parts are diode parts and the chip component is a chip diode.

With this method, the combination pattern of the plurality of diode parts in the chip component (chip diode) can be set to any pattern by selecting and cutting one or a plurality of the fuses, thereby enabling chip diodes of various electrical characteristics to be realized with a common design.

(2) Preferred Embodiments of the Invention Related to the Fifth Reference Example Preferred embodiments of the fifth reference example shall now be described in detail with reference to the attached drawings. The symbols indicated in FIG. 107 to FIG. 130 are effective only for these drawings and, even if used in other preferred embodiments, do not indicate the same components as the symbols in the other preferred embodiments.

Figure 107:
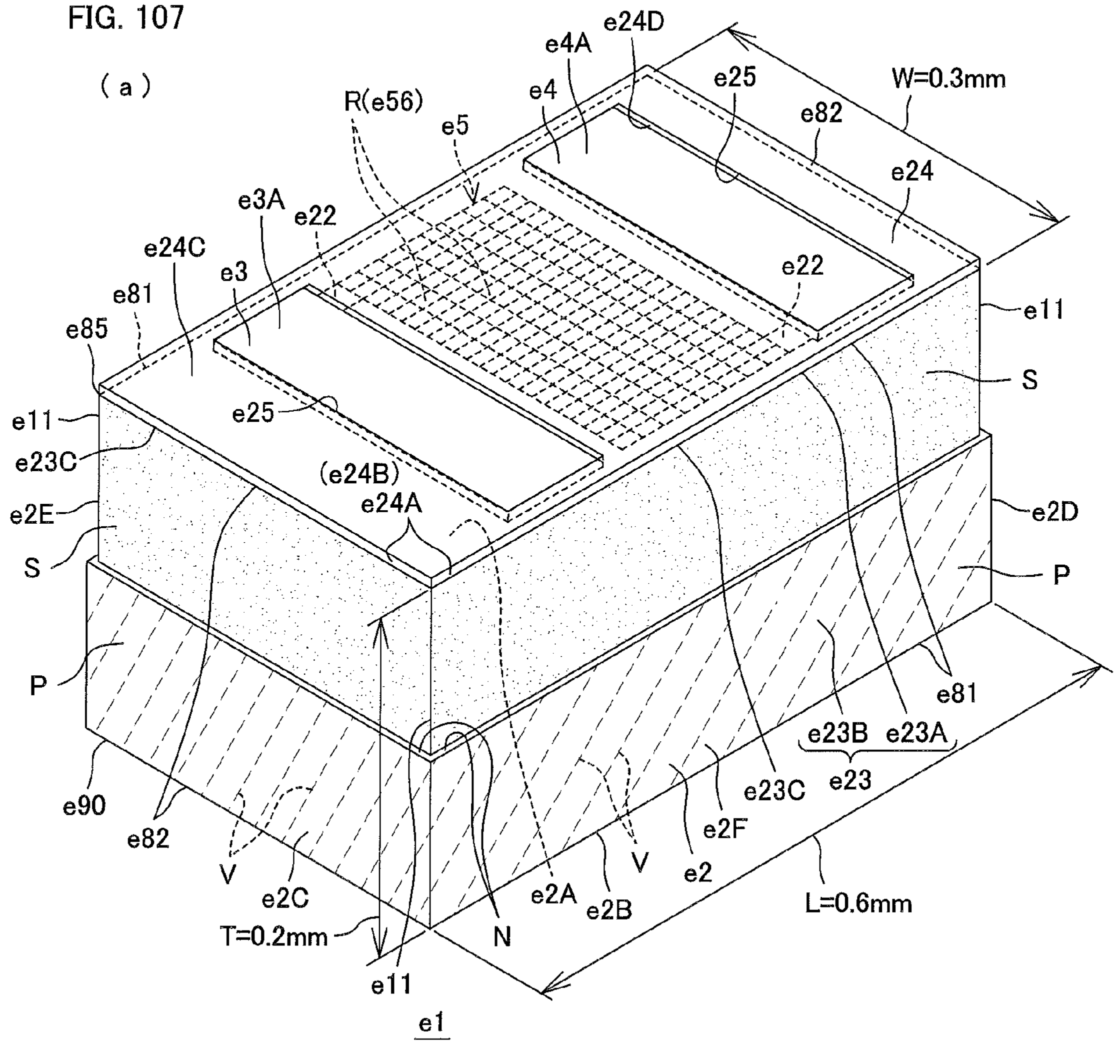
Figure 107:
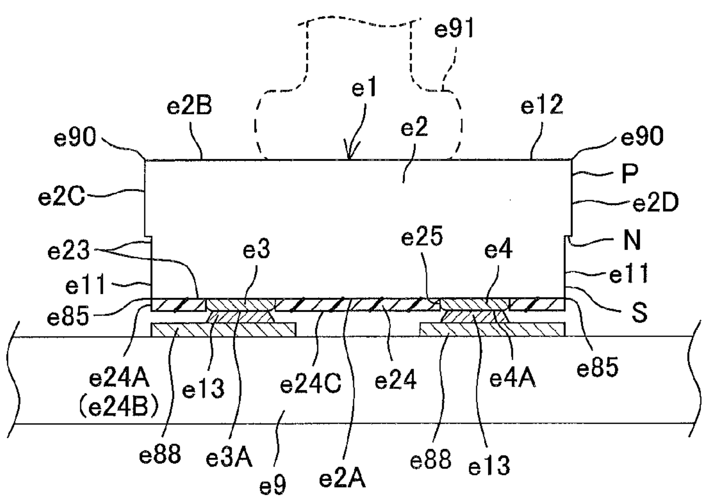

FIG. 107(*a*) is a schematic perspective view for describing the arrangement of a chip resistor according to a preferred embodiment of the fifth reference example, and FIG. 107 (*b*) is a schematic sectional view of a state where the chip resistor is mounted on a mounting substrate. The chip resistor e1 is a minute chip component and, as shown in FIG. 107(*a*), has a rectangular parallelepiped shape. The planar shape of the chip resistor e1 is a rectangular shape. In regard to the dimensions of the chip resistor e1, for example, the length L (length of a long side e81) is approximately 0.6 mm, the width W (length of a short side e82) is approximately 0.3 mm, and the thickness T is approximately 0.2 mm.

The chip resistor e1 is obtained by forming multiple chip resistors e1 in a lattice on a substrate, then forming a groove in the substrate, and thereafter performing rear surface grinding (splitting of the substrate at the groove) to perform separation into the individual chip resistors e1. The chip resistor e1 mainly includes a substrate e2 that constitutes the main body of the chip resistor e1, a first connection electrode e3 and a second connection electrode e4 that are to be a pair of external connection electrodes, and an element e5 connected to the exterior by the first connection electrode e3 and the second connection electrode e4.

The substrate e2 has a substantially rectangular parallelepiped chip shape. With the substrate e2, the upper surface in FIG. 107(*a*) is a top surface e2A. The top surface e2A is the surface (element forming surface) of the substrate e2 on which the element e5 is formed and has a substantially rectangular shape. The surface at the opposite side of the top surface e2A in the thickness direction of the substrate e2 is a rear surface e2B. The top surface e2A and the rear surface e2B are substantially the same in shape and are parallel to each other. However, the rear surface e2B is larger than the top surface e2A. Therefore in a plan view of looking from a direction orthogonal to the top surface e2A, the top surface e2A lies within the inner side of the rear surface e2B. A rectangular edge defined by the pair of long sides e81 and short sides e82 at the top surface e2A shall be referred to as an edge portion e85 and a rectangular edge defined by the pair of long sides e81 and short sides e82 at the rear surface e2B shall be referred to as an edge portion e90.

As surfaces besides the top surface e2A and the rear surface e2B, the substrate e2 has a plurality of side surfaces (a side surface e2C, a side surface e2D, a side surface e2E, and a side surface e2F). The plurality of side surfaces extend so as to intersect (specifically, so as to be orthogonal to) each of the top surface e2A and the rear surface e2B and join the top surface e2A and the rear surface e2B. The side surface e2C is constructed between the short sides e82 at one side in the long direction (the front left side in FIG. 107 (*a*)) of the top surface e2A and the rear surface e2B, and the side surface e2D is constructed between the short sides e82 at the other side in the long direction (the inner right side in FIG.

107 (*a*)) of the top surface e2A and the rear surface e2B. The side surfaces e2C and e2D are the respective end surfaces of the substrate e2 in the long direction. The side surface e2E is constructed between the long sides e81 at one side in the short direction (the inner left side in FIG. 107 (*a*)) of the top surface e2A and the rear surface e2B, and the side surface e2F is constructed between the long sides e81 at the other side in the short direction (the front right side in FIG. 107(*a*)) of the top surface e2A and the rear surface e2B. The side surfaces e2E and e2F are the respective end surfaces of the substrate e2 in the short direction. Each of the side surface e2C and the side surface e2D intersects (specifically, is orthogonal to) each of the side surface e2E and the side surface e2F.

By the above, mutually adjacent surfaces among the top surface e2A to side surface e2F form a substantially right angle. Each of the side surface e2C, side surface e2D, side surface e2E, and side surface e2F (hereinafter referred to as "each side surface") has a rough surface region S at the top surface e2A side and a striped pattern region P at the rear surface e2B side. In the rough surface region S, each side surface is a grainy, rough surface with an irregular pattern as indicated by the fine dots in FIG. 107(*a*). In the striped pattern region P, numerous stripes (saw marks) V, which constitute grinding marks made by a dicing saw to be described below, are left on each side surface in a regular pattern. The rough surface region S and the striped pattern region P are present on each side surface due to a process for manufacturing the chip resistor e1 and details shall be described later.

At each side surface, the rough surface region S occupies substantially half of the side surface at the top surface e2A side, and the striped pattern region P occupies substantially half of the side surface at the rear surface e2B side. At each side surface, the striped pattern region P protrudes further to the exterior of the substrate e2 (outer side of the substrate e2 in a plan view) than the rough surface region S, and a step N is thereby formed between the rough surface region S and the striped pattern region P. The step N connects a lower end edge of the rough surface region S with an upper end edge of the striped pattern region P and extends parallel to the top surface e2A and the rear surface e2B. The steps N of the respective side surfaces are connected and, as a whole, form a rectangular frame shape positioned between the edge portion e85 of the top surface e2A and the edge portion e90 of the rear surface e2B in a plan view.

The rear surface e2B is larger than the top surface e2A as mentioned above because such a step N is provided at each side surface. With the substrate e2, the respective entireties of the top surface e2A and the side surfaces e2C to e2F (both the rough surface region S and the striped pattern region P at each side surface) are covered by a passivation film e23. Therefore to be exact, the respective entireties of the top surface e2A and the side surfaces e2C to e2F in FIG. 107(*a*) are positioned at the inner sides (rear sides) of the passivation film e23 and are not exposed to the exterior. Here, in the passivation film e23, a portion covering the top surface e2A shall be referred to as a "top surface covering portion e23A" and a portion covering each of the side surfaces e2C to e2F shall be referred to as a "side surface covering portion e23B."

The chip resistor e1 further has a resin film e24. The resin film e24 is a protective film (protective resin film) that is formed on the passivation film e23 and covers at least the entirety of the top surface e2A. The passivation film e23 and the resin film e24 shall be described in detail later. The first connection electrode e3 and the second connection electrode e4 are formed on a region of the top surface e2A of the substrate e2 that is positioned further inward than the edge portion e85 and are partially exposed from the resin film e24 on the top surface e2A. In other words, the resin film e24 covers the top surface e2A (to be exact, the passivation film e23 on the top surface e2A) so as to expose the first connection electrode e3 and the second connection electrode e4. Each of the first connection electrode e3 and the second connection electrode e4 is arranged by laminating, for example, Ni (nickel), Pd (palladium), and Au (gold) in that order on the top surface e2A. The first connection electrode e3 and the second connection electrode e4 are disposed across an interval in the long direction of the top surface e2A and are long in the short direction of the top surface e2A. In FIG. 107(*a*), the first connection electrode e3 is provided at a position of the top surface e2A close to the side surface e2C and the second connection electrode e4 is provided at a position close to the side surface e2D.

The element e5 is an element network, is formed on the substrate e2 (top surface e2A), specifically in a region of the top surface e2A of the substrate e2 between the first connection electrode e3 and the second connection electrode e4, and is covered from above by the passivation film e23 (top surface covering portion e23A) and the resin film e24. The element e5 of the present preferred embodiment is a resistor e56. The resistor e56 is arranged by a resistor network in which a plurality of (unit) resistor bodies R, having an equal resistance value, are arrayed in a matrix on the top surface e2A. Each resistor body R is made of TiN (titanium nitride) or TiON (titanium oxide nitride) or TiSiON. The element e5 is electrically connected to wiring films e22, to be described below, and is electrically connected to the first connection electrode e3 and the second connection electrode e4 via the wiring films e22.

As shown in FIG. 107(*b*), the first connection electrode e3 and the second connection electrode e4 are made to face a mounting substrate e9 and connected electrically and mechanically by solders e13 to a pair of connection terminals e88 on the mounting substrate e9. The chip resistor e1 can thereby be mounted on (flip-chip connected to) the mounting substrate e9. The first connection electrode e3 and the second connection electrode e4 that function as the external connection electrodes are preferably formed of gold (Au) or has gold plating applied on the top surfaces thereof to improve solder wettability and improve reliability.

Figure 108:
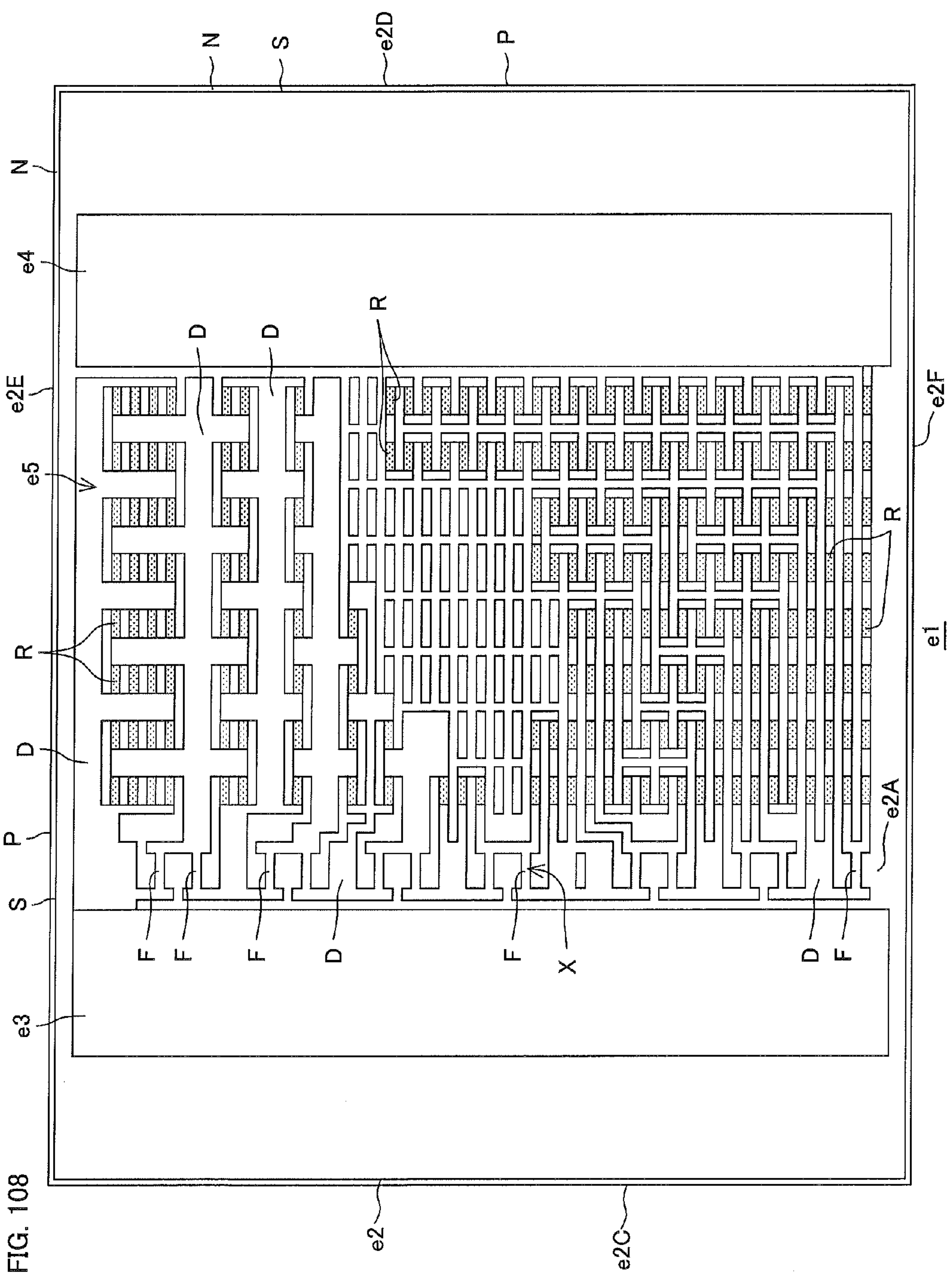

FIG. 108 is a plan view of a chip resistor showing the positional relationship of a first connection electrode, a second connection electrode, and an element and showing the arrangement (layout pattern) in a plan view of the element. With reference to FIG. 108, the element e5, which is a resistor network, has a total of 352 resistor bodies R arranged from 8 resistor bodies R arrayed along the row direction (length direction of the substrate e2) and 44 resistor bodies R arrayed along the column direction (width direction of the substrate e2). The resistor bodies R are the plurality of element parts that constitute the resistor network of the element e5.

The multiple resistor bodies R are electrically connected in groups of predetermined numbers of 1 to 64 each to form a plurality of types of resistor circuits. The plurality of types of resistor circuits thus formed are connected in predetermined modes by conductor films D (wiring films formed of a conductor). Further, on the top surface e2A of the substrate e2, a plurality of fuses (fuse films) F are provided that are capable of being cut (fused) to electrically incorporate resistor circuits into the element e5 or electrically separate resistor circuits from the element e5. The plurality of fuses F and the conductor films D are arrayed along the inner side of the second connection electrode e3 so that the positioning regions thereof are rectilinear. More specifically, the plurality of fuses F and the conductor films D are disposed adjacently and the direction of alignment thereof is rectilinear. The plurality of fuses F connect each of the plurality of types of resistor circuits (each of the pluralities of resistor bodies R of the respective resistor circuits) to the second connection electrode e3 in a manner enabling cutting (enabling disconnection).

Figure 109A:
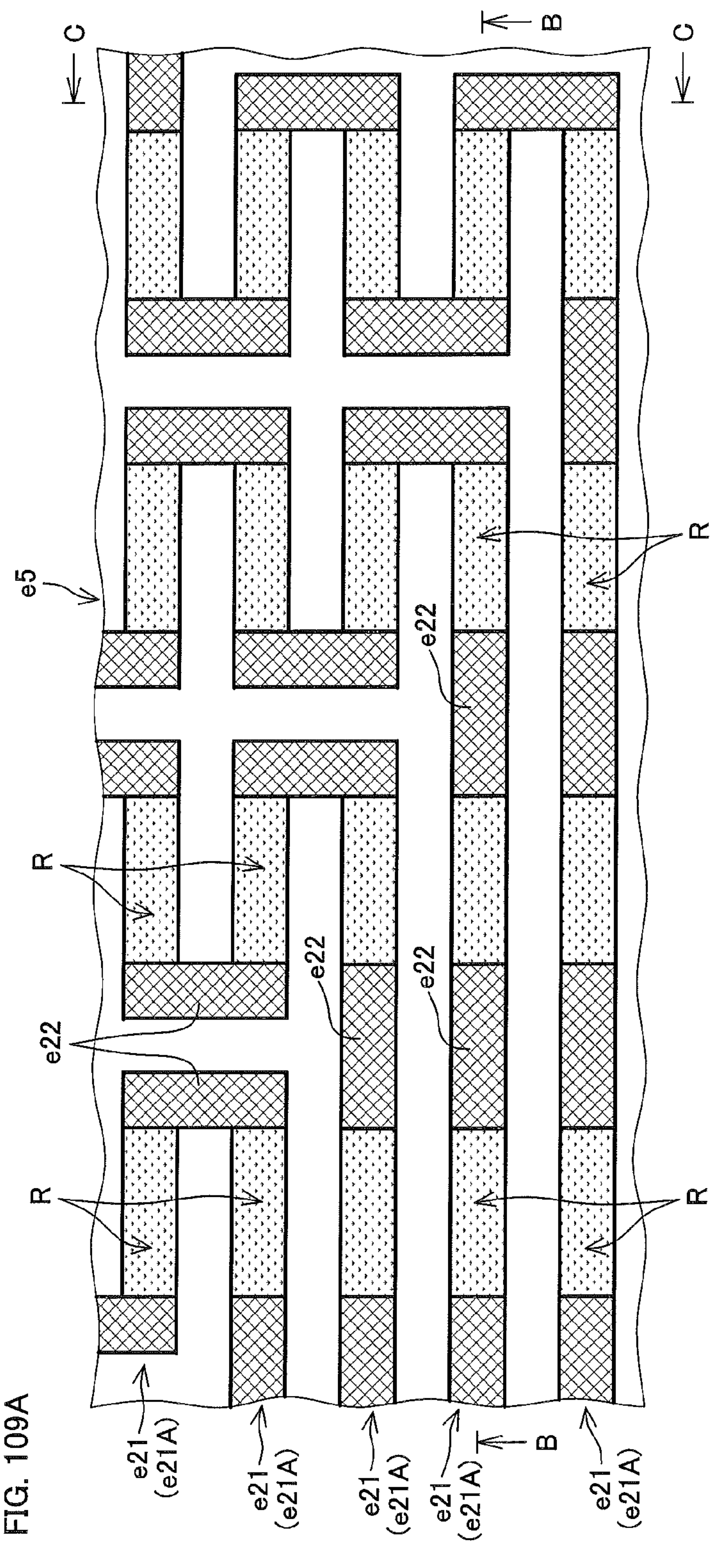
Figure 109B:
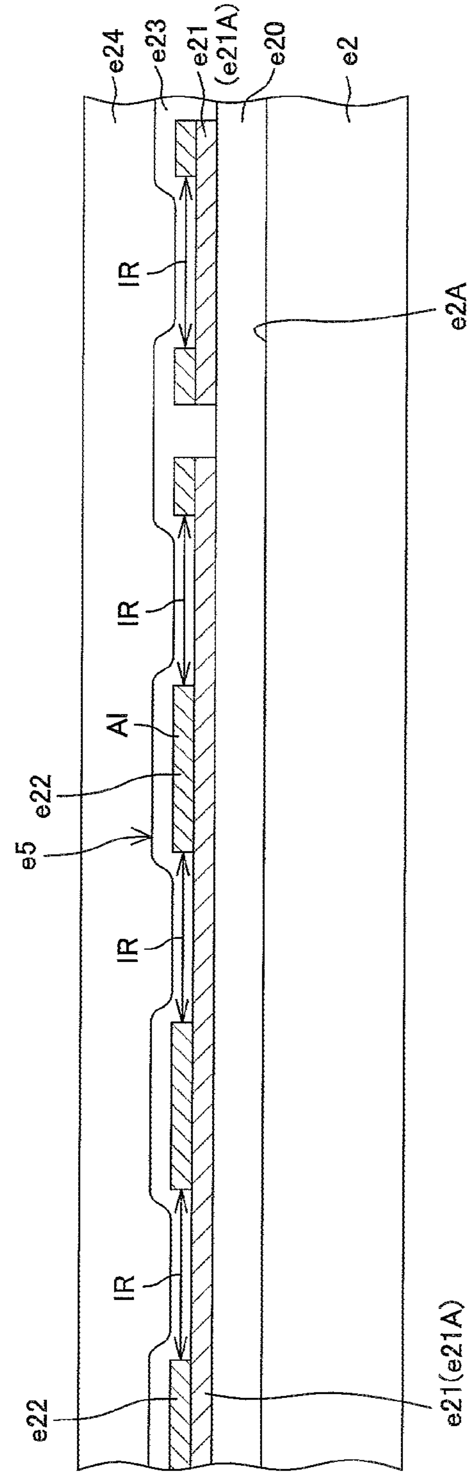
Figure 109C:
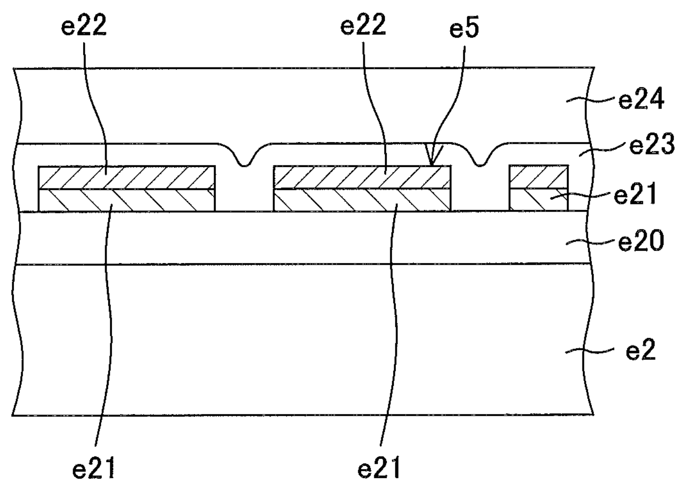

FIG. 109A is a partially enlarged plan view of the element shown in FIG. 108. FIG. 109B is a vertical sectional view in the length direction taken along B-B of FIG. 109A for describing the arrangement of resistor bodies in the element. FIG. 109C is a vertical sectional view in the width direction taken along C-C of FIG. 109A for describing the arrangement of the resistor bodies in the element. The arrangement of the resistor bodies R shall now be described with reference to FIG. 109A, FIG. 109B, and FIG. 109C.

Besides the wiring films e22, the passivation film e23, and the resin film e24, the chip resistor e1 further includes an insulating layer e20 and a resistor body film e21 (see FIG. 109B and FIG. 109C). The insulating layer e20, the resistor body film e21, the wiring films e22, the passivation film e23, and the resin film e24 are formed on the substrate e2 (top surface e2A). The insulating layer e20 is made of $SiO_2$ (silicon oxide). The insulating layer e20 covers the entirety of the top surface e2A of the substrate e2. The thickness of the insulating layer e20 is approximately 10000 Å.

The resistor body film e21 is formed on the insulating layer e20. The resistor body film e21 is formed of TiN, TiON, or TiSiON. The thickness of the resistor body film e21 is approximately 2000 Å. The resistor body film e21 is arranged as a plurality of resistor body films (hereinafter referred to as "resistor body film lines e21A") extending parallel and rectilinearly between the first connection electrode e3 and the second connection electrode e4, and there are cases where a resistor body film line e21A is cut at predetermined positions in the line direction (see FIG. 109A).

The wiring films e22 are laminated on the resistor body film lines e21A. The wiring films e22 are made of Al (aluminum) or an alloy (AlCu alloy) of aluminum and Cu (copper). The thickness of each wiring film e22 is approximately 8000 Å. The wiring films e22 are laminated on the resistor body film lines e21A at fixed intervals R in the line direction and are in contact with the resistor body film lines e21A.

Figure 110:
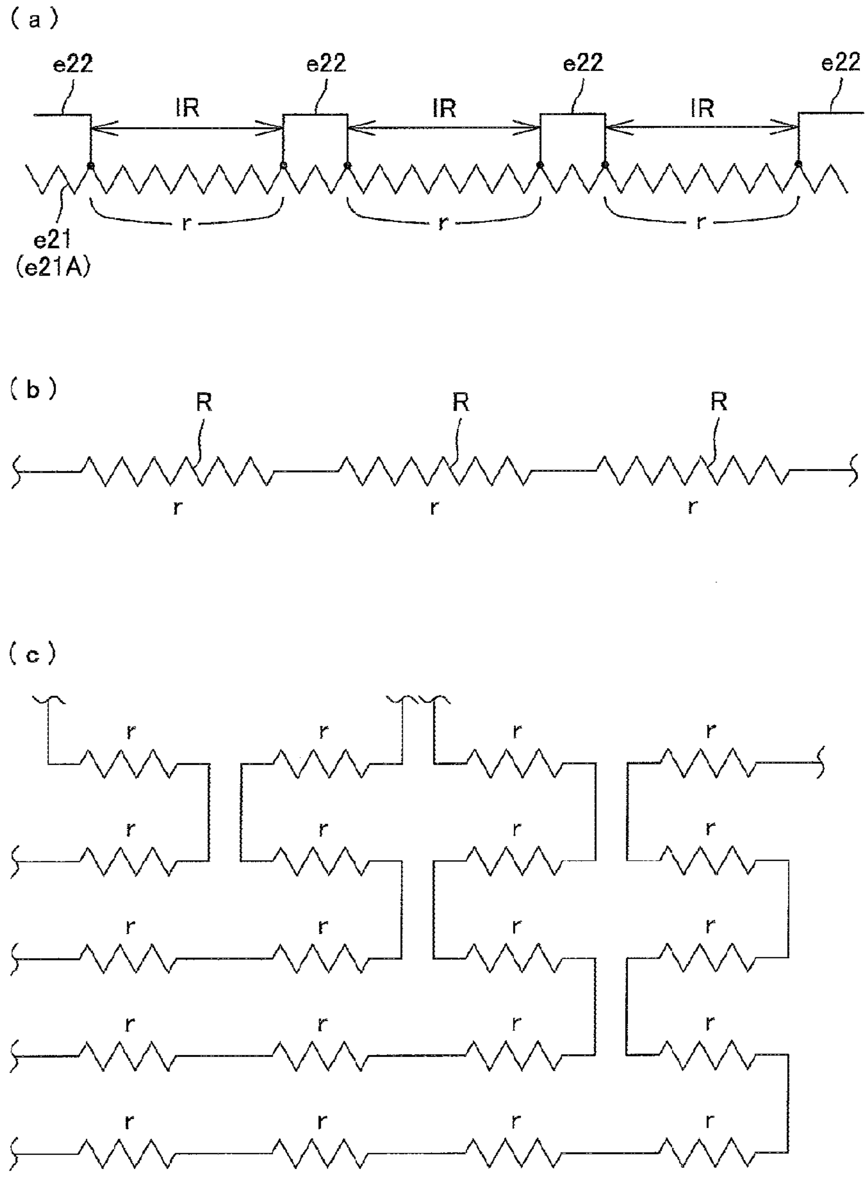

The electrical features of the resistor body film lines e21A and the wiring films e22 of the present arrangement are indicated by circuit symbols in FIG. 110. That is, as shown in FIG. 110(*a*), each of the resistor body film line e21A portions in regions of the predetermined interval IR forms a single resistor body R with a fixed resistance value r. In each region at which the wiring film e22 is laminated, the wiring film e22 electrically connects mutually adjacent resistor bodies R so that the resistor body film line e21A is short-circuited by the wiring film e22. A resistor circuit, made up of serial connections of resistor bodies R of resistance r, is thus formed as shown in FIG. 110(*b*).

Also, adjacent resistor body film lines e21A are connected to each other by the resistor body film e21 and wiring films e22, and the resistor network of the element e5 shown in FIG. 109A thus constitutes the resistor circuits (made up of the unit resistors of the resistor bodies R) shown in FIG. 110(*c*). The resistor body film e21 and the wiring films e22 thus constitute the resistor bodies R and the resistor circuits (that is, the element 5). Each resistor body R includes a resistor body film line e21A (resistor body film e21) and a plurality of wiring films e22 laminated at the fixed interval in the line direction on the resistor body film line e21A, and the resistor body film line e21A of the fixed interval IR portion on which the wiring film e22 is not laminated constitutes a single resistor body R. The resistor body film lines e21A at the portions constituting the resistor bodies R are all equal in shape and size. The multiple resistor bodies R arrayed in a matrix on the substrate e2 thus have an equal resistance value.

Figure 111:
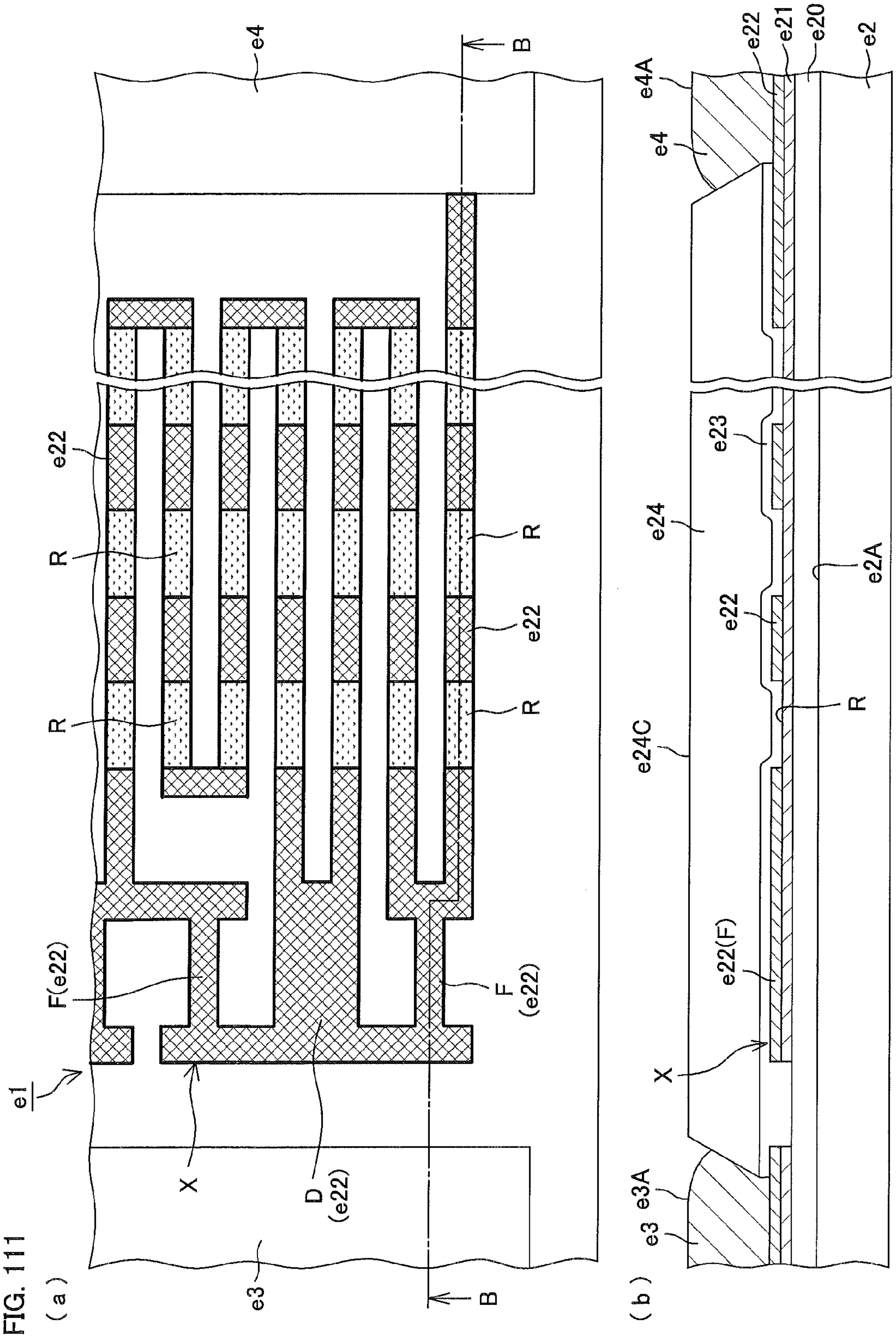

Also, the wiring films e22 laminated on the resistor body film lines e21A form the resistor bodies R and also serve the role of conductor films D that connect a plurality of resistor bodies R to arrange a resistor circuit (see FIG. 108). FIG. 111(*a*) is a partially enlarged plan view of a region including the fuses drawn by enlarging a portion of the plan view of the chip resistor shown in FIG. 108, and FIG. 111(*b*) is a structural sectional view taken along B-B in FIG. 111(*a*).

As shown in FIGS. 111(*a*) and 111(*b*), the fuses F and the conductor films D are also formed by the wiring films e22, which are laminated on the resistor body film e21 that forms the resistor bodies R. That is, the fuses F and the conductor films D are formed of Al or AlCu alloy, which is the same metal material as that of the wiring films e22, at the same layer as the wiring films e22, which are laminated on the resistor body film lines e21A that form the resistor bodies R. As mentioned above, the wiring films e22 are also used as the conductor films D that electrically connect a plurality of resistor bodies R to form a resistor circuit.

That is, at the same layer laminated on the resistor body film e21, the wiring films for forming the resistor bodies R, the fuses F, the conductor films D, and the wiring films for connecting the element e5 to the first connection electrode e3 and the second connection electrode e4 are formed as the wiring films e22 using the same metal material (Al or AlCu alloy). The fuses F are differed (distinguished) from the wiring films e22 because the fuses F are formed narrowly to enable easy cutting and because the fuses F are disposed so that other circuit components are not present in the surroundings thereof.

Here, a region of the wiring films e22 in which the fuses F are disposed shall be referred to as a trimming region X (see FIG. 108 and FIG. 111(*a*)). The trimming region X is a rectilinear region along the inner side of the second connection electrode e4 and not only the fuses F but also the conductor films D are disposed in the trimming region X. Also, resistor body film e21 is formed below the wiring films e22 in the trimming region X (see FIG. 111(*b*)). The fuses F are wirings that are greater in interwiring distance (are more separated from the surroundings) than portions of the wiring films e22 besides the trimming region X.

The fuse F may refer not only to a portion of the wiring films e22 but may also refer to an assembly (fuse element) of a portion of a resistor body R (resistor body film e21) and a portion of the wiring film e22 on the resistor body film e21. Also, although only a case where the same layer is used for the fuses F as that used for the conductor films D has been described, the conductor films D may have another conductor film laminated further thereon to decrease the resistance value of the conductor films D as a whole. Even in this case, the fusing property of the fuses F is not degraded as long as a conductor film is not laminated on the fuses F.

FIG. 112 is an electric circuit diagram of the element according to the preferred embodiment of the fifth reference example. Referring to FIG. 112, the element e5 is arranged by serially connecting a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16, and a resistor circuit R/32 in that order from the first connection electrode e3. Each of the reference resistor circuit R8 and resistor circuits R64 to R2 is arranged by serially connecting the same number of resistor bodies R as the number at the end of its symbol ("64" in the case of R64). The resistor circuit R1 is arranged froma single resistor body R. Each of the resistor circuits R/2 to R/32 is arranged by connecting the same number of resistor bodies R as the number at the end of its symbol ("32" in the case of R/32) in parallel. The meaning of the number at the end of the symbol of the resistor circuit is the same in FIG. 113 and FIG. 114 to be described below.

One fuse F is connected in parallel to each of the resistor circuit R64 to resistor circuit R32, besides the reference resistor circuit R8. The fuses F are mutually connected in series directly or via the conductor films D (see FIG. 111(*a*)). In a state where none of the fuses F is fused as shown in FIG. 112, the element e5 constitutes a resistor circuit of the reference resistor circuit R8 formed by the serial connection of the 8 resistor bodies R provided between the first connection electrode e3 and the second connection electrode e4. For example, if the resistance value r of a single resistor body R is r=8Ω, the chip resistor e1 is arranged with the first connection electrode e3 and the second connection electrode e4 being connected by the resistor circuit (the reference resistor circuit R8) of 8r=64Ω.

Also in the state where none of the fuses F is fused, the plurality of types of resistor circuits besides the reference resistor circuit R8 are put in short-circuited states. That is, although 13 resistor circuits R64 to R/32 of 12 types are connected in series to the reference resistor circuit R8, each resistor circuit is short-circuited by the fuse F that is connected in parallel and thus electrically, the respective resistor circuits are not incorporated in the element e5.

With the chip resistor e1 according to the present preferred embodiment, a fuse F is selectively fused, for example, by laser light in accordance with the required resistance value. The resistor circuit with which the fuse F connected in parallel is fused is thereby incorporated into the element e5. The overall resistance value of the element e5 can thus be set to the resistance value resulting from serially connecting and incorporating the resistor circuits corresponding to the fused fuses F.

In particular, the plurality of types of resistor circuits include the plurality of types of serial resistor circuits, with which the resistor bodies R having the equal resistance value are connected in series with the number of resistor bodies R being increased in geometric progression with a geometric ratio of 2 as 1, 2, 4, 8, 16, 32, . . . , and the plurality of types of parallel resistor circuits, with which the resistor bodies R having the equal resistance value are connected in parallel with the number of resistor bodies R being increased in geometric progression with a geometric ratio of 2 as 2, 4, 8, 16, . . . . Therefore by selectively fusing the fuses F (including the fuse elements), the resistance value of the element e5 (resistor e56) as a whole can be adjusted finely and digitally to an arbitrary resistance value to enable a resistance of a desired value to be formed in the chip resistor e1.

FIG. 113 is an electric circuit diagram of an element according to another preferred embodiment of the fifth reference example. Instead of arranging the element e5 by serially connecting the reference resistor circuit R8 and the resistor circuit R64 to the resistor circuit R/32 as shown in FIG. 112, the element e5 may be arranged as shown in FIG. 113. Specifically, the element e5 may be arranged, between the first connection electrode e3 and the second connection electrode e4, as a serial connection circuit of the reference resistor circuit R/16 and the parallel connection circuit of the 12 types of resistor circuits R/16, R/8, R/4, R/2, R1, R2, R4, R8, R16, R32, R64, and R128.

In this case, a fuse F is serially connected to each of the 12 types of resistor circuits besides the reference resistor circuit R/16. In a state where none of the fuses F is fused, the respective resistor circuits are electrically incorporated in the element e5. By selectively fusing a fuse F, for example, by laser light in accordance with the required resistance value, the resistor circuit corresponding to the fused fuse F (the resistor circuit connected in series to the fuse F) is electrically separated from the element e5 and the resistance value of the chip resistor e1 as a whole can thereby be adjusted.

FIG. 114 is an electric circuit diagram of an element according to yet another preferred embodiment of the fifth reference example. A feature of the element e5 shown in FIG. 114 is that it has the circuit arrangement where a serial connection of a plurality of types of resistor circuits and a parallel connection of a plurality of types of resistor circuits are connected in series. As in a previous preferred embodiment, with the plurality of types of resistor circuits connected in series, a fuse F is connected in parallel to each resistor circuit and all of the plurality of types of resistor circuits that are connected in series are put in short-circuited states by the fuses F. Therefore, when a fuse F is fused, the resistor circuit that was short-circuited by the fused fuse F is electrically incorporated into the element e5.

On the other hand, a fuse F is connected in series to each of the plurality of types of resistor circuits that are connected in parallel. Therefore by fusing a fuse F, the resistor circuit connected in series to the fused fuse F can be electrically disconnected from the parallel connection of resistor circuits. With this arrangement, for example, by forming a low resistance of not more than 1 kΩ at the parallel connection side and forming a resistor circuit of not less than 1 kΩ at the serial connection side, resistor circuits of a wide range, from a low resistance of several Ω to a high resistance of several MΩ, can be formed using the resistor networks arranged with the same basic design. That is, with the chip resistor e1, a plurality of types of resistance values can be accommodated easily and rapidly by selecting and cutting one or a plurality of the fuses F. In other words, chip resistors e1 of various resistance values can be realized with a common design by combining a plurality of resistor bodies R that differ in resistance value.

With the chip resistor e1, the connection states of the plurality of resistor bodies R (resistor circuits) in the trimming region X can be changed as described above. FIG. 115 is a schematic sectional view of the chip resistor. The chip resistor e1 shall now be described in further detail with reference to FIG. 115. For the sake of description, the element e5 is illustrated in a simplified form and hatching is applied to respective elements besides the substrate e2 in FIG. 115.

Here, the passivation film e23 and the resin film e24 shall be described. The passivation film e23 is made, for example, from SiN (silicon nitride) and the thickness thereof is 1000 Å to 5000 Å (approximately 3000 Å here). As mentioned above, the passivation film e23 includes the top surface covering portion e23A provided across the entirety of the top surface e2A and the side surface covering portion e23B provided across the respective entireties of the side surfaces e2C to e2F. The top surface covering portion e23A covers the resistor body film e21 and the respective wiring films e22 on the resistor body film e21 (that is, the element e5) from the top surface (upper side in FIG. 115) and covers the upper surfaces of the respective resistor bodies R in the element e5. The top surface covering portion e23A also covers the wiring films e22 in the trimming region X as well (see FIG. 111(*b*)). Also, the top surface covering portion e23A contacts the element e5 (the wiring films e22 and the resistor body film e21) and also contacts the insulating layer e20 in regions besides the resistor body film e21. The top surface covering portion e23A thus functions as a protective film that covers the entirety of the top surface e2A and protects the element e5 and the insulating layer e20. Also at the top surface e2A, the top surface covering portion e23A prevents short-circuiting across the resistor bodies R (short-circuiting across adjacent resistor body film lines e21A) at portions besides the wiring films e22.

On the other hand, the side surface covering portion e23B provided on each of the side surfaces e2C to e2F functions as a protective layer that protects each of the side surfaces e2C to e2F. At each of the side surfaces e2C to e2F, the side surface covering portion e23B covers the entireties of the rough surface region S and the striped pattern region P and also completely covers the step N between the rough surface region S and the striped pattern region P. Also, the boundary of the respective side surfaces e2C to e2F and the top surface e2A is the edge portion e85, and the passivation film e23 also covers this boundary (the edge portion e85). In the passivation film e23, the portion covering the edge portion e85 (portion overlapping the edge portion e85) shall be referred to as the "end portion e23C."

The resin film e24, together with the passivation film e23, protects the top surface e2A of the chip resistor e1 and is made of a resin, such as polyimide, etc. The resin film e24 is formed on the top surface covering portion e23A (including the end portion e23C) of the passivation film e23 so as to cover the entireties of regions of the top surface e2A besides the first connection electrode e3 and the second connection electrode e4 in a plan view. The resin film e24 covers the entirety of the top surface of the top surface covering portion e23A (including the element e5 and the fuses F covered by the top surface covering portion e23A). On the other hand, the resin film e24 does not cover the side surfaces e2C to e2F. An edge e24A at the outer periphery of the resin film e24 is thus matched in a plan view with the side surface covering portion e23B and a side end surface e24B of the resin film e24 at the edge e24A is flush with the side surface covering portion e23B (to be exact, the side surface covering portion e23B in the rough surface region S of each side surface) and extends in the thickness direction of the substrate e2. A top surface e24C of the resin film e24 extends flatly so as to be parallel to the top surface e2A of the substrate e2. When a stress is applied to the top surface e2A side of the substrate e2 in the chip resistor e1, the top surface e24C of the resin film e24 (the top surface e24C in the region between the first connection electrode e3 and the second connection electrode e4) functions as a stress dispersing surface and disperses the stress.

Also in the resin film e24, openings e25 are formed, one at each of two positions that are separated in a plan view. Each opening e25 is a penetrating hole penetrating continuously through each of the resin film e24 and the passivation film e23 (top surface covering portion e23A) in the thickness direction. The openings e25 are thus formed not only in the resin film e24 but also in the passivation film e23. Portions of wiring films e22 are exposed through the respective openings e25. The portions of the wiring films e22 exposed through the respective openings e25 are pad regions e22A (pads) for external connection. In the top surface covering portion e23A, each opening e25 extends in the thickness direction of the top surface covering portion e23A (same as the thickness direction of the substrate e2) and gradually widens in the long direction of the substrate e2 (the right/left direction in FIG. 115) as the top surface e24C of the resin film e24 is approached from the top surface covering portion e23A side. Defining surfaces e24D that define the opening e25 in the resin film e24 are thus inclining surfaces that intersect the thickness direction of the substrate e2. A pair of defining surfaces e24D defining each opening e25 in the long direction in the resin film e24 are present at portions of the resin film e24 bordering the opening e25, and the interval between the defining surfaces e24D widens gradually as the top surface e24C of the resin film e24 is approached from the top surface covering portion e23A side. Also, a pair of defining surfaces e24D defining each opening e25 in the short direction of the substrate e2 are present at portions of the resin film 24 bordering the opening e25 (not shown in FIG. 115), and the interval between these defining surfaces e24D may also widen gradually as the top surface e24C of the resin film e24 is approached from the top surface covering portion e23A side.

Of the two openings e25, one opening e25 is completely filled by the first connection electrode e3 and the other opening e25 is completely filled by the second connection electrode e4. Each of the first connection electrode e3 and the second connection electrode e4 widens toward the top surface e24C of the resin film e24 in accordance with the opening e25 that widens toward the top surface e24C of the resin film e24. A vertical section of each of the first connection electrode e3 and the second connection electrode e4 (the section surface resulting from sectioning in a plane extending in the long direction and the thickness direction of the substrate e2) thus has a trapezoidal shape having an upper base at the top surface e2A side of the substrate e2 and a lower base at the top surface e24C side of the resin film e24. Also, the respective lower bases are the respective top surfaces e3A and e4A of the first connection electrode e3 and the second connection electrode e4, and at each of the top surfaces e3A and e4A, an end portion at the opening e25 side is curved toward the top surface e2A side of the substrate e2. If the opening e25 is not widened toward the top surface e24C of the resin film e24 (if the defining surfaces e24D defining the opening e25 extend in the thickness direction of the substrate e2), each of the top surfaces e3A and e4A becomes a flat surface extending along the top surface e2A of the substrate e2 in the entire region including the end portion at the opening e25 side.

Also, as mentioned above, each of the first connection electrode e3 and the second connection electrode e4 is arranged by laminating Ni, Pd, and Au in that order on the top surface e2A and thus has an Ni layer e33, a Pd layer e34, and an Au layer e35 in that order from the top surface e2A side. Therefore in each of the first connection electrode e3 and the second connection electrode e4, the Pd layer e34 is interposed between the Ni layer e33 and the Au layer e35. In each of the first connection electrode e3 and the second connection electrode e4, the Ni layer e33 takes up most of each connection electrode and the Pd layer e34 and the Au layer e35 are formed significantly thinner than the Ni layer e33. The Ni layer e33 serves a role of relaying between the Al of the wiring film e22 in the pad region e22A in each opening e25 and the solder e13 when the chip resistor e1 is mounted on the mounting substrate e9 (see FIG. 107(*b*)).

With the first connection electrode e3 and the second connection electrode e4, a top surface of the Ni layer e33 is covered by the Au layer e35 via the Pd layer e34 and the Ni layer e33 can thus be prevented from becoming oxidized. Also, even if a penetrating hole (pinhole) forms in the Au layer e35 due to thinning of the Au layer e35, the Pd layer e34 interposed between the Ni layer e33 and the Au layer e35 closes the penetrating hole and the Ni layer e33 can thus be prevented from being exposed to the exterior through the penetrating hole and becoming oxidized.

With each of the first connection electrode e3 and the second connection electrode e4, the Au layer e35 is exposed at the topmost surface as the top surface e3A or e4A and faces the exterior through the opening e25 at the top surface e24A of the resin film e24. The first connection electrode e3 is electrically connected, via one opening e25, to the wiring film e22 in the pad region e22A in the opening e25. The second connection electrode e4 is electrically connected, via the other opening e25, to the wiring film e22 in the pad region e22A in the opening e25. With each of the first connection electrode e3 and the second connection electrode e4, the Ni layer e33 is connected to the pad region e22A. Each of the first connection electrode e3 and the second connection electrode e4 is thereby electrically connected to the element e5. Here, the wiring films e22 form wirings that are respectively connected to groups of resistor bodies R (resistor e56) and the first connection electrode e3 and the second connection electrode e4.

The resin film e24 and the passivation film e23, in which the openings e25 are formed, thus cover the top surface e2A in a state where the first connection electrode e3 and the second connection electrode e4 are exposed through the openings e25. Electrical connection between the chip resistor e1 and the mounting substrate e9 can thus be achieved via the first connection electrode e3 and the second connection electrode e4 exposed in the openings e25 in the top surface e24C of the resin film e24 (see FIG. 107(*b*)).

Here, the thickness of the resin film e24, that is, a height H from the top surface e2A of the substrate e2 to the top surface e24*c* of the resin film e24 is not less than a height J of each of the first connection electrode e3 and the second connection electrode e4 (from the top surface e2A). As a first preferred embodiment, in FIG. 115, the height H and the height J are equal so that the top surface e24C of the resin film e24 is flush with each of the respective top surfaces e3A and e4A of the first connection electrode e3 and the second connection electrode e4.

FIG. 116A to FIG. 116H are illustrative sectional views of a method for manufacturing the chip resistor shown in FIG. 115. First, as shown in FIG. 116A, a substrate e30, which is to be the base of the substrate e2, is prepared. Here, a top surface e30A of the substrate e30 is the top surface e2A of the substrate e2 and a rear surface e30B of the substrate e30 is the rear surface e2B of the substrate e2.

The top surface e30A of the substrate e30 is then thermally oxidized to form the insulating layer e20, made of $SiO_2$, etc., on the top surface e30A, and the element e5 (the resistor bodies R and the wiring films e22 connected to the resistor bodies R) is formed on the insulating layer e20. Specifically, first, the resistor body film e21 of TiN, TiON, or TiSiON is formed by sputtering on the entire surface of the insulating layer e20 and further, the wiring film e22 of aluminum (Al) is laminated on the resistor body film e21 so as to contact the resistor body film e21. Thereafter, a photolithography process is used and, for example, RIE (reactive ion etching) or other form of dry etching is performed to selectively remove and pattern the resistor body film e21 and the wiring film e22 to obtain the arrangement where, as shown in FIG. 109A, the resistor body film lines e21A of fixed width, at which the resistor body film e21 is laminated, are arrayed at fixed intervals in the column direction in a plan view. In this process, regions in which the resistor body film lines e21A and the wiring film e22 are cut at portions are also formed and the fuses F and the conductor films D are formed in the trimming region X (see FIG. 108). The wiring film e22 laminated on the resistor body film lines e21A is then removed selectively and patterned, for example, by wet etching. The element e5 of the arrangement where the wiring films e22 are laminated at the fixed intervals R on the resistor body film lines e21A (in other words, the plurality of resistor bodies R) is consequently obtained. The plurality of resistor bodies R and the fuses F can thus be formed simply in a batch by just laminating the wiring film e22 on the resistor body film e21 and then patterning the resistor body film e21 and the wiring film e22. The resistance value of the entirety of the element 5 may be measured to check whether or not the resistor body film e21 and the wiring film e22 have been formed to the targeted dimensions.

With reference to FIG. 116A, the elements e5 are formed at multiple locations on the top surface e30A of the substrate e30 in accordance with the number of chip resistors e1 that are to be formed on the single substrate e30. If a single region of the substrate e30 in which an (a single) element e5 (the resistor e56) is formed is referred to as a chip component region Y, a plurality of chip component regions Y (in other words, elements e5), each having the resistor e56, are formed (set) on the top surface e30A of the substrate e30. A single chip component region Y coincides with a single finished chip resistor e1 (see FIG. 115) in a plan view. On the top surface e30A of the substrate e30, a region between adjacent chip component regions Y shall be referred to as a "boundary region Z." The boundary region Z has a band shape and extends in a lattice in a plan view. A single chip component region Y is disposed in a single lattice cell defined by the boundary region Z. The width of the boundary region Z is 1 μm to 60 μm (for example, 20 μm) and is extremely narrow, and therefore a large number of chip component regions Y can be secured on the substrate e30 to consequently enable mass production of the chip resistors e1.

Thereafter as shown in FIG. 116A, an insulating film e45 made of SiN is formed on the entirety of the top surface e30A of the substrate e30 by a CVD (chemical vapor deposition) method. The insulating film e45 contacts and covers all of the insulating layer e20 and the elements e5 (resistor body film e21 and wiring films e22) on the insulating layer e20. The insulating film e45 thus also covers the wiring films e22 in the trimming regions X (see FIG. 108). Also, the insulating film e45 is formed across the entirety of the top surface e30A of the substrate e30 and is thus formed to extend to regions besides the trimming regions X on the top surface e30A. The insulating film e45 is thus a protective film that protects the entirety of the top surface e30A (including the elements e5 on the top surface e30A).

Thereafter as shown in FIG. 116B, a resist pattern e41 is formed across the entirety of the top surface e30A of the substrate e30 so as to cover the entire insulating film e45. An opening e42 is formed in the resist pattern e41. FIG. 117 is a schematic plan view of a portion of the resist pattern used for forming a first groove in the step of FIG. 116B.

With reference to FIG. 117, the opening e42 of the resist pattern e41 coincides with (corresponds to) a region (hatched portion in FIG. 117, in other words, the boundary region Z) between outlines of mutually adjacent chip resistors e1 in a plan view in a case where multiple chip resistors e1 (in other words, the chip component regions Y) are disposed in an array (that is also a lattice). The overall shape of the opening e42 is thus a lattice having a plurality of mutually orthogonal rectilinear portions e42A and e42B.

In the resist pattern e41, the mutually orthogonal rectilinear portions e42A and e42B in the opening e42 are connected while being maintained in mutually orthogonal states (without curving). Intersection portions e43 of the rectilinear portions e42A and e42B are thus pointed and form angles of substantially 90° in a plan view. Referring to FIG. 116B, the insulating film e45, the insulating layer e20, and the substrate e30 are respectively removed selectively by plasma etching using the resist pattern e41 as a mask. The material of the substrate e30 is thereby etched (removed) in the boundary region Z between mutually adjacent elements e5 (chip component regions Y). Consequently, the first groove e44, penetrating through the insulating film e45 and the insulating layer e20 and having a predetermined depth reaching a middle portion of the thickness of the substrate e30 from the top surface e30A of the substrate e30, is formed at positions (boundary region Z) coinciding with the opening e42 of the resist pattern e41 in a plan view. The first groove e44 is defined by a pair of mutually facing side surfaces e44A and a bottom surface e44B joining the lower ends (ends at the rear surface e30B side of the substrate e30) of the pair of side surfaces e44A. The depth of the first groove e44 on the basis of the top surface e30A of the substrate e30 is approximately half the thickness T of the finished chip resistor e1 (see FIG. 107(*a*)) and the width (interval between the mutually facing side surfaces e44A) M of the first groove e44 is approximately 20 μm and is fixed across the entire depth direction. By using plasma etching in particular among the types of etching, the first groove e44 can be formed with high precision.

The overall shape of the first groove e44 in the substrate e30 is a lattice that coincides with the opening e42 (see FIG. 117) of the resist pattern e41 in a plan view. At the top surface e30A of the substrate e30, rectangular frame portions (boundary region Z) of the first groove e44 surround the peripheries of the chip component regions Y in which the respective elements e5 are formed. In the substrate e30, each portion in which the element e5 is formed is a semi-finished product e50 of the chip resistor e1. At the top surface e30A of the substrate e30, one semi-finished product e50 is positioned in each chip component region Y surrounded by the first groove e44, and these semi-finished products e50 are arrayed and disposed in an array.

After the first groove e44 has been formed as shown in FIG. 116B, the resist pattern e41 is removed, and a dicing machine (not shown) having a dicing saw e47 is driven as shown in FIG. 116C. The dicing saw e47 is a disk-shaped grindstone and has a cutting tooth portion formed on its peripheral end surface. The width Q (thickness) of the dicing saw e47 is smaller than the width M of the first groove e44. Here, a dicing line U is set at a central position (position of equal distance from the mutually facing pair of side surfaces e44A) of the first groove e44. With its central position e47A in the thickness direction being coincident with the dicing line U in a plan view, the dicing saw e47 moves along the dicing line U inside the first groove e44 and grinds the substrate e30 from the bottom surface e44B of the first groove e44 in this process. When the movement of the dicing saw e47 is completed, a second groove e48 of a predetermined depth dug below the bottom surface e44B of the first groove e44 is formed in the substrate e30.

The second groove e48 continues from the bottom surface e44B of the first groove e44 and is recessed by the predetermined depth toward the rear surface e30B of the substrate e30. The second groove e48 is defined by a pair of mutually facing side surfaces e48A and a bottom surface e48B joining the lower ends (ends at the rear surface e30B side of the substrate e30) of the pair of side surfaces e48A. The depth of the second groove e48 on the basis of the bottom surface e44B of the first groove e44 is approximately half the thickness T of the finished chip resistor e1 and the width (interval between the mutually facing side surfaces e48A) of the second groove e48 is the same as the width Q of the dicing saw e47 and is fixed across the entire depth direction. In the first groove e44 and the second groove e48, a step e49 extending in a direction orthogonal to the thickness direction (direction along the top surface e30A of the substrate e30) is formed between a side surface e44A and a side surface e48A that are mutually adjacent in the thickness direction of the substrate e30. The continuous combination of the first groove e44 and the second groove e48 thus has the shape of a stepped projection that becomes narrower toward the rear surface e30B side. The side surface e44A becomes the rough surface region S of each side surface (each of side surfaces e2C to e2F) of the finished chip resistor e1, the side surface e48A becomes the striped pattern region P of each side surface of the chip resistor e1, and the step e49 becomes the step N of each side surface of the chip resistor e1.

Here, by the first groove e44 being formed by etching, each side surface e44A and the bottom surface e44B are made grainy, rough surfaces with an irregular pattern. On the other hand, by the second groove e48 being formed by the dicing saw e47, each side surface e48A is made to have numerous stripes, which constitute grinding marks of the dicing saw e48, left thereon in a regular pattern. The stripes cannot be removed completely even if the side surface e48A is etched and become the stripes V in the finished chip resistor e1 (see FIG. 107 (*a*)).

Thereafter, the insulating film e45 is removed selectively by etching using a mask e65 as shown in FIG. 116D. With the mask e65, openings e66 are formed at portions of the insulating film e45 coinciding with the respective pad regions e22A (see FIG. 115) in a plan view. Portions of the insulating film e45 coinciding with the openings e66 are thereby removed by the etching and the openings e25 are formed at these portions. The insulating film e45 is thus formed so that the respective pad regions e22A are exposed in the openings e25. Two openings e25 are formed per single semi-finished product e50.

With each semi-finished product e50, after the two openings e25 have been formed in the insulating film e45, probes e70 of a resistance measuring apparatus (not shown) are put in contact with the pad regions e22A in the respective openings e25 to detect the resistance value of the element e5 as a whole. Laser light (not shown) is then irradiated onto an arbitrary fuse F (see FIG. 108) via the insulating film e45 to trim the wiring film e22 in the trimming region X by the laser light and thereby fuse the corresponding fuse F. By thus fusing (trimming) the fuses F so that the required resistance value is attained as described above, the resistance value of the semi-finished product e50 (in other words, the chip resistor e1) as a whole can be adjusted. In this process, the insulating film e45 serves as a cover film that covers the element e5 and therefore the occurrence of a short circuit due to attachment of a fragment, etc., formed in the fusing process to the element e5 can be prevented. Also, the insulating film e45 covers the fuses F (the resistor body film e21) and therefore the energy of the laser light accumulates in the fuses F to enable the fuses F to be fused reliably.

Thereafter, SiN is formed on the insulating film e45 by the CVD method to thicken the insulating film e45. In this process, the insulating film e45 is also formed on the entireties of the inner peripheral surfaces of the first groove e44 and the second groove e48 (the side surfaces e44A, the bottom surface e44B, the side surfaces e48A, and the bottom surface e48B) as shown in FIG. 116E. The insulating film e45 is thus also formed on the steps e49. The insulating film e45 on the respective inner peripheral surfaces of the first groove e44 and the second groove e48 (the insulating film e45 in the state shown in FIG. 116E) has a thickness of 1000 Å to 5000 Å (approximately 3000 Å here). At this point, portions of the insulating film e45 enter inside the respective openings e25 to close the openings e25.

Thereafter, a liquid of a photosensitive resin constituted of polyimide is spray-coated onto the substrate e30 from above the insulating film e45 to form a resin film e46 of the photosensitive resin as shown in FIG. 116E. In this process, the liquid is coated onto the substrate e30 across a mask (not shown) having a pattern covering only the first groove e44 and the second groove e48 in a plan view so that the liquid does not enter inside the first groove e44 and the second groove e48. Consequently, the photosensitive resin of liquid form is formed only on the substrate e30 to become the resin film e46 (resin film) on the substrate e30. The top surface e46A of the resin film e46 on the top surface e30A is formed flatly along the top surface e30A.

The liquid does not enter inside the first groove e44 and the second groove e48 and therefore the resin film e46 is not formed inside the first groove e44 and the second groove e48. Also, besides spray-coating the liquid of photosensitive resin, the resin film e46 may be formed by spin-coating the liquid or adhering a sheet, made of the photosensitive resin, on the top surface e30A of the substrate e30.

Thereafter, heat treatment (curing) is performed on the resin film e46. The thickness of the resin film e46 is thereby made to undergo thermal contraction and the resin film e46 hardens and stabilizes in film quality. Thereafter as shown in FIG. 116F, the resin film e46 is patterned to selectively remove portions of the resin film e46 on the top surface e30A coinciding with the respective pad regions e22A (openings e25) of the wiring film e22 in a plan view. Specifically, a mask e62, having openings e61 of a pattern matching (coinciding with) the respective pad regions e22A in a plan view formed therein, is used to expose and develop the resin film e46 with the pattern. The resin film e46 is thereby made to separate at portions above the respective pad regions e22A to form the openings e25. In this process, portions of the resin film e46 bordering the openings e25 undergo thermal contraction and defining surfaces e46B that define the openings e25 at these portions become inclining surfaces that intersect the thickness direction of the substrate e30. Each opening e25 is thereby put in a state where it widens as the top surface e46A of the resin film 46 (which becomes the top surface e24C of the resin film e24) is approached as mentioned above.

Thereafter, the insulating film e45 above the respective pad regions e22 is removed by RIE using an unillustrated mask to open the respective openings e25 and expose the pad regions e22A. Thereafter, an Ni/Pd/Au laminated film, constituted by laminating Ni, Pd, and Au by electroless plating, is formed on the pad region e22 in each opening e25 to form the first connection electrode e3 and the second connection electrode e4 on the pad regions e22A as shown in FIG. 116G.

FIG. 118 is a diagram for describing a process for manufacturing the first connection electrode and the second connection electrode. Specifically, with reference to FIG. 118, first, a top surface of each pad region e22A is cleaned to remove (degrease) organic matter (including smuts, such as stains of carbon, etc., and oil and fat dirt) on the top surface (step S1). Thereafter, an oxide film on the top surface is removed (step S2). Thereafter, a zincate treatment is performed on the top surface to convert the Al (of the wiring film e22) at the top surface to Zn (step S3). Thereafter, the Zn on the top surface is peeled off by nitric acid, etc., so that fresh Al is exposed at the pad region e22A (step S4).

Thereafter, the pad region e22A is immersed in a plating solution to apply Ni plating on a top surface of the fresh Al in the pad region e22A. The Ni in the plating solution is thereby chemically reduced and deposited to form the Ni layer e33 on the top surface (step S5). Thereafter, the Ni layer e33 is immersed in another plating solution to apply Pd plating on a top surface of the Ni layer e33. The Pd in the plating solution is thereby chemically reduced and deposited to form the Pd layer e34 on the top surface of the Ni layer e33 (step S6).

Thereafter, the Pd layer e34 is immersed in yet another plating solution to apply Au plating on a top surface of the Pd layer e34. The Au in the plating solution is thereby chemically reduced and deposited to form the Au layer e35 on the top surface of the Pd layer e34 (step S7). The first connection electrode e3 and the second connection electrode e4 are thereby formed, and when the first connection electrode e3 and the second connection electrode e4 that have been formed are dried (step S8), the process for manufacturing the first connection electrode e3 and the second connection electrode e4 is completed. A step of washing the semi-finished product e50 with water is performed as necessary between consecutive steps. Also, the zincate treatment may be performed a plurality of times.

FIG. 116G shows a state after the first connection electrode e3 and the second connection electrode e4 have been formed in each semi-finished product e50. Respectively with the first connection electrode e3 and the second electrode e4, the top surfaces e3A and e4A are flush with the top surface e46A of the resin film e46. Also, in accordance with the defining surfaces e46B that define the openings e25 in the resin film e46 being inclined as described above, with each of the first connection electrode e3 and the second connection electrode e4, the end portions of the top surfaces e3A and e4A at the edge sides of the openings e25 are curved toward the rear surface e30B side of the substrate e30. Therefore with each of the first connection electrode e3 and the second connection electrode e4, end portions of each of the Ni layer e33, the Pd layer e34, and the Au layer e35 at the edge sides of the openings e25 are curved toward the rear surface e30B side of the substrate e30.

As described above, the first connection electrode e3 and the second connection electrode e4 are formed by electroless plating and therefore in comparison to a case where the first connection electrode e3 and the second connection electrode e4 are formed by electrolytic plating, the number of steps of the process for forming the first connection electrode e3 and the second connection electrode e4 (for example, a lithography step, a resist mask peeling step, etc., that are necessary in electrolytic plating) can be reduced to improve the productivity of the chip resistor e1. Further in the case of electroless plating, the resist mask that is deemed to be necessary in electrolytic plating is unnecessary and deviation of the positions of formation of the first connection electrode e3 and the second connection electrode e4 due to positional deviation of the resist mask thus does not occur, thereby enabling the formation position precision of the first connection electrode e3 and the second connection electrode e4 to be improved to improve the yield. Also, by performing electroless plating on the pad regions e22A exposed from the resin film e24, the first connection electrode e3 and the second connection electrode e4 can be formed just on the pad regions e22A.

Also generally in the case of electrolytic plating, Ni and Si are contained in the plating solution. Although failure of connection between the first connection electrode e3 or the second connection electrode e4 and a connection terminal e88 of the mounting substrate e9 (see FIG. 107(*b*)) may thus occur due to oxidation of the Sn left on the top surfaces e3A and e4A of the first connection electrode e3 and the second connection electrode e4, such a problem does not occur in the fifth reference example in which electroless plating is used.

After the first connection electrode e3 and the second connection electrode e4 have thus been formed, a conduction test is performed across the first connection electrode e3 and the second connection electrode e4, and thereafter, the substrate e30 is ground from the rear surface e30B. Specifically, an adhesive surface e72 of a thin, plate-shaped supporting tape e71, made of PET (polyethylene terephthalate) and having the adhesive surface e72, is adhered onto the first connection electrode e3 and second connection electrode e4 side (that is, the top surface e30A) of each semi-finished product e50 as shown in FIG. 116H. The respective semi-finished products e50 are thereby supported by the supporting tape e71. Here, for example, a laminated tape may be used as the supporting tape e71.

In the state where the respective semi-finished products e50 are supported by the supporting tape e71, the substrate e30 is ground from the rear surface e30B side. When the substrate e30 has been thinned by grinding until the bottom surface e48B (see FIG. 116G) of the second groove e48 is reached, there are no longer portions that join mutually adjacent semi-finished products e50 and the substrate e30 is thus divided at the first groove e44 and the second groove e48 as boundaries and the semi-finished products e50 are separated individually to become the finished products of the chip resistors e1. That is, the substrate e30 is cut (divided) at the first groove e44 and the second groove e48 (in other words, the boundary region Z) and the individual chip resistors e1 are thereby cut out. The thickness of the substrate e30 (substrate e2) after the rear surface e30B has been ground is 150 μm to 400 μm (not less than 150 μm and not more than 400 μm).

With each finished chip resistor e1, a portion that formed a side surface e44A of the first groove e44 becomes the rough surface region S of one of the side surfaces e2C to e2F of the substrate e2, a portion that formed a side surface e48A of the second groove e48 becomes the striped pattern region P of one of the side surfaces e2C to e2F of the substrate e2, and the step e49 between aside surface e44A and aside surface e48A becomes the step N. With each finished chip resistor e1, the rear surface e30B becomes the rear surface e2B. That is, the steps of forming the first groove e44 and the second groove e48 as described above (see FIG. 116B and FIG. 116C) are included in the step of forming the side surfaces e2C to e2F. Also, the insulating film e45 becomes the passivation film e23, and the resin film e46 becomes the resin film e24.

For example, even if the first groove e44 (see FIG. 116B), which is formed by etching, is not uniform in depth, as long as the second groove e48 is formed by the dicing saw e47 (see FIG. 116C), the depth (depth from the top surface e30A of the substrate e30 to the bottom of the second groove e48) of the first groove e44 and the second groove e48 as a whole will be uniform. Therefore, in the process of separating the chip resistors e1 into individual chips by grinding the rear surface e30B of the substrate e30, differences in time until separation from the substrate e1 can be lessened among the chip resistors e1 and the respective chip resistors e1 can thus be separated substantially simultaneously from the substrate e30. A problem, such as chipping occurring in a priorly-separated chip resistor e1 due to repeated collision of the chip resistor e1 with the substrate e30, can thereby be suppressed. Also, corner portions (corner portions ell) at the top surface e2A side of the chip resistor e1 are defined by the first groove e44 that is formed by etching, and therefore chipping is less likely to occur at the corner portions ell in comparison to a case where these portions are defined by the dicing saw e47. As a result of the above, chipping can be suppressed and occurrence of faults in separation into individual chips can be avoided in the process of separating the chip resistors e1 into individual chips. That is, control of the shape of the corner portions ell (see FIG. 107(*a*)) at the top surface e2A side of the chip resistor e1 is made possible. Also in comparison to a case where both the first groove e44 and the second groove e48 are formed by etching, the time required for separation of the chip resistors e1 into individual chips can be shortened to enable the productivity of the chip resistors e1 to be improved.

In particular, in a case where the thickness of the substrate e2 in the chip resistor e1 that has been separated into an individual chip is 150 μm to 400 μm and comparatively large, it is difficult and time-consuming to form a groove reaching from the top surface e30A of the substrate e30 to the bottom surface e48B of the second groove e48 (see FIG. 116C) just by etching. However, even in such a case, by forming the first groove e44 and the second groove e48 by combined use of etching and dicing by the dicing saw e47 and then grinding the rear surface e30B of the substrate e30, the time required for separation of the chip resistors e1 into individual chips can be shortened. The productivity of the chip resistors e1 can thus be improved.

Also, if the second groove e48 is made to reach the rear surface e30B of the substrate e30 (if the second groove e48 is made to penetrate through the substrate e30) by dicing, chipping may occur at corner portions of the rear surface e2B and the side surfaces e2C to e2F in the finished chip resistor e1. However, if, as in the fifth reference example, half-dicing is performed so that the second groove e48 does not reach the rear surface e30B (see FIG. 116C) and the rear surface e30B is ground thereafter, chipping is unlikely to occur at the corner portions of the rear surface e2B and the side surfaces e2C to e2F.

Also, if a groove reaching from the top surface e30A of the substrate e30 to the bottom surface e48B of the second groove e48 is formed just by etching, side surfaces of the groove after completion will not be aligned in the thickness direction of the substrate e2 and the groove will be unlikely to have a rectangular cross section due to variation of the etching rate. That is, there will be variation in the side surfaces of the groove. However, by combining etching and dicing as in the fifth reference example, the variation in each groove side surface (each of the side surfaces e44A and side surfaces e48A) of the first groove e44 and the second groove e48 as a whole can be reduced in comparison to performing etching alone and the groove side surfaces can thereby be aligned in the thickness direction of the substrate e2.

Also, the width Q of the dicing saw e47 is less than the width M of the first groove e44 so that the width Q of the second groove e48 formed by the dicing saw e47 is smaller than the width M of the first groove e44 and the second groove e48 is positioned at an inner side of the first groove e44 (see FIG. 116C). Therefore, when the second groove e48 is formed by the dicing saw e47, the dicing saw e47 will not widen the width of the first groove e44. Occurrence of chipping at the corner portions ell at the top surface e2A side of the chip resistor e1 due to the corner portions ell being defined by the dicing saw e47 instead of being defined by the first groove e44 can thus be suppressed reliably.

Although the chip resistors e1 are separated into individual chips by forming the second groove e48 and thereafter grinding the rear surface e30B, the rear surface e30B may instead be ground ahead of forming the second groove e48 and the second groove e48 may thereafter be formed by dicing. Cutting out of the chip resistors e1 by etching the substrate e30 from the rear surface e30B to the bottom surface e48B of the second groove e48 is also conceivable.

As described above, by forming the first groove e44 and the second groove e48 and thereafter grinding the substrate e30 from the rear surface e30B side, the plurality of chip component regions Y formed on the substrate e30 can be separated all at once into individual chip resistors e1 (chip components) (the individual chips of the plurality of chip resistors e1 can be obtained at once). The productivity of the chip resistors e1 can thus be improved by reduction of the time for manufacturing the plurality of chip resistors e1. For example, approximately 500 thousand chip resistors e1 can be cut out by using a substrate e30 with a diameter of 8 inches.

That is, even if the chip resistors e1 are small in size, the chip resistors e1 can be separated into individual chips at once by first forming the first groove e44 and the second groove e48 and then grinding the substrate e30 from the rear surface e30B side as described above. Also, the first groove e44 can be formed with high precision by etching and therefore in each individual chip resistor e1, improvement of external dimensional precision can be achieved at the rough surface region S side of each of the side surfaces e2C to e2F defined by the first groove e44. In particular, the first groove e44 can be formed with even higher precision by using plasma etching. Also, the intervals of the first groove e44 can be made fine in accordance with the resist pattern e41 (see FIG. 117) to achieve downsizing of the chip resistors e1 formed between mutually adjacent portions of the first groove e44. Also, in the case of etching, the occurrence of chipping at the corner portions ell of mutually adjacent rough surface regions S of the side surfaces e2C to e2F of the chip resistors e1 (see FIG. 107(*a*)) can be reduced to achieve improvement of the outer appearance of the chip resistors e1.

The rear surface e2B of the substrate e2 of the finished chip resistor e1 may be mirror-finished by polishing or etching to refine the rear surface e2B. The finished chip resistors e1 shown in FIG. 116H are peeled from the supporting tape e71 and thereafter conveyed to a predetermined space to be stored in the space. In mounting the chip resistor e1 on the mounting substrate e9 (see FIG. 107(*b*)), the rear surface e2B of the chip resistor e1 is suctioned onto a suction nozzle e91 (see FIG. 107 (*b*)) of an automatic mounting machine and then the suction nozzle e91 is moved to convey the chip resistor e1. In this process, a substantially central portion in the long direction of the rear surface e2B is suctioned onto the suction nozzle e91. With reference to FIG. 107(*b*), the suction nozzle e91 with the chip resistor e1 suctioned thereon is then moved to the mounting substrate e9. The mounting substrate e9 is provided with the pair of connection terminals e88 in correspondence to the first connection electrode e3 and the second connection electrode e4 of the chip resistor e1. The connection terminals e88 are made, for example, of Cu. At the top surface of each connection terminal e88, the solder e13 is provided so as to project from the top surface.

The suction nozzle e91 is then moved and pressed against the mounting substrate e9 so that, with the chip resistor e1, the first connection electrode e3 is contacted with the solder e13 on one connection terminal e88 and the second connection electrode e4 is contacted with the solder e13 on the other connection terminal e88. When the solders e13 are heated in this state, the solders e13 melt. Thereafter, when the solders e13 are cooled and solidified, the first connection electrode e3 and the one connection terminal e88 become bonded via the solder e13, the second connection electrode e4 and the other connection terminal e88 become bonded via the solder e13, and the mounting of the chip resistor e1 to the mounting substrate e9 is thereby completed.

FIG. 119 is a schematic view for describing how finished chip resistors are housed in an embossed carrier tape. On the other hand, there are also cases where the finished chip resistors e1 as shown in FIG. 116H are housed in the embossed carrier tape e92 shown in FIG. 119. The embossed carrier tape e92 is a tape (band-shaped body) formed, for example, of polycarbonate resin, etc. In the embossed carrier tape e92, multiple pockets e93 are formed so as to be aligned in a long direction of the embossed carrier tape e92. Each pocket e93 is defined as a convex space that is recessed toward one surface (rear surface) of the embossed carrier tape e92.

In housing each finished chip resistor e1 (see FIG. 116H) in the embossed carrier tape e92, (a substantially central portion in the long direction of) the rear surface e2B of the chip resistor e1 is suctioned onto a suction nozzle e91 (see FIG. 107 (*b*)) of a conveying device and then the suction nozzle e91 is moved to peel the chip resistor e1 off from the supporting tape e71. The suction nozzle e91 is then moved to a position facing a pocket e93 of the embossed carrier tape e92. At this point, with the chip resistor e1 being suctioned onto the suction nozzle e91, the first connection electrode e3, the second connection electrode e4, and the resin film e24 at the top surface e2A side face the pocket e93.

Here, in the case of housing the chip resistor e1 in the embossed carrier tape e92, the embossed carrier tape e92 is placed on a flat supporting base e95. The suction nozzle e91 is moved to the pocket e93 side (see the thick arrow) and the chip resistor e1 in an attitude where the top surface e2A side faces the pocket e93 is housed inside the pocket e93. When the top surface e2A side of the chip resistor e1 contacts a bottom e93A of the pocket e93, the housing of the chip resistor e1 in the embossed carrier tape e92 is completed. By moving the suction nozzle e91, the first connection electrode e3, the second connection electrode e4, and the resin film e24 at the top surface e2A side of the chip resistor e1 are pressed against the bottom e93A of the pocket e93 supported by the supporting base e95 when the top surface e2A side is contacted with the bottom e93*a*.

After the housing of the chip resistors e1 in the embossed carrier tape e92 is completed, a peelable cover e94 is adhered onto a top surface of the embossed carrier tape e92 and the interiors of the respective pockets e93 are sealed by the peelable cover e94. Entry of foreign matter into the respective pockets e93 is thereby prevented. To take out a chip resistor e1 from the embossed carrier tape e92, the peelable cover e94 is peeled from the embossed carrier tape e92 to open the pocket e93. Thereafter, the chip resistor e1 is taken out from the pocket e93 and mounted as described above by the automatic mounting machine.

When in mounting the chip resistor e1 as described above or in housing the chip resistor e1 in the embossed carrier tape e92 or further in performing a stress test on the chip resistor e1, the first connection electrode e3 and the second connection electrode e4 are pressed against something (referred to hereinafter as a "contacted portion") by applying force to (a substantially central portion in the long direction of) the rear surface e2B of the chip resistor e1, a stress acts on the top surface e2A of the substrate e2. The contacted portion is the mounting substrate e9 in the case of mounting the chip resistor e1, the bottom e93A of the pocket e93 supported by the supporting base e95 in the case of housing the chip resistor e1 in the embossed carrier tape e92, and a supporting surface supporting the chip resistor e1 that receives a stress in the case of performing a stress test.

Here, a chip resistor e1 may be considered where the height H of the resin film e24 at the top surface e2A of the substrate e2 (see FIG. 115) is less than the height J of each of the first connection electrode e3 and the second connection electrode e4 (see FIG. 115) and the top surfaces e3A and e4A of the first connection electrode e3 and the second connection electrode e4 project the most from the top surface e2A of the substrate e2 (that is, the resin film e24 is thin) (see FIG. 120 to be described below). With such a chip resistor e1, just the first connection electrode e3 and the second connection electrode e4 at the top surface e2A side make contact (two-point contact) with the contacted portion, and therefore the stress applied to the chip resistor e1 concentrates at the respective bonding portions of the first connection electrode e3 and the second connection electrode e4 with the substrate e2. The electrical characteristics of the chip resistor e1 may thus degrade. Further, strain may occur inside the chip resistor e1 (especially at a substantially central portion in the long direction of the substrate e2) due to the stress, and in a severe case, the substrate e2 may crack with the substantially central portion as a starting point.

However as mentioned above, with the fifth reference example, the resin film e24 is made thick so that the height H of the resin film e24 is not less than the height J of each of the first connection electrode e3 and the second connection electrode e4 (see FIG. 115). The stress applied to the chip resistor e1 is thus received not only by the first connection electrode e3 and the second connection electrode e4 but also by the resin film e24. The area of the portion of the chip resistor e1 that receives the stress can thus be increased so that the stress applied to the chip resistor e1 can be dispersed. The concentration of stress on the first connection electrode e3 and the second connection electrode e4 can thereby be suppressed in the chip resistor e1. In particular, the concentration of the stress applied to the chip resistor e1 can be dispersed more effectively by the top surface e24C of the resin film e24. The concentration of stress on the chip resistor e1 can thereby be suppressed further to enable the chip resistor e1 to be improved in strength. Consequently, destruction of the chip resistor e1 during mounting or during a durability test or during housing in the embossed carrier tape e92 can be suppressed. Consequently, the yield in the process of mounting or housing in the embossed carrier tape e92 can be improved and further, the chip resistor e1 can be improved in handling properties because the chip resistor e1 does not break readily.

Modification examples of the chip resistor e1 shall now be described. FIG. 120 to FIG. 124 are schematic sectional views of chip resistors according to first to fifth modification examples. With the first to fifth modification examples, portions corresponding to portions described above with the chip resistor e1 shall be provided with the same reference symbols and detailed description of these portions shall be omitted. In regard to the first connection electrode e3 and the second connection electrode e4, in FIG. 115, the top surface e3A of the first connection electrode e3 and the top surface e4A of the second connection electrode e4 are flush with the top surface e24C of the resin film e24. If the dispersion of a stress applied to the chip resistor e1 during mounting, etc., is not to be considered, the top surface e3A of the first connection electrode e3 and the top surface e4A of the second connection electrode e4 may, as in the first modification example shown in FIG. 120, project further than the top surface e24C of the resin film e24 in a direction away from the top surface e2A of the substrate e2 (upward in FIG. 120). In this case, the height H of the resin film e24 is lower than the height J of each of the first connection electrode e3 and the second connection electrode e4.

Oppositely, if the stress applied to the chip resistor e1 during mounting, etc., is to be dispersed more than in the case of FIG. 115, the height H of the resin film e24 is made higher than the height J of each of the first connection electrode e3 and the second connection electrode e4 as in the second modification example shown in FIG. 121. The resin film e24 is thereby made thicker and the top surface e3A of the first connection electrode e3 and the top surface e4A of the second connection electrode e4 are shifted more toward the top surface e2A side of the substrate e2 (downward in FIG. 120) than the top surface e24C of the resin film e24. In this case, the first connection electrode e3 and the second connection electrode e4 are in a state of being embedded more toward the substrate e2 side than the top surface e24C of the resin film e24 and the two-point contact at the first connection electrode e3 and the second connection electrode e4 does not occur per se. The concentration of stress on the chip resistor e1 can thus be suppressed further. However, in mounting the chip resistor e1 according to the second modification example on the mounting substrate e9, the solders e13 on the respective connection terminals e88 of the mounting substrate e9 must be made thick so as to be capable of reaching the top surface e3A of the first connection electrode e3 and the top surface e4A of the second connection electrode e4 to prevent failure of connection of the first connection electrode e3 and the second connection electrode e4 with the solders e13 (see FIG. 107(*b*)).

Also, although with the insulating layer e20 on the top surface e2A of the substrate e2, an end surface e20A thereof (the portion coincident with the edge portion e85 of the top surface e2A in a plan view) extends in the thickness direction of the substrate e2 (in the vertical direction in FIG. 115, FIG. 120, and FIG. 121), it may be inclined instead as shown in FIG. 122 to FIG. 124. Specifically, the end surface e20A of the insulating layer e20 is inclined so as to be directed toward the interior of the substrate e2 as the top surface of the insulating layer e20 is approached from the top surface e2A of the substrate e2. In accordance with such an end surface e20A, a portion of the passivation film e23 covering the end surface e20A (the end portion e23C) is also inclined along the end surface e20A.

The chip resistors e1 according to the third to fifth modification examples shown in FIG. 122 to FIG. 124 differ in the position of the edge e24A of the resin film e24. First, the chip resistor e1 according to the third modification example shown in FIG. 122 is the same as the chip resistor e1 of FIG. 115 with the exception that the end surface e20A of the insulating layer e20 and the end portion e23C of the passivation film e23 are inclined. Therefore in a plan view, the edge e24A of the resin film e24 is matched with the side surface covering portion e23B of the passivation film e23 and is positioned further outward than the edge portion e85 of the top surface e2A of the substrate e2 (end edge at the top surface e2A side of the substrate e2) by just an amount corresponding to the thickness of the side surface covering portion e23B. To thus match the edge e24A with the side surface covering portion e23B, an unillustrated mask must be used to prevent the photosensitive resin liquid for forming the resin film e46 from entering into the first groove e44 and the second groove e48 in the process of spray coating the liquid (see FIG. 116E). Or, even if the liquid enters into the first groove e44 and the second groove e48, an opening e61 is formed in the mask e62 at portions coinciding with the first groove e44 and the second groove e48 in a plan view in patterning the resin film e46 thereafter (see FIG. 116F). The resin film e46 in the first groove e44 and the second groove e48 can thereby be removed by the patterning of the resin film e46 to make the edge e24A of the resin film e24 be matched with the side surface covering portion e23B.

Here, the resin film e24 is made of resin and there is thus no possibility of a crack forming therein due to an impact. The resin film e24 can thus reliably protect the top surface e2A of the substrate e2 (especially, the element e5 and the fuses F) and the edge portion e85 of the top surface e2A of the substrate e2 against impacts to enable a chip resistor e1 of excellent impact resistance to be provided. On the other hand, with the chip resistor e1 according to the fourth modification example shown in FIG. 123, the edge e24A of the resin film e24 is not matched with the side surface covering portion e23B of the passivation film e23 in a plan view but is retreated further inward than the side surface covering portion e23B or more specifically, further toward the interior of the substrate e2 than the edge portion e85 of the top surface e2A of the substrate e2. Even in this case, the resin film e24 can reliably protect the top surface e2A of the substrate e2 (especially, the element e5 and the fuses F) from impacts to enable a chip resistor e1 of excellent impact resistance to be provided. To make the edge e24A of the resin film e24 retreat toward the interior of the substrate e2, the opening e61 is also formed at portions of the mask e62 overlapping with the edge portion e85 of the substrate e2 (substrate e30) in a plan view in patterning the resin film e46 (see FIG. 116F). The resin film e46 at regions overlapping with the edge portion e85 of the substrate e2 (substrate e30) in a plan view can thereby be removed by the patterning of the resin film e46 to make the edge e24A of the resin film e24 retreat toward the interior of the substrate e2.

With the chip resistor e1 according to the fifth modification example shown in FIG. 124, the edge e24A of the resin film e24 is not matched with the side surface covering portion e23B of the passivation film e23 in a plan view. Specifically, the resin film e24 protrudes further outward than the side surface covering portion e23B and covers the entirety of the side surface covering portion e23B from the exterior. That is, with the fifth modification example, the resin film e24 covers both the top surface covering portion e23A and the side surface covering portion e23B of the passivation film e23. In this case, the resin film e24 can reliably protect the top surface e2A of the substrate e2 (especially the element e5 and the fuses F) and the side surfaces e2C to e2F of the substrate e2 from impacts to enable a chip resistor e1 of excellent impact resistance to be provided. If the resin film e24 is to cover both the top surface covering portion e23A and the side surface covering portion e23B, the photosensitive resin liquid for forming the resin film e46 is made to enter into the first groove e44 and the second groove e48 and become attached to the side surface covering portion e23B in the process of spray coating the liquid (see FIG. 116E). As described above, spin coating of the liquid is not preferable because the liquid does not take the form of a film but fills the first groove e44 and the second groove e48 completely. On the other hand, forming of the resin film e46 by adhering a sheet made of the photosensitive resin onto the top surface e30A of the substrate e30 is not preferable because the sheet cannot enter inside the first groove e44 and the second groove e44 and the entirety of the side surface covering portion e23B thus cannot be covered. Spray coating of the liquid of the photosensitive resin is thus effective for making the resin film e24 cover both the top surface covering portion e23A and the side surface covering portion e23B.

Although preferred embodiments of the fifth reference example have been described above, the fifth reference example may be implemented in yet other modes as well. For example, although with each of the preferred embodiments described above, the chip resistor e1 was disclosed as an example of a chip component according to the fifth reference example, the fifth reference example may also be applied to a chip component, such as a chip capacitor, a chip inductor, or a chip diode. A chip capacitor shall be described below.

FIG. 125 is a plan view of a chip capacitor according to another preferred embodiment of the fifth reference example. FIG. 126 is a sectional view taken along section line CXXVI-CXXVI in FIG. 125. FIG. 127 is an exploded perspective view showing the arrangement of a portion of the chip capacitor in a separated state. With the chip capacitor e101 to be described below, portions corresponding to portions described above for the chip resistor e1 shall be provided with the same reference symbols and detailed description of such portions shall be omitted. With the chip capacitor e101, the portions provided with the same reference symbols as the portions described for the chip resistor e1 have, unless noted otherwise, the same arrangements as the portions described for the chip resistor e1 and exhibit the same actions and effects as the portions described for the chip resistor e1.

With reference to FIG. 125, the chip capacitor e101 has, like the chip resistor e1, the substrate e2, the first connection electrode e3 disposed on the substrate e2 (at the top surface e2A side of the substrate e2), and the second connection electrode e4 disposed similarly on the substrate e2. In the present preferred embodiment, the substrate e2 has, in a plan view, a rectangular shape. The first connection electrode e3 and the second connection electrode e4 are respectively disposed at portions at respective ends in the long direction of the substrate e2. In the present preferred embodiment, each of the first connection electrode e3 and the second connection electrode e4 has a substantially rectangular planar shape extending in the short direction of the substrate e2. On the top surface e2A of the substrate e2, a plurality of capacitor parts C1 to C9 are disposed within a capacitor arrangement region e105 between the first connection electrode e3 and the second connection electrode e4. The plurality of capacitor parts C1 to C9 are a plurality of element parts (capacitor elements) that constitute the element e5 and are electrically connected respectively to the second connection electrode e4 via a plurality of fuse units e107 (corresponding to the fuses F described above) in a manner enabling disconnection. The element e5 constituted of the capacitor parts C1 to C9 is arranged as a capacitor network.

As shown in FIG. 126 and FIG. 127, an insulating layer e20 is formed on the top surface e2A of the substrate e2, and a lower electrode film e111 is formed on the top surface of the insulating layer e20. The lower electrode film e111 is formed to spread across substantially the entirety of the capacitor arrangement region e105. The lower electrode film e111 is further formed to extend to a region directly below the first connection electrode e3. More specifically, the lower electrode film e111 has, in the capacitor arrangement region e105, a capacitor electrode region e111A functioning as a lower electrode in common to the capacitor parts C1 to C9 and has a pad region e111B (pad) leading out to an external electrode and disposed directly below the first connection electrode e3. The capacitor electrode region e111A is positioned in the capacitor arrangement region e105 and the pad region e111B is positioned directly below the first connection electrode e3 and is in contact with the first connection electrode e3.

In the capacitor arrangement region e105, a capacitance film (dielectric film) e112 is formed so as to cover and contact the lower electrode film e111 (capacitor electrode region e111A). The capacitance film e112 is formed across the entirety of the capacitor electrode region e111A (capacitor arrangement region e105). In the present preferred embodiment, the capacitance film e112 further covers the insulating layer e20 outside the capacitor arrangement region e105.

An upper electrode film e113 is formed on the capacitance film e112 so as to contact the capacitance film e112. In FIG. 125, the upper electrode film e113 is colored for the sake of clarity. The upper electrode film e113 includes a capacitor electrode region e113A positioned in the capacitor arrangement region e105, a pad region e113B (pad) positioned directly below the second connection electrode e4 and in contact with the second connection electrode e4, and a fuse region e113C disposed between the capacitor electrode region e113A and the pad region e113B.

In the capacitor electrode region e113A, the upper electrode film e113 is divided (separated) into a plurality of electrode film portions (upper electrode film portions) e131 to e139. In the present preferred embodiment, the respective electrode film portions e131 to e139 are all formed to rectangular shapes and extend in the form of bands from the fuse region e113C toward the first connection electrode e3. The plurality of electrode film portions e131 to e139 face the lower electrode film e111 across the capacitance film e112 over a plurality of types of facing areas (while being in contact with the capacitance film e112). More specifically, the facing areas of the electrode film portions e131 to e139 with respect to the lower electrode film e111 may be set to be 1:2:4:8:16:32:64:128:128. That is, the plurality of electrode film portions e131 to e139 include the plurality of electrode film portions differing in facing area and more specifically include the plurality of electrode film portions e131 to e138 (or e131 to e137 and e139) having facing areas that are set to form a geometric progression with a common ratio of 2. The plurality of capacitor parts C1 to C9, respectively arranged by the respective electrode film portions e131 to e139, the facing lower electrode film e111 across the capacitance film e112, and the capacitance film e112, thus include the plurality of capacitor parts having mutually different capacitance values. If the ratio of the facing areas of the electrode film portions e131 to e139 is as mentioned above, the ratio of the capacitance values of the capacitor parts C1 to C9 is equal to the ratio of the facing areas and is 1:2:4:8:16:32:64:128:128. The plurality of capacitor parts C1 to C9 thus include the plurality of capacitor parts C1 to C8 (or C1 to C7 and C9) with capacitance values set to form the geometric progression with the common ratio of 2.

In the present preferred embodiment, the electrode film portions e131 to e135 are formed to bands that are equal in width and have lengths with the ratio thereof being set to 1:2:4:8:16. Also, the electrode film portions e135, e136, e137, e138, and e139 are formed to bands that are equal in length and have widths with the ratio thereof being set to 1:2:4:8:8. The electrode film portions e135 to e139 are formed to extend across a range from an end edge at the second connection electrode e4 side to an end edge at the first connection electrode e3 side of the capacitor arrangement region e105, and the electrode film portions e131 to e134 are formed to be shorter than this range.

The pad region e113B is formed to be substantially similar in shape to the second connection electrode e4 and has a substantially rectangular planar shape. As shown in FIG. 126, the upper electrode film e113 in the pad region e113B is in contact with the second connection electrode e4.

The fuse region e113C is disposed along one long side (the long side at the inner side with respect to the peripheral edge of the substrate e2) of the pad region e113B. The fuse region e113C includes the plurality of fuse units e107 that are aligned along the one long side of the pad region e113B.

The fuse units e107 are formed of the same material as and to be integral to the pad region e113B of the upper electrode film e113. The plurality of electrode film portions e131 to e139 are each formed integral to one or a plurality of the fuse units e107, are connected to the pad region e113B via the fuse units e107, and are electrically connected to the second connection electrode e4 via the pad region e113B. As shown in FIG. 125, each of the electrode film portions e131 to e136 of comparatively small area is connected to the pad region e113B via a single fuse unit 7, and each of the electrode film portions e137 to e139 of comparatively large area is connected to the pad region e113B via a plurality of fuse units e107. It is not necessary for all of the fuse units e107 to be used and, in the present preferred embodiment, a portion of the fuse units e107 is unused.

The fuse units e107 include first wide portions e107A arranged to be connected to the pad region e113B, second wide portions e107B arranged to be connected to the electrode film portions e131 to e139, and narrow portions e107C connecting the first and second wide portions e107A and e107B. The narrow portions e107C are arranged to be capable of being cut (fused) by laser light. Unnecessary electrode film portions among the electrode film portions e131 to e139 can thus be electrically disconnected from the first and second connection electrodes e3 and e4 by cutting the fuse units e107.

Although omitted from illustration in FIG. 125 and FIG. 127, the top surface of the chip capacitor e101 that includes the top surface of the upper electrode film e113 is covered by the passivation film e23 as shown in FIG. 126. The passivation film e23 is constituted, for example, of a nitride film and is formed not only to cover the upper surface of the chip capacitor e101 but also to extend to the side surfaces e2C to e2F of the substrate e2 and cover the entireties of the side surfaces e2C to e2F. Further, the resin film e24 is formed on the passivation film e23.

The passivation film e23 and the resin film e24 are protective films that protect the top surface of the chip capacitor e101. In these films, the pad openings e25 are respectively formed in regions corresponding to the first connection electrode e3 and the second connection electrode e4. The pad openings e25 penetrate through the passivation film e23 and the resin film e24 so as to respectively expose a region of a portion of the pad region e111B of the lower electrode film e111 and a region of a portion of the pad region e113B of the upper electrode film e113. Further, with the present preferred embodiment, the opening e25 corresponding to the first connection electrode e3 also penetrates through the capacitance film e112.

The first connection electrode e3 and the second connection electrode e4 are respectively embedded in the pad openings e25. The first connection electrode e3 is thereby bonded to the pad region e111B of the lower electrode film e111 and the second connection electrode e4 is bonded to the pad region e113B of the upper electrode film e113. In the present preferred embodiment, the first and second external electrodes e3 and e4 are formed so that the respective top surfaces e3A and e4A are substantially flush with the top surface e24A of the resin film e24. As with the chip resistor e1, the chip capacitor e101 can be flip-chip bonded to the mounting substrate e9.

FIG. 128 is a circuit diagram of the electrical arrangement of the interior of the chip capacitor. The plurality of capacitor parts C1 to C9 are connected in parallel between the first connection electrode e3 and the second connection electrode e4. Fuses F1 to F9, each arranged from one or a plurality of the fuse units e107, are interposed in series between the respective capacitor parts C1 to C9 and the second connection electrode e4.

When all of the fuses F1 to F9 are connected, the capacitance value of the chip capacitor e101 is equal to the total of the capacitance values of the capacitor parts C1 to C9. When one or two or more fuses selected from among the plurality of fuses F1 to F9 is or are cut, each capacitor part corresponding to the cut fuse is disconnected and the capacitance value of the chip capacitor e101 decreases by just the capacitance value of the disconnected capacitor part or parts.

Therefore by measuring the capacitance value across the pad regions e111B and e113B (the total capacitance value of the capacitor parts C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor parts C1 to C8 are set to form a geometric progression with a common ratio of 2, fine adjustment to the targeted capacitance value at a precision corresponding to the capacitance value of the capacitor part C1, which is the smallest capacitance value (value of the first term in the geometric progression), is made possible.

For example, the capacitance values of the capacitor parts C1 to C9 may be set as follows. C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor e101 can be finely adjusted at a minimum adjustment precision of 0.03125 pF. Also, the fuses to be cut among the fuses F1 to F9 can be selected appropriately to provide the chip capacitor e101 with an arbitrary capacitance value between 10 pF and 18 pF.

As described above, with the present preferred embodiment, the plurality of capacitor parts C1 to C9 that can be disconnected by the fuses F1 to F9 are provided between the first connection electrode e3 and the second connection electrode e4. The capacitor parts C1 to C9 include a plurality of capacitor parts that differ in capacitance value and more specifically include a plurality of capacitor parts with capacitance values set to form a geometric progression. Chip capacitors e101, which can accommodate a plurality of types of capacitance values without change of design and can be accurately adjusted to the desired capacitance value by selection and fusion by laser light of one or a plurality of fuses among the fuses F1 to F9, can thus be realized with a common design.

Details of respective portions of the chip capacitor e101 shall now be described. With reference to FIG. 125, the substrate e2 may have, for example, a rectangular shape of 0.3 mm×0.15 mm, 0.4 mm×0.2 mm, etc. (preferably a size of not more than 0.4 mm×0.2 mm) in a plan view. The capacitor arrangement region e105 is generally a square region with each side having a length corresponding to the length of the short side of the substrate e2. The thickness of the substrate e2 may be approximately 150 μm. With reference to FIG. 126, the substrate e2 may, for example, be a substrate that has been thinned by grinding or polishing from the rear surface side (surface on which the capacitor parts C1 to C9 are not formed). As the material of the substrate e2, a semiconductor substrate as represented by a silicon substrate may be used or a glass substrate may be used or a resin film may be used.

The insulating layer e20 may be a silicon oxide film or other oxide film. The film thickness thereof may be approximately 500 Å to 2000 Å. The lower electrode film e111 is preferably a conductive film, a metal film in particular, and may, for example, be an aluminum film. The lower electrode film e111 that is constituted of an aluminum film may be formed by a sputtering method. Similarly, the upper electrode film e113 is preferably constituted of a conductive film, a metal film in particular, and may, for example, be an aluminum film. The upper electrode film e113 that is constituted of an aluminum film may be formed by the sputtering method. The patterning for dividing the capacitor electrode region e113A of the upper electrode film e113 into the electrode film portions e131 to e139 and shaping the fuse region e113C into the plurality of fuse units e107 may be performed by photolithography and etching processes.

The capacitance film e112 may be constituted, for example, of a silicon nitride film, and the film thickness thereof may be 500 Å to 2000 Å (for example, 1000 Å). The capacitance film e112 may be a silicon nitride film formed by plasma CVD (chemical vapor deposition). The passivation film e23 may be constituted, for example, of a silicon nitride film and may be formed, for example, by the plasma CVD method. The film thickness thereof may be approximately 8000 Å. As mentioned above, the resin film e24 may be constituted of a polyimide film or other resin film.

Each of the first and second connection electrodes e3 and e4 may, for example, be constituted of a laminated structure film in which the Ni layer e33 in contact with the lower electrode film e111 or the upper electrode film e113, the Pd layer e34 laminated on the Ni layer e33, and the Au layer e35 laminated on the Pd layer e34 are laminated, and may be formed, for example, by an electroless plating method. The Ni layer e33 contributes to improvement of adhesion with the lower electrode film e111 or the upper electrode film e113, and the Pd layer e34 functions as a diffusion preventing layer that suppresses mutual diffusion of the material of the upper electrode film or the lower electrode film and the gold of the topmost layer of each of the first and second connection electrodes e3 and e4.

A process for manufacturing the chip capacitor e101 is the same as the process for manufacturing the chip resistor e1 after the element e5 has been formed. To form the element e5 (capacitor element) in the chip capacitor e101, first, the insulating layer e20, constituted of an oxide film (for example, a silicon oxide film), is formed on the top surface of the substrate e30 (substrate e2) by a thermal oxidation method and/or CVD method. Thereafter, the lower electrode film e111, constituted of an aluminum film, is formed over the entire top surface of the insulating layer e20, for example, by the sputtering method. The film thickness of the lower electrode film e111 may be approximately 8000 Å. Thereafter, a resist pattern corresponding to the final shape of the lower electrode film e111 is formed on the top surface of the lower electrode film by photolithography. The lower electrode film is etched using the resist pattern as a mask to obtain the lower electrode film e111 of the pattern shown in FIG. 125, etc. The etching of the lower electrode film e111 may be performed, for example, by reactive ion etching.

Thereafter, the capacitance film e112, constituted of a silicon nitride film, etc., is formed on the lower electrode film e111, for example, by the plasma CVD method. In the region in which the lower electrode film e111 is not formed, the capacitance film e112 is formed on the top surface of the insulating layer e20. Thereafter, the upper electrode film e113 is formed on the capacitance film e112. The upper electrode film e113 is constituted, for example, of an aluminum film and may be formed by the sputtering method. The film thickness thereof may be approximately 8000 Å. Thereafter, a resist pattern corresponding to the final shape of the upper electrode film e113 is formed on the top surface of the upper electrode film e113 by photolithography. The upper electrode film e113 is patterned to its final shape (see FIG. 125, etc.) by etching using the resist pattern as a mask. The upper electrode film e113 is thereby shaped to the pattern having the portion divided into the plurality of electrode film portions e131 to e139 in the capacitor electrode region e113A, having the plurality of fuse units e107 in the fuse region e113C, and having the pad region e113B connected to the fuse units e107. By the dividing of the upper electrode film e113, the plurality of capacitor elements C1 to C9 can be formed in accordance with the number of electrode film portions e131 to e139. The etching for patterning the upper electrode film e113 may be performed by wet etching using an etching liquid, such as phosphoric acid, etc., or may be performed by reactive ion etching.

The element e5 (the capacitor parts C1 to C9 and the fuse units e107) in the chip capacitor e101 is formed by the above. After the element e5 has been formed, the insulating film e45 is formed by the plasma CVD method so as to cover the entire element e5 (the upper electrode film e113 and the capacitance film e112 in the region in which the upper electrode film e113 is not formed) (see FIG. 116A). Thereafter, the first groove e44 and the second groove e48 are formed (see FIG. 116B and FIG. 116C) and then the openings e25 are formed (see FIG. 116D). Probes e70 are then contacted against the pad region e113B of the upper electrode film e113 and the pad region e111B of the lower electrode film e111 that are exposed through the openings e25 to measure the total capacitance value of the plurality of capacitor parts C1 to C9 (see FIG. 116D). Based on the measured total capacitance value, the capacitor parts to be disconnected, that is, the fuses to be cut are selected in accordance with the targeted capacitance value of the chip capacitor e101.

From this state, the laser trimming for fusing the fuse units e107 is performed. That is, each fuse unit e107 constituting a fuse selected in accordance with the measurement result of the total capacitance value is irradiated with laser light and the narrow portion e107C (see FIG. 125) of the fuse unit e107 is fused. The corresponding capacitor part is thereby disconnected from the pad region e113B. When the laser light is irradiated on the fuse unit e107, the energy of the laser light is accumulated at a vicinity of the fuse unit e107 by the action of the insulating film e45 that is a cover film and the fuse unit e107 is thereby fused. The capacitance value of the chip capacitor e101 can thereby be set to the targeted capacitance value reliably.

Thereafter, a silicon nitride film is deposited on the cover film (insulating film e45), for example, by the plasma CVD method to form the passivation film e23. In the final form, the cover film is made integral with the passivation film e23 to constitute a portion of the passivation film e23. The passivation film e23 that is formed after the cutting of the fuses enters into openings in the cover film, destroyed at the same time as the fusing of the fuses, to cover and protect the cut surfaces of the fuse units e107. The passivation film e23 thus prevents entry of foreign matter and entry of moisture into the cut locations of the fuse units e107. The chip capacitor e101 of high reliability can thereby be manufactured. The passivation film e23 may be formed to have a film thickness, for example, of approximately 8000 Å as a whole.

Thereafter, the resin film e46 is formed (see FIG. 116E). Thereafter, the openings e25, closed by the resin film e46 and the passivation film e23, are opened (see FIG. 116F) and the pad region e111B and the pad region e113B are exposed from the resin film e46 (resin film e24) via the openings e25. Thereafter, the first connection electrode e3 and the second connection electrode e4 are formed, for example, by the electroless plating method, on the pad region e111B and the pad region e113B, exposed from the resin film e46, in the openings e25 (see FIG. 116G).

Thereafter, as in the case of the chip resistor e1, the individual chips of the chip capacitors e101 can be cut out by grinding the substrate e30 from the rear surface e30B (see FIG. 116H). In the patterning of the upper electrode film e113 using the photolithography process, the electrode film portions e131 to e139 of minute areas can be formed with high precision and the fuse units e107 of even finer pattern can be formed. After the patterning of the upper electrode film e113, the total capacitance value is measured and then the fuses to be cut are determined. By cutting the determined fuses, the chip capacitor e101 that is accurately adjusted to the desired capacitance value can be obtained. That is, with the chip capacitor e101, a plurality of types of capacitance values can be accommodated easily and rapidly by selecting and cutting one or a plurality of the fuses. In other words, chip capacitors e101 of various capacitance values can be realized with a common design by combining the plurality of capacitor parts C1 to C9 that differ in capacitance value.

Although chip components of the fifth reference example (the chip resistor e1 and the chip capacitor e101) have been described above, the fifth reference example may be implemented in yet other modes as well. For example, although with the chip resistor e1 among the preferred embodiments described above, an example where the plurality of resistor circuits include the plurality of resistor circuits having resistance values that form a geometric progression with a common ratio r ($0<r$; $r\neq 1$)=2 was described, the common ratio of the geometric progression may be a numeral other than 2. Also although with the chip capacitor e101, an example where the plurality of capacitor parts include the plurality of capacitor parts having capacitance values that form a geometric progression with a common ratio r ($0<r$; $r\neq1$)=2 was described, the common ratio of the geometric progression may be a numeral other than 2.

Also, although with the chip resistor e1 and the chip capacitor e101, the insulating layer e20 is formed on the top surface of the substrate e2, the insulating layer e20 may be omitted if the substrate e2 is an insulating substrate. Also, although with the chip capacitor e101, the arrangement where just the upper electrode film e113 is divided into the plurality of electrode film portions was described, just the lower electrode film e111 may be divided into a plurality of electrode film portions instead or both the upper electrode film e113 and the lower electrode film e111 may be divided into a plurality of electrode film portions. Further, although with the preferred embodiment, an example where the fuse units are made integral with the upper electrode film or the lower electrode film was described, the fuse units may be formed from a conductor film separate from the upper electrode film and the lower electrode film. Also, although with the chip capacitor e101, the single layer capacitor structure having the upper electrode film e113 and the lower electrode film e111 is formed, another electrode film may be laminated via a capacitance film on the upper electrode film e113 so that a plurality of capacitor structures are laminated.

With the chip capacitor e101, a conductive substrate may be used as the substrate e2, the conductive substrate may be used as a lower electrode, and the capacitance film e112 may be formed in contact with the top surface of the conductive substrate. In this case, one of the external electrodes may be led out from a rear surface of the conductive substrate. Also, in a case of applying the fifth reference example to a chip inductor, the element e5 formed on the substrate e2 in the chip inductor includes an inductor network (inductor element), which includes a plurality of inductor parts (element parts). In this case, the element e5 is disposed in a multilayer wiring formed on the top surface e2A of the substrate e2 and is formed by the wiring film e22. With the present chip inductor, the pattern of combination of the plurality of inductor parts in the inductor network can be set to any pattern by selectively disconnecting one or a plurality of fuses F, and chip inductors of various electrical characteristics of the inductor network can thus be realized with a common design.

Also, in a case of applying the fifth reference example to a chip diode, the element e5 formed on the substrate e2 in the chip diode includes a diode network (diode element), which includes a plurality of diode parts (element parts). The diode element is formed on the substrate e2. With the present chip diode, the pattern of combination of the plurality of diode parts in the diode network can be set to any pattern by selectively disconnecting one or a plurality of fuses F, and chip diodes of various electrical characteristics of the diode network can thus be realized with a common design.

With both the chip inductor and the chip diode, the same actions and effects as those in the case of the chip resistor e1 and the chip capacitor e101 can be exhibited. Also, in the first connection electrode e3 and the second connection electrode e4 described above, the Pd layer e34 interposed between the Ni layer e33 and the Au layer e35 may be omitted. The adhesion of the Ni layer e33 and the Au layer e35 is good and if the pinhole mentioned above does not form in the Au layer e35, the Pd layer e34 may be omitted.

Also, by forming the intersection portions e43 of the opening e42 of the resist pattern e41, used in forming the first groove e44 by etching as described above (see FIG. 117), to have rounded shapes, the corner portions ell at the top surface e2A side of the substrate e2 (corner portions in the rough surface region S) can be formed to have rounded shapes in the finished chip product. Also, the arrangements of Modification Examples 1 to 5 (FIG. 120 to FIG. 124) described for the chip resistor e1 are applicable to any of the chip capacitor e101, the chip inductor, and the chip diode.

FIG. 129 is a perspective view of the outer appearance of a smartphone that is an example of an electronic equipment in which chip components according to the fifth reference example are used. The smartphone e201 is arranged by housing electronic parts in the interior of a housing e202 with a flat rectangular parallelepiped shape. The housing e202 has a pair of rectangular principal surfaces at its front side and rear side, and the pair of principal surfaces are joined by four side surfaces. A display surface of a display panel e203, constituted of a liquid crystal panel or an organic EL panel, etc., is exposed at one of the principal surfaces of the housing e202. The display surface of the display panel e203 constitutes a touch panel and provides an input interface for a user.

The display panel e203 is formed to a rectangular shape that occupies most of one of the principal surfaces of the housing e202. Operation buttons e204 are disposed along one short side of the display panel e203. In the present preferred embodiment, a plurality (three) of the operation buttons e204 are aligned along the short side of the display panel e203. The user can call and execute necessary functions by performing operations of the smartphone e210 by operating the operation buttons e204 and the touch panel.

A speaker e205 is disposed in a vicinity of the other short side of the display panel e203. The speaker e205 provides an earpiece for a telephone function and is also used as an acoustic conversion unit for reproducing music data, etc. On the other hand, close to the operation buttons e204, a microphone e206 is disposed at one of the side surfaces of the housing e202. The microphone e206 provides a mouthpiece for the telephone function and may also be used as a microphone for sound recording.

FIG. 130 is an illustrative plan view of the arrangement of an electronic circuit assembly e210 housed in the interior of the housing e202. The electronic circuit assembly e210 includes a wiring substrate e211 and circuit parts mounted on a mounting surface of the wiring substrate e211. The plurality of circuit parts include a plurality of integrated circuit elements (ICs) e212 to e220 and a plurality of chip components. The plurality of ICs include a transmission processing IC e212, a one-segment TV receiving IC e213, a GPS receiving IC e214, an FM tuner IC e215, a power supply IC e216, a flash memory e217, a microcomputer e218, a power supply IC e219, and a baseband IC e220. The plurality of chip components (corresponding to the chip components of the fifth reference example) include chip inductors e221, e225, and e235, chip resistors e222, e224, and e233, chip capacitors e227, e230, and e234, and chip diodes e228 and e231.

The transmission processing IC e212 has incorporated therein an electronic circuit arranged to generate display control signals for the display panel e203 and receive input signals from the touch panel on a top surface of the display panel e203. For connection with the display panel e203, the transmission processing IC e212 is connected to a flexible wiring e209.

The one-segment TV receiving IC e213 incorporates an electronic circuit that constitutes a receiver for receiving one-segment broadcast (terrestrial digital television broadcast targeted for reception by portable equipment) radio waves. A plurality of the chip inductors e221 and a plurality of the chip resistors e222 are disposed in a vicinity of the one-segment TV receiving IC e213. The one-segment TV receiving IC e213, the chip inductors e221, and the chip resistors e222 constitute a one-segment broadcast receiving circuit e223. The chip inductors e221 and the chip resistors e222 respectively have accurately adjusted inductances and resistances and provide circuit constants of high precision to the one-segment broadcast receiving circuit e223.

The GPS receiving IC e214 incorporates an electronic circuit that receives radio waves from GPS satellites and outputs positional information of the smartphone e201. The FM tuner IC e215 constitutes, together with a plurality of the chip resistors e224 and a plurality of the chip inductors e225 mounted on the wiring substrate e211 in a vicinity thereof, an FM broadcast receiving circuit e226. The chip resistors e224 and the chip inductors e225 respectively have accurately adjusted resistance values and inductances and provide circuit constants of high precision to the FM broadcast receiving circuit e226.

A plurality of the chip capacitors e227 and a plurality of the chip diodes e228 are mounted on the mounting surface of the wiring substrate e211 in a vicinity of the power supply IC e216. Together with the chip capacitors e227 and the chip diodes e228, the power supply IC e216 constitutes a power supply circuit e229. The flash memory e217 is a storage device for recording operating system programs, data generated in the interior of the smartphone e201, and data and programs acquired from the exterior by communication functions, etc.

The microcomputer e218 is a computing processing circuit that incorporates a CPU, a ROM, and a RAM and realizes a plurality of functions of the smartphone e201 by executing various computational processes. More specifically, computational processes for image processing and various application programs are realized by actions of the microcomputer e218. A plurality of the chip capacitors e230 and a plurality of the chip diodes e231 are mounted on the mounting surface of the wiring substrate e211 in a vicinity of the power supply IC e219. Together with the chip capacitors e230 and the chip diodes e231, the power supply IC e219 constitutes a power supply circuit e232.

A plurality of the chip resistors e233, a plurality of the chip capacitors e234, and a plurality of the chip inductors e235 are mounted on the mounting surface of the wiring substrate e211 in a vicinity of the baseband IC e220. Together with the chip resistors e233, the chip capacitors e234, and the chip inductors e235, the baseband IC e220 constitutes a baseband communication circuit e236. The baseband communication circuit e236 provides communication functions for telephone communication and data communication.

With the above arrangement, electric power that is appropriately adjusted by the power supply circuits e229 and e232 is supplied to the transmission processing IC e212, the GPS receiving IC e214, the one-segment broadcast receiving circuit e223, the FM broadcast receiving circuit e226, the baseband communication circuit e236, the flash memory e217, and the microcomputer e218. The microcomputer e218 performs computational processes in response to input signals input via the transmission processing IC e212 and makes the display control signals be output from the transmission processing IC e212 to the display panel e203 to make the display panel e203 perform various displays.

When receiving of a one-segment broadcast is commanded by operation of the touch panel or the operation buttons e204, the one-segment broadcast is received by actions of the one-segment broadcast receiving circuit e223. Computational processes for outputting the received images to the display panel e203 and making the received audio signals be acoustically converted by the speaker e205 are executed by the microcomputer e218. Also, when positional information of the smartphone e201 is required, the microcomputer e218 acquires the positional information output by the GPS receiving IC e214 and executes computational processes using the positional information.

Further, when an FM broadcast receiving command is input by operation of the touch panel or the operation buttons e204, the microcomputer e218 starts up the FM broadcast receiving circuit e226 and executes computational processes for outputting the received audio signals from the speaker e205. The flash memory e217 is used for storing data acquired by communication and storing data prepared by computations by the microcomputer e218 and inputs from the touch panel. The microcomputer e218 writes data into the flash memory e217 or reads data from the flash memory e217 as necessary.

The telephone communication or data communication functions are realized by the baseband communication circuit e236. The microcomputer e218 controls the baseband communication circuit e236 to perform processes for sending and receiving audio signals or data.

Invention According to a Sixth Reference Example

(1) Features of the Invention According to the Sixth Reference Example

For example, the features of the invention according to the sixth reference example are the following F1 to F15.

(F1) A chip component including an element formed on a substrate, an external connection electrode formed on the substrate to provide external connection for the element, and a protective resin film formed on the substrate, covering the element, and exposing the external connection electrode, and where a height of a top surface of the protective resin film to a top surface of the substrate is not less than a height of the external connection electrode from the top surface of the substrate.

With this arrangement, even when the external connection electrode side of the chip component is pressed against something in mounting the chip component or in performing a stress test on the chip component, the stress applied to the chip component in the process is received not just by the external connection electrode but also by the protective resin film. The area of the portion of the chip component that receives the stress can thus be increased to enable the stress applied to the chip component to be dispersed. Concentration of stress on the chip component can thereby be suppressed.

(F2) The chip component according to F1, including a pair of the external connection electrodes and where the protective resin film is disposed between the pair of external connection electrodes and has a flat stress dispersing surface.

With this arrangement, the stress applied to the chip component can be dispersed more effectively by the stress dispersing surface of the protective resin film. The concentration of stress on the chip component can thereby be suppressed further.

(F3) The chip component according to F1 or F2, where the element includes a plurality of element parts and the chip component further includes a plurality of fuses provided on the substrate and disconnectably connecting the plurality of element parts to the external connection electrode.

With this arrangement, a combination pattern of the plurality of element parts in the element can be set to any pattern by selectively cutting one or a plurality of the fuses, thereby enabling chip components that are diverse in the electrical characteristics of the element to be realized with a common design.

(F4) The chip component according to F3, where the element parts are resistor bodies and the chip component is a chip resistor.

With this arrangement, the chip component (chip resistor) can be made to accommodate a plurality of types of resistance values easily and rapidly by selecting and cutting one or a plurality of the fuses. In other words, chip resistors of various resistance values can be realized with a common design by combining a plurality of resistor bodies that differ in resistance value.

(F5) The chip component according to F3, where the element parts are capacitor parts and the chip component is a chip capacitor.

With this arrangement, the chip component (chip capacitor) can be made to accommodate a plurality of types of capacitance values easily and rapidly by selecting and cutting one or a plurality of the fuses. In other words, chip capacitors of various capacitance values can be realized with a common design by combining a plurality of capacitor parts that differ in capacitance value.

(F6) The chip component according to F3, where the element parts are inductor parts and the chip component is a chip inductor.

With this arrangement, the combination pattern of the plurality of inductor parts in the chip component (chip inductor) can be set to any pattern by selecting and cutting one or a plurality of the fuses, thereby enabling chip inductors of various electrical characteristics to be realized with a common design.

(F7) The chip component according to F3, where the element parts are diode parts and the chip component is a chip diode.

With this arrangement, the combination pattern of the plurality of diode parts in the chip component (chip diode) can be set to any pattern by selecting and cutting one or a plurality of the fuses, thereby enabling chip diodes of various electrical characteristics to be realized with a common design.

(F8) The protective resin film is preferably made of polyimide.

(F9) The chip component according to any one of F1 to F8, where an opening, which penetrates through the protective resin film in a thickness direction and in which the external connection electrode is disposed, is formed in the protective resin film.

In this case, with the protective resin film, the external connection electrode can be exposed through the opening.

(F10) The opening may be widened as the top surface of the protective resin film is approached.

(F11) An end portion at the top surface of the external connection electrode is curved toward the top surface side of the substrate.

(F12) The chip component according to any one of F1 to F11, where the external connection electrode includes an Ni layer and an Au layer and the Au layer is exposed at a topmost surface.

In this case, the top surface of the Ni layer is covered by the Au layer of the external connection electrode and oxidation of the Ni layer can thus be prevented.

(F13) The chip component according to F12, where the external connection electrode further includes a Pd layer interposed between the Ni layer and the Au layer. In this case, even if a penetrating hole (pinhole) forms in the Au layer of the external connection electrode due to thinning of the Au layer, the Pd layer interposed between the Ni layer and the Au layer closes the penetrating hole and the Ni layer can thus be prevented from being exposed to the exterior through the penetrating hole and becoming oxidized.

(F14) A passivation film disposed between the substrate and the protective resin film and covering the top surface of the substrate may further be included.

(F15) The passivation film may cover a side surface of the substrate.

(2) Preferred Embodiments of the Invention Related to the Sixth Reference Example Preferred embodiments of the sixth reference example shall now be described in detail with reference to the attached drawings. The symbols indicated in FIG. 131 to FIG. 154 are effective only for these drawings and, even if used in other preferred embodiments, do not indicate the same components as the symbols in the other preferred embodiments.

FIG. 131(*a*) is a schematic perspective view for describing the arrangement of a chip resistor according to a preferred embodiment of the sixth reference example, and FIG. 131(*b*) is a schematic sectional view of a state where the chip resistor is mounted on amounting substrate. The chip resistor f1 is a minute chip component and, as shown in FIG. 131(*a*), has a rectangular parallelepiped shape. The planar shape of the chip resistor f1 is a rectangular shape. In regard to the dimensions of the chip resistor f1, for example, the length L (length of a long side f81) is approximately 0.6 mm, the width W (length of a short side f82) is approximately 0.3 mm, and the thickness T is approximately 0.2 mm.

The chip resistor f1 is obtained by forming multiple chip resistors f1 in a lattice on a substrate, then forming a groove in the substrate, and thereafter performing rear surface grinding (splitting of the substrate at the groove) to perform separation into the individual chip resistors f1. The chip resistor f1 mainly includes a substrate f2 that constitutes the main body of the chip resistor f1, a first connection electrode f3 and a second connection electrode f4 that are to be a pair of external connection electrodes, and an element f5 connected to the exterior by the first connection electrode f3 and the second connection electrode f4.

The substrate f2 has a substantially rectangular parallelepiped chip shape. With the substrate f2, the upper surface in FIG. 131(*a*) is a top surface f2A. The top surface f2A is the surface (element forming surface) of the substrate f2 on which the element f5 is formed and has a substantially rectangular shape. The surface at the opposite side of the top surface f2A in the thickness direction of the substrate f2 is a rear surface f2B. The top surface f2A and the rear surface f2B are substantially the same in shape and are parallel to each other. However, the rear surface f2B is larger than the top surface f2A. Therefore in a plan view of looking from a direction orthogonal to the top surface f2A, the top surface f2A lies within the inner side of the rear surface f2B. A rectangular end edge defined by the pair of long sides f81 and short sides f82 at the top surface f2A shall be referred to as an edge portion f85 and a rectangular end edge defined by the pair of long sides f81 and short sides f82 at the rear surface f2B shall be referred to as an edge portion f90.

As surfaces besides the top surface f2A and the rear surface f2B, the substrate f2 has a plurality of side surfaces (a side surface f2C, a side surface f2D, a side surface f2E, and a side surface f2F). The plurality of side surfaces extend so as to intersect (specifically, so as to be orthogonal to) each of the top surface f2A and the rear surface f2B and join the top surface f2A and the rear surface f2B. The side surface f2C is constructed between the short sides f82 at one side in the long direction (the front left side in FIG. 131(*a*)) of the top surface f2A and the rear surface f2B, and the side surface f2D is constructed between the short sides f82 at the other side in the long direction (the inner right side in FIG. 131(*a*)) of the top surface f2A and the rear surface f2B. The side surfaces f2C and f2D are the respective end surfaces of the substrate f2 in the long direction. The side surface f2E is constructed between the long sides f81 at one side in the short direction (the inner left side in FIG. 131(*a*)) of the top surface f2A and the rear surface f2B, and the side surface f2F is constructed between the long sides f81 at the other side in the short direction (the front right side in FIG. 131(*a*)) of the top surface f2A and the rear surface f2B. The side surfaces f2E and f2F are the respective end surfaces of the substrate f2 in the short direction. Each of the side surface f2C and the side surface f2D intersects (specifically, is orthogonal to) each of the side surface f2E and the side surface f2F.

By the above, mutually adjacent surfaces among the top surface f2A to side surface f2F form a substantially right angle. Each of the side surface f2C, side surface f2D, side surface f2E, and side surface f2F (hereinafter referred to as "each side surface") has a rough surface region S at the top surface f2A side and a striped pattern region P at the rear surface f2B side. In the rough surface region S, each side surface is a grainy, rough surface with an irregular pattern as indicated by the fine dots in FIG. 131(*a*). In the striped pattern region P, numerous stripes (saw marks) V, which constitute grinding marks made by a dicing saw to be described below, are left on each side surface in a regular pattern. The rough surface region S and the striped pattern region P are present on each side surface due to a process for manufacturing the chip resistor f1 and details shall be described later.

At each side surface, the rough surface region S occupies substantially half of the side surface at the top surface f2A side, and the striped pattern region P occupies substantially half of the side surface at the rear surface f2B side. At each side surface, the striped pattern region P protrudes further to the exterior of the substrate f2 (outer side of the substrate f2 in a plan view) than the rough surface region S, and a step N is thereby formed between the rough surface region S and the striped pattern region P. The step N connects a lower end edge of the rough surface region S with an upper end edge of the striped pattern region P and extends parallel to the top surface f2A and the rear surface f2B. The steps N of the respective side surfaces are connected and, as a whole, form a rectangular frame shape positioned between the edge portion f85 of the top surface f2A and the edge portion f90 of the rear surface f2B in a plan view.

The rear surface f2B is larger than the top surface f2A as mentioned above because such a step N is provided at each side surface. With the substrate f2, the respective entireties of the top surface f2A and the side surfaces f2C to f2F (both the rough surface region S and the striped pattern region P at each side surface) are covered by a passivation film f23. Therefore to be exact, the respective entireties of the top surface f2A and the side surfaces f2C to f2F in FIG. 131(*a*) are positioned at the inner sides (rear sides) of the passivation film f23 and are not exposed to the exterior. Here, in the passivation film f23, a portion covering the top surface f2A shall be referred to as a "top surface covering portion f23A" and a portion covering each of the side surfaces f2C to f2F shall be referred to as a "side surface covering portion f23B."

The chip resistor f1 further has a resin film f24. The resin film f24 is a protective film (protective resin film) that is formed on the passivation film f23 and covers at least the entirety of the top surface f2A. The passivation film f23 and the resin film f24 shall be described in detail later. The first connection electrode f3 and the second connection electrode f4 are formed on a region of the top surface f2A of the substrate f2 that is positioned further inward than the edge portion f85 and are partially exposed from the resin film f24 on the top surface f2A. In other words, the resin film f24 covers the top surface f2A (to be exact, the passivation film f23 on the top surface f2A) so as to expose the first connection electrode f3 and the second connection electrode f4. Each of the first connection electrode f3 and the second connection electrode f4 is arranged by laminating, for example, Ni (nickel), Pd (palladium), and Au (gold) in that order on the top surface f2A. The first connection electrode f3 and the second connection electrode f4 are disposed across an interval in the long direction of the top surface f2A and are long in the short direction of the top surface f2A. In FIG. 131(*a*), the first connection electrode f3 is provided at a position of the top surface f2A close to the side surface f2C and the second connection electrode f4 is provided at a position close to the side surface f2D.

The element f5 is an element network, is formed on the substrate f2 (top surface f2A), specifically in a region of the top surface f2A of the substrate f2 between the first connection electrode f3 and the second connection electrode f4, and is covered from above by the passivation film f23 (top surface covering portion f23A) and the resin film f24. The element f5 of the present preferred embodiment is a resistor f56. The resistor f56 is arranged by a resistor network in which a plurality of (unit) resistor bodies R, having an equal resistance value, are arrayed in a matrix on the top surface f2A. Each resistor body R is made of TiN (titanium nitride) or TiON (titanium oxide nitride) or TiSiON. The element f5 is electrically connected to wiring films f22, to be described below, and is electrically connected to the first connection electrode f3 and the second connection electrode f4 via the wiring films f22.

As shown in FIG. 131(*b*), the first connection electrode f3 and the second connection electrode f4 are made to face amounting substrate f9 and connected electrically and mechanically by solders f13 to a pair of connection terminals f88 on the mounting substrate f9. The chip resistor f1 can thereby be mounted on (flip-chip connected to) the mounting substrate f9. The first connection electrode f3 and the second connection electrode f4 that function as the external connection electrodes are preferably formed of gold (Au) or has goldplating applied on the top surfaces thereof to improve solder wettability and improve reliability.

FIG. 132 is a plan view of a chip resistor showing the positional relationship of a first connection electrode, a second connection electrode, and an element and showing the arrangement (layout pattern) in a plan view of the element. With reference to FIG. 132, the element f5, which is a resistor network, has a total of 352 resistor bodies R arranged from 8 resistor bodies R arrayed along the row direction (length direction of the substrate f2) and 44 resistor bodies R arrayed along the column direction (width direction of the substrate f2). The resistor bodies R are the plurality of element parts that constitute the resistor network of the element f5.

The multiple resistor bodies R are electrically connected in groups of predetermined numbers of 1 to 64 each to form a plurality of types of resistor circuits. The plurality of types of resistor circuits thus formed are connected in predetermined modes by conductor films D (wiring films formed of a conductor). Further, on the top surface f2A of the substrate f2, a plurality of fuses (fuses) F are provided that are capable of being cut (fused) to electrically incorporate resistor circuits into the element f5 or electrically separate resistor circuits from the element f5. The plurality of fuses F and the conductor films D are arrayed along the inner side of the second connection electrode f3 so that the positioning regions thereof are rectilinear. More specifically, the plurality of fuses F and the conductor films D are disposed adjacently and the direction of alignment thereof is rectilinear. The plurality of fuses F connect each of the plurality of types of resistor circuits (each of the pluralities of resistor bodies R of the respective resistor circuits) to the second connection electrode f3 in a manner enabling cutting (enabling disconnection).

FIG. 133A is a partially enlarged plan view of the element shown in FIG. 132. FIG. 133B is a vertical sectional view in the length direction taken along B-B of FIG. 133A for describing the arrangement of resistor bodies in the element. FIG. 133C is a vertical sectional view in the width direction taken along C-C of FIG. 133A for describing the arrangement of the resistor bodies in the element. The arrangement of the resistor bodies R shall now be described with reference to FIG. 133A, FIG. 133B, and FIG. 133C.

Besides the wiring films f22, the passivation film f23, and the resin film f24, the chip resistor f1 further includes an insulating layer f20 and a resistor body film f21 (see FIG. 133B and FIG. 133C). The insulating layer f20, the resistor body film f21, the wiring films f22, the passivation film f23, and the resin film f24 are formed on the substrate f2 (top surface f2A). The insulating layer f20 is made of $SiO_2$ (silicon oxide). The insulating layer f20 covers the entirety of the top surface f2A of the substrate f2. The thickness of the insulating layer f20 is approximately 10000 Å.

The resistor body film f21 is formed on the insulating layer f20. The resistor body film f21 is formed of TiN, TiON, or TiSiON. The thickness of the resistor body film f21 is approximately 2000 Å. The resistor body film f21 is arranged as a plurality of resistor body films (hereinafter referred to as "resistor body film lines f21A") extending parallel and rectilinearly between the first connection electrode f3 and the second connection electrode f4, and there are cases where a resistor body film line f21A is cut at predetermined positions in the line direction (see FIG. 133A).

The wiring films f22 are laminated on the resistor body film lines f21A. The wiring films f22 are made of Al (aluminum) or an alloy (AlCu alloy) of aluminum and Cu (copper). The thickness of each wiring film f22 is approximately 8000 Å. The wiring films f22 are laminated on the resistor body film lines f21A at fixed intervals R in the line direction and are in contact with the resistor body film lines f21A.

The electrical features of the resistor body film lines f21A and the wiring films f22 of the present arrangement are indicated by circuit symbols in FIG. 134. That is, as shown in FIG. 134(*a*), each of the resistor body film line f21A portions in regions of the predetermined interval IR forms a single resistor body R with a fixed resistance value r. In each region at which the wiring film f22 is laminated, the wiring film f22 electrically connects mutually adjacent resistor bodies R so that the resistor body film line f21A is short-circuited by the wiring film f22. A resistor circuit, made up of serial connections of resistor bodies R of resistance r, is thus formed as shown in FIG. 134(*b*).

Also, adjacent resistor body film lines f21A are connected to each other by the resistor body film f21 and wiring films f22, and the resistor network of the element f5 shown in FIG. 133A thus constitutes the resistor circuits (made up of the unit resistors of the resistor bodies R) shown in FIG. 134(*c*). The resistor body film f21 and the wiring films f22 thus constitute the resistor bodies R and the resistor circuits (that is, the element 5). Each resistor body R includes a resistor body film line f21A (resistor body film f21) and a plurality of wiring films f22 laminated at the fixed interval in the line direction on the resistor body film line f21A, and the resistor body film line f21A of the fixed interval IR portion on which the wiring film f22 is not laminated constitutes a single resistor body R. The resistor body film lines f21A at the portions constituting the resistor bodies R are all equal in shape and size. The multiple resistor bodies R arrayed in a matrix on the substrate f2 thus have an equal resistance value.

Also, the wiring films f22 laminated on the resistor body film lines f21A form the resistor bodies R and also serve the role of conductor films D that connect a plurality of resistor bodies R to arrange a resistor circuit (see FIG. 132). FIG. 135 (*a*) is a partially enlarged plan view of a region including the fuses drawn by enlarging a portion of the plan view of the chip resistor shown in FIG. 132, and FIG. 135 (*b*) is a structural sectional view taken along B-B in FIG. 135 (*a*).

As shown in FIGS. 135 (*a*) and 135 (*b*), the fuses F and the conductor films D are also formed by the wiring films f22, which are laminated on the resistor body film f21 that forms the resistor bodies R. That is, the fuses F and the conductor films D are formed of Al or AlCu alloy, which is the same metal material as that of the wiring films f22, at the same layer as the wiring films f22, which are laminated on the resistor body film lines f21A that form the resistor bodies R. As mentioned above, the wiring films f22 are also used as the conductor films D that connect a plurality of resistor bodies R to form a resistor circuit.

That is, at the same layer laminated on the resistor body film f21, the wiring films for forming the resistor bodies R, the fuses F, the conductor films D, and the wiring films for connecting the element f5 to the first connection electrode f3 and the second connection electrode f4 are formed as the wiring films f22 using the same metal material (Al or AlCu alloy). The fuses F are differed (distinguished) from the wiring films f22 because the fuses F are formed narrowly to enable easy cutting and because the fuses F are disposed so that other circuit components are not present in the surroundings of the fuses F.

Here, a region of the wiring films f22 in which the fuses F are disposed shall be referred to as a trimming region X (see FIG. 132 and FIG. 135 (*a*)). The trimming region X is a rectilinear region along the inner side of the second connection electrode f3 and not only the fuses F but also the conductor films D are disposed in the trimming region X. Also, resistor body film f21 is formed below the wiring films f22 in the trimming region X (see FIG. 135 (*b*)). The fuses F are wirings that are greater in interwiring distance (are more separated from the surroundings) than portions of the wiring films f22 besides the trimming region X.

The fuse F may refer not only to a portion of the wiring films f22 but may also refer to an assembly (fuse element)

of a portion of a resistor body R (resistor body film f21) and a portion of the wiring film f22 on the resistor body film f21. Also, although only a case where the same layer is used for the fuses F as that used for the conductor films D has been described, the conductor films D may have another conductor film laminated further thereon to decrease the resistance value of the conductor films D as a whole. Even in this case, the fusing property of the fuses F is not degraded as long as a conductor film is not laminated on the fuses F.

FIG. 136 is an electric circuit diagram of the element according to the preferred embodiment of the sixth reference example. Referring to FIG. 136, the element f5 is arranged by serially connecting a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16, and a resistor circuit R/32 in that order from the first connection electrode f3. Each of the reference resistor circuit R8 and resistor circuits R64 to R2 is arranged by serially connecting the same number of resistor bodies R as the number at the end of its symbol ("64" in the case of R64). The resistor circuit R1 is arranged from a single resistor body R. Each of the resistor circuits R/2 to R/32 is arranged by connecting the same number of resistor bodies R as the number at the end of its symbol ("32" in the case of R/32) in parallel. The meaning of the number at the end of the symbol of the resistor circuit is the same in FIG. 137 and FIG. 138 to be described below.

One fuse F is connected in parallel to each of the resistor circuit R64 to resistor circuit R32, besides the reference resistor circuit R8. The fuses F are mutually connected in series directly or via the conductor films D (see FIG. 135 (*a*)). In a state where none of the fuses F is fused as shown in FIG. 136, the element f5 constitutes a resistor circuit of the reference resistor circuit R8 formed by the serial connection of the 8 resistor bodies R provided between the first connection electrode f3 and the second connection electrode f4. For example, if the resistance value r of a single resistor body R is r=8Ω, the chip resistor f1 is arranged with the first connection electrode f3 and the second connection electrode f4 being connected by the resistor circuit (the reference resistor circuit R8) of 8r=64Ω.

Also in the state where none of the fuses F is fused, the plurality of types of resistor circuits besides the reference resistor circuit R8 are put in short-circuited states. That is, although 13 resistor circuits R64 to R/32 of 12 types are connected in series to the reference resistor circuit R8, each resistor circuit is short-circuited by the fuse F that is connected in parallel and thus electrically, the respective resistor circuits are not incorporated in the element f5.

With the chip resistor f1 according to the present preferred embodiment, a fuse F is selectively fused, for example, by laser light in accordance with the required resistance value. The resistor circuit with which the fuse F connected in parallel is fused is thereby incorporated into the element f5. The overall resistance value of the element f5 can thus be set to the resistance value resulting from serially connecting and incorporating the resistor circuits corresponding to the fused fuses F.

In particular, the plurality of types of resistor circuits include the plurality of types of serial resistor circuits, with which the resistor bodies R having the equal resistance value are connected in series with the number of resistor bodies R being increased in geometric progression with a geometric ratio of 2 as 1, 2, 4, 8, 16, 32, . . . , and the plurality of types of parallel resistor circuits, with which the resistor bodies R having the equal resistance value are connected in parallel with the number of resistor bodies R being increased in geometric progression with a geometric ratio of 2 as 2, 4, 8, 16, . . . . Therefore by selectively fusing the fuses F (including the fuse elements), the resistance value of the element f5 (resistor f56) as a whole can be adjusted finely and digitally to an arbitrary resistance value to enable a resistance of a desired value to be formed in the chip resistor f1.

FIG. 137 is an electric circuit diagram of an element according to another preferred embodiment of the sixth reference example. Instead of arranging the element f5 by serially connecting the reference resistor circuit R8 and the resistor circuit R64 to the resistor circuit R/32 as shown in FIG. 136, the element f5 may be arranged as shown in FIG. 137. Specifically, the element f5 may be arranged, between the first connection electrode f3 and the second connection electrode f4, as a serial connection circuit of the reference resistor circuit R/16 and the parallel connection circuit of the 12 types of resistor circuits R/16, R/8, R/4, R/2, R1, R2, R4, R8, R16, R32, R64, and R128.

In this case, a fuse F is serially connected to each of the 12 types of resistor circuits besides the reference resistor circuit R/16. In a state where none of the fuses F is fused, the respective resistor circuits are electrically incorporated in the element f5. By selectively fusing a fuse F, for example, by laser light in accordance with the required resistance value, the resistor circuit corresponding to the fused fuse F (the resistor circuit connected in series to the fuse F) is electrically separated from the element f5 and the resistance value of the chip resistor f1 as a whole can thereby be adjusted.

FIG. 138 is an electric circuit diagram of an element according to yet another preferred embodiment of the sixth reference example. A feature of the element f5 shown in FIG. 138 is that it has the circuit arrangement where a serial connection of a plurality of types of resistor circuits and a parallel connection of a plurality of types of resistor circuits are connected in series. As in a previous preferred embodiment, with the plurality of types of resistor circuits connected in series, a fuse F is connected in parallel to each resistor circuit and all of the plurality of types of resistor circuits that are connected in series are put in short-circuited states by the fuses F. Therefore, when a fuse F is fused, the resistor circuit that was short-circuited by the fused fuse F is electrically incorporated into the element f5.

On the other hand, a fuse F is connected in series to each of the plurality of types of resistor circuits that are connected in parallel. Therefore by fusing a fuse F, the resistor circuit connected in series to the fused fuse F can be electrically disconnected from the parallel connection of resistor circuits. With this arrangement, for example, by forming a low resistance of not more than 1 kΩ at the parallel connection side and forming a resistor circuit of not less than 1 kΩ at the serial connection side, resistor circuits of a wide range, from a low resistance of several Ω to a high resistance of several MΩ, can be formed using the resistor networks arranged with the same basic design. That is, with the chip resistor f1, a plurality of types of resistance values can be accommodated easily and rapidly by selecting and cutting one or a plurality of the fuses F. In other words, chip resistors f1 of various resistance values can be realized with a common design by combining a plurality of resistor bodies R that differ in resistance value.

With the chip resistor f1, the connection states of the plurality of resistor bodies R (resistor circuits) in the trimming region X can be changed as described above. FIG. 139 is a schematic sectional view of the chip resistor. The chip resistor f1 shall now be described in further detail with reference to FIG. 139. For the sake of description, the element f5 is illustrated in a simplified form and hatching is applied to respective elements besides the substrate f2 in FIG. 139.

Here, the passivation film f23 and the resin film f24 shall be described. The passivation film f23 is made, for example, from SiN (silicon nitride) and the thickness thereof is 1000 Å to 5000 Å (approximately 3000 Å here). As mentioned above, the passivation film f23 includes the top surface covering portion f23A provided across the entirety of the top surface f2A and the side surface covering portion f23B provided across the respective entireties of the side surfaces f2C to f2F. The top surface covering portion f23A covers the resistor body film f21 and the respective wiring films f22 on the resistor body film f21 (that is, the element f5) from the top surface (upper side in FIG. 139) and covers the upper surfaces of the respective resistor bodies R in the element f5. The top surface covering portion f23A also covers the wiring films f22 in the trimming region X as well (see FIG. 135 (*b*)). Also, the top surface covering portion f23A contacts the element f5 (the wiring films f22 and the resistor body film f21) and also contacts the insulating layer f20 in regions besides the resistor body film f21. The top surface covering portion f23A thus functions as a protective film that covers the entirety of the top surface f2A and protects the element f5 and the insulating layer f20. Also at the top surface f2A, the top surface covering portion f23A prevents short-circuiting across the resistor bodies R (short-circuiting across adjacent resistor body film lines f21A) at portions besides the wiring films f22.

On the other hand, the side surface covering portion f23B provided on each of the side surfaces f2C to f2F functions as a protective layer that protects each of the side surfaces f2C to f2F. At each of the side surfaces f2C to f2F, the side surface covering portion f23B covers the entireties of the rough surface region S and the striped pattern region P and also completely covers the step N between the rough surface region S and the striped pattern region P. Also, the boundary of the respective side surfaces f2C to f2F and the top surface f2A is the edge portion f85, and the passivation film f23 also covers this boundary (the edge portion f85). In the passivation film f23, the portion covering the edge portion f85 (portion overlapping the edge portion f85) shall be referred to as the "end portion f23C."

The resin film f24, together with the passivation film f23, protects the top surface f2A of the chip resistor f1 and is made of a resin, such as polyimide, etc. The resin film f2 is formed on the top surface covering portion f23A (including the end portion f23C) of the passivation film f23 so as to cover the entireties of regions of the top surface f2A besides the first connection electrode f3 and the second connection electrode f4 in a plan view. The resin film f24 covers the entirety of the top surface of the top surface covering portion f23A on the top surface f2A (including the element f5 and the fuses F covered by the top surface covering portion f23A). On the other hand, the resin film f24 does not cover the side surfaces f2C to f2F. An edge f24A at the outer periphery of the resin film f24 is thus matched in a plan view with the side surface covering portion f23B and a side end surface f24B of the resin film f24 at the edge 24A is flush with the side surface covering portion f23B (to be exact, the side surface covering portion f23B in the rough surface region S of each side surface) and extends in the thickness direction of the substrate f2. A top surface f24C of the resin film f24 extends flatly so as to be parallel to the top surface f2A of the substrate f2. When a stress is applied to the top surface f2A side of the substrate f2 in the chip resistor f1, the top surface f24C of the resin film f24 (in particular, the top surface f24C in the region between the first connection electrode f3 and the second connection electrode f4) functions as a stress dispersing surface and disperses the stress.

Also in the resin film f24, openings f25 are formed, one at each of two positions that are separated in a plan view. Each opening f25 is a penetrating hole penetrating continuously through each of the resin film f24 and the passivation film f23 (top surface covering portion f23A) in the thickness direction. The openings f25 are thus formed not only in the resin film f24 but also in the passivation film f23. Portions of wiring films f22 are exposed through the respective openings f25. The portions of the wiring films f22 exposed through the respective openings f25 are pad regions f22A (pads) for external connection. In the top surface covering portion f23A, each opening f25 extends in the thickness direction of the top surface covering portion f23A (same as the thickness direction of the substrate f2) and gradually widens in the long direction of the substrate f2 (the right/left direction in FIG. 139) as the top surface f24C of the resin film f24 is approached from the top surface covering portion f23A side. Defining surfaces f24D that define the opening f25 in the resin film f24 are thus inclining surfaces that intersect the thickness direction of the substrate f2. A pair of defining surfaces f24D defining each opening f25 in the long direction are present at portions of the resin film f24 bordering the opening f25, and the interval between the defining surfaces f24D widens gradually as the top surface f24C of the resin film f24 is approached from the top surface covering portion f23A side. Also, a pair of defining surfaces f24D defining each opening f25 in the short direction in the resin film f2 are present at portions of the resin film f24 bordering the opening f25 (not shown in FIG. 139), and the interval between these defining surfaces f24D may also widen gradually as the top surface f24C of the resin film f24 is approached from the top surface covering portion f23A side.

Of the two openings f25, one opening f25 is completely filled by the first connection electrode f3 and the other opening f25 is completely filled by the second connection electrode f4. Each of the first connection electrode f3 and the second connection electrode f4 widens toward the top surface f24C of the resin film f24 in accordance with the opening f25 that widens toward the top surface f24C of the resin film f24. A vertical section of each of the first connection electrode f3 and the second connection electrode f4 (the section surface resulting from sectioning in a plane extending in the long direction and the thickness direction of the substrate f2) thus has a trapezoidal shape having an upper base at the top surface f2A side of the substrate f2 and a lower base at the top surface f24C side of the resin film f24. Also, the respective lower bases are the respective top surfaces f3A and f4A of the first connection electrode f3 and the second connection electrode f4, and at each of the top surfaces f3A and f4A, an end portion at the opening f25 side is curved toward the top surface f2A side of the substrate f2. If the opening f25 is not widened toward the top surface f24C of the resin film f24 (if the defining surfaces f24D defining the opening f25 extend in the thickness direction of the substrate f2), each of the top surfaces f3A and f4A becomes a flat surface extending along the top surface f2A of the substrate f2 in the entire region including the end portion at the opening f25 side.

Also, as mentioned above, each of the first connection electrode f3 and the second connection electrode f4 is arranged by laminating Ni, Pd, and Au in that order on the top surface f2A and thus has an Ni layer f33, a Pd layer f34, and an Au layer f35 in that order from the top surface f2A side. Therefore in each of the first connection electrode f3 and the second connection electrode f4, the Pd layer f34 is interposed between the Ni layer f33 and the Au layer f35. In each of the first connection electrode f3 and the second connection electrode f4, the Ni layer f33 takes up most of each connection electrode and the Pd layer f34 and the Au layer f35 are formed significantly thinner than the Ni layer f33. The Ni layer f33 serves a role of relaying between the Al of the wiring film f22 in the pad region f22A in each opening f25 and the solder f13 when the chip resistor f1 is mounted on the mounting substrate f9 (see FIG. 131(*b*)).

With the first connection electrode f3 and the second connection electrode f4, a top surface of the Ni layer f33 is covered by the Au layer f35 via the Pd layer f34 and the Ni layer f33 can thus be prevented from becoming oxidized. Also, even if a penetrating hole (pinhole) forms in the Au layer f35 due to thinning of the Au layer f35, the Pd layer f34 interposed between the Ni layer f33 and the Au layer f35 closes the penetrating hole and the Ni layer f33 can thus be prevented from being exposed to the exterior through the penetrating hole and becoming oxidized.

With each of the first connection electrode f3 and the second connection electrode f4, the Au layer f35 is exposed at the topmost surface as the top surface f3A or f4A and faces the exterior through the opening f25 at the top surface f24A of the resin film f24. The first connection electrode f3 is electrically connected, via one opening f25, to the wiring film f22 in the pad region f22A in the opening f25. The second connection electrode f4 is electrically connected, via the other opening f25, to the wiring film f22 in the pad region f22A in the opening f25. With each of the first connection electrode f3 and the second connection electrode f4, the Ni layer f33 is connected to the pad region f22A. Each of the first connection electrode f3 and the second connection electrode f4 is thereby electrically connected to the element f5. Here, the wiring films f22 form wirings that are respectively connected to groups of resistor bodies R (resistor f56) and the first connection electrode f3 and the second connection electrode f4.

The resin film f24 and the passivation film f23, in which the openings f25 are formed, thus cover the top surface f2A in a state where the first connection electrode f3 and the second connection electrode f4 are exposed through the openings f25. Electrical connection between the chip resistor f1 and the mounting substrate f9 can thus be achieved via the first connection electrode f3 and the second connection electrode f4 exposed in the openings f25 in the top surface f24C of the resin film f24 (see FIG. 131(*b*)).

Here, the thickness of the resin film f24, that is, a height H from the top surface f2A of the substrate f2 to the top surface f24*c* of the resin film f24 is not less than a height J of each of the first connection electrode f3 and the second connection electrode f4 (from the top surface f2A). As a first preferred embodiment, in FIG. 139, the height H and the height J are equal so that the top surface f24C of the resin film f24 is flush with each of the respective top surfaces f3A and f4A of the first connection electrode f3 and the second connection electrode f4.

FIG. 140A to FIG. 140H are illustrative sectional views of a method for manufacturing the chip resistor shown in FIG. 139. First, as shown in FIG. 140A, a substrate f30, which is to be the base of the substrate f2, is prepared. Here, a top surface f30A of the substrate f30 is the top surface f2A of the substrate f2 and a rear surface f30B of the substrate f30 is the rear surface f2B of the substrate f2.

The top surface f30A of the substrate f30 is then thermally oxidized to form the insulating layer f20, made of $SiO_2$, etc., on the top surface f30A, and the element f5 (the resistor bodies R and the wiring films f22 connected to the resistor bodies R) is formed on the insulating layer f20. Specifically, first, the resistor body film f21 of TiN, TiON, or TiSiON is formed by sputtering on the entire surface of the insulating layer f20 and further, the wiring film f22 of aluminum (Al) is laminated on the resistor body film f21 so as to contact the resistor body film f21. Thereafter, a photolithography process is used and, for example, RIE (reactive ion etching) or other form of dry etching is performed to selectively remove and pattern the resistor body film f21 and the wiring film f22 to obtain the arrangement where, as shown in FIG. 133A, the resistor body film lines f21A of fixed width, at which the resistor body film f21 is laminated, are arrayed at fixed intervals in the column direction in a plan view. In this process, regions in which the resistor body film lines f21A and the wiring film f22 are cut at portions are also formed and the fuses F and the conductor films D are formed in the trimming region X (see FIG. 132). The wiring film f22 laminated on the resistor body film lines f21A is then removed selectively and patterned, for example, by wet etching. The element f5 of the arrangement where the wiring films f22 are laminated at the fixed intervals R on the resistor body film lines f21A (in other words, the plurality of resistor bodies R) is consequently obtained. The plurality of resistor bodies R and the fuses F can thus be formed simply in a batch by just laminating the wiring film f22 on the resistor body film f21 and then patterning the resistor body film f21 and the wiring film f22. The resistance value of the entirety of the element 5 may be measured to check whether or not the resistor body film f21 and the wiring film f22 have been formed to the targeted dimensions.

With reference to FIG. 140A, the elements f5 are formed at multiple locations on the top surface f30A of the substrate f30 in accordance with the number of chip resistors f1 that are to be formed on the single substrate f30. If a single region of the substrate f30 in which an (a single) element f5 (the resistor f56) is formed is referred to as a chip component region Y, a plurality of chip component regions Y (in other words, elements f5), each having the resistor f56, are formed (set) on the top surface f30A of the substrate f30. A single chip component region Y coincides with a single finished chip resistor f1 (see FIG. 139) in a plan view. On the top surface f30A of the substrate f30, a region between adjacent chip component regions Y shall be referred to as a "boundary region Z." The boundary region Z has a band shape and extends in a lattice in a plan view. A single chip component region Y is disposed in a single lattice cell defined by the boundary region Z. The width of the boundary region Z is 1 μm to 60 μm (for example, 20 μm) and is extremely narrow, and therefore a large number of chip component regions Y can be secured on the substrate f30 to consequently enable mass production of the chip resistors f1.

Thereafter as shown in FIG. 140A, an insulating film f45 made of SiN is formed on the entirety of the top surface f30A of the substrate f30 by a CVD (chemical vapor deposition) method. The insulating film f45 contacts and covers all of the insulating layer f20 and the elements f5 (resistor body film f21 and wiring films f22) on the insulating layer f20. The insulating film f45 thus also covers the wiring films f22 in the trimming regions X (see FIG. 132). Also, the insulating film f45 is formed across the entirety of the top surface f30A of the substrate f30 and is thus formed to extend to regions besides the trimming regions X on the top surface f30A. The insulating film f45 is thus a protective film that protects the entirety of the top surface f30A (including the elements f5 on the top surface f30A).

Thereafter as shown in FIG. 140B, a resist pattern f41 is formed across the entirety of the top surface f30A of the substrate f30 so as to cover the entire insulating film f45. An opening f42 is formed in the resist pattern f41. FIG. 141 is a schematic plan view of a portion of the resist pattern used for forming a first groove in the step of FIG. 140B.

With reference to FIG. 141, the opening f42 of the resist pattern f41 coincides with (corresponds to) a region (hatched portion in FIG. 141, in other words, the boundary region Z) between outlines of mutually adjacent chip resistors f1 in a plan view in a case where multiple chip resistors f1 (in other words, the chip component regions Y) are disposed in an array (that is also a lattice). The overall shape of the opening f42 is thus a lattice having a plurality of mutually orthogonal rectilinear portions f42A and f42B.

In the resist pattern f41, the mutually orthogonal rectilinear portions f42A and f42B in the opening f42 are connected while being maintained in mutually orthogonal states (without curving). Intersection portions f43 of the rectilinear portions f42A and f42B are thus pointed and form angles of substantially 90° in a plan view. Referring to FIG. 140B, the insulating film f45, the insulating layer f20, and the substrate f30 are respectively removed selectively by plasma etching using the resist pattern f41 as a mask. The material of the substrate f30 is thereby etched (removed) in the boundary region Z between mutually adjacent elements f5 (chip component regions Y). Consequently, the first groove f44, penetrating through the insulating film f45 and the insulating layer f20 and having a predetermined depth reaching a middle portion of the thickness of the substrate f30 from the top surface f30A of the substrate f30, is formed at positions (boundary region Z) coinciding with the opening f42 of the resist pattern f41 in a plan view. The first groove f44 is defined by a pair of mutually facing side surfaces f44A and a bottom surface f44B joining the lower ends (ends at the rear surface f30B side of the substrate f30) of the pair of side surfaces f44A. The depth of the first groove f44 on the basis of the top surface f30A of the substrate f30 is approximately half the thickness T of the finished chip resistor f1 (see FIG. 131(*a*)) and the width (interval between the mutually facing side surfaces f44A) M of the first groove f44 is approximately 20 μm and is fixed across the entire depth direction. By using plasma etching in particular among the types of etching, the first groove f44 can be formed with high precision.

The overall shape of the first groove f44 in the substrate f30 is a lattice that coincides with the opening f42 (see FIG. 141) of the resist pattern f41 in a plan view. At the top surface f30A of the substrate f30, rectangular frame portions (boundary region Z) of the first groove f44 surround the peripheries of the chip component regions Y in which the respective elements f5 are formed. In the substrate f30, each portion in which the element f5 is formed is a semi-finished product f50 of the chip resistor f1. At the top surface f30A of the substrate f30, one semi-finished product f50 is positioned in each chip component region Y surrounded by the first groove f44, and these semi-finished products f50 are arrayed and disposed in an array.

After the first groove f44 has been formed as shown in FIG. 140B, the resist pattern f41 is removed, and a dicing machine (not shown) having a dicing saw f47 is driven as shown in FIG. 140C. The dicing saw f47 is a disk-shaped grindstone and has a cutting tooth portion formed on its peripheral end surface. The width Q (thickness) of the dicing saw f47 is smaller than the width M of the first groove f44. Here, a dicing line U is set at a central position (position of equal distance from the mutually facing pair of side surfaces f44A) of the first groove f44. With its central position f47A in the thickness direction being coincident with the dicing line U in a plan view, the dicing saw f47 moves along the dicing line U inside the first groove f44 and grinds the substrate f30 from the bottom surface f44B of the first groove f44 in this process. When the movement of the dicing saw f47 is completed, a second groove f48 of a predetermined depth dug below the bottom surface f44B of the first groove f44 is formed in the substrate f30.

The second groove f48 continues from the bottom surface f44B of the first groove f44 and is recessed by the predetermined depth toward the rear surface f30B of the substrate f30. The second groove f48 is defined by a pair of mutually facing side surfaces f48A and a bottom surface f48B joining the lower ends (ends at the rear surface f30B side of the substrate f30) of the pair of side surfaces f48A. The depth of the second groove f48 on the basis of the bottom surface f44B of the first groove f44 is approximately half the thickness T of the finished chip resistor f1 and the width (interval between the mutually facing side surfaces f48A) of the second groove f48 is the same as the width Q of the dicing saw f47 and is fixed across the entire depth direction. In the first groove f44 and the second groove f48, a step f49 extending in a direction orthogonal to the thickness direction (direction along the top surface f30A of the substrate f30) is formed between a side surface f44A and a side surface f48A that are mutually adjacent in the thickness direction of the substrate f30. The continuous combination of the first groove f44 and the second groove f48 thus has the shape of a stepped projection that becomes narrower toward the rear surface f30B side. The side surface f44A becomes the rough surface region S of each side surface (each of side surfaces f2C to f2F) of the finished chip resistor f1, the side surface f48A becomes the striped pattern region P of each side surface of the chip resistor f1, and the step f49 becomes the step N of each side surface of the chip resistor f1.

Here, by the first groove f44 being formed by etching, each side surface f44A and the bottom surface f44B are made grainy, rough surfaces with an irregular pattern. On the other hand, by the second groove f48 being formed by the dicing saw f47, each side surface f48A is made to have numerous stripes, which constitute grinding marks of the dicing saw f47, left thereon in a regular pattern. The stripes cannot be removed completely even if the side surface f48A is etched and become the stripes V in the finished chip resistor f1 (see FIG. 131(*a*)).

Thereafter, the insulating film f45 is removed selectively by etching using a mask f65 as shown in FIG. 140D. With the mask f65, openings f66 are formed at portions of the insulating film f45 coinciding with the respective pad regions f22A (see FIG. 139) in a plan view. Portions of the insulating film f45 coinciding with the openings f66 are thereby removed by the etching and the openings f25 are formed at these portions. The insulating film f45 is thus formed so that the respective pad regions f22A are exposed in the openings f25. Two openings f25 are formed per single semi-finished product f50.

With each semi-finished product f50, after the two openings f25 have been formed in the insulating film f45, probes f70 of a resistance measuring apparatus (not shown) are put in contact with the pad regions f22A in the respective openings f25 to detect the resistance value of the element f5 as a whole. Laser light (not shown) is then irradiated onto an arbitrary fuse F (see FIG. 132) via the insulating film f45 to trim the wiring film f22 in the trimming region X by the laser light and thereby fuse the corresponding fuse F. By thus fusing (trimming) the fuses F so that the required resistance value is attained, the resistance value of the semi-finished product f50 (in other words, the chip resistor f1) as a whole can be adjusted as mentioned above. In this process, the insulating film f45 serves as a cover film that covers the element f5 and therefore the occurrence of a short circuit due to attachment of a fragment, etc., formed in the fusing process to the element f5 can be prevented. Also, the insulating film f45 covers the fuses F (the resistor body film f21) and therefore the energy of the laser light accumulates in the fuses F to enable the fuses F to be fused reliably.

Thereafter, SiN is formed on the insulating film f45 by the CVD method to thicken the insulating film f45. In this process, the insulating film f45 is also formed on the entireties of the inner peripheral surfaces of the first groove f44 and the second groove f48 (the side surfaces f44A, the bottom surface f44B, the side surfaces f48A, and the bottom surface f48B) as shown in FIG. 140E. The insulating film f45 is thus also formed on the steps f49. The insulating film f45 on the respective inner peripheral surfaces of the first groove f44 and the second groove f48 (the insulating film f45 in the state shown in FIG. 140E) has a thickness of 1000 Å to 5000 Å (approximately 3000 Å here). At this point, portions of the insulating film f45 enter inside the respective openings f25 to close the openings f25.

Thereafter, a liquid of a photosensitive resin constituted of polyimide is spray-coated onto the substrate f30 from above the insulating film f45 to form a resin film f46 of the photosensitive resin as shown in FIG. 140E. In this process, the liquid is coated onto the substrate f30 across a mask (not shown) having a pattern covering only the first groove f44 and the second groove f48 in a plan view so that the liquid does not enter inside the first groove f44 and the second groove f48. Consequently, the photosensitive resin of liquid form is formed only on the substrate f30 to become the resin film f46 (resin film) on the substrate f30. The top surface f46A of the resin film f46 on the top surface f30A is formed flatly along the top surface f30A.

The liquid does not enter inside the first groove f44 and the second groove f48 and therefore the resin film f46 is not formed inside the first groove f44 and the second groove f48. Also, besides spray-coating the liquid of photosensitive resin, the resin film f46 may be formed by spin-coating the liquid or adhering a sheet, made of the photosensitive resin, on the top surface f30A of the substrate f30.

Thereafter, heat treatment (curing) is performed on the resin film f46. The thickness of the resin film f46 is thereby made to undergo thermal contraction and the resin film f46 hardens and stabilizes in film quality. Thereafter as shown in FIG. 140F, the resin film f46 is patterned to selectively remove portions of the resin film f46 on the top surface f30A coinciding with the respective pad regions f22A (openings f25) of the wiring film f22 in a plan view. Specifically, a mask f62, having openings f61 of a pattern matching (coinciding with) the respective pad regions f22A in a plan view formed therein, is used to expose and develop the resin film f46 with the pattern. The resin film f46 is thereby made to separate at portions above the respective pad regions f22A to form the openings f25. In this process, portions of the resin film f46 bordering the openings f25 undergo thermal contraction and defining surfaces f46B that define the openings f25 at these portions become inclining surfaces that intersect the thickness direction of the substrate f30. Each opening f25 is thereby put in a state where it widens as the top surface f46A of the resin film f46 (which becomes the top surface f24C of the resin film f24) is approached as mentioned above.

Thereafter, the insulating film f45 above the respective pad regions f22 is removed by RIE using an unillustrated mask to open the respective openings f25 and expose the pad regions f22A. Thereafter, an Ni/Pd/Au laminated film, constituted by laminating Ni, Pd, and Au by electroless plating, is formed on the pad region f22A in each opening f25 to form the first connection electrode f3 and the second connection electrode f4 on the pad regions f22A as shown in FIG. 140G.

FIG. 142 is a diagram for describing a process for manufacturing the first connection electrode and the second connection electrode. Specifically, with reference to FIG. 142, first, a top surface of each pad region f22A is cleaned to remove (degrease) organic matter (including smuts, such as stains of carbon, etc., and oil and fat dirt) on the top surface (step S1). Thereafter, an oxide film on the top surface is removed (step S2). Thereafter, a zincate treatment is performed on the top surface to convert the Al (of the wiring film f22) at the top surface to Zn (step S3). Thereafter, the Zn on the top surface is peeled off by nitric acid, etc., so that fresh Al is exposed at the pad region f22A (step S4).

Thereafter, the pad region f22A is immersed in a plating solution to apply Ni plating on a top surface of the fresh Al in the pad region f22A. The Ni in the plating solution is thereby chemically reduced and deposited to form the Ni layer f33 on the top surface (step S5). Thereafter, the Ni layer f33 is immersed in another plating solution to apply Pd plating on a top surface of the Ni layer f33. The Pd in the plating solution is thereby chemically reduced and deposited to form the Pd layer f34 on the top surface of the Ni layer f33 (step S6).

Thereafter, the Pd layer f34 is immersed in yet another plating solution to apply Au plating on a top surface of the Pd layer f34. The Au in the plating solution is thereby chemically reduced and deposited to form the Au layer f35 on the top surface of the Pd layer f34 (step S7). The first connection electrode f3 and the second connection electrode f4 are thereby formed, and when the first connection electrode f3 and the second connection electrode f4 that have been formed are dried (step S8), the process for manufacturing the first connection electrode f3 and the second connection electrode f4 is completed. A step of washing the semi-finished product f50 with water is performed as necessary between consecutive steps. Also, the zincate treatment may be performed a plurality of times.

FIG. 140G shows a state after the first connection electrode f3 and the second connection electrode f4 have been formed in each semi-finished product f50. Respectively with the first connection electrode f3 and the second connection electrode f4, the top surfaces f3A and f4A are flush with the top surface f46A of the resin film f46. Also, in accordance with the defining surfaces f46B that define the openings f25 in the resin film f46 being inclined as described above, the end portions of the top surfaces f3A and f4A at the edge sides of the openings f25 are curved toward the rear surface f30B side of the substrate f30. Therefore with each of the first connection electrode f3 and the second connection electrode f4, end portions of each of the Ni layer f33, the Pd layer f34, and the Au layer f35 at the edge sides of the openings f25 are curved toward the rear surface f30B side of the substrate f30.

As described above, the first connection electrode f3 and the second connection electrode f4 are formed by electroless plating and therefore in comparison to a case where the first connection electrode f3 and the second connection electrode f4 are formed by electrolytic plating, the number of steps of the process for forming the first connection electrode f3 and the second connection electrode f4 (for example, a lithography step, a resist mask peeling step, etc., that are necessary in electrolytic plating) can be reduced to improve the productivity of the chip resistor f1. Further in the case of electroless plating, the resist mask that is deemed to be necessary in electrolytic plating is unnecessary and deviation of the positions of formation of the first connection electrode f3 and the second connection electrode f4 due to positional deviation of the resist mask thus does not occur, thereby enabling the formation position precision of the first connection electrode f3 and the second connection electrode f4 to be improved to improve the yield. Also, by performing electroless plating on the pad regions f22A exposed from the resin film f24, the first connection electrode f3 and the second connection electrode f4 can be formed just on the pad regions f22A.

Also generally in the case of electrolytic plating, Ni and Si are contained in the plating solution. Although failure of connection between the first connection electrode f3 or the second connection electrode f4 and a connection terminal f88 of the mounting substrate f9 (see FIG. 131(*b*)) may thus occur due to oxidation of the Sn left on the top surfaces f3A and f4A of the first connection electrode f3 and the second connection electrode f4, such a problem does not occur in the sixth reference example in which electroless plating is used.

After the first connection electrode f3 and the second connection electrode f4 have thus been formed, a conduction test is performed across the first connection electrode f3 and the second connection electrode f4, and thereafter, the substrate f30 is ground from the rear surface f30B. Specifically, an adhesive surface f72 of a thin, plate-shaped supporting tape f71, made of PET (polyethylene terephthalate) and having the adhesive surface f72, is adhered onto the first connection electrode f3 and second connection electrode f4 side (that is, the top surface f30A) of each semi-finished product f50 as shown in FIG. 140H. The respective semi-finished products f50 are thereby supported by the supporting tape f71. Here, for example, a laminated tape may be used as the supporting tape f71.

In the state where the respective semi-finished products f50 are supported by the supporting tape f71, the substrate f30 is ground from the rear surface f30B side. When the substrate f30 has been thinned by grinding until the rear surface f30B reaches the bottom surface f48B (see FIG. 140G) of the second groove f48, there are no longer portions that join mutually adjacent semi-finished products f50 and the substrate f30 is thus divided at the first groove f44 and the second groove f48 as boundaries and the semi-finished products f50 are separated individually to become the finished products of the chip resistors f1. That is, the substrate f30 is cut (divided) at the first groove f44 and the second groove f48 (in other words, the boundary region Z) and the individual chip resistors f1 are thereby cut out. The thickness of the substrate f30 (substrate f2) after the rear surface f30 has been ground is 150 μm to 400 μm (not less than 150 μm and not more than 400 μm).

With each finished chip resistor f1, a portion that formed a side surface f44A of the first groove f44 becomes the rough surface region S of one of the side surfaces f2C to f2F of the substrate f2, a portion that formed a side surface f48A of the second groove f48 becomes the striped pattern region P of one of the side surfaces f2C to f2F of the substrate f2, and the step f49 between a side surface f44A and a side surface f48A becomes the step N. With each finished chip resistor f1, the rear surface f30B becomes the rear surface f2B. That is, the steps of forming the first groove f44 and the second groove f48 as described above (see FIG. 140B and FIG. 140C) are included in the step of forming the side surfaces f2C to f2F. Also, the insulating film f45 becomes the passivation film f23, and the resin film f46 becomes the resin film f24.

For example, even if the first groove f44 (see FIG. 140B), which is formed by etching, is not uniform in depth, as long as the second groove f48 is formed by the dicing saw f47 (see FIG. 40C), the depth (depth from the top surface f30A of the substrate f30 to the bottom of the second groove f48) of the first groove f44 and the second groove f48 as a whole will be uniform. Therefore, in the process of separating the chip resistors f1 into individual chips by grinding the rear surface f30B of the substrate f30, differences in time until separation from the substrate f30 can be lessened among the chip resistors f1 and the respective chip resistors f1 can thus be separated substantially simultaneously from the substrate f30. A problem, such as chipping occurring in a priorly-separated chip resistor f1 due to repeated collision of the chip resistor f1 with the substrate f30, can thereby be suppressed. Also, corner portions (corner portions f11) at the top surface f2A side of the chip resistor f1 are defined by the first groove f44 that is formed by etching, and therefore chipping is less likely to occur at the corner portions f11 in comparison to a case where these portions are defined by the dicing saw f47. As a result of the above, chipping can be suppressed and occurrence of faults in separation into individual chips can be avoided in the process of separating the chip resistors f1 into individual chips. That is, control of the shape of the corner portions f11 (see FIG. 131(*a*)) at the top surface f2A side of the chip resistor f1 is made possible. Also in comparison to a case where both the first groove f44 and the second groove f48 are formed by etching, the time required for separation of the chip resistors f1 into individual chips can be shortened to enable the productivity of the chip resistors f1 to be improved.

In particular, in a case where the thickness of the substrate f2 in the chip resistor f1 that has been separated into an individual chip is 150 μm to 400 μm and comparatively large, it is difficult and time-consuming to form a groove reaching from the top surface f30A of the substrate f30 to the bottom surface f48B of the second groove f48 (see FIG. 140C) just by etching. However, even in such a case, by forming the first groove f44 and the second groove f48 by combined use of etching and dicing by the dicing saw f47 and then grinding the rear surface f30B of the substrate f30, the time required for separation of the chip resistors f1 into individual chips can be shortened. The productivity of the chip resistors f1 can thus be improved.

Also, if the second groove f48 is made to reach the rear surface f30B of the substrate f30 (if the second groove f48 is made to penetrate through the substrate f30) by dicing, chipping may occur at corner portions of the rear surface f2B and the side surfaces f2C to f2F in the finished chip resistor f1. However, if, as in the sixth reference example, half-dicing is performed so that the second groove f48 does not reach the rear surface f30B (see FIG. 140C) and the rear surface f30B is ground thereafter, chipping is unlikely to occur at the corner portions of the rear surface f2B and the side surfaces f2C to f2F.

Also, if a groove reaching from the top surface f30A of the substrate f30 to the bottom surface f48B of the second groove f48 is formed just by etching, side surfaces of the groove after completion will not be aligned in the thickness direction of the substrate f2 and the groove will be unlikely to have a rectangular cross section due to variation of the etching rate. That is, there will be variation in the side surfaces of the groove. However, by combining etching and dicing as in the sixth reference example, the variation in each groove side surface (each of the side surfaces f44A and side surfaces f48A) of the first groove f44 and the second groove f48 as a whole can be reduced in comparison to performing etching alone and the groove side surfaces can thereby be aligned in the thickness direction of the substrate f2.

Also, the width Q of the dicing saw f47 is less than the width M of the first groove f44 so that the width Q of the second groove f48 formed by the dicing saw f47 is smaller than the width M of the first groove f44 and the second groove f48 is positioned at an inner side of the first groove f44 (see FIG. 140C). Therefore, when the second groove f48 is formed by the dicing saw f47, the dicing saw f47 will not widen the width of the first groove f44. Occurrence of chipping at the corner portions f11 at the top surface f2A side of the chip resistor f1 due to the corner portions f11 being defined by the dicing saw f47 instead of being defined by the first groove f44 can thus be suppressed reliably.

Although the chip resistors f1 are separated into individual chips by forming the second groove f48 and thereafter grinding the rear surface f30B, the rear surface f30B may instead be ground ahead of forming the second groove f48 and the second groove f48 may thereafter be formed by dicing. Cutting out of the chip resistors f1 by etching the substrate f30 from the rear surface f30 to the bottom surface f48B of the second groove f48 is also conceivable.

As described above, by forming the first groove f44 and the second groove f48 and thereafter grinding the substrate f30 from the rear surface f30B side, the plurality of chip component regions Y formed on the substrate f30 can be separated all at once into individual chip resistors f1 (chip components) (the individual chips of the plurality of chip resistors f1 can be obtained at once). The productivity of the chip resistors f1 can thus be improved by reduction of the time for manufacturing the plurality of chip resistors f1. For example, approximately 500 thousand chip resistors f1 can be cut out by using a substrate f30 with a diameter of 8 inches.

That is, even if the chip resistors f1 are small in size, the chip resistors f1 can be separated into individual chips at once by first forming the first groove f44 and the second groove f48 and then grinding the substrate f30 from the rear surface f30B side as described above. Also, the first groove f44 can be formed with high precision by etching and therefore in each individual chip resistor f1, improvement of external dimensional precision can be achieved at the rough surface region S side of each of the side surfaces f2C to f2F defined by the first groove f44. In particular, the first groove f44 can be formed with even higher precision by using plasma etching. Also, the intervals of the first groove f44 can be made fine in accordance with the resist pattern f41 (see FIG. 141) to achieve downsizing of the chip resistors f1 formed between mutually adjacent portions of the first groove f44. Also, in the case of etching, the occurrence of chipping at the corner portions f11 of mutually adjacent rough surface regions S of the side surfaces f2C to f2F of the chip resistors f1 (see FIG. 131(*a*)) can be reduced to achieve improvement of the outer appearance of the chip resistors f1.

The rear surface f2B of the substrate f2 of the finished chip resistor f1 may be mirror-finished by polishing or etching to refine the rear surface f2B. The finished chip resistors f1 shown in FIG. 140H are peeled from the supporting tape f71 and thereafter conveyed to a predetermined space to be stored in the space. In mounting the chip resistor f1 on the mounting substrate f9 (see FIG. 131(*b*)), the rear surface f2B of the chip resistor f1 is suctioned onto a suction nozzle f91 (see FIG. 131(*b*)) of an automatic mounting machine and then the suction nozzle f91 is moved to convey the chip resistor f1. In this process, a substantially central portion in the long direction of the rear surface f2B is suctioned onto the suction nozzle f91. With reference to FIG. 131(*b*), the suction nozzle f91 with the chip resistor f1 suctioned thereon is then moved to the mounting substrate f9. The mounting substrate f9 is provided with the pair of connection terminals f88 in correspondence to the first connection electrode f3 and the second connection electrode f4 of the chip resistor f1. The connection terminals f88 are made, for example, of Cu. At the top surface of each connection terminal f88, the solder f13 is provided so as to project from the top surface.

The suction nozzle f91 is then moved and pressed against the mounting substrate f9 so that, with the chip resistor f1, the first connection electrode f3 is contacted with the solder f13 on one connection terminal f88 and the second connection electrode f4 is contacted with the solder f13 on the other connection terminal f88. When the solders f13 are heated in this state, the solders f13 melt. Thereafter, when the solders f13 are cooled and solidified, the first connection electrode f3 and the one connection terminal f88 become bonded via the solder f13, the second connection electrode f4 and the other connection terminal f88 become bonded via the solder f13, and the mounting of the chip resistor f1 to the mounting substrate f9 is thereby completed.

FIG. 143 is a schematic view for describing how finished chip resistors are housed in an embossed carrier tape. On the other hand, there are also cases where the finished chip resistors f1 as shown in FIG. 140H are housed in the embossed carrier tape f92 shown in FIG. 143. The embossed carrier tape f92 is a tape (band-shaped body) formed, for example, of polycarbonate resin, etc. In the embossed carrier tape f92, multiple pockets f93 are formed so as to be aligned in a long direction of the embossed carrier tape f92. Each pocket f93 is defined as a convex space that is recessed toward one surface (rear surface) of the embossed carrier tape f92.

In housing each finished chip resistor f1 (see FIG. 140H) in the embossed carrier tape f92, (a substantially central portion in the long direction of) the rear surface f2B of the chip resistor f1 is suctioned onto a suction nozzle f91 (see FIG. 131(*b*)) of a conveying device and then the suction nozzle f91 is moved to peel the chip resistor f1 off from the supporting tape f71. The suction nozzle f91 is then moved to a position facing a pocket f93 of the embossed carrier tape f92. At this point, with the chip resistor f1 being suctioned onto the suction nozzle f91, the first connection electrode f3, the second connection electrode f4, and the resin film f24 at the top surface f2A side face the pocket f93.

Here, in the case of housing the chip resistor f1 in the embossed carrier tape f92, the embossed carrier tape f92 is placed on a flat supporting base f95. The suction nozzle f91 is moved to the pocket f93 side (see the thick arrow) and the chip resistor f1 in an attitude where the top surface f2A side faces the pocket f93 is housed inside the pocket f93. When the top surface f2A side of the chip resistor f1 contacts a bottom f93A of the pocket f93, the housing of the chip resistor f1 in the embossed carrier tape f92 is completed. By moving the suction nozzle f91, the first connection electrode f3, the second connection electrode f4, and the resin film f24 at the top surface f2A side of the chip resistor f1 are pressed against the bottom f93A of the pocket f93 supported by the supporting base f95 when the top surface f2A side is contacted with the bottom f93A.

After the housing of the chip resistors f1 in the embossed carrier tape f92 is completed, a peelable cover f94 is adhered onto a top surface of the embossed carrier tape f92 and the interiors of the respective pockets f93 are sealed by the peelable cover f94. Entry of foreign matter into the respective pockets f93 is thereby prevented. To take out a chip resistor f1 from the embossed carrier tape 92, the peelable cover f94 is peeled from the embossed carrier tape f92 to open the pocket f93. Thereafter, the chip resistor f1 is taken out from the pocket f93 and mounted as described above by the automatic mounting machine.

When in mounting the chip resistor f1 as described above or in housing the chip resistor f1 in the embossed carrier tape f92 or further in performing a stress test on the chip resistor f1, the first connection electrode f3 and the second connection electrode f4 are pressed against something (referred to hereinafter as a "contacted portion") by applying force to (a substantially central portion in the long direction of) the rear surface f2B of the chip resistor f1, a stress acts on the top surface f2A of the substrate f2. The contacted portion is the mounting substrate f9 in the case of mounting the chip resistor f1, the bottom f93A of the pocket f93 supported by the supporting base f95 in the case of housing the chip resistor f1 in the embossed carrier tape f92, and a supporting surface supporting the chip resistor f1 that receives a stress in the case of performing a stress test.

Here, a chip resistor f1 may be considered where the height H of the resin film f24 at the top surface f2A of the substrate f2 (see FIG. 139) is less than the height J of each of the first connection electrode f3 and the second connection electrode f4 (see FIG. 139) and the top surfaces f3A and f4A of the first connection electrode f3 and the second connection electrode f4 project the most from the top surface f2A of the substrate f2A (that is, the resin film f24 is thin) (see FIG. 144 to be described below). With such a chip resistor f1, just the first connection electrode f3 and the second connection electrode f4 at the top surface f2A side make contact (two-point contact) with the contacted portion, and therefore the stress applied to the chip resistor f1 concentrates at the respective bonding portions of the first connection electrode f3 and the second connection electrode f4 with the substrate f2. The electrical characteristics of the chip resistor f1 may thus degrade. Further, strain may occur inside the chip resistor f1 (especially at a substantially central portion in the long direction of the substrate f2) due to the stress, and in a severe case, the substrate f2 may crack with the substantially central portion as a starting point.

However, as mentioned above, with the sixth reference example, the resin film f24 is made thick so that the height H of the resin film f24 is not less than the height J of each of the first connection electrode f3 and the second connection electrode f4 (see FIG. 139). The stress applied to the chip resistor f1 is thus received not only by the first connection electrode f3 and the second connection electrode f4 but also by the resin film f24. The area of the portion of the chip resistor f1 that receives the stress can thus be increased so that the stress applied to the chip resistor f1 can be dispersed. The concentration of stress on the first connection electrode f3 and the second connection electrode f4 can thereby be suppressed in the chip resistor f1. In particular, the concentration of the stress applied to the chip resistor f1 can be dispersed more effectively by the top surface f24C of the resin film f24. The concentration of stress on the chip resistor f1 can thereby be suppressed further to enable the chip resistor f1 to be improved in strength. Consequently, destruction of the chip resistor f1 during mounting or during a durability test or during housing in the embossed carrier tape f92 can be suppressed. Consequently, the yield in the process of mounting or housing in the embossed carrier tape f92 can be improved and further, the chip resistor f1 can be improved in handling properties because the chip resistor f1 does not break readily.

Modification examples of the chip resistor f1 shall now be described. FIG. 144 to FIG. 148 are schematic sectional views of chip resistors according to first to fifth modification examples. With the first to fifth modification examples, portions corresponding to portions described above with the chip resistor f1 shall be provided with the same reference symbols and detailed description of these portions shall be omitted. In regard to the first connection electrode f3 and the second connection electrode f4, in FIG. 139, the top surface f3A of the first connection electrode f3 and the top surface f4A of the second connection electrode f4 are flush with the top surface f24C of the resin film f24. If the dispersion of a stress applied to the chip resistor f1 during mounting, etc., is not to be considered, the top surface f3A of the first connection electrode f3 and the top surface f4A of the second connection electrode f4 may, as in the first modification example shown in FIG. 144, project further than the top surface f24C of the resin film f24 in a direction away from the top surface f2A of the substrate f2 (upward in FIG. 144). In this case, the height H of the resin film f24 is lower than the height J of each of the first connection electrode f3 and the second connection electrode f4.

Oppositely, if the stress applied to the chip resistor f1 during mounting, etc., is to be dispersed more than in the case of FIG. 139, the height H of the resin film f24 is made higher than the height J of each of the first connection electrode f3 and the second connection electrode f4 as in the second modification example shown in FIG. 145. The resin film f24 is thereby made thicker and the top surface f3A of the first connection electrode f3 and the top surface f4A of the second connection electrode f4 are shifted more toward the top surface f2A side of the substrate f2 (downward in FIG. 144) than the top surface f24C of the resin film f24. In this case, the first connection electrode f3 and the second connection electrode f4 are in a state of being embedded more toward the substrate f2 side than the top surface f24C of the resin film f24 and the two-point contact at the first connection electrode f3 and the second connection electrode f4 does not occur per se. The concentration of stress on the chip resistor f1 can thus be suppressed further. However, in mounting the chip resistor f1 according to the second modification example on the mounting substrate f9, the solders f13 on the respective connection terminals f88 of the mounting substrate f9 must be made thick so as to be capable of reaching the top surface f3A of the first connection electrode f3 and the top surface f4A of the second connection electrode f4 to prevent failure of connection of the first connection electrode f3 and the second connection electrode f4 with the solders f13 (see FIG. 131(*b*)).

Also, although with the insulating layer f20 on the top surface f2A of the substrate f2, an end surface f20A thereof (the portion coincident with the edge portion f85 of the top surface f2A in a plan view) extends in the thickness direction of the substrate f2 (in the vertical direction in FIG. 139, FIG. 144, and FIG. 145), it may be inclined instead as shown in FIG. 146 to FIG. 148. Specifically, the end surface f20A of the insulating layer f20 is inclined so as to be directed toward the interior of the substrate f2 as the top surface of the insulating layer f20 is approached from the top surface f2A of the substrate f2. In accordance with such an end surface f20A, a portion of the passivation film f23 covering the end surface f20A (the end portion f23C) is also inclined along the end surface f20A.

The chip resistors f1 according to the third to fifth modification examples shown in FIG. 146 to FIG. 148 differ in the position of the edge 24A of the resin film f24. First, the chip resistor f1 according to the third modification example shown in FIG. 146 is the same as the chip resistor f1 of FIG. 139 with the exception that the end surface f20A of the insulating layer f20 and the end portion f23C of the passivation film f23 are inclined. Therefore in a plan view, the edge 24A of the resin film f24 is matched with the side surface covering portion f23B of the passivation film f23 and is positioned further outward than the edge portion f85 of the top surface f2A of the substrate f2 (end edge at the top surface f2A side of the substrate f2) by just an amount corresponding to the thickness of the side surface covering portion f23B. To thus match the edge 24A with the side surface covering portion f23B, an unillustrated mask must be used to prevent the photosensitive resin liquid for forming the resin film f46 from entering into the first groove f44 and the second groove f48 in the process of spray coating the liquid (see FIG. 140E). Or, even if the liquid enters into the first groove f44 and the second groove f48, an opening f61 is formed in the mask f62 at portions coinciding with the first groove f44 and the second groove f48 in a plan view in patterning the resin film f46 thereafter (see FIG. 140F). The resin film f46 in the first groove f44 and the second groove f48 can thereby be removed by the patterning of the resin film f46 to make the edge 24A of the resin film f24 be matched with the side surface covering portion f23B.

Here, the resin film f24 is made of resin and there is thus no possibility of a crack forming therein due to an impact. The resin film f24 can thus reliably protect the top surface f2A of the substrate f2 (especially the element f5 and the fuses F) and the edge portion f85 of the top surface f2A of the substrate f2 against impacts to enable a chip resistor f1 of excellent impact resistance to be provided. On the other hand, with the chip resistor f1 according to the fourth modification example shown in FIG. 147, the edge 24A of the resin film f24 is not matched with the side surface covering portion f23B of the passivation film f23 in a plan view but is retreated further inward than the side surface covering portion f23B or more specifically, further toward the interior of the substrate f2 than the edge portion f85 of the top surface f2A of the substrate f2. Even in this case, the resin film f24 can reliably protect the top surface f2A of the substrate f2 (especially the element f5 and the fuses F) from impacts to enable a chip resistor f1 of excellent impact resistance to be provided. To make the edge f24A of the resin film f24 retreat toward the interior of the substrate f2, the opening f61 is also formed at portions of the mask f62 overlapping with the edge portion f85 of the substrate f2 (substrate f30) in a plan view in patterning the resin film f46 (see FIG. 140F). The resin film f46 at regions overlapping with the edge portion f85 of the substrate f2 (substrate f30) in a plan view can thereby be removed by the patterning of the resin film f46 to make the edge 24A of the resin film f24 retreat toward the interior of the substrate f2.

With the chip resistor f1 according to the fifth modification example shown in FIG. 148, the edge 24A of the resin film f24 is not matched with the side surface covering portion f23B of the passivation film f23 in a plan view. Specifically, the resin film f24 protrudes further outward than the side surface covering portion f23B and covers the entirety of the side surface covering portion f23B from the exterior. That is, with the fifth modification example, the resin film f24 covers both the top surface covering portion f23A and the side surface covering portion f23B of the passivation film f23. In this case, the resin film f24 can reliably protect the top surface f2A of the substrate f2 (especially, the element f5 and the fuses F) and the side surfaces f2C to f2F of the substrate f2 from impacts to enable a chip resistor f1 of excellent impact resistance to be provided. If the resin film f24 is to cover both the top surface covering portion f23A and the side surface covering portion f23B, the photosensitive resin liquid for forming the resin film f46 is made to enter into the first groove f44 and the second groove f48 and become attached to the side surface covering portion f23B in the process of spray coating the liquid (see FIG. 140E). As described above, spin coating of the liquid is not preferable because the liquid does not take the form of a film but fills the first groove f44 and the second groove f48 completely. On the other hand, forming of the resin film f46 by adhering a sheet made of the photosensitive resin to the top surface f30A of the substrate f30 is not preferable because the sheet cannot enter inside the first groove f44 and the second groove f48 and the entirety of the side surface covering portion f23B thus cannot be covered. Spray coating of the liquid of the photosensitive resin is thus effective for making the resin film f24 cover both the top surface covering portion f23A and the side surface covering portion f23B.

Although preferred embodiments of the sixth reference example have been described above, the sixth reference example may be implemented in yet other modes as well. For example, although with each of the preferred embodiments described above, the chip resistor f1 was disclosed as an example of a chip component according to the sixth reference example, the sixth reference example may also be applied to a chip component, such as a chip capacitor, a chip inductor, or a chip diode. A chip capacitor shall be described below.

FIG. 149 is a plan view of a chip capacitor according to another preferred embodiment of the sixth reference example. FIG. 150 is a sectional view taken along section line CL-CL in FIG. 149. FIG. 151 is an exploded perspective view showing the arrangement of a portion of the chip capacitor in a separated state. With the chip capacitor f101 to be described below, portions corresponding to portions described above for the chip resistor f1 shall be provided with the same reference symbols and detailed description of such portions shall be omitted. With the chip capacitor f101, the portions provided with the same reference symbols as the portions described for the chip resistor f1 have, unless noted otherwise, the same arrangements as the portions described for the chip resistor f1 and exhibit the same actions and effects as the portions described for the chip resistor f1.

With reference to FIG. 149, the chip capacitor f101 has, like the chip resistor f1, the substrate f2, the first connection electrode f3 disposed on the substrate f2 (at the top surface f2A side of the substrate f2), and the second connection electrode f4 disposed similarly on the substrate f2. In the present preferred embodiment, the substrate f2 has, in a plan view, a rectangular shape. The first connection electrode f3 and the second connection electrode f4 are respectively disposed at portions at respective ends in the long direction of the substrate f2. In the present preferred embodiment, each of the first connection electrode f3 and the second connection electrode f4 has a substantially rectangular planar shape extending in the short direction of the substrate f2. On the top surface f2A of the substrate f2, a plurality of capacitor parts C1 to C9 are disposed within a capacitor arrangement region f105 between the first connection electrode f3 and the second connection electrode f4. The plurality of capacitor parts C1 to C9 are a plurality of element parts (capacitor elements) that constitute the element f5 and are electrically connected respectively to the second connection electrode f4 via a plurality of fuse units f107 (corresponding to the fuses F described above) in a manner enabling disconnection. The element f5 constituted of the capacitor parts C1 to C9 is arranged as a capacitor network.

As shown in FIG. 150 and FIG. 151, an insulating layer f20 is formed on the top surface f2A of the substrate f2, and a lower electrode film f111 is formed on the top surface of the insulating layer f20. The lower electrode film f111 is formed to spread across substantially the entirety of the capacitor arrangement region f105. The lower electrode film fill is further formed to extend to a region directly below the first connection electrode f3. More specifically, the lower electrode film f111 has, in the capacitor arrangement region f105, a capacitor electrode region f111A functioning as a lower electrode in common to the capacitor parts C1 to C9 and has a pad region f111B (pad) leading out to an external electrode and disposed directly below the first connection electrode f3. The capacitor electrode region f111A is positioned in the capacitor arrangement region f105 and the pad region f111B is positioned directly below the first connection electrode f3 and is in contact with the first connection electrode f3.

In the capacitor arrangement region f105, a capacitance film (dielectric film) f112 is formed so as to cover and contact the lower electrode film f111 (capacitor electrode region f111A). The capacitance film f112 is formed across the entirety of the capacitor electrode region f111A (capacitor arrangement region f105). In the present preferred embodiment, the capacitance film f112 further covers the insulating layer f20 outside the capacitor arrangement region f105.

An upper electrode film f113 is formed on the capacitance film f112 so as to contact the capacitance film f112. In FIG. 149, the upper electrode film f113 is colored for the sake of clarity. The upper electrode film f113 includes a capacitor electrode region f113A positioned in the capacitor arrangement region f105, a pad region f113B (pad) positioned directly below the second connection electrode f4 and in contact with the second connection electrode f4, and a fuse region f113C disposed between the capacitor electrode region f113A and the pad region f113B.

In the capacitor electrode region f113A, the upper electrode film f113 is divided (separated) into a plurality of electrode film portions (upper electrode film portions) f131 to f139. In the present preferred embodiment, the respective electrode film portions f131 to f139 are all formed to rectangular shapes and extend in the form of bands from the fuse region f113C toward the first connection electrode f3. The plurality of electrode film portions f131 to f139 face the lower electrode film f111 across the capacitance film f112 over a plurality of types of facing areas (while being in contact with the capacitance film f112). More specifically, the facing areas of the electrode film portions f131 to f139 with respect to the lower electrode film f111 may be set to be 1:2:4:8:16:32:64:128:128. That is, the plurality of electrode film portions f131 to f139 include the plurality of electrode film portions differing in facing area and more specifically include the plurality of electrode film portions f131 to f138 (or f131 to f137 and f139) having facing areas that are set to form a geometric progression with a common ratio of 2. The plurality of capacitor parts C1 to C9, respectively arranged by the respective electrode film portions f131 to f139, the facing lower electrode film f111 across the capacitance film f112, and the capacitance film f112, thus include the plurality of capacitor parts having mutually different capacitance values. If the ratio of the facing areas of the electrode film portions f131 to f139 is as mentioned above, the ratio of the capacitance values of the capacitor parts C1 to C9 is equal to the ratio of the facing areas and is 1:2:4:8:16:32:64:128:128. The plurality of capacitor parts C1 to C9 thus include the plurality of capacitor parts C1 to C8 (or C1 to C7 and C9) with capacitance values set to form the geometric progression with the common ratio of 2.

In the present preferred embodiment, the electrode film portions f131 to f135 are formed to bands that are equal in width and have lengths with the ratio thereof being set to 1:2:4:8:16. Also, the electrode film portions f135, f136, f137, f138, and f139 are formed to bands that are equal in length and have widths with the ratio thereof being set to 1:2:4:8:8. The electrode film portions f135 to f139 are formed to extend across a range from an end edge at the second connection electrode f4 side to an end edge at the first connection electrode f3 side of the capacitor arrangement region f105, and the electrode film portions f131 to f134 are formed to be shorter than this range.

The pad region f113B is formed to be substantially similar in shape to the second connection electrode f4 and has a substantially rectangular planar shape. As shown in FIG. 150, the upper electrode film f113 in the pad region f113B is in contact with the second connection electrode f4.

The fuse region f113C is disposed along one long side (the long side at the inner side with respect to the peripheral edge of the substrate f2) of the pad region f113B. The fuse region f113C includes the plurality of fuse units f107 that are aligned along the one long side of the pad region f113B.

The fuse units f107 are formed of the same material as and to be integral to the pad region f113B of the upper electrode film f113. The plurality of electrode film portions f131 to f139 are each formed integral to one or a plurality of the fuse units f107, are connected to the pad region f113B via the fuse units f107, and are electrically connected to the second connection electrode f4 via the pad region f113B. As shown in FIG. 149, each of the electrode film portions f131 to f136 of comparatively small area is connected to the pad region f113B via a single fuse unit f107, and each of the electrode film portions f137 to f139 of comparatively large area is connected to the pad region f113B via a plurality of fuse units f107. It is not necessary for all of the fuse units f107 to be used and, in the present preferred embodiment, a portion of the fuse units f107 is unused.

The fuse units f107 include first wide portions f107A arranged to be connected to the pad region f113B, second wide portions f107B arranged to be connected to the electrode film portions f131 to f139, and narrow portions f107C connecting the first and second wide portions f107A and f107B. The narrow portions f107C are arranged to be capable of being cut (fused) by laser light. Unnecessary electrode film portions among the electrode film portions f131 to f139 can thus be electrically disconnected from the first and second connection electrodes f3 and f4 by cutting the fuse units f107.

Although omitted from illustration in FIG. 149 and FIG. 151, the top surface of the chip capacitor f101 that includes the top surface of the upper electrode film f113 is covered by the passivation film f23 as shown in FIG. 150. The passivation film f23 is constituted, for example, of a nitride film and is formed not only to cover the upper surface of the chip capacitor f101 but also to extend to the side surfaces f2C to f2F of the substrate f2 and cover the entireties of the side surfaces f2C to f2F. Further, the resin film f24 is formed on the passivation film f23.

The passivation film f23 and the resin film f24 are protective films that protect the top surface of the chip capacitor f101. In these films, the pad openings f25 are respectively formed in regions corresponding to the first connection electrode f3 and the second connection electrode f4. The openings f25 penetrate through the passivation film f23 and the resin film f24 so as to respectively expose a region of a portion of the pad region f111B of the lower electrode film f111 and a region of a portion of the pad region f113B of the upper electrode film f113. Further, with the present preferred embodiment, the pad opening f25 corresponding to the first connection electrode f3 also penetrates through the capacitance film f112.

The first connection electrode f3 and the second connection electrode f4 are respectively embedded in the openings f25. The first connection electrode f3 is thereby bonded to the pad region f111B of the lower electrode film f111 and the second connection electrode f4 is bonded to the pad region f113B of the upper electrode film f113. In the present preferred embodiment, the first and second connection electrodes f3 and f4 are formed so that the respective top surfaces f3A and f4A are substantially flush with the top surface f24A of the resin film f24. As with the chip resistor f1, the chip capacitor f101 can be flip-chip bonded to the mounting substrate f9.

FIG. 152 is a circuit diagram of the electrical arrangement of the interior of the chip capacitor. The plurality of capacitor parts C1 to C9 are connected in parallel between the first connection electrode f3 and the second connection electrode f4. Fuses F1 to F9, each arranged from one or a plurality of the fuse units f107, are interposed in series between the respective capacitor parts C1 to C9 and the second connection electrode f4.

When all of the fuses F1 to F9 are connected, the capacitance value of the chip capacitor f101 is equal to the total of the capacitance values of the capacitor parts C1 to C9. When one or two or more fuses selected from among the plurality of fuses F1 to F9 is or are cut, each capacitor part corresponding to the cut fuse is disconnected and the capacitance value of the chip capacitor f101 decreases by just the capacitance value of the disconnected capacitor part or parts.

Therefore by measuring the capacitance value across the pad regions f111B and f113B (the total capacitance value of the capacitor parts C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor parts C1 to C8 are set to form a geometric progression with a common ratio of 2, fine adjustment to the targeted capacitance value at a precision corresponding to the capacitance value of the capacitor part C1, which is the smallest capacitance value (value of the first term in the geometric progression), is made possible.

For example, the capacitance values of the capacitor parts C1 to C9 may be set as follows. C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor f101 can be finely adjusted at a minimum adjustment precision of 0.03125 pF. Also, the fuses to be cut among the fuses F1 to F9 can be selected appropriately to provide the chip capacitor f101 with an arbitrary capacitance value between 10 pF and 18 pF.

As described above, with the present preferred embodiment, the plurality of capacitor parts C1 to C9 that can be disconnected by the fuses F1 to F9 are provided between the first connection electrode f3 and the second connection electrode f4. The capacitor parts C1 to C9 include a plurality of capacitor parts that differ in capacitance value and more specifically include a plurality of capacitor parts with capacitance values set to form a geometric progression. Chip capacitors f101, which can accommodate a plurality of types of capacitance values without change of design and can be accurately adjusted to the desired capacitance value by selection and fusion by laser light of one or a plurality of fuses among the fuses F1 to F9, can thus be realized with a common design.

Details of respective portions of the chip capacitor f101 shall now be described. With reference to FIG. 149, the substrate f2 may have, for example, a rectangular shape of 0.3 mm×0.15 mm, 0.4 mm×0.2 mm, etc. (preferably a size of not more than 0.4 mm×0.2 mm) in a plan view. The capacitor arrangement region f105 is generally a square region with each side having a length corresponding to the length of the short side of the substrate f2. The thickness of the substrate f2 may be approximately 150 μm. With reference to FIG. 150, the substrate f2 may, for example, be a substrate that has been thinned by grinding or polishing from the rear surface side (surface on which the capacitor parts C1 to C9 are not formed). As the material of the substrate f2, a semiconductor substrate as represented by a silicon substrate may be used or a glass substrate may be used or a resin film may be used.

The insulating layer f20 may be a silicon oxide film or other oxide film. The film thickness thereof may be approximately 500 Å to 2000 Å. The lower electrode film f111 is preferably a conductive film, a metal film in particular, and may, for example, be an aluminum film. The lower electrode film f111 that is constituted of an aluminum film may be formed by a sputtering method. Similarly, the upper electrode film f113 is preferably constituted of a conductive film, a metal film in particular, and may, for example, be an aluminum film. The upper electrode film f113 that is constituted of an aluminum film may be formed by the sputtering method. The patterning for dividing the capacitor electrode region f113A of the upper electrode film f113 into the electrode film portions f131 to f139 and shaping the fuse region f113C into the plurality of fuse units f107 may be performed by photolithography and etching processes.

The capacitance film f112 may be constituted, for example, of a silicon nitride film, and the film thickness thereof may be 500 Å to 2000 Å (for example, 1000 Å). The capacitance film f112 may be a silicon nitride film formed by plasma CVD (chemical vapor deposition). The passivation film f23 may be constituted, for example, of a silicon nitride film and may be formed, for example, by the plasma CVD method. The film thickness thereof may be approximately 8000 Å. As mentioned above, the resin film f24 may be constituted of a polyimide film or other resin film.

Each of the first and second connection electrodes f3 and f4 may, for example, be constituted of a laminated structure film in which the Ni layer f33 in contact with the lower electrode film f111 or the upper electrode film f113, the Pd layer f34 laminated on the Ni layer f33, and the Au layer f35 laminated on the Pd layer f34 are laminated, and may be formed, for example, by an electroless plating method. The Ni layer f33 contributes to improvement of adhesion with the lower electrode film f111 or the upper electrode film f113, and the Pd layer f34 functions as a diffusion preventing layer that suppresses mutual diffusion of the material of the upper electrode film or the lower electrode film and the gold of the topmost layer of each of the first and second connection electrodes f3 and f4.

A process for manufacturing the chip capacitor f101 is the same as the process for manufacturing the chip resistor f1 after the element f5 has been formed. To form the element f5 (capacitor element) in the chip capacitor f101, first, the insulating layer f20, constituted of an oxide film (for example, a silicon oxide film), is formed on the top surface of the substrate f30 (substrate f2) by a thermal oxidation method and/or CVD method. Thereafter, the lower electrode film f111, constituted of an aluminum film, is formed over the entire top surface of the insulating layer f20, for example, by the sputtering method. The film thickness of the lower electrode film f111 may be approximately 8000 Å. Thereafter, a resist pattern corresponding to the final shape of the lower electrode film f111 is formed on the top surface of the lower electrode film by photolithography. The lower electrode film is etched using the resist pattern as a mask to obtain the lower electrode film f111 of the pattern shown in FIG. 149, etc. The etching of the lower electrode film f111 may be performed, for example, by reactive ion etching.

Thereafter, the capacitance film f112, constituted of a silicon nitride film, etc., is formed on the lower electrode film f111, for example, by the plasma CVD method. In the region in which the lower electrode film f111 is not formed, the capacitance film f112 is formed on the top surface of the insulating layer f20. Thereafter, the upper electrode film f113 is formed on the capacitance film f112. The upper electrode film f113 is constituted, for example, of an aluminum film and may be formed by the sputtering method. The film thickness thereof may be approximately 8000 Å. Thereafter, a resist pattern corresponding to the final shape of the upper electrode film f113 is formed on the top surface of the upper electrode film f113 by photolithography. The upper electrode film f113 is patterned to its final shape (see FIG. 149, etc.) by etching using the resist pattern as a mask. The upper electrode film f113 is thereby shaped to the pattern having the portion divided into the plurality of electrode film portions f131 to f139 in the capacitor electrode region f113A, having the plurality of fuse units f107 in the fuse region f113C, and having the pad region f113B connected to the fuse units f107. By the dividing of the upper electrode film f113, the plurality of capacitor elements C1 to C9 can be formed in accordance with the number of electrode film portions f131 to f139. The etching for patterning the upper electrode film f113 may be performed by wet etching using an etching liquid, such as phosphoric acid, etc., or may be performed by reactive ion etching.

The element f5 (the capacitor parts C1 to C9 and the fuse units f107) in the chip capacitor f101 is formed by the above. After the element f5 has been formed, the insulating film f45 is formed by the plasma CVD method so as to cover the entire element f5 (the upper electrode film f113 and the capacitance film f112 in the region in which the upper electrode film f113 is not formed) (see FIG. 140A). Thereafter, the first groove f44 and the second groove f48 are formed (see FIG. 140B and FIG. 140C) and then the openings f25 are formed (see FIG. 140D). Probes f70 are then contacted against the pad region f113B of the upper electrode film f113 and the pad region f111B of the lower electrode film f111 that are exposed through the openings f25 to measure the total capacitance value of the plurality of capacitor parts C1 to C9 (see FIG. 140D). Based on the measured total capacitance value, the capacitor parts to be disconnected, that is, the fuses to be cut are selected in accordance with the targeted capacitance value of the chip capacitor f101.

From this state, the laser trimming for fusing the fuse units f107 is performed. That is, each fuse unit f107 constituting a fuse selected in accordance with the measurement result of the total capacitance value is irradiated with laser light and the narrow portion f107C (see FIG. 149) of the fuse unit f107 is fused. The corresponding capacitor part is thereby disconnected from the pad region f113B. When the laser light is irradiated on the fuse unit f107, the energy of the laser light is accumulated at a vicinity of the fuse unit f107 by the action of the insulating film f45 that is a cover film and the fuse unit f107 is thereby fused. The capacitance value of the chip capacitor f101 can thereby be set to the targeted capacitance value reliably.

Thereafter, a silicon nitride film is deposited on the cover film (insulating film f45), for example, by the plasma CVD method to form the passivation film f23. In the final form, the cover film is made integral with the passivation film f23 to constitute a portion of the passivation film f23. The passivation film f23 that is formed after the cutting of the fuses enters into openings in the cover film, destroyed at the same time as the fusing of the fuses, to cover and protect the cut surfaces of the fuse units f107. The passivation film f23 thus prevents entry of foreign matter and entry of moisture into the cut locations of the fuse units f107. The chip capacitor f101 of high reliability can thereby be manufactured. The passivation film f23 may be formed to have a film thickness, for example, of approximately 8000 Å as a whole.

Thereafter, the resin film f46 is formed (see FIG. 140E). Thereafter, the openings f25, closed by the resin film f46 and the passivation film f23, are opened (see FIG. 140F) and the pad region f111B and the pad region f113B are exposed from the resin film f46 (resin film f24) via the openings f25. Thereafter, the first connection electrode f3 and the second connection electrode f4 are formed, for example by the electroless plating method, on the pad region f111B and the pad region f113B, exposed from the resin film f46, in the openings f25 (see FIG. 140G).

Thereafter, as in the case of the chip resistor f1, the individual chips of the chip capacitors f101 can be cut out by grinding the substrate f30 from the rear surface f30B (see FIG. 140H). In the patterning of the upper electrode film f113 using the photolithography process, the electrode film portions f131 to f139 of minute areas can be formed with high precision and the fuse units f107 of even finer pattern can be formed. After the patterning of the upper electrode film f113, the total capacitance value is measured and then the fuses to be cut are determined. By cutting the determined fuses, the chip capacitor f101 that is accurately adjusted to the desired capacitance value can be obtained. That is, with the chip capacitor f101, a plurality of types of capacitance values can be accommodated easily and rapidly by selecting and cutting one or a plurality of the fuses. In other words, chip capacitors f101 of various capacitance values can be realized with a common design by combining the plurality of capacitor parts C1 to C9 that differ in capacitance value.

Although chip components of the sixth reference example (the chip resistor f1 and the chip capacitor f101) have been described above, the sixth reference example may be implemented in yet other modes as well. For example, although with the chip resistor f1 among the preferred embodiments described above, an example where the plurality of resistor circuits include the plurality of resistor circuits having resistance values that form a geometric progression with a common ratio r ($0<r$; $r\neq1$)=2 was described, the common ratio of the geometric progression may be a numeral other than 2. Also although with the chip capacitor f101, an example where the capacitor parts include the plurality of capacitor parts having capacitance values that form a geometric progression with a common ratio r ($0<r$; $r\neq1$)=2 was described, the common ratio of the geometric progression may be a numeral other than 2.

Also, although with the chip resistor f1 and the chip capacitor f101, the insulating layer f20 is formed on the top surface of the substrate f2, the insulating layer f20 may be omitted if the substrate f2 is an insulating substrate. Also, although with the chip capacitor f101, the arrangement where just the upper electrode film f113 is divided into the plurality of electrode film portions was described, just the lower electrode film f111 may be divided into a plurality of electrode film portions instead or both the upper electrode film f113 and the lower electrode film f111 may be divided into a plurality of electrode film portions. Further, although with the preferred embodiment, an example where the fuse units are made integral with the upper electrode film or the lower electrode film was described, the fuse units may be formed from a conductor film separate from the upper electrode film and the lower electrode film. Also, although with the chip capacitor f101, the single layer capacitor structure having the upper electrode film f113 and the lower electrode film f111 is formed, another electrode film may be laminated via a capacitance film on the upper electrode film f113 so that a plurality of capacitor structures are laminated.

With the chip capacitor f101, a conductive substrate may be used as the substrate f2, the conductive substrate may be used as a lower electrode, and the capacitance film f112 may be formed in contact with the top surface of the conductive substrate. In this case, one of the external electrodes may be led out from a rear surface of the conductive substrate. Also, in a case of applying the sixth reference example to a chip inductor, the element f5 formed on the substrate f2 in the chip inductor includes an inductor network (inductor element), which includes a plurality of inductor parts (element parts). In this case, the element f5 is disposed in a multilayer wiring formed on the top surface f2A of the substrate f2 and is formed by the wiring film f22. With the present chip inductor, the pattern of combination of the plurality of inductor parts in the inductor network can be set to any pattern by selectively disconnecting one or a plurality of fuses F, and chip inductors of various electrical characteristics of the inductor network can thus be realized with a common design.

Also, in a case of applying the sixth reference example to a chip diode, the element f5 formed on the substrate f2 in the chip diode includes a diode network (diode element), which includes a plurality of diode parts (element parts). The diode element is formed on the substrate f2. With the present chip diode, the pattern of combination of the plurality of diode parts in the diode network can be set to any pattern by selectively disconnecting one or a plurality of fuses F, and chip diodes of various electrical characteristics of the diode network can thus be realized with a common design.

With both the chip inductor and the chip diode, the same actions and effects as those in the case of the chip resistor f1 and the chip capacitor f101 can be exhibited. Also, in the first connection electrode f3 and the second connection electrode f4 described above, the Pd layer f34 interposed between the Ni layer f33 and the Au layer f35 may be omitted. The adhesion of the Ni layer f33 and the Au layer f35 is good and if the pinhole mentioned above does not form in the Au layer f35, the Pd layer f34 may be omitted.

Also, by forming the intersection portions f43 of the opening f42 of the resist pattern f41, used in forming the first groove f44 by etching as described above (see FIG. 141), to have rounded shapes, the corner portions 11 at the top surface f2A side of the substrate f2 (corner portions in the rough surface region S) can be formed to have rounded shapes in the finished chip product. Also, the arrangements of Modification Examples 1 to 5 (FIG. 144 to FIG. 148) described for the chip resistor f1 are applicable to any of the chip capacitor f101, the chip inductor, and the chip diode.

FIG. 153 is a perspective view of the outer appearance of a smartphone that is an example of an electronic equipment in which chip components according to the sixth reference example are used. The smartphone f201 is arranged by housing electronic parts in the interior of a housing f202 with a flat rectangular parallelepiped shape. The housing f202 has a pair of rectangular principal surfaces at its front side and rear side, and the pair of principal surfaces are joined by four side surfaces. A display surface of a display panel f203, constituted of a liquid crystal panel or an organic EL panel, etc., is exposed at one of the principal surfaces of the housing f202. The display surface of the display panel f203 constitutes a touch panel and provides an input interface for a user.

The display panel f203 is formed to a rectangular shape that occupies most of one of the principal surfaces of the housing f202. Operation buttons f204 are disposed along one short side of the display panel f203. In the present preferred embodiment, a plurality (three) of the operation buttons f204 are aligned along the short side of the display panel f203. The user can call and execute necessary functions by performing operations of the smartphone f201 by operating the operation buttons f204 and the touch panel.

A speaker f205 is disposed in a vicinity of the other short side of the display panel f203. The speaker f205 provides an earpiece for a telephone function and is also used as an acoustic conversion unit for reproducing music data, etc. On the other hand, close to the operation buttons f204, a microphone f206 is disposed at one of the side surfaces of the housing f202. The microphone f206 provides a mouthpiece for the telephone function and may also be used as a microphone for sound recording.

FIG. 154 is an illustrative plan view of the arrangement of an electronic circuit assembly f210 housed in the interior of the housing f202. The electronic circuit assembly f210 includes a wiring substrate f211 and circuit parts mounted on a mounting surface of the wiring substrate f211. The plurality of circuit parts include a plurality of integrated circuit elements (ICs) f212 to f220 and a plurality of chip components. The plurality of ICs include a transmission processing IC f212, a one-segment TV receiving IC f213, a GPS receiving IC f214, an FM tuner IC f215, a power supply IC f216, a flash memory f217, a microcomputer f218, a power supply IC f219, and a baseband IC f220. The plurality of chip components (corresponding to the chip components of the sixth reference example) include chip inductors f221, f225, and f235, chip resistors f222, f224, and f233, chip capacitors f227, f230, and f234, and chip diodes f228 and f231.

The transmission processing IC f212 has incorporated therein an electronic circuit arranged to generate display control signals for the display panel f203 and receive input signals from the touch panel on a top surface of the display panel f203. For connection with the display panel f203, the transmission processing IC f212 is connected to a flexible wiring f209.

The one-segment TV receiving IC f213 incorporates an electronic circuit that constitutes a receiver for receiving one-segment broadcast (terrestrial digital television broadcast targeted for reception by portable equipment) radio waves. A plurality of the chip inductors f221 and a plurality of the chip resistors f222 are disposed in a vicinity of the one-segment TV receiving IC f213. The one-segment TV receiving IC f213, the chip inductors f221, and the chip resistors f222 constitute a one-segment broadcast receiving circuit f223. The chip inductors f221 and the chip resistors f222 respectively have accurately adjusted inductances and resistances and provide circuit constants of high precision to the one-segment broadcast receiving circuit f223.

The GPS receiving IC f214 incorporates an electronic circuit that receives radio waves from GPS satellites and outputs positional information of the smartphone f201. The FM tuner IC f215 constitutes, together with a plurality of the chip resistors f224 and a plurality of the chip inductors f225 mounted on the wiring substrate f211 in a vicinity thereof, an FM broadcast receiving circuit f226. The chip resistors f224 and the chip inductors f225 respectively have accurately adjusted resistance values and inductances and provide circuit constants of high precision to the FM broadcast receiving circuit f226.

A plurality of the chip capacitors f227 and a plurality of the chip diodes f228 are mounted on the mounting surface of the wiring substrate f211 in a vicinity of the power supply IC f216. Together with the chip capacitors f227 and the chip diodes f228, the power supply IC f216 constitutes a power supply circuit f229. The flash memory f217 is a storage device for recording operating system programs, data generated in the interior of the smartphone f201, and data and programs acquired from the exterior by communication functions, etc.

The microcomputer f218 is a computing processing circuit that incorporates a CPU, a ROM, and a RAM and realizes a plurality of functions of the smartphone f201 by executing various computational processes. More specifically, computational processes for image processing and various application programs are realized by actions of the microcomputer f218. A plurality of the chip capacitors f230 and a plurality of the chip diodes f231 are mounted on the mounting surface of the wiring substrate f211 in a vicinity of the power supply IC f219. Together with the chip capacitors f230 and the chip diodes f231, the power supply IC f219 constitutes a power supply circuit f232.

A plurality of the chip resistors f233, a plurality of the chip capacitors f234, and a plurality of the chip inductors f235 are mounted on the mounting surface of the wiring substrate f211 in a vicinity of the baseband IC f220. Together with the chip resistors f233, the chip capacitors f234, and the chip inductors f235, the baseband IC f220 constitutes a baseband communication circuit f236. The baseband communication circuit f236 provides communication functions for telephone communication and data communication.

With the above arrangement, electric power that is appropriately adjusted by the power supply circuits f229 and f232 is supplied to the transmission processing IC f212, the GPS receiving IC f214, the one-segment broadcast receiving circuit f223, the FM broadcast receiving circuit f226, the baseband communication circuit f236, the flash memory f217, and the microcomputer f218. The microcomputer f218 performs computational processes in response to input signals input via the transmission processing IC f212 and makes the display control signals be output from the transmission processing IC f212 to the display panel f203 to make the display panel f203 perform various displays.

When receiving of a one-segment broadcast is commanded by operation of the touch panel or the operation buttons f204, the one-segment broadcast is received by actions of the one-segment broadcast receiving circuit f223. Computational processes for outputting the received images to the display panel f203 and making the received audio signals be acoustically converted by the speaker f205 are executed by the microcomputer f218. Also, when positional information of the smartphone f201 is required, the microcomputer f218 acquires the positional information output by the GPS receiving IC f214 and executes computational processes using the positional information.

Further, when an FM broadcast receiving command is input by operation of the touch panel or the operation buttons f204, the microcomputer f218 starts up the FM broadcast receiving circuit f226 and executes computational processes for outputting the received audio signals from the speaker f205. The flash memory f217 is used for storing data acquired by communication and storing data prepared by computations by the microcomputer f218 and inputs from the touch panel. The microcomputer f218 writes data into the flash memory f217 or reads data from the flash memory f217 as necessary.

The telephone communication or data communication functions are realized by the baseband communication circuit f236. The microcomputer f218 controls the baseband communication circuit f236 to perform processes for sending and receiving audio signals or data.

Invention According to a Seventh Reference Example

(1) Features of the Invention According to the Seventh Reference Example

For example, the features of the invention according to the seventh reference example are the following G1 to G18.

(G1) A chip resistor including a rectangular substrate having a pair of mutually facing long sides and a pair of mutually facing short sides, a first electrode disposed on the substrate and along a first long side among the pair of long sides, a second electrode disposed on the substrate and along a second long side among the pair of long sides, a plurality of resistor circuits formed between the first electrode and the second electrode and including a resistor body film formed on the substrate and a wiring film laminated in contact with the resistor body film, and a plurality of disconnectable fuses formed between the first electrode and the second electrode and respectively connecting the plurality of resistor circuits.

By this arrangement, the electrode area can be made large to improve the heat dissipation efficiency even when the size is small. That is, variation of the resistance value due to temperature characteristics of the resistor bodies can be suppressed because the heat dissipation efficiency is high. A chip resistor of accurate resistance value and small size can thus be realized. With a conventional structure, a chip resistor that is made compact becomes high in temperature, may thus be subject to severe temperature cycling, and may thus be poor in temperature cycling characteristics. Further, by the chip resistor becoming high in temperature, solder between the chip resistor and the mounting wiring substrate may melt and the reliability of solder bonding may thus degrade. All of these problems are resolved by the seventh reference example.

Also, a chip resistor of low resistance can be realized. This is because the resistor body film in the plurality of resistor circuits can be made wide in width and short in length.

(G2) The chip resistor according to G1, where at least one of the first electrode and the second electrode is formed along the entire range of the corresponding long side. With this arrangement, the pair of electrodes are formed along the long direction of the substrate and moreover each electrode extends across the entire length of the substrate so that the electrode area can be increased to further improve the heat dissipation characteristics.

(G3) The chip resistor according to G2, where at least one of the first electrode and the second electrode is formed continuously along the entire range of the corresponding long side.

By this arrangement, a large electrode can be formed in a compact chip resistor, thereby enabling the realization of a chip resistor of accurate resistance value and small size.

(G4) The chip resistor according to G2, where at least one of the first electrode and the second electrode includes a plurality of electrode portions disposed at intervals along the corresponding long side.

(G5) The chip resistor according to G1 or G2, where the first electrode includes an electrode portion disposed along the first long side, the second electrode includes a plurality of electrode portions disposed at intervals along the second long side, and the respective electrode portions of the first electrode and the second electrode are disposed so as not to have overlapping portions when viewed in a direction along the short side.

With the arrangements of G4 and G5, the first electrode and the second electrode face each other in the short side direction of the chip resistor so that the interval between the electrodes is short. There is thus a possibility of solder short-circuiting the first electrode and second electrode when solder bonding onto a mounting substrate is performed. This problem is resolved by shifting the layout of the first electrode and the second electrode in regard to the long side direction.

(G6) The chip resistor according to any one of G1 to G5, where the length of the long side is not more than 0.4 mm and the length of the short side is not more than 0.2 mm.

By this arrangement, the electrode area can be made large to improve the heat dissipation efficiency even when the size is small. That is, even when the size is small, variation of performance due to temperature characteristics of a functional element can be suppressed because the heat dissipation efficiency is high. A chip component of accurate characteristics and small size can thus be realized.

(G7) The chip resistor according to any one of G1 to G6, where the resistance value between the first electrode and the second electrode is 1 mΩ to 1 GΩ.

By this arrangement, a compact chip resistor of low resistance value can be realized.

(G8) A chip component including a rectangular substrate having a pair of mutually facing long sides and a pair of mutually facing short sides, a first electrode disposed on the substrate and along a first long side among the pair of long sides, a second electrode disposed on the substrate and along a second long side among the pair of long sides, and a functional element formed in atop surface region sandwiched by the first electrode and the second electrode.

(G9) The chip component according to G8, where at least one of the first electrode and the second electrode is formed along the entire range of the corresponding long side.

(G10) The chip component according to G9, where at least one of the first electrode and the second electrode is formed continuously along the entire range of the corresponding long side.

(G11) The chip component according to any one of G8 to G10, including a plurality of disconnectable fuses formed between the first electrode and the second electrode and respectively connecting the plurality of resistor circuits, and where the functional element includes a diode and the chip component is a chip diode.

(G12) The chip component according to any one of G8 to G10, where the functional element includes an inductor and the chip component is a chip inductor.

(G13) The chip component according to any one of G8 to G10, where the functional element includes a capacitor and the chip component is a chip capacitor.

(G14) The chip component according to any one of G8 to G13, including a plurality of disconnectable fuses formed between the first electrode and the second electrode and selectively connecting the functional element.

(G15) The chip component according to any one of G8 to G14, where the length of the long side is not more than 0.4 mm and the length of the short side is not more than 0.2 mm.

By the arrangement of each of G8 to G15, the electrode area can be made large to improve the heat dissipation efficiency even when the size is small. Variation due to temperature characteristics of the functional element can be suppressed because the heat dissipation efficiency is high, and a chip component of improved characteristics can be provided.

(G16) A circuit assembly including a mounting substrate and the chip resistor according to any one of G1 to G7 or the chip component according to any one of G8 to G15 that is mounted on the substrate.

(G17) The circuit assembly according to G16, where the mounting substrate is a flexible substrate capable of being bent in a predetermined bending direction and the chip resistor or the chip component is mounted on the mounting substrate with the pair of long sides being aligned in a direction orthogonal to the bending direction of the flexible substrate.

With the arrangement of each of G16 and G17, the chip resistor or the chip component is large in electrode area, is therefore large in area of bonding with the mounting substrate, and can be bonded firmly to the mounting substrate. Therefore even if a difference in thermal expansion coefficient occurs between the mounting substrate and the chip resistor or the chip component, the bonded portions are unlikely to peel. Also, the distance between the bonded portions is short so that the bending stress applied to the chip resistor is small and the chip resistor or the chip component is thus unlikely to break. In particular, the bending stress applied to the chip resistor or the chip component from the mounting substrate is minimized when the long side of the chip resistor or the chip component is disposed so as to be orthogonal to the bending direction of the mounting substrate. Further, the heat dissipation path is short because the distance from a resistive element or functional element to an electrode is short, and the heat dissipation area is large because the electrode area is large. A circuit assembly that is unlikely to be damaged by temperature cycling and is low in thermal stress can thus be provided.

(G18) An electronic equipment including a housing and the circuit assembly according to G16 or G17 housed in the housing.

By this arrangement, an electronic equipment that is compact and high in performance can be provided.

(2) Preferred Embodiments of the Invention Related to the Seventh Reference Example Preferred embodiments of the seventh reference example shall now be described in detail with reference to the attached drawings. The symbols indicated in FIG. 155 to FIG. 188 are effective only for these drawings and, even if used in other preferred embodiments, do not indicate the same components as the symbols in the other preferred embodiments.

(2-1) Description of a Preferred Embodiment of a Chip Resistor

FIG. 155(A) is an illustrative perspective view of the external arrangement of a chip resistor g10 according to a preferred embodiment of the seventh reference example and FIG. 155(B) is a side view of a state where the chip resistor g10 is mounted on a substrate. With reference to FIG. 155(A), the chip resistor g10 according to the preferred embodiment of the seventh reference example includes a first connection electrode g12, a second connection electrode g13, and a resistor network g14 that are formed on a substrate g11. The substrate g11 has a rectangular parallelepiped shape with a substantially rectangular shape in a plan view and is a minute chip with, for example, the length in the long side direction being L=0.3 mm, the width in the short side direction being W=0.15 mm, and the thickness being T=0.1 mm, approximately. The substrate g11 may have a corner-rounded shape with the corners being chamfered in a plan view. The substrate may be formed, for example, of silicon, glass, ceramic, etc. With the preferred embodiment described below, a case where the substrate g11 is a silicon substrate shall be described as an example.

On the substrate g11, the first connection electrode g12 is a rectangular electrode that is disposed along one long side g111 of the substrate g11 and is long in the long side g111 direction. The second connection electrode g13 is a rectangular electrode that is disposed on the substrate g11 along the other long side g112 and is long in the long side g112 direction. A feature of the present preferred embodiment is that the pair of connection electrodes are formed along the pair of long sides g111 and g112 of the substrate g11. The resistor network g14 is provided in a central region (circuit forming surface or element forming surface) on the substrate g11 sandwiched by the first connection electrode g12 and the second connection electrode g13. One end side of the resistor network g14 is electrically connected to the first connection electrode g12 and the other end side of the resistor network g14 is electrically connected to the second connection electrode g13. The first connection electrode g12, the second connection electrode g13, and the resistor network g14 may be provided on the substrate g11 by using, for example, a micromachining process. In particular, the resistor network g14 with a fine and accurate layout pattern can be formed by using a photolithography process to be described below.

The first connection electrode g12 and the second connection electrode g13 respectively function as external connection electrodes. In a state where the chip resistor g10 is mounted on a circuit substrate g15, the first connection electrode g12 and the second connection electrode g13 are respectively connected electrically and mechanically by solders to circuits (not shown) of the circuit substrate g15 as shown in FIG. 155(B). Preferably with each of the first connection electrode g12 and the second connection electrode g13 functioning as external connection electrodes, at least a top surface region is formed of gold (Au) or gold plating is applied to the top surface to improve solder wettability and improve reliability.

FIG. 156 is a plan view of the chip resistor g10 showing the positional relationship of the first connection electrode g12, the second connection electrode g13, and the resistor network g14 and shows the arrangement in a plan view (layout pattern) of the resistor network g14. With reference to FIG. 156, the chip resistor g10 includes the first connection electrode g12, disposed with the long side parallel to the one long side g111 of the substrate g11 upper surface and having a substantially long rectangular shape in a plan view, the second connection electrode g13, disposed with the long side parallel to the other long side g112 of the substrate g11 upper surface and having a substantially long rectangular shape in a plan view, and the resistor network g14 provided in the region of rectangular shape in a plan view between the first connection electrode g12 and the second connection electrode g13.

The resistor network g14 has multiple unit resistor bodies R having an equal resistance value and arrayed in a matrix on the substrate g11 (the example of FIG. 156 has an arrangement including a total of 352 unit resistor bodies R with 8 unit resistor bodies R arrayed along the row direction (width (short) direction of the substrate g11) and 44 unit resistor bodies R arrayed along the column direction (length direction of the substrate g11)). A predetermined number from 1 to 64 of the multiple unit resistor bodies R are electrically connected by conductor films C (each conductor film C preferably being a wiring film formed of an aluminum-based metal, such as Al, AlSi, AlSiCu, or AlCu, etc.) to form each of a plurality of types of resistor circuits in accordance with each number of unit resistor bodies R connected.

Further, a plurality of fuses F (preferably wiring films formed of aluminum-based metal films of Al, AlSi, AlSiCu, or AlCu, etc., that is the same material as that of the conductor film C and hereinafter also referred to as "fuses") are provided that are capable of being fused to electrically incorporate resistor circuits into the resistor network g14 or electrically separate resistor circuits from the resistor network g14. The plurality of fuses F are arrayed along the inner side of the second connection electrode g13 so that the positioning region thereof is rectilinear. More specifically, the plurality of fuses F and the connection conductor films, that is, the wiring films C are aligned adjacently and disposed so that the alignment directions thereof are rectilinear.

FIG. 157A is an enlarged plan view of a portion of the resistor network g14 shown in FIG. 156, and FIG. 157B and FIG. 157C are a vertical sectional view in the length direction and a vertical sectional view in the width direction, respectively, for describing the structure of the unit resistor bodies R in the resistor network g14. The arrangement of the unit resistor bodies R shall now be described with reference to FIG. 157A, FIG. 157B, and FIG. 157C.

An insulating layer ($SiO_2$) g19 is formed on an upper surface of the substrate g11, and a resistor body film g20 is disposed on the insulating layer g19. The resistor body film g20 is made of a material containing one or more types of material selected from the group consisting of NiCr, NiCrAl, NiCrSi, NiCrSiAl, TaN, $TaSiO_2$, TiN, TiNO, and TiSiON. By forming the resistor body film g20 from such a material, micromachining by photolithography is made possible. Also, a chip resistor of accurate resistance value with which the resistance value does not change readily due to influences of temperature characteristics can be prepared. The resistor body film g20 is arranged as a plurality of resistor body films (hereinafter referred to as "resistor body film lines") extending parallel as straight lines between the first connection electrode g12 and the second connection electrode g13, and there are cases where a resistor body film line g20 is cut at predetermined positions in the line direction. An aluminum film is laminated as conductor film pieces g21 on the resistor body film lines g20. The respective conductor film pieces g21 are laminated on the resistor body film lines g20 at fixed intervals R in the line direction.

The electrical features of the resistor body film lines g20 and the conductor film pieces g21 of the present arrangement are indicated by circuit symbols in FIG. 158. That is, as shown in FIG. 158(A), each resistor body film line g20 portion in a region of the predetermined interval IR forms a unit resistor body R with a fixed resistance value r. In each region in which a conductor film piece g21 is laminated, the resistor body film line g20 is short-circuited by the conductor film piece g21. A resistor circuit, made up of serial connections of unit resistor bodies R of resistance r, is thus formed as shown in FIG. 158(B).

Also, adjacent resistor body film lines g20 are connected to each other by the resistor body film lines g20 and the conductor film pieces g21 so that the resistor network shown in FIG. 157A forms the resistor circuit shown in FIG. 158(C). In the illustrative sectional views of FIG. 157B and FIG. 157C, the reference symbol g11 indicates the substrate, g19 indicates the silicon dioxide $SiO_2$ layer as an insulating layer, g20 indicates the resistor body film formed on the insulating layer g19, g21 indicates the wiring film made of aluminum (Al), g22 indicates an SiN film as a protective film, and g23 indicates a polyimide layer as a protective film.

As mentioned above, the material of the resistor body film g20 is constituted of the material containing one or more types of material selected from the group consisting of NiCr, NiCrAl, NiCrSi, NiCrSiAl, TaN, $TaSiO_2$, TiN, TiNO, and TiSiON. Also, the film thickness of the resistor body film g20 is preferably 300 Å to 1 μm. This is because by setting the film thickness of the resistor body film g20 in this range, a temperature coefficient of 50 ppm/° C. to 200 ppm/° C. can be realized for the resistor body film g20 and the chip resistor becomes one that is not readily influenced by temperature characteristics.

A chip resistor that is satisfactory for practical use can be obtained if the temperature coefficient of the resistor body film g20 is less than 1000 ppm/° C. Further, the resistor body film g20 preferably has a structure that includes linear components having a line width of 1 μm to 1.5 μm. This is because miniaturization of the resistor circuit and satisfactory temperature characteristics can then be realized at the same time. In place of Al, the wiring film g21 may be constituted of an aluminum-based metal film, such as AlSi, AlSiCu, or AlCu. By thus forming the wiring film g21 (including the fuses F) from an aluminum-based metal film, the processing precision can be improved.

A process for manufacturing the resistor network g14 with the above arrangement shall be described in detail later. In the present preferred embodiment, the unit resistor bodies R, included in the resistor network g14 formed on the substrate g11, include the resistor body film lines g20 and the plurality of conductor film pieces g21 that are laminated on the resistor body film lines g20 at fixed intervals in the line direction, and a single unit resistor body R is arranged from the resistor body film line g20 at the fixed interval IR portion on which the conductor film piece g21 is not laminated. The resistor body film lines g20 making up the unit resistor bodies R are all equal in shape and size. Therefore based on the characteristic that resistor body films of the same shape and same size that are formed on a substrate are substantially the same in value, the multiple unit resistor bodies R arrayed in a matrix on the substrate g11 have an equal resistance value.

The conductor film pieces g21 laminated on the resistor body film lines g20 form the unit resistor bodies R and also serve the role of connection wiring films that connect a plurality of unit resistor bodies R to arrange a resistor circuit. FIG. 159(A) is a partially enlarged plan view of a region including the fuses F drawn by enlarging a portion of the plan view of the chip resistor g10 shown in FIG. 156, and FIG. 159(B) is a structural sectional view taken along B-B in FIG. 159(A).

As shown in FIGS. 159(A) and 159(B), the fuses F are also formed by the wiring film g21 laminated on the resistor body film g20. That is, the fuses F are formed of aluminum (Al), which is the same metal material as that of the conductor film pieces g21, at the same layer as the conductor film pieces g21, which are laminated on the resistor body film lines g20 that form the unit resistor bodies R. As mentioned above, the conductor film pieces g21 are also used as the connection conductor films C that electrically connect a plurality of unit resistor bodies R to form a resistor circuit.

That is, at the same layer laminated on the resistor body film g20, the wiring films forming the unit resistor bodies R, the connection wiring films forming the resistor circuits, the connection wiring films making up the resistor network g14, the fuses F, and the wiring films connecting the resistor network g14 to the first connection electrode g12 and the second connection electrode g13 are formed by the same manufacturing process (for example, a sputtering and photolithography process) using the same aluminum-based metal material (for example, aluminum). The manufacturing process of the chip resistor g10 is thereby simplified and also, various types of wiring films can be formed at the same time using a mask in common. Further, the property of alignment with respect to the resistor body film g20 is also improved.

FIG. 160 is an illustrative diagram of the array relationships of the connection conductor films C and the fuses F connecting a plurality of types of resistor circuits in the resistor network g14 shown in FIG. 156 and the connection relationships of the plurality of types of resistor circuits connected to the connection conductor films C and fuses F. With reference to FIG. 160, one end of a reference resistor circuit R8, included in the resistor network g14, is connected to the first connection electrode g12. The reference resistor circuit R8 is formed by a serial connection of 8 unit resistor bodies R and the other end thereof is connected to a fuse F1.

One end and the other end of a resistor circuit R64, formed by a serial connection of 64 unit resistor bodies R, are connected to the fuse F1 and a connection conductor film C2. One end and the other end of a resistor circuit R32, formed by a serial connection of 32 unit resistor bodies R, are connected to the connection conductor film G2 and a fuse F4. One end and the other end of a resistor circuit body R32, formed by a serial connection of 32 unit resistor bodies R, are connected to the fuse F4 and a connection conductor film C5.

One end and the other end of a resistor circuit R16, formed by a serial connection of 16 unit resistor bodies R, are connected to the connection conductor film G5 and a fuse F6. One end and the other end of a resistor circuit R8, formed by a serial connection of 8 unit resistor bodies R, are connected to a fuse F7 and a connection conductor film C9.

One end and the other end of a resistor circuit R4, formed by a serial connection of 4 unit resistor bodies R, are connected to the connection conductor film C9 and a fuse F10.

One end and the other end of a resistor circuit R2, formed by a serial connection of 2 unit resistor bodies R, are connected to a fuse F11 and a connection conductor film C12. One end and the other end of a resistor circuit body R1, formed of a single unit resistor body R, are connected to the connection conductor film C12 and a fuse F13. One end and the other end of a resistor circuit R/2, formed by a parallel connection of 2 unit resistor bodies R, are connected to the fuse F13 and a connection conductor film C15.

One end and the other end of a resistor circuit R/4, formed by a parallel connection of 4 unit resistor bodies R, are connected to the connection conductor film C15 and a fuse F16. One end and the other end of a resistor circuit R/8, formed by a parallel connection of 8 unit resistor bodies R, are connected to the fuse F16 and a connection conductor film C18. One end and the other end of a resistor circuit R/16, formed by a parallel connection of 16 unit resistor bodies R, are connected to the connection conductor film C18 and a fuse F19.

A resistor circuit R/32, formed by a parallel connection of 32 unit resistor bodies R, is connected to the fuse F19 and a connection conductor film C22. With the plurality of fuses F and connection conductor films C, the fuse F1, the connection conductor film C2, the fuse F3, the fuse F4, the connection conductor film C5, the fuse F6, the fuse F7, the connection conductor film C8, the connection conductor film C9, the fuse F10, the fuse F11, the connection conductor film C12, the fuse F13, a fuse F14, the connection conductor film C15, the fuse F16, the fuse F17, the connection conductor film C18, the fuse F19, the fuse F20, the connection conductor film C21, and the connection conductor film C22 are disposed rectilinearly and connected in series. With this arrangement, when a fuse F is fused, the electrical connection with the connection conductor film C connected adjacently to the fuse F is interrupted.

This arrangement is illustrated in the form of an electric circuit diagram in FIG. 161. That is, in a state where none of the fuses F is fused, the resistor network g14 forms a resistor circuit of the reference resistor circuit R8 (resistance value: 8r), formed by the serial connection of the 8 unit resistor bodies R provided between the first connection electrode g12 and the second connection electrode g13. For example, if the resistance value r of a single unit resistor body R is r=80Ω, the chip resistor g10 is arranged with the first connection electrode g12 and the second connection electrode g13 being connected by a resistor circuit of 8r=640Ω.

With each of the plurality of types of resistor circuits besides the reference resistor circuit R8, a fuse F is connected in parallel, and these plurality of types of resistor circuits are put in short-circuited states by the respective fuses F. That is, although 13 resistor circuits R64 to R/32 of 12 types are connected in series to the reference resistor circuit R8, each resistor circuit is short-circuited by the fuse F that is connected in parallel and thus electrically, the respective resistor circuits are not incorporated in the resistance network g14.

With the chip resistor g10 according to the present preferred embodiment, a fuse F is selectively fused, for example, by laser light in accordance with the required resistance value. The resistor circuit with which the fuse F connected in parallel is fused is thereby incorporated into the resistor network g14. The resistor network g14 can thus be made a resistor network with the overall resistance value being the resistance value resulting from serially connecting and incorporating the resistor circuits corresponding to the fused fuses F.

In other words, with the chip resistor g10 according to the present preferred embodiment, by selectively fusing the fuses F corresponding to a plurality of types of resistor circuits, the plurality of types of resistor circuits (for example, the serial connection of the resistor circuits R64, R32, and R1 in the case of fusing F1, F4, and F13) can be incorporated into the resistor network. The respective resistance values of the plurality of types of resistor circuits are predetermined, and the chip resistor g10 can thus be made to have the required resistance value by adjusting the resistance value of the resistance network g14 in a so to speak digital manner.

Also, the plurality of types of resistor circuits include the plurality of types of serial resistor circuits, with which the unit resistor bodies R having an equal resistance value are connected in series with the number of unit resistor bodies R being increased in geometric progression as 1, 2, 4, 8, 16, 32, and 64, and the plurality of types of parallel resistor circuits, with which the unit resistor bodies R having an equal resistance value are connected in parallel with the number of unit resistor bodies R being increased in geometric progression as 2, 4, 8, 16, and 32. These are connected in series in states of being short-circuited by the fuses F. Therefore by selectively fusing the fuses F, the resistance value of the resistor network g14 as a whole can be set to an arbitrary resistance value within a wide range from a small resistance value to a large resistance value.

FIG. 162 is a plan view of a chip resistor g30 according to another preferred embodiment of the seventh reference example and shows the positional relationship of the first connection electrode g12, the second connection electrode g13, and the resistor network 4 and shows the arrangement in a plan view of the resistor network g14. The first connection electrode g12 and the second connection electrode g13 are disposed along the pair of long sides of the substrate g11 in the present preferred embodiment as well.

The chip resistor g30 differs from the chip resistor g10 described above in the mode of connection of the unit resistor bodies R in the resistor network g14. That is, the resistor network g14 of the chip resistor g30 has multiple unit resistor bodies R having an equal resistance value and arrayed in a matrix on the substrate g11 (the arrangement of FIG. 162 is an arrangement including a total of 352 unit resistor bodies R with 8 unit resistor bodies R arrayed along the row direction (short (width) direction of the substrate g11) and 44 unit resistor bodies R arrayed along the column direction (length direction of the substrate g11)). A predetermined number from 1 to 128 of the multiple unit resistor bodies R are electrically connected to form a plurality of types of resistor circuits. The plurality of types of resistor circuits thus formed are connected in parallel modes by conductor films and the fuses F as network connection means. The plurality of fuses F are arrayed along the inner side of the second connection electrode g13 so that the positioning region thereof is rectilinear, and when a fuse F is fused, the resistor circuit connected to the fuse F is electrically separated from the resistor network g14.

The material and structure of the multiple unit resistor bodies R forming the resistor network g14, and the material and structures of the connection conductor films and fuses F are the same as the structures of the corresponding portions in the chip resistor g10 and description of these shall thus be omitted here. FIG. 163 is an illustrative diagram of the connection modes of the plurality of types of resistor circuits in the resistor network shown in FIG. 162, the array relationship of the fuses F connecting the resistor circuits, and the connection relationships of the plurality of types of resistor circuits connected to the fuses F.

Referring to FIG. 163, one end of a reference resistor circuit R/16, included in the resistor network g14, is connected to the first connection electrode g12. The reference resistor circuit R/16 is formed by a parallel connection of 16 unit resistor bodies R and the other end thereof is connected to the connection conductor film C, to which the remaining resistor circuits are connected. One end and the other end of a resistor circuit R128, formed by a serial connection of 128 unit resistor bodies R, are connected to the fuse F1 and the connection conductor film C.

One end and the other end of a resistor circuit R64, formed by the serial connection of 64 unit resistor bodies R, are connected to the fuse F5 and the connection conductor film C. One end and the other end of a resistor circuit R32, formed by the serial connection of 32 unit resistor bodies R, are connected to the fuse film F6 and the connection conductor film C. One end and the other end of a resistor circuit R16, formed by the serial connection of 16 unit resistor bodies R, are connected to the fuse F7 and the connection conductor film C.

One end and the other end of a resistor circuit R8, formed by the serial connection of 8 unit resistor bodies R, are connected to the fuse F8 and the connection conductor film C. One end and the other end of a resistor circuit R4, formed by the serial connection of 4 unit resistor bodies R, are connected to the fuse F9 and the connection conductor film C. One end and the other end of a resistor circuit R2, formed by the serial connection of 2 unit resistor bodies R, are connected to the fuse F10 and the connection conductor film C.

One end and the other end of a resistor circuit R1, formed of the single unit resistor body R, are connected to the fuse F11 and the connection conductor film C. One end and the other end of a resistor circuit R/2, formed by the parallel connection of 2 unit resistor bodies R, are connected to the fuse F12 and the connection conductor film C. One end and the other end of a resistor circuit R/4, formed by the parallel connection of 4 unit resistor bodies R, are connected to the fuse F13 and the connection conductor film C.

The fuses F14, F15, and F16 are electrically connected, and one end and the other end of a resistor circuit R/8, formed by the parallel connection of 8 unit resistor bodies R, are connected to the fuses F14, F15, and F16 and the connection conductor film C. The fuses F17, F18, F19, F20, and F21 are electrically connected, and one end and the other end of a resistor circuit R/16, formed by the parallel connection of 16 unit resistor bodies R, are connected to the fuses F17 to F21 and the connection conductor film C.

The 21 fuses F of fuses F1 to F21 are provided and all of these are connected to the second connection electrode g13. With this arrangement, when a fuse F, to which one end of a resistor circuit is connected, is fused, the resistor circuit having one end connected to the fuse F is electrically disconnected from the resistor network g14.

The arrangement of FIG. 163, that is, the arrangement of the resistor network g14 included in the chip resistor g30, is illustrated in the form of an electric circuit diagram in FIG. 164. In a state where none of the fuses F is fused, the resistor network g14 forms, between the first connection electrode g14 and the second connection electrode g13, a serial connection circuit of the reference resistor circuit R/16 and the parallel connection circuit of the 12 types of resistor circuits R/16, R/8, R/4, R/2, R1, R2, R4, R8, R16, R32, R64, and R128.

A fuse F is serially connected to each of the 12 types of resistor circuits besides the reference resistor circuit R/16. Therefore with the chip resistor g30 having the resistor network g14, by selectively fusing a fuse F, for example, by laser light in accordance with the required resistance value, the resistor circuit corresponding to the fused fuse F (the resistor circuit connected in series to the fuse F) is electrically separated from the resistor network g14 and the resistance value of the chip resistor g10 can thereby be adjusted.

In other words, with the chip resistor g30 according to the present preferred embodiment, by selectively fusing the fuses F provided in correspondence to a plurality of types of resistor circuits, the plurality of types of resistor circuits can be electrically separated from the resistor network. The respective resistance values of the plurality of types of resistor circuits are predetermined, and the chip resistor g30 can thus be made to have the required resistance value by adjusting the resistance value of the resistance network g14 in a so to speak digital manner.

Also, the plurality of types of resistor circuits include the plurality of types of serial resistor circuits, with which the unit resistor bodies R having an equal resistance value are connected in series with the number of unit resistor bodies R being increased in geometric progression as 1, 2, 4, 8, 16, 32, 64, and 128, and the plurality of types of parallel resistor circuits, with which the unit resistor bodies R having an equal resistance value are connected in parallel with the number of unit resistor bodies R being increased in geometric progression as 2, 4, 8, and 16. Therefore by selectively fusing the fuses F, the resistance value of the resistor network g14 as a whole can be set to an arbitrary resistance value finely and digitally.

With the electric circuit shown in FIG. 164, there is a tendency for an overcurrent to flow in resistor circuits of low resistance value among the reference resistor circuit R/16 and the parallel-connected resistor circuits, and the rated current that can be allowed to flow through the resistors must be designed to be large in setting the resistors. Therefore to disperse the current, the connection structure of the resistor network of the electric circuit shown in FIG. 164 may be changed to the electric circuit arrangement shown in FIG. 165(A). That is, the reference resistor circuit R/16 is eliminated, and the parallel-connected resistor circuits are changed to a circuit that includes an arrangement g140 in which the minimum resistance value is set to r and a plurality of sets of resistance units R1 of resistance value r are connected in parallel.

FIG. 165(B) is an electric circuit diagram with specific resistance values indicated therein and the circuit is arranged to include the arrangement g140 in which a plurality of sets of a serial connection of an 80Ω unit resistor body and the fuse F are connected in parallel. The current flowing through can thereby be dispersed. FIG. 166 is an electric circuit diagram of the circuit arrangement of a resistor network g14 included in a chip resistor according to yet another preferred embodiment of the seventh reference example. A feature of the resistor network g14 shown in FIG. 166 is a circuit arrangement in which a serial connection of a plurality of types of resistor circuits and a parallel connection of a plurality of types of resistor circuits are connected in series.

With the plurality of types of resistor circuits connected in series, a fuse F is connected in parallel to each resistor circuit and all of the plurality of types resistor circuits connected in series are put in short circuited states by the fuses F as in the preferred embodiments described above. Therefore, when a fuse F is fused, the resistor circuit short-circuited by the fuse F is electrically incorporated in the resistor network g14. On the other hand, a fuse F is connected in series to each of the plurality of types of resistor circuits connected in parallel. Therefore, by fusing a fuse F, the resistor circuit connected in series to the fuse F can be electrically disconnected from the parallel connection of the resistor circuits.

By this arrangement, for example, a low resistance of not more than 1 kΩ can be prepared at the parallel connection side and resistor circuits of not less than 1 kΩ can be prepared at the serial connection side. A wide range of resistor circuits from those of low resistance of several Ω to those of high resistance of several MΩ can thus be prepared using resistor networks g14 arranged with the same basic design. If a resistance value is to be set more precisely, the fuse film of a resistor circuit at the serial connection side that is close to the required resistance value can be fused in advance and fine adjustment of the resistance value can then be performed by fusing the fuses F of resistor circuits at the parallel connection side to thereby improve the precision of adjustment to the desired resistance value.

FIG. 167 is an electric circuit diagram of a specific arrangement example of the resistor network g14 in a chip resistor having a resistance value in a range of 10Ω to 1 MΩ. The resistor network g14 shown in FIG. 167 also has the circuit arrangement in which a serial connection of a plurality of types of resistor circuits short-circuited by the fuses F and a parallel connection of a plurality of types of resistor circuits serially connected to the fuses F are connected in series.

With the resistor circuit of FIG. 167, an arbitrary resistance value from 10 to 1 kΩ can be set at a precision of within 1% at the parallel connection side. Also, an arbitrary resistance value from 1 k to 1 MΩ can be set at a precision of within 1% at the serial connection side. In a case of using a circuit at the serial connection side, the merit of being able to set the resistance value more precisely is provided by fusing the fuse F of a resistor circuit close to the desired resistance value and adjusting to the desired resistance value in advance.

Although only cases where the same layer is used for the fuses F as that used for the connection conductor films C has been described, the connection conductor film C portions may have another conductor film laminated further thereon to decrease the resistance value of the conductor films. Also, the resistor body film may be eliminated to use only the connection conductor films C. Even in these cases, the fuses F are not degraded in fusing property as long as a conductor film is not laminated on the fuses F.

FIG. 168 is an illustrative plan view for describing the structure of principal portions of a chip resistor g90 according to yet another preferred embodiment of the seventh reference example. For example, with the chip resistor g10 (see FIG. 155 and FIG. 156) and the chip resistor g30 (see FIG. 162) described above, the relationship, expressed in a plan view, of the resistor body film lines g20 and the conductor film pieces g21 constituting the resistor circuits has the arrangement shown in FIG. 168(A). That is, as shown in FIG. 168(A), the resistor body film line g20 portion in the region of the predetermined interval IR forms the unit resistor body R with the fixed resistance value r. Conductor film pieces g21 are laminated at both sides of the unit resistor body R and the resistor body film line g20 is short-circuited by the conductor film pieces g21.

Here, with the chip resistor g10 and the chip resistor g30, the length of the resistor body film line g20 portion forming the unit resistor body R is, for example, 12 μm, the width of the resistor body film line g20 is, for example, 1.5 μm, and the unit resistance (sheet resistance) 10Ω/€. The resistance value r of the unit resistor body R is thus r=80Ω. With the chip resistor g10 shown in FIG. 155 and FIG. 156, for example, there is a demand for increasing the resistance value of the resistor network g14 without expanding the arrangement region of the resistor network g14 to realize a high resistance in the chip resistor g10.

Therefore with the chip resistor g90 according to the present preferred embodiment, the layout of the resistor network g14 is changed and the unit resistor body constituting the resistor circuits included in the resistor network is made to have the shape and size shown in FIG. 168(B). With reference to FIG. 168(B), the resistor body film line g20 includes a line-shaped resistor body film line g20 that extends in a straight line with a width of 1.5 μm. In the resistor body film line g20, the resistor body film line g20 portion of a predetermined interval R' forms a unit resistor body R' with a fixed resistance value r'. The length of the unit resistor body R' is set, for example, to 17 μm. The unit resistor body R' can thereby be arranged as a unit resistor body with a resistance value r' of r'=160Ω, that is, substantially twice that of the unit resistor body R shown in FIG. 168(A).

Also, the length of the conductor film piece g21 laminated on the resistor body film line g20 can be arranged to be the same length in the arrangement shown in FIG. 168(A) and in the arrangement shown in FIG. 168(B). A high resistance is thus realized in the chip resistor g90 by changing the layout pattern of the respective unit resistor bodies R' constituting the resistor circuits included in the resistor network g14 to a layout pattern in which the unit resistor bodies R' can be connected serially.

FIG. 169 shows plan views of layout arrangements (layouts) of electrodes of chip resistors according to other preferred embodiments of the seventh reference example. The chip resistor g40 shown in FIG. 169(A) has, on the substrate g11, the first connection electrode g12 that is disposed along the one long side g111 of the substrate g11 and is long in the long side g111 direction and the second connection electrode g13 that is disposed along the other long side g112 of the substrate g11 and is long in the long side g112 direction. The substrate g11 has a width W of 300 μm and a length L of 150 μm. Each of the first connection electrode g12 and the second connection electrode g13 on the substrate g11 has a width W of 300 μm and a length of 50 μm, and therefore the resistor network forming region g14 sandwiched by the electrodes g12 and g13 is an elongate region with a width W of 300 μm and a length of 50 μm. The ratio of length/width (L/W) is set to 0.17.

When, as in the chip resistor g40 of the present preferred embodiment, a region of one-third of the substrate g11 is set as a resistor network forming region g14 and regions of the remaining two-thirds are set as long electrodes g12 and g13 disposed so as to sandwich the resistor network forming region g14, the surface areas of the electrodes g12 and g13 can be made large and the area of bonding of the electrodes g12 and g13 with a mounting substrate can be made large. The chip resistor g40 is thus made strong against thermal stress.

Also, by making the resistor network forming region g14 an elongate region sandwiched by the electrodes g12 and g13, the region is made short in the length L and wide in the width W. The resistor body film formed in the resistor network forming region g14 can thereby be made wide in width and short in length to enable the realization of a chip resistor g40 of low resistance. FIG. 169(B) is a plan view of a chip resistor g50 according to another preferred embodiment. With the chip resistor g50, the substrate g11 is divided equally in three in the length direction into three regions. A first region g201 is provided with the first connection electrode g12, a second region g202 is arranged as the resistor network forming region g14, and a third region g203 has second connection electrodes g13A and g13B formed therein.

Although the first connection electrode g12 is disposed along the one long side g111 of the substrate g11, it is not disposed along the entire range of the one long side g111. The first connection electrode g12 extends with a central portion of the one long side g111 as a center and is not disposed at both end portions of the first long side g111. Although the second connection electrodes g13A and g13B are disposed along the other long side g112, these include the two electrode portions g13A and g13B disposed across an interval along the other long side g112. More specifically, the layout structure is one having the two electrode portions g13A and g13B extending along respective end portions that exclude a central portion of the other long side g112.

Also, the first connection electrode g12 and the second connection electrodes g13A and g13B are disposed so that the first connection electrode g12 and the second connection electrodes g13A and g13B do not have overlapping portions when observed in the direction of the short sides of the substrate g11. By making the electrodes g12, g13A, and g13B have this layout structure, the possibility of solder causing a short circuit across the first connection electrode g12 and the second connection electrodes g13A and g13B can be avoided when the chip resistor g50 is solder bonded to a mounting substrate.

The layout structure of the electrodes in the chip resistor according to the seventh reference example is not restricted to those shown in FIGS. 169(A) and 169(B). For example, the first connection electrode g12 may be provided with a layout structure that includes a plurality of electrode portions disposed at intervals along the one long side g111, and the second connection electrode g13 may also be provided with a layout structure that includes a plurality of electrode portions disposed at intervals along the other long side g112. The plurality of electrode portions of the first connection electrode g12 and the plurality of electrode portions of the second connection electrode g13 may then be disposed alternately so as not to have overlapping portions when observed in the direction of the short sides, that is, so as not to face each other across the resistor network forming region g14.

An arrangement is also possible where, in the chip resistor g50 shown in FIG. 169(B), the resistor network is disposed in regions of the first region g201 and the third region g203 in which an electrode is not disposed. With this arrangement, the arrangement region for the resistor network is increased and the range of selection of the resistance value is increased. Or, there is a merit that a chip resistor of higher resistance can be realized easily.

FIG. 170 is a flow diagram of an example of a process for manufacturing the chip resistor g10 described with reference to FIGS. 155 to 161. A method for manufacturing the chip resistor g10 shall now be described in detail in accordance with the manufacturing process of the flow diagram and with reference to FIGS. 155 to 161 where necessary. Step S1: First, the substrate g11 is placed in a predetermined processing chamber and a silicon dioxide ($SiO_2$) layer is formed as the insulating layer g19 on the top surface, for example, by a thermal oxidation method.

Step S2: Thereafter, the resistor body film g20, made, for example, of TiN, TiON, or TiSiON or other material containing one or more types of material selected from the group consisting of NiCr, NiCrAl, NiCrSi, NiCrSiAl, TaN, $TaSiO_2$, TiN, TiNO, and TiSiON, is formed, for example, by a sputtering method on an entire top surface of the insulating layer g19. Step S3: Thereafter, the sputtering method, for example, is used to laminatingly form the wiring film g21, for example, from aluminum (Al) on an entire top surface of the resistor body film g20. The total film thickness of the two laminated film layers of the resistor body film g20 and the wiring film g21 may, for example, be approximately 8000 Å. In place of Al, the wiring film g21 may be formed from an aluminum-based metal film, such as AlSi, AlSiCu, or AlCu. By forming the wiring film g21 from an aluminum-based metal film, such as Al, AlSi, AlSiCu, or AlCu, the processing precision can be improved.

Step S4: Thereafter, a photolithography process is used to form a resist pattern, corresponding to the arrangement in a plan view of the resistor network g14 (the layout pattern including the conductor films C and the fuse films F) on a top surface of the wiring film g21 (formation of the first resist pattern). Step S5: A first etching step is then performed. That is, the laminated two-layer film of the resistor body film g20 and the wiring film g21 is etched, for example, by reactive ion etching (RIE) using the first resist pattern formed in step S4 as the mask. The first resist pattern is then peeled off after etching.

Step S6: The photolithography process is used again to form a second resist pattern. The second resist pattern formed in step S6 is a pattern for selectively removing the wiring film g21 laminated on the resistor body film g20 to form the unit resistor bodies R (regions indicated by being provided with fine dots in FIG. 156). Step S7: Only the wiring film g21 is etched selectively, for example, by wet etching using the second resist pattern, formed in step S6 as a mask (second etching step). After the etching, the second resist pattern is peeled off. The layout pattern of the resistor network g14 shown in FIG. 156 is thereby obtained.

Step S8: The resistance value of the resistor network g14 formed on the substrate top surface (the resistance value of the network g14 as a whole) is measured at this stage. This measurement is made, for example, by putting multiprobe pins in contact with an end portion of the resistor network g14 at the side connected to the first connection electrode g12 shown in FIG. 156 and end portions of the fuse film and the resistor network g14 at the side connected to the second connection electrode g13. The quality of the manufactured resistor network g14 in the initial state can be judged by this measurement.

Step S9: Thereafter, a cover film g22*a*, made, for example, of a nitride film, is formed so as to cover the entire surface of the resistor network g14 formed on the substrate g11. In place of a nitride film (SiN film), the cover film g22*a* may be an oxide film ($SiO_2$ film). The cover film g22*a* may be formed by a plasma CVD method, and a silicon nitride film (SiN film) with a film thickness, for example, of approximately 3000 Å may be formed. The cover film g22*a* covers the patterned wiring film g21, resistor body film g20, and fuses F.

Step S10: From this state, laser trimming is performed to selectively fuse the fuses F to adjust the chip resistor g10 to a desired resistance value. That is, as shown in FIG. 171(A), a fuse F, selected in accordance with the measurement result of the total resistance value measurement performed in step S8, is irradiated with laser light to fuse the fuse F and the resistor body film g20 positioned below it. The corresponding resistor circuit that was short-circuited by the fuse F is thereby incorporated into the resistor network g14 to enable the resistance value of the resistor network g14 to be adjusted to the desired resistance value. When a fuse F is irradiated with the laser light, the energy of the laser light is accumulated at a vicinity of the fuse F by an action of the cover film g22*a* and the fuse F and the resistor body film g20 below it is thereby fused.

Step S11: Thereafter as shown in FIG. 171(B), a passivation film g22 is formed by depositing a silicon nitride film on the cover film g22*a*, for example, by the plasma CVD method. In the final form, the cover film g22*a* is made integral with the passivation film g22 to constitute a portion of the passivation film g22. The passivation film g22 that is formed after the cutting of the fuses F and the resistor body film g20 therebelow enters into openings g22*b* in the cover film g22*a* that is destroyed at the same time as the fusing of the fuses F and the resistor body film g20 therebelow to protect cut surfaces of the fuses F and the resistor body film g20 therebelow. The passivation film g22 thus prevents entry of foreign matter and entry of moisture into cut locations of the fuses F. The passivation film g22 suffices to have a thickness, for example, of approximately 1000 to 20000 Å as a whole and may be formed to have a film thickness, for example, of approximately 8000 Å.

Also as mentioned above, the passivation film g22 may be a silicon oxide film. Step S12: Thereafter, a resin film g23 is coated on the entire surface as shown in FIG. 171(C). As the resin film g23, for example, a coating film g23 of a photosensitive polyimide is used. Step S13: Patterning of the resin film g23 by photolithography may be performed by performing an exposure step and a subsequent developing step on regions of the resin film corresponding to openings of the first connection electrode g12 and the second connection electrode g13. Pad openings for the first connection electrode g12 and the second connection electrode g13 are thereby formed in the resin film g23.

Step S14: Thereafter, heat treatment (polyimide curing) for curing the resin film g23 is performed and the polyimide film g23 is stabilized by the heat treatment. The heat treatment may, for example, be performed at a temperature of approximately 170° C. to 700° C. A merit that the characteristics of the resistor bodies (the resistor body film g20 and the patterned wiring film g21) are stabilized is also provided as a result. Step S15: Thereafter, the passivation film g22 is etched using the polyimide film g23, having penetrating holes at positions at which the first connection electrode g12 and the second connection electrode g13 are to be formed, as a mask. The pad openings that expose the wiring film g21 at a region of the first connection electrode g12 and a region of the second connection electrode g13 are thereby formed. The etching of the passivation film g22 may be performed by reactive ion etching (RIE).

Step S16: Multiprobe pins are put in contact with the wiring film g21 exposed from the two pad openings to perform resistance value measurement ("after" measurement) for confirming that the resistance value of the chip resistor is the desired resistance value. By thus performing the "after" measurement, in other words, performing the series of processes of the first measurement (initial measurement)→fusing of the fuses F (laser repair)→"after" measurement, the trimming processing ability with respect to the chip resistor g10 is improved significantly.

Step S17: The first connection electrode g12 and the second connection electrode g13 are grown as external connection electrodes inside the two pad openings, for example, by an electroless plating method. Step S18: Thereafter, a third resist pattern is formed by photolithography for separation of the numerous (for example, 500 thousand) respective chip resistors, formed in an array on the substrate top surface, into the individual chip resistors g10. The resist film is provided on the substrate top surface to protect the respective chip resistors g10 and is formed so that intervals between the respective chip resistors g10 will be etched.

Step S19: Plasma dicing is then executed. The plasma dicing is the etching using the third resist pattern as a mask and a groove of a predetermined depth from the substrate top surface is formed between the respective chip resistors g10. Thereafter, the resist film is peeled off. Step S20: Then as shown, for example, in FIG. 172(A), a protective tape g100 is adhered onto the top surface.

Step S21: Thereafter, rear surface grinding of the substrate is performed to separate the chip resistors into the individual chip resistors g10 (see FIGS. 172(A) and 172(B)). Step S22: Then as shown in FIG. 172(C), a carrier tape (thermally foaming sheet) g200 is adhered onto the rear surface side, and the numerous chip resistors g10 that have been separated into the individual chip resistors are held in a state of being arrayed on the carrier tape g200. On the other hand, the protective tape adhered to the top surface is removed (see FIG. 172(D)).

Step S23: When the thermally foaming sheet g200 is heated, thermally foaming particles 201 contained in the interior swell and the respective chip resistors g10 adhered to the carrier tape g200 surface are thereby peeled off from the carrier tape g200 and separated into individual chips (see FIGS. 172(E) and 172(F)).

(2-2) Description of a Preferred Embodiment of a Chip Capacitor

FIG. 173 is a plan view of a chip capacitor g301 according to another preferred embodiment of the seventh reference example, and FIG. 174 is a sectional view thereof showing a section taken along section line CLXXIV-CLXXIV in FIG. 173.

The chip capacitor g301 includes a substrate g302, a first external electrode g303 disposed on the substrate g302, and a second external electrode g304 disposed similarly on the substrate g302. In the present preferred embodiment, the substrate g302 has, in a plan view, a rectangular shape with the four corners chamfered. The rectangular shape has dimensions of, for example, approximately 0.3 mm×0.15 mm. The first external electrode g303 and the second external electrode g304 are respectively disposed at portions at respective ends in the short direction of the substrate g302. In the present preferred embodiment, each of the first external electrode g303 and the second external electrode g304 has a long, substantially rectangular planar shape extending in the long direction of the substrate g302 and has chamfered portions at two locations respectively corresponding to the corners of the substrate g302.

That is, the pair of long electrodes g303 and g304 are included in the chip capacitor g301 as well. On the substrate g302, a plurality of capacitor parts C1 to C9 are disposed within a capacitor arrangement region g305 between the first external electrode g303 and the second external electrode g304. The plurality of capacitor parts C1 to C9 are electrically connected respectively to the first external electrode g303 via a plurality of fuse units g307.

As shown in FIG. 174, an insulating film g308 is formed on a top surface of the substrate g302, and a lower electrode film g311 is formed on a top surface of the insulating film g308. The lower electrode film g311 is formed to spread across substantially the entirety of the capacitor arrangement region g305 and extend to a region directly below the second external electrode g304. More specifically, the lower electrode film g311 has a capacitor electrode region g311A functioning as a lower electrode in common to the capacitor parts C1 to C9 and a pad region g311B leading out to an external electrode. The capacitor electrode region g311A is positioned in the capacitor arrangement region g305 and the pad region g311B is positioned directly below the second external electrode g304.

In the capacitor arrangement region g305, a capacitance film (dielectric film) g312 is formed so as to cover the lower electrode film g311 (capacitor electrode region g311A). The capacitance film g312 is continuous across the entirety of the capacitor electrode region g311A and, in the present preferred embodiment, further extends to a region directly below the first external electrode g303 and covers the insulating film g308 outside the capacitor arrangement region g305.

An upper electrode film g313 is formed on the capacitance film g312. In FIG. 173, the upper electrode film g313 is indicated with fine dots added for the sake of clarity. The upper electrode film g313 includes a capacitor electrode region g313A positioned in the capacitor arrangement region 5, a pad region g313B positioned directly below the first external electrode g303, and a fuse region g313C disposed between the pad region g313B and the capacitor electrode region g313A.

In the capacitor electrode region g313A, the upper electrode film g313 is divided into a plurality of electrode film portions g131 to g139. In the present preferred embodiment, the respective electrode film portions g131 to g139 are all formed to rectangular shapes and extend in the form of bands from the fuse region g313C toward the second external electrode g304. The plurality of electrode film portions g131 to g139 face the lower electrode film g311 across the capacitance film g312 over a plurality of types of facing areas. More specifically, the facing areas of the electrode film portions g131 to g139 with respect to the lower electrode film g311 may be set to be 1:2:4:8:16:32:64:128:128. That is, the plurality of electrode film portions g131 to g139 include the plurality of electrode film portions differing in facing area and more specifically include the plurality of electrode film portions g131 to g138 (or g131 to g137 and g139) having facing areas that are set to form a geometric progression with a common ratio of 2. The plurality of capacitor parts C1 to C9, respectively arranged by the respective electrode film portions g131 to g139 and the facing lower electrode film g311 across the capacitance film g312, thus include the plurality of capacitor parts having mutually different capacitance values. If the ratio of the facing areas of the electrode film portions g131 to g139 is as mentioned above, the ratio of the capacitance values of the capacitor parts C1 to C9 is equal to the ratio of the facing areas and is 1:2:4:8:16:32:64:128:128. The plurality of capacitor parts C1 to C9 thus include the plurality of capacitor parts C1 to C8 (or C1 to C7 and C9) with capacitance values set to form the geometric progression with the common ratio of 2.

In the present preferred embodiment, the electrode film portions g131 to g135 are formed to bands that are equal in width and have lengths with the ratio thereof being set to 1:2:4:8:16. Also, the electrode film portions g135, g136, g137, g138, and g139 are formed to bands that are equal in length and have widths with the ratio thereof being set to 1:2:4:8:8. The electrode film portions g135 to g139 are formed to extend across a range from an end edge at the first external electrode g303 side to an end edge at the second external electrode g304 side of the capacitor arrangement region g305, and the electrode film portions g131 to g134 are formed to be shorter than this range.

The pad region g313B is formed to be substantially similar in shape to the first external electrode g303 and has a substantially rectangular planar shape having two chamfered portions corresponding to corner portions of the substrate g302. The fuse region g313C is disposed along one long side (the long side at the inner side with respect to the peripheral edge of the substrate g302) of the pad region g313B. The fuse region g313C includes the plurality of fuse units g307 that are aligned along the one long side of the pad region g313B. The fuse units g307 are formed of the same material as and integral to the pad region g313B of the upper electrode film g313. The plurality of electrode film portions g131 to g139 are each formed integral to one or a plurality of the fuse units g307, are connected to the pad region g313B via the fuse units g307, and are electrically connected to the first external electrode g303 via the pad region g313B. Each of the electrode film portions g131 to g136 of comparatively small area is connected to the pad region g313B via a single fuse unit g307, and each of the electrode film portions g137 to g139 of comparatively large area is connected to the pad region g313B via a plurality of fuse units g307. It is not necessary for all of the fuse units g307 to be used and, in the present preferred embodiment, a portion of the fuse units g307 is unused.

The fuse units g307 include first wide portions g307A arranged to be connected to the pad region g313B, second wide portions g307B arranged to be connected to the electrode film portions g131 to g139, and narrow portions g307C connecting the first and second wide portions g307A and g307B. The narrow portions g307C are arranged to be capable of being cut (fused) by laser light. Unnecessary electrode film portions among the electrode film portions g131 to g139 can thus be electrically disconnected from the first and second external electrodes g303 and g304 by cutting the fuse units g307.

Although omitted from illustration in FIG. 173, a top surface of the chip capacitor g301 that includes a top surface of the upper electrode film g313 is covered by a passivation film g309 as shown in FIG. 174. The passivation film g309 is constituted, for example, of a nitride film and is formed not only to cover the upper surface of the chip capacitor g301 but also to extend to side surfaces of the substrate g302 and cover the side surfaces. Further, a resin film g310, made of a polyimide resin, etc., is formed on the passivation film g309. The resin film g310 is formed to cover the upper surface of the chip capacitor g301 and extend to the side surfaces of the substrate g302 to cover the passivation film g309 on the side surfaces.

The passivation film g309 and the resin film g310 are protective films that protect the top surface of the chip capacitor g301. In these films, pad openings g321 and g322 are respectively formed in regions corresponding to the first external electrode g303 and the second external electrode g304. The pad openings g321 and g322 penetrate through the passivation film g309 and the resin film g310 so as to respectively expose a region of a portion of the pad region g313B of the upper electrode film g313 and a region of a portion of the pad region g311B of the lower electrode film g311. Further, with the present preferred embodiment, the pad opening g322 corresponding to the second external electrode g304 also penetrates through the capacitance film g312.

The first external electrode g303 and the second external electrode g304 are respectively embedded in the pad openings g321 and g322. The first external electrode g303 is thereby bonded to the pad region g313B of the upper electrode film g313 and the second external electrode g304 is bonded to the pad region g311B of the lower electrode film g311. The first and second external electrodes g303 and g304 are formed to project from a top surface of the resin film g310. The chip capacitor g301 can thereby be flip-chip bonded to a mounting substrate.

FIG. 175 is a circuit diagram of the electrical arrangement of the interior of the chip capacitor g301. The plurality of capacitor parts C1 to C9 are connected in parallel between the first external electrode g303 and the second external electrode g304. Fuses F1 to F9, each arranged from one or a plurality of the fuse units g307, are interposed in series between the respective capacitor parts C1 to C9 and the first external electrode g303.

When all of the fuses F1 to F9 are connected, the capacitance value of the chip capacitor g301 is equal to the total of the capacitance values of the capacitor parts C1 to C9. When one or two or more fuses selected from among the plurality of fuses F1 to F9 is or are cut, each capacitor part corresponding to the cut fuse is disconnected and the capacitance value of the chip capacitor g301 decreases by just the capacitance value of the disconnected capacitor part or parts.

Therefore by measuring the capacitance value across the pad regions g311B and g313B (the total capacitance value of the capacitor parts C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor parts C1 to C8 are set to form a geometric progression with a common ratio of 2, fine adjustment to the targeted capacitance value at a precision corresponding to the capacitance value of the capacitor part C1, which is the smallest capacitance value (value of the first term in the geometric progression), is made possible.

For example, the capacitance values of the capacitor parts C1 to C9 may be set as follows. C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor g301 can be finely adjusted at a minimum adjustment precision of 0.03125 pF. Also, the fuses to be cut among the fuses F1 to F9 can be selected appropriately to provide the chip capacitor g301 with an arbitrary capacitance value between 0.1 pF and 10 pF.

As described above, with the present preferred embodiment, the plurality of capacitor parts C1 to C9 that can be disconnected by the fuses F1 to F9 are provided between the first external electrode g303 and the second external electrode g304. The capacitor parts C1 to C9 include a plurality of capacitor parts that differ in capacitance value and more specifically include a plurality of capacitor parts with capacitance values set to form a geometric progression. The chip capacitor g301, which can accommodate a plurality of types of capacitance values without change of design and can be accurately adjusted to the desired capacitance value by selection and fusion by laser light of one or a plurality of fuses among the fuses F1 to F9, can thus be provided.

Details of respective portions of the chip capacitor g301 shall now be described. The substrate g302 may have, for example, a rectangular shape of 0.3 mm×0.15 mm, 0.4 mm×0.2 mm, or 0.2 mm×0.1 mm, etc. (preferably a size of not more than 0.4 mm×0.2 mm) in a plan view. The capacitor arrangement region g305 is generally a rectangular region sandwiched by the pair of external electrodes g303 and g304 that are formed along the long sides of the substrate g302. The thickness of the substrate g302 may be approximately 150 μm. The substrate g302 may, for example, be a substrate that has been thinned by grinding or polishing from a rear surface side (surface on which the capacitor parts C1 to C9 are not formed). As the material of the substrate g302, a semiconductor substrate as represented by a silicon substrate may be used or a glass substrate may be used or a resin film may be used.

The insulating film g308 may be a silicon oxide film or other oxide film. The film thickness thereof may be approximately 500 Å to 2000 Å. The lower electrode film g311 is preferably a conductive film, a metal film in particular, and may, for example, be an aluminum film. The lower electrode film g311 that is constituted of an aluminum film may be formed by a sputtering method. Similarly, the upper electrode film g313 is preferably constituted of a conductive film, a metal film in particular, and may, for example, be an aluminum film. The upper electrode film g313 that is constituted of an aluminum film may be formed by the sputtering method. The patterning for dividing the capacitor electrode region g313A of the upper electrode film g313 into the electrode film portions g131 to g139 and shaping the fuse region g313C into the plurality of fuse units g307 may be performed by photolithography and etching processes.

The capacitance film g312 may be constituted, for example, of a silicon nitride film, and the film thickness thereof may be 500 Å to 2000 Å (for example, 1000 Å). The capacitance film g312 may be a silicon nitride film formed by plasma CVD (chemical vapor deposition). The passivation film g309 may be constituted, for example, of a silicon nitride film and may be formed, for example, by the plasma CVD method. The film thickness thereof may be approximately 8000 Å. As mentioned above, the resin film g310 may be constituted of a polyimide film or other resin film.

Each of the first and second external electrodes g303 and g304 may, for example, be constituted of a laminated structure film in which a nickel layer in contact with the lower electrode film g311 or the upper electrode film g313, a palladium layer laminated on the nickel layer, and a gold layer laminated on the palladium layer are laminated, and may be formed, for example, by a plating method (or more specifically, an electroless plating method). The nickel layer contributes to improvement of adhesion with the lower electrode film g311 or the upper electrode film g313, and the palladium layer functions as a diffusion preventing layer that suppresses mutual diffusion of the material of the upper electrode film or the lower electrode film and the gold of the uppermost layer of each of the first and second external electrodes g303 and g304.

FIG. 176 is a flow diagram for describing an example of a process for manufacturing the chip capacitor g301. As the substrate g302, a semiconductor substrate with a specific resistance of not less than 100 Ω·cm is prepared. The insulating film g308, constituted of an oxide film (for example, a silicon oxide film), is formed on the top surface of the substrate g302 by a thermal oxidation method and/or CVD method (step S1). Thereafter, the lower electrode film g311, constituted of an aluminum film, is formed over the entire top surface of the insulating film g308, for example, by the sputtering method (step S2). The film thickness of the lower electrode film g311 may be approximately 8000 Å.

Thereafter, a resist pattern corresponding to the final shape of the lower electrode film g311 is formed on the top surface of the lower electrode film by photolithography (step S3). The lower electrode film is etched using the resist pattern as a mask to obtain the lower electrode film g311 of the pattern shown in FIG. 173, etc. (step S4). The etching of the lower electrode film g311 may be performed, for example, by reactive ion etching.

Thereafter, the capacitance film g312, constituted of a silicon nitride film, etc., is formed on the lower electrode film g311, for example, by the plasma CVD method (step S5). In the regions in which the lower electrode film g311 is not formed, the capacitance film g312 is formed on the top surface of the insulating film g308. Thereafter, the upper electrode film g313 is formed on the capacitance film g312 (step S6). The upper electrode film g313 is constituted, for example, of an aluminum film and may be formed by the sputtering method. The film thickness thereof may be approximately 8000 Å. Thereafter, a resist pattern corresponding to the final shape of the upper electrode film g313 is formed on the top surface of the upper electrode film g313 by photolithography (step S7). The upper electrode film g313 is patterned to its final shape (see FIG. 173, etc.) by etching using the resist pattern as a mask (step S8). The upper electrode film g313 is thereby shaped to the pattern having the plurality of electrode film portions g131 to g139 in the capacitor electrode region g313A, having the plurality of fuse units g307 in the fuse region g313C, and having the pad region g313B connected to the fuse units g307. The etching for patterning the upper electrode film g313 may be performed by wet etching using an etching liquid, such as phosphoric acid, etc., or may be performed by reactive ion etching.

Thereafter, inspection probes are pressed against the pad region g313B of the upper electrode film g313 and the pad region g311B of the lower electrode film g311 to measure the total capacitance value of the plurality of capacitor parts C1 to C9 (step S9). Based on the measured total capacitance value, the capacitor parts to be disconnected, that is, the fuses to be cut are selected in accordance with the targeted capacitance value of the chip capacitor g301 (step S10).

Thereafter as shown in FIG. 177A, a cover film g326, constituted, for example, of a nitride film, is formed on the entire surface of the substrate g302 (step S11). The forming of the cover film g326 may be performed by the plasma CVD method and, for example, a silicon nitride film with a film thickness of approximately 3000 Å may be formed. The cover film g326 covers the patterned upper electrode film g313 and covers the capacitance film g312 in the region in which the upper electrode film g313 is not formed. The cover film g326 covers the fuse units g307 in the fuse region g313C.

From this state, the laser trimming for fusing the fuse units g307 is performed (step S12). That is, as shown in FIG. 177B, each fuse unit g307 constituting a fuse selected in accordance with the measurement result of the total capacitance value is irradiated with laser light g327 and the narrow portion g307C of the fuse unit g307 is fused. The corresponding capacitor part is thereby disconnected from the pad region g313B. When the laser light g327 is irradiated on the fuse unit g307, the energy of the laser light g327 is accumulated at a vicinity of the fuse unit g307 by the action of the cover film g326 and the fuse unit g307 is thereby fused.

Thereafter as shown in FIG. 177C, a silicon nitride film is deposited on the cover film g326, for example, by the plasma CVD method to form the passivation film g309 (step S13). In the final form, the cover film g326 is made integral with the passivation film g309 to constitute a portion of the passivation film g309. The passivation film g309 that is formed after the cutting of the fuses enters into openings in the cover film g326, destroyed at the same time as the fusing of the fuses, to protect the cut surfaces of the fuse units g307. The passivation film g309 thus prevents entry of foreign matter and entry of moisture into the cut locations of the fuse units g307. The passivation film g309 may be formed to have a film thickness, for example, of approximately 8000 Å as a whole.

Thereafter, a resist pattern, having penetrating holes at positions at which the first and second external electrodes g303 and g304 are to be formed, is formed on the passivation film g309 (step S14). The passivation film g309 is etched using the resist pattern as a mask. The pad opening exposing the lower electrode film g311 in the pad region g311B and the pad opening exposing the upper electrode film g313 in the pad region g313B are thereby formed (step S15). The etching of the passivation film g309 may be performed by reactive ion etching. In the process of etching of the passivation film g309, the capacitance film g312, which is similarly constituted of a nitride film, is also opened and the pad region g311B of the lower electrode film g311 is thereby exposed.

Thereafter a resin film is coated on the entire surface (step S16). As the resin film, for example, a coating film of a photosensitive polyimide is used. Patterning of the resin film by photolithography may be performed by performing an exposure step and a subsequent developing step on regions of the resin film corresponding to the pad openings (step S17). The pad openings g321 and g322 penetrating through the resin film g310 and the passivation film g309 are thereby formed. Thereafter, heat treatment (curing) for hardening the resin film is performed (step S18) and further, the first external electrode g303 and the second external electrode g304 are grown inside the pad openings g321 and g322, for example, by the electroless plating method (step S19). The chip capacitor g301 of the structure shown in FIG. 173, etc., is thereby obtained.

In the patterning of the upper electrode film g313 using the photolithography process, the electrode film portions g131 to g139 of minute areas can be formed with high precision and the fuse units g307 of even finer pattern can be formed. After the patterning of the upper electrode film g313, the total capacitance value is measured and then the fuses to be cut are determined. By cutting the determined fuses, the chip capacitor g301 that is accurately adjusted to the desired capacitance value can be obtained.

Thereafter, the respective chip capacitors g301 are separated from the base substrate and the individual chip capacitors g301 are obtained.

(2-3) Description of a Preferred Embodiment of a Chip Diode

FIG. 178 is a perspective view of a chip diode g401 according to another preferred embodiment of the seventh reference example, FIG. 179 is a plan view thereof, and FIG. 180 is a sectional view taken along CLXXX-CLXXX in FIG. 179. Further, FIG. 181 is a sectional view taken along CLXXXI-CLXXXI in FIG. 179.

The chip diode g401 includes a $p^+$-type semiconductor substrate g402 (for example, a silicon substrate), a plurality of diode cells D1 to D4 formed on the semiconductor substrate g402, and a cathode electrode g403 and an anode electrode g404 connecting the plurality of diode cells D1 to D4 in parallel. The semiconductor substrate g402 includes a pair of principal surfaces g402*a* and g402*b* and a plurality of side surfaces g402*c* orthogonal to the pair of principal surfaces g402*a* and g402*b*, and one (principal surface g402*a*) of the pair of principal surfaces g402*a* and g402*b* is arranged as an element forming surface. Hereinafter, the principal surface g402*a* shall be referred to as the "element forming surface g402*a*." The element forming surface g402*a* is formed to a rectangular shape in a plan view and, for example, the length L in the long direction may be approximately 0.4 mm and the length Win the short direction may be approximately 0.2 mm. Also, the thickness T of the chip diode g401 as a whole may be approximately 0.1 mm.

An external connection electrode g403B of the cathode electrode g403 and an external connection electrode g404B of the anode electrode g404 are disposed at respective end portions of the element forming surface g402*a* in the short direction. The external connection electrodes g403B and g404B are arranged as long electrodes extending along the long direction of the element forming surface g402*a*, and a diode cell region g407 is provided on the element forming surface g402*a* between the external connection electrodes g403B and g404B.

A plurality of recesses g7 (for example, a maximum of four recesses) that are cutout so as to extend in the thickness direction of the semiconductor substrate g402 are formed on one side surface g402*c* that is continuous with one long side (in the present preferred embodiment, the long side close to the cathode side external connection electrode g403B) of the element forming surface g402*a*. In the present preferred embodiment, each recess g7 extends across the entirety in the thickness direction of the semiconductor substrate g402. In a plan view, each recess g7 is recessed inward from the one long side of the element forming surface g402*a* and, in the present preferred embodiment, has a trapezoidal shape that becomes narrow toward the inner side of the element forming surface g402*a*. Obviously, this planar shape is an example and the planar shape may instead be a rectangular shape, a triangular shape, or a recessingly curved shape, such as a partially circular shape (for example, an arcuate shape), etc.

The recesses g7 indicate the orientation (chip direction) of the chip diode g401. More specifically, the recesses g7 provide a cathode mark that indicates the position of the cathode side external connection electrode g403B. A structure is thereby provided with which the polarity of the chip diode g401 can be ascertained from its outer appearance during mounting. The recesses g7 may also function as a marking that indicates other information, such as the type name, date of manufacture, etc., in addition to the polarity direction of the chip capacitor g401.

The semiconductor substrate g402 has four corner portions g409 at four corners, each corresponding to an intersection portion of a pair of mutually adjacent side surfaces among the four side surfaces g402*c*. In the present preferred embodiment, the four corner portions g409 are shaped to rounded shapes. Each corner portion g409 has a smooth curved surface that is outwardly convex in a plan view as viewed in a direction of a normal to the element forming surface g402*a*. A structure capable of suppressing chipping during the manufacturing process or mounting of the chip diode g401 is thereby arranged.

In the present preferred embodiment, the diode cell region g407 is formed to a rectangular shape. The plurality of diode cells D1 to D4 are disposed inside the diode cell region g407. In regard to the plurality of diode cells D1 to D4, four are provided in the present preferred embodiment and these are arrayed two-dimensionally at equal intervals in a matrix along the long direction and short direction of the semiconductor substrate g402. FIG. 182 is a plan view showing the structure of the top surface (element forming surface g402*a*) of the semiconductor substrate g402 with the cathode electrode g403, the anode electrode g404, and the arrangement formed thereon being removed. In each of the regions of the diode cells D1 to D4, an $n^+$-type region g410 is formed in a top layer region of the $p^+$-type semiconductor substrate g402. The $n^+$-type regions g410 are separated according to each individual diode cell. The diode cells D1 to D4 are thereby made to respectively have p-n junction regions g411 that are separated according to each individual diode cell.

In the present preferred embodiment, the plurality of diode cells D1 to D4 are formed to be equal in size and equal in shape and are specifically formed to rectangular shapes, and the $n^+$-type region g410 with a polygonal shape is formed in the rectangular region of each diode cell. In the present preferred embodiment, each $n^+$-type region g410 is formed to a regular octagon having four sides parallel to the four sides forming the rectangular region of the corresponding diode cell among the diode cells D1 to D4 and another four sides respectively facing the four corner portions of the rectangular region of the corresponding diode cell among the diode cells D1 to D4.

As shown in FIG. 180 and FIG. 181, an insulating film g415 (omitted from illustration in FIG. 179), constituted of an oxide film, etc., is formed on the element forming surface g402*a* of the semiconductor substrate g402. Contact holes g416 (cathode contact holes) exposing top surfaces of the respective $n^+$-type regions g410 of the diode cells D1 to D4 and contact holes g417 (anode contact holes) exposing the element forming surface g402*a* are formed in the insulating film g415. The cathode electrode g403 and the anode electrode g404 are formed on the top surface of the insulating film g415. The cathode electrode g403 includes a cathode electrode film g403A formed on the top surface of the insulating film g415 and the external connection electrode g403B bonded to the cathode electrode film g403A. The cathode electrode film g403A includes a lead-out electrode L1 connected to the plurality of diode cells D1 and D3, a lead-out electrode L2 connected to the plurality of diodes D2 and D4, and a cathode pad g405 formed integral to the lead-out electrodes L1 and L2 (cathode lead-out electrodes). The cathode pad g405 is formed to a rectangle at one end portion of the element forming surface g402*a*. The external connection electrode g403B is connected to the cathode pad g405. The external connection electrode g403B is thereby connected in common to the lead-out electrodes L1 and L2. The cathode pad g405 and the external connection electrode g403B constitute an external connection portion (cathode external connection portion) of the cathode electrode g403.

The anode electrode g404 includes an anode electrode film g404A formed on the top surface of the insulating film g415 and the external connection electrode g404B bonded to the anode electrode film g404A. The anode electrode film g404A is connected to the $p^+$-type semiconductor substrate g402 and has an anode pad g406 near one end portion of the element forming surface g402*a*. The anode pad g406 is constituted of a region of the anode electrode film g404A that is disposed at the one end portion of the element forming surface g402*a*. The external connection electrode g404B is connected to the anode pad g406. The anode pad g406 and the external connection electrode g404B constitute an external connection portion (anode external connection portion) of the anode electrode g404. The region of the anode electrode film g404A besides the anode pad g406 is an anode lead-out electrode that is led out from the anode contact holes g417.

The lead-out electrode L1 enters into the contact holes g416 of the diode cells D1 and D3 from the top surface of the insulating film g415 and is in ohmic contact with the respective $n^+$-type regions g10 of the diode cells D1 and D3 inside the respective contact holes g416. In the lead-out electrode L1, the portions connected to the diode cells D1 and D3 inside the contact holes g416 constitute cell connection portions C1 and C3. Similarly, the lead-out electrode L2 enters into the contact holes g416 of the diode cells D2 and D4 from the top surface of the insulating film g415 and is in ohmic contact with the respective $n^+$-type regions g410 of the diode cells D2 and D4 inside the respective contact holes g416. In the lead-out electrode L2, the portions connected to the diode cells D2 and D4 inside the contact holes g416 constitute cell connection portions C2 and C4. The anode electrode film g404A extends to inner sides of the contact holes g417 from the top surface of the insulating film g415 and is in ohmic contact with the $p^+$-type semiconductor substrate g402 inside the contact holes g417. In the present preferred embodiment, the cathode electrode film g403A and the anode electrode film g404A are made of the same material.

In the present preferred embodiment, AlSi films are used as the electrode films. When an AlSi film is used, the anode electrode film g404A can be put in ohmic contact with the $p^+$-type semiconductor substrate g402 without having to provide a $p^+$-type region on the top surface of the semiconductor substrate g402. That is, an ohmic junction can be formed by putting the anode electrode film g404A in direct contact with the $p^+$-type semiconductor substrate g402. A process for forming the $p^+$-type region can thus be omitted.

The cathode electrode film g403A and the anode electrode film g404A are separated by a slit g418. The lead-out electrode L1 is formed rectilinearly along a straight line passing from the diode cell D1 to the cathode pad g405 through the diode cell D3. Similarly, the lead-out electrode L2 is formed rectilinearly along a straight line passing from the diode cell D2 to the cathode pad g405 through the diode cell D4. The lead-out electrodes L1 and L2 respectively have uniform widths W1 and W2 at all locations between the $n^+$-type regions g410 and the cathode pad g405, and the widths W1 and W2 are wider than the widths of the cell connection portions C1, C2, C3, and C4. The widths of the cell connection portions C1 to C4 are defined by the lengths in the direction orthogonal to the lead-out directions of the lead-out electrodes L1 and L2. Tip end portions of the lead-out electrodes L1 and L2 are shaped to match the planar shapes of the $n^+$-type regions g410. Base end portions of the lead-out electrodes L1 and L2 are connected to the cathode pad g405. The slit g418 is formed so as to border the lead-out electrodes L1 and L2. On the other hand, the anode electrode film g404A is formed on the top surface of the insulating film g415 so as to surround the cathode electrode film g403A across an interval corresponding to the slit g418 of substantially fixed width. The anode electrode film g404A integrally includes a comb-teeth-like portion extending in the long direction of the element forming surface g402*a* and the anode pad g406 that is constituted of a rectangular region.

The cathode electrode film g403A and the anode electrode film g404A are covered by a passivation film g420 (omitted from illustration in FIG. 179), constituted, for example, of a nitride film, and a resin film g421, made of polyimide, etc., is further formed on the passivation film g420. A pad opening g422 exposing the cathode pad g405 and a pad opening g423 exposing the anode pad g406 are formed so as to penetrate through the passivation film g420 and the resin film g421. The external connection electrodes g403B and g404B are respectively embedded in the pad openings g422 and g423. The passivation film g420 and the resin film g421 constitute a protective film arranged to suppress or prevent the entry of moisture to the lead-out electrodes L1 and L2 and the p-n junction regions g411 and also absorb impacts, etc., from the exterior, thereby contributing to improvement of the durability of the chip diode g401.

The external connection electrodes g403B and g404B may have top surfaces at positions lower than the top surface of the resin film g421 (positions close to the semiconductor substrate g402) or may project from the top surface of the resin film g421 and have top surfaces at positions higher than the resin film g421 (positions far from the semiconductor substrate g402). An example where the external connection electrodes g403B and g404B project from the top surface of the resin film g421 is shown in FIG. 180. Each of the external connection electrodes g403B and g404B may be constituted, for example, of an Ni/Pd/Au laminated film having an Ni film in contact with the electrode film g403A or g404A, a Pd film formed on the Ni film, and an Au film formed on the Pd film. Such a laminated film may be formed by a plating method.

In each of the diode cells D1 to D4, the p-n junction region g411 is formed between the p-type semiconductor substrate g402 and the $n^+$-type region g410, and a p-n junction diode is thus formed respectively. The $n^+$-type regions g410 of the plurality of diode cells D1 to D4 are connected in common to the cathode electrode g403, and the $p^+$-type semiconductor substrate g402, which is the p-type region in common to the diode cells D1 to D4, is connected in common to the anode electrode g404. The plurality of diode cells D1 to D4, formed on the semiconductor substrate g402, are thereby connected in parallel all together.

FIG. 183 is an electric circuit diagram showing the electrical structure of the interior of the chip diode g401. With the p-n junction diodes respectively constituted by the diode cells D1 to D4, the cathode sides are connected in common by the cathode electrode g403, the anode sides are connected in common by the anode electrode g404, and all of the diodes are thereby connected in parallel and made to function as a single diode as a whole.

With the arrangement of the present preferred embodiment, the chip diode g401 has the plurality of diode cells D1 to D4 and each of the diode cells D1 to D4 has the p-n junction region g411. The p-n junction regions g411 are separated according to each of the diode cells D1 to D4. The chip diode g401 is thus made long in the peripheral length of the p-n junction regions g411, that is, the total peripheral length (total extension) of the $n^+$-type regions g410 in the semiconductor substrate g402. The electric field can thereby be dispersed and prevented from concentrating at vicinities of the p-n junction regions g411, and the ESD tolerance can thus be improved. That is, even when the chip diode g401 is to be formed compactly, the total peripheral length of the p-n junction regions g411 can be made large, thereby enabling both downsizing of the chip diode g401 and securing of the ESD tolerance to be achieved at the same time.

With the present preferred embodiment, the recesses g7 expressing the cathode direction are formed on the long side of the semiconductor substrate g402 close to the cathode side external connection electrode g403B and there is thus no need to mark a cathode mark on a rear surface (the principal surface at the side opposite to the element forming surface g402*a*) of the semiconductor substrate g402. The recesses g7 may be formed at the same time as performing the processing for cutting out the chip diode g401 from a wafer (base substrate). Also, the recesses g7 can be formed to indicate the direction of the cathode even when the size of the chip diode g401 is minute and marking is difficult. A step for marking can thus be omitted and a cathode mark can be provided even in the chip diode g401 of minute size.

FIG. 184 is a process diagram for describing an example of a manufacturing process of the chip diode g401. Also, FIG. 185A and FIG. 185B are sectional views of the arrangement in the middle of the manufacturing process of FIG. 184 and show a section corresponding to FIG. 180. First, the $p^+$-type semiconductor wafer W is prepared as the base substrate of the semiconductor substrate g402. A top surface of the semiconductor wafer W is an element forming surface and corresponds to the element forming surface g402*a* of the semiconductor substrate g402. A plurality of chip diode regions g401*a*, corresponding to a plurality of the chip diodes g401, are arrayed and set in a matrix on the element forming surface. A boundary region is provided between adjacent chip diode regions g401*a*. The boundary region is a band-like region having a substantially fixed width and extends in two orthogonal directions to form a lattice. After performing necessary steps on the semiconductor wafer W, the semiconductor wafer W is cut apart along the boundary region to obtain the plurality of chip diodes g401.

The steps executed on the semiconductor wafer W are, for example, as follows. First, the insulating film g415 (with a thickness, for example, of 8000 Å to 8600 Å), which is a thermal oxide film or CVD oxide film, etc., is formed on the element forming surface of the $p^+$-type semiconductor wafer W (S1) and a resist mask is formed on the insulating film g415 (S2). Openings corresponding to the $n^+$-type regions g410 are then formed in the insulating film g415 by etching using the resist mask (S3). Further, after peeling off the resist mask, an n-type impurity is introduced to top layer portions of the semiconductor wafer W that are exposed from the openings formed in the insulating film g415 (S4). The introduction of the n-type impurity may be performed by a step of depositing phosphorus as the n-type impurity on the top surface (so-called phosphorus deposition) or by implantation of n-type impurity ions (for example, phosphorus ions). Phosphorus deposition is a process of depositing phosphorus on the top surface of the semiconductor wafer W exposed inside the openings in the insulating film g415 by conveying the semiconductor wafer W into a diffusion furnace and performing heat treatment while making $POCl_3$ gas flow inside a diffusion passage. After thickening the insulating film g415 (thickening, for example, by approximately 1200 Å by CVD oxide film formation) as necessary (S5), heat treatment (drive-in) for activation of the impurity ions introduced into the semiconductor wafer W is performed (S6). The $n^+$-type regions g410 are thereby formed on the top layer portion of the semiconductor wafer W.

Thereafter, another resist mask having openings matching the contact holes g416 and g417 is formed on the insulating film g415 (S7). The contact holes g416 and g417 are formed in the insulating film g415 by etching via the resist mask (S8), and the resist mask is peeled off thereafter. An electrode film that constitutes the cathode electrode g403 and the anode electrode g404 is then formed on the insulating film g415, for example, by sputtering (S9). In the present preferred embodiment, an electrode film (for example, of 10000 Å thickness), made of AlSi, is formed. Another resist mask having an opening pattern corresponding to the slit g418 is then formed on the electrode film (S10) and the slit g418 is formed in the electrode film by etching (for example, reactive ion etching) via the resist mask (S11). The width of the slit g418 may be approximately 5 μm. The electrode film is thereby separated into the cathode electrode film g403A and the anode electrode film g404A.

Then after peeling off the resist film, the passivation film g420, which is a nitride film, etc., is formed, for example, by the CVD method (S12), and further, polyimide, etc., is applied to form the resin film g421 (S13). For example, a polyimide imparted with photosensitivity is applied, and after exposing in a pattern corresponding to the pad openings g423 and g424, the polyimide film is developed (step S14). The resin film g421, having openings corresponding to the pad openings g423 and g424, is thereby formed. Thereafter, heat treatment for curing the resin film is performed as necessary (S15). The pad openings g422 and g423 are then formed in the passivation film g420 by performing dry etching (for example, reactive ion etching) using the resin film g421 as a mask (S16). Thereafter, the external connection electrodes g403B and g404B are formed inside the pad openings g422 and g423 (S17). The external connection electrodes g403B and g404B may be formed by plating (preferably, electroless plating).

Thereafter, a resist mask g83 (see FIG. 185A), having a lattice-shaped opening matching the boundary region, is formed (S18). Plasma etching is performed via the resist mask g83 and the semiconductor wafer W is thereby etched to a predetermined depth from the element forming surface as shown in FIG. 185A. A groove g81 for cutting is thereby formed along the boundary region g8 (S19). After peeling off the resist mask g83, the semiconductor wafer W is ground from the rear surface Wb until a bottom portion of the groove g81 is reached as shown in FIG. 185B (S20). The plurality of chip diode regions g401*a* are thereby separated into individual chips and the chip diodes g401 with the structure described above can thereby be obtained.

Although a chip resistor, a chip capacitor, and a chip diode were described above as preferred embodiments of the seventh reference example, the seventh reference example may also be applied to chip components besides a chip resistor, a chip capacitor, and a chip diode. For example, a chip inductor may be cited as another example of a chip component. A chip inductor is a part having, for example, a multilayer wiring structure on a substrate and having an inductor (coil) and wiring related thereto inside the multilayer wiring structure and is arranged so that an arbitrary inductor in the multilayer wiring structure can be incorporated into a circuit or cut off from the circuit by a fuse and has a pair of connection electrodes exposed to the exterior. The chip inductor can also be made a chip inductor (chip component) that is appropriate for mounting and easy to handle by arranging the connection electrodes to be long electrodes in accordance with the seventh reference example.

FIG. 186 is an illustrative perspective view of an arrangement example of a circuit assembly according to a preferred embodiment of the seventh reference example. The circuit assembly g90 shown in FIG. 186 includes a flexible substrate g91 and the chip resistor g10 mounted on the flexible substrate g91. The flexible substrate g91 is disposed so as to be bendable in the direction of the arrows A1. The chip resistor g10 is mounted with the long side of the substrate g11 set along the direction of the arrows A2 that is orthogonal to the bending direction A1 of the flexible substrate g91. The flexible substrate g9 is not curved in the direction of the arrows A2. The first connection electrode g12 and the second connection electrode g13 that are long in the long side direction of the chip resistor g10 are thus bonded firmly by solder to the top surface of the flexible substrate g91. The chip resistor g10 is unlikely to become peeled or separated from the flexible substrate g91 because bending of the flexible substrate g91 in the long side direction of the chip resistor g10 does not occur.

Also, even if the flexible substrate g91 is bent in the direction of the arrows A1, this direction is the short side direction of the chip resistor g10, which is short in the dimension in this direction. Therefore the bending (curving) of the flexible substrate g91 has hardly any adverse effect on the mounted chip resistor g10. With the chip resistor g10 mounted on the flexible substrate g91, the first connection electrode g12 and the second connection electrode g13 face each other in the short side direction of the substrate g11 and the interval in between is short. Therefore, even if the flexible substrate g91 is bent in the direction of the arrows A1, the bending stress applied to the chip resistor g10 is small and breakage of the chip resistor g10 is unlikely to occur.

The preferred embodiment of the chip resistor g10 may be modified as follows. That is, in mounting the chip resistor g10 on a flexible substrate, the long direction of the connection electrodes of the chip resistor g10 may be made coincident with the direction in which the flexible substrate is not intended to be bent. In this case, due to the action of the long electrodes of the mounted chip resistor g10, the flexible substrate is made difficult to bend, thereby providing the effect of enabling the intended object to be achieved.

Although the mounting of the chip resistor g10 on a flexible substrate was described as an example in the above description, the same can be applied to mounting structures for the other chip components, in other words, the chip capacitor, the chip diode, and the chip inductor according to the seventh reference example. FIG. 187 is a perspective view of the outer appearance of a smartphone that is an example of an electronic equipment in which chip resistors according to the seventh reference example are used. The smartphone g201 is arranged by housing electronic parts in the interior of a housing g202 with a flat rectangular parallelepiped shape. The housing g202 has a pair of rectangular principal surfaces at its front side and rear side, and the pair of principal surfaces are joined by four side surfaces. A display surface of a display panel g203, constituted of a liquid crystal panel or an organic EL panel, etc., is exposed at one of the principal surfaces of the housing g202. The display surface of the display panel g203 constitutes a touch panel and provides an input interface for a user.

The display panel g203 is formed to a rectangular shape that occupies most of one of the principal surfaces of the housing g202. Operation buttons g204 are disposed along one short side of the display panel g203. In the present preferred embodiment, a plurality (three) of the operation buttons g204 are aligned along the short side of the display panel g203. The user can call and execute necessary functions by performing operations of the smartphone g210 by operating the operation buttons g204 and the touch panel.

A speaker g205 is disposed in a vicinity of the other short side of the display panel g203. The speaker g205 provides an earpiece for a telephone function and is also used as an acoustic conversion unit for reproducing music data, etc. On the other hand, close to the operation buttons g204, a microphone g206 is disposed at one of the side surfaces of the housing g202. The microphone g206 provides a mouthpiece for the telephone function and may also be used as a microphone for sound recording.

FIG. 188 is an illustrative plan view of the arrangement of an electronic circuit assembly g210 housed in the interior of the housing g202. The electronic circuit assembly g210 includes a wiring substrate g211 and circuit parts mounted on a mounting surface of the wiring substrate g211. The plurality of circuit parts include a plurality of integrated circuit elements (ICs) g212 to g220 and a plurality of chip components. The plurality of ICs include a transmission processing IC g212, a one-segment TV receiving IC g213, a GPS receiving IC g214, an FM tuner IC g215, a power supply IC g216, a flash memory g217, a microcomputer g218, a power supply IC g219, and a baseband IC g220. The plurality of chip components include chip inductors g221, g225, and g235, chip resistors g222, g224, and g233, chip capacitors g227, g230, and g234, and chip diodes g228 and g231. As the chip components, those with the arrangement according to the seventh reference example may be used.

The transmission processing IC g212 has incorporated therein an electronic circuit arranged to generate display control signals for the display panel g203 and receive input signals from the touch panel on a top surface of the display panel g203. For connection with the display panel g203, the transmission processing IC g212 is connected to a flexible wiring 209. The one-segment TV receiving IC g213 incorporates an electronic circuit that constitutes a receiver for receiving one-segment broadcast (terrestrial digital television broadcast targeted for reception by portable equipment) radio waves. A plurality of the chip inductors g221 and a plurality of the chip resistors g222 are disposed in a vicinity of the one-segment TV receiving IC g213. The one-segment TV receiving IC g213, the chip inductors g221, and the chip resistors g222 constitute a one-segment broadcast receiving circuit g223. The chip inductors g221 and the chip resistors g222 respectively have accurately adjusted inductances and resistances and provide circuit constants of high precision to the one-segment broadcast receiving circuit g223.

The GPS receiving IC g214 incorporates an electronic circuit that receives radio waves from GPS satellites and outputs positional information of the smartphone g201. The FM tuner IC g215 constitutes, together with a plurality of the chip resistors g224 and a plurality of the chip inductors g225 mounted on the wiring substrate g211 in a vicinity thereof, an FM broadcast receiving circuit g226. The chip resistors g224 and the chip inductors g225 respectively have accurately adjusted resistance values and inductances and provide circuit constants of high precision to the FM broadcast receiving circuit g226.

A plurality of the chip capacitors g227 and a plurality of the chip diodes g228 are mounted on the mounting surface of the wiring substrate g211 in a vicinity of the power supply IC g216. Together with the chip capacitors g227 and the chip diodes g228, the power supply IC g216 constitutes a power supply circuit g229. The flash memory g217 is a storage device for recording operating system programs, data generated in the interior of the smartphone g201, and data and programs acquired from the exterior by communication functions, etc.

The microcomputer g218 is a computing processing circuit that incorporates a CPU, a ROM, and a RAM and realizes a plurality of functions of the smartphone g201 by executing various computational processes. More specifically, computational processes for image processing and various application programs are realized by actions of the microcomputer g218.

A plurality of the chip capacitors g230 and a plurality of the chip diodes g231 are mounted on the mounting surface of the wiring substrate g211 in a vicinity of the power supply IC g219. Together with the chip capacitors g230 and the chip diodes g231, the power supply IC g219 constitutes a power supply circuit g232.

A plurality of the chip resistors g233, a plurality of the chip capacitors g234, and a plurality of the chip inductors g235 are mounted on the mounting surface of the wiring substrate g211 in a vicinity of the baseband IC g220. Together with the chip resistors g233, the chip capacitors g234, and the chip inductors g235, the baseband IC g220 constitutes a baseband communication circuit g236. The baseband communication circuit g236 provides communication functions for telephone communication and data communication.

With the above arrangement, electric power that is appropriately adjusted by the power supply circuits g229 and g232 is supplied to the transmission processing IC g212, the GPS receiving IC g214, the one-segment broadcast receiving circuit g223, the FM broadcast receiving circuit g226, the baseband communication circuit g236, the flash memory g217, and the microcomputer g218. The microcomputer g218 performs computational processes in response to input signals input via the transmission processing IC g212 and makes the display control signals be output from the transmission processing IC g212 to the display panel g203 to make the display panel g203 perform various displays.

When receiving of a one-segment broadcast is commanded by operation of the touch panel or the operation buttons g204, the one-segment broadcast is received by actions of the one-segment broadcast receiving circuit g223. Computational processes for outputting the received images to the display panel g203 and making the received audio signals be acoustically converted by the speaker g205 are executed by the microcomputer g218. Also, when positional information of the smartphone g201 is required, the microcomputer g218 acquires the positional information output by the GPS receiving IC g214 and executes computational processes using the positional information.

Further, when an FM broadcast receiving command is input by operation of the touch panel or the operation buttons g204, the microcomputer g218 starts up the FM broadcast receiving circuit g226 and executes computational processes for outputting the received audio signals from the speaker g205. The flash memory g217 is used for storing data acquired by communication and storing data prepared by computations by the microcomputer g218 and inputs from the touch panel. The microcomputer g218 writes data into the flash memory g217 or reads data from the flash memory g217 as necessary.

The telephone communication or data communication functions are realized by the baseband communication circuit g236. The microcomputer g218 controls the baseband communication circuit g236 to perform processes for sending and receiving audio signals or data.

DESCRIPTION OF THE SYMBOLS

10, 30 chip resistor 11 substrate (silicon substrate) 12 first connection electrode (external connection electrode) 13 second connection electrode (external connection electrode) 14 resistor network 20, 103 resistor body film (resistor body film line) 21 conductor film (wiring film) F fuse film C connection conductor film C1 to C9 capacitor parts F1 to F9 fuses 1 chip capacitor 2 substrate 3 first external electrode 4 second external electrode 5 capacitor arrangement region 7 fuse unit 8 insulating film 9 passivation film 50 resin film 51 lower electrode film 51A capacitor electrode region 51B pad region 51C fuse region 52 capacitor film 53 upper electrode film 53A capacitor electrode region 53B pad region 53C fuse region 131 to 139 electrode film portions 141 to 149 electrode film portions 151 to 159 electrode film portions 31 chip capacitor 41 chip capacitor 47 fuse unit

What is claimed is:

1. A chip resistor comprising:

a substrate;

an element circuit network including a plurality of element parts formed on the substrate, the element circuit network including a resistor network having a plurality of resistor bodies formed on the substrate, the resistor bodies each including a resistor body film formed on the substrate, wherein a wiring film is laminated on the resistor body film;

an external connection electrode provided on one of two main surfaces of the substrate to provide external connection for the element circuit network;

a plurality of fuses formed on the substrate and disconnectably connecting each of the plurality of element parts to the external connection electrode;

a solder layer formed on an external connection terminal of the external connection electrode; and a resin film, which covers the one of the two main surfaces of the substrate and a side surface of the substrate.

2. The chip resistor according to claim 1, wherein the wiring film and the fuses are conductor films formed at the same layer and the conductor films are also provided on the substrate at which the external connection electrode is provided.

3. The chip resistor according to claim 2, wherein the external connection electrode is formed from a conductor material laminated on a conductor film forming a portion of the element circuit network.

4. The chip resistor according to claim 3, wherein the conductor material includes a conductor material film with a multilayer structure.

5. The chip resistor according to claim 2, wherein the external connection electrode includes a nickel layer, a palladium layer, a gold layer, and a solder layer.

6. The chip resistor according to claim 2, wherein the external connection electrode includes a copper layer and a solder layer.

* * * * *